US012354966B2

(12) United States Patent
Lin et al.

(10) Patent No.: US 12,354,966 B2
(45) Date of Patent: Jul. 8, 2025

(54) LOGIC DRIVE BASED ON CHIP SCALE PACKAGE COMPRISING STANDARDIZED COMMODITY PROGRAMMABLE LOGIC IC CHIP AND MEMORY IC CHIP

(71) Applicant: iCometrue Company Ltd., Zhubei (TW)

(72) Inventors: Mou-Shiung Lin, Hsinchu (TW); Jin-Yuan Lee, Hsinchu (TW)

(73) Assignee: iCometrue Company Ltd., Hsinchu County (TW)

( * ) Notice: Subject to any disclaimer, the term of this patent is extended or adjusted under 35 U.S.C. 154(b) by 69 days.

(21) Appl. No.: 18/228,787

(22) Filed: Aug. 1, 2023

(65) Prior Publication Data

US 2023/0378074 A1 Nov. 23, 2023

Related U.S. Application Data

(63) Continuation of application No. 17/535,989, filed on Nov. 27, 2021, now Pat. No. 11,749,610, which is a (Continued)

(51) Int. Cl.

| | |
|---|---|
| ***H01L 23/52*** | (2006.01) |
| ***G11C 5/06*** | (2006.01) |
| ***H01L 23/538*** | (2006.01) |
| ***H01L 25/065*** | (2023.01) |
| ***H03K 19/094*** | (2006.01) |

(52) U.S. Cl.

CPC ............ *H01L 23/5384* (2013.01); *G11C 5/06* (2013.01); *H01L 23/5385* (2013.01); *H01L 23/5386* (2013.01); *H01L 25/0657* (2013.01); *H03K 19/094* (2013.01)

(58) Field of Classification Search

None

See application file for complete search history.

(56) References Cited

U.S. PATENT DOCUMENTS

| | | | |
|---|---|---|---|
| 4,870,302 | A | 9/1989 | Freeman |
| 5,272,368 | A | 12/1993 | Turner et al. |

(Continued)

FOREIGN PATENT DOCUMENTS

| | | |
|---|---|---|
| CN | 103681367 | 3/2014 |
| CN | 104078453 | 10/2014 |

(Continued)

*Primary Examiner* — Nicholas J Tobergte

(57) ABSTRACT

A multi-chip package includes: a first semiconductor integrated-circuit (IC) chip; a second semiconductor integrated-circuit (IC) chip over and bonded to the first semiconductor integrated-circuit (IC) chip; a plurality of first metal posts over and coupling to the first semiconductor integrated-circuit (IC) chip, wherein the plurality of first metal posts are in a space beyond and extending from a sidewall of the second semiconductor integrated-circuit (IC) chip; and a first polymer layer over the first semiconductor integrated-circuit (IC) chip and in the space, wherein the plurality of first metal posts are in the first polymer layer, wherein a top surface of the first polymer layer, a top surface of the second semiconductor integrated-circuit (IC) chip and a top surface of each of the plurality of first metal posts are coplanar.

29 Claims, 81 Drawing Sheets

Related U.S. Application Data continuation of application No. 16/686,107, filed on Nov. 16, 2019, now Pat. No. 11,211,334.

(60) Provisional application No. 62/891,386, filed on Aug. 25, 2019, provisional application No. 62/882,941, filed on Aug. 5, 2019, provisional application No. 62/768,978, filed on Nov. 18, 2018.

(56) References Cited

U.S. PATENT DOCUMENTS 5,587,603 A 12/1996 Kowshik
5,592,102 A 1/1997 Lane et al.
5,689,195 A 11/1997 Cliff et al.
5,796,662 A 8/1998 Kalter et al.
6,020,633 A 2/2000 Erikson
6,034,542 A 3/2000 Ridgeway
6,167,558 A 12/2000 Trimberger
6,356,478 B1 3/2002 McCollum
6,388,466 B1 5/2002 Wittig et al.
6,404,226 B1 6/2002 Schadt
6,687,167 B2 2/2004 Guaitini et al.
6,798,240 B1 9/2004 Pedersen
6,812,086 B2 11/2004 Murthy et al.
6,828,823 B1 12/2004 Tsui
6,943,580 B2 9/2005 Lewis et al.
6,998,872 B1 2/2006 Chirania et al.
7,030,652 B1 4/2006 Lewis et al.
7,061,271 B1 6/2006 Young et al.
7,126,214 B2 10/2006 Huppenthal et al.
7,190,190 B1 3/2007 Camarota et al.
7,193,433 B1 3/2007 Young
7,219,237 B1 5/2007 Trimberger
7,366,306 B1 4/2008 Trimberger
7,385,417 B1 6/2008 Agrawal et al.
7,420,390 B1 9/2008 Hutton et al.
7,550,994 B1 6/2009 Camarota
7,598,555 B1 10/2009 Papworth Parkin
7,653,891 B1 1/2010 Anderson et al.
7,747,025 B1 6/2010 Trimberger
7,853,799 B1 12/2010 Trimberger
7,933,140 B2 4/2011 Wang et al.
7,944,231 B2 5/2011 Javerliac
7,948,266 B2 5/2011 Schmit et al.
7,973,556 B1 7/2011 Noguera Serra et al.
8,064,224 B2 11/2011 Mahajan et al.
8,081,079 B1 12/2011 Camarota
8,159,268 B1 4/2012 Madurawe
8,243,527 B2 8/2012 Hung et al.
8,354,297 B2 1/2013 Pagaila et al.
8,378,407 B2 2/2013 Audzeyeu et al.
8,531,032 B2 9/2013 Yu et al.
8,546,955 B1 10/2013 Wu
8,592,886 B2 11/2013 Hsu et al.
8,709,865 B2 4/2014 Hu et al.
8,742,579 B2 6/2014 Pagaila et al.
8,786,060 B2 7/2014 Yen et al.
8,796,137 B2 8/2014 Pagaila et al.
8,866,292 B2 10/2014 Beer et al.
8,872,349 B2 10/2014 Chiu et al.
8,878,360 B2 11/2014 Meyer et al.
8,883,561 B2 11/2014 Park et al.
8,885,334 B1 11/2014 Baxter
8,895,440 B2 11/2014 Choi et al.
8,912,822 B2 12/2014 Yasuda
8,916,421 B2 12/2014 Gong et al.
8,941,230 B2 1/2015 Kyozuka et al.
8,952,489 B2 2/2015 Elian et al.
8,952,521 B2 2/2015 Wojnowski et al.
8,987,918 B2 3/2015 Razdan et al.
8,993,377 B2 3/2015 Koo et al.
9,003,221 B1 4/2015 Abugharbieh et al.
9,082,636 B2 * 7/2015 Lin .................... H01L 21/6835
9,082,806 B2 7/2015 Lin et al.
9,106,229 B1 8/2015 Hutton
9,135,185 B2 9/2015 Loh et al.
9,147,638 B2 9/2015 Liu et al.
9,224,647 B2 12/2015 Koo et al.
9,225,512 B1 12/2015 Trimberger
9,252,127 B1 2/2016 Shen et al.
9,263,370 B2 2/2016 Shenoy et al.
9,281,292 B2 3/2016 Hu et al.
9,324,672 B2 4/2016 Pagaila et al.
9,331,060 B2 5/2016 Otremba et al.
9,343,442 B2 5/2016 Chen et al.
9,349,703 B2 5/2016 Chiu et al.
9,349,713 B2 5/2016 Kim et al.
9,362,187 B2 6/2016 Ossimitz
9,368,458 B2 6/2016 Wu et al.
9,385,006 B2 7/2016 Lin
9,385,009 B2 7/2016 Lin et al.
9,385,105 B2 7/2016 Meyer et al.
9,396,998 B2 7/2016 Kurita et al.
9,397,050 B2 7/2016 Shin et al.
9,406,619 B2 8/2016 Pagaila et al.
9,406,658 B2 8/2016 Lee et al.
9,437,260 B2 9/2016 Prenat et al.
9,449,930 B2 9/2016 Kim et al.
9,455,218 B2 9/2016 Ooi et al.
9,508,626 B2 11/2016 Pagaila et al.
9,524,955 B2 12/2016 Huang et al.
9,543,276 B2 1/2017 Jee et al.
9,583,431 B1 2/2017 Rahman
9,593,009 B2 3/2017 Fuergut et al.
9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,722,584 B1 8/2017 Chang et al.
9,735,113 B2 8/2017 Chi et al.
9,763,329 B1 9/2017 Mason
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.
9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Yuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,290,611 B2 5/2019 Yu et al.
10,325,882 B2 6/2019 Kang et al.

(56) References Cited

U.S. PATENT DOCUMENTS

| | | | |
|---|---|---|---|
| 10,333,623 | B1 | 6/2019 | Liao et al. |
| 10,340,249 | B1 | 7/2019 | Yu et al. |
| 10,373,885 | B2 | 8/2019 | Yu et al. |
| 10,419,001 | B2 | 9/2019 | Jo et al. |
| 10,431,536 | B2 | 10/2019 | Kim et al. |
| 10,447,274 | B2 | 10/2019 | Lee et al. |
| 10,476,505 | B2 | 11/2019 | Ngai |
| 10,490,521 | B2 | 11/2019 | Hu et al. |
| 10,490,540 | B2 | 11/2019 | Yu et al. |
| 10,504,835 | B1 | 12/2019 | Wang et al. |
| 10,510,634 | B2 | 12/2019 | Lin et al. |
| 10,510,650 | B2 | 12/2019 | Yu et al. |
| 10,522,449 | B2 | 12/2019 | Chen et al. |
| 10,541,227 | B2 | 1/2020 | Yeh et al. |
| 10,541,228 | B2 | 1/2020 | Chen et al. |
| 10,622,321 | B2 | 4/2020 | Yu et al. |
| 10,741,537 | B2 | 8/2020 | Lu et al. |
| 10,784,248 | B2 | 9/2020 | Yu et al. |
| 10,797,031 | B2 | 10/2020 | Liao et al. |
| 10,892,011 | B2 | 1/2021 | Lin et al. |
| 10,892,291 | B2 | 1/2021 | Chhun et al. |
| 11,114,408 | B2 | 9/2021 | Shen et al. |
| 11,211,334 | B2 | 12/2021 | Lin et al. |
| 11,217,368 | B2 | 1/2022 | Choa et al. |
| 12,062,618 | B2 * | 8/2024 | Yang ................. H01L 23/49833 |
| 2001/0045844 | A1 | 11/2001 | New et al. |
| 2002/0092307 | A1 | 7/2002 | Ghoshal |
| 2003/0122578 | A1 | 7/2003 | Masui et al. |
| 2004/0041584 | A1 | 3/2004 | Sunaga et al. |
| 2004/0145850 | A1 | 7/2004 | Fukumoto et al. |
| 2004/0222817 | A1 | 11/2004 | Madurawe |
| 2005/0185457 | A1 | 8/2005 | Kim et al. |
| 2005/0218929 | A1 | 10/2005 | Wang et al. |
| 2006/0138509 | A1 | 6/2006 | Lee et al. |
| 2007/0037379 | A1 | 2/2007 | Enquist et al. |
| 2007/0164279 | A1 | 7/2007 | Lin et al. |
| 2007/0166912 | A1 | 7/2007 | Fenigstein et al. |
| 2007/0279987 | A1 | 12/2007 | Fang et al. |
| 2009/0114971 | A1 | 5/2009 | Cai et al. |
| 2009/0243650 | A1 | 10/2009 | Madurawe |
| 2009/0243652 | A1 | 10/2009 | Dorairaj et al. |
| 2009/0267238 | A1 | 10/2009 | Joseph |
| 2010/0039136 | A1 | 2/2010 | Chua-Eoan et al. |
| 2010/0133704 | A1 | 6/2010 | Marimuthu et al. |
| 2010/0157669 | A1 | 6/2010 | Audzeyeu |
| 2010/0283085 | A1 | 11/2010 | Bemanian |
| 2011/0026232 | A1 | 2/2011 | Lin et al. |
| 2011/0221470 | A1 | 9/2011 | Javerliac et al. |
| 2012/0193785 | A1 | 8/2012 | Lin et al. |
| 2012/0217549 | A1 | 8/2012 | Widjaja |
| 2013/0082399 | A1 | 4/2013 | Kim et al. |
| 2013/0257477 | A1 | 10/2013 | Yasuda et al. |
| 2013/0285253 | A1 | 10/2013 | Aoki et al. |
| 2014/0017882 | A1 | 1/2014 | Lei |
| 2014/0070380 | A1 | 3/2014 | Chiu et al. |
| 2014/0070403 | A1 | 3/2014 | Pan et al. |
| 2014/0131858 | A1 | 5/2014 | Pan et al. |
| 2014/0183731 | A1 | 7/2014 | Lin et al. |
| 2014/0185264 | A1 | 7/2014 | Chen et al. |
| 2014/0203412 | A1 | 7/2014 | Wang et al. |
| 2014/0210097 | A1 | 7/2014 | Chen |
| 2014/0254232 | A1 | 9/2014 | Wu |
| 2014/0302659 | A1 | 10/2014 | Phatak |
| 2015/0008957 | A1 | 1/2015 | Olgiati et al. |
| 2015/0014844 | A1 | 1/2015 | Wu et al. |
| 2015/0085560 | A1 | 3/2015 | Candelier et al. |
| 2015/0116965 | A1 | 4/2015 | Kim et al. |
| 2015/0227662 | A1 | 8/2015 | Lepercq |
| 2015/0287672 | A1 | 10/2015 | Yazdani |
| 2015/0327367 | A1 | 11/2015 | Shen |
| 2016/0118390 | A1 | 4/2016 | Liaw |
| 2016/0133571 | A1 | 5/2016 | Lee et al. |
| 2016/0141228 | A1 | 5/2016 | Leobandung |
| 2016/0173101 | A1 | 6/2016 | Gao et al. |
| 2016/0190113 | A1 | 6/2016 | Sharan et al. |
| 2016/0217835 | A1 | 7/2016 | Blott et al. |
| 2016/0351626 | A1 | 12/2016 | McCollum |
| 2016/0372449 | A1 | 12/2016 | Rusu et al. |
| 2017/0071552 | A1 | 3/2017 | Harpe et al. |
| 2017/0117263 | A1 | 4/2017 | Yeh et al. |
| 2017/0301650 | A1 | 10/2017 | Yu |
| 2017/0358557 | A1 | 12/2017 | Chen et al. |
| 2018/0053730 | A1 | 2/2018 | Shao |
| 2018/0061742 | A1 | 3/2018 | Ananiev |
| 2018/0068937 | A1 | 3/2018 | Marimuthu et al. |
| 2018/0076179 | A1 | 3/2018 | Hsu et al. |
| 2018/0102776 | A1 | 4/2018 | Chandrasekar et al. |
| 2018/0150667 | A1 | 5/2018 | Yu et al. |
| 2018/0151477 | A1 | 5/2018 | Yu et al. |
| 2018/0151501 | A1 | 5/2018 | Yu et al. |
| 2018/0158746 | A1 | 6/2018 | Lin |
| 2018/0165396 | A1 | 6/2018 | Lin et al. |
| 2018/0174865 | A1 | 6/2018 | Yu et al. |
| 2018/0204810 | A1 | 7/2018 | Yu et al. |
| 2018/0204828 | A1 | 7/2018 | Yu et al. |
| 2018/0210799 | A1 | 7/2018 | Gao |
| 2018/0226349 | A1 | 8/2018 | Yu et al. |
| 2018/0226371 | A1 | 8/2018 | Enquist |
| 2018/0247905 | A1 | 8/2018 | Yu et al. |
| 2018/0269188 | A1 | 9/2018 | Yu et al. |
| 2018/0275193 | A1 | 9/2018 | Rouge et al. |
| 2018/0284186 | A1 | 10/2018 | Chadha |
| 2018/0286776 | A1 | 10/2018 | Yu et al. |
| 2018/0301351 | A1 | 10/2018 | Yu et al. |
| 2018/0301376 | A1 | 10/2018 | Shih et al. |
| 2018/0350629 | A1 | 12/2018 | Liu et al. |
| 2018/0350763 | A1 | 12/2018 | Yu et al. |
| 2018/0358312 | A1 | 12/2018 | Yu et al. |
| 2018/0374824 | A1 | 12/2018 | Yu et al. |
| 2019/0013276 | A1 | 1/2019 | Lee et al. |
| 2019/0019756 | A1 | 1/2019 | Yu et al. |
| 2019/0020343 | A1 | 1/2019 | Lin et al. |
| 2019/0051641 | A1 | 2/2019 | Lin et al. |
| 2019/0057931 | A1 | 2/2019 | Hsu et al. |
| 2019/0057932 | A1 | 2/2019 | Wu et al. |
| 2019/0067152 | A1 | 2/2019 | Wuu et al. |
| 2019/0097304 | A1 | 3/2019 | Hsiao et al. |
| 2019/0129817 | A1 | 5/2019 | Zhuo |
| 2019/0164834 | A1 | 5/2019 | Or-Bach et al. |
| 2019/0221547 | A1 | 7/2019 | Drab et al. |
| 2019/0238134 | A1 | 8/2019 | Lin et al. |
| 2019/0238135 | A1 | 8/2019 | Lin et al. |
| 2019/0245543 | A1 | 8/2019 | Lin et al. |
| 2019/0253056 | A1 | 8/2019 | Lin et al. |
| 2019/0304803 | A1 | 10/2019 | Hu et al. |
| 2019/0333871 | A1 | 10/2019 | Chen et al. |
| 2019/0347790 | A1 | 11/2019 | Lin et al. |
| 2019/0363715 | A1 | 11/2019 | Lin et al. |
| 2019/0371763 | A1 | 12/2019 | Agarwal et al. |
| 2019/0372574 | A1 | 12/2019 | Lin et al. |
| 2020/0006274 | A1 | 1/2020 | Chiang et al. |
| 2020/0058617 | A1 | 2/2020 | Wu et al. |
| 2020/0058626 | A1 | 2/2020 | Tai et al. |
| 2020/0082885 | A1 | 3/2020 | Lin et al. |
| 2020/0111734 | A1 | 4/2020 | Lin et al. |
| 2020/0144224 | A1 | 5/2020 | Lin et al. |
| 2020/0161242 | A1 | 5/2020 | Lin et al. |
| 2020/0243422 | A1 | 7/2020 | Kim et al. |
| 2020/0373215 | A1 | 11/2020 | Wu et al. |
| 2020/0395350 | A1 | 12/2020 | Wu et al. |
| 2021/0005592 | A1 | 1/2021 | Lin et al. |
| 2021/0043557 | A1 | 2/2021 | Lin et al. |
| 2021/0050300 | A1 | 2/2021 | Lin et al. |
| 2021/0090983 | A1 | 3/2021 | Lin et al. |
| 2021/0159180 | A1 | 5/2021 | Zhai et al. |
| 2021/0217702 | A1 | 7/2021 | Dabral et al. |
| 2021/0232744 | A1 | 7/2021 | Lin et al. |
| 2022/0013504 | A1 | 1/2022 | Dabral et al. |
| 2022/0020729 | A1 | 1/2022 | Gao et al. |

FOREIGN PATENT DOCUMENTS

| | | |
|---|---|---|
| CN | 104282650 | 1/2015 |
| CN | 105745752 | 7/2016 |

(56) References Cited

FOREIGN PATENT DOCUMENTS

| | | |
|---|---|---|
| CN | 104064556 | 4/2019 |
| TW | 200623398 | 7/2006 |
| WO | WO00/36748 | 6/2000 |
| WO | WO2005010976 | 2/2005 |
| WO | WO2016160063 | 10/2016 |
| WO | WO2018004092 | 1/2018 |

* cited by examiner

| Input | | | | Output | | | | |
|---|---|---|---|---|---|---|---|---|
| A1 | A0 x A3 | | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

190

LOGIC DRIVE BASED ON CHIP SCALE PACKAGE COMPRISING STANDARDIZED COMMODITY PROGRAMMABLE LOGIC IC CHIP AND MEMORY IC CHIP

PRIORITY CLAIM

This application is a continuation of application Ser. Nos. 17/535,989, filed Nov. 27, 2021, now U.S. Pat. No. 11,749, 610, which is a continuation of application Ser. No. 16/686, 107, filed Nov. 16, 2019, now U.S. Pat. No. 11,211,334, which claims priority benefits from U.S. provisional application No. 62/768,978, filed on Nov. 18, 2018 and entitled "LOGIC DRIVE BASED ON STANDARDIZED COMMODITY PROGRAMMABLE LOGIC/MEMORY SEMICONDUCTOR IC CHIP SCALE PACKAGES", U.S. provisional application No. 62/882,941, filed on Aug. 5, 2019 and entitled "VERTICAL INTERCONNECT ELEVATOR BASED ON THROUGH SILICON VIAS", and U.S. provisional application No. 62/891,386, filed on Aug. 25, 2019 and entitled "VERTICAL INTERCONNECT ELEVATOR BASED ON THROUGH SILICON VIAS". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic disk drive, logic solid-state disk, logic solid-state drive, Field Programmable Gate Array (FPGA) logic disk, FPGA logic drive, or programmable logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive, FPGA logic disk, FPGA logic drive, or programmable logic drive") comprising plural programmable Field Programmable Gate Arrays/High Bandwidth Memory semiconductor IC chip Chip-Scale Packages (FPGA/HBM CSP) and one or plural non-volatile IC chips for field programming purposes, and more particularly to a standardized commodity logic drive formed by using plural standardized commodity FPGA/HBM CSPs (each comprising a FPGA IC chip and one or plural HBM IC chips) and one or plural non-volatile IC chip or chips, and to be used for different specific applications when field programmed or user programmed.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extend to a certain time period, the semiconductor IC suppliers may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, (3) gives lower performance. When the semiconductor technology nodes or generations migrate, following the Moore's Law, to advanced nodes or generations (for example below 30 nm or 20 nm), the Non-Recurring Engineering (NRE) cost for designing an ASIC or COT chip increases greatly (more than US $5M or even exceeding US $10M, US $20M, US $50M or US $100M). The cost of a photo mask set for an ASIC or COT chip at the 16 nm technology node or generation may be over US $2M, US $5M, or US $10M. The high NRE cost in implementing the innovation or application using the advanced IC technology nodes or generations slows down or even stops the innovation or application using advanced and useful semiconductor technology nodes or generations. A new approach or technology is needed to inspire the continuing innovation and to lower down the barrier for implementing the innovation in the semiconductor IC chips.

SUMMARY OF THE DISCLOSURE

One aspect of the disclosure provides a standardized commodity logic drive in a multi-chip package comprising plural standardized commodity Field Programmable Gate Array/High Bandwidth Memory Chip-Scale Packages (FPGA/HBM CSPs) and one or plural non-volatile IC chips for use in varieties of applications requiring logic, computing and/or processing functions by field programming; wherein the FPGA/HBM CSP is a Chip-Scale-Package (CSP) comprising a standard commodity FPGA IC chip and one HBM chip or a stacked package with plural HBM chips. Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing. Uses of the standardized commodity FPGA/HBM CSPs is analogues to uses of a standardized commodity data storage memory IC chips, for example, standard commodity DRAM chips or standard commodity NAND flash chips, and differs in that the latter has memory functions for data storage, while the former has logic functions for processing and/or computing.

Another aspect of the disclosure provides a method to reduce Non-Recurring Engineering (NRE) expenses for implementing an innovation and/or an application in semiconductor IC chips by using the standardized commodity logic drive comprising plural standardized commodity FPGA/HBM CSPs. A person, user, or developer with an innovation and/or an application concept or idea needs to purchase the standardized commodity logic drive and develops or writes software codes or programs to load into the standardized commodity logic drive to implement his/her innovation and/or application concept or idea; wherein said innovation and/or application (abbreviated as innovation) comprises (i) innovative algorithms and/or architectures of computing, processing, learning and/or inferencing, and/or (ii) innovative and/or specific applications. Compared to the implementation by developing a logic ASIC or COT IC chip, the NRE cost may be reduced by a factor of equal to or larger than 2, 5, 10, 30, 50 or 100 using the disclosed standardized commodity logic drive. For advanced semiconductor technology nodes or generations (for example more advanced than or below 20 nm), the NRE cost for designing an ASIC or COT chip increases greatly, more than US $5M or even exceeding US $10M, US $20M, US $50M, or US $100M. The cost of a photo mask set for an ASIC or COT chip at the 16 nm technology node or generation may be over US $2M, US $5M, or US $10M. Implementing the same or similar innovation and/or application using the logic drive may reduce the NRE cost down to smaller than US $10M or even less than US $5M, US $3M, US $2M or US $1M. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" again for innovators to easily and cheaply implement or realize their innovation in semiconductor IC chips using advanced IC technology nodes more advanced than 20 nm, for example, using a technology node of 16 nm, 10 nm, 7 nm, 5 nm or 3 nm, by using logic drives; wherein said innovation comprises (i) innovative algorithms or architectures of computing, processing, learning and/or inferencing, and/or (ii) innovative and/or specific applications. In years of 1990's, innovators could implement their innovation by designing IC chips and fabricating the IC chips in a semiconductor manufacturing foundry fab using technology nodes at 1 μm, 0.8 μm, 0.5 μm, 0.35 μm, 0.18 μm or 0.13 μm, at a cost of about several hundred thousand US dollars. The semiconductor manufacturing foundry companies are productless companies and own semiconductor manufacturing fabs. They provide manufacturing services to their customers. The customers are fabless companies, which include (i) IC chip design companies designing and owning the IC chips, (ii) system companies designing and owning the systems, (iii) IC chip designing individuals designing and owning IC chips. The IC manufacturing foundry fab then was the "public innovation platform". However, when IC technology nodes have migrated to a technology node more advanced than 20 nm, for example to the technology node of 16 nm, 10 nm, 7 nm, 5 nm or 3 nm IC technology nodes, only a few giant system or IC design companies, not the public innovators, can afford to use the semiconductor IC manufacturing foundry fab. It costs about or over 10 million US dollars to develop and implement an IC chip using these advanced technology nodes. The semiconductor IC manufacturing foundry fab is now not the "public innovation platform" anymore, they are becoming a "club innovation platform" for club innovators. The disclosed logic drives, comprising standard commodity FPGA IC chips, provides public innovators the "public innovation platform" to semiconductor IC industry again just as in 1990's. The innovators can implement or realize their innovation (algorithms, architectures and/or applications) by using the standard commodity of logic drives and writing software programs using common programing languages, for example, C, Java, C++, C#, Scala, Swift, Matlab, Assembly Language, Pascal, Python, Visual Basic, PL/SQL or JavaScript languages, at cost of less than 500K or 300K US dollars. The innovators can use their own standard commodity logic drives or they can rent standard commodity logic drives in data centers or clouds through networks.

Another aspect of the disclosure provides an innovation platform for an innovator, comprising: (a) multiple logic drives in a data center or a cloud, wherein multiple logic drives comprise plural standard commodity FPGA IC chips, in the FPGA/HBM CSPs, fabricated using a semiconductor IC process technology node more advanced than 20 nm technology node; (b) an innovator's device and multiple users' devices communicating with the multiple logic drives in the data center or the cloud through an internet or a network, wherein the innovator develops and writes software programs to implement his/her innovation (algorithms, architectures and/or applications) in a common programing language to program, through the internet or the network, the multiple logic drives in the data center or the cloud, wherein the common programing language comprises Java, C++, C#, Scala, Swift, Matlab, Assembly Language, Pascal, Python, Visual Basic, PL/SQL or JavaScript language; (c) after programming the logic drives, the innovator or the multiple users may use the programed logic drives for his/her or their innovations (algorithms, architectures and/or applications) through the internet or the network; wherein said innovations comprise (i) innovative algorithms or architectures of computing, processing, learning and/or inferencing, and/or (ii) innovative and/or specific applications.

Another aspect of the disclosure provides a method to change the current logic ASIC or COT IC chip business into a commodity logic IC chip business, like the current commodity DRAM, or commodity flash memory IC chip business, by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications), the standardized commodity logic drive may be used as an alternative for designing an ASIC or COT IC chip. The current logic ASIC or COT IC chip design, manufacturing and/or product companies (including fabless IC design and product companies, or IC foundry or contracted manufacturers (may be product-less), and/or vertically-integrated IC design, manufacturing and product (IDM) companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufacturers (may be product-less), vertically-integrated IC design, manufacturing and product companies) may become companies in the following business models: (1) designing, manufacturing, and/or selling the standard commodity FPGA IC chips or FPGA/HBM CSPs; and/or (2) designing, manufacturing, and/or selling the standard commodity logic drives. The business model is similar to the current commodity DRAM or flash memory chip and module business. A person, user, customer, or software developer, or algorithm/architecture/application developer may purchase the standardized commodity logic drive and write software codes to program them for his/her desired algorithms, architectures and/or applications, for example, in algorithms, architectures and/or applications of Artificial Intelligence (AI), machine learning, deep learning, big data, Internet Of Things (JOT), industry computers, Virtual Reality (VR), Augmented Reality (AR), self-drive or driver-less car, Graphic Processing (GP), Digital Signal Processing (DSP), Micro Controlling (MC), and/or Central Processing (CP). The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (JOT), industry computers, Virtual Reality (VR), Augmented Reality (AR), car electronics, Graphic Processing (GP), Digital Signal Processing (DSP), Micro Controlling (MC), and/or Central Processing (CP). The logic drive may be field programmed as an accelerator for, for example, the AI functions, in the user-end, data center or cloud, in the algorithms, architectures and/or applications of training and/or inferring of the AI functions.

Another aspect of the disclosure provides a method to change the current logic ASIC or COT IC chip hardware business into a software business by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications), the standardized commodity logic drive may be used as an alternative for designing an ASIC or COT IC chip. The current ASIC or COT IC chip design companies or suppliers may become software developers or suppliers; they may adapt the following business models: (1) become software companies to develop and sell software for their innovation (algorithms, architectures and/or applications), and let their customers or users to install software in the customers' or users' own standard commodity logic drive; and/or (2) still hardware companies by selling hardware without performing ASIC or COT IC chip design and/or production. In the case (2), they may install their in-house developed software for the innovation (algorithms, architectures and/or applications) in the purchased standard commodity logic drive; and sell the program-installed logic drive to their customers or users. In both cases (1) and (2), either the customers/users or developers/companies may write software codes into the standard commodity logic drive (that is, loading the software codes in the standardized commodity logic drive) for their desired algorithms, architectures and/or applications, for example, in algorithms, architectures and/or applications of Artificial Intelligence (AI), machine learning, deep learning, big data, Internet Of Things (JOT), industry computers, car electronics, Virtual Reality (VR), Augmented Reality (AR), Graphic Processing, Digital Signal Processing, micro controlling, and/or Central Processing. The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (JOT), industry computers, car electronics, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current system design, manufactures and/or product business into a commodity system/product business, like current commodity DRAM, or flash memory business, by using the standardized commodity logic drive. The system, computer, processor, smart-phone, or electronic equipment or device may become a standard commodity hardware comprises mainly a memory drive and a logic drive. The memory drive may be a hard disk drive, a flash drive, and/or a solid-state drive. The logic drive in the aspect of the disclosure may have big enough or adequate number of inputs/outputs (I/Os) to support I/O ports for used for programming all or most applications. The logic drive may have I/Os to support required I/O ports for programming, for example, to perform all or any combinations of functions of Artificial Intelligence (AI), machine learning, deep learning, big data, Internet Of Things (JOT), industry computers, Virtual Reality (VR), Augmented Reality (AR), car electronics, Graphic Processing (GP), Digital Signal Processing (DSP), Micro Controlling (MC), and/or Central Processing (CP), and etc. The logic drive may comprise (1) programing or configuration I/Os for software, algorithm, architecture and/or application developers to load algorithm, architecture and/or application software or program codes to program or configure the logic drive, through I/O ports or connectors connecting or coupling to the I/Os of the logic drive; and (2) operation, execution or user I/Os for the users to operate, execute and perform their instructions, through I/O ports or connectors connecting or coupling to the I/Os of the logic drive; for example, generating a Microsoft Word file, or a PowerPoint presentation file, or an Excel file. The I/O ports or connectors connecting or coupling to the corresponding I/Os of the logic drive may comprise one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The I/O ports or connectors connecting or coupling to the corresponding I/Os of the logic drive may also comprise Serial Advanced Technology Attachment (SATA) ports, or Peripheral Components Interconnect express (PCIe) ports for communicating, connecting or coupling with or to the memory drive. The I/O ports or connectors may be placed, located, assembled, or connected on or to a substrate, film or board; for example, a Printed Circuit Board (PCB), a silicon substrate with interconnection schemes, a metal substrate with interconnection schemes, a glass substrate with interconnection schemes, a ceramic substrate with interconnection schemes, a flexible film with interconnection schemes. The logic drive is assembled on the substrate, film or board using solder bumps, or copper pillars or bumps, on or of the logic drive, similar to the flip-chip assembly of the chip packaging technology, or the Chip-On-Film (COF) assembly technology used in the LCD driver packaging technology. The system, computer, processor, smart-phone, or electronic equipment or device design, manufacturing, and/or product companies may become companies to (1) design, manufacturing and/or sell the standard commodity hardware comprising a memory drive and a logic drive; in this case, the companies are still hardware companies; (2) develop system and algorithm, architecture and/or application software for users to install in the users' own standard commodity hardware; in this case, the companies become software companies; (3) install the third party's developed system and algorithm, architecture and/or application software or programs in the standard commodity hardware and sell the software-loaded hardware; and in this case, the companies are still hardware companies.

Another aspect of the disclosure provides a standard commodity FPGA IC chip for use in the standard commodity FPGA/HBM CSPs. The FPGA/HBM CSPs are used in the multi-chip packaged standard commodity logic drive. The standard commodity FPGA IC chip is designed, implemented and fabricated using an advanced semiconductor technology node or generation, for example more advanced than or equal to, or below or equal to 30 nm, 20 nm or 10 nm; with a chip size and manufacturing yield optimized with the minimum manufacturing cost for the used semiconductor technology node or generation. The standard commodity FPGA IC chip may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors used in the advanced semiconductor technology node or generation may be a FIN Field-Effect-Transistor (FINFET), a Gate-All-Around Field-Effect-Transistor (GAAFET), FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. The standard commodity FPGA IC chip may only communicate directly with other chips in or of the logic drive only; its I/O circuits may require only small I/O drivers or receivers, and small or none Electrostatic Discharge (ESD) devices. The driving capability, loading, output capacitance, or input capacitance of I/O drivers or receivers, or I/O circuits may be between 0.05 pF and 2 pF or 0.05 pF and 1 pF; or smaller than 2 pF or 1 pF. The size of the ESD device may be between 0.01 pF and 2 pF or 0.01 pF and 1 pF; or smaller than 2 pF, 1 pF or 0.1 pF. For example, a bi-directional (or tri-state) I/O pad or circuit may comprise an ESD circuit, a receiver, and a driver, and has an input capacitance or output capacitance between 0.05 pF and 2 pF or 0.05 pF and 1 pF; or smaller than 2 pF or 1 pF. The smaller I/O circuits provide high performance and low power of the FPGA IC chips. All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in another dedicated control chip, dedicated I/O chip, or dedicated control and I/O chip, packaged in the same logic drive. None or minimal area of the standard commodity FPGA IC chip is used for the control or I/O circuits, for example, less than 15%, 10%, 5%, 2%, 1%, 0.5% or 0.1% area is used for the control or IO circuits; or, none or minimal transistors of the standard commodity FPGA IC chip are used for the control or I/O circuits, for example, less than 15%, 10%, 5%, 2%, 1%, 0.5% or 0.1% of the total number of transistors are used for the control or I/O circuits; or all or most area of the standard commodity FPGA IC chip is used for (i) logic blocks or cells comprising logic gate arrays, computing units or operators, and/or Look-Up-Tables (LUTs) and multiplexers, and/or (ii) programmable interconnection. For example, greater than 85%, 90%, 95%, 98%, 99%, 99.5% or 99.9% area is used for logic blocks, and/or programmable interconnection; or, all or most transistors of the standard commodity FPGA IC chip are used for logic blocks, and/or programmable interconnection, for example, greater than 85%, 90%, 95%, 98%, 99%, 99.5% or 99.9% of the total number of transistors are used for logic blocks, and/or programmable interconnection. The area (mentioned above) of the standard commodity FPGA IC chip is measured without the seal ring and the dicing area of the chip; that means the area is only including an area up to the inner boundary of the seal ring. The standard repetitive arrays in the FPGA chip further improve the manufacturing yield of the FPGA chip. Since the FPGA IC chips are in the standard common designs, a standard common design for the locations of the Through Polymer metal Vias, Through Package metal Vias, Through Polymer metal posts, Through Polymer metal pillars (all are abbreviated as TPV, and to be described and specified below) may be designed at fixed standard locations of the FPGA IC chip.

Another aspect of the disclosure provides a standard commodity FPGA IC chip for use in the FPGA/HBM CSPs. The FPGA/HBM CSPs are used in the multi-chip packaged standard commodity logic drive. The standard commodity FPGA chip comprises logic blocks or cells. The logic blocks comprise (i) logic gate arrays comprising Boolean logic operators, for example, NAND, NOR, AND, and/or OR circuits; (ii) computing units comprising, for examples, adder, multiplication, and/or division circuits; (iii) Look-Up-Tables (LUTs) and multiplexers. The Boolean operators, the functions of logic gates, or computing, operations or processes may be carried out using the programmable wires or lines (the programmable metal interconnection wires or lines) on the FPGA IC chip; while certain Boolean operators, logic gates, or certain computing, operations or processes may be carried out using the fixed wires or lines (the metal interconnection wires or lines) on the FPGA IC chip. For example, the adder and/or multiplier may be designed and implemented by the fixed wires or lines (the fixed metal interconnection wires or lines) on the FPGA IC chip, for interconnecting logic circuits of the adder and/or multiplier. Alternatively, the Boolean operators, the functions of logic gates, or computing, operations or processes may be carried out using, for example, Look-Up-Tables (LUTs) and/or multiplexers. The LUTs store or memorize the processing or computing results of logic gates, computing results of calculations, decisions of decision-making processes, or results of operations, events or activities. The LUTs may store or memorize data or results in, for example, SRAM cells. One of the two latched nodes of the 4 latch transistors in the 5 T or 6 T SRAM cell is connected or coupled to the multiplexer. The stored data in the 5 T or 6 T SRAM cell is used for LUTs. When inputting a set of data, requests or conditions, a multiplexer is used to select the corresponding data (or results) stored or memorized in the LUTs, based on the inputted set of data, requests or conditions. As an example, a 4-input NAND gate may be implemented using an operator comprising LUTs and multiplexers as described below: There are 4 inputs for a 4-input NAND gate, and 16 ($2^4$) possible corresponding outputs (results) of the 4-input NAND gate. To carry out the same function of the 4-input NAND operation using LUTs and multiplexers, it may require circuits comprising: (i) a LUT for storing and memorizing the 16 possible corresponding outputs (results), (ii) a multiplexer designed and used for selecting the right (corresponding) output, based on a given 4-input control or instruction data set (for example, 1, 0, 0, 1); that is there are 16 input data (the memory stored data) and 4 control or instruction data for the multiplexer. An output is selected by the multiplexer from the 16 stored data based on 4 control or instruction data. In general, for a LUT and a multiplexer to carry out the same function as an operator NAND comprises n inputs, the LUT may be storing or memorizing $2^n$ corresponding data or results, and using the multiplexer to select a right (corresponding) output from the memorized $2^n$ corresponding data or results based on a given n-input control or instruction data set. The memorized $2^n$ corresponding data or results are memorized or stored in the $2^n$ memory cells, for example, $2^n$ memory cells of the 5 T or 6 T SRAM cells.

The programmable interconnections of the standard commodity FPGA IC chip comprise cross-point switches in the middle of interconnection metal lines or traces. For example, n metal lines or traces are connected to the input terminals of the cross-point switches, and m metal lines or traces are connected to the output terminals of the cross-point switches, and the cross-point switches are located between the n metal lines or traces and the m metal lines and traces. The cross-point switches are designed such that each of the n metal lines or traces may be programed to connect to anyone of the m metal lines or traces. Each of the cross-point switches may comprise, for example, a pass/no-pass circuit comprising a n-type and a p-type transistor, in pair, wherein one of the n metal lines or traces are connected to the connected source terminals of the n-type and p-type transistor pairs in the pass-no-pass circuit, while one of the m metal lines and traces are connected to the connected drain terminal of the n-type and p-type transistor pairs in the pass-no-pass circuit. The connection or disconnection (pass or no pass) of the cross-point switch is controlled by the data (1 or 0) stored or latched in a SRAM cell. Since the standard commodity FPGA IC chip comprises mainly the regular and repeated gate arrays or blocks, LUTs and multiplexers, or programmable interconnection, just like standard commodity DRAM, or NAND flash IC chips, the manufacturing yield may be very high, for example, greater than 70%, 80%, 90% or 95% for a chip area greater than, for example, 50 $mm^2$, or 80 $mm^2$.

Alternatively, each of the cross-point switches may comprise, for example, a pass/no-pass circuit comprising a switching buffer, wherein the switching buffer comprises two-stages of inverters (buffer), a control N-MOS, and a control P-MOS. Wherein one of the n metal lines or traces is connected to the common (connected) gate terminal of an input-stage inverter of the buffer in the pass-no-pass circuit, while one of the m metal lines and traces is connected to the common (connected) drain terminal of output-stage inverter of buffer in the pass-no-pass circuit. The output-stage inverter is stacked with the control P-MOS at the top (between $V_{cc}$ and the source of the P-MOS of the output-stage inverter) and the control N-MOS at the bottom (between $V_{ss}$ and the source of the N-MOS of the output-stage inverter). The connection or disconnection (pass or no pass) of the cross-point switch is controlled by the data (0 or 1) stored in a 5 T or 6 T SRAM cell.

Alternatively, the cross-point switches may comprise, for example, multiplexers and switch buffers. The multiplexer selects one of the n inputting data from the n inputting metal lines based on the data stored in the 5 T or 6 T SRAM cells; and outputs the selected one of inputs to a switch buffer. The switch buffer passes or does not pass the output data from the multiplexer to one metal line connected to the output of the switch buffer based on the data stored in the 5 T or 6 T SRAM cells. The switch buffer comprises two-stages of inverters (buffer), a control N-MOS, and a control P-MOS. Wherein the selected data from the multiplexer is connected to the common (connected) gate terminal of input-stage inverter of the buffer, while one of the m metal lines or traces is connected to the common (connected) drain terminal of output-stage inverter of the buffer. The output-stage inverter is stacked with the control P-MOS at the top (between $V_{cc}$ and the source of the P-MOS of the output-stage inverter) and the control N-MOS at the bottom (between $V_{ss}$ and the source of the N-MOS of the output-stage inverter). The connection or disconnection of the switch buffer is controlled by the data (0 or 1) stored in the 5 T or 6 T SRAM cell.

The programmable interconnections of the standard commodity FPGA IC chip comprise a multiplexer in the middle of interconnection metal lines or traces. The multiplexer selects from n metal interconnection lines connected to the n inputs of the multiplexer, and coupled or connected to one metal interconnection line connected to the output of the multiplexer, based on the data stored or programmed in the 5 T or 6 T SRAM cells. For example, n=16, 4 bits stored in the four 5 T or 6 T SRAM cells are required to select any one of the 16 metal interconnection lines connected to the 16 inputs of the multiplexer, and couple or connect the selected one to one metal interconnection line connected to the output of the multiplexer. The data from the selected one of 16 inputs is therefore coupled, passed, or connected to the metal line connected to the output of the multiplexer.

Another aspect of the disclosure provides the standard commodity logic drive in a multi-chip package comprising plural standard commodity FPGA/HBM CSPs and one or more non-volatile memory IC chips, for use in different applications requiring logic, computing and/or processing functions by field programming, wherein each of the plural standard commodity FPGA/HBM CSPs comprises (i) one standard commodity FPGA IC chip and (ii) one HBM chip mounted on the standard commodity FPGA IC chip or a stacked package with multiple HBM chips mounted on the standard commodity FPGA IC chip. Each of the plural standard commodity FPGA IC chips may have standard common features or specifications: (1) logic blocks including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits. In some cases, the standard commodity FPGA IC chip may comprise logic blocks of system gates (as in (i)) and logic cells or elements but not hard macros as in (iii). The hard macros may be included in the other chips of the logic drive, for example, in the dedicated control chip, dedicated I/O chip, the dedicated control and I/O chip, IAC, or DPIIC chip of the logic drive. (2) the number of inputs to each of the logic blocks or operators: the number of inputs to each of the logic block or operator may be greater or equal to 4, 8, 16, 32, 64, 128, or 256; (3) the power supply voltage: the voltage may be between 0.2V and 2.5V, 0.2V and 2V, 0.2V and 1.5V, 0.1V and 1V, or 0.2V and 1V, or, smaller or lower than or equal to 2.5V, 2V, 1.8V, 1.5V or 1V; (4) the I/O pads, in terms of layout, location, number and function; (5) the Through Silicon Vias (TSVs) in the silicon substrate of the FPGA IC Chip, in terms of layout, location, number and function. Since the FPGA chips are standard commodity IC chips, the number of FPGA chip designs or products is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, or 3 and 5 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising the plural standard commodity FPGA IC chips (in the FPGA/HBM CSPs) and one or more non-volatile memory IC chips, for use in different applications requiring logic, computing and/or processing functions by field programming, wherein the plural standard commodity FPGA IC chips, each is in the FPGA/HBM CSPs. Each of the plural standard commodity FPGA IC chips may have standard common features or specifications as described and specified above. Similar to standard commodity DRAM IC chips for use in a DRAM module, the standard commodity FPGA IC chips in the logic drive, each chip may further comprise some additional I/O pins or pads, for example: (1) one chip enable pin or pad, (2) two or more input selection pins or pads and/or (3) two or more output selection pins or pads. Each of the plural standard commodity FPGA IC chips may comprise, for example, 4 I/O ports, and each I/O port may comprise 64 bi-directional I/O circuits. The above additional I/O pins or pads are used to select one I/O port from the above 4 I/O ports for each of the standard commodity FPGA IC chips in the logic drive. The data, signal and/or power/ground bus in the interconnection schemes, for example, the TISD or FOISD on or of the FOIT multichip package (to be described below), for interconnecting two or more of the plural standard commodity FPGA IC chips in the logic drive also comprises a plurality of groups of bus lines or traces corresponding to the plurality of I/O ports (of the FPGA IC chips), and each group of bus lines or traces may comprise n bus lines or traces, wherein n is equal to or greater than 4, 8, 16, 32, 64, 128, 256, 512, or 1024.

Another aspect of the disclosure provides the standard commodity logic drive in a multi-chip package comprising the plural standard commodity FPGA/HBM CSPs and one or more non-volatile memory IC chips, for use in different applications requiring logic, computing and/or processing functions by field programming, wherein each of the plural standard commodity FPGA/HBM CSPs comprises one standard commodity FPGA IC chip and one HBM chip mounted on the standard commodity FPGA IC chip or a stacked package with plural HBM chips mounted on the standard commodity FPGA IC chip. Each of the plural standard commodity FPGA IC chips may have standard common features or specifications as described and specified above. Each of the plural standard commodity FPGA IC chip may comprise multiple logic blocks, wherein each logic block may comprise, for example, (1) 1 to 16 of 8-by-8 adders, (2) 1 to 16 of 8-by-8 multipliers, (3) 256 to 2K of logic cells, wherein each logic cell comprises 1 register and 1 to 4 of LUTs (Look-Up-Tables), wherein each LUT comprises 4 to 256 bits of data or information. The above 1 to 16 of 8-by-8 adders and/or 1 to 16 of 8-by-8 multipliers may be designed and formed by fixed metal wires or lines (metal interconnection wires or lines) on each of the FPGA IC chips.

Another aspect of the disclosure provides the standard commodity logic drive in a multi-chip package comprising plural standard commodity FPGA/HBM CSPs and one or more non-volatile memory IC chips, for use in different algorithms, architectures and/or applications requiring logic, computing and/or processing functions by field programming, wherein each of the plural standard commodity FPGA/HBM CSPs comprises one standard commodity FPGA IC chip and one HBM chip mounted on the standard commodity FPGA IC chip or a stacked package with plural HBM chips mounted on the standard commodity FPGA IC chip. The standard commodity logic drive may have standard common features, counts or specifications: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The logic drive may also comprise the I/O pads, metal pillars or bumps connecting or coupling to Serial Advanced Technology Attachment (SATA) ports, or Peripheral Components Interconnect express (PCIe) ports for communicating, connecting or coupling with the memory drive. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package further comprising a dedicated control chip. The dedicated control chip is designed, implemented and fabricated using varieties of semiconductor technology nodes or generations, including old or matured technology nodes or generations, for example, less advanced than or equal to, or above or equal to 40 nm, 50 nm, 90 nm, 130 nm, 250 nm, 350 nm, or 500 nm. The semiconductor technology node or generation used in the dedicated control chip is 1, 2, 3, 4, 5 or greater than 5 nodes or generations older, more matured or less advanced than that used in the standard commodity FPGA IC chips packaged in the same logic drive. Transistors used in the dedicated control chip may be a FINFET, a Fully Depleted Silicon-on-insulator (FDSOI) MOSFET, a Partially Depleted Silicon-on-insulator (PDSOI) MOSFET or a conventional MOSFET. Transistors used in the dedicated control chip may be different from that used in the standard commodity FPGA IC chips packaged in the same logic drive; for example, the dedicated control chip may use the conventional MOSFET, while the standard commodity FPGA IC chips (in the FPGA/HBM CSPs) packaged in the same logic drive may use the FINFET; or the dedicated control chip may use the Fully Depleted Silicon-on-insulator (FDSOI) MOSFET, while the standard commodity FPGA IC chips packaged in the same logic drive may use the FINFET. The dedicated control chip provides control functions of: (1) downloading programing codes from outside (of the logic drive) to the non-volatile IC chips in the logic drive; (2) downloading the programing codes from the non-volatile IC chips in the logic drive to the 5 T or 6 T SRAM cells of the programmable interconnection on the standard commodity FPGA IC chips. Alternatively, the programming codes from the non-volatile IC chips in the logic drive may go through a buffer or driver in or of the dedicated control chip before getting into the 5 T or 6 T SRAM cells of the programmable interconnection on the standard commodity FPGA chips. The buffer in or of the dedicated control chip may latch the data from the non-volatile chips and increase the bit-width of the data. For example, the data bit-width (in a SATA standard) from the non-volatile chips is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chips is 32 bits, the buffer may increase the data bit-width to equal to or greater than 64, 128, or 256 data bit-width. The driver in or of the dedicated control chip may amplify the data signals from the non-volatile chips; (3) inputting/outputting signals for a user application; (4) power management; (5) downloading data from the non-volatile IC chips in the logic drive to the 5 T or 6 T SRAM cells of the LUTs on the standard commodity FPGA IC chips. Alternatively, the data from the non-volatile IC chips in the logic drive may go through a buffer or driver in or of the dedicated control chip before getting into the 5 T or 6 T SRAM cells of LUTs on the standard commodity FPGA IC chips. The buffer in or of the dedicated control chip may latch the data from the non-volatile chips and increase the bit-width of the data. For example, the data bit-width (in a SATA standard) from the non-volatile chips is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chips is 32 bits, the buffer may increase the data bit-width to equal to or greater than 64, 128, or 256 data bit-width. The driver in or of the dedicated control chip may amplify the data signals from the non-volatile chips.

Another aspect of the disclosure provides the standard commodity logic drive in a multi-chip package further comprising a dedicated I/O chip. The dedicated I/O chip is designed, implemented and fabricated using varieties of semiconductor technology nodes or generations, including old or matured technology nodes or generations, for example, a semiconductor node or generation less advanced than or equal to, or above or equal to 40 nm, 50 nm, 90 nm, 130 nm, 250 nm, 350 nm, or 500 nm. The semiconductor technology node or generation used in the dedicated I/O chip is 1, 2, 3, 4, 5 or greater than 5 nodes or generations older, more matured or less advanced than that used in the standard commodity FPGA IC chips (of the FPGA/HBM CSPs) packaged in the same logic drive. Transistors used in the dedicated I/O chip may be a Fully Depleted Silicon-on-insulator (FDSOI) MOSFET, a Partially Depleted Silicon-on-insulator (PDSOI) MOSFET or a conventional MOSFET. Transistors used in the dedicated I/O chip may be different from that used in the standard commodity FPGA IC chips packaged in the same logic drive; for example, the dedicated I/O chip may use the conventional MOSFET, while the standard commodity FPGA IC chips packaged in the same logic drive may use the FINFET; or the dedicated I/O chip may use the Fully Depleted Silicon-on-insulator (FDSOI) MOSFET, while the standard commodity FPGA IC chips packaged in the same logic drive may use the FINFET. The power supply voltage used in the dedicated I/O chip may be greater than or equal to 1.5V, 2.0 V, 2.5V, 3 V, 3.5V, 4V, or 5V, while the power supply voltage used in the standard commodity FPGA IC chips packaged in the same logic drive may be smaller than or equal to 2.5V, 2V, 1.8V, 1.5V, or 1 V. The power supply voltage used in the dedicated I/O chip may be different from that used in the standard commodity FPGA IC chips packaged in the same logic drive; for example, the dedicated I/O chip may use a power supply of 4V, while the standard commodity FPGA IC chips packaged in the same logic drive may use a power supply voltage of 1.5V; or the dedicated I/O chip may use a power supply of 2.5V, while the standard commodity FPGA IC chips packaged in the same logic drive may use a power supply of 0.75V. The gate oxide (physical) thickness of the Field-Effect-Transistors (FETs) may be thicker than or equal to 5 nm, 6 nm, 7.5 nm, 10 nm, 12.5 nm, or 15 nm, while the gate oxide (physical) thickness of FETs used in the standard commodity FPGA IC chips packaged in the same logic drive may be thinner than 4.5 nm, 4 nm, 3 nm or 2 nm. The gate oxide (physical) thickness of FETs used in the dedicated I/O chip may be different from that used in the standard commodity FPGA IC chips packaged in the same logic drive; for example, the dedicated I/O chip may use a gate oxide (physical) thickness of FETs of 10 nm, while the standard commodity FPGA IC chips packaged in the same logic drive may use a gate oxide (physical) thickness of FETs of 3 nm; or the dedicated I/O chip may use a gate oxide (physical) thickness of FETs of 7.5 nm, while the standard commodity FPGA IC chips packaged in the same logic drive may use a gate oxide (physical) thickness of FETs of 2 nm. The dedicated I/O chip provides inputs and outputs, and ESD protection for the logic drive. The dedicated I/O chip provides (i) large drivers or receivers, or I/O circuits for communicating with external or outside (of the logic drive) circuits, and (ii) small drivers or receivers, or I/O circuits for communicating with chips in or of the logic drive. The large drivers or receivers, or I/O circuits for communicating with external or outside (of the logic drive) circuits have driving capability, loading, output capacitance or input capacitance lager or bigger than that of the small drivers or receivers, or I/O circuits for communicating with chips in or of the logic drive. The driving capability, loading, output capacitance, or input capacitance of the large I/O drivers or receivers, or I/O circuits for communicating with external or outside (of the logic drive) circuits may be between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. The driving capability, loading, output capacitance, or input capacitance of the small I/O drivers or receivers, or I/O circuits for communicating with chips in or of the logic drive may be between 0.1 pF and 10 pF, 0.1 pF and 5 pF, 0.1 pF and 2 pF, or 0.1 pF and 1 pF; or smaller than 10 pF, 5 pF, 3 pF, 2 pF or 1 pF. The size of ESD protection device on the dedicated I/O chip is larger than that on other standard commodity FPGA IC chips in the same logic drive. The size of the ESD device in the large I/O circuits may be between 0.5 pF and 20 pF, 0.5 pF and 15 pF, 0.5 pF and 10 pF 0.5 pF and 5 pF or 0.5 pF and 2 pF; or larger than 0.5 pF, 1 pF, 2 pF, 3 pF, 5 pF or 10 pF. For example, a bi-directional (or tri-state) I/O pad or circuit may be used for the large I/O drivers or receivers, or I/O circuits for communicating with external or outside (of the logic drive) circuits, and may comprise an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. For example, a bi-directional (or tri-state) I/O pad or circuit may be used for the small I/O drivers or receivers, or I/O circuits for communicating with chips in or of the logic drive, and may comprise an ESD circuit, a receiver, and a driver, and may have an input capacitance or output capacitance between 0.1 pF and 10 pF, 0.1 pF and 5 pF, 0.1 pF and 2 pF, or 0.1 pF and 1 pF; or smaller than 10 pF, 5 pF, 3 pF, 2 pF or 1 pF.

The dedicated I/O chip (or chips) in the multi-chip package of the standard commodity logic drive may comprise a buffer and/or driver circuits for (1) downloading the programing codes from the non-volatile IC chips in the logic drive to the 5 T or 6 T SRAM cells of the programmable interconnection on the standard commodity FPGA chips. The programming codes from the non-volatile IC chips in the logic drive may go through a buffer or driver in or of the dedicated I/O chip before getting into the 5 T or 6 T SRAM cells of the programmable interconnection on the standard commodity FPGA chips. The buffer in or of the dedicated I/O chip may latch the data from the non-volatile chips and increase the bit-width of the data. For example, the data bit-width (in a SATA standard) from the non-volatile chips is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chips is 32 bits, the buffer may increase the data bit-width to equal to or greater than 64, 128, or 256 data bit-width. The driver in or of the dedicated I/O chip may amplify the data signals from the non-volatile chips; (2) downloading data from the non-volatile IC chips in the logic drive to the 5 T or 6 T SRAM cells of the LUTs on the standard commodity FPGA chips. The data from the non-volatile IC chips in the logic drive may go through a buffer or driver in or of the dedicated I/O chip before getting into the 5 T or 6 T SRAM cells of LUTs on the standard commodity FPGA chips. The buffer in or of the dedicated I/O chip may latch the data from the non-volatile chips and increase the bit-width of the data. For example, the data bit-width (in a SATA standard) from the non-volatile chips is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chips is 32 bits, the buffer may increase the data bit-width to equal to or greater than 64, 128, or 256 data bit-width. The driver in or of the dedicated I/O chip may amplify the data signals from the non-volatile chips.

The dedicated I/O chip (or chips) in the multi-chip package of the standard commodity logic drive may comprise I/O circuits or pads (or micro copper pillars or bumps) for connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The dedicated I/O chip may also comprise I/O circuits or pads (or micro copper pillars or bumps) for connecting or coupling to Serial Advanced Technology Attachment (SATA) ports, or Peripheral Components Interconnect express (PCIe) ports for communicating, connecting or coupling with the memory drive.

Another aspect of the disclosure provides the standard commodity logic drive in a multi-chip package comprising plural standard commodity FPGA/HBM CSPs and one or more non-volatile IC chips, for use in different applications requiring logic, computing and/or processing functions by field programming; wherein the one or more non-volatile memory IC chips comprises a NAND flash chip or chips, in a bare-die format or in a multi-chip flash package format. Each of the one or more NAND flash chips may has a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. The NAND flash chip may be designed and fabricated using advanced NAND flash technology nodes or generations, for example, more advanced than or equal to 45 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32, 72 stacked layers or levels of NAND cells.

Another aspect of the disclosure provides the standard commodity logic drive in a multi-chip package comprising plural standard commodity FPGA/HBM CSPs and one or more non-volatile IC chips, for use in different applications requiring logic, computing and/or processing functions by field programming; wherein the one or more non-volatile memory IC chips comprises a NAND flash chip or chips, in a bare-die format or in a multi-chip flash package format. The standard commodity logic drive may have a standard non-volatile memory density, capacity or size of greater than or equal to 8 MB, 64 MB, 128 GB, 512 GB, 1 GB, 4 GB, 16 GB, 64 GB, 256 GB, or 512 GB, wherein "B" is bytes, each byte has 8 bits.

Another aspect of the disclosure provides the standard commodity logic drive in a multi-chip package comprising the plural standard commodity FPGA/HBM CSPs, the dedicated I/O chip, the dedicated control chip and the one or more non-volatile memory IC chips, for use in different applications requiring logic, computing and/or processing functions by field programming. The communication between the chips of the logic drive and the communication between each chip of the logic drive and the external or outside (of the logic drive) circuits are described as follows: (1) the dedicated I/O chip communicates directly with the other chip or chips of the logic drive, and also communicates directly with the external or outside circuits (of the logic drive). The dedicated I/O chip comprises two types of I/O circuits; one type having large driving capability, loading, output capacitance or input capacitance for communicating directly with the external or outside circuits of the logic drive, and the other type having small driving capability, loading, output capacitance or input capacitance for communicating directly with the other chip or chips of the logic drive; (2) each of the plural FPGA IC chips (in the FPGA/HBM CSPs) only communicates directly with the other chip or chips of the logic drive, but does not communicate directly and/or does not communicate with the external or outside circuits (of the logic drive); wherein an I/O circuit of one of the plural FPGA IC chips may communicate indirectly with the external or outside circuits (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one of the plural FPGA IC chips, wherein the I/O circuit (for example, the input or output capacitance is smaller than 2 pF) of the one of the plural FPGA IC chips is connected or coupled to the large or big I/O circuit (for example, the input or output capacitance is larger than 3 pF) of the dedicated I/O chip for communicating with the external or outside circuits of the logic drive; (3) the dedicated control chip only communicates directly with the other chip or chips of the logic drive, but does not communicate directly and/or does not communicate with the external or outside circuits (of the logic drive); wherein an I/O circuit of the dedicated control chip may communicate indirectly with the external or outside circuits (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the dedicated control chip. Alternatively, wherein the dedicated control chip may communicate directly with the other chip or chips of the logic drive, and may also communicate directly with the external or outside circuits (of the logic drive), wherein the dedicated control chip comprises both small and large I/O circuits for these two types of communication, respectively; (4) each of the one or more non-volatile memory IC chips only communicates directly with the other chip or chips of the logic drive, but does not communicates directly and/or does not communicate with the external or outside circuits (of the logic drive); wherein an I/O circuit of the one or more non-volatile memory IC chips may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one or more non-volatile memory IC chips. Alternatively, wherein the one or more non-volatile memory IC chips may communicate directly with the other chip or chips of the logic drive, and may also communicate directly with the external or outside circuits (of the logic drive), wherein the one or more non-volatile memory IC chips comprises both small and large I/O circuits for these two types of communication, respectively. In the above, “Object X communicates directly with Object Y” means the Object X (for example, a first chip of the logic drive) communicates or couples electrically and directly with the Object Y without going through or passing through any other chip or chips of the logic drive. In the above, “Object X does not communicate directly with Object Y” means the Object X (for example, a first chip of or in the logic drive) may communicate or couple electrically but indirectly with the Object Y by going through or passing through any other chip or chips of the logic drive. “Object X does not communicate with Object Y” means the Object X (for example, a first chip of the logic drive) does not communicate or couple electrically and directly, and does not communicate or couple electrically and indirectly with the Object Y.

Another aspect of the disclosure provides the standard commodity logic drive in a multi-chip package further comprising a dedicated control and I/O chip. The dedicated control and I/O chip provides the functions of the dedicated control chip and the dedicated I/O chip, as described in the above paragraphs, in one chip.

Another aspect of the disclosure provides a development kit or tool for a user or developer to implement an innovation or an application using the standard commodity logic drive. The user or developer with innovation or application concept or idea may purchase the standard commodity logic drive and use the corresponding development kit or tool to develop or to write software codes or programs to load into the non-volatile memory of the standard commodity logic drive for implementing his/her innovation or application concept or idea.

Another aspect of the disclosure provides a logic drive in a multi-chip package format further comprising an Innovated ASIC or COT (abbreviated as IAC below) chip for Intellectual Property (IP) circuits, Application Specific (AS) circuits, analog circuits, mixed-mode signal circuits, Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or above or equal to 40 nm, 50 nm, 90 nm, 130 nm, 250 nm, 350 nm or 500 nm. Alternatively, the advanced semiconductor technology nodes or generations, such as more advanced than or equal to, or below or equal to 40 nm, 20 nm or 10 nm, may be used for the IAC chip. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a Fully Depleted Silicon-on-insulator (FDSOI) MOSFET, a Partially Depleted Silicon-On-Insulator (PDSOI) MOSFET or a conventional MOSFET. Transistors used in the IAC chip may be different from that used in the standard commodity FPGA IC chips packaged in the same logic drive; for example, the IAC chip may use the conventional MOSFET, while the standard commodity FPGA IC chips packaged in the same logic drive may use the FINFET; or the IAC chip may use the Fully Depleted Silicon-on-insulator (FDSOI) MOSFET, while the standard commodity FPGA IC chips packaged in the same logic drive may use the FINFET. Since the IAC chip in this aspect of disclosure may be designed and fabricated using older or less advanced technology nodes or generations, for example, less advanced than or equal to, or more mature than, 20 nm or 30 nm, and for example using the technology node of 22 nm, 28 nm, 40 nm, 90 nm, 130 nm, 180 nm, 250 nm, 350 nm, or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the logic drive including the IAC chip designed and fabricated using older or less advanced technology nodes or generations may reduce NRE cost down to less than US $10M, US $7M, US $5M, US $3M or US $1M. Compared to the implementation by developing the current conventional logic ASIC or COT IC chip, the NRE cost of developing the IAC chip for the same or similar innovation and/or application may be reduced by a factor of larger than 2, 5, 10, 20, or 30. The innovators therefor can cheaply and easily implement their innovation by (i) designing the IAC chip using older and more mature technology nodes, for example, 40 nm or more mature than or equal to 20 nm; and (ii) using standard commodity FPGA IC chips packaged in a same logic drive, wherein the standard commodity FPGA IC chips are fabricated using advanced technology nodes, for example, 7 nm node, more advanced than 20 nm or more advanced than 7 nm.

Another aspect of the disclosure provides a method to change the logic ASIC or COT IC chip hardware business into a mainly software business by using the logic drive. Since the performance, power consumption and engineering and manufacturing costs of the logic drive may be better or equal to the current conventional ASIC or COT IC chip for a same or similar innovation or application, the current ASIC or COT IC chip design companies or suppliers may become mainly software developers, while only designing the IAC chip, as described above, using older or less advanced semiconductor technology nodes or generations. In this aspect of disclosure, they may (1) design and own the IAC chip; (2) purchase from a third party the standard commodity FPGA chips and standard commodity non-volatile memory chips in the bare-die or packaged format; (3) design and fabricate (may outsource the manufacturing to a third party of the manufacturing provider) the logic drive including their own IAC chip, and the purchased third party's standard commodity FPGA IC chips and standard commodity non-volatile memory chips; (3) install in-house developed software for the innovation or application in the non-volatile memory IC chip or chips in the logic drive; and/or (4) sell the program-installed logic drive to their customers. In this case, they still sell hardware without performing the expensive ASIC or COT IC chip design and production using advanced semiconductor technology nodes, for example, nodes or generations more advanced than or below 30 nm, 20 nm or 10 nm. They may write software codes to program the logic drive comprising the plural of standard commodity FPGA IC chips for their desired applications, for example, in applications of Artificial Intelligence (AI), machine learning, deep learning, big data, Internet Of Things (JOT), industry computing, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides the logic drive in a multi-chip package comprising plural standard commodity FPGA/HBM CSPs and one or more non-volatile IC chips, further comprising processing and/or computing IC chips, for example, one or plural Central Processing Unit (CPU) chips, one or plural Graphic Processing Unit (GPU) chips, one or plural Digital Signal Processing (DSP) chips, one or plural Tensor Processing Unit (TPU) chips, and/or one or plural Application Processing Unit (APU) chips, designed, implemented and fabricated using an advanced semiconductor technology node or generation, for example more advanced than or equal to, or below or equal to 50 nm, 30 nm, 20 nm or 10 nm, which may be the same as, one generation or node less advanced than, or one generation or node more advanced than that used for the FPGA IC chips in the same logic drive. Alternatively, the logic drive may comprise the combination of the plural processing and/or computing IC chips: (1) plural GPU chips, for example 2, 3, 4 or more than 4 GPU chips, (2) one or plural CPU chips and/or one or plural GPU chips, (3) one or plural CPU chips and/or one or plural DSP chips, (3) one or plural CPU chips, one or plural GPU chips and/or one or plural DSP chips, (4) one or plural CPU chips and/or one or plural TPU chips, or, (5) one or plural CPU chips, one or plural DSP chips and/or one or plural TPU chips. In all of the above alternatives, the logic drive may comprise one or plural of the processing and/or computing IC chips, and one or plural high speed, wide bit-width and high bandwidth cache SRAM chips or DRAM IC chips (HBM) for high speed parallel processing and/or computing. For example, the logic drive may comprise plural GPU chips, for example 2, 3, 4 or more than 4 GPU chips, and plural high speed, wide bit-width and high bandwidth cache SRAM chips or DRAM IC chips (HBM). The communication between one of GPU chips and one of SRAM or DRAM IC chips may be with data bit-width of equal or greater than 64, 128, 256, 512, 1024, 2048, 4096, 8K, or 16K. For another example, the logic drive may comprise plural TPU chips, for example 2, 3, 4 or more than 4 TPU chips, and plural high speed, wide bit-width and high bandwidth cache SRAM chips or DRAM IC chips. The communication between one of TPU chips and one of SRAM or DRAM IC chips may be with data bit-width of equal or greater than 64, 128, 256, 512, 1024, 2048, 4096, 8K, or 16K.

The communication, connection, or coupling between one of logic, processing and/or computing chips (for example, FPGA, CPU, GPU, DSP, APU, TPU, and/or ASIC chips) and one of high speed, wide bit-width and high bandwidth SRAM, DRAM or NVM RAM (for example, MRAM, RRAM) chips, through the TISD or FOISD of the FOIT multichip package (to be described and specified below), may be the same or similar as that between internal circuits in a same chip. Alternatively, the communication, connection, or coupling between one of logic, processing and/or computing chips (for example, FPGA, CPU, GPU, DSP, APU, TPU, and/or ASIC chips) and one of high speed, wide bit-width and high bandwidth SRAM, DRAM or NVM RAM chips, through the TISD or FOISD of the FOIT multichip package, may be using small I/O drivers and/or receivers on both logic, processing and/or computing chips and SRAM, DRAM or NVM RAM chips. The driving capability, loading, output capacitance, or input capacitance of the small I/O drivers or receivers, or I/O circuits may be between 0.01 pF and 10 pF, 0.05 pF and 5 pF, 0.01 pF and 2 pF, or 0.01 pF and 1 pF; or smaller than 10 pF, 5 pF, 3 pF, 2 pF, 1 pF, 0.5 pF or 0.1 pF. For example, a bi-directional (or tri-state) I/O pad or circuit may be used for the small I/O drivers or receivers, or I/O circuits for communicating between high speed, wide bit-width and high bandwidth logic and memory chips in the logic drive, and may comprise an ESD circuit, a receiver, and a driver, and may have an input capacitance or output capacitance between 0.01 pF and 10 pF, 0.05 pF and 5 pF, 0.01 pF and 2 pF, 0.01 pF and 1 pF; or smaller than 10 pF, 5 pF, 3 pF, 2 pF, 1 pF, or 0.5 pF or 0.1 pF.

The processing and/or computing IC chip or chips in the logic drive provide fixed-metal-line (non-field-programmable) interconnects for (non-field-programmable) functions, processors and operations. The standard commodity FPGA IC chips provide (1) programmable-metal-line (field-programmable) interconnects for (field-programmable) logic functions, processors and operations and (2) fixed-metal-line (non-field-programmable) interconnects for (non-field-programmable) logic functions, processors and operations. Once the programmable-metal-line interconnects in or of the FPGA IC chips are programmed, the programmed interconnects together with the fixed interconnects in or of the FPGA chips provide some specific functions for some given applications. The operational FPGA chips may operate together with the processing and/or computing IC chip or chips in the same logic drive to provide flexibility, programmability and powerful functions and operations in applications, for example, Artificial Intelligence (AI), machine learning, deep learning, big data, Internet Of Things (IOT), industry computing, Virtual Reality (VR), Augmented Reality (AR), driverless car electronics, Graphic Processing (GP), Digital Signal Processing (DSP), Micro Controlling (MC), and/or Central Processing (CP).

Another aspect of the disclosure provides the standard commodity FPGA IC chip for use in the FPGA/HBM CSPs. The FPGA/HBM CSPs are used in the multi-chip packaged logic drive. The standard commodity FPGA chip is designed, implemented and fabricated using an advanced semiconductor technology node or generation, for example more advanced than or below 20 nm or 10 nm. The standard commodity FPGA/HBM CSP comprises standard commodity FPGA IC chips, wherein the standard commodity FPGA IC chips comprise Through Package metal Vias, Through Polymer metal Vias, Through Polymer metal posts, or Through Polymer metal pillars (all are abbreviated as TPVCs) on or over the FPGA IC silicon substrates. The standard commodity FPGA IC chips with TPVCs are fabricated by the process steps described in the following paragraphs:

(1) Providing a semiconductor substrate (for example, a silicon substrate), or a Silicon-On-Insulator (SOI) substrate, with the substrate in the wafer form, and with a wafer size, for example 8", 12" or 18" in the diameter. The transistors are formed in the advanced semiconductor technology node or generation may be a GAAFET, a FINFET, a FINFET on Silicon-on-insulator (FINFET SOI), a Fully Depleted Silicon-on-insulator (FDSOI) MOSFET, a Partially Depleted Silicon-on-insulator (PDSOI) MOSFET or a conventional MOSFET.

(2) Forming a First Interconnection Scheme in, on or of the Chip (FISC) over the substrate and on or over a layer comprising transistors, by a wafer process. The FISC comprises multiple interconnection metal layers, with an inter-metal dielectric layer between each of the multiple interconnection metal layers. The FISC structure may be formed by performing a single damascene copper process and/or a double damascene copper process. The FISC may comprise 4 to 15 layers, or 6 to 12 layers of interconnection metal layers.

The metal lines or traces in the FISC are coupled or connected to the underlying transistors. The thickness of the metal lines or traces of the FISC, either formed by the single-damascene process or by the double-damascene process, is, for example, between 3 nm and 500 nm, or between 10 nm and 1,000 nm, or, thinner than or equal to 5 nm, 10 nm, 30 nm, 50 nm, 100 nm, 200 nm, 300 nm, 500 nm, or 1,000 nm. The width of the metal lines or traces of the FISC is, for example, between 3 nm and 500 nm, or between 10 nm and 1,000 nm, or, narrower than 5 nm, 10 nm, 20 nm, 30 nm, 70 nm, 100 nm, 300 nm, 500 nm or 1,000 nm. The thickness of the inter-metal dielectric layer has a thickness, for example, between 3 nm and 500 nm, or between 10 nm and 1,000 nm, or thinner than 5 nm, 10 nm, 30 nm, 50 nm, 100 nm, 200 nm, 300 nm, 500 nm or 1,000 nm. The metal lines or traces of the FISC may be used for the programmable interconnection.

(3) Depositing a passivation layer on or over the whole wafer and on or over the FISC structure. The passivation is used for protecting the transistors and the FISC structure from water moisture or contamination from the external environment, for example, sodium mobile ions. The passivation comprises a mobile ion-catching layer or layers, for example, SiN, SiON, and/or SiCN layer or layers. The total thickness of the mobile ion catching layer or layers is thicker than or equal to 100 nm, 150 nm, 200 nm, 300 nm, 450 nm, or 500 nm. Openings in the passivation layer may be formed to expose the top surface of the top-most interconnection metal layer of the FISC, and for forming vias in the passivation openings in the following processes later.

(4) Forming a Second Interconnection Scheme in, on or of the Chip (SISC) on or over the FISC structure. The SISC comprises multiple interconnection metal layers, with an inter-metal dielectric layer between each of the multiple interconnection metal layers, and may optionally comprise an insulating dielectric layer on or over the passivation layer, and between the bottom-most interconnection metal layer of the SISC and the passivation layer. A polymer material may be used for the inter-metal dielectric layer, for example, polyimide, BenzoCycloButene (BCB), parylene, epoxy-based material or compound, photo epoxy SU-8, elastomer or silicone. An emboss copper electroplating process is then performed to form metal layer or metal vias in the SISC. The SISC may comprise 2 to 6, or 3 to 5 layers of interconnection metal layers. The metal lines or traces of the interconnection metal layers of the SISC have the adhesion layer (Ti or TiN, for example) and the copper seed layer only at the bottom, but not at the sidewalls of the metal lines or traces. The metal lines or traces of the interconnection metal layers of FISC have the adhesion layer (Ti or TiN, for example) and the copper seed layer at both the bottom and the sidewalls of the metal lines or traces.

The SISC interconnection metal lines or traces are coupled or connected to the FSIC interconnection metal lines or traces, or to transistors in the chip, through vias in openings of the passivation layer. The thickness of the metal lines or traces of SISC is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISC is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISC may be used for the programmable interconnection.

(5) Forming micro copper pads, for flip-chip assembly of the HBM IC chips or packages on the FPGA IC chip, by exposing top surfaces of the top-most interconnection metal layer in the openings of the top-most insulating dielectric layer of SISC.

Alternatively, micro copper pads, pillars or bumps with solder caps, for flip-chip assembly of the HBM IC chips or packages on the FPGA IC chip, may be formed (i) on the top surface of the top-most interconnection metal layer of SISC, (or FISC if SISC is omitted), exposed in openings in the insulating dielectric layer of the SISC, and/or (ii) on or over the top-most insulating dielectric layer of the SISC, (or FISC if SISC is omitted). An emboss metal electroplating process, as described in above paragraphs, is performed to form the micro copper pads, pillars or bumps with solder caps. The micro copper pads, pillars or bumps with solder caps are coupled or connected to the SISC and FISC interconnection metal lines or traces, and to transistors in or of the chip, through vias in openings in the top-most insulating dielectric layer of the SISC, (or FISC if SISC is omitted). The height of the micro pillars or bumps is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The largest dimension in a cross-section of the micro pillars or bumps (for example, the diameter of a circle shape, or the diagonal length of a square or rectangle shape) is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The space between a micro pillar or bump to its nearest neighboring pillar or bump is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

(6) Forming TPVCs on or over the FPGA Chip wafer (TPVC). The TPVCs are formed at locations where no HBM IC chips or packages are to be flip-chip assembled on the FPGA IC chip. The TPVCs are formed by an embossing copper electroplating process and used for signal, power and/or ground interconnecting the FISC and/or SISC to the external circuits of the FPGA/HBM CSP (to be formed later).

In the case that the exposed copper pads in openings of the top-most insulating dielectric layer of SISC or FISC are used for flip-chip assembly of the HBM IC chips or packages on the FPGA IC chip, the TPVCs are formed by an embossing copper electroplating process on or over the exposed copper pads in openings of the top-most insulating dielectric layer of SISC or FISC (if SISC is omitted), but are not formed on or over the exposed copper pads in openings used for flip-chip assembly of the HBM IC chips or packages on the FPGA IC chip.

In the case that micro copper pads, pillars or bumps with solder caps are used for flip-chip assembly of the HBM IC chips or packages on the FPGA IC chip, the process steps for forming both the micro copper pads, pillars or bumps for flip-chip assembly and the TPVCs are as follows: (i) depositing whole FPGA IC wafer an adhesion layer on or over the top-most insulting dielectric layer (of SISC, or FISC if SISC is omitted) and the exposed top surfaces of the top-most interconnection layer of FISC or SISC at the bottom of the openings in top-most insulating dielectric layer, for example, sputtering or CVD depositing a titanium (Ti) or titanium nitride (TiN) layer (with a thickness, for example, between 1 nm to 200 nm, or 5 nm and 50 nm); (ii) then depositing an electroplating seed layer on or over the adhesion layer, for example, sputtering or CVD depositing a copper seed layer (with a thickness, for example, between 3 nm and 300 nm, or 10 nm and 120 nm); (iii) depositing a first photoresist layer and patterning openings or holes in the first photoresist layer, for forming the flip-chip micro copper pads, pillars or bumps later, by coating, exposing and developing the first photoresist layer, exposing the copper seed layer at the bottom of the openings or holes in the first photoresist layer. The first photoresist layer has a thickness, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The opening or hole in the first photoresist layer overlaps the opening in the top-most insulating dielectric layer of the SISC or FISC; and may extend out of the opening of the insulating dielectric layer, to an area or a ring of the insulating dielectric layer around the opening in the insulating dielectric layer; (iv) then electroplating a copper layer (with a thickness, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm) on or over the copper seed layer in the patterned openings or holes of the first photoresist layer; (v) removing the remained first photoresist, and exposed the surfaces of copper seed layer; (vi) depositing a second photoresist layer and patterning openings or holes in the second photoresist layer for forming the TPVCs later by coating, exposing and developing the second photoresist layer, exposing the copper seed layer at the bottom of the openings or holes in the second photoresist layer. The second photoresist layer has a thickness, for example, between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm). The locations of the openings or holes in the second photoresist layer are in the gaps or spaces between HBM DRAM IC chips or the HBM DRAM Stacked Chip Scale Packages (SCSP) in or of the FPGA/HBM CSP (to be formed latter), that is, in peripheral area of each of the FPGA IC chips. The locations of the openings or holes in the second photoresist layer are outside the edges or sidewalls of the HBM DRAM IC chips or the HBM DRAM Stacked Chip Scale Package (SCSP); while the flip-chip micro copper pads, pillars or bumps to be used for flip-chip bonding in latter processes are located (after flip-chip assembly) inside the edges of and vertically under the HBM DRAM IC chips or the HBM DRAM Stacked Chip Scale Package (SCSP); (vii) then electroplating a copper layer (with a thickness, for example, between 20 μm and 300 μm, 30 μm and 200 μm, 50 μm and 150 μm, 50 μm and 120 μm, 20 μm and 100 μm, 20 μm and 60 μm, 20 μm and 40 μm, or 20 μm and 30 μm) on or over the copper seed layer in the patterned openings or holes of the second photoresist layer; (viii) removing the remained second photoresist to expose the copper seed layer; (ix) removing or etching the copper seed layer and the adhesion layer not under the electroplated coppers for both TPVCs and flip-chip micro copper pads, pillars or bumps. Alternatively, the micro copper pads, pillars, or bumps may be formed at the locations of TPVCs while forming the flip-chip micro copper pads, pillars or bumps, process steps (i) to (v). In this case, in the process step (vi), in depositing a second photoresist layer and patterning openings or holes in the second photoresist layer for forming the TPVCs by coating, exposing and developing the second photoresist layer, the top surfaces of the micro copper pads, pillars or bumps at the locations of TPVCs to be formed later are exposed, but the top surfaces of the flip-chip micro copper pads, pillars or bumps not at the locations of TPVCs are not exposed; and, in the process step (vii), electroplating a copper layer starts from the top surfaces of the micro copper pads, pillars or bumps.

The height of TPVCs (from the level of top surface of the top-most insulating layer to the level of the top surface of the TPVCs) is between 20 μm and 300 μm, 30 μm and 200 μm, 50 μm and 150 μm, 50 μm and 120 μm, 20 μm and 100 μm, 20 μm and 60 μm, 20 μm and 40 μm, or 20 μm and 30 μm, or greater than or taller than or equal to 100 μm, 50 μm, 30 μm, or 20 μm. The largest dimension in a cross-section of the TPVCs (for example, the diameter of a circle shape or the diagonal length of a square or rectangle shape) is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm. The smallest space between a TPVC and its nearest neighboring TPVC is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm. The height of the TPVCs is taller than that of the copper pads, pillar or bumps by greater than 20 micrometers or 50 micrometers.

The wafer of the FPGA IC chips, with the FISC, SISC, flip-chip micro copper pads, pillars and the tall copper pillars, posts or bumps (TPVCs), are then used for flip-chip assembling or bonding the HBM DRAM IC chip or the HBM Stacked Chip Scale Package (HBM SCSP) to the flip-chip micro copper pads, pillars or bumps on or of them for forming a FPGA/HBM CSP.

Another aspect of the disclosure provides an HBM Stacked Chip Scale Package (HBM SCSP). The HBM Stacked Chip Scale Package (HBM SCSP) comprises an ASIC or logic chip and plural High Bandwidth high speed Memory IC chips (HBM, for example, DRAM IC chips, cache SRAM chips or high speed non-volatile Memory chips, for example, Magnetic RAM (MRAM), Resistive RAM (RRAM) or Phase shifted RAM (PRAM)) stacked assembled on the ASIC or logic chip. The ASIC or logic chip and the plural HBM DRAM IC chips, each has Through Silicon Vias (TSVs) in its silicon substrate for use in electrical communication with the other chip or chips staked assembled in the HBM SCSP, and the FPGA IC chip in the FPGA/HBM CSP. One HBM SCSP may comprise 2, 4, 8, 16, 24, 32 HBM DRAM IC chips, or equal to or greater than 2, 4, 8, 16, 32 HBM DRAM IC chips. Each HBM DRAM IC chip may have the memory density of 512 Mb, 1 Gb, 4 Gb, 8 Gb, 16 Gb, 32 Gb, 64 Gb, or equal to or greater than 256 Mb, 1 Gb, 8 Gb, 16 Gb, wherein b is bit. The HBM DRAM IC chips may be with data bit-width of equal or greater than 64, 128, 256, 512, 1024, 2048, 4096, 8K, or 16K for communication with the FPGA chip in the FPGA/HBM CSP, through the TSVs in the HBM DRAM IC chips or the ASIC or logic chip in the FPGA/HMB CSP. The HBM DRAM IC chips are designed with small I/O drivers or receivers, or I/O circuits with small driving capability, wherein the loading, output capacitance, or input capacitance may be between 0.05 pF and 2 pF, or 0.05 pF and 1 pF, or smaller than 2 pF or 1 pF, for communication with the FPGA chip in the FPGA/HBM CSP. The ASIC or logic chip is used for buffers, DRAM memory controls, or interface circuits, and may be located at the bottom of HBM SCSP package. The HBM SCSP packages have solder bumps or copper pillars at the bottom of the HBM SCSP packages. The HBM SCSP and the HBM DRAM IC chips are designed in standard common specifications and features physically and functionally.

Another aspect of the disclosure provides a method of forming the standard commodity FPGA/HBM CSPs for use in the logic drive; wherein each of the one or plural standard commodity FPGA/HBM CSPs comprises one standard commodity FPGA IC chip and (i) one HBM DRAM IC chip mounted on the standard commodity FPGA IC chip, wherein the HBM DRAM IC chip may have or may not have TSVs in its silicon substrate, or (ii) a stacked package with plural HBM chips (HBM SCSP) mounted on the standard commodity FPGA IC chip, wherein the HBM DRAM IC chips have TSVs in their silicon substrates. The standard commodity FPGA IC chip comprises the FISC, SISC, flip-chip micro copper pads, pillars and the tall copper pillars, posts or bumps (TPVCs). The locations of the TPVCs are in a space outside and beyond the edges or sidewalls of the HBM DRAM IC chip or the HBM DRAM Stacked Chip Scale Package (SCSP), for example, on or over the peripheral area of each of the FPGA IC chips where no HBM DRAM IC chip or the HBM DRAM Stacked Chip Scale Package (SCSP) is to be flip-chip assembled on or over. The flip-chip micro copper pads, pillars or bumps to be used for flip-chip bonding in latter processes are located in a space inside the edges of and vertically under the HBM DRAM IC chip or the HBM DRAM Stacked Chip Scale Package (SCSP). The standard commodity FPGA IC chip and the HBM chip or the stacked package with plural HBM DRAM IC chips (HBM SCSP) are described and specified in above. The process steps for forming the FPGA/HBM CSPs are described as below:

(1) Performing flip-chip assembling, bonding or packaging: (a) First providing the wafers with standard commodity FPGA IC chips as described and specified above, wherein the standard commodity FPGA chips comprising the TPVCs, transistors, FISC, the SISC, micro copper pads, bumps or pillars, and providing HBM DRAM IC chips or HBM SCSP packages; then flip-chip assembling, bonding or packaging the HBM DRAM IC chip or HBM SCSP package to and on the micro copper pads, bumps or pillars on each of the FPGA IC chips on the wafer. The FPGA IC wafer is formed as described and specified above. The HBM DRAM IC chips or HBM SCSP packages to be assembled, bonded or packaged to the FPGA wafer are described and specified above. All HBM DRAM IC chips or HBM SCSP packages to be flip-chip packaged in the FPGA wafer comprise solder bumps or copper pillars on the top surfaces thereof. Here, for the HBM SCSPs, the ASIC or logic chips are at the bottoms of the stacks. The copper pads may be provided and exposed at the top surface of the FPGA wafer for flip-chip assembly. Alternatively, copper pads or pillars, or solder bumps on the top surface of the FPGA wafer may be used for flip-chip assembly. The top surfaces of the copper pads or pillars, or solder bumps are at a level above a level of the top surface of the top-most insulating dielectric layer of the FPGA IC chips with a height of, for example, between 3 μm and 120 μm, 5 μm and 75 μm, 5 μm and 50 μm, 5 μm and 25 μm, 5 μm and 15 μm, or 3 μm and 10 μm, or greater than or equal to 30 μm, 20 μm, 15 μm, or 3 μm; (b) The HBM DRAM IC chips or HBM SCSP packages are flip-chip assembled, bonded or packaged on or to corresponding micro copper pads, pillars or bumps on or of the FPGA wafer with the side or surface of the FPGA wafer with transistors faced up. The backside of the silicon substrate of the HBM DRAM IC chip or HBM SCSP package (the side or surface without transistors) is faced up; (c) Filling the gaps or spaces between the FPGA wafer and the HBM DRAM IC chips or HBM SCSP packages (and between micro solder bumps or copper pillars of the HBM DRAM IC chips or HBM SCSP packages and the FPGA wafer) with an underfill material by, for example, a dispensing method using a dispenser. The TPVCs are in the gaps or spaces between the HBM DRAM IC chips or HBM SCSP packages. A clearance between the TPVCs and the edges of the HBM DRAM IC chips or HBM SCSP packages is required for the underfill dispensing. The underfill material comprises epoxy resins or compounds, and can be cured at temperature equal to or above 100° C., 120° C., or 150° C. Alternatively, the HBM IC chips or HBM SCSP packages are bonded to the FPGA chip by thermal compression bonding or oxide-to-oxide metal-to-metal direct bonding.

(2) Applying a material, resin, or compound to fill the gaps or spaces between HBM DRAM IC chips or HBM SCSP packages and cover the backside surfaces of HBM DRAM IC chips or HBM SCSP packages and the top surfaces of TPVCs by methods, for example, spin-on coating, screen-printing, dispensing or molding in the wafer format. The molding method includes the compress molding (using top and bottom pieces of molds) or the casting molding (using a dispenser). The material, resin, or compound used may be a polymer material includes, for example, polyimide, BenzoCycloButene (BCB), parylene, epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the FPGA wafer and on or over the backside of the HBM DRAM IC chips or HBM SCSP packages to a level to: (i) fill gaps or spaces between HBM DRAM IC chips or HBM SCSP packages, (ii) fill gaps or spaces between TPVCs, (iii) fill gaps or spaces between TPVCs and HBM DRAM IC chips or HBM SCSP packages, (iv) cover the top surface of the TPVCs, (v) cover the top-most backside surface of the HBM DRAM IC chips or HBM SCSP packages. The material, resin or compound may be cured or cross-linked by raising a temperature to a certain temperature degree, for example, at or higher than or equal to 50° C., 70° C., 90° C., 100° C., 125° C., 150° C., 175° C., 200° C., 225° C., 250° C., 275° C. or 300° C. The material may be polymer or molding compound. Applying a CMP, polishing or grinding process to planarize the surface of the applied material, resin or compound. The CMP, polishing or grinding process is performed until a level where the backside surfaces of all HBM DRAM IC chips or HBM SCSP packages and the top surfaces of the TPVCs are fully exposed. Alternatively, the top surfaces of TSVs in silicon substrate of the HBM DRAM IC chip or the top-most HBM DRAM IC chip of the HBM SCSP, are exposed for connecting or coupling to the interconnection schemes above to be formed latter.

(3) forming solder bumps on exposed top surfaces of the TPVCs. Alternatively, Depositing a layer of insulating dielectric layer on the planarized surface of the applied material, resin or compound, the backside surfaces of HBM DRAM IC chips or HBM SCSP packages and the exposed top surfaces of the TPVCs (and, in some cases, the exposed top surfaces of TSVs in silicon substrate of the HBM DRAM IC chip or the top-most HBM DRAM IC chip of the HBM SCSP). Then forming copper pads, pillars or solder bumps on and over the top surfaces of TPVCs and TSVs exposed in openings in the insulating dielectric layer. The copper pads, pillars or solder bumps on the TPVCs are used for connecting or coupling power, ground and signal from circuits external to the FPGA/HBM CSP to the FPGA IC chip and the HBM DRAM IC chip or the HBM DRAM IC chips of the HBM SCSP, through the TPVCs. The power supply to the HBM DRAM IC chip or the HBM DRAM IC chips of the HBM SCSP from circuits external to the FPGA/HBM CSP is through, in sequence, (i) the copper pads, pillars or solder bumps on the TPVCs, (ii) TPVCs, (iii) Power/ground buses provided by metal lines or traces having the thickness thicker than 0.5 micrometers or 1 micrometer in the SISC or top layers of FISC (for example, top 1, 2, 3, or 4 layers of FISC on the FPGA IC chip, (iv) bonding pads, pillars or bumps between the FPGA IC chip and the HBM DRAM IC chip or the HBM SCSP, (v) the power/ground buses on the HBM DRAM IC chip or the HBM DRAM IC chips of the HBM SCSP. The power supply to the FPGA IC chip from circuits external to the FPGA/HBM CSP is through, in sequence, (i) the copper pads, pillars or solder bumps on the TPVCs, (ii) TPVCs, (iii) Power/ground buses provided by metal lines or traces having the thickness thicker than 0.5 micrometers or 1 micrometer in the SISC or top layers of FISC (for example, top 1, 2, 3, or 4 layers of FISC on the FPGA IC chip.

Alternatively, a Backside metal Interconnection Scheme at the backside surfaces of HBM DRAM IC chips or HBM SCSP packages of the FPGA/HBM CSPs (abbreviated as BISCSP in below) may be formed. The BISCSP may comprise metal lines, traces, or planes in multiple interconnection metal layers, and is formed on or over (i) the backside of HBM DRAM IC chips or HBM SCSP packages (the sides of DRAM IC chips or the HBM DRAM IC chips of the HBM SCSP packages with the transistors are facing down), (ii) the molding compound after the process step of planarization of the molding compound, and (iii) the exposed top surfaces of the TPVCs, (and, in some cases, the exposed top surfaces of TSVs in silicon substrate of the HBM DRAM IC chip or the top-most HBM DRAM IC chip of the HBM SCSP). The BISCSP provides additional interconnection metal layer or layers at the backside of the FPGA/HBM CSPs, and provides copper pads, copper pillars or solder bumps in an area array at the backside of the FPGA/HBM CSPs, including at locations vertically over the HBM DRAM IC chip or HBM SCSP package of the FPGA/HBM CSP (DRAM IC chips or the HBM DRAM IC chips of the HBM SCSP packages with the transistors side faced down). The TPVCs are used for connecting or coupling circuits or components (for example, the FISC and/or SISC) of the FPGA IC chip to that (for example, the BISCSP) at the backside of the FPGA/HBM CSP. The BISCSP is formed by forming metal lines, traces, or planes in or of multiple interconnection metal layers on or over the backside of the HBM DRAM IC chip or HBM SCSP package (the side of the HBM DRAM IC chips or the HBM DRAM IC chips of the HBM SCSP packages with the transistors are faced down), the molding compound, and the exposed top surfaces of the TPVCs (and, in some cases, the exposed top surfaces of TSVs in silicon substrate of the HBM DRAM IC chip or the top-most HBM DRAM IC chip of the HBM SCSP), after the process step of planarization of the molding compound. The process steps for forming the BISCSP are: (a) depositing a bottom-most insulting dielectric layer, whole wafer, on or over the exposed backside of the IC chips, molding compound and the exposed top surfaces of the TPVCs, (and, in some cases, the exposed top surfaces of TSVs in silicon substrate of the HBM DRAM IC chip or the top-most HBM DRAM IC chip of the HBM SCSP). The bottom-most insulting dielectric layer may be a polymer material includes, for example, polyimide, BenzoCycloButene (BCB), parylene, epoxy-based material or compound, photo epoxy SU-8, elastomer, or silicone. The thickness of the cured bottom-most polymer is between, for example, 2 μm and 50 μm, 2 μm and 30 μm, 2 μm and 20 μm, or 2 μm and 15 μm; or thicker than or equal to 2 μm, 3 μm, 5 μm, 10 μm, 20 μm, or 30 μm; (b) performing an emboss copper process to form the metal vias in the openings of the cured bottom-most polymer insulating dielectric layer, and to form metal lines, traces or planes of an bottom-most interconnection metal layer of the BISCSP on or over the insulating dielectric layer. The processes of forming the bottom-most insulating dielectric layer and openings in it; and the emboss copper processes for forming the metal vias in the bottom-most insulting dielectric layer and the metal lines, traces, or planes of the bottom-most interconnection metal layer, may be repeated to form a metal layer of multiple interconnection metal layers in or of the BISCSP; wherein the repeated bottom-most insulating dielectric layer is used as the inter-metal dielectric layer between two interconnection metal layers of the BISCSP, and the metal vias in the bottom-most insulating dielectric layer (now in the inter-metal dielectric layer) are used for connecting or coupling metal lines, traces, or planes of the two interconnection metal layers, above and below the metal vias, of the BISCSP. The top-most interconnection metal layer of the BISCSP is covered with a top-most insulating dielectric layer of the BISCSP. Forming copper pads, solder bumps, copper pillars on or over the top-most metal layer of BISCSP exposed in openings in the top-most insulating dielectric layer of BISCSP using emboss copper process as described and specifies in above. The locations of the solder bumps or copper pillars are on or over: (i) a space outside and beyond the edges or sidewalls of the HBM DRAM IC chip or the HBM SCSP, for example, on or over the peripheral area of each of the FPGA IC chips where no HBM DRAM IC chip or the HBM SCSP is flip-chip assembled on or over; (b) vertically on or over the backside of the HBM DRAM IC chip or HBM SCSP package of the FPGA/HBM CSP. The BISCSP may comprise 1 to 10 layers, or 2 to 6 layers of interconnection metal layers. The interconnection metal lines, traces or planes of the BISCSP have the adhesion layer (Ti or TiN, for example) and the copper seed layer only at the bottom, but not at the sidewalls of the metal lines or traces. The interconnection metal lines or traces of FISC have the adhesion layer (Ti or TiN, for example) and the copper seed layer at both the bottom and the sidewalls of the metal lines or traces.

The thickness of the metal lines, traces or planes of the BISCSP is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISCSP is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISCSP is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISCSP may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISCSP; or maybe layout in a fork shape.

The interconnection metal lines or traces of the FISC and/or SISC of the FPGA chips for the FPGA/HBM CSP may: (a) comprise a first interconnection net or scheme of metal lines or traces in or of the FISC and/or SISC of a FPGA IC chip for connecting or coupling the transistors, a second interconnection net or scheme of metal lines or traces and/or the micro copper pads, pillars or bumps of the FPGA IC chip. The first interconnection net or scheme of metal lines or traces in or of the FISC and/or SISC may be connected to the circuits or components outside or external to the FPGA/HBM CSP through TPVCs in the FPGA/HBM CSP. The first interconnection net or scheme may be connected or coupled to the HBM DRAM IC chip or HBM SCSP package on or over the FPGA chip. The first interconnection net or scheme of metal lines or traces in or of the FISC and/or SISC may be a net or scheme for signals, or the power supply or ground. In this case, the TPVCs are used as metal vias, pillars or posts for signals, or the power supply or ground; (b) comprise direct and vertical connection between the circuits of the FPGA chip and the HBM DRAM IC chip or HBM SCSP package by using the stacked metal vias/metal layers in the FISC and SISC. The solder bumps or copper pillars of the HBM DRAM IC chip or HBM SCSP package are flip-chip bonded to the copper pads, pillars or bumps of the FPGA IC chip, wherein the copper pads, pillars or bumps are vertically over the stacked vias/metal layers of FISC and/or SISC of the FPGA IC chip. The vertical connects provide high bandwidth, high speed and wide bit-width communication between the FPGA chip and the HBM DRAM IC chip or HBM SCSP package. The HBM DRAM IC chip or HBM SCSP package may be with data bit-width of equal or greater than 64, 128, 256, 512, 1024, 2048, 4096, 8K, or 16K in communication with the underlying FPGA chip. The HBM DRAM IC chip or each of the HBM DRAM IC chips in the HBM SCSP package is designed with small I/O drivers or receivers, or I/O circuits having small driving capability in communication with the underlying FPGA IC chip, wherein the loading, output capacitance, or input capacitance may be between 0.05 pF and 2 pF, or 0.05 pF and 1 pF, or smaller than 2 pF or 1 pF. The HBM DRAM IC chip or each of the HBM DRAM IC chips in the HBM SCSP package may be with data bit-width of equal or greater than 64, 128, 256, 512, 1024, 2048, 4096, 8K, or 16K.

Copper pads or pillars, or solder bumps are then formed on or over the top surfaces of the top-most metal layer of the BISCSP exposed in the openings in the top-most insulating dielectric layer of the BISCSP. The FPGA wafer is at the bottom and the HBM DRAM IC chip or HBM SCSP package are at the top. The frontside (the side with the transistors) of the FPGA chips are now facing up, the molding compound and the backside of the HBM DRAM IC chip or HBM SCSP package are now at the top. The copper pillars or bumps are formed by performing an emboss copper electroplating process. The copper pads, pillars or solder bumps are used for next level packaging to form the logic drive.

(4) Separating, cutting or dicing the finished FPGA wafer, including separating, cutting or dicing through materials or structures between two neighboring HBM DRAM IC chips or HBM SCSP packages. The material (for example, polymer) filling gaps or spaces between two neighboring HBM DRAM IC chip or HBM SCSP package is separated, cut or diced to from individual unit of FPGA/HBM CSPs.

Another aspect of the disclosure provides the FPGA/HBM CSP with TPVCs for use in the logic drive in a standard format or having standard sizes. For example, the FPGA/HBM CSP may be in a shape of square or rectangle, with a certain widths, lengths and thicknesses; and/or with a standard layout of the locations of the copper pads or pillars or solder bumps on or over the BISCSP. An industry standard may be set for the shape and dimensions of the FPGA/HBM CSP. For example, the standard shape of the FPGA/HBM CSP may be a square, with a width greater than or equal to 3 mm, 6 mm, 8 mm, 10 mm, 12 mm, 15 mm, 20 mm, 25 mm or 30 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the FPGA/HBM CSP may be a rectangle, with a width greater than or equal to 3 mm, 6 mm, 8 mm, 10 mm, 12 mm, 15 mm, 20 mm, or 25 mm, or 30 mm and a length greater than or equal to 5 mm, 7 mm, 10 mm, 12 mm, 15 mm, 20 mm, 25 mm, 30 mm, 35 mm, or 40 mm; and having a thickness greater than or equal to 0.03 mm, 0.05 mm, 0.1 mm, 0.3 mm, 0.5 mm, 1 mm, 2 mm, 3 mm, 4 mm, or 5 mm.

Another aspect of the disclosure provides a Fan-Out Interconnection Technology (FOIT) for making or fabricating the logic drive, comprising FPGA/HBM CSPs, based on a multi-chip packaging technology and process. The Fan-Out Interconnection Technology (FOIT) is a multichip packaging technology based on fan-out interconnection or Re-Distribution Layer (RDL) for interconnecting chips or packages in the logic drive. The FOIT logic drive may be formed by three methods: (A) Chip-First by placing chips or packages first in the process: (i) chip faced up, (ii) chip face down; (B) RDL-First by forming the RDL layer first and then flip-chip assembling the chips on the RDL layer. The three methods differ in process sequence, yet result in a similar structure. The process steps of method (A) (i) are described as below:

(1) Providing a chip carrier, holder, molder or substrate, and IC chips or packages; then placing, fixing or attaching the IC chips or packages to and on the carrier, holder, molder or substrate. The carrier, holder, molder or substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the chip carrier, holder, molder or substrate may be silicon, metal, ceramics, glass, steel, plastics, polymer, epoxy-based polymer, or epoxy-based compound. The IC chips or packages to be placed, fixed or attached to the carrier, holder, molder or substrate include the chips or packages mentioned, described and specified above: the standard commodity FPGA/HBM CSP packages, the non-volatile chips or packages, the HBM IC chips or the HBM SCSPs, the dedicated control chip, the dedicated I/O chip, the dedicated control and I/O chip, IAC, DPIIC chip and/or computing and/or processing IC chips, for example, CPU, GPU, DSP, TPU. APU or AI chips. All chips or CSPs to be packaged in the logic drives comprise micro copper pillars or solder bumps on the top surfaces of the chips or CSPs. The top surfaces of micro copper pillars or solder bumps are at a level above the level of the top surface of the top-most insulating dielectric layer of the chips or CSPs with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The chips or CSPs are placed, held, fixed or attached on or to the carrier, holder, molder or substrate with the backside of the silicon substrate of the chips (the side or surface without transistors) or the backside of FPGA/HBM CSPs (the FPGA IC chip is at the bottom) is faced down.

(2) Applying a material, resin, or compound to fill the gaps or spaces between chips or CSPs and cover the surfaces of chips or CSPs by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the carrier, holder, molder or substrate and on or over the chips to a level to: (i) fill gaps or spaces between chips or CSPs, (ii) cover the top-most surface of the chips or CSPs, (iii) fill gaps or spaces between micro copper pillars or bumps on or of the chips or CSPs, (iv) cover top surfaces of the micro copper pillars or bumps on or of the chips or CSPs. The material may be polymer or molding compound. Applying a CMP, polishing or grinding process to planarize the surface of the applied material, resin or compound to a level where the top surfaces of all micro bumps or pillars on or of the chips or CSPs are fully exposed. The chip carrier, holder, molder or substrate may be then (i) removed after the CMP polishing or grinding process, and before forming a Top Interconnection Scheme in, on or of the logic drive (TISD) to be described below; (ii) kept during the following fabrication process steps to be performed later, and removed after all fabrication process steps for making or fabricating the logic drive at the wafer or panel format are finished; or (iii) kept as part of the separated finished final logic drive product. A process, for example, a CMP process, a polishing process, a wafer backside grinding process or wafer or panel debonding or releasing process, may be performed for removing the chip carrier, holder, molder or substrate. Alternatively, a wafer or panel thinning process, for example, a CMP process, a polishing process or a wafer backside grinding process, may be performed to remove portion of the wafer or panel to make the wafer or panel thinner, in a wafer or panel process, after the wafer or panel process steps are all finished, and before the wafer or panel is separated, cut or diced into individual unit of the logic drive.

(3) Forming a Top Interconnection Scheme in, on or of the logic drive (TISD) on or over the planarized material, resin or compound and on or over the exposed top surfaces of the micro pillars or bumps by a wafer or panel processing. The TISD comprises multiple metal layers, with inter-metal dielectric layers between each of the multiple metal layers, and may, optionally, comprise an insulating dielectric layer on the planarized material, resin or compound layer, and between the bottom-most interconnection metal layer of the TISD and the planarized material, resin or compound layer. The metal lines or traces of the interconnection metal layers of the TISD are over the chips or CSPs and extend horizontally across the edges of the chips or CSPs, in other words, the metal lines or traces are running through and over gaps or spaces between chips or CSPs of the logic drive. The metal lines or traces of the interconnection metal layers of the TISD are connecting or coupling circuits of two or more chips or CSPs of the logic drive. The TISD is formed comprising process steps (i) forming inter-metal dielectric layer: depositing polymer layer using methods of spin-on coating, screen-printing, dispensing, or molding. The material in the polymer layer may comprise, for example, polyimide, BenzoCycloButene (BCB), parylene, epoxy-based material or compound, photo epoxy SU-8, elastomer, or silicone. The polymer material may be photosensitive, and may be used as photoresist as well for patterning openings in it for forming metal vias in it; (ii) forming metal lines or traces of the interconnection metal layers by embossing copper electroplating process. The TISD may comprise 2 to 6 layers, or 3 to 5 layers of interconnection metal layers. The interconnection metal lines or traces of the TISD have the adhesion layer (Ti or TiN, for example) and the copper seed layer only at the bottom, but not at the sidewalls of the metal lines or traces. The interconnection metal lines or traces of FISC have the adhesion layer (Ti or TiN, for example) and the copper seed layer at both the bottom and the sidewalls of the metal lines or traces.

The TISD interconnection metal lines or traces are coupled or connected to the SISC interconnection metal lines or traces, the FISC interconnection metal lines or traces, and/or transistors on, in or of the chips of the logic drive, through the micro bumps or pillars on or of the chips. The chips or CSPs are surrounded by the material, resin, or compound filled in the gaps or spaces between chips or CSPs, and the chips or CSPs are also covered by the material, resin, or compound on the surfaces of the chips. The thickness of the metal lines or traces of the TISD is between, for example, 0.3 μm and 30 μm, 0.5 μm and 20 μm, 1 μm and 10 μm, or 0.5 μm to 5 μm, or thicker than or equal to 0.3 μm, 0.5 μm, 0.7 μm, 1 μm, 1.5 μm, 2 μm, 3 μm or 5 μm. The width of the metal lines or traces of the TISD is between, for example, 0.3 μm and 30 μm, 0.5 μm and 20 μm, 1 μm and 10 μm, or 0.5 μm to 5 μm, or wider than or equal to 0.3 μm, 0.5 μm, 0.7 μm, 1 μm, 1.5 μm, 2 μm, 3 μm or 5 μm. The thickness of the inter-metal dielectric layer of the TISD is between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The metal lines or traces of interconnection metal layers of the TISD may be used for the programmable interconnection.

(4) Forming copper pillars or bumps on or over the top-most insulating dielectric layer of the TISD, and the exposed top surfaces of the top-most interconnection metal layer of the TISD in openings of the top-most insulating dielectric layer of the TISD, by performing an emboss copper electroplating process, as described above. The copper pillars or bumps are used for connecting or coupling the chips, for example the dedicated I/O chip, of the logic drive to the external circuits or components external or outside of the logic drive. The height of the copper pillars or bumps is, for example, between 5 μm and 120 μm, 10 μm and 100 μm, 10 μm and 60 μm, 10 μm and 40 μm, or 10 μm and 30 or greater or taller than or equal to 50 μm, 30 μm, 20 μm, 15 μm, or 5 μm. The largest dimension in a cross-section of the copper pillars or solder bumps (for example, the diameter of a circle shape or the diagonal length of a square or rectangle shape) is, for example, between 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm, or 10 μm. The smallest space between a copper pillar or bump and its nearest neighboring copper pillar or bump is, for example, between 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm. The copper bumps or pillars may be used for flip-package assembling the logic drive on or to a substrate, film or board, similar to the flip-chip assembly of the chip packaging technology, or similar to the Chip-On-Film (COF) assembly technology used in the LCD driver packaging technology. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The substrate, film or board may comprise metal bonding pads or bumps at its surface; and the metal bonding pads or bumps may have a layer of solder on their top surface for use in the solder reflow or thermal compressing bonding process for bonding to the copper pillars or bumps on or of the logic drive package. The copper pillars or bumps may be located at the front surface of the logic drive package with a layout of Bump or Pillar Grid-Array, with the pillars or bumps at the peripheral area used for the signal I/Os, and the pillars or bumps at or near the central area used for the Power/Ground (P/G) I/Os. The signal pillars or bumps at the peripheral area may form 1 ring, or 2, 3, 4, 5, or 6 rings along the edges of the logic driver package. The pitches of the signal I/Os at the peripheral area may be smaller than that of the P/G I/Os at or near the central area of the logic drive package.

Alternatively, solder bumps may be formed on or over the top-most insulating dielectric layer of the TISD, and the exposed top surfaces of the top-most interconnection metal layer of the TISD in openings of the top-most insulating dielectric layer of the TISD, by performing an emboss copper/solder process. Lead-free solders in commercial use may contain tin, copper, silver, bismuth, indium, zinc, antimony, and traces of other metals. For example, the lead-free solder may be Sn—Ag—Cu (SAC) solder, Sn—Ag solder, or Sn—Ag—Cu—Zn solder. The solder bumps are used for connecting or coupling the chips, for example, the dedicated I/O chip, of the logic drive to the external circuits or components external or outside of the logic drive. The height of the solder bumps (including the copper barrier layer) is, for example, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 μm. The solder bump (including the copper barrier layer) height is measured from the level of the surface of the top-most insulating dielectric layer of TISD to the level of the top surface of the solder bump. The largest dimension in cross-sections of the solder bumps (for example, the diameter of a circle shape or the diagonal length of a square or rectangle shape) is, for example, between 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 100 μm, 60 μm, 50 μm, 40 μm, 30 μm, 20 μm, 15 μm, or 10 μm. The smallest space between a solder bump and its nearest neighboring solder bump is, for example, between 5 μm and 150 μm, 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm. The solder bumps may be used for flip-package assembling the logic driver on or to the substrate, film or board, similar to the flip-chip assembly of the chip packaging technology, or the Chip-On-Film (COF) assembly technology used in the LCD driver packaging technology. The solder bump assembly process may comprise a solder flow or reflow process using solder flux or without using solder flux. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The solder bumps may be located at the front surface of the logic drive package with a layout in a Ball-Grid-Array (BGA) with the bumps at the peripheral area used for the signal I/Os, and the bumps at or near the central area used for the Power/Ground (P/G) I/Os. The signal bumps at the peripheral area may form ring or rings at the peripheral area near the edges of the logic driver package, with 1 ring, or 2, 3, 4, 5, 6 rings. The pitches of the signal I/Os at the peripheral area may be smaller than that of the P/G I/Os at or near the central area of the logic drive package.

(5) Separating, cutting or dicing the finished wafer or panel, including separating, cutting or dicing through materials or structures between two neighboring logic drives. The material (for example, polymer) filling gaps between chips of two neighboring logic drives is separated, cut or diced to form individual unit of logic drives.

The FOIT logic drive may be, alternatively, formed by the (A) (ii) method of the three methods mentioned above: (A)

Chip-First by placing chips or packages first in the process: (ii) chip face down. The process steps of method of (A) (ii) are similar to the method (A) (i) described and specified above except:

(1') The process is similar to the Process step (1) of (A) (i) except that the chips or CSPs are placed, held, fixed or attached on or to the carrier, holder, molder or substrate with the backside of the silicon substrate of the chips (the side or surface without transistors) or the backside of FPGA/HBM CSPs (the FPGA IC chip is at the top) faced up. A sacrificial bonding layer is formed on the carrier, holder, molder or substrate. The sacrificial bonding layer is used (i) as a bonding layer to bond the IC chips or the FPGA/HBM CSPs to the carrier, holder, molder or substrate; and (ii) as a substrate-release layer to de-bond or release the carrier, holder, molder or substrate from the structure comprising IC chips or CSPs and molding compound, either before or after the processes of forming the TISD and copper pillars or solder bumps. The material used for the sacrificial bonding layer is a Light-To-Heat Conversion (LTHC) material, and is coating by screen printing, spin-on coating or adhesive film attachment. The LTHC may be in liquid form and deposited on the carrier, holder, molder or substrate. by printing or spin-on coating and then cured or dried. The sacrificial bonding layer may have a thickness of about 1 micrometer or between 0.5 and 2 micrometers. The LTHC material may be a liquid ink comprising carbon black and binder in a mixture of solvents.

(2') The material, resin or compound is applied (by coating, printing, dispensing or molding) on or over the carrier, holder, molder or substrate and on or over the backsides of the chips and the CSPs to a level to: (i) fill gaps or spaces between chips or CSPs, (ii) cover the top-most surface of (the backside of) the chips or CSPs. A process to de-bond or release the carrier, holder, molder or substrate from the structure comprising IC chips or CSPs and molding compound is then performed. Alternatively, the process of de-bonding or releasing the carrier, holder, molder or substrate from the structure comprising IC chips or CSPs and molding compound may be performed after the processes of forming the TISD and copper pillars or solder bumps. Then turning the structure comprising IC chips or CSPs and molding compound upside down (with the front side of the IC chips or CSPs faced up), and forming TISD on and over the front side of the IC chips or CSPs, and the exposed copper pads or pillars of the IC chips or CSPs.

The FOIT logic drive may be, alternatively, formed by the (B) method of the three methods mentioned above: (B) RDL-First by forming the RDL layer first and then flip-chip assembling the chips or packages (CSPs) on the RDL. (The process steps of method of (B) are similar to the method (A) (i) described and specified above except:

(1') providing a Temporary Substrate (T-Sub) with a Fan-Out Interconnection Scheme of the logic Drive (FOISD). The FOISD comprises fan-out interconnection metal lines or traces and micro metal pads, pillars or bumps on or over the T-Sub. The micro metal pads, pillars or bumps are used for flip-chip assembly or packaging in forming the multi-chip package of the logic drive. The multi-chips are flip-chip packaged on the T-Sub using the micro pads, metal pillars or bumps thereon. The T-Sub may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The substrate is served as a temporary support for the wafer-level or panel-level processes. The material of the substrate may be silicon, metal, ceramics, glass, steel, plastics, polymer, epoxy-based polymer, or epoxy-based compound. The substrate will be removed or released after the processes of (a) FOISD, (b) flip-chip assembly and underfill, and (c) molding. As an example, a glass substrate may be used as a temporary substrate in forming FOISD on the glass substrate. The process steps for forming the FOISD are as follows:

(a) forming a sacrificial bonding layer on the glass substrate. The sacrificial bonding layer is used (i) as a bonding layer to bond the FOISD structures (high density fan-out and interconnection structures and the micro metal pads, pillars or bumps) to be built on it; and (ii) as a substrate-release layer to de-bond or release the substrate from the structure comprising FOISD, underfill, IC chips and molding compound, after finished the processes of forming the FOISDs, flip-chip assembly/underfill and molding. The material used for the sacrificial bonding layer is a Light-To-Heat Conversion (LTHC) material, and is coating by screen printing, spin-on coating or adhesive film attachment. The LTHC may be in liquid form and deposited on the glass substrate (T-Sub) by printing or spin-on coating and then cured or dried. The sacrificial bonding layer may have a thickness of about 1 micrometer or between 0.5 and 2 micrometers. The LTHC material may be a liquid ink comprising carbon black and binder in a mixture of solvents.

(b) Forming the FOISD (Fan-Out Interconnection Scheme of the logic Drive), mentioned above, on or over the sacrificial bonding layer and the T-Sub. The FOISD comprises multiple interconnection metal layers, with an inter-metal dielectric layers between two neighboring layers of the multiple interconnection metal layers. The metal lines or traces and the metal vias are formed by the emboss copper electroplating processes as described or specified in forming the metal lines or traces and metal vias in the SISC of FPGA IC chips. The FOISD is formed by first depositing a bottom-most dielectric layer, forming openings in the bottom-most dielectric layer, and then formed a bottom-most metal layer on the bottom-most dielectric layer and in the openings in the bottom-most dielectric layer. The metal in the openings are the metal vias, and the bottom of metal vias are exposed (and to be used as metal via contacts) when the temporary substrate (T-Sub) and the sacrificial bonding layer are removed or released later on. The processes for forming the bottom-most dielectric layer, metal vias in the bottom-most dielectric layer, and the bottom-most interconnection metal layer (metal lines or traces) using the emboss copper process may be repeated multiple times to form metal lines or traces of multiple interconnection metal layers and vias in inter-metal dielectric layers of the FOISD. The processes and materials for forming (i) the bottom-most dielectric layer or inter-metal dielectric layers, (ii) the bottom-most metal layer or multiple interconnection metal layers, and (iii) metal vias in the inter-metal dielectric layer, are the same as described and specified in forming the SISC of FPGA IC chips. The FOISD may comprise 1 to 7 layers, or 1 to 4 layers of interconnection metal layers.

The thickness of the metal lines or traces of FOISD is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of FOISD is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of FOISD may be used as the programmable interconnection.

(c) Forming micro copper pads, pillars or solder bumps of the FOISD on the top surface of the top-most interconnection metal layer of FOISD, exposed in openings in the topmost insulating dielectric layer of the FOISD. An emboss metal electroplating process, as described and specified in above paragraphs, is performed to form the micro copper pillars or solder bumps on or over the substrate.

The height of the micro pillars or solder bumps on or over the substrate is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The largest dimension in a cross-section of the micro pillars or bumps (for example, the diameter of a circle shape, or the diagonal length of a square or rectangle shape) is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The space between a micro pillar or bump to its nearest neighboring pillar or bump is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

(d) Performing flip-chip assembling, bonding or packaging: The IC chips or CSPs are then flip-chip assembled, bonded or packaged on or to corresponding micro copper pads, bumps or pillar of the FOISD on or over the TS substrate with the front side or surface of the chip or the CSP (the front side of the chip with transistors faced down or front side the CSPs with copper pillar or solder bumps is faced down). The backside of the silicon substrate of the chips (the side or surface without transistors) or the backside of the CSP is faced up; The IC chips or CSPs to be assembled, bonded or packaged to the substrate include the chips or CSP packages mentioned, described and specified above: the standard commodity FPGA IC chips, the dedicated control chip, the dedicated I/O chip, the dedicated control and I/O chip, IAC chip and/or computing and/or processing IC chips, for example, the CPU, GPU, DSP, TPU, APU or AI chips. All chips or CSPs to be flip-chip packaged in the logic drives comprise micro copper pillars or solder bumps on the front side or surface of the chips or CSPs. Filling the gaps or spaces between the substrate and the IC chips or CSPs (and between micro copper bumps or pillars of the IC chips or CSPs) with an underfill material by, for example, a dispensing method using a dispenser. The underfill material comprises epoxy resins or compounds, and can be cured at temperature equal to or above 100° C., 120° C., or 150° C.

(2') The material, resin or compound is applied (by coating, printing, dispensing or molding) on or over the carrier, holder, molder or substrate and on or over the backsides of the chips and the CSPs to a level to: (i) fill gaps or spaces between chips or CSPs, (ii) cover the top-most surface of (the backside of) the chips or CSPs. A process to de-bond or release the TS and the sacrificial layer from the structure comprising IC chips or CSPs and molding compound is then performed. The bottom of metal vias in the bottom-most dielectric layer are exposed (and to be used as metal via contacts) when the temporary substrate (T-Sub) and the sacrificial bonding layer are removed or released.

(3') No TISD process is required, since the FOISD is used as the TISD.

(4') Then turn the structure comprising IC chips or CSPs, FOISD and molding compound upside down (with the front side of the IC chips or CSPs faced up, the FOISD on or over the IC chips or CSPs), form copper pillars or solder bumps on the exposed top surfaces of the top-most metal layer in openings of the top-most insulating dielectric layer of the FOISD.

The TISD or FOISD interconnection metal lines or traces of a logic drive (formed by (A)(i), (A)(ii) or (B)) may: (a) comprise an interconnection net or scheme of metal lines or traces in or of the TISD or FOISD of the logic drive for connecting or coupling the transistors, the FISC, the SISC and/or the micro copper pads, pillars or bumps of a first FPGA IC chip in a first standard commodity FPGA/HBM CSP of the logic drive (through copper pillars or solder bumps on or over a first BISCSP, metal lines or traces and vias of the first BISCSP and first TPVCs of the first FPGA/HBM CSP) to the transistors, the FISC, the SISC and/or the micro copper pads, pillars or bumps of a second FPGA IC chip in a second standard commodity FPGA/HBM CSP packaged in the logic drive (through copper pillars or solder bumps on or over a second BISCSP, metal lines or traces and vias of the second BISCSP and second TPVCs of the second FPGA/HBM CSP). This interconnection net or scheme of metal lines or traces in or of the TISD or FOISD may be connected or coupled to the circuits or components outside or external to the logic drive through metal pillars or bumps (copper pillars or bumps, solder bumps, or gold bumps on or over the TISD or FOISD). This interconnection net or scheme of metal lines or traces in or of the TISD or FOISD may be a net or scheme for the signals, or for the power supply or ground. This interconnection net or scheme of metal lines or traces in or of the TISD or FOISD may be used as power or ground bus for supplying power to (i) the first FPGA IC chip and a first HBM IC chip or first HMB IC chips in a first HBM SCSP in the first FPGA/HBM CSP, through the first TPVCs and the power/ground bus on or of the first FPGA IC chip, and/or (ii) the second FPGA IC chip and a second HBM IC chip or second HMB IC chips in a second HBM SCSP in the second FPGA/HBM CSP, through the second TPVCs and the power/ground bus on or of the first FPGA IC chip; (b) comprise an interconnection net or scheme of metal lines or traces in or of the TISD or FOISD of the logic drive connecting to plural micro copper pads, pillars or bumps of an IC chip or CSP in or of the logic drive. The interconnection net or scheme of metal lines or traces in or of the TISD or FOISD may be connected or coupled to the circuits or components outside or external to the logic drive through metal pillars or bumps (copper pillars or bumps, solder bumps, or gold bumps on the TISD or FOISD). The interconnection net or scheme of metal lines or traces in or of the TISD or FOISD may be a net or scheme for the signals, or for the power or ground supply; (c) comprise an interconnection net or scheme of metal lines or traces in or of the TISD or FOISD of the logic drive for connecting or coupling to the circuits or components outside or external to the logic drive, through the metal bumps or pillars (copper pillars or bumps solder bumps, or gold bumps on the TISD) of the single-layer-packaged logic drive. The interconnection net or scheme of metal lines or traces in or of the TISD or FOISD may be used for signals, power or ground supplies. In this case, for example, the metal pillars or bumps may be connected to the I/O circuits of, for example, the dedicated I/O chip of the logic drive. The I/O circuits in this case may be a large I/O circuit, for example, a bi-directional (or tri-state) I/O pad or circuit, comprising an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF; (d) comprise an interconnection net or scheme of metal lines or traces in or of the TISD or FOISD of the logic drive used for connecting the transistors, the FISC, the SISC and/or the micro copper pads, pillars or bumps of a first FPGA IC chip in a first standard commodity FPGA/HBM CSP of the logic drive (through copper pillars or solder bumps on or over a first BISCSP, metal lines or traces and vias of the first BISCSP and first TPVCs) of the first FPGA/HBM CSP) to the transistors, the FISC, the SISC and/or the micro copper pillars or bumps of a second FPGA IC chip in a second standard commodity FPGA/HBM CSP packaged in the logic drive (through copper pillars or solder bumps on or over a second BISCSP, metal lines or traces and vias of the second BISCSP and second TPVCs of the second FPGA/HBM CSP); but not connected to the circuits or components outside or external to the (this) single-layer-packaged logic drive. That is, no metal pillars or bumps (copper pillars or bumps solder bumps, or gold bumps) of the logic drive is connected to the interconnection net or scheme of metal lines or traces in or of the TISD or FOISD. In this case, the interconnection net or scheme of metal lines or traces in or of the TISD or FOISD may be connected or coupled to (i) first I/O circuits of the first FPGA chip in the first standard commodity FPGA/HBM CSP, and (ii) second I/O circuits of the second FPGA chip in the second standard commodity FPGA/HBM CSP, packaged in the logic drive. The first and second I/O circuits in this case may be small I/O circuits, for example, a bi-directional (or tri-state) I/O pads or circuits, each comprising an ESD circuit, a receiver, and/or a driver, and may have an input capacitance or output capacitance between 0.05 pF and 2 pF or 0.05 pF and 1 pF; or smaller than 2 pF or 1 pF; (e) comprise an interconnection net or scheme of metal lines or traces in or of the TISD or FOISD of the logic drive used for connecting or coupling to plural micro copper pillars or bumps of an IC chip or package in or of the logic drive; but not connecting to the circuits or components outside or external to the logic drive. That is, no metal pillars or bumps (copper pillars or bumps solder bumps, or gold bumps) of the logic drive is connected to the interconnection net or scheme of metal lines or traces in or of the TISD or FOISD. In this case, the interconnection net or scheme of metal lines or traces in or of the TISD or FOISD may be connected or coupled, directly, to the internal circuits, for example, the transistors, the FISC, the SISC through the micro copper pads, pillars or bumps of the FPGA IC chip in the standard commodity FPGA/HBM CSP of the logic drive, without going through any I/O circuit of the FPGA IC chip.

Another aspect of the disclosure provides a logic drive comprising plural single-layer-packaged logic drives; and each of single-layer-packaged logic drives in a multiple-chip package is as described and specified above. The multiple single-layer-packaged logic drives, for example, 2, 3, 4, 5, 6, 7, 8 or greater than 8 single-layer-packaged logic drives, may be, for example, (1) flip-package assembled on a printed circuit board (PCB), high-density fine-line PCB, Ball-Grid-Array (BGA) substrate, or flexible circuit film or tape; or (2) stack assembled using the Package-on-Package (POP) assembling technology; that is assembling one single-layer-packaged logic drive on top of the other single-layer-packaged logic drive. The POP assembling technology may apply, for example, the Surface Mount Technology (SMT).

Another aspect of the disclosure provides a method for forming a single-layer-packaged logic drive suitable for the stacked POP assembling technology. The single-layer-packaged logic drive for use in the POP package assembling are fabricated as the same as the process steps and specifications of the FOIT described in the above paragraphs, except for forming Through-Package-metal-Vias, Thought-Polymer-metal-Vias, Through-Polymer-metal-posts, Through-Polymer-pillars (all are abbreviated as TPVs) in the gaps or spaces between chips or CSPs in or of the logic drive, and/or in the peripheral area of the logic drive package and outside the edges of chips or CSPs in or of the logic drive. The TPVs are used for connecting or coupling circuits or components at the frontside of the logic drive to that at the backside of the logic drive package. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The logic drive with TPVs is formed by forming copper pillars, posts, or bumps on: (a) on the chip carrier, holder, molder or substrate for use in placing, fixing or attaching the IC chips or packages to and on it as described in Process Step (1) of the method (A) (i) or (A)(ii), or (b) on the FOISD on the TS in Process Step (1) of the method (B); in forming the logic drive package using the FOIT package. The process steps for forming the copper pillars, bumps or posts used as TPVs are similar to that for forming the TPVCs comprising embossing copper electroplating process. The height of the TPVs (from the level of top surface of the insulating dielectric layer to the level of the top surface of the copper pillars, bumps or posts) is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or taller than or equal to 50 μm, 30 μm, 20 μm, 15 μm, or 5 μm. The largest dimension in a cross-section of the copper pillars or bumps (for example, the diameter of a circle shape or the diagonal length of a square or rectangle shape) is between, for example, 5 μm and 300 μm, 5 μm and 200 μm, 5 μm and 150 μm, 10 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm. The smallest space between a copper pillar or bump and its nearest neighboring copper pillar or bump is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm.

The wafer or panel with the insulating dielectric layer and the copper pillars, bumps or posts (TPVs) are then used as the carrier, holder, molder or substrate or TS for forming a logic drive as described and specified above. All processes of forming the logic drive are the same as described and specified above. Some process steps are mentioned again below: in the Process Step (2) for forming the logic drive described above, a material, resin, or compound is applied to (i) fill gaps or spaces between chips or CSPs, (ii) cover the front sides or surfaces of chips or CSPs in the method (A)(i), or, the back sides or surfaces of chips or CSPs in the method (A)(ii) and (B), (iii) fill gaps or spaces between micro copper pillars or bumps on or of chips or CSPs, (iv) cover top surfaces of the micro copper pillars or bumps on or of chips or CSPs in the method (A) (i) and (A) (ii), (v) filling gaps or spaces between TPVs on or over the wafer or panel, or TS, (vi) cover the top surfaces of the copper pillars or bumps (TPVs) on or over the wafer or panel, or TS. Applying CMP, polishing or grinding process to planarize the surface of the applied material, resin or compound to a level where (i) all top surfaces of micro bumps or pillars on chips or CSPs (only for the methods (A) (i) and (A)(ii)), and (ii) all top surfaces of TPVs on or over the wafer or panel, or TS, are fully exposed. For the methods (A) (i) and (A)(ii), the TISD structure is then formed on or over the planarized surface of the applied material, resin or compound, and connecting or coupling to the exposed top surfaces of micro bumps or pillars on chips or CSPs and/or the top surfaces of TPVs on or over the wafer or panel, as described and specified above. For all the methods (A) (i), (A)(ii) and (B), the copper pillars or bumps, solder bumps, gold bumps on or over the TISD or FOISD (wherein the TS and the sacrificial layer are removed) are then formed for connecting or coupling to the metal lines or traces in the multiple interconnection metal layers of the TISD or the FOISD, as described and specified above. The copper pillars, posts or bumps on or over the wafer or panel and in the cured, or cross-linked applied material, resin or compound are used as TPVs for connecting or coupling circuits, interconnection metal schemes (for example, the TISD or the FOISD), copper pillars or bumps, solder bumps, gold bumps, and/or metal pads at the front side of the logic drive to circuits, interconnection metal schemes, metal pads, metal pillars or bumps, and/or components at backside of the logic drive package. For the methods (A) (i) and (A) (ii), the chip carrier, holder, molder or substrate may be removed after the CMP, polishing, or grinding process, and before forming the Top Interconnection Scheme in, on or of the logic drive (TISD); thereafter the bottom surfaces of the TPVs are exposed. For the method of (A) (i), the chip carrier, holder, molder or substrate may be, alternatively, removed after all fabrication process steps are finished. The chip carrier, holder, molder or substrate is removed by a peeling process, a de-bonding process, a CMP process, a backside grinding or a polishing process. After the chip carrier, holder, molder or substrate are removed, the bottom surfaces of the TPVs are exposed. In the method of (B), the TS and sacrificial layer are also removed to expose the bottom surfaces of the TPVs. The exposed bottom surfaces of TPVs used as copper pads at the backside of the logic drive for use in making connection or coupling to transistors, circuits, interconnection metal schemes, metal pads, metal pillars or bumps, and/or components at the frontside (or topside, still assuming the backside of the IC chips or CSPs is facing up) of the logic drive package.

The stacked logic drive may be formed, for an example, by in the following process steps: (i) providing a first single-layer-packaged logic drive, either separated or still in the wafer or panel format, with TPVs and with its copper pillars or bumps, solder bumps, or gold bumps faced down, and with the exposed copper pads of TPVs on its upside; (ii) Package-On-Package (POP) stacking assembling, by surface-mounting and/or flip-package methods, a second separated single-layer-packaged logic drive or an IC chip package on top of the provided first single-layer-packaged logic drive. The surface-mounting process is similar to the Surface-Mount Technology (SMT) used in the assembly of components on or to the Printed Circuit Boards (PCB), by first printing solder or solder cream, or flux on the copper pads of the TPVs, and then flip-package assembling, connecting or coupling the copper pillars or bumps, solder bumps, or gold bumps on or of the second separated single-layer-packaged logic drive or the IC chip package to the solder or solder cream or flux printed copper pads of TPVs of the first single-layer-packaged logic drive. The flip-package process is performed, similar to the Package-On-Package technology (POP) used in the IC stacking-package technology, by flip-package assembling, connecting or coupling the copper pillars or bumps, solder bumps, or gold bumps on or of the second separated single-layer-packaged logic drive or the IC chip package to the copper pads of TPVs of the first single-layer-packaged logic drive. An underfill material may be filled in the gaps or spaces between the first and the second single-layer-packaged logic drives. A third separated single-layer-packaged logic drive may be flip-package assembled, connected or coupled to the exposed copper pads of TPVs of the second single-layer-packaged logic drive. The Package-On-Package stacking assembling process may be repeated for assembling more separated single-layer-packaged logic drives (for example, up to more than or equal to a nth separated single-layer-packaged logic drive, wherein n is greater than or equal to 2, 3, 4, 5, 6, 7, 8) to form the finished stacking logic drive. When the first single-layer-packaged logic drives are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the wafer or panel format, the wafer or panel may be used directly as the carrier or substrate for performing POP stacking processes, in the wafer or panel format, for forming the stacked logic drivers. The wafer or panel is then cut or diced to obtain the separated stacked finished logic drives.

Another aspect of the disclosure provides a method for a single-layer-packaged logic drive suitable for the stacked POP assembling technology. The single-layer-packaged logic drive for use in the POP package assembling are fabricated as the same process steps and specifications of the FOIT (with TPVs) described in the above paragraphs, except for forming a Bottom metal Interconnection Scheme at the frontside (bottom) of the single-layer-packaged logic Drive (abbreviated as BISD in below).

In the method of (A) (i) for forming FOIT packages, a sacrificial bonding layer is formed on the carrier, holder, molder or substrate. The sacrificial bonding layer is used (i) as a bonding layer to bond the BISD structures (high density fan-out and interconnection structures and the micro metal pads, pillars or bumps) to be built on it; and (ii) as a substrate-release layer to de bond or release the substrate from the structure comprising BISD, IC chips (or CSPs), molding compound and TISD, after finished the processes of forming the BISD, IC chips or CSPs attachment, molding, TISD and metal pads, pillars or bumps. The material used for the sacrificial bonding layer is a Light-To-Heat Conversion (LTHC) material, and is coating by screen printing, spin-on coating or adhesive film attachment. The LTHC may be in liquid form and deposited on the carrier, holder, molder or substrate by printing or spin-on coating and then cured or dried. The sacrificial bonding layer may have a thickness of about 1 micrometer or between 0.5 and 2 micrometers. The LTHC material may be a liquid ink comprising carbon black and binder in a mixture of solvents. The BISD is formed on or over the sacrificial bonding layer on the carrier, holder, molder or substrate, and copper pillars, bumps or posts (TPVs) are formed on or over the BISD, before pacing, attaching or fixing the IC chips or CSPs to the chip carrier, holder, molder or substrate. The BISD is formed using the same or similar process steps as in forming the TISD as described and specified above. The TPVs formed on or over the BISD using the same or similar process steps as in forming metal pillars or bumps (copper pillars or bumps, solder bumps or gold bumps) on the TISD as described and specified above. The process steps for forming the BISD comprise (i) the embossing electroplating process for forming metal lines or traces and metal vias, and (ii) processes of forming inter-metal dielectric layer, wherein inter-metal dielectric layer comprises polymer material, for example, polyimide, BenzoCycloButene (BCB), parylene, epoxy-based material or compound, photo epoxy SU-8, elastomer, or silicone. The inter-metal dielectric layer is between two interconnection metal layers of the BISD, and the metal vias are in the inter-metal dielectric layer. The top-most interconnection metal layer of the BISD is covered with a top-most insulating dielectric layer of the BISD. The top-most insulating dielectric layer has openings in it to expose top surface of the top-most interconnection metal layer of the BISD, wherein TPVs are to formed on the top-most metal layer of the BISD exposed in the openings. The locations of the TPVs are in the gaps or spaces between chips or CSPs in or of the logic drive, and/or in peripheral area of the logic drive package and outside the edges of chips or CSPs in or of the logic drive, (the chips or CSPs are to be placed, attached or fixed in latter processes).

The BISD may comprise 1 to 6 layers, or 2 to 5 layers of interconnection metal layers. The interconnection metal lines, traces or planes of the BISD have the adhesion layer (Ti or TiN, for example) and the copper seed layer only at the bottom, but not at the sidewalls of the metal lines or traces. The interconnection metal lines or traces of FISC have the adhesion layer (Ti or TiN, for example) and the copper seed layer at both the bottom and the sidewalls of the metal lines or traces.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The thickness or height of metal vias in the bottom-most insulating dielectric layer of the BISD is between, for example, 3 μm and 50 μm, 3 μm and 30 μm, 3 μm and 20 μm, or 3 μm and 15 μm; or thicker than or equal to 3 μm, 5 μm, 10 μm, 20 μm, or 30 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

After the BISD is formed, forming copper pillars or bumps (to be used as TPVs) on or over the top-most insulating dielectric layer of the BISD on or of the carrier, holder, molder or substrate, and the exposed top surfaces of the top-most interconnection metal layer of the BISD in openings of the top-most insulating dielectric layer of the BISD, by performing an emboss copper electroplating process. The height of the copper pillars or bumps (from the level of top surface of the insulating dielectric layer to the level of the top surface of the copper pillars or bumps) is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or taller than or equal to 50 μm, 30 μm, 20 μm, 15 μm, or 5 μm. The largest dimension in a cross-section of the copper pillars or bumps (for example, the diameter of a circle shape or the diagonal length of a square or rectangle shape) is between, for example, 5 μm and 300 μm, 5 μm and 200 μm, 5 μm and 150 μm, 10 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm. The smallest space between a copper pillar or bump and its nearest neighboring copper pillar or bump is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm.

The wafer or panel with the BISD and the copper pillars, posts or bumps (TPVs) are then used as the carrier, holder, molder or substrate for forming a logic drive as described and specified above. All processes of forming the logic drive are the same as described and specified above. Some process steps are mentioned again below: in the Process Step (2) for forming FOIT of the logic drive described above, a material, resin, or compound is applied to (i) fill gaps between chips or CSPs, (ii) cover the top surfaces of chips or CSPs, (iii) fill gaps or spaces between micro copper pillars or bumps on or of chips or CSPs, (iv) cover top surfaces of the micro copper pillars or bumps on or of chips or CSPs, (v) filling gaps or spaces between TPVs on or over the wafer or panel, (vi) cover the top surfaces of the TPVs on or over the wafer or panel. Applying a CMP, polishing or grinding process to planarize the surface of the applied material, resin or compound to a level where (i) all top surfaces of micro bumps or pillars on chips or CSPs and (ii) all top surfaces of copper pillars or bumps (TPVs) on or over the wafer or panel, are fully exposed. The TISD is then formed followed by forming the copper pads, pillars or solder bumps on or over the TISD. The sacrificial bonding layer and the chip carrier, holder, molder or substrate may be (i) removed after the CMP, polishing or grinding process (for planarizing the surface of the applied material, resin or compound), and before forming the Top Interconnection Scheme in, on or of the logic drive (the TISD); (2) kept during the fabrication process steps, and removed after all fabrication process steps (in wafer or panel format) are finished. When the chip carrier, holder, molder or substrate is removed to expose the metal vias in the openings of the bottom-most insulating dielectric layer of the BISD. The exposed surfaces of the metal vias, used as contact pads, may be designed or layout as a pad area array at the bottom surface or the backside surface of the logic drive package; with the contact pads at the peripheral area used for the signal pads, and pads at or near the central area used for the Power/Ground (P/G) pads. The pads may be located directly under locations where IC chips or CSPs are placed or attached on the carrier, holder, molder or substrate. The signal pads at the peripheral area may form 1 ring, or 2, 3, 4, 5, or 6 rings along the edges at the bottom of the logic driver package. The pitches of the signal pads at the peripheral area may be smaller than that of the P/G pads at or near the central area of the backside of logic drive package. The exposed copper pads at the bottom surface or the backside surface of the logic drive package are connected to TPVs, and therefore the copper pads and TPVs are used for connection or coupling between the transistors, circuits, interconnection metal schemes (for example, TISD), metal pads, metal pillars or bumps, and/or components at the frontside (or topside, still assuming the frontsides of IC chips or CSPs are facing up) of the logic drive package, and interconnection metal schemes (for example, BISD), metal pads and/or components at the backside (or bottom side) of the logic drive package.

The BISD provides additional interconnection metal layer or layers at the bottom or the backside of the logic drive package, and provides the exposed metal pads or copper pads in an area array at the bottom of the single-layer-packaged logic drive, including at locations directly under the IC chips or CSPs of the logic drive. The TPVs are used for connecting or coupling circuits or components (for example, the TISD) at the topside of the logic drive to that (for example, the BISD) at the backside of the logic drive package. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses; and/or with a standard layout of the locations of the copper pads. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm.

In the method of (A) (ii) for forming FOIT packages, the description and specification BISD are similar or same as that in (A) (i), described and specified above, except that the TPVs and the TISD are formed before the BISD. Copper pillars, posts or bumps are formed on or over the chip carrier, holder, molder or substrate for use as TPVs; performing the chips or CSPs attachment to the chip carrier, holder, molder or substrate, molding, removing the chip carrier, holder, molder or substrate to expose the micro copper pads, pillars or bumps and then forming TISD. Performing polishing, CMP, or grinding to expose the top surfaces of the TPVs (the TISD is already formed and at the bottom of the logic drive). The BISD is then formed on or over the exposed top surfaces of the TPVs.

In the method of (B) for forming FOIT packages, the description and specification BISD are similar or same as that in (A) (i), described and specified above, except that the FOISD and TPVs are formed before the BISD. Performing polishing, CMP, or grinding to expose the top surfaces of the TPVs (the FOISD is already formed and at the bottom of the logic drive). The BISD is then formed on or over the exposed top surfaces of the TPVs.

In this paragraph, the BISD (or the backside of the logic drive) is at the top side of the logic drive, and the TISD or FOISD (or the frontside of the logic drive) is at the bottom of the logic drive. For the FOIT logic drive formed by any of the above three methods (A) (i), (A) (ii) and (B), the BISD interconnection metal lines or traces of the single-layer-packaged logic drive are used: (a) for connecting or coupling the copper pads, pillar or solder bumps at the backside (top) surface (of the BISD) of the single-layer-packaged logic drive to their corresponding TPVs; and through the corresponding TPVs, the copper pads, pillars or solder bumps at the backside (top) surface (of the BISD) of the single-layer-packaged logic drive are connected or coupled to the metal lines or traces of the TISD or the FOISD at the frontside (or bottom) of the single-layer-packaged logic drive, therefore connecting or coupling the copper pads, pillars or solder bumps at the top surface of the BISD to the transistors, the FISC, the SISC and micro copper pillars or bumps of the IC chips or CSPs of the single-layer-packaged logic drive; (b) for connecting or coupling the copper pads, pillars or solder bumps at the backside (top) surface (of the BISD) of the single-layer-packaged logic drive to their corresponding TPVs, and through the corresponding TPVs, the copper pads, pillars or solder bumps at the backside (top) surface (of the BISD) of the single-layer-packaged logic drive are connected or coupled to the metal lines or traces of the TISD or FOISD at the frontside (bottom) of the single-layer-packaged logic drive; and the TISD or FOISD may be connected or coupled to the metal pads, pillars or bumps on and under the TISD or FOISD. Therefore, the copper pads, pillars or solder bumps at the backside (top) surface (of the BISD) of the single-layer-packaged logic drive are connected or coupled to the metal pads, pillars or bumps at the frontside (bottom) of the single-layer-packaged logic drive; (c) for connecting or coupling copper pads, pillars or solder bumps (on or over the BISD) vertically over a first FPGA chip (in a first FPGA/HBM CSP) of the single-layer-packaged logic drive to copper pads, pillars or solder bumps (on or over the BISD vertically over a second FPGA chip (in a second FPGA/HBM CSP) of the single-layer-packaged logic drive by using an interconnection net or scheme of metal lines or traces in or of the BISD. The interconnection net or scheme may be connected or coupled to TPVs of the single-layer-packaged logic drive; (d) for connecting or coupling a first copper pad, pillar or solder bump (on or over the BISD) vertically over a FPGA chip (in a FPGA/HBM CSP) of the single-layer-packaged logic drive to one or a plurality of second copper pads, pillars or solder bumps vertically over the same FPGA chip (in the same FPGA/HBM CSP) by using an interconnection net or scheme of metal lines or traces in or of the BISD. The interconnection net or scheme may be connected or coupled to the TPVs of the single-layer-packaged logic drive; (e) for the power or ground planes and/or heat dissipaters or spreaders.

The stacked logic drive using the single-layer-packaged logic drive with the BISD and TPVs may be formed using the same or similar process steps, as described and specified above.

Another aspect of the disclosure provides varieties of interconnection alternatives for the TPVs of a single-layer-packaged logic drive (now turn the logic drive upside down; the TISD or FOISD (or the backside of the logic drive) is at the top side of the logic drive, and the BISD or FOISD (or the frontside of the logic drive) is at the bottom of the logic drive.): (a) the TPV is used as a through via for connecting a single-layer-packaged logic drive above the single-layer-packaged logic drive, and a single-layer-packaged logic drive below the single-layer-packaged logic drive; without connecting or coupled to the FISC, the SISC or micro copper pads, pillars or bumps on or of any IC chip of the single-layer-packaged logic drive. In this case, a stacked structure is formed, from bottom to top: (i) copper pad, pillar or solder bump under of the BISD); (ii) stacked interconnection layers and metal vias in the dielectric layer of the BISD; (iii) the TPV; (iv) stacked interconnection layers and metal vias in the dielectric layer of the TISD or FOISD; and (v) the metal pillar or bump on or over the TISD or FIOISD; (b) the TPV is stacked as a through TPV in (a), but is connected or coupled to the FISC, the SISC or micro copper pads, pillars or bumps on or of one or more IC chips of the single-layer-packaged logic drive, through the metal lines or traces of the TISD or FOISD; (c) the TPV is only stacked at the bottom portion, but not at the top portion. In this case, a structure for the TPV connection is formed, from bottom to top: (i) copper pad, pillar or bump under or of the BISD; (ii) stacked interconnection layers and metal vias in the dielectric layer of the BISD; (iii) the TPV; (iv) the top of the TPV is connected or coupled to the FISC, the SISC or micro copper pads, pillars or bumps on or of one or more IC chips of the single-layer-packaged logic drive, through the interconnection metal layers and metal vias in the dielectric layer of the TISD or FOISD; no metal pillar or bump, vertically over the top of the TPV, is connected or coupled to the TPV; (v) a metal pad, pillar or bump (on or over the TISD or FOISD) connected or coupled to the top of the TPV and at a location not vertically over the top of the TPV; (d) a structure for the TPV connection is formed, from bottom to top: (i) a copper pad, pillar or bump under or of the BISD vertically under an IC chip or CSP of the single-layer-packaged logic drive; (ii) the copper pad, pillar or bump is connected or coupled to the bottom of the TPV (which is located in the gaps or spaces between chips or CSPs or at the peripheral area where no chip and CSP is placed) through the interconnection metal layers and metal vias in the dielectric layer of the BISD; (iii) the TPV; (iv) the top of the TPV is connected or coupled to the FISC, the SISC or micro copper pads, pillars or bumps on or of one or more IC chips of the single-layer-packaged logic drive through the interconnection metal layers and metal vias in the dielectric layer of the TISD; (v) a metal pad, pillar or bump (on the TISD) connected or coupled to the top of the TPV, and may be at a location not vertically over the top of the TPV; (e) a structure for the TPV connection is formed, from bottom to top: (i) a copper pad, pillar or bump vertically under an IC chip or CSP of the single-layer-packaged logic drive; (ii) the copper pad, pillar or bump is connected or coupled to the bottom of the TPV (which is located in the gaps or spaces between chips or CSPs or at the peripheral area where no chip and CSP is placed) through the interconnection metal layers and metal vias in the dielectric layer of the BISD; (iii) the TPV; (iv) the top of the TPV is connected or coupled to the FISC, the SISC or micro copper pads, pillars or bumps on or of one or more IC chips of the single-layer-packaged logic drive through the interconnection metal layers and metal vias in the dielectric layer of the TISD or FOISD. The interconnection metal layers and metal vias in the dielectric layer of the TISD or FOISD may comprise an interconnection net or scheme of metal lines or traces in or of the TISD or FOISD of the (this) single-layer-packaged logic drive used for connecting or coupling the transistors, the FISC, the SISC and/or micro copper pads, pillars or bumps on or of one or more IC chips of the single-layer-packaged logic drive, but the interconnection net or scheme is not connected or coupled to the circuits or components outside or external to the (this) single-layer-packaged logic drive. That is, no metal pillars or bumps (copper pillars or bumps, solder bumps, or gold bumps) of the single-layer-packaged logic drive is connected to the interconnection net or scheme of metal lines or traces in or of the TISD or FOISD, and therefore, no metal pillars or bumps (copper pillars or bumps, solder bumps, or gold bumps) of the single-layer-packaged logic drive is connected or coupled to the top of the TPV.

Another aspect of the disclosure provides an interconnection net or scheme of metal lines or traces in or of the TISD or FOISD of the single-layer-packaged logic drive used for connecting or coupling the transistors, the FISC, the SISC and/or the micro copper pads, pillars or bumps of an FPGA IC chip of the FPGA/HBM CSP packaged in the single-layer-packaged logic drive (through copper pillars or solder bumps of the FPGA/HBM CSP), but the interconnection net or scheme is not connected or coupled to the circuits or components outside or external to the single-layer-packaged logic drive. That is, no metal pads, pillars or bumps (copper pads, pillars or bumps, solder bumps, or gold bumps) on or over the TISD or FOISD of the single-layer-packaged logic drive is connected to the interconnection net or scheme of metal lines or traces in or of the TISD or FOISD, and no copper pads, copper pillars or solder bumps under the BISD is connected or coupled to the interconnection net or scheme of metal lines or traces in or of the TISD or FOISD.

Another aspect of the disclosure provides the logic drive in a multi-chip package format further comprising one or plural Dedicated Programmable Interconnection IC chip or chips (DPIIC). The DPIIC chip comprises 5 T or 6 T SRAM cells and cross-point switches, and is used for programming the interconnection between circuits or interconnections of the standard commodity FPGA chips of the FPGA/HBM CSP in the logic drive. The programmable interconnections comprise interconnection metal lines or traces of the TISD (or FOISD) between the standard commodity FPGA chips of the FPGA/HBM CSP or other IC chips or CSPs in or of the logic drive, wherein cross-point switch circuits are in the middle of interconnection metal lines or traces of the TISD (or FOISD). For example, n metal lines or traces of the TISD (or FOISD) are input to a cross-point switch circuit, and m metal lines or traces of the TISD (or FOISD) are output from the switch circuit. The cross-point switch circuit is designed such that each of the n metal lines or traces of the TISD (or FOISD) can be programed to connect to anyone of the m metal lines or traces of the TISD (or FOISD). The cross-point switch circuit may be controlled by the programming code stored in, for example, an SRAM cell in or of the DPIIC chip. The SRAM cell may comprise 6-Transistors (6 T), with two transfer (write) transistors and 4 data-latch transistors. The two transfer (write) transistors are used for writing the programing code or data into the two storage or latch nodes of the 4 data-latch transistors. Alternatively, the SRAM cell may comprise 5-Transistors (5 T), with a transfer (write) transistor and 4 data-latch transistors. The transfer (write) transistor is used for writing the programing code or data into the two storage or latch nodes of the 4 data-latch transistors. The stored (programming) data in the 5 T or 6 T SRAM cell is used to program the connection or not-connection of metal lines or traces of the TISD. The cross-point switches are the same as that described above in the standard commodity FPGA IC chips of the FPGA/HBM CSP. The details of various types of cross-point switches are as specified or described in the above paragraphs of FPGA IC chips of the FPGA/HBM CSP. The cross-point switches may comprise: (1) n-type and p-type transistor pair circuits; or (2) multiplexers and switch buffers. In (1), when the data latched in the 5 T or 6 T SRAM cell is programmed at 1, a pass/no-pass circuit comprising a n-type and p-type transistor pair is on, and the two metal lines or traces of the TISD (or FOISD) connected to two terminals of the pass-no-pass circuit (the source and drain of the transistor pair, respectively), are connected; while the data latched in the 5 T or 6 T SRAM cell is programmed at 0, a pass/no-pass circuit comprising a n-type and p-type transistor pair circuit is off, and the two metal lines or traces of the TISD (or FOISD) connected to two terminals of the pass/no-pass circuit (the source and drain of the transistor pair, respectively), are dis-connected. In (2), the multiplexer selects one from n inputs as its output, and then input its output to the switch buffer. When the data latched in the 5 T or 6 T SRAM cell is programmed at 1, the control N-MOS transistor and the control P-MOS transistor in the switch buffer are on, the data on the input metal line is passing to the output metal line of the cross-point switch, and the two metal lines or traces of the TISD (or FOISD) connected to two terminals of the cross-point switch are coupled or connected; while the data latched in the 5 T or 6 T SRAM cell is programmed at 0, the control N-MOS transistor and the control P-MOS transistor in the switch buffer are off, the data on the input metal line is not passing to the output metal line of the cross-point switch, and the two metal lines or traces of the TISD (or FOISD) connected to two terminals of the cross-point switch are not coupled or dis-connected. The DPIIC chip comprises 5 T or 6 T SRAM cells and cross-point switches used for programmable interconnection of metal lines or traces of the TISD or FOISD between the standard commodity FPGA chips (in the FPGA/HBM CSPs) in the logic drive. Alternatively, the DPIIC chip comprising 5 T or 6 T SRAM cells and cross-point switches may be used for programmable interconnection of metal lines or traces of the TISD or FOISD between the standard commodity FPGA chips of the FPGA/HBM CSP and the TPVs (for example, the bottom surfaces of the TPVs) in the logic drive, in the same or similar method as described above, here the TISD or FOISD is at the bottom of the logic drive, and the BISD is at the top of the logic drive. The stored (programming) data in the 5 T or 6 T SRAM cell is used to program the connection or not-connection between (i) a first metal line, trace, or net of the TISD or FOISD, connecting to one or more micro copper pads, pillars or bumps on or of one or more the IC chips of the logic drive, and/or to one or more metal pads, pillars or bumps on or under the TISD or FOISD, and (ii) a second metal line, trace or net of the TISD or FOISD, connecting or coupling to a TPV (for example, the bottom surface of the TPV), in a same or similar method described above. With this aspect of disclosure, TPVs are programmable; in other words, this aspect of disclosure provides programmable TPVs. The programmable TPVs may, alternatively, use the programmable interconnection, comprising 5 T or 6 T SRAM cells and cross-point switches, on or of the FPGA chips of the FPGA/HBM CSP in or of the logic drive. The programmable TPV may be, by (software) programming, (i) connected or coupled to one or more micro copper pillars or bumps of one or more IC chips (therefor to the metal lines or traces of the SISC and/or the FISC, and/or the transistors) of the logic drive, and/or (ii) connected or coupled to one or more metal pads, pillars or bumps on or under TISD or FOISD of the logic drive.

The metal pad, bump or pillar (on or over the BISD) at the backside of the logic drive is programmable when it is connected to the programmable TPV. Here the TISD or FOISD is at the bottom of the logic drive, and the BISD is at the top of the logic drive. The programmable metal pad, bump or pillar (on or of the BISD) at the backside of the logic drive may be connected or coupled to, by programming and through the programmable TPV, (i) one or more micro copper pillars or bumps of one or more IC chips or FPGA/HBM CSPs (therefor to the metal lines or traces of the SISC and/or the FISC, and/or the transistors) at the frontside (the side with the transistors) of the one or more IC chips or FPGA/HBM CSPs of the logic drive, and/or (ii) one or more metal pads, pillars or bumps on or under the TISD (or FOISD) of the logic drive.

The metal pad, pillar or bump on or under the TISD or FOISD is programmable using cross-point switches on the DPIIC chip, wherein the cross-point switches may be used for programmable interconnection of metal lines or traces of the TISD (or FOISD) between the metal pads, pillars or bumps (copper pads, copper pillars or bumps, solder bumps or gold bumps) on or under TISD (or FOISD) of the logic drive and one or more micro copper pads, pillars or bumps on or of one or more IC chips or FPGA/HBM CSPs of the logic drive, in a same or similar method as described above. The stored (programming) data in the 5 T or 6 T SRAM cell is used in the cross point switches to program the connection or not-connection between (i) a first metal line, trace or net of the TISD or FOISD, connecting to one or more micro copper pads, pillars or bumps on or of one or more IC chips or FPGA/HBM CSPs of the logic drive, and/or to the metal pads, pillars or bumps on or under the TISD or FOISD, and (ii) a second metal line, trace or net of the TISD or FOISD, connecting or coupling to the metal pad, pillar or bump on or under the TISD or FOISD, in a same or similar method described above. With this aspect of disclosure, the metal pads, pillars or bumps on or under the TISD or FOISD are programmable; in other words, this aspect of disclosure provides programmable metal pads, pillars or bumps on or under the TISD or FOISD. The programmable metal pad, pillar or bump on or under the TISD or FOISDE may, alternatively, use the programmable interconnection, comprising 5 T or 6 T SRAM cells and cross-point switches, on or of the FPGA chips of the FPGA/HBM CSP in or of the logic drive. The programmable metal pad, pillar or bump on or under the TISD or FOISD may be connected or coupled, by programming, to one or more micro copper pads, pillars or bumps of one or more IC chips or FPGA/HBM CSPs (therefor to the metal lines or traces of the SISC and/or the FISC, and/or the transistors of the FPGA chips of the FPGA/HBM CSP) of the logic drive.

The DPIIC chip is designed, implemented and fabricated using varieties of semiconductor technology nodes or generations, including old or matured technology nodes or generations, for example, a semiconductor node or generation less advanced than or equal to, or above or equal to 20 nm, 30 nm, 40 nm, 50 nm, 90 nm, 130 nm, 250 nm, 350 nm, 500 nm. The semiconductor technology node or generation used in the DPIIC chip is 1, 2, 3, 4, 5 or greater than 5 nodes or generations older, more matured or less advanced than that used in the standard commodity FPGA IC chips of the FPGA/HBM CSP packaged in the same logic drive. Transistors used in the DPIIC chip may be a FINFET, a Fully Depleted Silicon-on-insulator (FDSOI) MOSFET, a Partially Depleted Silicon-on-insulator (PDSOI) MOSFET or a conventional MOSFET. Transistors used in the DPIIC chip may be different from that used in the standard commodity FPGA IC chips of the FPGA/HBM CSP packaged in the same logic drive; for example, the DPIIC chip may use the conventional MOSFET, while the standard commodity FPGA IC chips of the FPGA/HBM CSP packaged in the same logic drive may use the FINFET; or the DPIIC chip may use the Fully Depleted Silicon-On-Insulator (FDSOI) MOSFET, while the standard commodity FPGA IC chips of the FPGA/HBM CSP packaged in the same logic drive may use the FINFET.

Another aspect of the disclosure provides a standardized footprints or layouts (locations and sizes) of (i) the copper pads, pillars or solder bumps on or under the TISD or FOISD; (ii) the copper pads, pillars or solder bumps on or over the BISD; (iii) the TPVs in the logic drive; wherein the TISD or FOISD is at the bottom of the logic drive, and the BISD is at the top of the logic drive. The standard commodity logic drive with a fixed layout or design may be used and customized, by software coding or programming, using the programmable TPVs, programmable metal pads, pillars or bumps on or under the TISD or FOISD, and/or programmable metal pads, pillars or bumps on or over the BISD as described and specified above, for different applications. As described above, the data installed or programed in the 5 T or 6 T SRAM cells of the DPIIC chips may be used for programmable TPVs, programmable metal pads, pillars or bumps on or under the TISD or FOISD, and/or programmable metal pads, pillars or bumps on or over the BISD. The data installed or programed in the 5 T or 6 T SRAM cells of the FPGA chips of the FPGA/HBM CSP may be alternatively used for programmable TPVs, programmable metal pads, pillars or bumps on or under the TISD or FOISD, and/or programmable metal pads, pillars or bumps on or over the BISD. Each of the standard commodity logic drives with the same design, layout or footprint of the metal pads, pillars or bumps on or under the TISD or FOISD, and the copper pads, copper pillars or bumps, or solder bumps on or over the BISD may be used for different applications, purposes or functions, by software coding or programming, using the programmable metal pads, pillars or bumps on or under the TISD or FOISD, and/or programmable copper pads, copper pillars or bumps, or solder bumps on or over the BISD (through programmable TPVs) of the logic drive.

Another aspect of the disclosure provides an interposer for flip-chip assembly or packaging in forming the multi-chip package of the logic drive. The multi-chip package is based on multiple-Chips-On-an-Interposer (COIP) flip-chip packaging method. The interposer or substrate in the COIP multi-chip package comprises: (i) high density interconnects for fan-out and interconnection between IC chips or CSPs flip-chip-assembled, bonded or packaged on or over the interposer, (ii) micro metal pads, bumps or pillars on or over the high density interconnects, (iii) deep holes or vias or shallow holes or vias in the substrate or interposer. The IC chips or packages to be flip-chip assembled, bonded or packaged, to the substrate or interposer include the chips or packages mentioned, described and specified above: the standard commodity FPGA/HBM CSPs, the non-volatile chips (for example, the NAND flash IC chips) or packages, the dedicated control chip, the dedicated I/O chip, the dedicated control and I/O chip, IAC chip, and/or processing and/or computing IC chip, for example CPU, GPU, DSP, TPU, APU or AI chip. The process steps for forming the interposer of the logic drive are as follows:

(1) Providing a substrate. The substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the substrate may be silicon, metal, ceramics, glass, steel, plastics, polymer, epoxy-based polymer, or epoxy-based compound. As an example, a silicon wafer may be used as a substrate in forming a silicon interposer.

(2) Forming metal vias in the substrate: forming deep holes or vias or shallow holes or vias in the substrate. Silicon wafer is used as an example in forming the metal vias in the silicon substrate. The bottom surface metal vias in the silicon wafer are exposed in the final product of the logic drive, therefore, the metal vias become through vias, and the through vias are the Trough-Silicon-Vias (TSVs).

(3) Forming a First Interconnection Scheme on or of the Interposer (FISIP). The metal lines or traces and the metal vias of the FISIP are formed by the single damascene copper processes or the double damascene copper processes as described or specified above in forming the metal lines or traces and metal vias in the FISC of FPGA IC chips. The FISIP may comprise 2 to 10 layers, or 3 to 6 layers of interconnection metal layers. The metal lines or traces of the interconnection metal layers of FISIP have the adhesion layer (Ti or TiN, for example) and the copper seed layer at both the bottoms and the sidewalls of the metal lines or traces.

The metal lines or traces in the FISIP are coupled or connected to the micro copper bumps or pillars of the IC chips or CSPs in or of the logic drive, and coupled or connected to the TSVs in the substrate of the interposer. The thickness of the metal lines or traces of the FISIP, either formed by the single-damascene process or by the double-damascene process, is, for example, between 3 nm and 2,000 nm, 3 nm and 500 nm, between 10 nm and 1,000 nm, or between 10 nm and 2,000 nm, or, thinner than or equal to 50 nm, 100 nm, 200 nm, 300 nm, 500 nm, 1,000 nm, 1,500 nm or 2,000 nm. The minimum width of the metal lines or traces of the FISIP is, for example, equal to or smaller than 50 nm, 100 nm, 150 nm, 200 nm, 300 nm, 500 nm, 1,000 nm, 1,500 nm or 2,000 nm. The minimum space between two neighboring metal lines or traces of the FISIP is, for example, equal to or smaller than 50 nm, 100 nm, 150 nm, 200 nm, 300 nm, 500 nm, 1,000 nm, 1,500 nm or 2,000 nm. The minimum pitch of the metal lines or traces of the FISIP is, for example, equal to or smaller than 100 nm, 200 nm, 300 nm, 400 nm, 600 nm, 1,000 nm, 3,000 nm or 4,000 nm. The thickness of the inter-metal dielectric layer has a thickness, for example, between 3 nm and 500 nm, between 10 nm and 1,000 nm, or between 10 nm and 2,000 nm, or, thinner than or equal to 50 nm, 100 nm, 200 nm, 300 nm, 500 nm, 1,000 nm or 2,000 nm. The metal lines or traces of the FISIP may be used as the programmable interconnection.

(4) Forming a Second Interconnection Scheme of the Interposer (SISIP) on or over the FISIP structure. The SISIP comprises multiple interconnection metal layers, with an inter-metal dielectric layer between each of the multiple interconnection metal layers. The metal lines or traces and the metal vias are formed by the emboss electroplating copper processes as described or specified above in forming the metal lines or traces and metal vias in the SISC of FPGA IC chips. The SISIP may comprise 1 to 5 layers, or 1 to 3 layers of interconnection metal layers. Alternatively, the SISIP on or of the interposer may be omitted, and the COIP only has FISIP interconnection scheme on the substrate of the interposer. Alternatively, the FISIP on or of the interposer may be omitted, and the COIP only has SISIP interconnection scheme on the substrate of the interposer.

The thickness of the metal lines or traces of SISIP is between, for example, 0.3 μm and 20 μm, 0.5 μm and 10 μm, 1 μm and 5 μm, 1 μm and 10 μm, 2 μm and 20 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISIP is between, for example, 0.3 μm and 20 μm, 0.5 μm and 10 μm, 1 μm and 5 μm, 1 μm and 10 μm, 2 μm and 20 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISIP may be used as the programmable interconnection.

(5) Forming micro copper pads, pillars or bumps (i) on the top surface of the top-most interconnection metal layer of SISIP, exposed in openings in the topmost insulating dielectric layer of the SISIP, or (ii) on the top surface of the top-most interconnection metal layer of FISIP, exposed in openings in the topmost insulating dielectric layer of the FISIP in the case wherein the SISIP is omitted. An emboss electroplating copper process, as described and specified in above paragraphs, is performed to form the micro copper pads, pillars or bumps on or over the interposer.

The height of the micro pads, pillars or bumps on or over the interposer is between, for example, 1 μm and 60 μm, 5 μm and 50 μm, 5 μm and 40 μm, 5 μm and 30 μm, 5 μm and 20 μm, 1 μm and 15 μm, or 1 μm and 10 μm, or smaller than or equal to 60 μm, 50 μm, 40 μm, 30 μm, 20 μm, 15 μm, 10 μm or 5 μm. The largest dimension in a cross-section of the micro pads, pillars or bumps (for example, the diameter of a circle shape, or the diagonal length of a square or rectangle shape) is between, for example, 1 μm and 60 μm, 5 μm and 50 μm, 5 μm and 40 μm, 5 μm and 30 μm, 5 μm and 20 μm, 1 μm and 15 μm, or 1 μm and 10 μm, or smaller than or equal to 60 μm, 50 μm, 40 μm, 30 μm, 20 μm, 15 μm, 10 μm or 5 μm. The space between a micro pad, pillar or bump to its nearest neighboring micro pad, pillar or bump is between, for example, 1 μm and 60 μm, 5 μm and 50 μm, 5 μm and 40 μm, 5 μm and 30 μm, 5 μm and 20 μm, 1 μm and 15 μm, or 1 μm and 10 μm, or smaller than or equal to 60 μm, 50 μm, 40 μm, 30 μm, 20 μm, 15 μm, 10 μm or 5 μm.

Another aspect of the disclosure provides a method for forming the logic drive in a COIP multi-chip package using an interposer comprising the FISIP, the SISIP, micro copper pads, bumps or pillars and the metal vias in the substrate based on a flip-chip assembled multi-chip packaging technology and process. The process steps for forming the COIP multi-chip packaged logic drive are described as below:

(1) Performing flip-chip assembling, bonding or packaging: (a) First providing the interposer comprising the FISIP, the SISIP, micro copper bumps or pillars and TSVs, and IC chips or packages; then flip-chip assembling, bonding or packaging the IC chips or packages to and on the interposer. The interposer is formed as described and specified above. The IC chips or packages to be assembled, bonded or packaged to the interposer include the chips or packages mentioned, described and specified above: the standard commodity the standard commodity FPGA/HBM CSPs, the non-volatile chips or packages, the dedicated control chip, the dedicated I/O chip, the dedicated control and I/O chip, IAC, chip and/or computing and/or processing IC chips, for example, CPU, GPU, DSP, TPU. APU or AI chips. All chips or packages to be flip-chip packaged in the logic drives comprise micro copper pads, pillars or bumps with solder caps on the top surface of the chips or packages; (b) The chips or packages are flip-chip assembled, bonded or packaged on or to corresponding micro copper pads, bumps or pillar on or of the interposer with the side or surface of the chip or CSP with micro copper pads, pillars or bumps faced down. The frontsides of the chips or CSPs (the sides with micro copper pads, pillars or bumps) are faced up; (c) Filling the gaps or spaces between the interposer and the IC chips or CSPs (and between micro copper bumps or pillars of the IC chips (or CSPs) and the interposer) with an underfill material by, for example, a dispensing method using a dispenser.

(2) Applying a material, resin, or compound to fill the gaps or spaces between chips (or CSPs) and cover the backside surfaces of chips (or CSPs) by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the interposer and on or over the backside of the chips (or CSPs) to a level to: (i) fill gaps or spaces between chips (or CSPs), (ii) cover the top-most backside surface of the chips (or CSPs). The material may be polymer or molding compound. Applying a CMP, polishing or grinding process to planarize the surface of the applied material, resin or compound. Optionally, the CMP, or grinding process is performed until a level where the backside surfaces of all IC chips (or CSPs) are fully exposed.

(3) Thinning the silicon substrate of the interposer to expose the bottom surfaces of the metal vias in the silicon substrate to form Through-Silicon-Vias (TSVs). A wafer or panel thinning process, for example, a CMP process, a polishing process or a wafer backside grinding process, may be performed to remove portion of the wafer or panel to make the wafer or panel thinner, in a wafer or panel process, to expose the surfaces of the metal through vias (TSVs) at the backside of the interposer.

The interconnection metal lines or traces of the FISIP and/or SISIP of the interposer for the logic drive may have same functions as that of the TISD or FOISD in the FOIT logic drive as described and specified above. The interconnection metal lines or traces of the FISIP and/or SISIP of the interposer for the logic drive may: (a) comprise an interconnection net or scheme of metal lines or traces in or of the FISIP and/or SISIP of the logic drive for connecting or coupling the transistors, the FISC, the SISC and/or the micro copper pads, pillars or bumps of a first FPGA IC chip of a first standard commodity FPGA/HBM CSP in the logic drive (through TPVCs, BISCSP and the copper pillars or solder bumps on or under the BISCSP of the first FPGA/HBM CSP) to the transistors, the FISC, the SISC and/or the micro copper pads, pillars or bumps of a second FPGA IC chip of a second standard commodity FPGA/HBM CSPs chip packaged in the same logic drive (through TPVCs, BISCSP and the copper pillars or solder bumps on or under the BISCSP of the second FPGA/HBM CSP). This interconnection net or scheme of metal lines or traces in or of the FISIP and/or SISIP may be connected to the circuits or components outside or external to the logic drive through TSVs in the substrate of the interposer. This interconnection net or scheme of metal lines or traces in or of the FISIP and/or SISIP may be a net or scheme for signals, or the power or ground supply; (b) comprise an interconnection net or scheme of metal lines or traces in or of the FISIP and/or SISIP of the logic drive connecting to multiple micro copper pillars or bumps of an IC chip or CSP in or of the logic drive. This interconnection net or scheme of metal lines or traces in or of the FISIP and/or SISIP may be connected to the circuits or components outside or external to the logic drive through the TSVs in the substrate of the interposer. This interconnection net or scheme of metal lines or traces in or of the FISIP and/or SISIP may be a net or scheme for signals, or the power or ground supply; (c) comprise interconnection metal lines or traces in or of the FISIP and/or SISIP of the logic drive for connecting or coupling to the circuits or components outside or external to the logic drive, through one or plural of the TSVs in the substrate of the interposer. The interconnection metal lines or traces in or of the FISIP and/or SISIP may be used for signals, power or ground supplies. In this case, for example, the one or plural of the TSVs in the substrate of the interposer may be connected to the I/O circuits of, for example, the dedicated I/O chip of the logic drive. The I/O circuits in this case may be a large I/O circuit, for example, a bi-directional (or tri-state) I/O pad or circuit, comprising an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF; (d) comprise an interconnection net or scheme of metal lines or traces in or of the FISIP and/or SISIP of the logic drive used for connecting the transistors, the FISC, the SISC and/or the micro copper pillars or bumps of a first standard commodity FPGA IC chip of a first FPGA/HBM CSPs chip of the logic drive (through TPVCs, BISCSP and the copper pillars or solder bumps on or under the BISCSP of the first FPGA/HBM CSP) to the transistors, the FISC, the SISC and/or the micro copper pillars or bumps of a second FPGA IC chip of a second FPGA/HBM CSP packaged in the logic drive (through TPVCs, BISCSP and the copper pillars or solder bumps on or under the BISCSP of the second FPGA/HBM CSP); but not connected to the circuits or components outside or external to the logic drive. That is, no TSV in the substrate of the interposer of the logic drive is connected to the interconnection net or scheme of metal lines or traces in or of the FISIP and/or SISIP. In this case, the interconnection net or scheme of metal lines or traces in or of the FISIP and/or SISIP may be connected or coupled to the off-chip I/O circuits of the first and second FPGA chips of the first and second FPGA/HBM CSPs, respectively, packaged in the logic drive. Each of the I/O circuits in this case may be a small I/O circuit, for example, a bi-directional (or tri-state) I/O pad or circuit, comprising an ESD circuit, a receiver, and/or a driver, and may have an input capacitance or output capacitance between 0.05 pF and 2 pF, or 0.05 pF and 1 pF; or smaller than 2 pF or 1 pF; (e) comprise an interconnection net or scheme of metal lines or traces in or of the FISIP and/or SISIP of the logic drive used for connecting or coupling to multiple micro copper pillars or bumps of an IC chip or CSP in or of the logic drive; but not connecting to the circuits or components outside or external to the logic drive. That is, no TSV in the substrate of the interposer of the logic drive is connected to the interconnection net or scheme of metal lines or traces in or of the FISIP and/or SISIP. In this case, the interconnection net or scheme of metal lines or traces in or of the FISIP and/or SISIP may be connected or coupled to the transistors, the FISC, the SISC and/or the micro copper pillars or bumps of the FPGA IC chip of the FPGA/HBM CSP of the logic drive (through TPVCs, BISCSP and the copper pillars or solder bumps on or under the BISCSP of the FPGA/HBM CSP), without going through any I/O circuit of the FPGA IC chip.

(4) Forming metal pillars or bumps, for example copper pillars or solder bumps, on or under the exposed bottom surfaces of the TSVs. The metal pillars or bumps may be located at the frontside (bottom) surface of the logic drive package with a layout in a Ball-Grid-Array (BGA), having the metal pillars or bumps at the peripheral area used for the signal I/Os, and the metal pillars or bumps at or near the central area used for the Power/Ground (P/G) I/Os. The signal bumps at the peripheral area may form ring or rings along the edges of the logic driver package, with 1 ring, or 2, 3, 4, 5, 6 rings. The pitches of the metal pillars or bumps for the signal I/Os in the peripheral area may be smaller than that for the P/G I/Os at or near the central area of the logic drive package.

(5) Separating, cutting or dicing the finished wafer or panel, including separating, cutting or dicing through materials or structures between two neighboring logic drives. The material (for example, polymer) filling gaps or spaces between chips (or CSPs) of two neighboring logic drives is separated, cut or diced to from individual unit of logic drives.

Another aspect of the disclosure provides the standard commodity COIP multi-chip packaged logic drive. The standard commodity COIP logic drive may be in a shape of square or rectangle, with a certain widths, lengths and thicknesses. An industry standard may be set for the shape and dimensions of the logic drive. For example, the standard shape of the COIP-multi-chip packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the COIP-multi-chip packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. Furthermore, the metal bumps or pillars on or under the interposer in the logic drive may be in a standard footprint, for example, in an area array of M×N with a standard dimension of pitch and space between neighboring two metal bumps or pillars. The location of each metal bumps or pillars is also at a standard location.

The logic drive formed by the COIP multi-chip packaging may further including Through Package or Polymer Vias, pillars, or posts (TPVs) and/or Backside Interconnection Scheme of logic drive (BISD), which are similar or the same as in TPVs or BISD in the FOIT logic drive, as described and specified above. In forming the interposer, the TPVs are formed on or over the SISIP (or FISIP when SISIP is omitted) of the interposer. The functions and specifications of the TPVs and BISD of COIP logic drives are the same as that specified in the above FOIT logic drives.

All specifications, functions, purposes of the structures and designs of the FOIT logic drives described and specified above can be applied to the corresponding structures or designs in the COIP structures.

Another aspect of the disclosure provides a method for forming the logic drive in a Chip-On-Interconnection-Substrate (COIS) multi-chip package using an Interconnection Substrate (IS), wherein the IS comprises the interconnection Schemes of the Printed Circuit Board (PCB) substrate or Ball Grid Array (BGA) substrate and silicon Fineline Interconnection Bridges (FIB) embedded in it. The FIB is used for high speed, high density interconnection between IC chips or CSPs flipchip assembled on the IS substrate. The FIBs comprise First Interconnection Schemes on the substrates of FIBs (FISIB) and/or Second Interconnection Schemes on the substrates of FIBs (SISIB). The FISIB is formed by processes including damascene copper processes as described and specified above in forming the FISC of the FPGA IC chips, and the SISIB is formed by processes including embossing electroplating copper processes as described and specified above in forming the SISC of the FPGA IC chips. The description, fabrication processes, specifications, features of the FISIB is as described and specified above in the FISIP of the interposers used in the COIP logic drives, and the description, fabrication processes, specifications and features of the SISIB is as described and specified above in the SISIP of the interposers used in the COIP logic drives. The FIBs are then embedded in the IS. The IS is formed by the PCB or BGA processes, for example, semi-additive process using laminated dielectric insulating layers and copper foils. The dielectric insulating layers may comprise FR4 (a composite material composed of woven fiberglass cloth with an epoxy resin binder) or BT (Bismaleimide Triazine Resin).

The COIS packages are the same as the COIP package except that Interconnection Substrates are used instead of the InterPosers (IP). The interconnection schemes of IS comprises the interconnection Schemes of the Printed Circuit Board (PCB) substrate or Ball Grid Array (BGA) substrate and silicon Fineline Interconnection Bridges (FIB) embedded in it, wherein FIB comprise the FISIB and/or SISIB. The purposes and functions of the interconnections schemes of the IS are same as that of interconnection schemes (FISIP and/or SISIP) of the interposers. The purposes and functions of the interconnections schemes of the IS are also same as that of interconnection schemes of the TISD in the FOIT logic drives as described above. The IC chips or CSP packages to be assembled, bonded or packaged to the IS include the chips or CSP packages mentioned, described and specified above: the standard commodity DRAM IC chips or FPGA/HBM CSP packages, the non-volatile chips or packages, the dedicated control chip, the dedicated I/O chip, the dedicated control and I/O chip, IAC chip, DIPIIC chip and/or computing and/or processing IC chips, for example, CPU, GPU, DSP, TPU. APU or AI chips.

The logic drive formed by the COIS multi-chip packaging can further include Through Package or Polymer Vias, pillars, or posts (TPVs) and/or Backside Interconnection Scheme of logic drive (BISD), which are similar or the same as in TPVs or BISD in the COIP logic drive or in the FOIT logic drive. In forming the IS, the TPVs are formed on or over the IS. The functions and specifications of the TPVs and BISD of COIS logic drives are the same as that specified in the COIP logic drives or the FOIT logic drives.

All specifications, functions, purposes of the structures and designs of the COIP logic drives or the FOIT logic drives described above can be applied to the corresponding structures or designs in the COIS structures.

Another aspect of the disclosure provides a logic drive comprising Chip-Scale-Packages (CSPs) comprising processor, computing or logic IC chips and the HBM IC chips or the HBM SCSPs. The CSPs are similar to the FPGA/HBM CSPs, except that other processor, computing or logic IC chips are used replacing the FPGA IC chip in the CSPs. The other processor, computing or logic IC chip in the CSPs may be a CPU chip, a GPU chip, a DSP chip, a TPU chip, an APU chip, an ASIC chip or an AI chip, wherein the CPU chip, the GPU chip, the DSP chip, the TPU chip, the APU chip, the ASIC chip or the AI chip comprises TPVCs and copper pads, pillar or bumps as described and specified for the FPGA IC chip, wherein the height of the TPVCs is taller than that of the copper pads, pillar or bumps by greater than 20 micrometers or 50 micrometers. Alternatively, the CPU chip, the GPU chip, the DSP chip, the TPU chip, the APU chip, the ASIC chip or the AI chip comprises TPVCs and exposed copper pads in the openings of the topmost insulating dielectric layer of SISC or FISC. The CSP, packaged in the logic drive, may be a CPU/HBM CSP, a GPU/HBM CSP, a TPU/HBM CSP, an APU/HBM CSP, an ASIC/HBM CSP, or an AI/HBM CSP. The structures and the methods of forming the structures of the CPU/HBM CSP, the GPU/HBM CSP, the TPU/HBM CSP, the APU/HBM CSP, the ASIC/HBM CSP, or the AI/HBM CSP are the same or similar to that of the FPGA/HBM CSPs, as described and specified in the above aspects. The structures and the methods of forming the structures of the logic drive, comprising the CPU/HBM CSP, the GPU/HBM CSP, the TPU/HBM CSP, the APU/HBM CSP, the ASIC/HBM CSP, or the AI/HBM CSP, are the same or similar to that of the logic drive comprising FPGA/HBM CSPs, as described and specified in all above aspects.

Another aspect of the disclosure provides a logic drive comprising Chip-Scale-Packages (CSPs) comprising processor, computing or logic IC chips and the HBM IC chips or the HBM SCSPs. The CSPs are similar to FPGA/HBM CSPs, except that (i) the first IC chip comprising processor, computing or logic IC chips are used as the FPGA IC chip in the FPGA/HBM CSP, and (ii) the second IC chip or a package comprising processor, computing or logic IC chips are used as the HBM IC chip or the HBM SCSP in the FPGA/HBM CSP. The first IC chip may be a FPGA IC chip, a CPU chip, a GPU chip, a DSP chip, a TPU chip, an APU chip, an ASIC chip or an AI chip, wherein the FPGA IC chip, the CPU chip, the GPU chip, the DSP chip, the TPU chip, the APU chip, the ASIC chip or the AI chip comprises TPVCs and copper pads, pillar or bumps as described and specified for the FPGA IC chip in the FPGA/HBM CSP, wherein the height of the TPVCs is taller than that of the copper pads, pillar or bumps by greater than 20 micrometers or 50 micrometers. Alternatively, the FPGA IC chip, the CPU chip, the GPU chip, the DSP chip, the TPU chip, the APU chip, the ASIC chip or the AI chip comprises TPVCs and exposed copper pads in the openings of the topmost insulating dielectric layer of SISC or FISC. The second IC chip or the package may be a FPGA IC chip, a CPU chip, a GPU chip, a DSP chip, a TPU chip, an APU chip, an ASIC chip, an AI chip, the dedicated I/O chip, the dedicated control chip, the dedicated control and I/O chip, the IAC chip and/or the DPIIC chip, wherein the FPGA IC chip, the CPU chip, the GPU chip, the DSP chip, the TPU chip, the APU chip, the ASIC chip, the AI chip, the dedicated I/O chip, the dedicated control chip, the dedicated control and I/O chip, the IAC chip and/or the DPIIC chip may optionally have TSVs in its silicon substrate as that in the HBM IC chips in the HBM SCSP. The dedicated I/O chip, the dedicated control chip, the dedicated control and I/O chip, the IAC chip and the DPIIC chip are as described and specified in the above aspects. The CSP, packaged in the logic drive, is a FPGA/CLC CSP, a CPU/CLC CSP, a GPU/CLC CSP, a TPU/CLC CSP, an APU/CLC CSP, an ASIC/CLC CSP, or an AI/CLC CSP, wherein CLC is an abbreviation of the processor, Computing or Logic IC Chip. The structures and the methods of forming the structures of the FPGA/CLC CSP, the CPU/CLC CSP, the GPU/CLC CSP, the TPU/CLC CSP, the APU/CLC CSP, the ASIC/CLC CSP or the AI/CLC CSP, are the same or similar to that of FPGA/HBM CSPs, as described and specified in the above aspects. The structures and the methods of forming the structures of the logic drive, comprising the FPGA/CLC CSP, the CPU/CLC CSP, the GPU/CLC CSP, the TPU/CLC CSP, the APU/CLC CSP, the ASIC/CLC CSP, or the AI/CLC CSP, are the same or similar that of the logic drive comprising FPGA/HBM CSPs, as described and specified in the above aspects.

Another aspect of the disclosure provides a logic drive in a 3D multi-chip package format. The logic drive comprises a plurality of IC chips and/or packages, wherein the a plurality of IC chips or packages may comprise a FPGA IC chip, a CPU chip, a GPU chip, a DSP chip, a TPU chip, an APU chip, an ASIC chip, an AI chip, a NAND flash memory chip or package, a HBM chip or package, the HBM SCSP, the dedicated I/O chip, the dedicated control chip, the dedicated control and I/O chip, the IAC chip and/or the DPIIC chip. The plurality of IC chips and/or packages may be assembled, bonded, connected or coupled, in the x-y directions, to (i) TISD or FOISD in the FOIT package, (ii) SISIP or FISIP in the COIP package, (iii) the interconnection schemes of IS in the COIS package, (iv) the interconnection schemes of a ball grid array (BGA) substrate, or (v) the interconnection schemes of a printed circuit board (PCB). The plurality of IC chips and/or packages may be assembled, bonded, connected or coupled, in the z direction, to each other in a stacked CSP, like the FPGA/HBM CSP, wherein the vertical interconnection or coupling is through TPVS on the bottom-most IC chip in the CSP, and/or through TSVs in the silicon substrate of IC chip or chips on or over the bottom-most IC chip.

All specifications, functions, purposes of the structures and designs of the COIP logic drives described above can be applied to the corresponding structures or designs in the COIS structures.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1A:
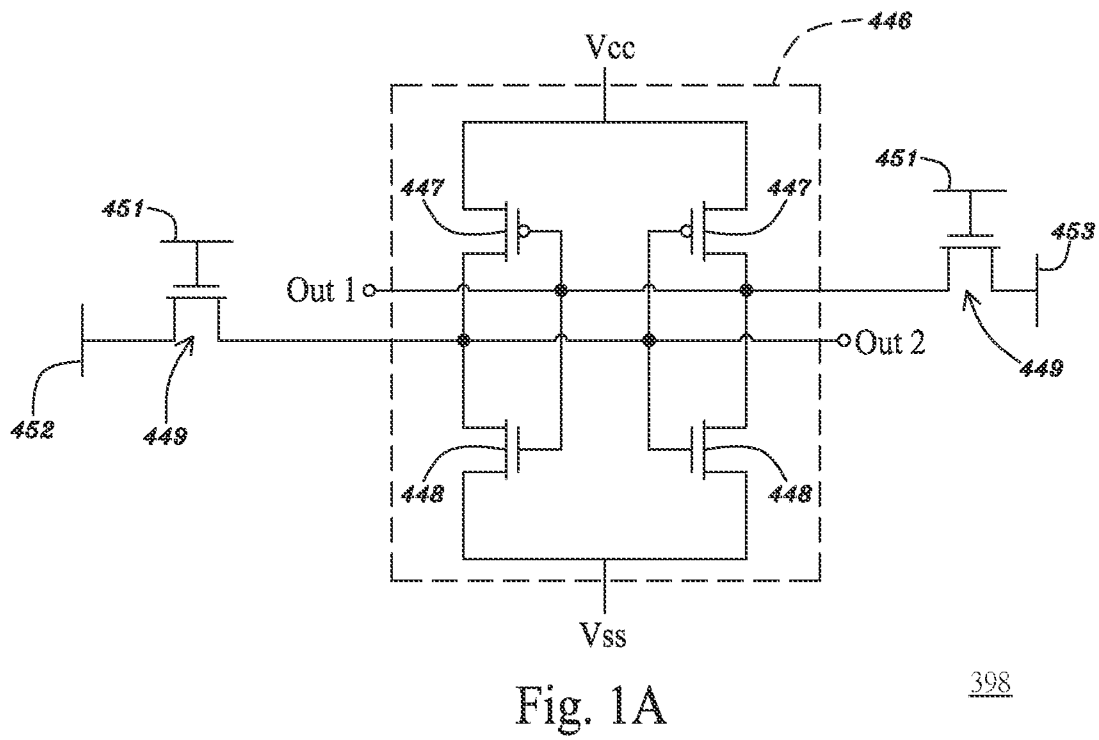
FIGS. 1A and 1B are circuit diagrams illustrating first and second types of SRAM cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) Cells (1) First type of Volatile Storage Unit FIG. 1A is a circuit diagram illustrating a first type of volatile storage unit in accordance with an embodiment of the present application. Referring to FIG. 1A, a first type of volatile storage unit 398 may have a memory unit 446, i.e., static random-access memory (SRAM) cell, composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as a first output point of the memory unit 446 for a first data output Out1 of the memory unit 446. The gate terminals of the P-type and N-type MOS transistors 447 and 448 in the right pair are coupled to the drain terminals of the P-type and N-type MOS transistors 447 and 448 in the left pair, acting as a second output point of the memory unit 446 for a second data output Out2 of the memory unit 446.

Referring to FIG. 1A, the first type of volatile storage unit 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second type of Volatile Storage Unit

Figure 1B:
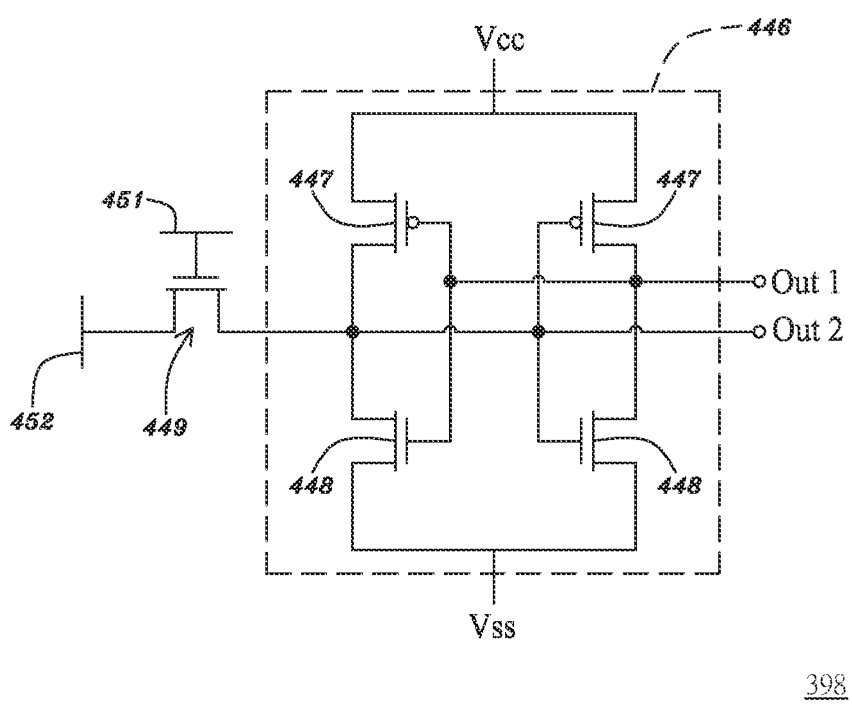

FIG. 1B is a circuit diagram illustrating a second type of volatile storage unit in accordance with an embodiment of the present application. Referring to FIG. 1B, a second type of volatile storage unit 398 may have the memory unit 446, i.e., static random-access memory (SRAM) cell, as illustrated in FIG. 1A. The second type of volatile storage unit 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Pass/No-Pass Switches (1) First Type of Pass/No-Pass Switch

Figure 2B:
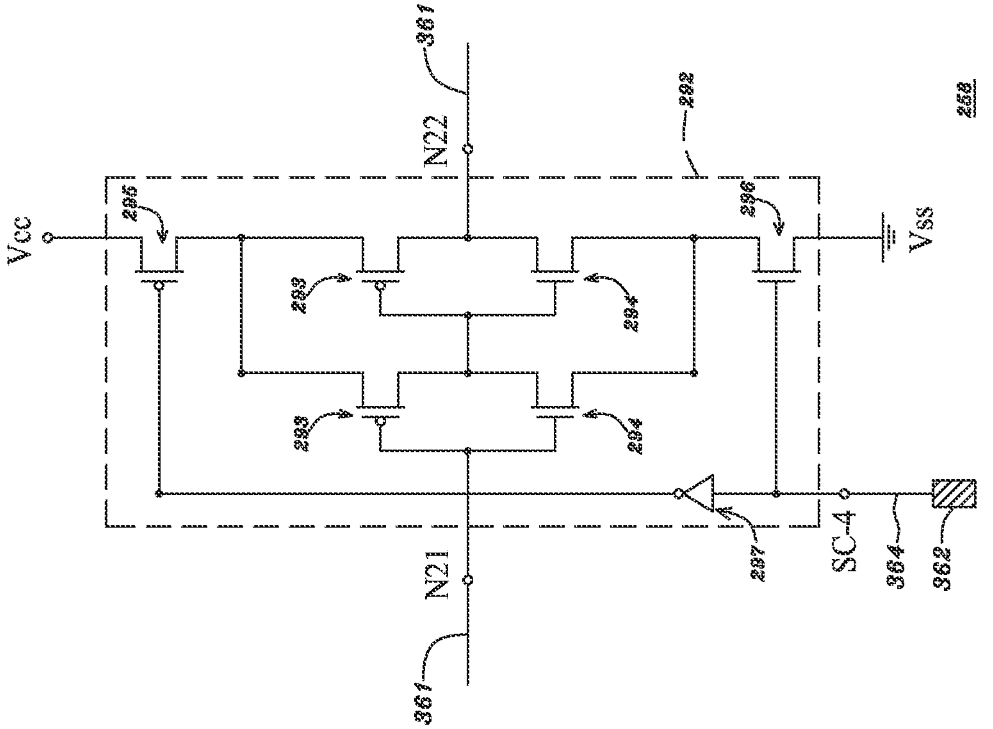
FIGS. 2A-2C are circuit diagrams illustrating first, second and third types of pass/no-pass switches in accordance with an embodiment of the present application.
Figure 2A:
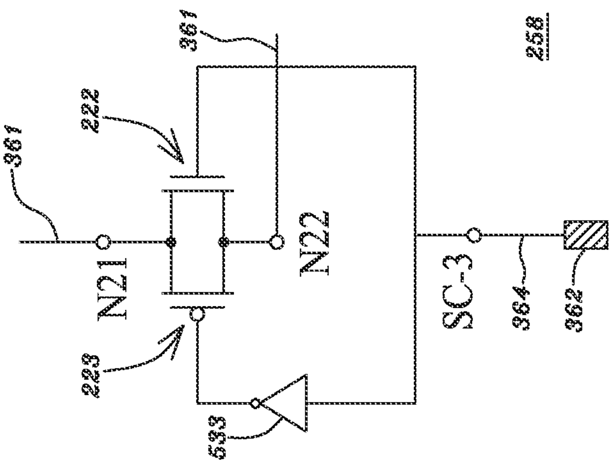

FIG. 2A is a circuit diagram illustrating a first type of pass/no-pass switch in accordance with an embodiment of the present application. Referring to FIG. 2A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the first type of pass/no-pass switch 258 may be configured to form a channel having an end at a node N21 of the pass/no-pass switch 258 and the other opposite end at a node N22 of the pass/no-pass switch 258. Thereby, the first type of pass/no-pass switch 258 may be set to turn on or off connection between its nodes N21 and N22. The first type of pass/no-pass switch 258 may further include an inverter 533 configured to invert its data input at its input point coupling to a gate terminal of the N-type MOS transistor 222 and a node SC-3 as its data output at its output point coupling to a gate terminal of the P-type MOS transistor 223.

(2) Second Type of Pass/No-Pass Switch

FIG. 2B is a circuit diagram illustrating a second type of pass/no-pass switch in accordance with an embodiment of the present application. Referring to FIG. 2B, a second type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. The P-type MOS and N-type MOS transistors 293 and 294 in the pair in the first stage may have gate terminals at a node N21 of the pass/no-pass switch 258. The drain terminals of the P-type MOS and N-type MOS transistors 293 and 294 in the pair in the first stage may couple to each other and to gate terminals of the P-type MOS and N-type MOS transistors 293 and 294 in the pair in the second stage, i.e., output stage. The P-type MOS and N-type MOS transistors 293 and 294 in the pair in the second stage, i.e., output stage, may have drain terminals couple to each other at a node N22 of the pass/no-pass switch 258.

Referring to FIG. 2B, the second type of pass/no-pass switch 258 may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert a data input SC-4 of the pass/no-pass switch 258 at an input point of the inverter 297 coupling to a gate terminal of the control N-type MOS transistor 296 as a data output of the inverter 297 at an output point of the inverter 297 coupling to a gate terminal of the control P-type MOS transistor 295.

For example, referring to FIG. 2B, when the pass/no-pass switch 258 has the data input SC-4 at a logic level of "1" to turn on the pass/no-pass switch 258, the pass/no-pass switch 258 may amplify its data input and pass its data input from its input point at the node N21 to its output point at its node N22 as its data output. When the pass/no-pass switch 258 has the data input SC-4 at a logic level of "0" to turn off the pass/no-pass switch 258, the pass/no-pass switch 258 may neither pass data from its node N21 to its node N22 nor pass data from its node N22 to its node N21.

(3) Third Type of Pass/No-Pass Switch

Figure 2C:
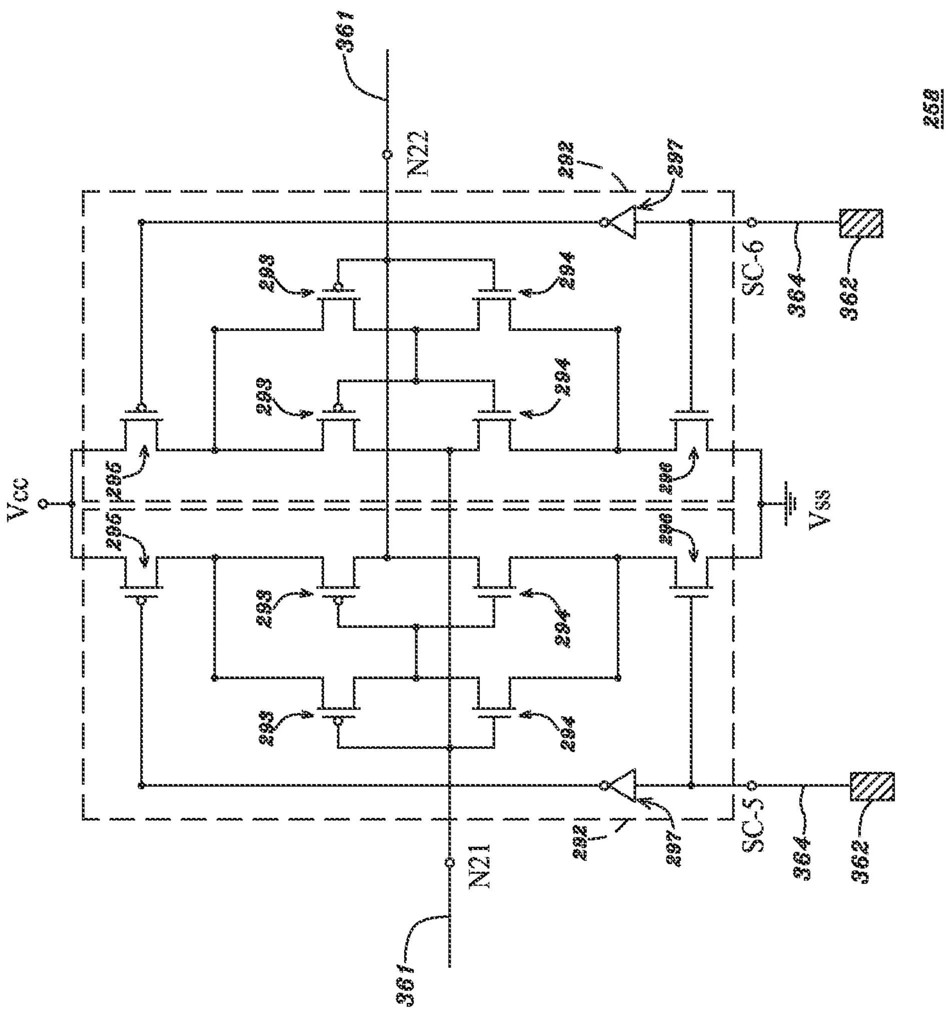

FIG. 2C is a circuit diagram illustrating a third type of pass/no-pass switch in accordance with an embodiment of the present application. For an element indicated by the same reference number shown in FIGS. 2B and 2C, the specification of the element as seen in FIG. 2C may be referred to that of the element as illustrated in FIG. 2B. Referring to FIG. 2C, a third type of pass/no-pass switch 258 may include a pair of multi-stage tri-state buffers 292, i.e., switch buffers, as illustrated in FIG. 2B. The P-type and N-type MOS transistors 293 and 294 in the first stage in the left one of the multi-stage tri-state buffers 292 in the pair may have their gate terminals at a node N21 of the pass/no-pass switch 258, which couples to the drain terminals of the P-type and N-type MOS transistors 293 and 294 in the second stage, i.e., output stage, in the right one of the multi-stage tri-state buffers 292 in the pair. The P-type and N-type MOS transistors 293 and 294 in the first stage in the right one of the multi-stage tri-state buffers 292 in the pair may have gate terminals at a node N22 of the pass/no-pass switch 258, which couples to the drain terminals of the P-type and N-type MOS transistors 293 and 294 in the second stage, i.e., output stage, in the left one of the multi-stage tri-state buffers 292 in the pair. For the left one of the multi-stage tri-state buffers 292 in the pair, its inverter 297 is configured to invert a data input SC-5 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295. For the right one of the multi-stage tri-state buffers 292 in the pair, its inverter 297 is configured to invert a data input SC-6 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295.

For example, referring to FIG. 2C, when the pass/no-pass switch 258 has the data input SC-5 at a logic level of "1" to turn on the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may amplify its data input and pass its data input from its input point at its node N21 to its output point at its node N22 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may amplify its data input and pass its data input from its input point at its node N22 to its output point at its node N21 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may neither pass data from its node N21 to its node N22 nor pass data from its node N22 to its node N21. When the pass/no-pass switch 258 has the data input SC-5 at a logic level of "1" to turn on the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may either amplify its data input and pass its data input from its input point at its node N21 to its output point at its node N22 as its data output or amplify its data input and pass its data input from its input point at its node N22 to its output point at its node N21 as its data output.

Figure 3A:
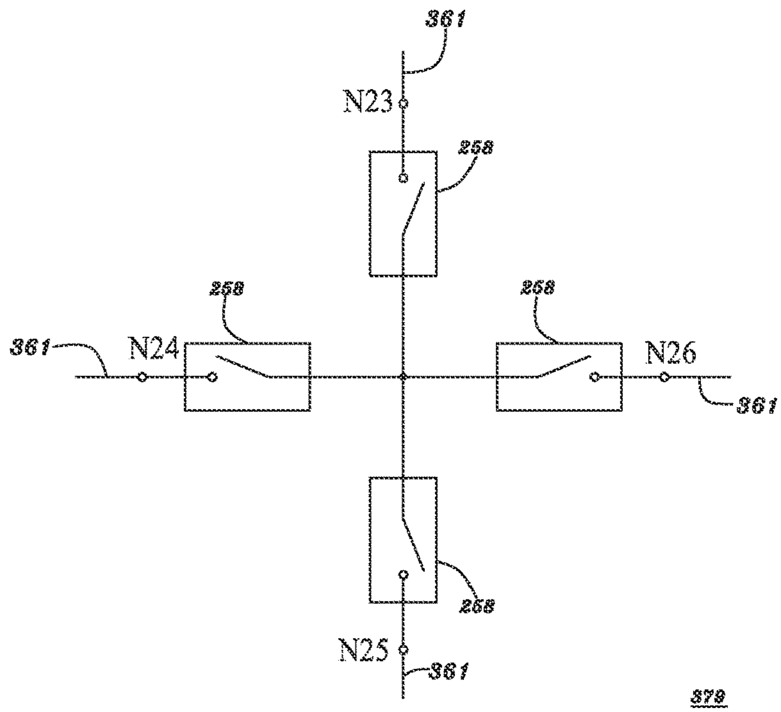
FIGS. 3A and 3B are circuit diagrams illustrating first and second types of cross-point switches composed of multiple pass/no-pass switches in accordance with an embodiment of the present application.

Specification for Cross-Point Switches Constructed from Pass/No-Pass Switches (1) First Type of Cross-Point Switch FIG. 3A is a circuit diagram illustrating a first type of cross-point switch composed of four pass/no-pass switches in accordance with an embodiment of the present application. Referring to FIG. 3A, four pass/no-pass switches 258, each of which may be one of the first and third types of pass/no-pass switches 258 as illustrated in FIGS. 2A and 2C respectively, may compose a first type of cross-point switch 379. The first type of cross-point switch 379 may have four terminals N23-N26 each configured to be switched to couple to another one of its four terminals N23-N26 via two of its four pass/no-pass switches 258. The first type of cross-point switch 379 may have a central node configured to couple to its four terminals N23-N26 via its four respective pass/no-pass switches 258. Each of the pass/no-pass switches 258 may have one of the nodes N21 and N22 coupling to one of the four terminals N23-N26 and the other one of the nodes N21 and N22 coupling to the central node of the first type of cross-point switch 379. For example, the first type of cross-point switch 379 may be switched to pass data from its terminal N23 to its terminal N24 via top and left ones of its four pass/no-pass switches 258, to its terminal N25 via top and bottom ones of its four pass/no-pass switches 258 and/or to its terminal N26 via top and right ones of its four pass/no-pass switches 258.

(2) Second Type of Cross-Point Switch

Figure 3B:
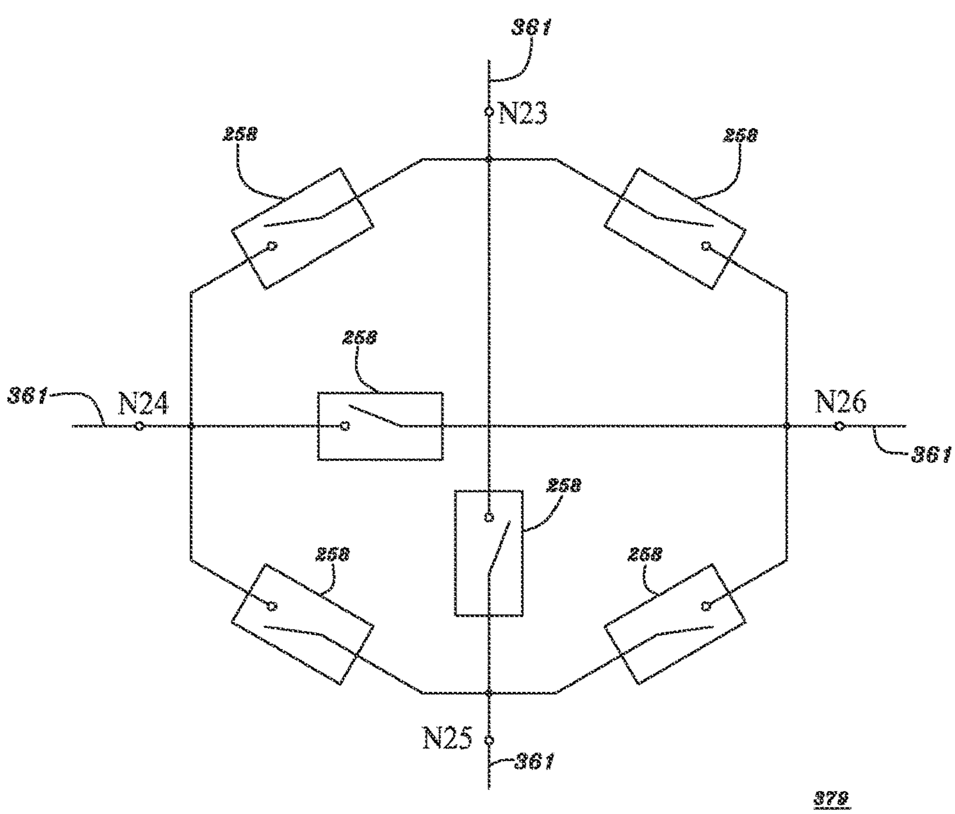

FIG. 3B is a circuit diagram illustrating a second type of cross-point switch composed of six pass/no-pass switches in accordance with an embodiment of the present application. Referring to FIG. 3B, six pass/no-pass switches 258, each of which may be one of the first and three types of pass/no-pass switches as illustrated in FIGS. 2A and 2C respectively, may compose a second type of cross-point switch 379. The second type of cross-point switch 379 may have four terminals N23-N26 each configured to be switched to couple to another one of its four terminals N23-N26 via one of its six pass/no-pass switches 258. Each of the pass/no-pass switches 258 may have one of the nodes N21 and N22 coupling to one of the four terminals N23-N26 and the other one of the nodes N21 and N22 coupling to another one of the four terminals N23-N26. For example, the second type of cross-point switch 379 may be switched to pass data from its terminal N23 to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

Specification for Multiplexer (MUXER)

Figure 4:
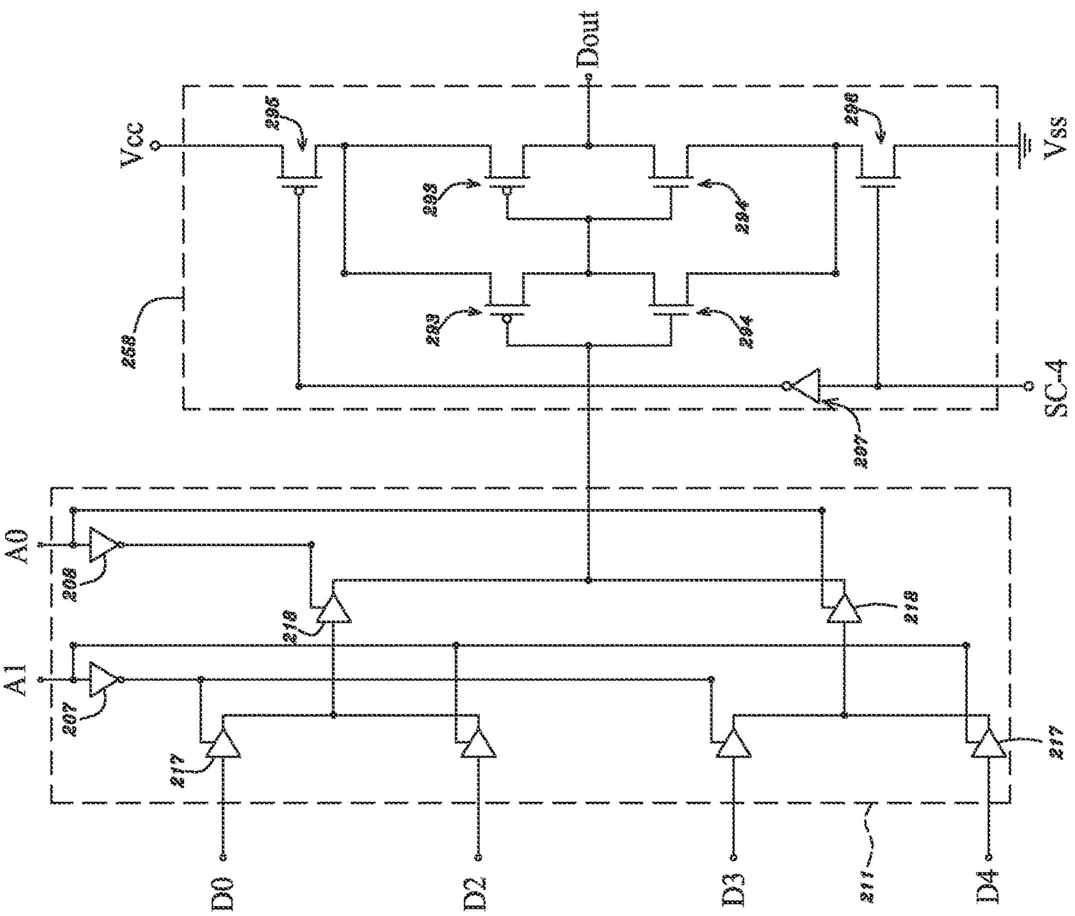
FIG. 4 is a circuit diagram illustrating a multiplexer in accordance with an embodiment of the present application.

FIG. 4 is a circuit diagram illustrating a multiplexer in accordance with an embodiment of the present application. Referring to FIG. 4, a multiplexer (MUXER) 211 may have a first set of two input points arranged in parallel for a first input data set, e.g., A0 and A1, and a second set of four input points arranged in parallel for a second input data set, e.g., D0, D1, D2 and D3. The multiplexer (MUXER) 211 may select a data input, e.g., D0, D1, D2 or D3, from its second input data set at a second set of its input points as a data output Dout at its output point based on its first input data set, e.g., A0 and A1, at a first set of its input points.

Referring to FIG. 4, the multiplexer 211 may include multiple stages of switch buffers, e.g., two stages of switch buffers 217 and 218, coupling to each other or one another stage by stage. For more elaboration, the multiplexer 211 may include four switch buffers 217 in two pairs in the first stage, i.e., input stage, arranged in parallel, each having a first input point for a first data input associated with data A1 of the first input data set of the multiplexer 211 and a second input point for a second data input associated with data, e.g., D0, D1, D2 or D3, of the second input data set of the multiplexer 211. Said each of the four switch buffers 217 in the first stage may be switched on or off to pass or not to pass its second data input from its second input point to its output point in accordance with its first data input at its first input point. The multiplexer 211 may include an inverter 207 having an input point for the data A1 of the first input data set of the multiplexer 211, wherein the inverter 207 is configured to invert the data A1 of the first input data set of the multiplexer 211 as a data output at an output point of the inverter 207. One of the two switch buffers 217 in each pair in the first stage may be switched on, in accordance with the first data input at its first input point coupling to one of the input and output points of the inverter 207, to pass the second data input from its second input point to its output point as a data output of said pair of switch buffers 217 in the first stage; the other one of the switch buffers 217 in said each pair in the first stage may be switched off, in accordance with the first data input at its first input point coupling to the other one of the input and output points of the inverter 207, not to pass the second data input from its second input point to its output point. The output points of the two switch buffers 217 in said each pair in the first stage may couple to each other. For example, a top one of the two switch buffers 217 in a top pair in the first stage may have its first input point coupling to the output point of the inverter 207 and its second input point for its second data input associated with data DO of the second input data set of the multiplexer 211; a bottom one of the two switch buffers 217 in the top pair in the first stage may have its first input point coupling to the input point of the inverter 207 and its second input point for its second data input associated with data D1 of the second input data set of the multiplexer 211. The top one of the two switch buffers 217 in the top pair in the first stage may be switched on in accordance with its first data input at its first input point to pass its second data input from its second input point to its output point as a data output of the top pair of switch buffers 217 in the first stage; the bottom one of the two switch buffers 217 in the top pair in the first stage may be switched off in accordance with its first data input at its first input point not to pass its second data input from its second input point to its output point. Thereby, each of the two pairs of switch buffers 217 in the first stage may be switched in accordance with its two first data inputs at its two first input points coupling to the input and output points of the inverter 207 respectively to pass one of its two second data inputs from one of its two second input points to its output point coupling to a second input point of one of the switch buffers 218 in the second stage, i.e., output stage, as a data output of said each of the two pairs of switch buffers 217 in the first stage.

Referring to FIG. 4, the multiplexer 211 may include a pair of two switch buffers 218 in the second stage, i.e., output stage, arranged in parallel, each having a first input point for a first data input associated with data A0 of the first input data set of the multiplexer 211 and a second input point for a second data input associated with the data output of one of the two pairs of switch buffers 217 in the first stage. Said each of the two switch buffers 218 in the pair in the second stage, i.e., output stage, may be switched on or off to pass or not to pass its second data input from its second input point to its output point in accordance with its first data input at its first input point. The multiplexer 211 may include an inverter 208 having an input point for the data A0 of the first input data set of the multiplexer 211, wherein the inverter 208 is configured to invert the data A0 of the first input data set of the multiplexer 211 as its data output at an output point of the inverter 208. One of the two switch buffers 218 in the pair in the second stage, i.e., output stage, may be switched on, in accordance with the first data input at its first input point coupling to one of the input and output points of the inverter 208, to pass the second data input from its second input point to its output point as a data output of said pair of switch buffers 218 in the second stage; the other one of the two switch buffers 218 in the pair in the second stage, i.e., output stage, may be switched off, in accordance with the first data input at its first input point coupling to the other one of the input and output points of the inverter 208, not to pass the second data input from its second input point to its output point. The output points of the two switch buffers 218 in the pair in the second stage, i.e., output stage, may couple to each other. For example, a top one of the two switch buffers 218 in the pair in the second stage, i.e., output stage, may have its first input point coupling to the output point of the inverter 208 and its second input point for its second data input associated with the data output of the top one of the two pairs of switch buffers 217 in the first stage; a bottom one of the two switch buffers 218 in the pair in the second stage, i.e., output stage, may have its first input point coupling to the input point of the inverter 208 and its second input point for its second data input associated with the data output of the bottom one of the two pairs of switch buffers 217 in the first stage. The top one of the two switch buffers 218 in the pair in the second stage, i.e., output stage, may be switched on in accordance with its first data input at its first input point to pass its second data input from its second input point to its output point as a data output of the pair of switch buffers 218 in the second stage; the bottom one of the two switch buffers 218 in the pair in the second stage, i.e., output stage, may be switched off in accordance with its first data input at its first input point not to pass its second data input from its second input point to its output point. Thereby, the pair of switch buffers 218 in the second stage, i.e., output stage, may be switched in accordance with its two first data inputs at its two first input points coupling to the input and output points of the inverter 207 respectively to pass one of its two second data inputs from one of its two second input points to its output point as a data output of the pair of switch buffers 218 in the second stage, i.e., output stage.

Referring to FIG. 4, the second type of pass/no-pass switch or switch buffer 292 as seen in FIG. 2B may be provided to couple to the output point of the pair of switch buffers 218 of the multiplexer 211. The pass/no-pass switch or switch buffer 292 may have the input point at its node N21 coupling to the output point of the pair of switch buffers 218 in the last stage, e.g., in the second stage or output stage in this case. For an element indicated by the same reference number shown in FIGS. 2B and 4, the specification of the element as seen in FIG. 4 may be referred to that of the element as illustrated in FIG. 2B. Accordingly, referring to FIG. 4, the multiplexer (MUXER) 211 may select a data input from its second input data set, e.g., D0, D1, D2 and D3, at its second set of four input points as its data output Dout at its output point based on its first input data set, e.g., A0 and A1, at its first set of two input points. The second type of pass/no-pass switch 292 may amplify its data input associated with the data output Dout of the pair of switch buffers 218 of the multiplexer 211 as its data output at its output point at its node N22.

Specification for Large I/O Circuits

Figure 5A:
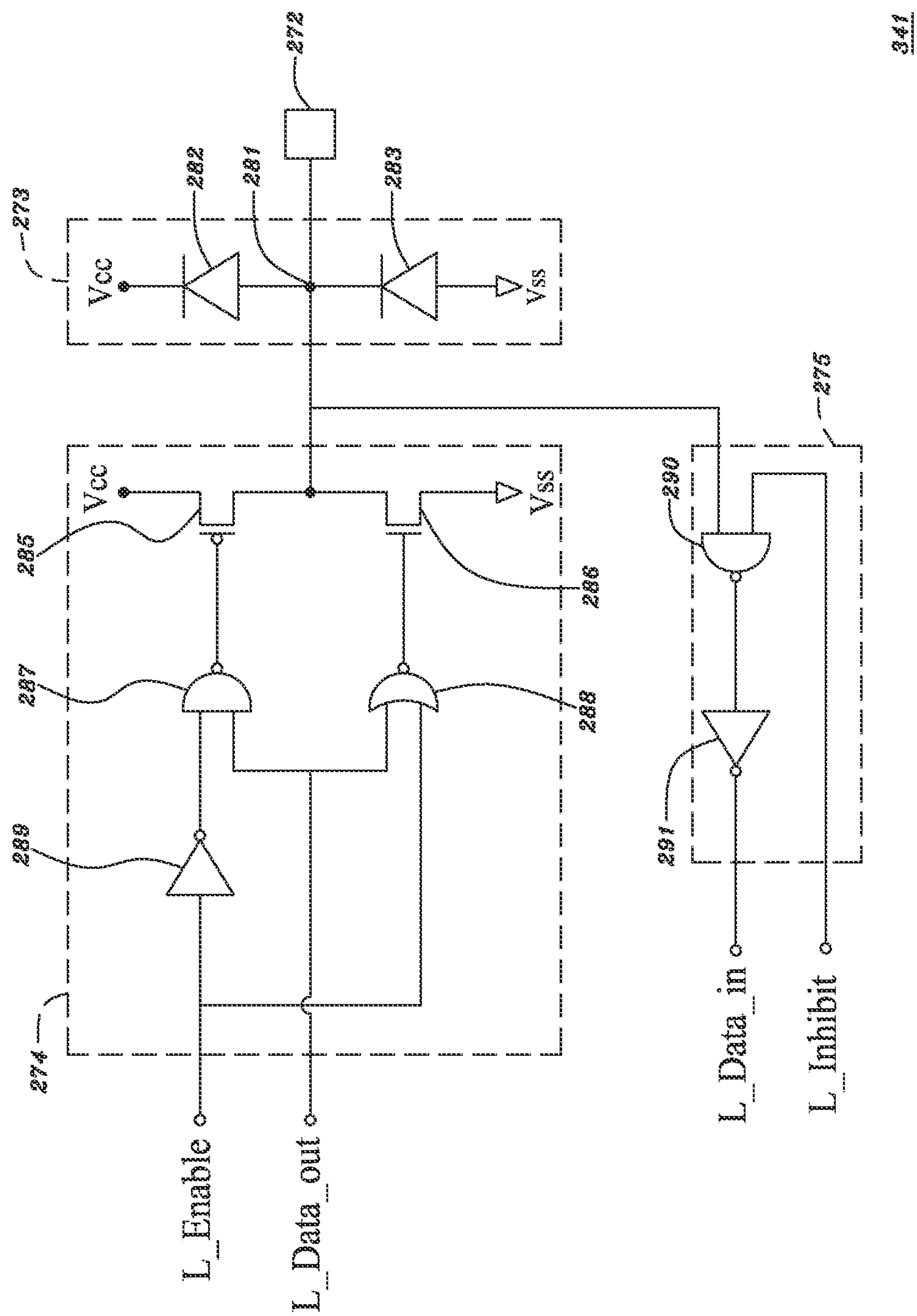
FIG. 5A is a circuit diagram of a large I/O circuit in accordance with an embodiment of the present application.

FIG. 5A is a circuit diagram of a large I/O circuit in accordance with an embodiment of the present application. Referring to FIG. 5A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 5A, the large driver 274 may have a first input point for a first data input L_Enable for enabling the large driver 274 and a second input point for a second data input L_Data_out, and may be configured to amplify or drive the second data input L_Data_out as its data output at its output point at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output point at the node 281 and respective source terminals coupling to the voltage Vcc of power supply and to the voltage Vss of ground reference. The large driver 274 may have a NAND gate 287 having a data output at an output point of the NAND gate 287 coupling to a gate terminal of the P-type MOS transistor 285 and a NOR gate 288 having a data output at an output point of the NOR gate 288 coupling to a gate terminal of the N-type MOS transistor 286. The NAND gate 287 may have a first data input at its first input point associated with a data output of its inverter 289 at an output point of an inverter 289 of the large driver 274 and a second data input at its second input point associated with the second data input L_Data_out of the large driver 274 to perform a NAND operation on its first and second data inputs as its data output at its output point coupling to the gate terminal of its P-type MOS transistor 285. The NOR gate 288 may have a first data input at its first input point associated with the second data input L_Data_out of the large driver 274 and a second data input at its second input point associated with the first data input L_Enable of the large driver 274 to perform a NOR operation on its first and second data inputs as its data output at its output point coupling to the gate terminal of the N-type MOS transistor 286. The inverter 289 may be configured to invert its data input at its input point associated with the first data input L_Enable of the large driver 274 as its data output at its output point coupling to the first input point of the NAND gate 287.

Referring to FIG. 5A, when the large driver 274 has the first data input L_Enable at a logic level of "1", the data output of the NAND gate 287 is always at a logic level of "1" to turn off the P-type MOS transistor 285 and the data output of the NOR gate 288 is always at a logic level of "0" to turn off the N-type MOS transistor 286. Thereby, the large driver 274 may be disabled by its first data input L_Enable and the large driver 274 may not pass the second data input L_Data_out from its second input point to its output point at the node 281.

Referring to FIG. 5A, the large driver 274 may be enabled when the large driver 274 has the first data input L_Enable at a logic level of "0". Meanwhile, if the large driver 274 has the second data input L_Data_out at a logic level of "0", the data outputs of the NAND and NOR gates 287 and 288 are at a logic level of "1" to turn off the P-type MOS transistor 285 and on the N-type MOS transistor 286, and thereby the data output of the large driver 274 at the node 281 is at a logic level of "0" to be passed to said one of the I/O pads 272. If the large driver 274 has the second data input L_Data_out is at a logic level of "1", the data outputs of the NAND and NOR gates 287 and 288 are at a logic level of "0" to turn on the P-type MOS transistor 285 and off the N-type MOS transistor 286, and thereby the data output of the large driver 274 at the node 281 is at a logic level of "1" to be passed to said one of the I/O pads 272. Accordingly, the large driver 274 may be enabled by its first data input L_Enable to amplify or drive its second data input L_Data_out at its second input point as its data output at its output point at the node 281 to be transmitted to circuits outside the semiconductor chip through said one of the I/O pads 272.

Referring to FIG. 5A, the large receiver 275 may have a first data input L_Inhibit at its first input point and a second data input at its second input point coupling to said one of the I/O pads 272 to be amplified or driven by the large receiver 275 as its data output L_Data_in. The large receiver 275 may be inhibited by its first data input L_Inhibit from generating its data output L_Data_in associated with its second data input. The large receiver 275 may include a NAND gate 290 and an inverter 291 having a data input at an input point of the inverter 291 associated with a data output of the NAND gate 290. The NAND gate 290 has a first input point for its first data input associated with the second data input of the large receiver 275 and a second input point for its second data input associated with the first data input L_Inhibit of the large receiver 275 to perform a NAND operation on its first and second data inputs as its data output at its output point coupling to the input point of its inverter 291. The inverter 291 may be configured to invert its data input associated with the data output of the NAND gate 290 as its data output at its output point acting as the data output L_Data_in of the large receiver 275 at an output point of the large receiver 275.

Referring to FIG. 5A, when the large receiver 275 has the first data input L_Inhibit at a logic level of "0", the data output of the NAND gate 290 is always at a logic level of "1" and the data output L_Data_in of the large receiver 275 is always at a logic level of "0". Thereby, the large receiver 275 is inhibited from generating its data output L_Data_in associated with its second data input at the node 281.

Referring to FIG. 5A, the large receiver 275 may be activated when the large receiver 275 has the first data input L_Inhibit at a logic level of "1". Meanwhile, if the large receiver 275 has the second data input at a logic level of "1" from circuits outside the semiconductor chip through said one of the I/O pads 272, the NAND gate 290 has its data output at a logic level of "0", and thereby the large receiver 275 may have its data output L_Data_in at a logic level of "1". If the large receiver 275 has the second data input at a logic level of "0" from circuits outside the semiconductor chip through said one of the I/O pads 272, the NAND gate 290 has its data output at a logic level of "1", and thereby the large receiver 275 may have its data output L_Data_in at a logic level of "0". Accordingly, the large receiver 275 may be activated by its first data input L_Inhibit signal to amplify or drive its second data input from circuits outside the semiconductor chip through said one of the I/O pads 272 as its data output L_Data_in.

Referring to FIG. 5A, the large I/O circuit 274 may have output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 3 pF, 5 pF, 10 pF, 15 pF or 20 pF, provided by its large driver 274. Further, the large I/O circuit 274 may have input capacitance, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 3 pF, 5 pF, 10 pF, 15 pF or 20 pF, provided by its large receiver 275 and/or its large ESD protection circuit 273. The size of the large ESD protection circuit or device 273 may be between 0.5 pF and 20 pF, between 0.5 pF and 15 pF, between 0.5 pF and 10 pF, between 0.5 pF and 5 pF or between 0.5 pF and 2 pF, or larger than 0.5 pF, 1 pF, 2 pF, 3 pF, 5 pF or 10 pF.

Specification for Small I/O Circuits

Figure 5B:
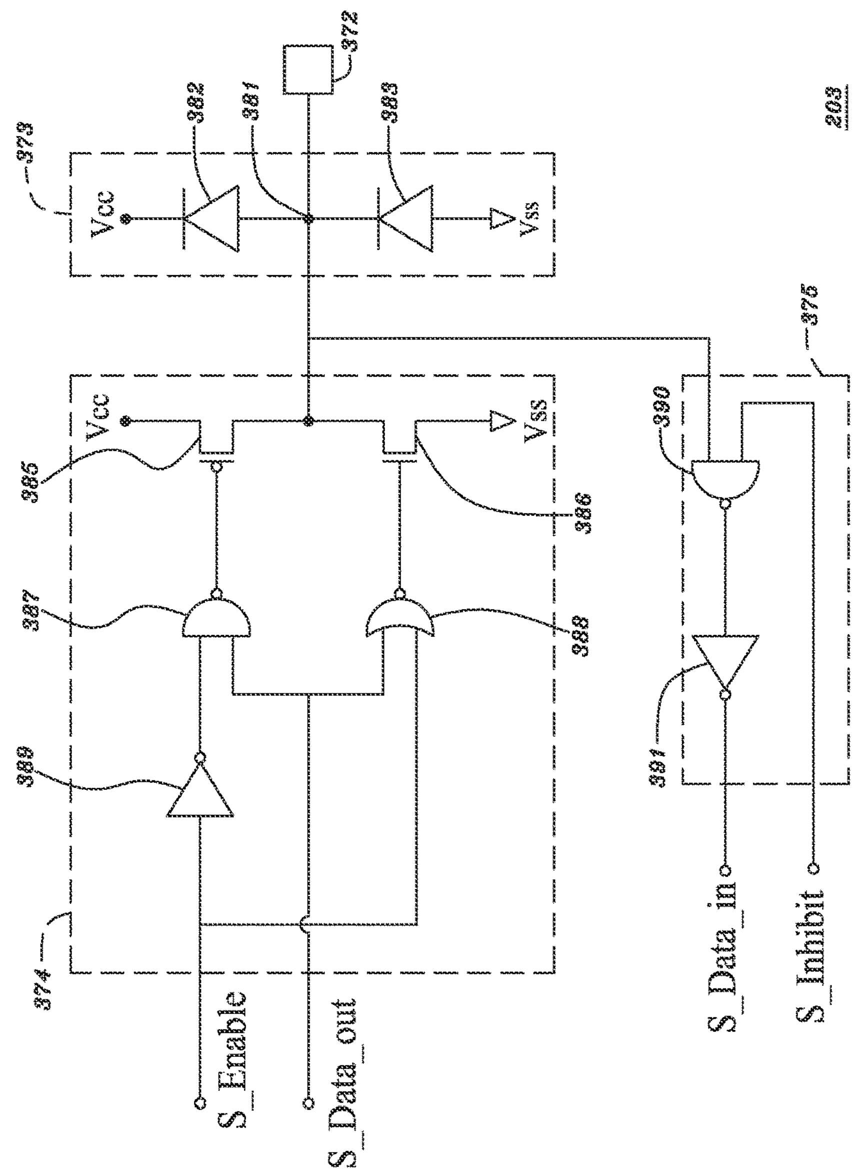
FIG. 5B is a circuit diagram of a small I/O circuit in accordance with an embodiment of the present application.

FIG. 5B is a circuit diagram of a small I/O circuit in accordance with an embodiment of the present application. Referring to FIG. 5B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 5B, the small driver 374 may have a first input point for a first data input S_Enable for enabling the small driver 374 and a second input point for a second data input S_Data_out, and may be configured to amplify or drive the second data input S_Data_out as its data output at its output point at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output point at the node 381 and respective source terminals coupling to the voltage Vcc of power supply and to the voltage Vss of ground reference. The small driver 374 may have a NAND gate 387 having a data output at an output point of the NAND gate 387 coupling to a gate terminal of the P-type MOS transistor 385 and a NOR gate 388 having a data output at an output point of the NOR gate 388 coupling to a gate terminal of the N-type MOS transistor 386. The NAND gate 387 may have a first data input at its first input point associated with a data output of its inverter 389 at an output point of an inverter 389 of the small driver 374 and a second data input at its second input point associated with the second data input S_Data_out of the small driver 374 to perform a NAND operation on its first and second data inputs as its data output at its output point coupling to the gate terminal of its P-type MOS transistor 385. The NOR gate 388 may have a first data input at its first input point associated with the second data input S_Data_out of the small driver 374 and a second data input at its second input point associated with the first data input S_Enable of the small driver 374 to perform a NOR operation on its first and second data inputs as its data output at its output point coupling to the gate terminal of the N-type MOS transistor 386. The inverter 389 may be configured to invert its data input at its input point associated with the first data input S_Enable of the small driver 374 as its data output at its output point coupling to the first input point of the NAND gate 387.

Referring to FIG. 5B, when the small driver 374 has the first data input S_Enable at a logic level of "1", the data output of the NAND gate 387 is always at a logic level of "1" to turn off the P-type MOS transistor 385 and the data output of the NOR gate 388 is always at a logic level of "0" to turn off the N-type MOS transistor 386. Thereby, the small driver 374 may be disabled by its first data input S_Enable and the small driver 374 may not pass the second data input S_Data_out from its second input point to its output point at the node 381.

Referring to FIG. 5B, the small driver 374 may be enabled when the small driver 374 has the first data input S_Enable at a logic level of "0". Meanwhile, if the small driver 374 has the second data input S_Data_out at a logic level of "0", the data outputs of the NAND and NOR gates 387 and 388 are at a logic level of "1" to turn off the P-type MOS transistor 385 and on the N-type MOS transistor 386, and thereby the data output of the small driver 374 at the node 381 is at a logic level of "0" to be passed to said one of the I/O pads 372. If the small driver 374 has the second data input S_Data_out at a logic level of "1", the data outputs of the NAND and NOR gates 387 and 388 are at a logic level of "0" to turn on the P-type MOS transistor 385 and off the N-type MOS transistor 386, and thereby the data output of the small driver 374 at the node 381 is at a logic level of "1" to be passed to said one of the I/O pads 372. Accordingly, the small driver 374 may be enabled by its first data input S_Enable to amplify or drive its second data input S_Data_out at its second input point as its data output at its output point at the node 381 to be transmitted to circuits outside the semiconductor chip through said one of the I/O pads 372.

Referring to FIG. 5B, the small receiver 375 may have a first data input S_Inhibit at its first input point and a second data input at its second input point coupling to said one of the I/O pads 372 to be amplified or driven by the small receiver 375 as its data output S_Data_in. The small receiver 375 may be inhibited by its first data input S_Inhibit from generating its data output S_Data_in associated with its second data input. The small receiver 375 may include a NAND gate 390 and an inverter 391 having a data input at an input point of the inverter 391 associated with a data output of the NAND gate 390. The NAND gate 390 has a first input point for its first data input associated with the second data input of the large receiver 275 and a second input point for its second data input associated with the first data input S_Inhibit of the small receiver 375 to perform a NAND operation on its first and second data inputs as its data output at its output point coupling to the input point of its inverter 391. The inverter 391 may be configured to invert its data input associated with the data output of the NAND gate 390 as its data output at its output point acting as the data output S_Data_in of the small receiver 375 at an output point of the small receiver 375.

Referring to FIG. 5B, when the small receiver 375 has the first data input S_Inhibit at a logic level of "0", the data output of the NAND gate 390 is always at a logic level of "1" and the data output S_Data_in of the small receiver 375 is always at a logic level of "0". Thereby, the small receiver 375 is inhibited from generating its data output S_Data_in associated with its second data input at the node 381.

Referring to FIG. 5B, the small receiver 375 may be activated when the small receiver 375 has the first data input S_Inhibit at a logic level of "1". Meanwhile, if the small receiver 375 has the second data input at a logic level of "1" from circuits outside the semiconductor chip through said one of the I/O pads 372, the NAND gate 390 has its data output at a logic level of "0", and thereby the small receiver 375 may have its data output S_Data_in at a logic level of "1". If the small receiver 375 has the second data input at a logic level of "0" from circuits outside the semiconductor chip through said one of the I/O pads 372, the NAND gate 390 has its data output at a logic level of "1", and thereby the small receiver 375 may have its data output S_Data_in at a logic level of "0". Accordingly, the small receiver 375 may be activated by its first data input S_Inhibit to amplify or drive its second data input from circuits outside the semiconductor chip through said one of the I/O pads 372 as its data output S_Data_in.

Referring to FIG. 5B, the small I/O circuit 203 may have output capacitance or driving capability or loading, for example, between 0.05 pF and 2 pF or between 0.1 pF and 1 pF, or smaller than 2 pF or 1 pF, provided by its small driver 374. Further, the small I/O circuit 203 may have input capacitance, for example, between 0.05 pF and 2 pF or between 0.1 pF and 1 pF, or smaller than 2 pF or 1 pF, provided by its small receiver 375 and/or its small ESD protection circuit 373.

Specification for Programmable Logic Blocks

Figure 6A:
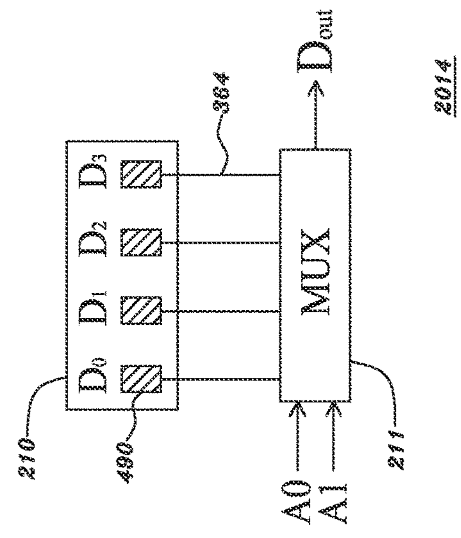
FIG. 6A is a schematic view showing a block diagram of a programmable logic cell in accordance with an embodiment of the present application.

FIG. 6A is a schematic view showing a block diagram of a programmable logic cell in accordance with an embodiment of the present application. Referring to FIG. 6A, a programmable logic block (LB) or element may include one or a plurality of programmable logic cells (LC) 1014 each configured to perform logic operation on its input data set at its input points. Each of the programmable logic cells (LC) 1014 may include multiple memory cells, i.e., configuration-programming-memory (CPM) cells, each configured to save or store one of resulting values or data of a look-up table (LUT) 210 and a multiplexer (MUXER) 211 having a first set of two input points arranged in parallel for a first input data set, e.g., A0 and A1 as illustrated in FIG. 4, and a second set of four input points arranged in parallel for a second input data set, e.g., D0, D1, D2 and D3 as illustrated in FIG. 4, each associated with one of the resulting values or data or programming codes for the look-up table (LUT) 210. The multiplexer (MUXER) 211 is configured to select, in accordance with its first input data set associated with the input data set of said each of the programmable logic cells (LC) 1014, a data input, e.g., D0, D1, D2 or D3 as illustrated in FIG. 4, from its second input data set as a data output Dout at its output point acting as a data output of said each of the programmable logic cells (LC) 1014 at an output point of said each of the programmable logic cells (LC) 1014.

Referring to FIG. 6A, each of the memory cells 490, i.e., configuration-programming-memory (CPM) cells, may be referred to the memory cell 446 as illustrated in FIG. 1A or 1B. The multiplexer (MUXER) 211 may have its second input data set, e.g., D0, D1, D2 and D3 as illustrated in FIG. 4, each associated with a data output, i.e., configuration-programming-memory (CPM) data, of one of the memory cells 490, e.g., one of the first and second data outputs Out1 and Out2 of the memory cell 446 as illustrated in FIG. 1A or 1B via non-programmable interconnects 364 configured not to be programmable for interconnection. Alternatively, each of the programmable logic cells (LC) 2014 may further include the second type of pass/no-pass switch or switch buffer 292 as seen in FIGS. 2B and 4 having the input point coupling to the output point of its multiplexer (MUXER) 211 to amplify the data output Dout of its multiplexer 211 as a data output of said each of the programmable logic cells (LC) 1014 at an output point of said each of the programmable logic cells (LC) 1014, wherein its second type of pass/no-pass switch or switch buffer 292 may have the data input SC-4 associated with a data output, i.e., configuration-programming-memory (CPM) data, of another of the memory cells 490, e.g., one of the first and second data outputs Out1 and Out2 of the memory cell 446 as illustrated in FIG. 1A or 1B.

Referring to FIG. 6A, each of the programmable logic cells (LC) 2014 may have the memory cells 490, i.e., configuration-programming-memory (CPM) cells, configured to be programed to store or save the resulting values or programing codes for the look-up table (LUT) 210 to perform the logic operation, such as AND operation, NAND operation, OR operation, NOR operation, EXOR operation or other Boolean operation, or an operation combining two or more of the above operations. For this case, each of the programmable logic cells (LC) 2014 may perform the logic operation on its input data set, e.g., A0 and A1, at its input points as a data output Dout at its output point. For more elaboration, each of the programmable logic cells (LC) 1014 may include the number $2^n$ of memory cells 490, i.e., configuration-programming-memory (CPM) cells, each configured to save or store one of resulting values of the look-up table (LUT) 210 and a multiplexer (MUXER) 211 having a first set of the number n of input points arranged in parallel for a first input data set, e.g., A0-A1, and a second set of the number $2^n$ of input points arranged in parallel for a second input data set, e.g., D0-D3, each associated with one of the resulting values or programming codes for the look-up table (LUT) 210, wherein the number n may range from 2 to 8, such as 2 for this case. The multiplexer (MUXER) 211 is configured to select, in accordance with its first input data set associated with the input data set of said each of the programmable logic cells (LC) 1014, a data input, e.g., one of D0-D3, from its second input data set as a data output Dout at its output point acting as a data output of said each of the programmable logic cells (LC) 1014 at an output point of said each of the programmable logic cells (LC) 1014.

Figure 6B:
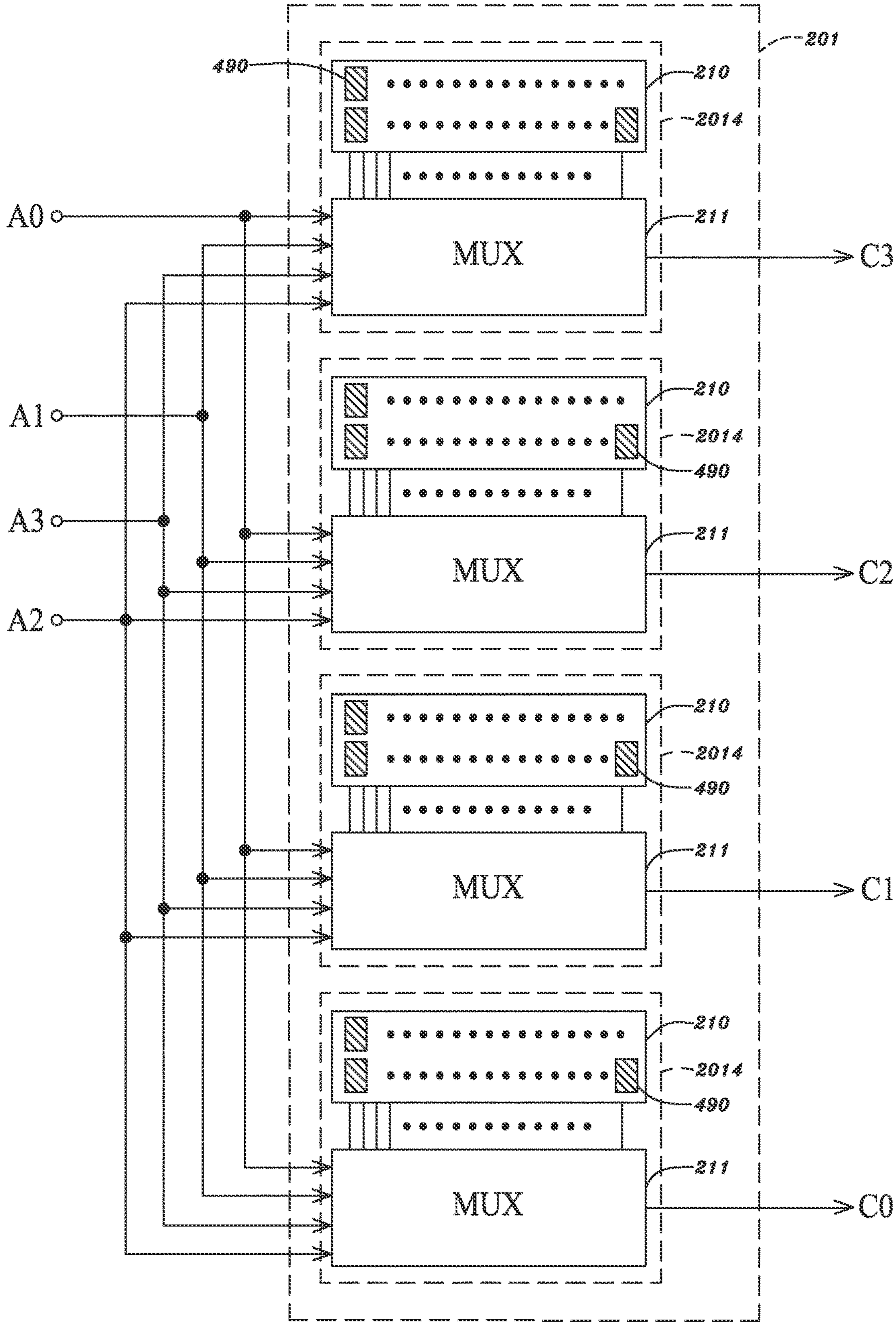
FIG. 6B is a block diagram illustrating a computation operator in accordance with an embodiment of the present application.
Figures 6C, 6D:
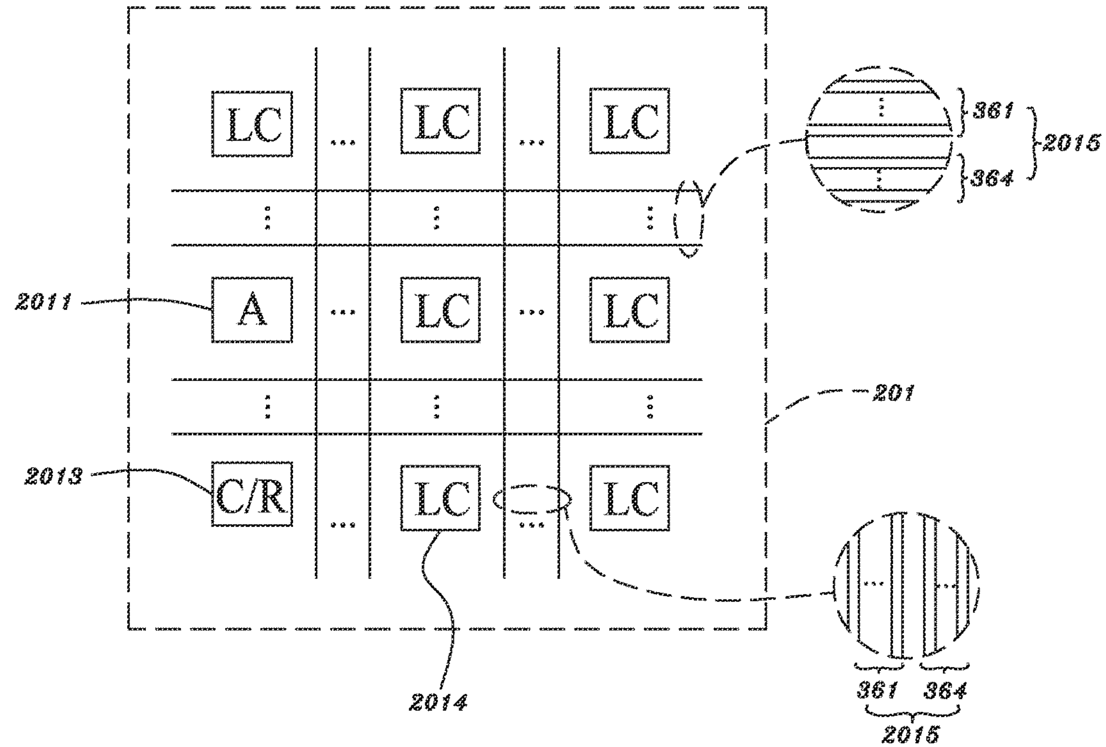
FIG. 6C shows a truth table for a logic operator as seen in FIG. 6B.
FIG. 6D is a block diagram illustrating a programmable logic block for a standard commodity FPGA IC chip in accordance with an embodiment of the present application.

Alternatively, a plurality of programmable logic cells (LC) 2014 as illustrated in FIG. 6A are configured to be programed to be integrated into a programmable logic block (LB) or element 201 as seen in FIG. 6B acting as a computation operator to perform computation operation, such as addition, subtraction, multiplication or division operation. The computation operator may be an adder, a multiplier, a multiplexer, a shift register, floating-point circuits and/or division circuits. FIG. 6B is a block diagram illustrating a computation operator in accordance with an embodiment of the present application. For example, the computation operator as seen in FIG. 6B may be configured to multiply two two-binary-digit data inputs, i.e., [A1, A0] and [A3, A2], into a four-binary-digit output data set, i.e., [C3, C2, C1, C0], as seen in FIG. 1C. FIG. 6C shows a truth table for a logic operator as seen in FIG. 6B.

Referring to FIGS. 6B and 6C, four programmable logic cells (LC) 2014, each of which may be referred to one as illustrated in FIG. 6A, may be programed to be integrated into the computation operator. Each of the four programmable logic cells (LC) 2014 may have its input data set at its four input points associated with an input data set [A1, A0, A3, A2] of the computation operator respectively. Each of the programmable logic cells (LC) 2014 of the computation operator may generate a data output, e.g., C0, C1, C2 or C3, of the four-binary-digit data output of the computation operator based on its input data set [A1, A0, A3, A2]. In the multiplication of the two-binary-digit number, i.e., [A1, A0], by the two-binary-digit number, i.e., [A3, A2], the programmable logic block (LB) 201 may generate its four-binary-digit output data set, i.e., [C3, C2, C1, C0], based on its input data set [A1, A0, A3, A2]. Each of the four programmable logic cells (LC) 2014 may have the memory cells 490, each of which may be referred to the memory cell 446 as illustrated in FIG. 1A or 1B, to be programed to save or store resulting values or programming codes of its look-up table 210, e.g., Table-0, Table-1, Table-2 or Table-3.

For example, referring to FIGS. 6B and 6C, a first one of the four programmable logic cells (LC) 2014 may have its memory cells 490, i.e., configuration-programming-memory (CPM) cells, configured to save or store the resulting values or programming codes of its look-up table (LUT) 210 of Table-0 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-0, as its data output C0 acting as a binary-digit data output of the four-binary-digit output data set, i.e., [C3, C2, C1, C0], of the programmable logic block (LB) 201. A second one of the four programmable logic cells (LC) 2014 may have its memory cells 490, i.e., configuration-programming-memory (CPM) cells, configured to save or store the resulting values or programming codes of its look-up table (LUT) 210 of Table-1 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-1, as its data output C1 acting as a binary-digit data output of the four-binary-digit output data set, i.e., [C3, C2, C1, C0], of the programmable logic block (LB) 201. A third one of the four programmable logic cells (LC) 2014 may have its memory cells 490, i.e., configuration-programming-memory (CPM) cells, configured to save or store the resulting values or programming codes of its look-up table (LUT) 210 of Table-2 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-2, as its data output C2 acting as a binary-digit data output of the four-binary-digit output data set, i.e., [C3, C2, C1, C0], of the programmable logic block (LB) 201. A fourth one of the four programmable logic cells (LC) 2014 may have its memory cells 490, i.e., configuration-programming-memory (CPM) cells, configured to save or store the resulting values or programming codes of its look-up table (LUT) 210 of Table-3 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-3, as its data output C3 acting as a binary-digit data output of the four-binary-digit output data set, i.e., [C3, C2, C1, C0], of the programmable logic block (LB) 201.

Thereby, referring to FIGS. 6B and 6C, the programmable logic block (LB) 201 acting as the computation operator may be composed of the four programmable logic cells (LC) 2014 to generate its four-binary-digit output data set, i.e., [C3, C2, C1, C0], based on its input data set [A1, A0, A3, A2].

Referring to FIGS. 6B and 6C, in a particular case for multiplication of 3 by 3, each of the four programmable logic cells (LC) 2014 may have its multiplexer (MUXER) 211 configured to select, in accordance with the first input data set of its multiplexer (MUXER) 211 associated with the input data set, i.e., [A1, A0, A3, A2]=[1, 1, 1, 1], of the computation operator respectively, a data input from the second input data set D0-D15 of its multiplexer (MUXER) 211, each associated with one of the resulting values or programming codes of its look-up table (LUT) 210, i.e., one of Table-0, Table-1, Table-2 and Table-3, as its data output, i.e., one of C0, C1, C2 and C3, acting as a binary-digit data output of the four-binary-digit output data set, i.e., [C3, C2, C1, C0]=[1, 0, 0, 1], of the programmable logic block (LB) 201. The first one of the four programmable logic cells (LC) 2014 may generate its data output C0 at a logic level of "1" based on its input data set, i.e., [A1, A0, A3, A2]=[1, 1, 1, 1]; the second one of the four programmable logic cells (LC) 2014 may generate its data output C1 at a logic level of "0" based on its input data set, i.e., [A1, A0, A3, A2]=[1, 1, 1, 1]; the third one of the four programmable logic cells (LC) 2014 may generate its data output C2 at a logic level of "0" based on its input data set, i.e., [A1, A0, A3, A2]=[1, 1, 1, 1]; the fourth one of the four programmable logic cells (LC) 2014 may generate its data output C3 at a logic level of "1" based on its input data set, i.e., [A1, A0, A3, A2]=[1, 1, 1, 1].

Alternatively, FIG. 6D is a block diagram illustrating a programmable logic block for a standard commodity FPGA IC chip in accordance with an embodiment of the present application. Referring to FIG. 6D, the programmable logic block (LB) 201 may include (1) one or more cells (A) 2011 for fixed-wired adders, having the number ranging from 1 to 16 for example, (2) one or more cells (C/R) 2013 for caches and registers, each having capacity ranging from 256 to 2048 bits for example, and (3) the programmable logic cells (LC) 2014 as illustrated in FIGS. 6A-6C having the number ranging from 64 to 2048 for example. The programmable logic block (LB) 201 may further include multiple intra-block interconnects 2015 each extending over spaces between neighboring two of its cells 2011, 2013 and 2014 arranged in an array therein. For the programmable logic block (LB) 201, its intra-block interconnects 2015 may be divided into programmable interconnects 361 configured to be programmed for interconnection by its memory cells 362 as seen in FIGS. 3A, 3B and 7 and non-programmable interconnects 364 as seen in FIGS. 6A and 7 configured not to be programmable for interconnection.

Referring to FIG. 6D, each of the programmable logic cells (LC) 2014 may have the memory cells 490, i.e., configuration-programming-memory (CPM) cells, having the number ranging from 4 to 256 for example, each configured to save or store one of the resulting values or programming codes of its look-up table 210 and the multiplexer (MUXER) 211 configured to select, in accordance with the first input data set of its multiplexer (MUXER) 211 having a bit-width ranging from 2 to 8 for example at its input points coupling to at least one of the programmable interconnects 361 and non-programmable interconnects 364 of the intra-block interconnects 2015, a data input from the second input data set of its multiplexer (MUXER) 211 having a bit-width ranging from 4 to 256 for example as its data output at its output point coupling to at least one of the programmable interconnects 361 and non-programmable interconnects 364 of the intra-block interconnects 2015.

Specification for Programmable Interconnect

Figure 7:
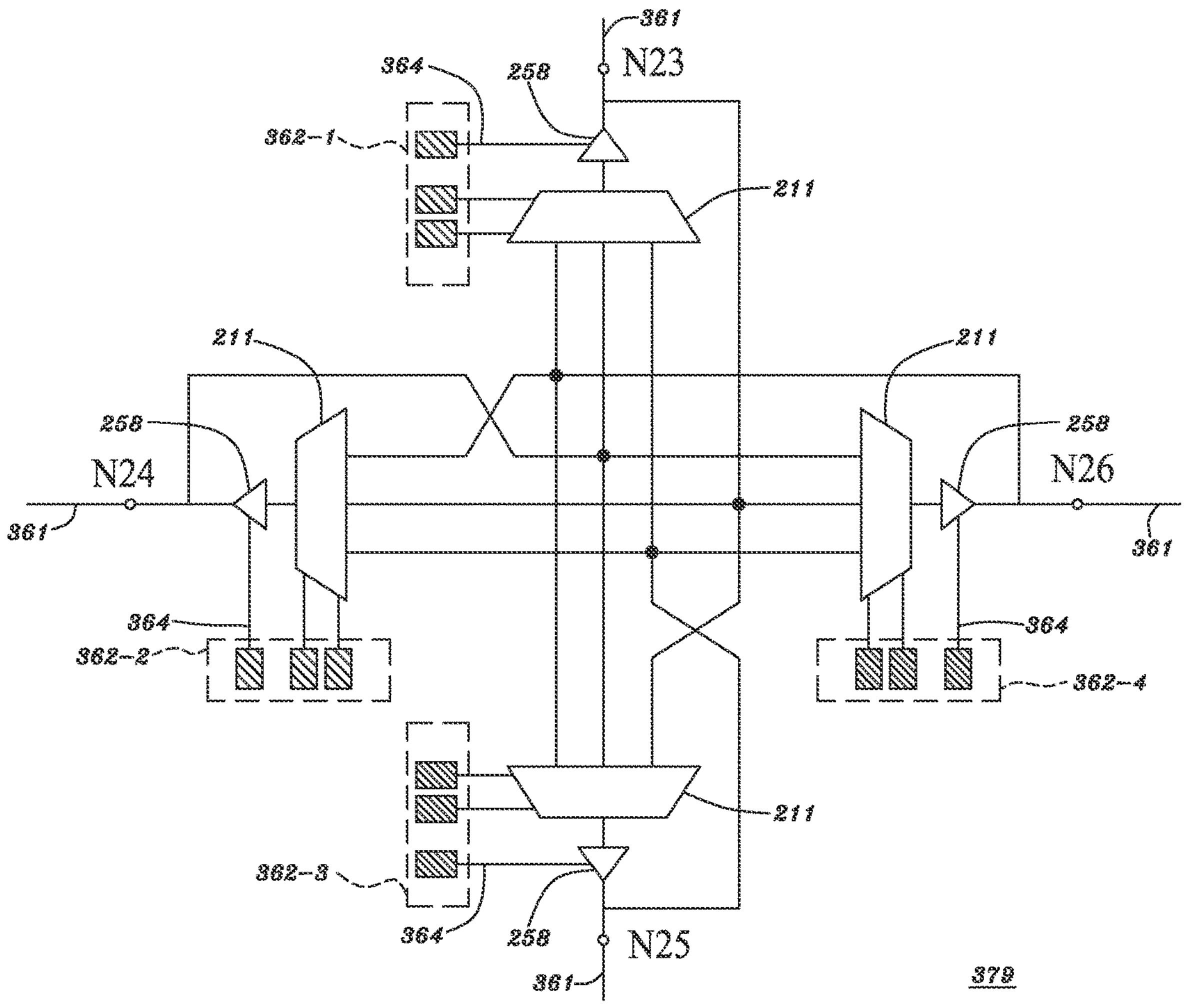
FIG. 7 is a circuit diagram illustrating programmable interconnects programmed by a third type of cross-point switch in accordance with an embodiment of the present application.

FIG. 7 is a circuit diagram illustrating programmable interconnects programmed by a third type of cross-point switch in accordance with an embodiment of the present application. Besides the first and second types of cross-point switches 379 as illustrated in FIGS. 3A and 3B, a third type of cross-point switch 379 may presented as seen in FIG. 7 to include the four multiplexers (MUXERs) 211 as seen in FIG. 4. Each of the four multiplexers (MUXERs) 211 may be configured to select, in accordance with its first input data set, e.g., A0 and A1, at its first set of input points, a data input from its second input data set, e.g., D0-D2, at its second set of input points as its data output. Each of the second set of three input points of one of the four multiplexers (MUXERs) 211 may couple to one of the second set of three input points of one of another two of the four multiplexers (MUXERs) 211 and to the output point of the other of the four multiplexers (MUXERs) 211. Thereby, each of the four multiplexers (MUXERs) 211 may select, in accordance with its first input data set, e.g., A0 and A1, a data input from its second input data set, e.g., D0-D2, at its second set of three input points coupling to three respective programmable interconnects 361 extending in three different directions and to the output points of the other respective three of the four multiplexers (MUXERs) 211 as its data output, e.g., Dout, at its output point at one of four nodes N23-N26 of the third type of cross-point switch 379 coupling to the other programmable interconnect 361 extending in a direction other than the three different directions. For example, the top one of the four multiplexers (MUXERs) 211 may select, in accordance with its first input data set, e.g., A0 and A1, a data input from its second input data set, e.g., D0-D2, at its second set of three input points at the nodes N24, N25 and N26 of the third type of cross-point switch 379 respectively, i.e., at the output points of the left, bottom and right ones of the four multiplexers 211 respectively, as its data output, e.g., Dout, at its output point at the node N23 of the third type of cross-point switch 379.

Referring to FIG. 7, the four programmable interconnects 361 may couple to the respective four nodes N23-N26 of the third type of cross-point switch 379. Thereby, data from one of the four programmable interconnects 361 may be switched by the third type of cross-point switch 379 to be passed to another one, two or three of the four programmable interconnects 361. For the third type of cross-point switch 379, each of its four multiplexers (MUXERs) 211, which may be referred to that as seen in FIG. 4, may have the data inputs, e.g., A0 and A1, of the first input data set each associated with a data output of one of its memory cells 362, i.e., configuration-programming-memory (CPM) cell, e.g., one of the first and second data outputs Out1 and Out2 of the memory cell 446 as illustrated in FIG. 1A or 1B.

Alternatively, referring to FIG. 7, the third type of cross-point switch 379 may further include four pass/no-pass switches or switch buffers 258 of the second type each having the input point coupling to the output point of one of the four multiplexers (MUXERs) 211 as seen in FIG. 4. For the third type of cross-point switch 379, each of its four pass/no-pass switch or switch buffer 258 is configured to be switched on or off in accordance with the data input SC-4 of said each of its four pass/no-pass switch or switch buffer 258 to pass or not to pass the data output, e.g., Dout, of one of its four multiplexers (MUXERs) 211 as its data output at its output point, i.e., at the node 23, 24, 25 or 26, coupling to one of the four programmable interconnects 361. For example, for the third type of cross-point switch 379, the top one of its four multiplexers (MUXERs) 211 may couple to the top one of its four pass/no-pass switch or switch buffers 258 configured to be switched on or off in accordance with the data input SC-4 of the top one of its four pass/no-pass switch or switch buffers 258 to pass or not to pass the data output, e.g., Dout, of the top one of its four multiplexers (MUXERs) 211 as the data output of the top one of its four pass/no-pass switch or switch buffers 258 at the output point of the top one of its four pass/no-pass switch or switch buffers 258, i.e., at the node 23, coupling to the top one of the four programmable interconnects 361. For the third type of cross-point switch 379, each of its four pass/no-pass switch or switch buffer 258 may have the data input SC-4 associated with a data output of another of its memory cells 362, i.e., configuration-programming-memory (CPM) cell, e.g., one of the first and second data outputs Out1 and Out2 of the memory cell 446 as illustrated in FIG. 1A or 1B.

Thereby, for the third type of cross-point switch 379, each of its memory cells 362, i.e., configuration-programming-memory (CPM) cell, is configured to be programmed to save or store a programming code to control data transmission between each of three of the four programmable interconnects 361 coupling respectively to the three input points of the second set of one of its four multiplexers (MUXERs) 211 and the other of the four programmable interconnects 361 coupling to the output point of said one of its four multiplexers (MUXERs) 211, that is, to pass or not to pass one of the data inputs, e.g., D0, D1 and D2, of the second input data set of said one of its four multiplexers (MUXERs) 211 at the respective three input points of the second set of said one of its four multiplexers (MUXERs) 211 coupling respectively to said three of the four programmable interconnects 361 as the data output, e.g., Dout, of said one of its four multiplexers (MUXERs) 211 at the output point of said one of its four multiplexers (MUXERs) 211 coupling to the other of the four programmable interconnects 361.

For example, referring to FIG. 7, for the third type of cross-point switch 379, the top one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-1, each of which may be referred to one of the data outputs Out1 and Out2 of the memory cell 446 as illustrated in FIG. 1A or 1B, and the top one of its four pass/no-pass switches or switch buffers 258 of the second type as seen in FIG. 4 may have the data input SC-4 associated with the data output, i.e., configuration-programming-memory (CPM) data, of the other of its three memory cells 362-1, which may be referred to one of the data outputs Out1 and Out2 of the memory cell 446 as illustrated in FIG. 1A or 1B; the left one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-2, each of which may be referred to one of the data outputs Out1 and Out2 of the memory cell 446 as illustrated in FIG. 1A or 1B, and the left one of its four pass/no-pass switches or switch buffers 258 of the second type as seen in FIG. 4 may have the data input SC-4 associated with the data output, i.e., configuration-programming-memory (CPM) data, of the other of its three memory cells 362-2, which may be referred to one of the data outputs Out1 and Out2 of the memory cell 446 as illustrated in FIG. 1A or 1B; the bottom one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-3, each of which may be referred to one of the data outputs Out1 and Out2 of the memory cell 446 as illustrated in FIG. 1A or 1B, and the bottom one of its four pass/no-pass switches or switch buffers 258 of the second type as seen in FIG. 4 may have the data input SC-4 associated with the data output, i.e., configuration-programming-memory (CPM) data, of the other of its three memory cells 362-3, which may be referred to one of the data outputs Out1 and Out2 of the memory cell 446 as illustrated in FIG. 1A or 1B; the right one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-4, each of which may be referred to one of the data outputs Out1 and Out2 of the memory cell 446 as illustrated in FIG. 1A or 1B, and the right one of its four pass/no-pass switches or switch buffers 258 of the second type as seen in FIG. 4 may have the data input SC-4 associated with the data output, i.e., configuration-programming-memory (CPM) data, of the other of its three memory cells 362-4, which may be referred to one of the data outputs Out1 and Out2 of the memory cell 446 as illustrated in FIG. 1A or 1B.

Referring to FIG. 7, for the third type of cross-point switch 379, before its memory cells 362-1, 362-2, 362-3 and 362-4, i.e., configuration-programming-memory (CPM) cells, are programmed or when its memory cells 362-1, 362-2, 362-3 and 362-4 are being programmed, the four programmable interconnects 361 may not be used for signal transmission. Its memory cells 362-1, 362-2, 362-3 and 362-4, i.e., configuration-programming-memory (CPM) cells, may be programmed to save or store programming codes, i.e., configuration-programming-memory (CPM) data, to pass data from one of the four programmable interconnects 361 to another, another two or the other three of the four programmable interconnects 361, that is, from one of the nodes N23-N26 to another, another two or the other three of the nodes N23-N26, for signal transmission in operation.

Alternatively, two programmable interconnects 361 may be controlled, by either of the first through third types of pass/no-pass switch 258 as seen in FIGS. 2A-2C, to pass or not to pass data therebetween. One of the programmable interconnects 361 may couple to the node N21 of the pass/no-pass switch 258, and another of the programmable interconnects 361 may couple to the node N22 of the pass/no-pass switch 258. Accordingly, either of the first through third types of pass/no-pass switch 258 may be switched on to pass data from said one of the programmable interconnects 361 to said another of the programmable interconnects 361; either of the first through third types of pass/no-pass switch 258 may be switched off not to pass data from said one of the programmable interconnects 361 to said another of the programmable interconnects 361.

Referring to FIG. 2A, the first type of pass/no-pass switch 258 may have the data input SC-3 associated via a non-programmable interconnect 364 with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby, the memory cell 362 may be programmed to save or store a programming code to switch on or off the first type of pass/no-pass switch 258 to control data transmission between said one of the programmable interconnects 361 and said another of the programmable interconnects 361, that is, to pass or not to pass data from the node N21 of the first type of pass/no-pass switch 258 to the node N22 of the first type of pass/no-pass switch 258 or from the node N22 of the first type of pass/no-pass switch 258 to the node N21 of the first type of pass/no-pass switch 258.

Referring to FIG. 2B, the second type of pass/no-pass switch 258 may have the data input SC-4 associated via a non-programmable interconnect 364 with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby, the memory cell 362 may be programmed to save or store a programming code to switch on or off the second type of pass/no-pass switch 258 to control data transmission between said one of the programmable interconnects 361 and said another of the programmable interconnects 361, that is, to pass or not to pass data from the node N21 of the second type of pass/no-pass switch 258 to the node N22 of the second type of pass/no-pass switch 258.

Referring to FIG. 2C, the third type of pass/no-pass switch 258 may have the data inputs SC-5 and SC-6 each associated via a non-programmable interconnect 364 with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby, each of the memory cells 362 may be programmed to save or store a programming code to switch on or off the third type of pass/no-pass switch 258 to control data transmission between said one of the programmable interconnects 361 and said another of the programmable interconnects 361, that is, to pass or not to pass data from the node N21 of the third type of pass/no-pass switch 258 to the node N22 of the third type of pass/no-pass switch 258 or from the node N22 of the third type of pass/no-pass switch 258 to the node N21 of the third type of pass/no-pass switch 258.

Similarly, each of the first and second types of cross-point switches 379 as seen in FIGS. 3A and 3B may be composed of a plurality of pass/no-pass switches 258 of the first, second or third type, wherein each of the first, second or third type of pass/no-pass switches 258 may have the data input(s) SC-3, SC-4 or (SC-5 and SC-6) each associated with a data output, i.e., configuration-programming-memory (CPM) data, of a memory cell 362, i.e., configuration-programming-memory (CPM) cell, as mentioned above. Each of the memory cells 362 may be programmed to save or store a programming code to switch said each of the first and second types of cross-point switches 379 to pass data from one of the nodes N23-N26 of said each of the first and second types of cross-point switches 379 to another, another two or another three of the nodes N23-N26 of said each of the first and second types of cross-point switches 379 for signal transmission in operation. Four of the programmable interconnects 361 may couple respectively to the nodes N23-N26 of said each of the first and second types of cross-point switches 379 and thus may be controlled, by said each of the first and second types of cross-point switches 379, to pass data from one of said four of the programmable interconnects 361 to another one, two or three of said four of the programmable interconnects 361.

Figure 8A:
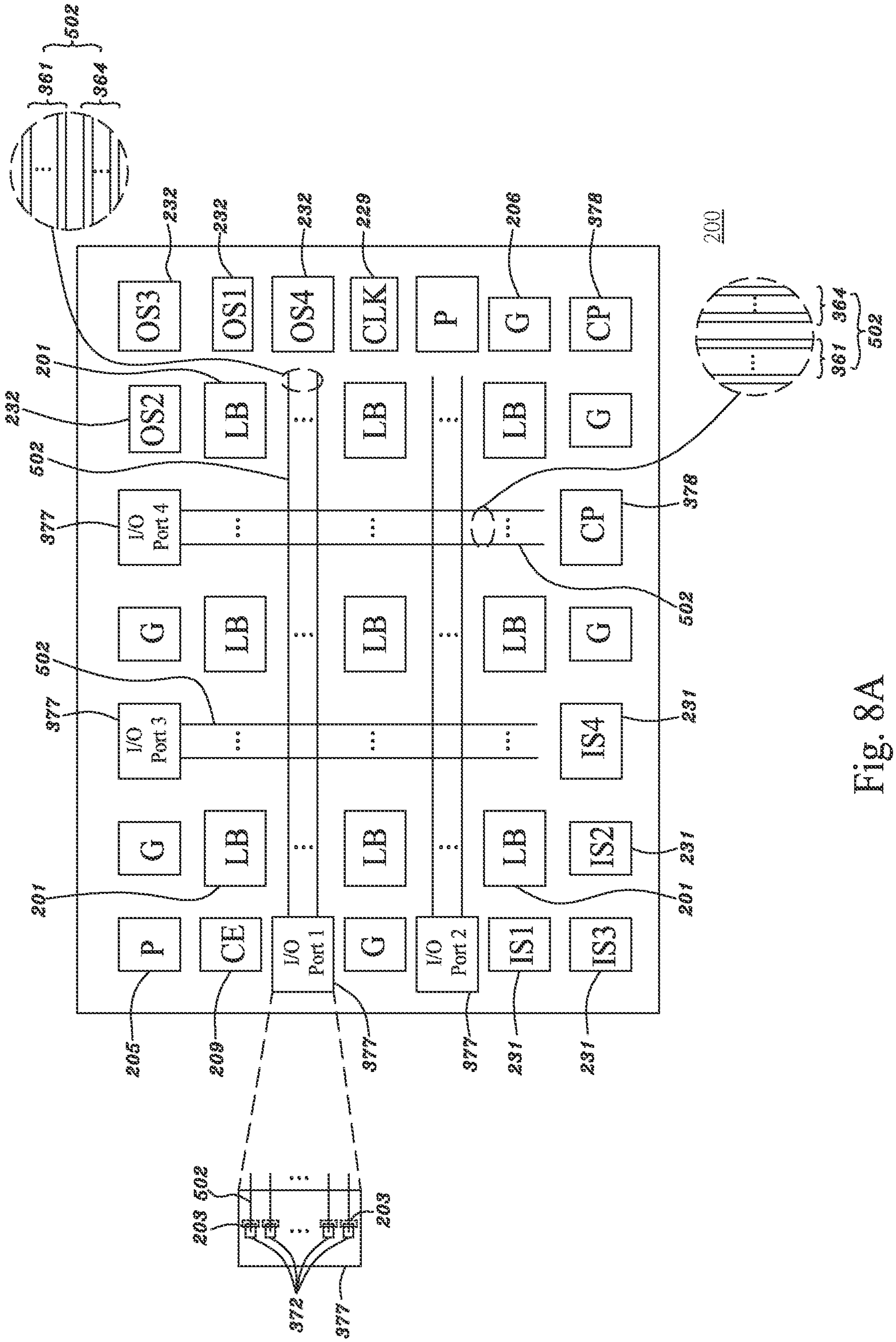
FIG. 8A is a schematically top view showing a block diagram of a standard commodity FPGA IC chip in accordance with an embodiment of the present application.

Specification for Standard Commodity Field-Programmable-Gate-Array (FPGA) Integrated-Circuit (IC) Chip FIG. 8A is a schematically top view showing a block diagram of a standard commodity FPGA IC chip in accordance with an embodiment of the present application. Referring to FIG. 8A, the standard commodity FPGA IC chip 200 may include (1) a plurality of programmable logic blocks (LB) 201 as illustrated in FIGS. 6A-6D arranged in an array in a central region thereof, (2) a plurality of cross-point switches 379 as illustrated in FIGS. 3A, 3B and 7 arranged around each of the programmable logic blocks (LB) 201, (3) a plurality of memory cells 362 as illustrated in FIGS. 3A, 3B and 7 configured to be programmed to control its cross-point switches 379, (4) a plurality of intra-chip interconnects 502 each extending over spaces between neighboring two of the programmable logic blocks (LB) 201, wherein the intra-chip interconnects 502 may include the programmable interconnects 361 as seen in FIGS. 3A, 3B and 7 configured to be programmed for interconnection by its memory cells 362 and the non-programmable interconnects 364 for programing its memory cells 362 and 490, and (5) a plurality of small input/output (I/O) circuits 203 as illustrated in FIG. 5B each providing the small driver 374 with the second data input S_Data_out at the second input point of the small driver 374 configured to couple to its programmable interconnects 361 or non-programmable interconnects 364 and providing the small receiver 375 with the data output S_Data_in at the output point of the small receiver 375 configured to couple to its programmable interconnects 361 or non-programmable interconnects 364.

Referring to FIG. 8A, the programmable interconnects 361 of the intra-chip interconnects 502 may couple to the programmable interconnects 361 of the intra-block interconnects 2015 of each of the programmable logic blocks (LB) 201 as seen in FIG. 6D. The non-programmable interconnects 364 of the intra-chip interconnects 502 may couple to the non-programmable interconnects 364 of the intra-block interconnects 2015 of each of the programmable logic blocks (LB) 201 as seen in FIG. 6D.

Referring to FIG. 8A, each of the programmable logic blocks (LB) 201 may include one or more programmable logic cells (LC) 2014 as illustrated in FIGS. 6A-6D. Each of the one or more programmable logic cells (LC) 2014 may have the input data set at its input points each coupling to one of the programmable and non-programmable interconnects 361 and 364 of the intra-chip interconnects 502 and may be configured to perform logic operation or computation operation on its input data set into its data output coupling to another of the programmable and non-programmable interconnects 361 and 364 of the intra-chip interconnects 502, wherein the computation operation may include an addition, subtraction, multiplication or division operation, and the logic operation may include a Boolean operation such as AND, NAND, OR or NOR operation.

Referring to FIG. 8A, the standard commodity FPGA IC chip 200 may include multiple I/O pads 372 as seen in FIG. 5B each vertically over one of its small input/output (I/O) circuits 203. For example, in a first clock cycle, for one of the small input/output (I/O) circuits 203 of the standard commodity FPGA IC chip 200, its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, associated with the data output of one of the programmable logic cells (LC) 2014 of the standard commodity FPGA IC chip 200 as illustrated in FIGS. 6A-6D through first one or more of the programmable interconnects 361 of the standard commodity FPGA IC chip 200 and/or one or more of the cross-point switches 379 of the standard commodity FPGA IC chip 200 each coupled between two of said first one or more of the programmable interconnects 361, as the data output of its small driver 374 to be transmitted to one of the I/O pads 372 vertically over said one of the small input/output (I/O) circuits 203 for external connection to circuits outside the standard commodity FPGA IC chip 200, such as non-volatile memory (NVM) integrated-circuit (IC) chip.

In a second clock cycle, for said one of the small input/output (I/O) circuits 203 of the standard commodity FPGA IC chip 200, its small driver 374 may be disabled by the first data input S_Enable of its small driver 374 and its small receiver 375 may be activated by the first data input S_Inhibit of its small receiver 375. Thereby, its small receiver 375 may amplify the second data input of its small receiver 375 transmitted from circuits outside the standard commodity FPGA IC chip 200 through said one of the I/O pads 372 as the data output S_Data_in of its small receiver 375 to be associated with a data input of the input data set of one of the programmable logic cells (LC) 2014 of the standard commodity FPGA IC chip 200 as illustrated in FIGS. 6A-6D through second one or more of the programmable interconnects 361 of the standard commodity FPGA IC chip 200 and/or one or more of the cross-point switches 379 of the standard commodity FPGA IC chip 200 each coupled between two of said second one or more of the programmable interconnects 361.

Referring to FIG. 8A, the standard commodity FPGA IC chip 200 may include multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 5B having the number ranging from 4 to 256, such as 64 for this case, arranged in parallel for data transmission with bit width ranging from 4 to 256, such as 64 for this case, and (2) the I/O pads 372 as seen in FIG. 5B having the number ranging from 4 to 256, such as 64 for this case, arranged in parallel and vertically over the small I/O circuits 203 respectively.

Referring to FIG. 8A, the standard commodity FPGA IC chip 200 may further include a chip-enable (CE) pad 209 configured for enabling or disabling the standard commodity FPGA IC chip 200. For example, when the chip-enable (CE) pad 209 is at a logic level of "0", the standard commodity FPGA IC chip 200 may be enabled to process data and/or operate with circuits outside of the standard commodity FPGA IC chip 200; when the chip-enable (CE) pad 209 is at a logic level of "1", the standard commodity FPGA IC chip 200 may be disabled not to process data and/or operate with circuits outside of the standard commodity FPGA IC chip 200.

Figure 12:
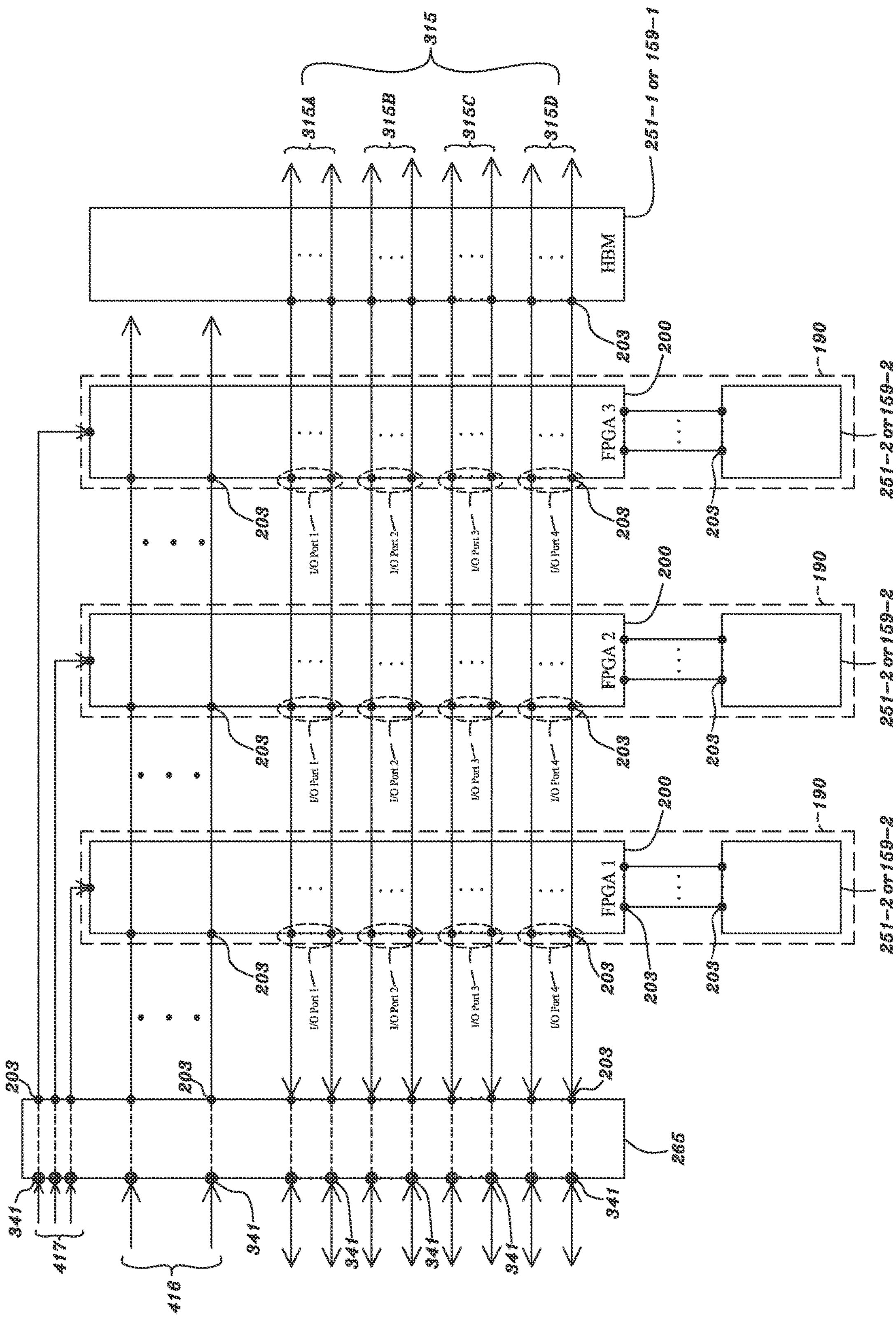
FIG. 12 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with an embodiment the present application.

Referring to FIG. 8A, the standard commodity FPGA IC chip 200 may include multiple input selection (IS) pads 231, e.g., IS1, IS2, IS3 and IS4 pads, each configured to receive data to be associated with the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive data to be associated with the first data input S_Inhibit of the small receiver 375 of each of the small I/O circuits 203 of its I/O Port 1 through a first one of its small I/O circuits 203; the IS2 pad 231 may receive data to be associated with the first data input S_Inhibit of the small receiver 375 of each of the small I/O circuits 203 of I/O Port 2 through a second one of its small I/O circuits 203; the IS3 pad 231 may receive data to be associated with the first data input S_Inhibit of the small receiver 375 of each of the small I/O circuits 203 of I/O Port 3 through a third one of its small I/O circuits 203; and the IS4 pad 231 may receive data to be associated with the first data input S_Inhibit of the small receiver 375 of each of the small I/O circuits 203 of I/O Port 4 through a fourth one of its small I/O circuits 203. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small I/O circuits 203 of one of the I/O ports 377 selected in accordance with the logic level at one of the input selection (IS) pads 231 of the standard commodity FPGA IC chip 200, its small receiver 375 may be activated by the first data input S_Inhibit of its small receiver 375 associated with the logic level at said one of the input selection (IS) pads 231 of the standard commodity FPGA IC chip 200 to amplify or pass the second data input of its small receiver 375, transmitted from a data path of one of data buses 315 as illustrated in FIG. 12 outside the standard commodity FPGA IC chip 200 through one of the I/O pads 372 of said one of the I/O ports 377 selected in accordance with the logic level at said one of the input selection (IS) pads 231 of the standard commodity FPGA IC chip 200, as the data output S_Data_in of its small receiver 375 to be associated with a data input of the input data set of one of the programmable logic cells (LC) 2014 as seen in FIGS. 6A-6D of the standard commodity FPGA IC chip 200 through one or more of the programmable interconnects 361 as seen in FIGS. 3A, 3B and 7 of the standard commodity FPGA IC chip 200, for example. For each of the small I/O circuits 203 of the other one or more of the I/O ports 377, not selected in accordance with the logic level at the other(s) of the input selection (IS) pads 231, of the standard commodity FPGA IC chip 200, its small receiver 375 may be inhibited by the first data input S_Inhibit of its small receiver 375 associated with the logic level at one of the other(s) of the input selection (IS) pads 231.

For example, referring to FIG. 8A, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver 375 may be activated by the first data input S_Inhibit of its small receiver 375 associated with the logic level at the IS1 pad 231 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small receiver 375 may be inhibited by the first data input S_Inhibit of its small receiver 375 associated respectively with the logic levels at the IS2, IS3 and IS4 pads 231 of the standard commodity FPGA IC chip 200.

For example, referring to FIG. 8A, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the standard commodity FPGA IC chip 200, its small receiver 375 may be activated by the first data input S_Inhibit of its small receiver 375 associated respectively with the logic levels at the IS1, IS2, IS3 and IS4 pads 231 of the standard commodity FPGA IC chip 200.

Referring to FIG. 8A, the standard commodity FPGA IC chip 200 may include multiple output selection (OS) pads 232, e.g., OS1, OS2, OS3 and OS4 pads, each configured to receive data to be associated with the first data input S_Enable of the small driver 374 of each of the small I/O circuits 203 of one of its I/O ports 377, e.g., I/O Port 1, I/O Port 2, I/O Port 3 and I/O Port 4. For more elaboration, the OS1 pad 232 may receive data to be associated with the first data input S_Enable of the small driver 374 of each of the small I/O circuits 203 of I/O Port 1 through a fifth one of its small I/O circuits 203; the OS2 pad 232 may receive data to be associated with the first data input S_Enable of the small driver 374 of each of the small I/O circuits 203 of I/O Port 2 through a sixth one of its small I/O circuits 203; the OS3 pad 232 may receive data to be associated with the first data input S_Enable of the small driver 374 of each of the small I/O circuits 203 of I/O Port 3 through a seventh one of its small I/O circuits 203; the OS4 pad 232 may receive data to be associated with the first data input S_Enable of the small driver 374 of each of the small I/O circuits 203 of I/O Port 4 through an eighth one of its small I/O circuits 203. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 associated with the logic level at one of the output selection (OS) pads 232 to amplify or pass the second data input S_Data_out of its small driver 374, associated with the data output of one of the programmable logic cells (LC) 2014 as seen in FIGS. 6A-6D of the standard commodity FPGA IC chip 200 through one or more of the programmable interconnects 361 as seen in FIGS. 3A, 3B and 7 of the standard commodity FPGA IC chip 200, as the data output of its small driver 374 to be transmitted to a data path of one of data buses 315 as illustrated in FIG. 12 outside the standard commodity FPGA IC chip 200 through one of the I/O pads 372 of said each of the one or more I/O ports 377, for example. For each of the small I/O circuits 203 of each of the I/O ports 377, not selected in accordance with in accordance with the logic levels at the output selection (OS) pads 232, of the standard commodity FPGA IC chip 200, its small driver 374 may be disabled by the first data input S_Enable of its small driver 374 associated with the logic level at one of the output selection (OS) pads 232.

For example, referring to FIG. 8A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver 374 may be enabled by the first data input S_Enable of its small driver 374 associated with the logic level at the OS1 pad 232 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small driver 374 may be disabled by the first data input S_Enable of its small driver 374 associated respectively with the logic levels at the OS2, OS3 and OS4 pads 232 of the standard commodity FPGA IC chip 200.

For example, referring to FIG. 8A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, I/O Port 2, I/O Port 3 and I/O Port 4, of the standard commodity FPGA IC chip 200, its small driver 374 may be enabled by the first data input S_Enable of its small driver 374 associated respectively with the logic levels at the OS1, OS2, OS3 and OS4 pads 232 of the standard commodity FPGA IC chip 200.

Thereby, referring to FIG. 8A, in a clock cycle, one or more of the I/O ports 377, e.g., I/O Port 1, I/O Port 2, I/O Port 3 and I/O Port 4, may be selected, in accordance with the logic levels at the IS1, IS2, IS3 and IS4 pads 231, to pass data for the input operation, while another one or more of the I/O ports 377, e.g., I/O Port 1, I/O Port 2, I/O Port 3 and I/O Port 4, may be selected, in accordance with the logic levels at the OS1, OS2, OS3 and OS4 pads 232, to pass data for the output operation. The input selection (IS) pads 231 and output selection (OS) pads 232 may be provided as I/O-port selection pads.

Referring to FIG. 8A, the standard commodity FPGA IC chip 200 may further include (1) multiple power pads 205 configured for applying the voltage Vcc of power supply to its memory cells 490 for the look-up tables (LUT) 210 of its programmable logic cells (LC) 2014 as illustrated in FIGS. 6A-6D, the multiplexers (MUXERs) 211 of its programmable logic cells (LC) 2014, its memory cells 362 for its cross-point switches 379 as illustrated in FIGS. 3A, 3B and 7, its cross-point switches 379 and/or the small drivers 374 and receivers 375 of its small I/O circuits 203 as seen in FIG. 5B through one or more of its non-programmable interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to its memory cells 490 for the look-up tables (LUT) 210 of its programmable logic cells (LC) 2014 as illustrated in FIGS. 6A-6D, the multiplexers (MUXERs) 211 of its programmable logic cells (LC) 2014, its memory cells 362 for its cross-point switches 379 as illustrated in FIGS. 3A, 3B and 7, its cross-point switches 379 and/or the small drivers 374 and receivers 375 of its small I/O circuits 203 as seen in FIG. 5B through one or more of its non-programmable interconnects 364.

Referring to FIG. 8A, the standard commodity FPGA IC chip 200 may further include a clock pad (CLK) 229 configured to receive a clock signal from circuits outside of the standard commodity FPGA IC chip 200 and multiple control pads (CP) 378 configured to receive control commands to control the standard commodity FPGA IC chip 200.

Referring to FIG. 8A, for the standard commodity FPGA IC chip 200, its programmable logic cells (LC) 2014 as seen in FIGS. 6A-6D may be reconfigurable for artificial-intelligence (AI) application. For example, in a clock cycle, one of the programmable logic cells (LC) 2014 of the standard commodity FPGA IC chip 200 may have its memory cells 490 to be programmed to perform OR operation; however, after one or more events happen, in another clock cycle said one of its programmable logic cells (LC) 2014 of the standard commodity FPGA IC chip 200 may have its memory cells 490 to be programmed to perform NAND operation for better AI performance.

Referring to FIG. 8A, the standard commodity FPGA IC chip 200 may be designed, implemented and fabricated using an advanced semiconductor technology node or generation, for example more advanced than or equal to, or below or equal to 30 nm, 20 nm or 10 nm. The standard commodity FPGA IC chip 200 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the standard commodity FPGA IC chip 200 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Figure 8B:
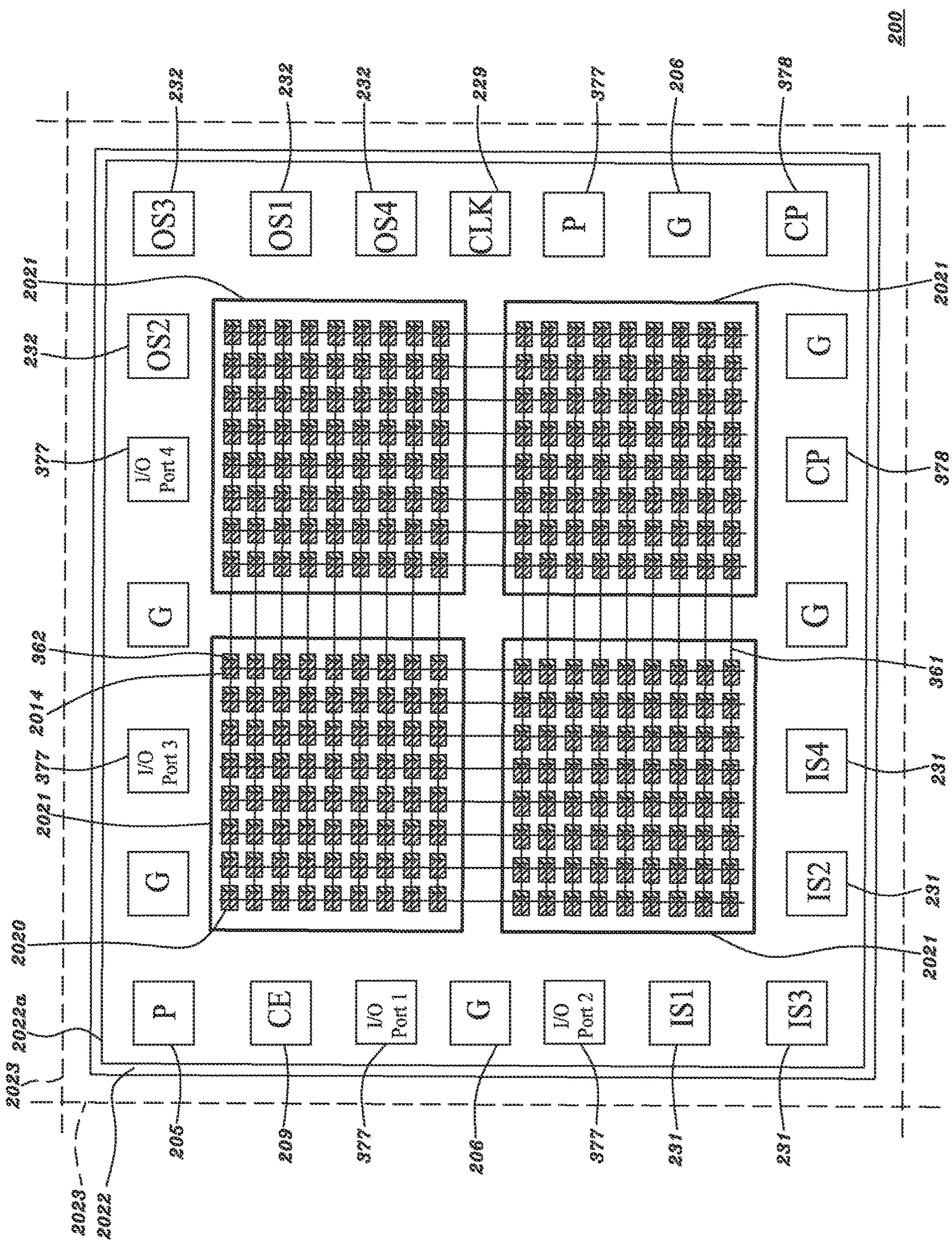
FIG. 8B is a top view showing a layout of a standard commodity FPGA IC chip in accordance with an embodiment of the present application.

FIG. 8B is a top view showing a layout of a standard commodity FPGA IC chip in accordance with an embodiment of the present application. Referring to FIG. 8B, the standard commodity FPGA IC chip 200 may include multiple repetitive circuit arrays 2021 arranged in an array therein, and each of the repetitive circuit arrays 2021 may include multiple repetitive circuit units 2020 arranged in an array therein. Each of the repetitive circuit units 2020 may include a programmable logic cell (LC) 2014 as illustrated in FIG. 6A, and/or the memory cells 362 for the programmable interconnection as illustrated in FIGS. 2A-2C, 3A, 3B and 7. The programmable logic cells (LC) 2014 may be programmed or configured as functions of, for example, digital-signal processor (DSP), microcontroller, adders, and/or multipliers. For the standard commodity FPGA IC chip 200, its programmable interconnects 361 may couple neighboring two of its repetitive circuit units 2020 and the repetitive circuit units 2020 in neighboring two of its repetitive circuit units 2020. The standard commodity FPGA IC chip 200 may include a seal ring 2022 at its four edges, enclosing its repetitive circuit arrays 2021, its I/O ports 277 and its various circuits as illustrated in FIG. 8A, and a scribe line, kerf or die-saw area 2023 at its border and outside and around the seal ring 2022. For example, for the standard commodity FPGA IC chip 200, greater than 85%, 90%, 95% or 99% area (not counting its seal ring 2022 and scribe line 2023, that is, only including an area within an inner boundary **2022*a* of its seal ring 2022) is used for its repetitive circuit arrays 2021; alternatively, all or most of its transistors are used for its repetitive circuit arrays 2021. Alternatively, for the standard commodity FPGA IC chip 200, none or minimal area may be provided for its control circuits, I/O circuits or hard macros, for example, less than 15%, 10%, 5%, 2% or 1% of its area (not counting its seal ring 2022 and scribe line 2023, that is, only including an area within an inner boundary 2022*a* of its seal ring 2022**) is used for its control circuits, I/O circuits or hard macros; alternatively, none or minimal transistors may be provided for its control circuits, I/O circuits or hard macros, for example, less than 15%, 10%, 5%, 2% or 1% of the total number of its transistors are used for its control circuits, I/O circuits or hard macros.

The standard commodity plural FPGA IC chip 200 may have standard common features, counts or specifications: (1) its regular repetitive logic array may have the number of programmable logic arrays or sections equal to or greater than 2, 4, 8, 10 or 16, wherein its regular repetitive logic array may include programmable logic blocks or elements 201 as illustrated in FIGS. 6A-6D with the count equal to or greater than 128K, 512K, 1M, 4M, 8M, 16M, 32M or 80M; (2) its regular memory array may have the number of memory banks equal to or greater than 2, 4, 8, 10 or 16, wherein its regular memory array may include memory cells with the bit count equal to or greater than 1M, 10M, 50M, 100M, 200M or 500M bits; (3) the number of data inputs to each of its programmable logic blocks or elements 201 may be greater than or equal to 4, 8, 16, 32, 64, 128 or 256; (4) its applied voltage may be between 0.1V and 1.5V, between 0.1V and 1.0V, between 0.1V and 0.7V, or between 0.1V and 0.5V; and (4) its I/O pads 372 as seen in FIG. 8A may be arranged in terms of layout, location, number and function.

Figure 9:
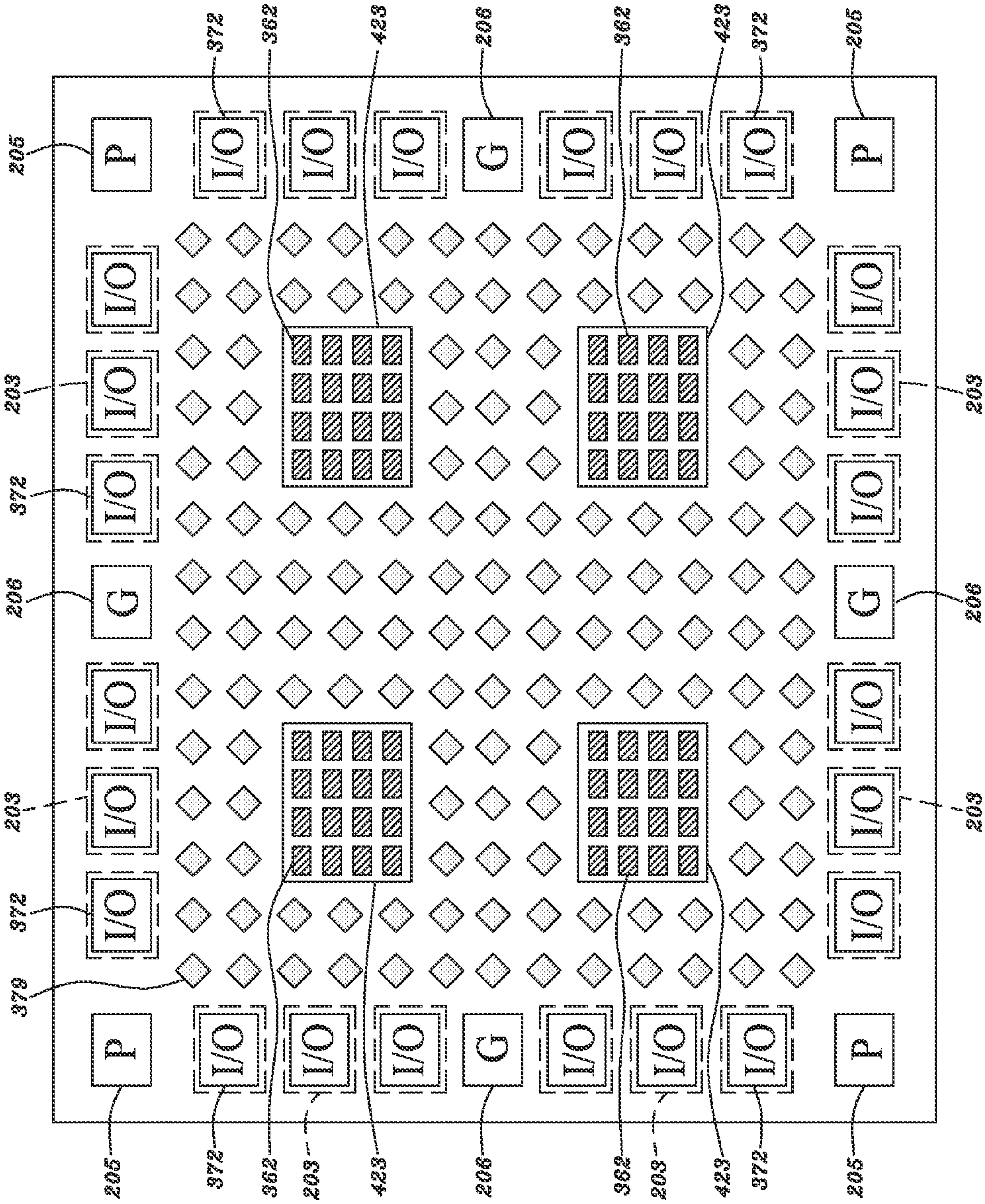
FIG. 9 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 9 is a schematically top view showing a block diagram of a dedicated programmable interconnection (DPI) integrated-circuit (IC) chip in accordance with an embodiment of the present application.

Referring to FIG. 9, the DPIIC chip 410 may include (1) a plurality of memory-array blocks 423 arranged in an array in a central region thereof, wherein each of the memory-array blocks 423 may include a plurality of memory cells 362 as illustrated in FIGS. 3A, 3B and 7 arranged in an array, (2) a plurality of groups of cross-point switches 379 as illustrated in FIGS. 3A, 3B and 7, each group of which is arranged in one or more rings around one of the memory-array blocks 423, wherein each of its memory cells 362 in one of its memory-array blocks 423 is configured to be programmed to control its cross-point switches 379 around said one of its memory-array blocks 423, (4) a plurality of intra-chip interconnects including the programmable interconnects 361 as seen in FIGS. 3A, 3B and 7 configured to be programmed for interconnection by its memory cells 362 and multiple non-programmable interconnects for programing its memory cells 362, and (6) a plurality of small input/output (I/O) circuits 203 as illustrated in FIG. 5B each providing the small receiver 375 with the data output S_Data_in associated with a data input at one of the nodes N23-N26 of one of its cross-point switches 379 as illustrated in FIGS. 3A, 3B and 8 through one or more of its programmable interconnects 361 and providing the small driver 374 with the data input S_Data_out associated with a data output at one of the nodes N23-N26 of another of its cross-point switches 379 as illustrated in FIGS. 3A, 3B and 8 through another one or more of its programmable interconnects 361.

Referring to FIG. 9, each of the memory cells 362 may be referred to a memory cell 446 as illustrated in FIGS. 1A and 1B. The DPIIC chip 410 may provide the first type of pass/no-pass switches 258 for its first or second type of cross-point switches 379 as illustrated in FIGS. 3A and 3B close to one of its memory-array blocks 423, each of which may have the data input SC-3 as seen in FIG. 2A associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B. Alternatively, the DPIIC chip 410 may provide the third type of pass/no-pass switches 258 for its first or second type of cross-point switches 379 as illustrated in FIGS. 3A and 3B close to one of the memory-array blocks 423, each of which may have the data inputs SC-5 and SC-6 as seen in FIG. 2C each associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B. Alternatively, the DPIIC chip 410 may provide the multiplexers 211 for its third type of cross-point switches 379 as illustrated in FIG. 7 close to one of the memory-array blocks 423, each of which may have the first set of input points for multiple data inputs of the first input data set of said each of its multiplexers 211 each associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B.

Referring to FIG. 9, the DPIIC chip 410 may include multiple intra-chip interconnects (not shown) each extending over spaces between neighboring two of the memory-array blocks 423, wherein said each of the intra-chip interconnects may be the programmable interconnect 361, coupling to one of the nodes N23-N26 of one of its cross-point switches 379 as illustrated in FIGS. 3A, 3B and 7. For the DPIIC chip 410, each of its small input/output (I/O) circuits 203, as illustrated in FIGS. 5B, may provide the small receiver 375 with the data output S_Data_in to be passed through one or more of its programmable interconnects 361 and the first data input S_Inhibit passed through another one or more of its programmable interconnects 361 and provide the small driver 374 with the first data input S_Enable passed through another one or more of its programmable interconnects 361 and the second data input S_Data_out passed through another one or more of its programmable interconnects.

Referring to FIG. 9, the DPIIC chip 410 may include multiple of the I/O pads 372 as seen in FIG. 5B, each vertically over one of its small input/output (I/O) circuits 203, coupling to the node 381 of said one of its small input/output (I/O) circuits 203. For the DPIIC chip 410, in a first clock cycle, data from one of the nodes N23-N26 of one of its cross-point switches 379 as illustrated in FIGS. 3A, 3B and 7 may be associated with the second data input S_Data_out of the small driver 374 of one of its small input/output (I/O) circuits 203 through one or more of the programmable interconnects 361 programmed by a first group of its memory cells 362, and then the small driver 374 of said one of its small input/output (I/O) circuits 203 may amplify or pass the second data input S_Data_out of the small driver 374 of said one of its small input/output (I/O) circuits 203 into the data output of the small driver 374 of said one of its small input/output (I/O) circuits 203 to be transmitted to one of its I/O pads 372 vertically over said one of its small input/output (I/O) circuits 203 for external connection to circuits outside the DPIIC chip 410. In a second clock cycle, data from circuits outside the DPIIC chip 410 may be associated with the second data input of the small receiver 375 of said one of its small input/output (I/O) circuits 203 through said one of its I/O pads 372, and then the small receiver 375 of said one of the small input/output (I/O) circuits 203 may amplify or pass the second data input of the small receiver 375 of said one of its small input/output (I/O) circuits 203 into the data output S_Data_in of the small receiver 375 of said one of its small input/output (I/O) circuits 203 to be associated with one of the nodes N23-N26 of another of its cross-point switches 379 as illustrated in FIGS. 3A, 3B and 7 through another one or more of the programmable interconnects 361 programmed by a second group of its memory cells 362.

Referring to FIG. 9, the DPIIC chip 410 may further include (1) multiple power pads 205 for applying the voltage Vcc of power supply to its memory cells 362 for its cross-point switches 379 as illustrated in FIGS. 3A, 3B and 7 and/or its cross-point switches 379, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to its memory cells 362 for its cross-point switches 379 as illustrated in FIGS. 3A, 3B and 7 and/or its cross-point switches 379.

Referring to FIG. 9, the DPIIC chip 410 may further include multiple volatile storage units 398 of the first type as illustrated in FIG. 1A used as cache memory for data latch or storage. Each of the volatile storage units 398 may include two switches 449, such as N-type or P-type MOS transistors, for bit and bit-bar data transfer, and two pairs of P-type and N-type MOS transistors 447 and 448 for data latch or storage nodes. For each of the volatile storage units 398 acting as the cache memory of the DPIIC chip 410, its two switches 449 may perform control of writing data into each of its memory cells 446 and reading data stored in each of its memory cells 446. The DPIIC chip 410 may further include a sense amplifier for reading, amplifying or detecting data from the memory cells 446 of its volatile storage units 398 acting as the cache memory.

Referring to FIG. 9, the dedicated programmable interconnection (DPI) integrated-circuit (IC) chip 410 may be designed, implemented and fabricated using an advanced semiconductor technology node or generation, for example more advanced than or equal to, or below or equal to 30 nm, 20 nm or 10 nm. The DPIIC chip 410 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the DPIIC chip 410 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Specification for Standard Commodity Logic Drive

I. First Type of Standard Commodity Logic Drive

Figure 10A:
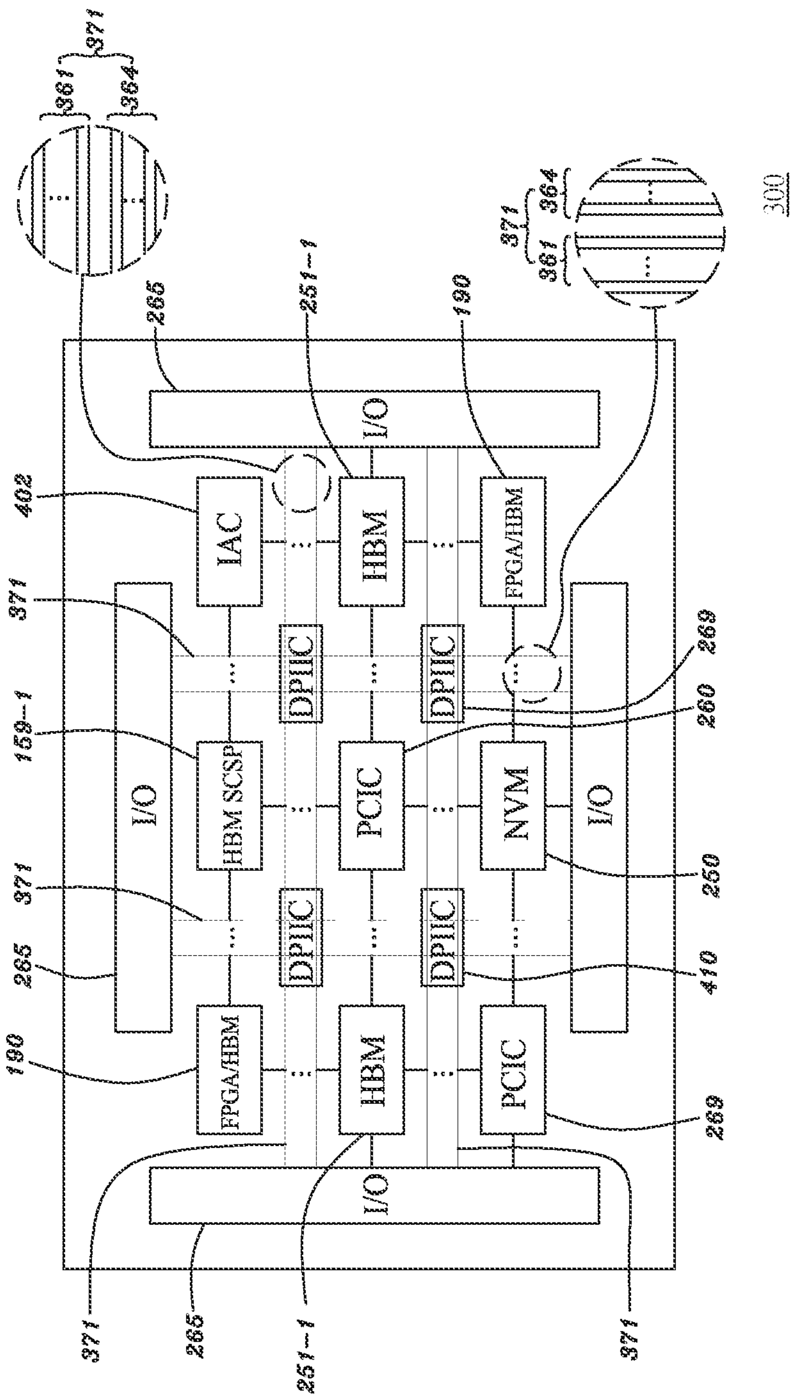
FIGS. 10A-10D are schematically top views showing multiple arrangements for semiconductor chips packaged in various types of standard commodity logic drives in accordance with multiple embodiments of the present application.
Figure 15A:
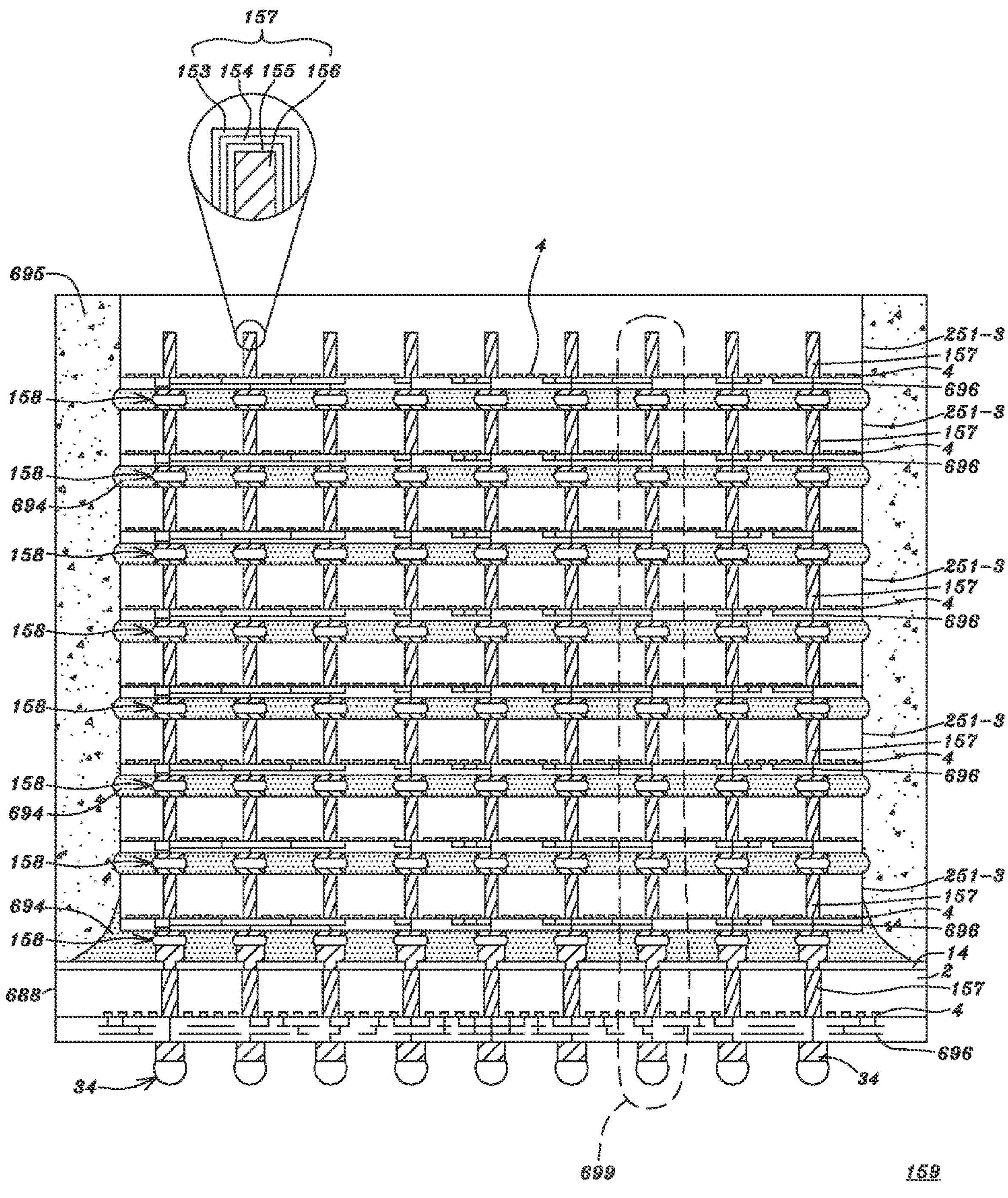
FIGS. 15A and 15B are schematically cross-sectional views showing various types of memory modules in accordance with an embodiment of the present application.
Figure 15B:
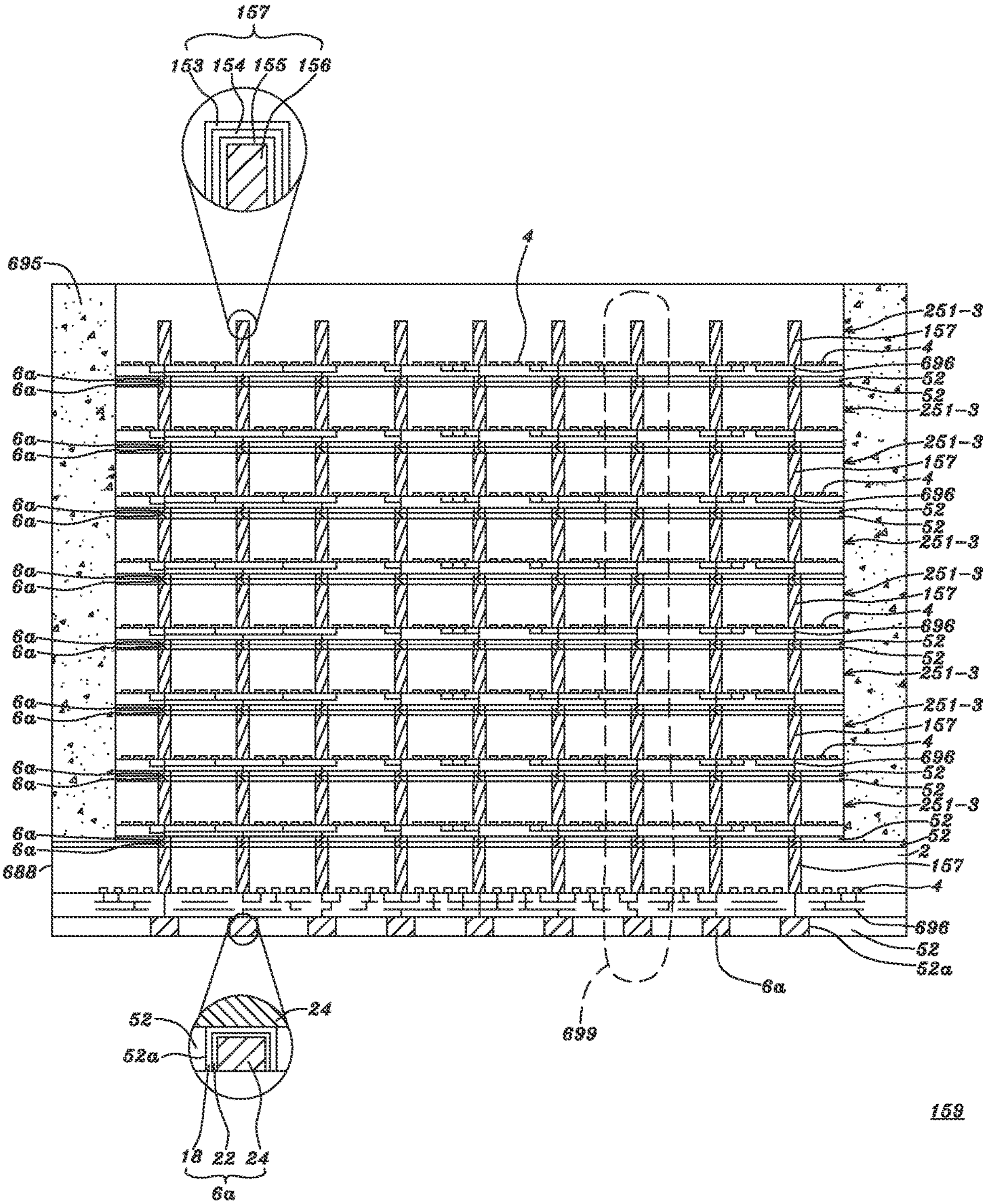

FIG. 10A is a schematically top view showing arrangement for various chips packaged in a first type of standard commodity logic drive in accordance with an embodiment of the present application. Referring to FIG. 10A, a first type of standard commodity logic drive 300 may be packaged with multiple processing and/or computing (PC) integrated circuit (IC) chips 269, a non-volatile memory (NVM) IC chip 250, multiple first high speed, high bandwidth memory (HBM) IC chips 251-1, an innovated application-specific integrated circuit (ASIC) chip or customer-owned tooling (COT) chip 402, abbreviated as IAC chip below, a first memory module 159-1 as seen in FIG. 15A or 15B and multiple operation modules 190 each as seen in FIG. 18E-18H or 20E-20H, which are arranged in an array. For each of the operation modules 190 of the first type of standard commodity logic drive 300, a standard commodity FPGA IC chip 200 as illustrated in FIGS. 8A and 8B is provided at a bottom thereof, and a second high bandwidth memory (HBM) IC chip 251-2 or a second memory module 159-2 as seen in FIG. 15A or 15B may be provided over its standard commodity FPGA IC chip 200, and thereby its standard commodity FPGA IC chip 200 may operate with its second HBM IC chip 251-2 or multiple third HBM IC chips 251-3 of its second memory module 159-2 for high speed, high bandwidth, wide bitwidth parallel processing and/or parallel computing. A data bus between its standard commodity FPGA IC chip 200 and its second HBM IC chip 251-2, or each of the third HBM IC chips 251-3 of its second memory module 159-2, may have a data bit width of equal to or greater than 64, 128, 256, 512, 1024, 2048, 4096, 8K, or 16K.

Referring to FIG. 10A, for the first type of standard commodity logic drive 300, its NVM IC chip 250 is configured to store the resulting values and programming codes in a non-volatile manner for programming the programmable logic cells (LC) 2014 and cross-point switches 379 of the standard commodity FPGA IC chip 200 of each of its operation modules 190, as illustrated in FIGS. 6A-6D, 7, 8A and 8B. The resulting values and programming codes stored in its NVM IC chip 250 may be passed to and stored in the memory cells 490 and 362 of the standard commodity FPGA IC chip 200 of each of its operation modules 190. For the first type of standard commodity logic drive 300, each of its PCIC chips 269 may be a graphic-processing-unit (GPU) chip, central-processing-unit (CPU) chip, digital-signal-processing (DSP) chip, tensor-processing-unit (TPU) chip or neural-processing-unit (NPU) chip. Each of its first, second and third HBM IC chips 251-1, 251-2 and 251-3 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth NVM chip, high speed, high bandwidth, wide bitwidth magnetoresistive random-access-memory (MRAM) chip or high speed, high bandwidth, wide bitwidth resistive random-access-memory (RRAM) chip. One of its PCIC chips 269 may operate with one of its first HBM IC chips 251-1 next to said one of its PCIC chips 269 for high speed, high bandwidth, wide bitwidth parallel processing and/or parallel computing. One of its PCIC chips 269 may operate with the third HBM IC chips 251-3 of one of its first memory modules 159-1 next to said one of its PCIC chips 269 for high speed, high bandwidth, wide bitwidth parallel processing and/or parallel computing.

Referring to FIG. 10A, the first type of standard commodity logic drive 300 may include multiple inter-chip interconnects 371 each extending under spaces between neighboring two of its NVM IC chip 250, PCIC chips 269, first HBM IC chips 251-1, operation modules 190 and first memory module 159-1. The first type of standard commodity logic drive 300 may include a plurality of dedicated-programmable-interconnection (DPI) integrated-circuit (IC) chips 410 as illustrated in FIG. 9 each aligned with a cross of a vertical bundle of its inter-chip interconnects 371 and a horizontal bundle of its inter-chip interconnects 371.

Referring to FIG. 10A, for the first type of standard commodity logic drive 300, each of its inter-chip interconnects 371 may be a non-programmable interconnect 364 for programing one or more of the memory cells 362 and 490 of the standard commodity FPGA IC chip 200 of one of its operation modules 190 or one or more of the memory cells 362 of one of its DPIIC chips 410, or a programmable interconnect 361 configured to be programmed by one or more of the memory cells 362 of the standard commodity FPGA IC chip 200 of one of its operation modules 190 or one or more of the memory cells 362 of one of its DPIIC chips 410. Signal transmission may be built (1) between one of the programmable interconnects 361 of its inter-chip interconnects 371 and one of the programmable interconnects 361 of the intra-chip interconnects 502 of the standard commodity FPGA IC chip 200 of one of its operation modules 190 via one of the small input/output (I/O) circuits 203 of the standard commodity FPGA IC chip 200 of said one of its operation modules 190, or (2) between one of the programmable interconnects 361 of its inter-chip interconnects 371 and one of the programmable interconnects of the intra-chip interconnects of one of its DPIIC chips 410 via one of the small input/output (I/O) circuits 203 of said one of its DPIIC chips 410. Signal transmission may be built (1) between one of the non-programmable interconnects 364 of its inter-chip interconnects 371 and one of the non-programmable interconnects 364 of the intra-chip interconnects 502 of the standard commodity FPGA IC chip 200 of said one of its operation modules 190 via one of the small input/output (I/O) circuits 203 of the standard commodity FPGA IC chip 200 of said one of its operation modules 190 or (2) between one of the non-programmable interconnects 364 of its inter-chip interconnects 371 and one of the non-programmable interconnects of the intra-chip interconnects of one of its DPIIC chips 410 via one of the small input/output (I/O) circuits 203 of said one of its DPIIC chips 410. For the first type of standard commodity logic drive 300, its NVM IC chip 250 is configured to store the programming codes in a non-volatile manner for programming the cross-point switches 379 of its DPIIC chips 410, as illustrated in FIGS. 7 and 9. The programming codes stored in its NVM IC chip 250 may be passed to and stored in the memory cells 362 of its DPIIC chips 410.

Referring to FIG. 10A, for the first type of standard commodity logic drive 300, one or more of the programmable or non-programmable interconnects 361 or 364 of its inter-chip interconnects 371 may couple from the standard commodity FPGA IC chip 200 of each of its operation modules 190 to all of its DPIIC chips 410. One or more of the programmable or non-programmable interconnects 361 or 364 of its inter-chip interconnects 371 may couple from the standard commodity FPGA IC chip 200 of each of its operation modules 190 to its IAC chip 402. One or more of the programmable or non-programmable interconnects 361 or 364 of its inter-chip interconnects 371 may couple from the standard commodity FPGA IC chip 200 of each of its operation modules 190 to its NVM IC chip 250. One or more of the programmable or non-programmable interconnects 361 or 364 of its inter-chip interconnects 371 may couple from the standard commodity FPGA IC chip 200 of each of its operation modules 190 to both of its PCIC chips 269. One or more of the programmable or non-programmable interconnects 361 or 364 of its inter-chip interconnects 371 may couple from the standard commodity FPGA IC chip 200 of one of its operation modules 190 to one of its first HBM IC chips 251-1 next to said one of its operation modules 190 and compose a data bus between the standard commodity FPGA IC chip 200 of said one of its operation modules 190 and said one of its first HBM IC chips 251-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from the standard commodity FPGA IC chip 200 of one of its operation modules 190 to each of the third HBM IC chips 251-3 of its first memory module 159-1 next to said one of its operation modules 190 and compose a data bus between the standard commodity FPGA IC chip 200 of said one of its operation modules 190 and said each of the third HBM IC chips 251-3 of its first memory module 159-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from each of its DPIIC chips 410 to its IAC chip 402. One or more of the programmable or non-programmable interconnects 361 or 364 of its inter-chip interconnects 371 may couple from each of its DPIIC chips 410 to its NVM IC chip 250. One or more of the programmable or non-programmable interconnects 361 or 364 of its inter-chip interconnects 371 may couple from each of its DPIIC chips 410 to both of its PCIC chips 269. One or more of the programmable or non-programmable interconnects 361 or 364 of its inter-chip interconnects 371 may couple from each of its DPIIC chips 410 to both of its first HBM IC chips 251-1. One or more of the programmable or non-programmable interconnects 361 or 364 of its inter-chip interconnects 371 may couple from each of its DPIIC chips 410 to all of the third HBM IC chips 251-3 of its first memory module 159-1. One or more of the programmable or non-programmable interconnects 361 or 364 of its inter-chip interconnects 371 may couple from each of its DPIIC chips 410 to the second HBM IC chip 251-2 of each of its operation modules 190. One or more of the programmable or non-programmable interconnects 361 or 364 of its inter-chip interconnects 371 may couple from each of its DPIIC chips 410 to each of the third HBM IC chips 251-3 of the second memory module 159-2 of each of its operation modules 190. One or more of the programmable or non-programmable interconnects 361 or 364 of its inter-chip interconnects 371 may couple from each of its DPIIC chips 410 to the others of its DPIIC chips 410. One or more of the programmable or non-programmable interconnects 361 or 364 of its inter-chip interconnects 371 may couple from each of its PCIC chips 269 to all of its first, second and third HBM IC chips 251-1, 251-2 and 251-3. One or more of the programmable or non-programmable interconnects 361 or 364 of its inter-chip interconnects 371 may couple from one of its PCIC chips 269 to one of its first HBM IC chips 251-1 next to said one of its PCIC chips 269 and compose a data bus between said one of its PCIC chips 269 and said one of its first HBM IC chips 251-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from one of its PCIC chips 269 to each of the third HBM IC chips 251-3 of its first memory module 159-1 next to said one of its PCIC chips 269 and compose a data bus between said one of its PCIC chips 269 and said each of the third HBM IC chips 251-3 of its first memory module 159-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from each of its PCIC chips 269 to its IAC chip 402. One or more of the programmable or non-programmable interconnects 361 or 364 of its inter-chip interconnects 371 may couple from each of its PCIC chips 269 to its NVM IC chip 250. One or more of the programmable or non-programmable interconnects 361 or 364 of its inter-chip interconnects 371 may couple from its NVM IC chip 250 to its IAC chip 402. One or more of the programmable or non-programmable interconnects 361 or 364 of its inter-chip interconnects 371 may couple from its NVM IC chip 250 to all of its first, second and third HBM IC chips 251-1, 251-2 and 251-3. One or more of the programmable or non-programmable interconnects 361 or 364 of its inter-chip interconnects 371 may couple from its IAC chip 402 to all of its first, second and third HBM IC chips 251-1, 251-2 and 251-3. One or more of the programmable or non-programmable interconnects 361 or 364 of its inter-chip interconnects 371 may couple from its IAC chip 402 to its first and/or second memory modules 159-1 and/or 159-2. One or more of the programmable or non-programmable interconnects 361 or 364 of its inter-chip interconnects 371 may couple from each of its first, second and third HBM IC chips 251-1, 251-2 and 251-3 to the others of its first, second and third HBM IC chips 251-1, 251-2 and 251-3. One or more of the programmable or non-programmable interconnects 361 or 364 of its inter-chip interconnects 371 may couple from one of its PCIC chips 269 to the other of its PCIC chips 269.

Accordingly, referring to FIG. 10A, for the first type of standard commodity logic drive 300, the standard commodity FPGA IC chip 200 of a first one of its operation modules 190 may have a first one of the programmable logic cells (LC) 2014, as illustrated in FIG. 6A, to transmit the output Dout of the first one of the programmable logic cells (LC) 2014 to one of the inputs A0-A1 of a second one of the programmable logic cells (LC) 2014, as illustrated in FIG. 6A, of the standard commodity FPGA IC chip 200 of a second one of its operation modules 190 through one of the cross-point switches 379 of one of its DPIIC chips 410. The output Dout of the first one of the programmable logic cells (LC) 2014 may be passed to said one of the inputs A0-A1 of the second one of the programmable logic cells (LC) 2014 through, in sequence, (1) the programmable interconnects 361 of the intra-chip interconnects 502 of the standard commodity FPGA IC chip 200 of the first one of its operation modules 190, (2) a first group of programmable interconnects 361 of its inter-chip interconnects 371, (3) a first group of programmable interconnects 361 of the intra-chip interconnects of said one of its DPIIC chips 410, (4) said one of the cross-point switches 379 of said one of its DPIIC chips 410, (5) a second group of programmable interconnects 361 of the intra-chip interconnects of said one of its DPIIC chips 410, (6) a second group of programmable interconnects 361 of its inter-chip interconnects 371 and (7) the programmable interconnects 361 of the intra-chip interconnects 502 of the standard commodity FPGA IC chip 200 of the second one of its operation modules 190.

Alternatively, referring to FIGS. 10A, for the first type of standard commodity logic drive 300, the standard commodity FPGA IC chip 200 of one of its operation modules 190 may have a first one of the programmable logic cells (LC) 2014, as illustrated in FIG. 6A, to transmit the output Dout of the first one of the programmable logic cells (LC) 2014 to one of the inputs A0-A1 of a second one of the programmable logic cells (LC) 2014, as illustrated in FIG. 6A, of the standard commodity FPGA IC chip 200 of said one of its operation modules 190 through one of the cross-point switches 379 of one of its DPIIC chips 410. The output Dout of the first one of the programmable logic cells (LC) 2014 may be passed to one of the inputs A0-A1 of the second one of the programmable logic cells (LC) 2014 through, in sequence, (1) a first group of programmable interconnects 361 of the intra-chip interconnects 502 of the standard commodity FPGA IC chip 200 of said one of its operation modules 190, (2) a first group of programmable interconnects 361 of its inter-chip interconnects 371, (3) a first group of programmable interconnects 361 of the intra-chip interconnects of said one of its DPIIC chips 410, (4) said one of the cross-point switches 379 of said one of its DPIIC chips 410, (5) a second group of programmable interconnects 361 of the intra-chip interconnects of said one of its DPIIC chips 410, (6) a second group of programmable interconnects 361 of its inter-chip interconnects 371 and (7) a second group of programmable interconnects 361 of the intra-chip interconnects 502 of the standard commodity FPGA IC chip 200 of said one of its operation modules 190.

Referring to FIG. 10A, the first type of standard commodity logic drive 300 may include multiple dedicated control and input/output (I/O) chips 265 in a peripheral region thereof surrounding a central region thereof having its NVM IC chip 250, IAC chip 402, PCIC chips 269, first HBM IC chips 251-1, DPIIC chips 410, first memory module 159-1 and operation modules 190 located therein. For the first type of standard commodity logic drive 300, one or more of the programmable or non-programmable interconnects 361 or 364 of its inter-chip interconnects 371 may couple from the standard commodity FPGA IC chip 200 of each of its operation modules 190 to all of its dedicated control and input/output (I/O) chips 265. One or more of the programmable or non-programmable interconnects 361 or 364 of its inter-chip interconnects 371 may couple from each of its DPIIC chips 410 to all of its dedicated control and input/output (I/O) chips 265. One or more of the programmable or non-programmable interconnects 361 or 364 of its inter-chip interconnects 371 may couple from its NVM IC chip 250 to all of its dedicated control and input/output (I/O) chips 265. One or more of the programmable or non-programmable interconnects 361 or 364 of its inter-chip interconnects 371 may couple from its IAC chip 402 to all of its dedicated control and input/output (I/O) chips 265. One or more of the programmable or non-programmable interconnects 361 or 364 of its inter-chip interconnects 371 may couple from each of its PCIC chips 269 to all of its dedicated control and input/output (I/O) chips 265. One or more of the programmable or non-programmable interconnects 361 or 364 of its inter-chip interconnects 371 may couple from each of its first, second and third HBM IC chips 251-1, 251-2 and 251-3 to all of its dedicated control and input/output (I/O) chips 265. One or more of the programmable or non-programmable interconnects 361 or 364 of its inter-chip interconnects 371 may couple from each of its dedicated control and input/output (I/O) chips 265 to the others of its dedicated control and input/output (I/O) chips 265. One or more of the programmable or non-programmable interconnects 361 or 364 of its inter-chip interconnects 371 may couple from each of its first and/or second memory modules 159-1 and/or 159-2 to all of its dedicated control and input/output (I/O) chips 265.

Referring to FIG. 10A, for the first type of standard commodity logic drive 300, the standard commodity FPGA IC chip 200 of each of its operation modules 190 may be referred to one as illustrated in FIGS. 8A and 8B and each of its DPIIC chips 410 may be referred to one as illustrated in FIG. 9. Its IAC chip 402 may include intellectual property (IP) circuits, application specific (AS) circuits, analog circuits, mixed-mode signal circuits, radio-frequency (RF) circuits and/or transmitter, receiver, transceiver circuits. Its NVM IC chip 250 may be a NAND flash chip. Data stored in its NVM IC chip 250 may be kept even if the first type of standard commodity logic drive 300 is powered off. Alternatively, its NVM IC chip 250 may be a Non-Volatile Radom-Access-Memory (NVRAM) IC chip. The NVRAM may be a Ferroelectric RAM (FRAM), Magnetoresistive RAM (MRAM), or Phase-change RAM (PRAM). Its NVM IC chip 250 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits.

Referring to FIG. 10A, for the first type of standard commodity logic drive 300, the voltage Vcc of power supply for each of its dedicated control and input/output (I/O) chips 265 may be greater than or equal to 1.5V, 2.0V, 2.5V, 3V, 3.5V, 4V, or 5V, while the voltage Vcc of power supply for the standard commodity FPGA IC chip 200 of each of its operation modules 190 and for its DPIIC chips 410 may be between 0.2V and 2.5V, between 0.2V and 2V, between 0.2V and 1.5V, between 0.1V and 1V, or between 0.2V and 1V, or smaller or lower than or equal to 2.5V, 2V, 1.8V, 1.5V or 1V. The gate oxide (physical) thickness of the Field-Effect-Transistors (FETs) of each of its control and input/output (I/O) chips 265 may be thicker than or equal to 5 nm, 6 nm, 7.5 nm, 10 nm, 12.5 nm, or 15 nm, while the gate oxide (physical) thickness of FETs of the standard commodity FPGA IC chip 200 of each of its operation modules 190 and of its DPIIC chips 410 may be thinner than 4.5 nm, 4 nm, 3 nm or 2 nm.

Referring to FIG. 10A, for the first type of standard commodity logic drive 300, each of its dedicated control and input/output (I/O) chips 265 may be designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in each of its dedicated control and input/output (I/O) chips 265 is 1, 2, 3, 4, 5 or greater than 5 nodes or generations older, more matured or less advanced than that used in the standard commodity FPGA IC chip 200 of each of its operation modules 190 and each of its DPIIC chips 410. Transistors or semiconductor devices used in each of its dedicated control and input/output (I/O) chips 265 may be a Fully Depleted Silicon-on-insulator (FDSOI) MOSFET, a Partially Depleted Silicon-on-insulator (PDSOI) MOSFET or a conventional MOSFET.

Referring to FIG. 10A, for the first type of standard commodity logic drive 300, each of its PCIC chips 269 may be designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one generation or node less advanced than or one generation or node more advanced than that used for the standard commodity FPGA IC chip 200 of each of its operation modules 190 and each of its DPIIC chips 410. Transistors or semiconductor devices used in its PCIC chip 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Referring to FIG. 10A, for the first type of standard commodity logic drive 300, each of its dedicated control and input/output (I/O) chip(s) 165 may arrange a plurality of large I/O circuits 341 and I/O pads 272 as seen in FIG. 5A to employ one or multiple (2, 3, 4, or more than 4) Universal Serial Bus (USB) ports, one or more IEEE 1394 ports, one or more Ethernet ports, one or more HDMI ports, one or more VGA ports, one or more audio ports or serial ports, for example, RS-232 or COM (communication) ports, wireless transceiver I/Os, and/or Bluetooth transceiver I/Os, and etc. Further, each of its dedicated control and input/output (I/O) chips 165 may have a plurality of large I/O circuits 341 and I/O pads 272 as seen in FIG. 5A to employ Serial Advanced Technology Attachment (SATA) ports, or Peripheral Components Interconnect express (PCIe) ports to communicate, connect or couple with a memory device.

II. Second Type of Standard Commodity Logic Drive

Figure 10B:
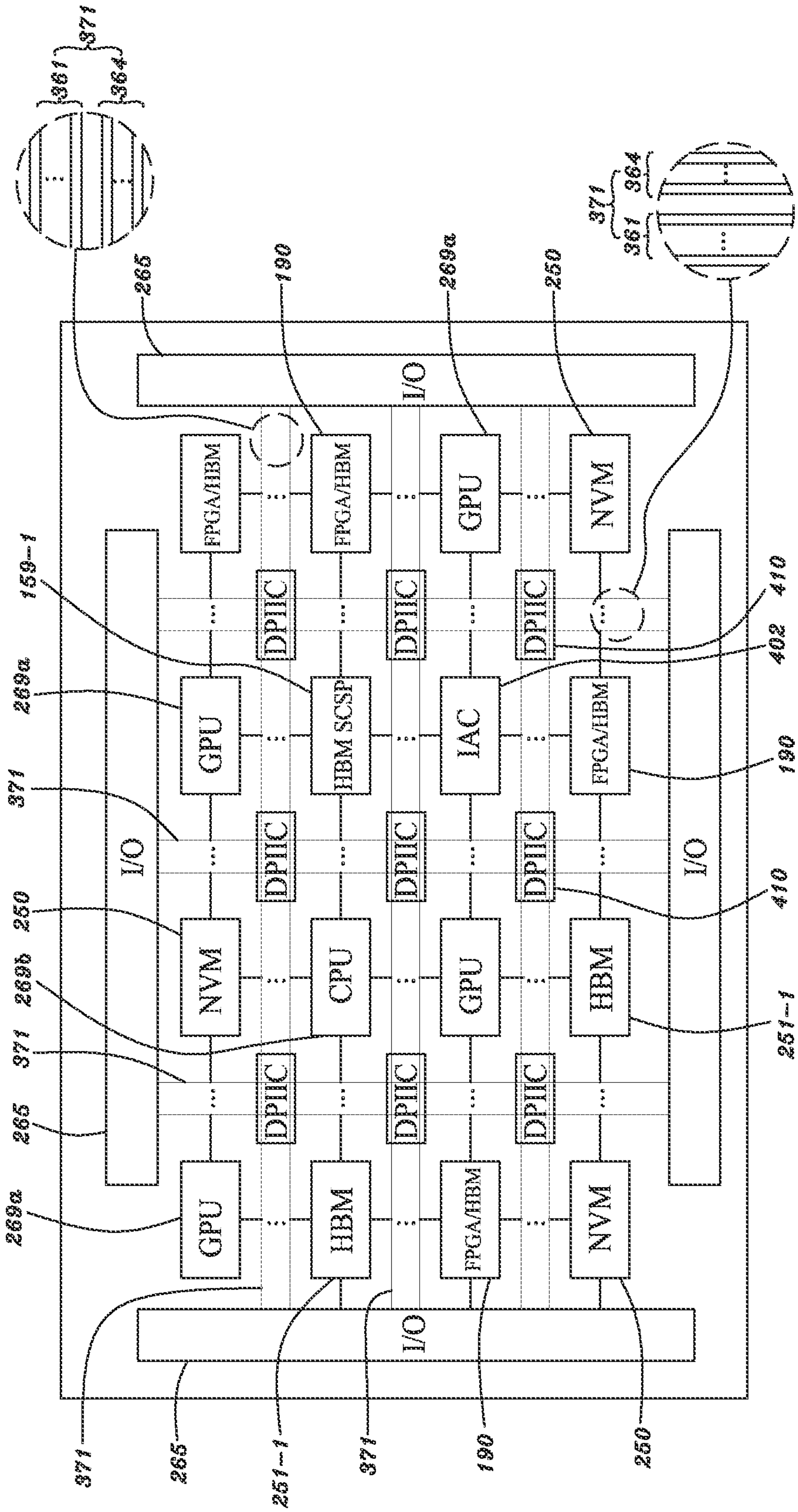

FIG. 10B is a schematically top view showing arrangement for various chips packaged in a second type of standard commodity logic drive in accordance with an embodiment of the present application. For an element indicated by the same reference number shown in FIGS. 10A and 10B, the specification of the element as seen in FIG. 10B and the process for forming the same may be referred to that of the element as illustrated in FIG. 10A and the process for forming the same.

Referring to FIG. 10B, a second type of standard commodity logic drive 300 may be packaged with multiple GPU chips 269*a* and a CPU chip 269*b* for the PCIC chips 269 as above mentioned. Further, the second type of standard commodity logic drive 300 may be packaged with multiple first high-bitwidth-memory (HBM) integrated-circuit (IC) chips 251-1 each arranged next to one of the GPU chips 269*a* for communication with said one of the GPU chips 269*a* in a high speed, high bandwidth and wide bitwidth. The second type of standard commodity logic drive 300 may be further packaged with an operation module 190 as seen in FIG. 18E-18H or 20E-20H therein. For the operation module 190 of the second type of standard commodity logic drive 300, a standard commodity FPGA IC chip 200 as illustrated in FIGS. 8A and 8B is provided at a bottom thereof, and a second high bandwidth memory (HBM) IC chip 251-2 or a second memory module 159-2 as seen in FIG. 15A or 15B may be provided over its standard commodity FPGA IC chip 200, and thereby its standard commodity FPGA IC chip 200 may operate with its second HBM IC chip 251-2 or multiple third HBM IC chips 251-3 of its second memory module 159-2 for high speed, high bandwidth, wide bitwidth parallel processing and/or parallel computing. A data bus between its standard commodity FPGA IC chip 200 and its second HBM IC chip 251-2, or each of the third HBM IC chips 251-3 of its second memory module 159-2, may have a data bit width of equal to or greater than 64, 128, 256, 512, 1024, 2048, 4096, 8K, or 16K.

Referring to FIG. 10B, the second type of standard commodity logic drive 300 may be further packaged with a plurality of NVM IC chips 250 configured to store the resulting values or programming codes in a non-volatile manner for programming the programmable logic cells (LC) 2014 or cross-point switches 379 of the standard commodity FPGA IC chip 200 of each of its operation modules 190, as illustrated in FIGS. 6A-6D, 7, 8A and 8B. The resulting values and programming codes stored in its NVM IC chips 250 may be passed to and stored in the memory cells 490 and 362 of the standard commodity FPGA IC chip 200 of each of its operation modules 190. The second type of standard commodity logic drive 300 may be further packaged with a first memory module 159-1 as illustrated in FIG. 15A or 15B, configured to be access by one of its GPU chips 269*a*, its CPU chip 269*b* and the standard commodity FPGA IC chip 200 of one of its operation modules 190 next to its first memory module 159-1 for signal transmission in a high bandwidth or bitwidth.

Referring to FIG. 10B, the second type of standard commodity logic drive 300 may include multiple inter-chip interconnects 371 each extending under spaces between neighboring two of its NVM IC chips 250, IAC chip 402, GPU chips 269*a*, CPU chip 269*b*, first HBM IC chips 251, first memory module 159-1 and operation modules 190. The second type of standard commodity logic drive 300 may include a plurality of DPIIC chip 410 as illustrated in FIG. 9 each aligned with a cross of a vertical bundle of its inter-chip interconnects 371 and a horizontal bundle of its inter-chip interconnects 371.

Referring to FIG. 10B, for the second type of standard commodity logic drive 300, each of its inter-chip interconnects 371 may be a non-programmable interconnect 364 for programing one or more of the memory cells 362 and 490 of the standard commodity FPGA IC chip 200 of one of its operation modules 190 or one or more of the memory cells 362 of one of its DPIIC chip 410, or a programmable interconnect 361 configured to be programmed by one or more of the memory cells 362 of the standard commodity FPGA IC chip 200 of one of its operation modules 190 or one or more of the memory cells 362 of one of its DPIIC chip 410. Signal transmission may be built (1) between one of the programmable interconnects 361 of its inter-chip interconnects 371 and one of the programmable interconnects 361 of the intra-chip interconnects 371 of the standard commodity FPGA IC chip 200 of one of its operation modules 190 via one of the small input/output (I/O) circuits 203 of the standard commodity FPGA IC chip 200 of said one of its operation modules 190, and (2) between one of the programmable interconnects 361 of its inter-chip interconnects 371 and one of the programmable interconnects 361 of the intra-chip interconnects of one of its DPIIC chips 410 via one of the small input/output (I/O) circuits 203 of said one of its DPIIC chips 410. Signal transmission may be built (1) between one of the non-programmable interconnects 364 of its inter-chip interconnects 371 and one of the non-programmable interconnects 364 of the intra-chip interconnects 502 of the standard commodity FPGA IC chip 200 of one of its operation modules 190 via one of the small input/output (I/O) circuits 203 of the standard commodity FPGA IC chip 200 of said one of its operation modules 190, and (2) between one of the non-programmable interconnects 364 of its inter-chip interconnects 371 and one of the non-programmable interconnects 364 of the intra-chip interconnects of one of its DPIIC chips 410 via one of the small input/output (I/O) circuits 203 of said one of its DPIIC chips 410. For the second type of standard commodity logic drive 300, its NVM IC chips 250 are configured to store the programming codes in a non-volatile manner for programming the cross-point switches 379 of its DPIIC chips 410, as illustrated in FIGS. 7 and 9. The programming codes stored in its NVM IC chips 250 may be passed to and stored in the memory cells 362 of its DPIIC chips 410.

Referring to FIG. 10B, for the second type of standard commodity logic drive 300, one or more of the programmable or non-programmable interconnects 361 or 364 of its inter-chip interconnects 371 may couple from the standard commodity FPGA IC chip 200 of each of its operation modules 190 to all of its DPIIC chips 410. One or more of the programmable or non-programmable interconnects 361 or 364 of its inter-chip interconnects 371 may couple from the standard commodity FPGA IC chip 200 of each of its operation modules 190 to its IAC chip 402. One or more of the programmable or non-programmable interconnects 361 or 364 of its inter-chip interconnects 371 may couple from the standard commodity FPGA IC chip 200 of each of its operation modules 190 to all of its NVM IC chips 250. One or more of the programmable or non-programmable interconnects 361 or 364 of its inter-chip interconnects 371 may couple from the standard commodity FPGA IC chip 200 of each of its operation modules 190 to all of its GPU chips 269*a*. One or more of the programmable or non-programmable interconnects 361 or 364 of its inter-chip interconnects 371 may couple from the standard commodity FPGA IC chip 200 of each of its operation modules 190 to its CPU chip 269*b*. One or more of the programmable or non-programmable interconnects 361 or 364 of its inter-chip interconnects 371 may couple from the standard commodity FPGA IC chip 200 of one of its operation modules 190 to one of its first HBM IC chips 251-1 next to the standard commodity FPGA IC chip 200 of said one of its operation modules 190 and compose a data bus between the standard commodity FPGA IC chip 200 of said one of its operation modules 190 and said one of its first HBM IC chips 251-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from the standard commodity FPGA IC chip 200 of one of its operation modules 190 to each of the third HBM IC chips 251-3 of its first memory module 159-1 next to said one of its operation modules 190 and compose a data bus between the standard commodity FPGA IC chip 200 of said one of its operation modules 190 and said each of the third HBM IC chips 251-3 of its first memory module 159-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from the standard commodity FPGA IC chip 200 of one of its operation modules 190 to the standard commodity FPGA IC chip 200 of each of the others of its operation modules 190. One or more of the programmable or non-programmable interconnects 361 or 364 of its inter-chip interconnects 371 may couple from each of its DPIIC chips 410 to its IAC chip 402. One or more the programmable or non-programmable interconnects 361 or 364 of its inter-chip interconnects 371 may couple from each of its DPIIC chips 410 to all of its NVM IC chips 250. One or more of the programmable or non-programmable interconnects 361 or 364 of its inter-chip interconnects 371 may couple from each of its DPIIC chips 410 to all of its GPU chips 269*a*. One or more of the programmable or non-programmable interconnects 361 or 364 of its inter-chip interconnects 371 may couple from each of its DPIIC chips 410 to its CPU chip 269*b*. One or more of the programmable or non-programmable interconnects 361 or 364 of its inter-chip interconnects 371 may couple from each of its DPIIC chips 410 to both of its first HBM IC chips 251-1. One or more of the programmable or non-programmable interconnects 361 or 364 of its inter-chip interconnects 371 may couple from each of its DPIIC chips 410 to each of the third HBM IC chips 251-3 of its first memory module 159-1. One or more of the programmable or non-programmable interconnects 361 or 364 of its inter-chip interconnects 371 may couple from each of its DPIIC chips 410 to the second HBM IC chip 251-2 of each of its operation modules 190. One or more of the programmable or non-programmable interconnects 361 or 364 of its inter-chip interconnects 371 may couple from each of its DPIIC chips 410 to all of the third HBM IC chips 251-3 of the second memory module 159-2 of each of its operation modules 190. One or more of the programmable or non-programmable interconnects 361 or 364 of its inter-chip interconnects 371 may couple from each of its DPIIC chips 410 to the others of its DPIIC chips 410. One or more of the programmable or non-programmable interconnects 361 or 364 of its inter-chip interconnects 371 may couple from its CPU chip 269*b* to all of its GPU chips 269*a*. One or more of the programmable or non-programmable interconnects 361 or 364 of its inter-chip interconnects 371 may couple from its CPU chip 269*b* to all of its NVM IC chips 250. One or more of the programmable or non-programmable interconnects 361 or 364 of its inter-chip interconnects 371 may couple from its CPU chip 269*b* to all of its first, second and third HBM IC chips 251-1, 251-2 and 251-3. One or more of the programmable or non-programmable interconnects 361 or 364 of its inter-chip interconnects 371 may couple from its CPU chip 269*b* to one of its first HBM IC chips 251-1 next to its CPU chip 269*b* and composes a data bus between its CPU chip 269*b* and said one of its first HBM IC chips 251-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from its CPU chip 269*b* to each of the third HBM IC chips 251-3 of its first memory module 159-1 next to its CPU chip 269*b* and compose a data bus between its CPU chip 269*b* and said each of the third HBM IC chips 251-3 of its first memory module 159-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from each of its GPU chips 269*a* to all of its first, second and third HBM IC chips 251-1, 251-2 and 251-3. One or more of the programmable or non-programmable interconnects 361 or 364 of its inter-chip interconnects 371 may couple from one of its GPU chips 269*a* to one of its first HBM IC chips 251-1 next to said one of its GPU chips 269*a* and composes a data bus between said one of its GPU chips 269*a* and said one of its first HBM IC chips 251-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from one of its GPU chips 269*a* to each of the third HBM IC chips 251-3 of its first memory module 159-1 next to said one of its GPU chips 269*a* and compose a data bus between said one of its GPU chips 269*a* and said each of the third HBM IC chips 251-3 of its first memory module 159-1 having a data bit width of equal to or greater than 64, 128, 256, 512, 1024, 2048, 4096, 8K, or 16K. One or more of the programmable or non-programmable interconnects 361 or 364 of its inter-chip interconnects 371 may couple from each of its GPU chips 269*a* to all of its NVM IC chips 250. One or more of the programmable or non-programmable interconnects 361 or 364 of its inter-chip interconnects 371 may couple from each of its GPU chips 269*a* to the others of its GPU chips 269*a*. One or more of the programmable or non-programmable interconnects 361 or 364 of its inter-chip interconnects 371 may couple from each of its NVM IC chips 250 to its IAC chip 402. One or more of the programmable or non-programmable interconnects 361 or 364 of its inter-chip interconnects 371 may couple from its IAC chip 402 to all of its first, second and third HBM IC chips 251-1, 251-2 and 251-3. One or more of the programmable or non-programmable interconnects 361 or 364 of its inter-chip interconnects 371 may couple from each of its first and/or second memory modules 159-1 and/or 159-2 to its IAC chip 402. One or more of the programmable or non-programmable interconnects 361 or 364 of its inter-chip interconnects 371 may couple from each of its GPU chips 269*a* to its IAC chip 402. One or more of the programmable or non-programmable interconnects 361 or 364 of its inter-chip interconnects 371 may couple from its CPU chip 269*b* to its IAC chip 402. One or more of the programmable or non-programmable interconnects 361 or 364 of its inter-chip interconnects 371 may couple from each of its NVM IC chips 250 to all of its first, second and third HBM IC chips 251-1, 251-2 and 251-3. One or more of the programmable or non-programmable interconnects 361 or 364 of its inter-chip interconnects 371 may couple from each of its NVM IC chips 250 to all of its first and/or second memory modules 159-1 and/or 159-2. One or more of the programmable or non-programmable interconnects 361 or 364 of its inter-chip interconnects 371 may couple from each of its NVM IC chips 250 to the others of its NVM IC chips 250. One or more of the programmable or non-programmable interconnects 361 or 364 of its inter-chip interconnects 371 may couple from each of its first, second and third HBM IC chips 251-1, 251-2 and 251-3 to the others of its first, second and third HBM IC chips 251-1, 251-2 and 251-3.

Referring to FIG. 10B, the second type of standard commodity logic drive 300 may include multiple dedicated control and input/output (I/O) chips 265 in a peripheral region thereof surrounding a central region thereof having its NVM IC chips 250, IAC chip 402, GPU chips 269*a*, CPU chip 269*b*, first HBM IC chips 251-1, DPIIC chips 410, first memory module 159-1 and operation modules 190 located therein. For the second type of standard commodity logic drive 300, one or more of the programmable or non-programmable interconnects 361 or 364 of its inter-chip interconnects 371 may couple from the standard commodity FPGA IC chip 200 of each of its operation modules 190 to all of the dedicated control and input/output (I/O) chips 265. One or more of the programmable or non-programmable interconnects 361 or 364 of its inter-chip interconnects 371 may couple from each of its DPIIC chips 410 to all of its dedicated control and input/output (I/O) chips 265. One or more of the programmable or non-programmable interconnects 361 or 364 of its inter-chip interconnects 371 may couple from each of its NVM IC chips 250 to all of its dedicated control and input/output (I/O) chips 265. One or more of the programmable or non-programmable interconnects 361 or 364 of its inter-chip interconnects 371 may couple from its IAC chip 402 to all of its dedicated control and input/output (I/O) chips 265. One or more of the programmable or non-programmable interconnects 361 or 364 of its inter-chip interconnects 371 may couple from each of its GPU chips 269*a* to all of its dedicated control and input/output (I/O) chips 265. One or more of the programmable or non-programmable interconnects 361 or 364 of its inter-chip interconnects 371 may couple from its CPU chip 269*b* to all of its dedicated control and input/output (I/O) chips 265. One or more of the programmable or non-programmable interconnects 361 or 364 of its inter-chip interconnects 371 may couple from each of its first, second and third HBM IC chips 251-1, 251-2 and 251-3 to all of its dedicated control and input/output (I/O) chips 265. One or more of the programmable or non-programmable interconnects 361 or 364 of its inter-chip interconnects 371 may couple from each of its first and/or second memory modules 159-1 and/or 159-2 to all of its dedicated control and input/output (I/O) chips 265.

Figure 10C:
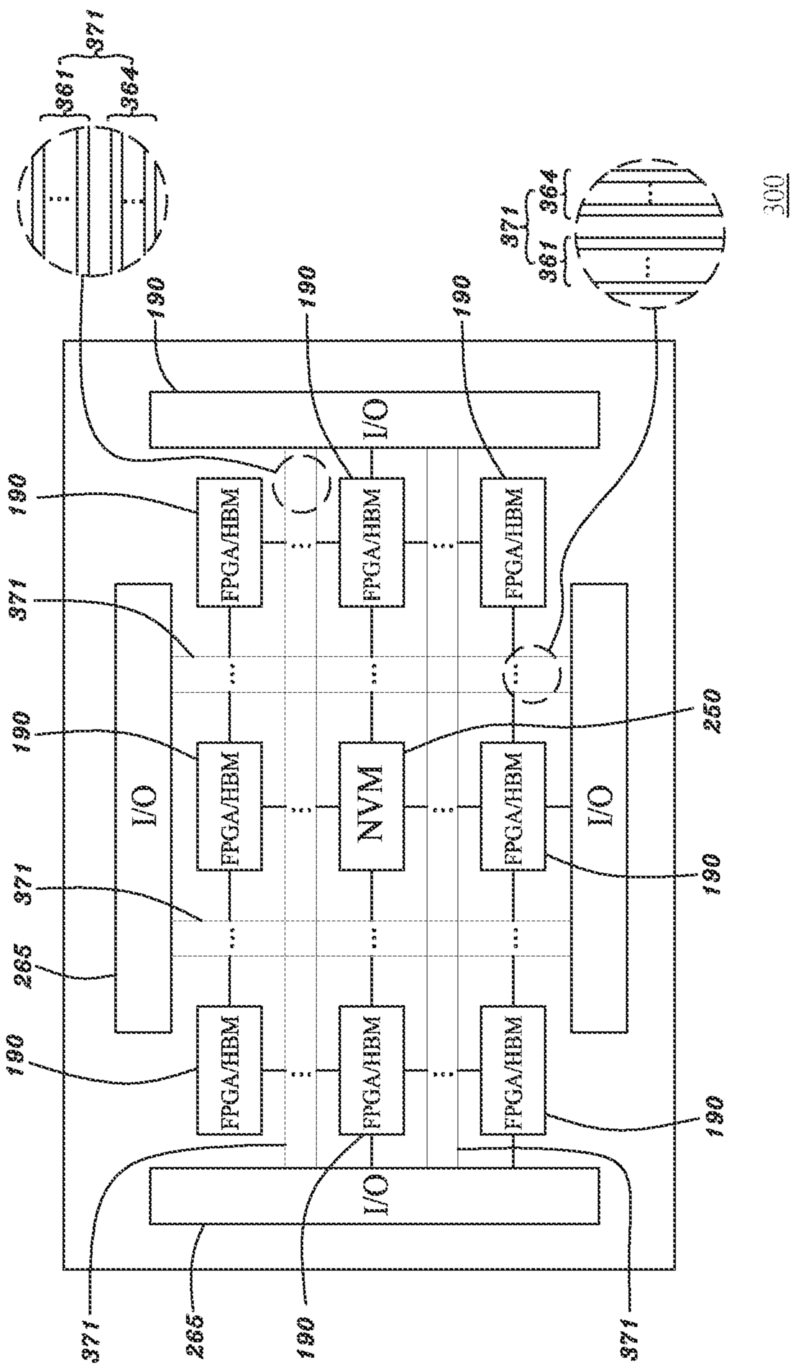

Referring to FIG. 10B, for the second type of standard commodity logic drive 300, the standard commodity FPGA IC chip 200 of each of its operation modules 190 may be referred to one as illustrated in FIGS. 8A and 8B, and each of its DPIIC chips 410 may be referred to one as illustrated in FIG. 9. Its IAC chip 402 may include intellectual property (IP) circuits, application specific (AS) circuits, analog circuits, mixed-mode signal circuits, radio-frequency (RF) circuits and/or transmitter, receiver, transceiver circuits. Each of its NVM IC chip 250 may be a NAND flash chip. Data stored in its NVM IC chips 250 may be kept even if the second type of standard commodity logic drive 300 is powered off. Alternatively, each of its NVM IC chips 250 may be a Non-Volatile Radom-Access-Memory (NVRAM) IC chip. The NVRAM may be a Ferroelectric RAM (FRAM), Magnetoresistive RAM (MRAM), or Phase-change RAM (PRAM). Each of its NVM IC chips 250 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. III. Third Type of Standard Commodity Logic Drive III. Third Type of Standard Commodity Logic Drive FIG. 10C is a schematically top view showing arrangement for various chips packaged in a third type of standard commodity logic drive in accordance with an embodiment of the present application. For an element indicated by the same reference number shown in FIGS. 10A-10C, the specification of the element as seen in FIG. 10C and the process for forming the same may be referred to that of the element as illustrated in FIG. 10A or 10B and the process for forming the same.

Referring to FIG. 10C, a third type of standard commodity logic drive 300 may be packaged with an NVM IC chip 250 and multiple operation modules 190 each as seen in FIG. 18E-18H or 20E-20H arranged in an array, wherein its NVM IC chip 250 is surrounded by its operation modules 190. For the operation module 190 of the third type of standard commodity logic drive 300, a standard commodity FPGA IC chip 200 as illustrated in FIGS. 8A and 8B is provided at a bottom thereof, and a second high bandwidth memory (HBM) IC chip 251-2 or a second memory module 159-2 as seen in FIG. 15A or 15B may be provided over its standard commodity FPGA IC chip 200, and thereby its standard commodity FPGA IC chip 200 may operate with its second HBM IC chip 251-2 or multiple third HBM IC chips 251-3 of its second memory module 159-2 for high speed, high bandwidth, wide bitwidth parallel processing and/or parallel computing. A data bus between its standard commodity FPGA IC chip 200 and its second HBM IC chip 251-2, or each of the third HBM IC chips 251-3 of its second memory module 159-2, may have a data bit width of equal to or greater than 64, 128, 256, 512, 1024, 2048, 4096, 8K, or 16K.

Referring to FIG. 10C, for the third type of standard commodity logic drive 300, its NVM IC chip 250 is configured to store the resulting values and programming codes in a non-volatile manner for programming the programmable logic cells (LC) 2014 and cross-point switches 379 of the standard commodity FPGA IC chip 200 of each of its operation modules 190, as illustrated in FIGS. 6A-6D, 7, 8A and 8B. The resulting values and programming codes stored in its NVM IC chip 250 may be passed to and stored in the memory cells 490 and 362 of the standard commodity FPGA IC chip 200 of each of its operation modules 190.

Referring to FIG. 10C, the third type of standard commodity logic drive 300 may include multiple inter-chip interconnects 371 each extending under spaces between neighboring two of its operation modules 190. For the third type of standard commodity logic drive 300, each of its inter-chip interconnects 371 may be a non-programmable interconnect 364 for programing one or more of the memory cells 362 and 490 of the standard commodity FPGA IC chip 200 of one of its operation modules 190, or a programmable interconnect 361 configured to be programmed by one or more of the memory cells 362 of the standard commodity FPGA IC chip 200 of one of its operation modules 190. Signal transmission may be built (1) between one of the programmable interconnects 361 of its inter-chip interconnects 371 and one of the programmable interconnects 361 of the intra-chip interconnects 371 of the standard commodity FPGA IC chip 200 of one of its operation modules 190 via one of the small input/output (I/O) circuits 203 of the standard commodity FPGA IC chip 200 of said one of its operation modules 190. Signal transmission may be built (1) between one of the non-programmable interconnects 364 of its inter-chip interconnects 371 and one of the non-programmable interconnects 364 of the intra-chip interconnects 502 of the standard commodity FPGA IC chip 200 of one of its operation modules 190 via one of the small input/output (I/O) circuits 203 of the standard commodity FPGA IC chip 200 of said one of its operation modules 190.

Referring to FIG. 10C, for the third type of standard commodity logic drive 300, one or more of the programmable or non-programmable interconnects 361 or 364 of its inter-chip interconnects 371 may couple from the standard commodity FPGA IC chip 200 of one of its operation modules 190 to the standard commodity FPGA IC chip 200 of each of the others of its operation modules 190. One or more of the programmable or non-programmable interconnects 361 or 364 of its inter-chip interconnects 371 may couple from the standard commodity FPGA IC chip 200 of one of its operation modules 190 to all of the third HBM IC chips 251-3 of the second memory module 159-2, or the second HBM IC chip 251-2, of each of the others of its operation modules 190. One or more of the programmable or non-programmable interconnects 361 or 364 of its inter-chip interconnects 371 may couple from each of the third HBM IC chips 251-3 of the second memory module 159-2, or the second HBM IC chip 251-2, of one of its operation modules 190 to all of the third HBM IC chips 251-3 of the second memory module 159-2, or the second HBM IC chip 251-2, of each of the others of its operation modules 190. One or more of the programmable or non-programmable interconnects 361 or 364 of its inter-chip interconnects 371 may couple from the standard commodity FPGA IC chip 200 of each of its operation modules 190 to its NVM IC chip 250. One or more of the programmable or non-programmable interconnects 361 or 364 of its inter-chip interconnects 371 may couple from each of the third HBM IC chips 251-3 of the second memory module 159-2, or the second HBM IC chip 251-2, of each of its operation modules 190 to its NVM IC chip 250.

Referring to FIG. 10C, the third type of standard commodity logic drive 300 may include multiple dedicated control and input/output (I/O) chips 265 in a peripheral region thereof surrounding a central region thereof having its operation modules 190 and NVM IC chip 250 located therein. For the third type of standard commodity logic drive 300, one or more of the programmable or non-programmable interconnects 361 or 364 of its inter-chip interconnects 371 may couple from the standard commodity FPGA IC chip 200 of each of its operation modules 190 to all of the dedicated control and input/output (I/O) chips 265. One or more of the programmable or non-programmable interconnects 361 or 364 of its inter-chip interconnects 371 may couple from each of the third HBM IC chips 251-3 of the second memory module 159-2, or the second HBM IC chip 251-2, of each of its operation modules 190 to all of the dedicated control and input/output (I/O) chips 265.

Referring to FIG. 10C, for the third type of standard commodity logic drive 300, the standard commodity FPGA IC chip 200 of each of its operation modules 190 may be referred to one as illustrated in FIGS. 8A and 8B. Its NVM IC chip 250 may be a NAND flash chip. Data stored in its NVM IC chip 250 may be kept even if the third type of standard commodity logic drive 300 is powered off. Alternatively, its NVM IC chip 250 may be a Non-Volatile Radom-Access-Memory (NVRAM) IC chip. The NVRAM may be a Ferroelectric RAM (FRAM), Magnetoresistive RAM (MRAM), or Phase-change RAM (PRAM).

Referring to FIG. 10C, one or more of the programmable interconnects 361 of its inter-chip interconnects 371 may couple one or more of the small I/O circuits 203 of each of its dedicated control and input/output (I/O) chips 265 to one or more of the small I/O circuits 203 of the standard commodity FPGA IC chip 200 of each of its operation modules 190. One or more of the non-programmable interconnects 364 of the inter-chip interconnects 371 may couple one or more of the small I/O circuits 203 of each of its dedicated control and input/output (I/O) chips 265 to one or more of the small I/O circuits 203 of the standard commodity FPGA IC chip 200 of each of its operation modules 190. One or more of the programmable interconnects 361 of its inter-chip interconnects 371 may couple one or more of the small I/O circuits 203 of the standard commodity FPGA IC chip 200 of each of its operation modules 190 to one or more of the small I/O circuits 203 of the standard commodity FPGA IC chip 200 of another of its operation modules 190. One or more of the non-programmable interconnects 364 of its inter-chip interconnects 371 may couple one or more of the small I/O circuits 203 of the standard commodity FPGA IC chip 200 of each of its operation modules 190 to one or more of the small I/O circuits 203 of the standard commodity FPGA IC chip 200 of another of the others of its operation modules 190. One or more of the non-programmable interconnects 364 of its inter-chip interconnects 371 may couple one or more of the large I/O circuits 341 of each of its dedicated control and input/output (I/O) chips 265 to one or more of the large I/O circuits 341 of another of its dedicated control and input/output (I/O) chips 265. One or more of the large I/O circuits 341 of each of its dedicated control and input/output (I/O) chips 265 may couple to the external circuitry outside the third type of standard commodity logic drive 300.

IV. Fourth Type of Standard Commodity Logic Drive

Figure 10D:
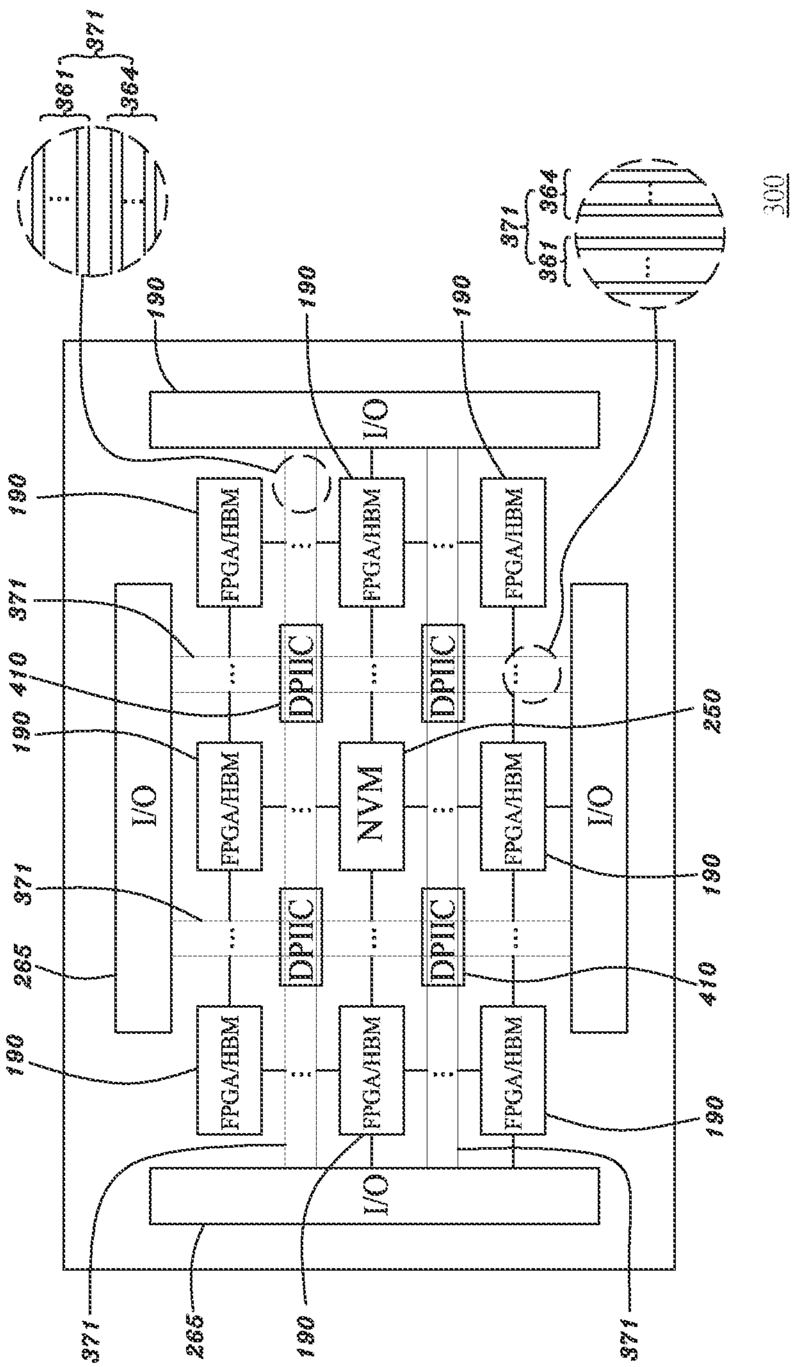

FIG. 10D is a schematically top view showing arrangement for various chips packaged in a fourth type of standard commodity logic drive in accordance with an embodiment of the present application. For an element indicated by the same reference number shown in FIGS. 10A-10D, the specification of the element as seen in FIG. 10D and the process for forming the same may be referred to that of the element as illustrated in FIG. 10A, 10B or 10C and the process for forming the same. The third and fourth types of standard commodity logic drive 300 as seen in FIGS. 10C and 10D respectively are similar to each other, and the specification for the fourth type of standard commodity logic drive 300 may be referred to that for the third type of standard commodity logic drive 300. The difference between the third and fourth types of standard commodity logic drive 300 as seen in FIGS. 10C and 10D respectively is that the fourth type of standard commodity logic drive 300 may further include a plurality of dedicated-programmable-interconnection (DPI) integrated-circuit (IC) chips 410 as illustrated in FIG. 9 each aligned with a cross of a vertical bundle of its inter-chip interconnects 371 and a horizontal bundle of its inter-chip interconnects 371.

Referring to FIG. 10A, for the fourth type of standard commodity logic drive 300, each of its inter-chip interconnects 371 may be a non-programmable interconnect 364 for programing one or more of the memory cells 362 and 490 of the standard commodity FPGA IC chip 200 of one of its operation modules 190 or one or more of the memory cells 362 of one of its DPIIC chips 410, or a programmable interconnect 361 configured to be programmed by one or more of the memory cells 362 of the standard commodity FPGA IC chip 200 of one of its operation modules 190 or one or more of the memory cells 362 of one of its DPIIC chips 410. Signal transmission may be further built between one of the programmable interconnects 361 of its inter-chip interconnects 371 and one of the programmable interconnects of the intra-chip interconnects of one of its DPIIC chips 410 via one of the small input/output (I/O) circuits 203 of said one of its DPIIC chips 410. Signal transmission may be further built between one of the non-programmable interconnects 364 of its inter-chip interconnects 371 and one of the non-programmable interconnects of the intra-chip interconnects of one of its DPIIC chips 410 via one of the small input/output (I/O) circuits 203 of said one of its DPIIC chips 410. For the fourth type of standard commodity logic drive 300, its NVM IC chip 250 is configured to store the programming codes in a non-volatile manner for programming the cross-point switches 379 of its DPIIC chips 410, as illustrated in FIGS. 7 and 9. The programming codes stored in its NVM IC chip 250 may be passed to and stored in the memory cells 362 of its DPIIC chips 410.

Referring to FIG. 10D, for the fourth type of standard commodity logic drive 300, one or more of the programmable or non-programmable interconnects 361 or 364 of its inter-chip interconnects 371 may couple from the standard commodity FPGA IC chip 200 of each of its operation modules 190 to all of its DPIIC chips 410. One or more of the programmable or non-programmable interconnects 361 or 364 of its inter-chip interconnects 371 may couple from each of its DPIIC chips 410 to its NVM IC chip 250. One or more of the programmable or non-programmable interconnects 361 or 364 of its inter-chip interconnects 371 may couple from each of its DPIIC chips 410 to the others of its DPIIC chips 410. One or more of the programmable or non-programmable interconnects 361 or 364 of its inter-chip interconnects 371 may couple from each of its DPIIC chips 410 to all of the third HBM IC chips 251-3 of the second memory module 159-2, or the second HBM IC chip 251-2, of each of its operation modules 190. One or more of the programmable or non-programmable interconnects 361 or 364 of its inter-chip interconnects 371 may couple from each of its DPIIC chips 410 to all of its dedicated control and input/output (I/O) chips 265.

Referring to FIG. 10D, for the fourth type of standard commodity logic drive 300, the standard commodity FPGA IC chip 200 of each of its operation modules 190 may be referred to one as illustrated in FIGS. 8A and 8B and each of its DPIIC chips 410 may be referred to one as illustrated in FIG. 9. Its NVM IC chip 250 may be a NAND flash chip. Data stored in its NVM IC chip 250 may be kept even if the first type of standard commodity logic drive 300 is powered off. Alternatively, its NVM IC chip 250 may be a Non-Volatile Radom-Access-Memory (NVRAM) IC chip. The NVRAM may be a Ferroelectric RAM (FRAM), Magnetoresistive RAM (MRAM), or Phase-change RAM (PRAM).

Interconnection for Standard Commodity Logic Drive

Figure 11:
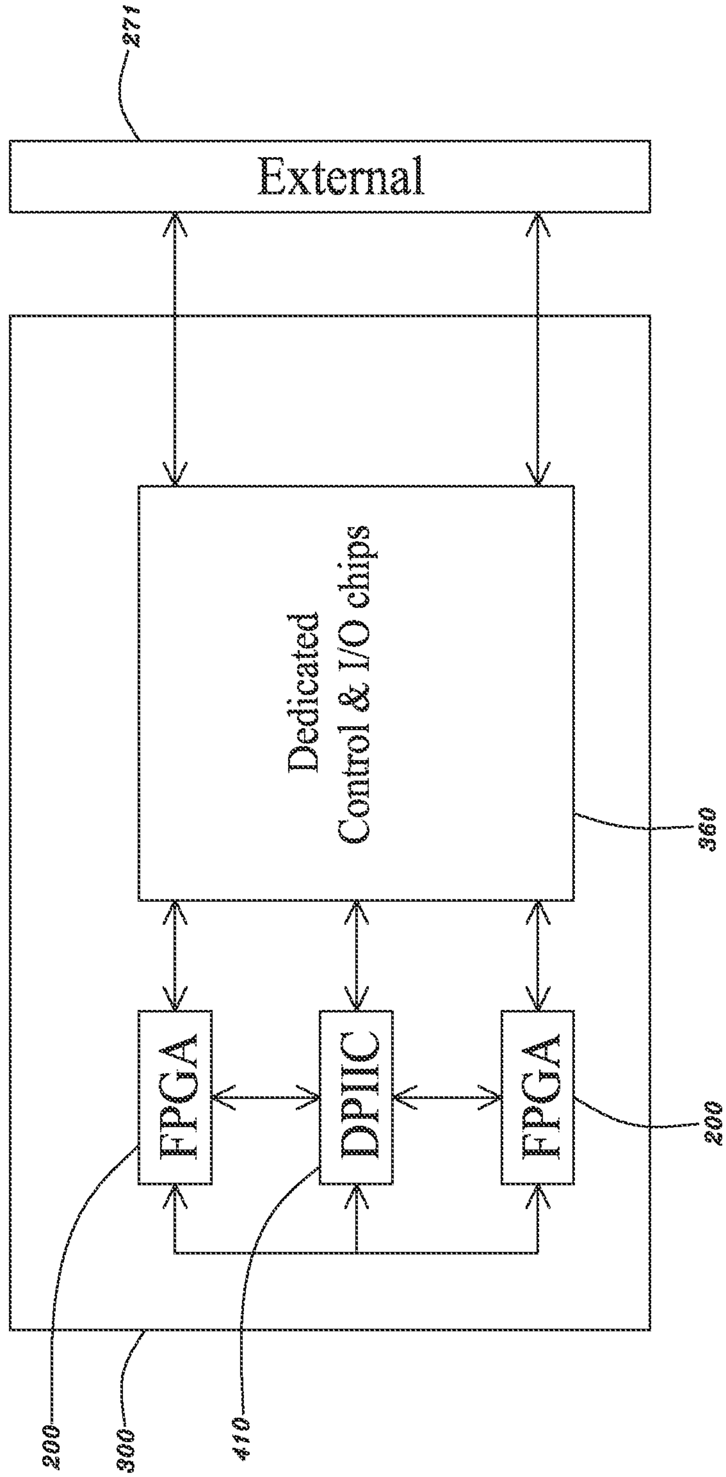
FIG. 11 is a block diagram showing interconnection between chips in a standard commodity logic drive in accordance with an embodiment of the present application.

FIG. 11 is a block diagram showing interconnection between chips in a standard commodity logic drive in accordance with an embodiment of the present application. Referring to FIG. 11, each of two blocks 200 may be a combination of the standard commodity FPGA IC chip(s) 200 of one or more of the operation modules 190 of the first, second or fourth type of standard commodity logic drive 300 illustrated in FIG. 10A, 10B or 10D; a block 410 may be a combination of the DPIIC chips 410 in the first, second or fourth type of standard commodity logic drive 300 illustrated in FIG. 10A, 10B or 10D; a block 360 may be a combination of the dedicated control and input/output (I/O) chips 265 in the first, second or fourth type of standard commodity logic drive 300 illustrated in FIG. 10A, 10B or 10D.

Referring to FIG. 11, for each of the first, second and fourth types of standard commodity logic drives 300 as illustrated in FIGS. 10A, 10B and 10D respectively, one or more of the programmable interconnects 361 of its inter-chip interconnects 371 may couple one or more of the small I/O circuits 203 of each of its dedicated control and input/output (I/O) chips 265 in the block 360 to one or more of the small I/O circuits 203 of the standard commodity FPGA IC chip 200 of one of its operation modules 190. One or more of the programmable interconnects 361 of its inter-chip interconnects 371 may couple one or more of the small I/O circuits 203 of each of its dedicated control and input/output (I/O) chips 265 in the block 360 to one or more of the small I/O circuits 203 of one of its DPIIC chips 410. One or more of the non-programmable interconnects 364 of the inter-chip interconnects 371 may couple one or more of the small I/O circuits 203 of each of its dedicated control and input/output (I/O) chips 265 in the block 360 to one or more of the small I/O circuits 203 of the standard commodity FPGA IC chip 200 of one of its operation modules 190. One or more of the non-programmable interconnects 364 of the inter-chip interconnects 371 may couple one or more of the small I/O circuits 203 of each of its dedicated control and input/output (I/O) chips 265 in the block 360 to one or more of the small I/O circuits 203 of one of its DPIIC chips 410.

Referring to FIG. 11, for each of the first, second and fourth types of standard commodity logic drives 300 as illustrated in FIGS. 10A, 10B and 10D respectively, one or more of the programmable interconnects 361 of its inter-chip interconnects 371 may couple one or more of the small I/O circuits 203 of each of its DPIIC chips 410 to one or more of the small I/O circuits 203 of the standard commodity FPGA IC chip 200 of one of its operation modules 190. One or more of the programmable interconnects 361 of its inter-chip interconnects 371 may couple one or more of the small I/O circuits 203 of each of its DPIIC chips 410 to one or more of the small I/O circuits 203 of another of its DPIIC chips 410. One or more of the non-programmable interconnects 364 of the inter-chip interconnects 371 may couple one or more of the small I/O circuits 203 of each of its DPIIC chips 410 to one or more of the small I/O circuits 203 of the standard commodity FPGA IC chip 200 of one of its operation modules 190. One or more of the non-programmable interconnects 364 of the inter-chip interconnects 371 may couple one or more of the small I/O circuits 203 of each of its DPIIC chips 410 to one or more of the small I/O circuits 203 of another of its DPIIC chips 410.

Referring to FIG. 11, for each of the first, second and fourth types of standard commodity logic drives 300 as illustrated in FIGS. 10A, 10B and 10D respectively, one or more of the programmable interconnects 361 of its inter-chip interconnects 371 may couple one or more of the small I/O circuits 203 of the standard commodity FPGA IC chip 200 of each of its operation modules 190 to one or more of the small I/O circuits 203 of the standard commodity FPGA IC chip 200 of another of its operation modules 190. One or more of the non-programmable interconnects 364 of its inter-chip interconnects 371 may couple one or more of the small I/O circuits 203 of the standard commodity FPGA IC chip 200 of each of its operation modules 190 to one or more of the small I/O circuits 203 of the standard commodity FPGA IC chip 200 of another of its operation modules 190.

Referring to FIG. 11, for each of the first, second and fourth types of standard commodity logic drives 300 as illustrated in FIGS. 10A, 10B and 10D respectively, one or more of the non-programmable interconnects 364 of its inter-chip interconnects 371 may couple one or more of the large I/O circuits 341 of each of its dedicated control and input/output (I/O) chips 265 in the block 360 to one or more of the large I/O circuits 341 of another of its dedicated control and input/output (I/O) chips 265. One or more of the large I/O circuits 341 of each of its dedicated control and input/output (I/O) chips 265 in the block 360 may couple to the external circuitry 271 outside the first, second or fourth type of standard commodity logic drive 300.

(1) Interconnection for Operation

Referring to FIG. 11, for each of the first, second and fourth types of standard commodity logic drives 300 as illustrated in FIGS. 10A, 10B and 10D respectively, the standard commodity FPGA IC chip 200 of each of its operation modules 190 may reload resulting values or first programming codes from its non-volatile memory (NVM) IC chip(s) 250 to the memory cells 490 of the standard commodity FPGA IC chip 200 of said each of its operation modules 190 via one or more of the non-programmable interconnects 364 of its intra-chip interconnects 502, and thereby the resulting values or first programming codes may be stored or latched in the memory cells 490 of the standard commodity FPGA IC chip 200 of said each of its operation modules 190 to program the programmable logic cells (LC) 2014 of the standard commodity FPGA IC chip 200 of said each of its operation modules 190 as illustrated in FIGS. 6A-6D, 8A and 8B. The standard commodity FPGA IC chip 200 of said each of its operation modules 190 may reload second programming codes from its non-volatile memory (NVM) IC chip(s) 250 to the memory cells 362 of the standard commodity FPGA IC chip 200 of said each of its operation modules 190 via one or more of the non-programmable interconnects 364 of its intra-chip interconnects 502, and thereby the second programming codes may be stored or latched in the memory cells 362 of the standard commodity FPGA IC chip 200 of said each of its operation modules 190 to program the pass/no-pass switches 258 or cross-point switches 379 of the standard commodity FPGA IC chip 200 of said each of its operation modules 190 as illustrated in FIGS. 2A-2C, 3A, 3B, 7, 8A and 8B. Each of its DPIIC chips 410 may reload third programming codes from its non-volatile memory (NVM) IC chip(s) 250 to the memory cells 362 of said each of its DPIIC chips 410, and thereby the third programming codes may be stored or latched in the memory cells 362 of said each of its DPIIC chips 410 to program the pass/no-pass switches 258 or cross-point switches 379 of said each of its DPIIC chips 410 as illustrated in FIGS. 2A-2C, 3A, 3B, 7 and 9.

Thereby, referring to FIG. 11, one of the dedicated control and input/output (I/O) chips 265 of the first, second or fourth type of standard commodity logic drive 300 illustrated in FIG. 10A, 10B or 10D may have one of its large I/O circuits 341 to drive data from the external circuitry 271 outside the first, second or fourth type of standard commodity logic drive 300 to one of its small I/O circuits 203. For said one of the dedicated control and input/output (I/O) chips 265, said one of its small I/O circuits 203 may drive the data to a first one of the small I/O circuits 203 of one of the DPIIC chips 410 of the first, second or fourth type of standard commodity logic drive 300 via one or more of the programmable interconnects 361 of the inter-chip interconnects 371 of the first, second or fourth type of standard commodity logic drive 300. For said one of the dedicated DPIIC chips 410, the first one of its small I/O circuits 203 may drive the data to one of its cross-point switches 379 via a first group of programmable interconnects 361 of its intra-chip interconnects; said one of its cross-point switches 379 may pass the data from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data to one of the small I/O circuits 203 of the standard commodity FPGA IC chip 200 of one of the operation modules 190 of the first, second or fourth type of standard commodity logic drive 300 via one or more of the programmable interconnects 361 of the inter-chip interconnects 371 of the first, second or fourth type of standard commodity logic drive 300. For the standard commodity FPGA IC chip 200 of said one of its operation modules 190, said one of its small I/O circuits 203 may drive the data to one of its cross-point switches 379 through a first group of programmable interconnects 361 of its intra-chip interconnects 502 as seen in FIGS. 2A-2C, 3A, 3B, 7, 8A and 8B; said one of its cross-point switches 379 may pass the data from the first group of programmable interconnects 361 of its intra-chip interconnects 502 to a second group of programmable interconnects 361 of its intra-chip interconnects 502 to be associated with a data input of the input data set, e.g., A0 and A1, of one of its programmable logic cells (LC) 2014 as seen in FIGS. 6A-6D, 8A and 8B.

Referring to FIG. 11, in another aspect, for the standard commodity FPGA IC chip 200 of a first one of the operation modules 190 of the first, second or fourth type of standard commodity logic drive 300, one of its programmable logic cells (LC) 2014 as seen in FIGS. 6A-6D, 8A and 8B may have the data output, e.g., Dout as seen in FIG. 6A, to be passed to one of its cross-point switches 379 via a first group of programmable interconnects 361 of its intra-chip interconnects 502; said one of its cross-point switches 379 may pass data associated with the data output, e.g., Dout, of said one of its programmable logic cells (LC) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data to a first one of the small I/O circuits 203 of one of the DPIIC chips 410 of the first, second or fourth type of standard commodity logic drive 300 via one or more of programmable interconnects 361 of the inter-chip interconnects 371 of the first, second or fourth type of standard commodity logic drive 300. For said one of the DPIIC chips 410, the first one of its small I/O circuits 203 may drive the data to one of its cross-point switches 379 via a first group of programmable interconnects 361 of its intra-chip interconnects; said one of its cross-point switches 379 may pass the data from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data to one of the small I/O circuits 203 of the standard commodity FPGA IC chip 200 of a second one of the operation modules 190 of the first, second or fourth type of standard commodity logic drive 300 via one or more of the programmable interconnects 361 of the inter-chip interconnects 371 of the first, second or fourth type of standard commodity logic drive 300. For the standard commodity FPGA IC chip 200 of the second one of its operation modules 190, said one of its small I/O circuits 203 may drive the data to one of its cross-point switches 379 through a first group of programmable interconnects 361 of its intra-chip interconnects 502; said one of its cross-point switches 379 may pass the data from the first group of programmable interconnects 361 of its intra-chip interconnects 502 to a second group of programmable interconnects 361 of its intra-chip interconnects 502 to be associated with a data input of the input data set, e.g., A0 and A1 as seen in FIG. 6A, of one of its programmable logic cells (LC) 2014 as seen in FIGS. 6A-6D, 8A and 8B.

Referring to FIG. 11, in another aspect, for the standard commodity FPGA IC chip 200 of one of the operation modules 190 of the first, second or fourth type of standard commodity logic drive 300, one of its programmable logic cells (LC) 2014 as seen in FIGS. 6A-6D, 8A and 8B may have the data output, e.g., Dout as seen in FIG. 6A, to be passed to one of its cross-point switches 379 via a first group of programmable interconnects 361 of its intra-chip interconnects 502; said one of its cross-point switches 379 may pass data associated with the data output, e.g., Dout, of said one of its programmable logic cells (LC) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data to a first one of the small I/O circuits 203 of one of the DPIIC chips 410 of the first, second or fourth type of standard commodity logic drive 300 via one or more of the programmable interconnects 361 of the inter-chip interconnects 371 of the first, second or fourth type of standard commodity logic drive 300. For said one of the DPIIC chips 410, the first one of its small I/O circuits 203 may drive the data to one of its cross-point switches 379 via a first group of programmable interconnects 361 of its intra-chip interconnects; said one of its cross-point switches 379 may pass the data from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data to one of the small I/O circuits 203 of one of the dedicated control and input/output (I/O) chips 265 of the first, second or fourth type of standard commodity logic drive 300 via one or more of programmable interconnects 361 of the inter-chip interconnects 371 of the first, second or fourth type of standard commodity logic drive 300. For said one of the dedicated control and input/output (I/O) chips 265, said one of its small I/O circuits 203 may drive the data to one of its large I/O circuits 341 to be passed to the external circuitry 271 outside the first, second or fourth type of standard commodity logic drive 300.

(3) Accessibility

Referring to FIG. 11, the external circuitry 271 outside the first, second or fourth type of standard commodity logic drive 300 may not be allowed to reload the resulting values and first, second and third programming codes from any of the NVM IC chip(s) 250 of the first, second or fourth type of standard commodity logic drive 300. Alternatively, the external circuitry 271 outside the first, second or fourth type of standard commodity logic drive 300 may be allowed to reload the resulting values and first, second and third programming codes from the NVM IC chip(s) 250 of the first, second or fourth type of standard commodity logic drive 300.

Data and Control Buses for Expandable Logic Scheme Based on Standard Commodity FPGA IC Chips and/or High Bandwidth Memory (HBM) IC Chips FIG. 12 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with an embodiment of the present application. Referring to FIG. 12, each of the first through third types of standard commodity logic drive 300 as seen in FIGS. 10A-10C may be provided with multiple control buses 416 each constructed from multiple of the programmable interconnects 361 of its inter-chip interconnects 371 or multiple of the non-programmable interconnects 364 of its inter-chip interconnects 371.

For example, in the arrangement as illustrated in FIGS. 8A and 8B, for each of the first through fourth types of standard commodity logic drives 300 as seen in FIGS. 10A-10D, one of its control buses 416 may couple the IS1 pads 231 of the standard commodity FPGA IC chips 200 of all of its operation modules 190 to each other or one another and to one of the small I/O circuits 203 of one of its dedicated control and input/output (I/O) circuits 265. Another of its control buses 416 may couple the IS2 pads 231 of the standard commodity FPGA IC chips 200 of all of its operation modules 190 to each other or one another and to another of the small I/O circuits 203 of said one of its dedicated control and input/output (I/O) circuits 265. Another of its control buses 416 may couple the IS3 pads 231 of the standard commodity FPGA IC chips 200 of all of its operation modules 190 to each other or one another and to another of the small I/O circuits 203 of said one of its dedicated control and input/output (I/O) circuits 265. Another of its control buses 416 may couple the IS4 pads 231 of the standard commodity FPGA IC chips 200 of all of its operation modules 190 to each other or one another and to another of the small I/O circuits 203 of said one of its dedicated control and input/output (I/O) circuits 265. Another of its control buses 416 may couple the OS1 pads 232 of the standard commodity FPGA IC chips 200 of all of its operation modules 190 to each other or one another and to another of the small I/O circuits 203 of said one of its dedicated control and input/output (I/O) circuits 265. Another of its control buses 416 may couple the OS2 pads 232 of the standard commodity FPGA IC chips 200 of all of its operation modules 190 to each other or one another and to another of the small I/O circuits 203 of said one of its dedicated control and input/output (I/O) circuits 265. Another of its control buses 416 may couple the OS3 pads 232 of the standard commodity FPGA IC chips 200 of all of its operation modules 190 to each other or one another and to another of the small I/O circuits 203 of said one of its dedicated control and input/output (I/O) circuits 265. Another of its control buses 416 may couple the OS4 pads 232 of the standard commodity FPGA IC chips 200 of all of its operation modules 190 to each other or one another and to another of the small I/O circuits 203 of said one of its dedicated control and input/output (I/O) circuits 265. Each of its control buses 416 may couple to the I/O pad 272 of one of the large I/O circuits 341 of said one of its dedicated control and input/output (I/O) circuits 265 as seen in FIG. 5A, for the connection to an external circuitry outside said each of the first through fourth types of standard commodity logic drives 300, through one of the small I/O circuits 203 of said one of its dedicated control and input/output (I/O) circuits 265.

Referring to FIG. 12, each of the first through fourth types of standard commodity logic drives 300 as seen in FIGS. 10A-10D may be provided with multiple chip-enable (CE) lines 417 each constructed from one or more of the programmable interconnects 361 of its inter-chip interconnects 371 or one or more of the non-programmable interconnects 364 of its inter-chip interconnects 371 to couple to the chip-enable (CE) pad 209 of the standard commodity FPGA IC chip 200 of one of its operation modules 190 as seen in FIGS. 8A and 8B and to another of the small I/O circuits 203 of said one of its dedicated control and input/output (I/O) circuits 265. Each of its chip-enable (CE) lines 417 may couple to the I/O pad 272 of one of the large I/O circuits 341 of said one of its dedicated control and input/output (I/O) circuits 265 as seen in FIG. 5A, for the connection to an external circuitry outside said each of the first through fourth types of standard commodity logic drives 300, through one of the small I/O circuits 203 of said one of its dedicated control and input/output (I/O) circuits 265.

Furthermore, referring to FIG. 12, each of the first through fourth types of standard commodity logic drives 300 as illustrated in FIGS. 10A-10D may be provided with a set of data buses 315 for use in an expandable interconnection scheme. In this case, for each of the first through fourth types of standard commodity logic drives 300 as illustrated in FIGS. 10A-10D, its set of data buses 315 may include four data bus subsets or data buses, e.g., 315A, 315B, 315C and 315D, each coupling to the small I/O circuits 203 of one of the I/O ports 377, e.g., I/O Port 1, I/O Port 2, I/O Port 3 and I/O Port 4, of the standard commodity FPGA IC chip 200 of each of its operation modules 190 as seen in FIGS. 8A and 8B and, alternatively, the small I/O circuits 203 of one of multiple I/O ports of each of its first high bandwidth memory (HBM) IC chips 251-1, and to a set of small I/O circuits 203 of said one of its dedicated control and input/output (I/O) circuits 265; that is, its data bus 315A couples to and is associated with the small I/O circuits 203 of one of the I/O ports 377, e.g., I/O Port 1, of the standard commodity FPGA IC chip 200 of each of its operation modules 190 and, alternatively, the small I/O circuits 203 of a first one of the I/O ports of each of its first high bandwidth memory (HBM) IC chips 251-1 or each of the third high bandwidth memory (HBM) IC chips 251-3 of its first memory module 159-1, and to a first set of small I/O circuits 203 of said one of its dedicated control and input/output (I/O) circuits 265; its data bus 315B couples to and is associated with the small I/O circuits 203 of one of the I/O ports 377, e.g., I/O Port 2, of the standard commodity FPGA IC chip 200 of each of its operation modules 190 and, alternatively, the small I/O circuits 203 of a second one of the I/O ports of each of its first high bandwidth memory (HBM) IC chips 251-1 or each of the third high bandwidth memory (HBM) IC chips 251-3 of its first memory module 159-1, and to a second set of small I/O circuits 203 of said one of its dedicated control and input/output (I/O) circuits 265; its data bus 315C couples to and is associated with the small I/O circuits 203 of one of the I/O ports 377, e.g., I/O Port 3, of the standard commodity FPGA IC chip 200 of each of its operation modules 190 and, alternatively, the small I/O circuits 203 of a third one of the I/O ports of each of its first high bandwidth memory (HBM) IC chips 251-1 or each of the third high bandwidth memory (HBM) IC chips 251-3 of its first memory module 159-1, and to a fourth set of small I/O circuits 203 of said one of its dedicated control and input/output (I/O) circuits 265; and its data bus 315D couples to and is associated with the small I/O circuits 203 of one of the I/O ports 377, e.g., I/O Port 4, of the standard commodity FPGA IC chip 200 of each of its operation modules 190 and, alternatively, the small I/O circuits 203 of a fourth one of the I/O ports of each of its first high bandwidth memory (HBM) IC chips 251-1 or each of the third high bandwidth memory (HBM) IC chips 251-3 of its first memory module 159-1, and to a fourth set of small I/O circuits 203 of said one of its dedicated control and input/output (I/O) circuits 265. Its data buses 315A may couple to the I/O pads 272 of a first set of large I/O circuits 341 of said one of its dedicated control and input/output (I/O) circuits 265 as seen in FIG. 5A, for the connection to an external circuitry outside said each of the first through fourth types of standard commodity logic drives 300, through the first set of small I/O circuits 203 of said one of its dedicated control and input/output (I/O) circuits 265 respectively. Its data buses 315B may couple to the I/O pads 272 of a second set of large I/O circuits 341 of said one of its dedicated control and input/output (I/O) circuits 265 as seen in FIG. 5A, for the connection to an external circuitry outside said each of the first through fourth types of standard commodity logic drives 300, through the second set of small I/O circuits 203 of said one of its dedicated control and input/output (I/O) circuits 265 respectively. Its data buses 315C may couple to the I/O pads 272 of a third set of large I/O circuits 341 of said one of its dedicated control and input/output (I/O) circuits 265 as seen in FIG. 5A, for the connection to an external circuitry outside said each of the first through fourth types of standard commodity logic drives 300, through the third set of small I/O circuits 203 of said one of its dedicated control and input/output (I/O) circuits 265 respectively. Its data buses 315D may couple to the I/O pads 272 of a fourth set of large I/O circuits 341 of said one of its dedicated control and input/output (I/O) circuits 265 as seen in FIG. 5A, for the connection to an external circuitry outside said each of the first through fourth types of standard commodity logic drives 300, through the fourth set of small I/O circuits 203 of said one of its dedicated control and input/output (I/O) circuits 265 respectively.

Each of its four data buses, e.g., 315A, 315B, 315C and 315D, may provide data transmission with bit width ranging from 4 to 256, such as 64 for a case. In this case, for each of the first through fourth types of standard commodity logic drives 300, each of its four data buses, e.g., 315A, 315B, 315C and 315D, may be composed of multiple data paths, having the number of 64 arranged in parallel, coupling respectively to the I/O pads 372, having the number of 64 arranged in parallel, of one of the I/O ports 377, e.g., I/O Port 1, I/O Port 2, I/O Port 3 and I/O Port 4, of the standard commodity FPGA IC chip 200 of each of its operation modules 190, wherein each of the data paths of said each of its four data buses, e.g., 315A, 315B, 315C and 315D, may be constructed from multiple of the programmable interconnects 361 of its inter-chip interconnects 371 or multiple of the non-programmable interconnects 364 of its inter-chip interconnects 371.

Furthermore, referring to FIG. 12, for each of the first through fourth types of standard commodity logic drives 300 as illustrated in FIGS. 10A-10D, each of its data buses 315 may pass data for the standard commodity FPGA IC chip 200 of each of its operation modules 190 and, alternatively, each of its first high bandwidth memory (HBM) IC chips 251-1 (only one is shown in FIG. 12). For example, in a third clock cycle, for each of the first through fourth types of standard commodity logic drives 300, the standard commodity FPGA IC chip 200 of a first one of its operation modules 190 may be selected in accordance with a logic level at the chip-enable pad 209 of the standard commodity FPGA IC chip 200 of the first one of its operation modules 190 to be enabled to pass data for the input operation of the standard commodity FPGA IC chip 200 of the first one of its operation modules 190, and the standard commodity FPGA IC chip 200 of a second one of its operation modules 190 may be selected in accordance with a logic level at the chip-enable pad 209 of the standard commodity FPGA IC chip 200 of the second one of its operation modules 190 to be enabled to pass data for the output operation of the standard commodity FPGA IC chip 200 of the second one of its operation modules 190. In the arrangement as illustrated in FIGS. 8A and 8B, for the standard commodity FPGA IC chip 200 of the first one of the operation modules 190 of each of the first through fourth types of standard commodity logic drives 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads; for the standard commodity FPGA IC chip 200 of the second one of the operation modules 190 of each of the first through fourth types of standard commodity logic drives 300, the same I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads.

Thereby, in the arrangement as illustrated in FIGS. 8A and 8B, in the third clock cycle, for each of the first through fourth types of standard commodity logic drives 300, the selected I/O port, e.g., I/O Port 1, of the standard commodity FPGA IC chip 200 of the second one of its operation modules 190 may have the small drivers 374 to drive or pass first data associated with the data output, e.g., Dout as seen in FIG. 6A, of one of the programmable logic cells (LC) 2014 of the standard commodity FPGA IC chip 200 of the second one of its operation modules 190, for example, to a first one, e.g., 315A, of its data buses 315 and the small receivers 375 of the selected I/O port, e.g., I/O Port 1, of the standard commodity FPGA IC chip 200 of the first one of its operation modules 190 may receive the first data to be associated with a data input of the input data set, e.g., A0 and A1 as seen in FIG. 6A, of one of the programmable logic cells (LC) 2014 of the standard commodity FPGA IC chip 200 of the first one of its operation modules 190, for example, from the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the standard commodity FPGA IC chip 200 of the second one of its operation modules 190 to the small receiver 375 of one of the small I/O circuits 203 of the selected I/O port, e.g., I/O Port 1, of the standard commodity FPGA IC chip 200 of the first one of its operation modules 190.

Furthermore, referring to FIG. 12, in the third clock cycle, for the second, third or fourth type of standard commodity logic drive 300 as seen in FIG. 10B, 10C or 10D, the standard commodity FPGA IC chip 200 of a third one of its operation modules 190 may be selected in accordance with a logic level at the chip-enable pad 209 of the standard commodity FPGA IC chip 200 of the third one of its operation modules 190 to be enabled to pass data for the input operation of the standard commodity FPGA IC chip 200 of the third one of its operation modules 190. In the arrangement as illustrated in FIGS. 8A and 8B, for the standard commodity FPGA IC chip 200 of the third one of the operation modules 190 of the second, third or fourth type of standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 8A and 8B, in the third clock cycle, for the second, third or fourth type of standard commodity logic drive 300, the small receivers 375 of the selected I/O port, e.g., I/O Port 1, of the standard commodity FPGA IC chip 200 of the third one of its operation modules 190 may receive the first data to be associated with a data input of the input data set, e.g., A0 and A1 as seen in FIG. 6A, of one of the programmable logic cells (LC) 2014 of the standard commodity FPGA IC chip 200 of the third one of its operation modules 190, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the standard commodity FPGA IC chip 200 of the third one of its operation modules 190. For the standard commodity FPGA IC chip 200 of the other(s) of its operation modules 190 of the second, third or fourth type of standard commodity logic drive 300, the small driver and receiver 374 and 375 of each of the small I/O circuits 203 of one of its I/O ports 377, e.g. I/O Port 1, coupling to the first one, e.g., 315A, of the data buses 315 of the second, third or fourth type of standard commodity logic drive 300 may be disabled and inhibited.

Referring to FIG. 12, in the third clock cycle, for each of the first high bandwidth memory (HBM) IC chips 251-1 of the first or second type of standard commodity logic drive 300, the small driver and receiver 374 and 375 of each of the small I/O circuits 203 of one of its I/O ports, e.g. first I/O port, coupling to the first one, e.g., 315A, of the data buses 315 of the first or second type of standard commodity logic drive 300 may be disabled and inhibited.

Furthermore, referring to FIG. 12, in the third clock cycle, in the arrangement as illustrated in FIGS. 8A and 8B, for the standard commodity FPGA IC chip 200 of the first one of the operation modules 190 of each of the first through fourth types of standard commodity logic drives 300 as illustrated in FIGS. 10A-10C, an I/O port, e.g. I/O Port 2, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads; for the standard commodity FPGA IC chip 200 of the second one of its operation modules 190, the same I/O port, e.g. I/O Port 2, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads. Thereby, in the arrangement as illustrated in FIGS. 8A and 8B, in the third clock cycle, for each of the first through fourth types of standard commodity logic drives 300 as illustrated in FIGS. 10A-10C, the selected I/O port, e.g., I/O Port 2, of the standard commodity FPGA IC chip 200 of the first one of its operation modules 190 may have the small drivers 374 to drive or pass second data associated with the data output, e.g., Dout as seen in FIG. 6A, of said one of the programmable logic cells (LC) 2014 of the standard commodity FPGA IC chip 200 of the first one of its operation modules 190, for example, to a second one, e.g., 315B, of its data buses 315 and the small receivers 375 of the selected I/O port, e.g., I/O Port 2, of the standard commodity FPGA IC chip 200 of the second one of its operation modules 190 may receive the second data to be associated with a data input of the input data set, e.g., A0 and A1 as seen in FIG. 6A, of said one of the programmable logic cells (LC) 2014 of the standard commodity FPGA IC chip 200 of the second one of its operation modules 190, for example, from the second one, e.g., 315B, of its data buses 315. The second one, e.g., 315B, of its data buses 315 may have the data paths each coupling the small driver 374 of one of the small I/O circuits 203 of the selected I/O port, e.g., I/O Port 2, of the standard commodity FPGA IC chip 200 of the first one of its operation modules 190 to the small receiver 375 of one of the small I/O circuits 203 of the selected I/O port, e.g., I/O Port 2, of the standard commodity FPGA IC chip 200 of the second one of its operation modules 190. For example, said one of the programmable logic cells (LC) 2014 of the standard commodity FPGA IC chip 200 of the first one of its operation modules 190 may be programmed to perform logic operation for multiplication.

Further, referring to FIG. 12, in a fourth clock cycle, for the first or second type of standard commodity logic drive 300 as seen in FIG. 10A or 10B, the standard commodity FPGA IC chip 200 of the first one of its operation modules 190 may be selected in accordance with the logic level at the chip-enable pad 209 of the standard commodity FPGA IC chip 200 of the first one of its operation modules 190 to be enabled to pass data for the input operation of the standard commodity FPGA IC chip 200 of the first one of its operation modules 190. In the arrangement as illustrated in FIGS. 8A and 8B, for the standard commodity FPGA IC chip 200 of the first one of the operation modules 190 of the first or second type of standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Further, in the fourth clock cycle, for the first or second type of standard commodity logic drive 300, a first one of its first high bandwidth memory (HBM) IC chips 251-1 may be selected to be enabled to pass data for an output operation of the first one of its first high bandwidth memory (HBM) IC chips 251-1. For the first one of the first high bandwidth memory (HBM) IC chips 251-1 of the first or second type of standard commodity logic drive 300, its first I/O port may be selected from its I/O ports, e.g., first, second, third and fourth I/O ports, to enable the small drivers 374 of the small I/O circuits 203 of its selected I/O port, e.g. first I/O port, in accordance with logic levels at its output-selection pads, and to inhibit the small receivers 375 of the small I/O circuits 203 of its selected I/O port, e.g. first I/O port, in accordance with logic levels at its input-selection pads. Thereby, in the arrangement as illustrated in FIGS. 8A and 8B, in the fourth clock cycle, for the first or second type of standard commodity logic drive 300, the selected I/O port, e.g., first I/O port, of the first one of its first high bandwidth memory (HBM) IC chips 251-1 may have the small drivers 374 to drive or pass third data to the first one, e.g., 315A, of its data buses 315 and the small receivers 375 of the selected I/O port, e.g., I/O Port 1, of the standard commodity FPGA IC chip 200 of the first one of its operation modules 190 may receive the third data to be associated with a data input of the input data set, e.g., A0 and A1 as seen in FIG. 6A, of said one of the programmable logic cells (LC) 2014 of the standard commodity FPGA IC chip 200 of the first one of its operation modules 190, for example, from the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the first one of its first high bandwidth memory (HBM) IC chips 251-1 to the small receiver 375 of one of the small I/O circuits 203 of the selected I/O port, e.g., I/O Port 1, of the standard commodity FPGA IC chip 200 of the first one of its operation modules 190.

Furthermore, referring to FIG. 12, in the fourth clock cycle, for the first or second type of standard commodity logic drive 300, the standard commodity FPGA IC chip 200 of the second one of its operation modules 190 may be selected in accordance with a logic level at the chip-enable pad 209 of the standard commodity FPGA IC chip 200 of the second one of its operation modules 190 to be enabled to pass data for the input operation of the standard commodity FPGA IC chip 200 of the second one of its operation modules 190. In the arrangement as illustrated in FIGS. 8A and 8B, for the standard commodity FPGA IC chip 200 of the second one of the operation modules 190 of the first or second type of standard commodity logic drive 300, the same I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 8A and 8B, in the fourth clock cycle, for the first or second type of standard commodity logic drive 300, the small receivers 375 of the selected I/O port, e.g., I/O Port 1, of the standard commodity FPGA IC chip 200 of the second one of its operation modules 190 may receive the third data to be associated with a data input of the input data set, e.g., A0 and A1 as seen in FIG. 6A, of said one of the programmable logic cells (LC) 2014 of the standard commodity FPGA IC chip 200 of the second one of its operation modules 190, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the standard commodity FPGA IC chip 200 of the second one of its operation modules 190.

Referring to FIG. 12, for the standard commodity FPGA IC chip 200 of each of the others of its operation modules 190 of the second type of standard commodity logic drive 300, the small driver and receiver 374 and 375 of each of the small I/O circuits 203 of one of its I/O ports 377, e.g. I/O Port 1, coupling to the first one, e.g., 315A, of the data buses 315 of the second type of standard commodity logic drive 300 may be disabled and inhibited.

Referring to FIG. 12, for the other of the first high bandwidth memory (HBM) IC chips 251-1 of the first or second type of standard commodity logic drive 300, the small driver and receiver 374 and 375 of each of the small I/O circuits 203 of one of its I/O ports, e.g. first I/O port, coupling to the first one, e.g., 315A, of the data buses 315 of the first or second type of standard commodity logic drive 300 may be disabled and inhibited.

Further, referring to FIG. 12, in a fifth clock cycle, for the first or second type of standard commodity logic drive 300 as seen in FIG. 10A or 10B, the standard commodity FPGA IC chip 200 of the first one of its operation modules 190 may be selected in accordance with a logic level at the chip-enable pad 209 of the standard commodity FPGA IC chip 200 of the first one of its operation modules 190 to be enabled to pass data for the output operation of the standard commodity FPGA IC chip 200 of the first one of its operation modules 190. In the arrangement as illustrated in FIGS. 8A and 8B, for the standard commodity FPGA IC chip 200 of the first one of the operation modules 190 of the first or second type of standard commodity logic drive 300, an I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Further, in the fifth clock cycle, for the first or second type of standard commodity logic drive 300, the first one of its first high bandwidth memory (HBM) IC chips 251-1 may be selected to be enabled to pass data for an input operation of the first one of its first high bandwidth memory (HBM) IC chips 251-1. For the first one of the first high bandwidth memory (HBM) IC chips 251-1 of the first or second type of standard commodity logic drive 300, its first I/O port may be selected from its I/O ports, e.g., first, second, third and fourth I/O ports, to activate the small receivers 375 of the small I/O circuits 203 of its selected I/O port, e.g. first I/O port, in accordance with logic levels at its input-selection pads, and to disable the small drivers 374 of the small I/O circuits 203 of its selected I/O port, e.g. first I/O port, in accordance with logic levels at its output-selection pads. Thereby, in the arrangement as illustrated in FIGS. 8A and 8B, in the fifth clock cycle, for the first or second type of standard commodity logic drive 300, the selected I/O port, e.g., first I/O port, of the first one of its first high bandwidth memory (HBM) IC chips 251-1 may have the small receivers 375 to receive fourth data from the first one, e.g., 315A, of its data buses 315 and the small drivers 374 of the selected I/O port, e.g., I/O Port 1, of the standard commodity FPGA IC chip 200 of the first one of its operation modules 190 may drive or pass the fourth data associated with the data output, e.g., Dout as seen in FIG. 6A, of said one of the programmable logic cells (LC) 2014 of the standard commodity FPGA IC chip 200 of the first one of its operation modules 190, for example, to the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the standard commodity FPGA IC chip 200 of the first one of its operation modules 190 to the small receiver 375 of one of the small I/O circuits 203 of the selected I/O port, e.g., first I/O port, of the first one of its first high bandwidth memory (HBM) IC chips 251-1.

Furthermore, referring to FIG. 12, in the fifth clock cycle, for the first or second type of standard commodity logic drive 300 as seen in FIG. 10A or 10B, the standard commodity FPGA IC chip 200 of the second one of its operation modules 190 may be selected in accordance with a logic level at the chip-enable pad 209 of the standard commodity FPGA IC chip 200 of the second one of its operation modules 190 to be enabled to pass data for the input operation of the standard commodity FPGA IC chip 200 of the second one of its operation modules 190. In the arrangement as illustrated in FIGS. 8A and 8B, for the standard commodity FPGA IC chip 200 of the second one of the operation modules 190 of the first or second type of standard commodity logic drive 300, the same I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 8A and 8B, in the fifth clock cycle, for the first or second type of standard commodity logic drive 300, the small receivers 375 of the selected I/O port, e.g., I/O Port 1, of the standard commodity FPGA IC chip 200 of the second one of its operation modules 190 may receive the fourth data to be associated with a data input of the input data set, e.g., A0 and A1 as seen in FIG. 6A, of said one of the programmable logic cells (LC) 2014 of the standard commodity FPGA IC chip 200 of the second one of its operation modules 190, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the standard commodity FPGA IC chip 200 of the second one of its operation modules 190.

For the standard commodity FPGA IC chip 200 of each of the others of the operation modules 190 of the second type of standard commodity logic drive 300, the small driver and receiver 374 and 375 of each of the small I/O circuits 203 of one of its I/O ports 377, e.g. I/O Port 1, coupling to the first one, e.g., 315A, of the data buses 315 of the second type of standard commodity logic drive 300 may be disabled and inhibited.

For the other of the first high bandwidth memory (HBM) IC chips 251-1 of the first or second type of standard commodity logic drive 300, the small driver and receiver 374 and 375 of each of the small I/O circuits 203 of one of its I/O ports, e.g. first I/O port, coupling to the first one, e.g., 315A, of the data buses 315 of the first or second type of standard commodity logic drive 300 may be disabled and inhibited.

Further, referring to FIG. 12, in a sixth clock cycle, for the first or second type of standard commodity logic drive 300 as seen in FIG. 10A or 10B, the first one of its first high bandwidth memory (HBM) IC chips 251-1 may be selected to be enabled to pass data for an input operation of the first one of its first high bandwidth memory (HBM) IC chips 251-1. For the first one of the first high bandwidth memory (HBM) IC chips 251-1 of the first or second type of standard commodity logic drive 300, its first I/O port may be selected from its I/O ports, e.g., first, second, third and fourth I/O ports, to activate the small receivers 375 of the small I/O circuits 203 of its selected I/O port, e.g. first I/O port, in accordance with logic levels at its input-selection pads, and to disable the small drivers 374 of the small I/O circuits 203 of its selected I/O port, e.g. first I/O port, in accordance with logic levels at its output-selection pads. Further, in the sixth clock cycle, for the first or second type of standard commodity logic drive 300, a second one of its first high bandwidth memory (HBM) IC chips 251-1 may be selected to be enabled to pass data for an output operation of the second one of its first high bandwidth memory (HBM) IC chips 251-1. For the second one of the first high bandwidth memory (HBM) IC chips 251-1 of the first or second type of standard commodity logic drive 300, its first I/O port may be selected from its I/O ports, e.g., first, second, third and fourth I/O ports, to enable the small drivers 374 of the small I/O circuits 203 of its selected I/O port, e.g. first I/O port, in accordance with logic levels at its output-selection pads, and to inhibit the small receivers 375 of the small I/O circuits 203 of its selected I/O port, e.g. first I/O port, in accordance with logic levels at its input-selection pads. Thereby, in the sixth clock cycle, for the first or second type of standard commodity logic drive 300, the selected I/O port, e.g., first I/O port, of the first one of its first high bandwidth memory (HBM) IC chips 251-1 may have the small receivers 375 to receive fifth data from the first one, e.g., 315A, of its data buses 315 and the selected I/O port, e.g., first I/O port, of the second one of its first high bandwidth memory (HBM) IC chips 251-1 may have the small drivers 374 to drive or pass the fifth data to the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the second one of its first high bandwidth memory (HBM) IC chips 251-1 to the small receiver 375 of one of the small I/O circuits 203 of the selected I/O port, e.g., first I/O port, of the first one of its first high bandwidth memory (HBM) IC chips 251-1. For the standard commodity FPGA IC chip 200 of each of the operation modules 190 of the first or second type of standard commodity logic drive 300, the small driver and receiver 374 and 375 of each of the small I/O circuits 203 of one of its I/O ports 377, e.g. I/O Port 1, coupling to the first one, e.g., 315A, of its data buses 315 may be disabled and inhibited.

Architecture of Programming and Operation in Standard Commodity FPGA IC Chip

Figure 13:
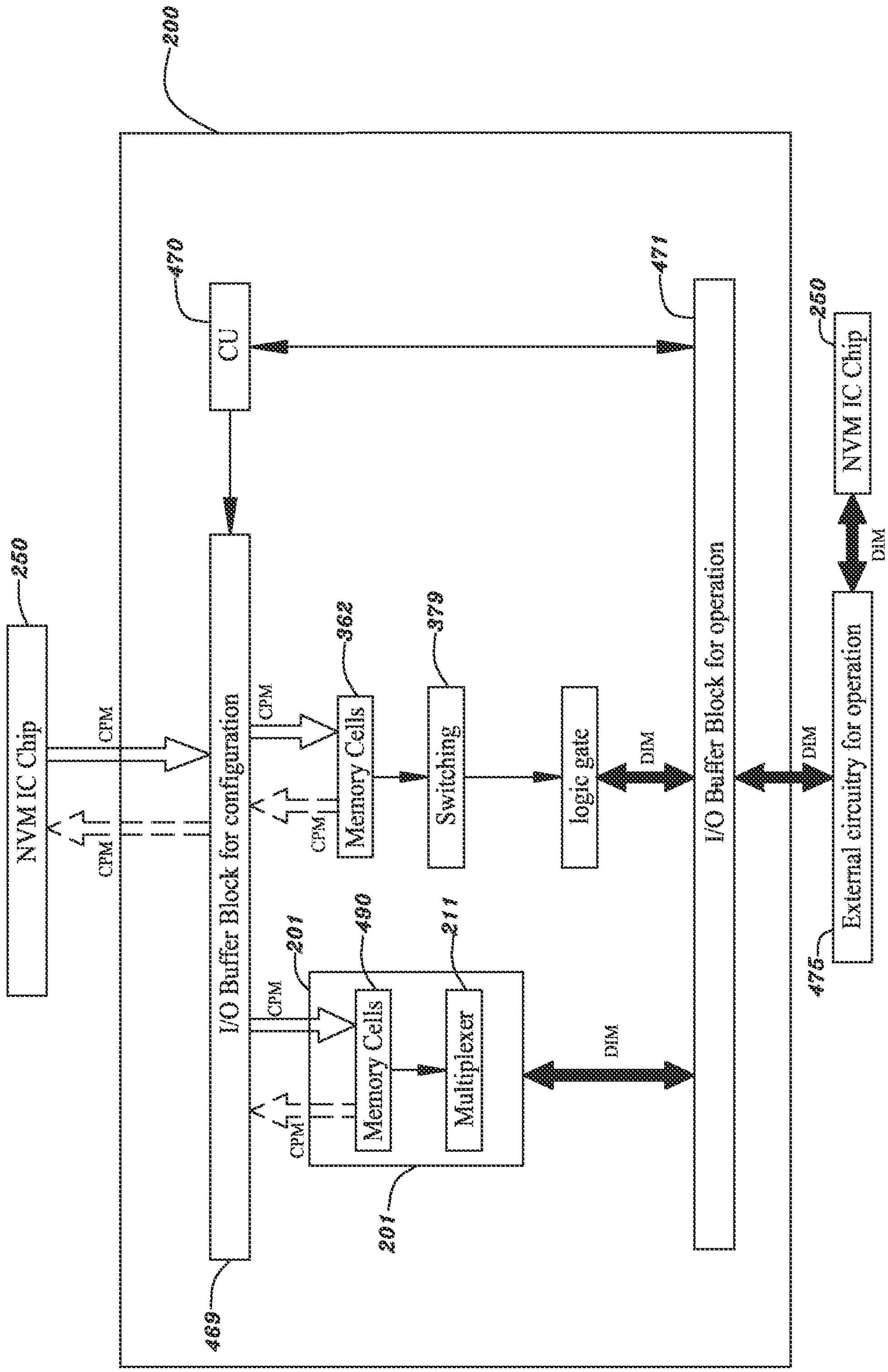
FIG. 13 is a block diagrams showing architecture of programming and operation in a standard commodity FPGA IC chip in accordance with an embodiment of the present application.

FIG. 13 is a block diagrams showing architecture of programming and operation in a standard commodity FPGA IC chip in accordance with an embodiment of the present application. Referring to FIG. 13, for each of the first through fourth types of standard commodity logic drives 300 as illustrated in FIG. 10A-10D, each of its non-volatile memory (NVM) IC chip(s) 250 may include three non-volatile memory blocks each composed of multiple non-volatile memory cells arranged in an array. The non-volatile memory cells, i.e., configuration programming memory (CPM) cells, of a first one of the three non-volatile memory blocks of said each of its non-volatile memory (NVM) IC chip(s) 250 are configured to save or store configuration programming memory (CPM) data including original resulting values or programming codes of the look-up tables (LUT) 210 of the standard commodity FPGA IC chip 200 of each of its operation modules 190 as illustrated in FIGS. 6A-6D and original programming codes for the cross-point switches 379 of the standard commodity FPGA IC chip 200 of each of its operation modules 190 and each of its DPIIC chips 410 as illustrated in FIGS. 3A, 3B and 7; the non-volatile memory cells, i.e., configuration programming memory (CPM) cells, of a second one of the three non-volatile memory blocks of said each of its non-volatile memory (NVM) IC chip(s) 250 are configured to save or store configuration programming memory (CPM) data including immediately-previously self-configured resulting values or programming codes of the look-up tables (LUT) 210 of the standard commodity FPGA IC chip 200 of each of its operation modules 190 as illustrated in FIGS. 6A-6D and immediately-previously self-configured programming codes for the cross-point switches 379 the standard commodity FPGA IC chip 200 of each of its operation modules 190 and each of its DPIIC chips 410 as illustrated in FIGS. 3A, 3B and 7; the non-volatile memory cells, i.e., configuration programming memory (CPM) cells, of a third one of the three non-volatile memory blocks of said each of its non-volatile memory (NVM) IC chips 250 are configured to save or store configuration programming memory (CPM) data including currently self-configured resulting values or programming codes of the look-up tables (LUT) 210 the standard commodity FPGA IC chip 200 of each of its operation modules 190 as illustrated in FIGS. 6A-6D and currently self-configured programming codes for the cross-point switches 379 of the standard commodity FPGA IC chip 200 of each of its operation modules 190 and each of its DPIIC chips 410 as illustrated in FIGS. 3A, 3B and 7.

Referring to FIG. 13, for each of the first through fourth types of standard commodity logic drives 300 as illustrated in FIGS. 10A-10D, the original, immediately-previously self-configured or currently self-configured resulting values or programming codes of the look-up tables (LUT) 210 and the original, immediately-previously self-configured or currently self-configured programming codes for the cross-point switches 379 stored in one of the three non-volatile memory blocks of said each of its non-volatile memory (NVM) IC chip(s) 250 may be passed to and stored in the memory cells 490, i.e., configuration programming memory (CPM) cells, of the programmable logic cells (LC) 2014 of the standard commodity FPGA IC chip 200 of each of its operation modules 190 as illustrated in FIGS. 6A-6D and the memory cells 362, i.e., configuration programming memory (CPM) cells, for the cross-point switches 379 of the standard commodity FPGA IC chip 200 of said each of its operation modules 190 as illustrated in FIGS. 3A, 3B and 7 through multiple of the small I/O circuits 203 of the standard commodity FPGA IC chip 200 of said each of its operation modules 190 as seen in FIG. 5B, which are defined in an I/O buffering block 469 of the standard commodity FPGA IC chip 200 of said each of its operation modules 190. Thereby, the programmable logic cells (LC) 2014 of the standard commodity FPGA IC chip 200 of said each of its operation modules 190 may be programmed by the original, immediately-previously self-configured or currently self-configured resulting values or programming codes of the look-up tables (LUT) 210 and the cross-point switches 379 of the standard commodity FPGA IC chip 200 of said each of its operation modules 190 may be programmed by the original, immediately-previously self-configured or currently self-configured programming codes for the cross-point switches 379.

Referring to FIG. 13, for each of the first through fourth types of standard commodity logic drives 300 as illustrated in FIGS. 10A-10D, a first data information memory (DIM) cell of circuits 475 external of the standard commodity FPGA IC chip 200 of said each of its operation modules 190, such as SRAM or DRAM cells of one of its first, second and third HBM IC chips 251-1, 251-2 and 251-3, may pass a first data information memory (DIM) dataset to be associated with a data input of the first input data set, e.g., A0 and A1 as seen in FIGS. 4 and 6A, of the multiplexer 211 of one of the programmable logic cells (LC) 2014 of the standard commodity FPGA IC chip 200 of said each of its operation modules 190 through a first one of the small I/O circuits 203 of the standard commodity FPGA IC chip 200 of said each of its operation modules 190 as seen in FIG. 5B, which are defined in an I/O buffering block 471 of the standard commodity FPGA IC chip 200 of said each of its operation modules 190. A first one of the cross-point switches 379 of the standard commodity FPGA IC chip 200 of said each of its operation modules 190 may pass the first data information memory (DIM) dataset from the first one of the small I/O circuits 203 of the standard commodity FPGA IC chip 200 of said each of its operation modules 190 to be associated with the data input of the first input data set of the multiplexer 211 of said one of the programmable logic cells (LC) 2014 of the standard commodity FPGA IC chip 200 of said each of its operation modules 190. A second data information memory (DIM) cell of circuits 475 external of the standard commodity FPGA IC chip 200 of said each of its operation modules 190, such as SRAM or DRAM cell of said one of its first, second and third HBM IC chips 251-1, 251-2 and 251-3, may receive a second data information memory (DIM) dataset associated with a data output, e.g., Dout as seen in FIGS. 4 and 6A, of the multiplexer 211 of said one of the programmable logic cells (LC) 2014 of the standard commodity FPGA IC chip 200 of said each of its operation modules 190 through a second one of the small I/O circuits 203 of the standard commodity FPGA IC chip 200 of said each of its operation modules 190 as seen in FIG. 5B. A second one of the cross-point switches 379 of the standard commodity FPGA IC chip 200 of said each of its operation modules 190 may pass the second data information memory (DIM) dataset associated with the data output of the multiplexer 211 of said one of the programmable logic cells (LC) 2014 of the standard commodity FPGA IC chip 200 of said each of its operation modules 190 to the second one of the small I/O circuits 203 of the standard commodity FPGA IC chip 200 of said each of its operation modules 190.

Referring to FIG. 13, for each of the first through fourth types of standard commodity logic drives 300 as illustrated in FIGS. 10A-10D, the data information memory (DIM) datasets saved or stored in the SRAM or DRAM cells, i.e., data information memory (DIM) cells, of one of its first, second and third HBM IC chips 251-1, 251-2 and 251-3 may be backed up or stored in one of its NVM IC chip(s) 250 or circuits outside said each of the first through fourth types of standard commodity logic drives 300. Thereby, when said each of the first through fourth types of standard commodity logic drives 300 is powered off, the data information memory (DIM) datasets stored in said one of its NVM IC chip(s) 250 may be kept.

For reconfiguration for artificial intelligence (AI), machine learning or deep learning, for the standard commodity FPGA IC chip 200 of each of the operation modules 190 of each of the first through fourth types of standard commodity logic drives 300 as illustrated in FIGS. 10A-10D, the current logic operation, such as AND logic operation, of one of its programmable logic cells (LC) 2014 may be self-reconfigured to another logic operation, such as NAND logic operation, by reconfiguring the resulting values or programming codes, i.e., configuration programming memory (CPM) data, in the memory cells 490 of said one of its programmable logic cells (LC) 2014. The current switching state of one of its cross-point switches 379 may be self-reconfigured to another switching state by reconfiguring the programming codes, i.e., configuration programming memory (CPM) data, in the memory cells 362 for said one of its cross-point switches 379. The currently self-reconfigured resulting values or programming codes, i.e., configuration programming memory (CPM) data, in the memory cells 490 of said one of its programmable logic cells (LC) 2014 and in the memory cells 362 for said one of its cross-point switches 379 may be passed to and stored in the non-volatile memory cells, i.e., configuration programming memory (CPM) cells, of the third one of the three non-volatile memory blocks of said each of the non-volatile memory (NVM) IC chip(s) 250 of said each of the first through fourth types of standard commodity logic drives 300 through multiple of its small I/O circuits 203 as seen in FIG. 5B, which are defined in its I/O buffering block 469.

Accordingly, referring to FIG. 13, for said each of the first through fourth types of standard commodity logic drives 300, when it is powered on, the currently self-configured configuration programming memory (CPM) data stored or saved in the non-volatile memory cells in the third one of the three non-volatile memory blocks of said each of its non-volatile memory (NVM) IC chip(s) 250 may be reloaded to the memory cells 490 and 362 of the standard commodity FPGA IC chip 200 of said each of its operation modules 190. During operation, the standard commodity FPGA IC chip 200 of said each of its operation modules 190 may be reset to pass the original or immediately-previously self-configured configuration programming memory (CPM) data from the non-volatile memory cells in the first or second one of the three non-volatile memory blocks of said each of its non-volatile memory (NVM) IC chips 250 to the memory cells 490 and 362 of the standard commodity FPGA IC chip 200 of said each of its operation modules 190 to be stored in the memory cells 490 and 362 of the standard commodity FPGA IC chip 200 of said each of its operation modules 190.

Specification for Processes for Fabricating Semiconductor Chip

1. First Type of Semiconductor Chip

Figure 14A:
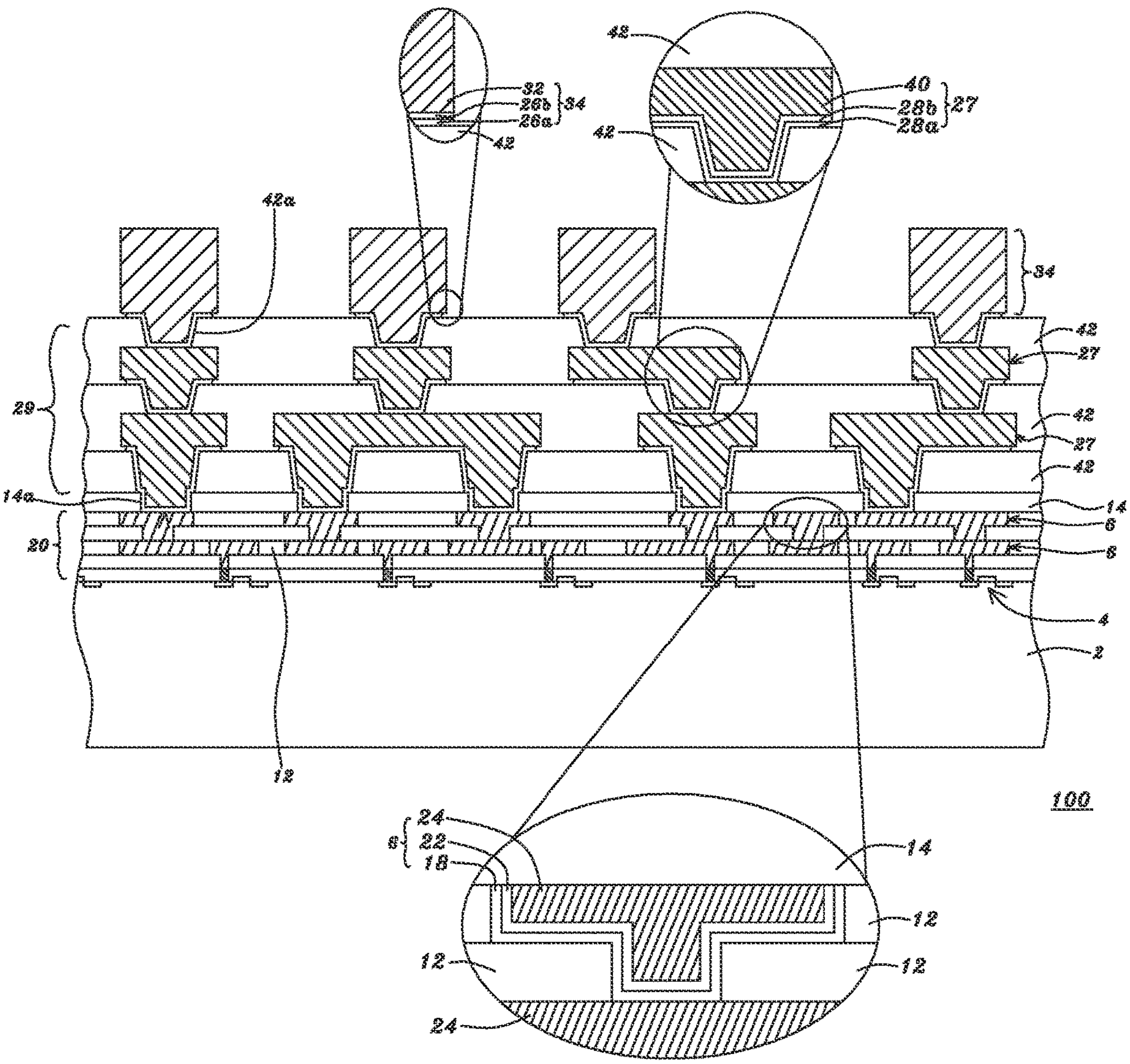
FIGS. 14A-14F are schematically cross-sectional views showing various types of semiconductor chips in accordance with an embodiment of the present application.

FIG. 14A is a schematically cross-sectional view showing a first type of semiconductor chip in accordance with an embodiment of the present application. A first type of semiconductor chip 100 may include (1) a semiconductor substrate 2, such as silicon substrate, GaAs substrate, SiGe substrate or Silicon-On-Insulator (SOI) substrate; (2) multiple semiconductor devices 4, i.e., transistors, on its semiconductor substrate 2; (3) a first interconnection scheme for a chip (FISC) 20 over its semiconductor substrate 2, provided with one or more interconnection metal layers 6 coupling to its semiconductor devices 4, i.e., transistors, and one or more insulating dielectric layers 12 each between neighboring two of its interconnection metal layers 6, wherein each of its one or more interconnection metal layers 6 may have a thickness between 0.1 and 2 micrometers; (4) a passivation layer 14 over its first interconnection scheme for a chip (FISC) 20, wherein multiple openings **14*a* in its passivation layer 14 may be aligned with and over multiple metal pads of the topmost one of the interconnection metal layers 6 of its first interconnection scheme for a chip (FISC) 20; (5) a second interconnection scheme for a chip (SISC) 29 optionally provided over its passivation layer 14, provided with one or more interconnection metal layers 27 coupling to the topmost one of the interconnection metal layers 6 of its first interconnection scheme for a chip (FISC) 20 through the openings 14*a* in its passivation layer 14 and one or more polymer layers 42 each between neighboring two of its interconnection metal layers 27, under a bottommost one of its interconnection metal layers 27 or over a topmost one of its interconnection metal layers 27, wherein multiple openings 42*a* in the topmost one of its polymer layers 42 may be aligned with and over multiple metal pads of the topmost one of the interconnection metal layers 27 of its second interconnection scheme for a chip (SISC) 29, wherein each of the interconnection metal layers 27 of its second interconnection scheme for a chip (SISC) 29 may have a thicknesses between 3 and 5 micrometers; and (6) multiple micro-bumps or micro-pillars 34 on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20**.

Referring to FIG. 14A, for the first type of semiconductor chip 100, its semiconductor devices 4 may include a memory cell, a logic circuit, a passive device, such as resistor, capacitor, inductor or filter, or an active device, such as p-channel and/or n-channel MOS devices. Its semiconductor devices 4 may compose the memory cells 362 and multiplexer 211 for the cross-point switches 379 and small I/O circuits 203, as illustrated in FIGS. 1A-5B, 7 and 9, for each of the DPIIC chips 410 of the first, second or fourth type of standard commodity logic drive 300 as seen in FIG. 10A, 10B or 10D. Its semiconductor devices 4 may compose the large and small I/O circuits 341 and 203, as illustrated in FIGS. 5A and 5B, for each of the dedicated control and input/output (I/O) chips 265 of each of the first through fourth types of standard commodity logic drives 300 as illustrated in FIGS. 10A-10D.

Referring to FIG. 14A, for the first type of semiconductor chip 100, each of the interconnection metal layers 6 of its first interconnection scheme for a chip (FISC) 20 may include (1) a copper layer 24 having lower portions in openings in a lower one of the insulating dielectric layers 12, such as SiOC layers having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. Each of the interconnection metal layers 6 of its first interconnection scheme for a chip (FISC) 20 may be patterned with a metal line or trace having a thickness between 0.1 and 2 micrometers, between 3 nm and 1,000 nm or between 10 nm and 500 nm, or thinner than or equal to 5 nm, 10 nm, 30 nm, 50 nm, 100 nm, 200 nm, 300 nm, 500 nm or 1,000 nm and a width between 3 nm and 1,000 nm or between 10 nm and 500 nm, or narrower than 5 nm, 10 nm, 20 nm, 30 nm, 70 nm, 100 nm, 300 nm, 500 nm or 1,000 nm, for example. Each of the insulating dielectric layers 12 of its first interconnection scheme for a chip (FISC) 20 may have a thickness between 0.1 and 2 micrometers, between 3 nm and 1,000 nm or between 10 nm and 500 nm, or thinner than 5 nm, 10 nm, 30 nm, 50 nm, 100 nm, 200 nm, 300 nm, 500 nm or 1,000 nm.

Referring to FIG. 14A, for the first type of semiconductor chip 100, its passivation layer 14 containing a silicon-nitride, SiON or SiCN layer having a thickness greater than 0.3 μm for example and, alternatively, a polymer layer having a thickness between 1 and 10 μm may protect the semiconductor devices 4 and the interconnection metal layers 6 from being damaged by moisture foreign ion contamination, or from water moisture or contamination form external environment, for example sodium mobile ions. Each of the openings **14*a* in its passivation layer 14** may have a transverse dimension, from a top view, of between 0.5 and 20 μm.

Referring to FIG. 14A, for the first type of semiconductor chip 100, each of the interconnection metal layers 27 of its second interconnection scheme for a chip (SISC) 29 may include (1) a copper layer 40 having lower portions in openings in one of the polymer layers 42 having a thickness of between 0.3 μm and 20 and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 of its second interconnection scheme for a chip (SISC) 29 may be patterned with a metal line or trace having a thickness between, for example, 0.3 μm and 20 μm, 0.5 μm and 10 μm, 1 μm and 5 μm, 1 μm and 10 μm, or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm, or 2 μm and 10 μm, or wider than or equal to 0.3 μm, 0.5 μm, 0.7 μm, 1 μm, 1.5 μm, 2 μm or 3 μm. Each of the polymer layers 42 of its second interconnection scheme for a chip (SISC) 29 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 μm.

Referring to FIG. 14A, for the first type of semiconductor chip 100, each of its micro-bumps or micro-pillars 34 may be of various types. A first type of micro-bumps or micro-pillars 34 may include, as seen in FIG. 14A, (1) an adhesion layer 26*a*, such as titanium (Ti) or titanium nitride (TiN) layer having a thickness of between 1 nm and 50 nm, on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20, (2) a seed layer 26*b*, such as copper, on its adhesion layer 26*a* and (3) a copper layer 32 having a thickness of between 1 μm and 60 μm on its seed layer 26*b*.

Alternatively, a second type of micro-bumps or micro-pillars 34 may include the adhesion layer 26*a*, seed layer 26*b* and copper layer 32 as mentioned above, and may further include a tin-containing solder cap made of tin or a tin-silver alloy, which has a thickness of between 1 μm and 50 μm on its copper layer 32.

Alternatively, a third type of micro-bumps or micro-pillars 34 may be thermal compression bumps, including the adhesion layer 26*a* and seed layer 26*b* as mentioned above, and may further include, as seen in FIGS. 16A, 16B, 19A, 19B, 26A and 26B, a copper layer 37 having a thickness t3 of between 2 μm and 20 μm, such as 3 μm, and a largest transverse dimension w3, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness of between 1 μm and 15 μm, such as 2 μm, and a largest transverse dimension, such as diameter in a circular shape, between 1 μm and 15 μm, such as 3 μm, on its copper layer 37. The third type of micro-bumps or micro-pillars 34 are formed respectively on multiple metal pads 6*b* provided as seen in FIGS. 16A, 16B, 19A, 19B, 26A and 26B by a frontmost one of the interconnection metal layers 27 of its second interconnection scheme for a chip (SISC) 29 or by, if the second interconnection scheme for a chip (SISC) 29 is not provided, a frontmost one of the interconnection metal layers 6 of its first interconnection scheme for a chip (FISC) 20, wherein each of the metal pads 6*b* may have a thickness t1 between 1 and 10 micrometers or between 2 and 10 micrometers and a largest transverse dimension w1, such as diameter in a circular shape, between 1 μm and 15 μm, such as 5 μm. A pitch between neighboring two of its third type of micro-bumps or micro-pillars 34 may be between 3 μm and 20 μm.

Alternatively, a fourth type of micro-bumps or micro-pillars 34 may be thermal compression pads, including the adhesion layer 26*a* and seed layer 26*b* as mentioned above, and further including, as seen in FIGS. 19A, 19B, 24A, 24B and 26A-26D, a copper layer 48 having a thickness t2 of between 1 μm and 10 μm or between 2 and 10 micrometers and a largest transverse dimension w2, such as diameter in a circular shape, between 1 μm and 15 μm, such as 5 μm, on its seed layer 26*b* and a metal cap 49 made of a tin-silver alloy, a tin-gold alloy, a tin-copper alloy, a tin-indium alloy, indium, tin or gold, which has a thickness of between 0.1 μm and 5 μm, such as 1 μm, on its copper layer 48. Neighboring two of its fourth type of micro-bumps or micro-pillars 34 may have a pitch between 3 μm and 20 μm.

2. Second Type of Semiconductor Chip

Figure 14B:
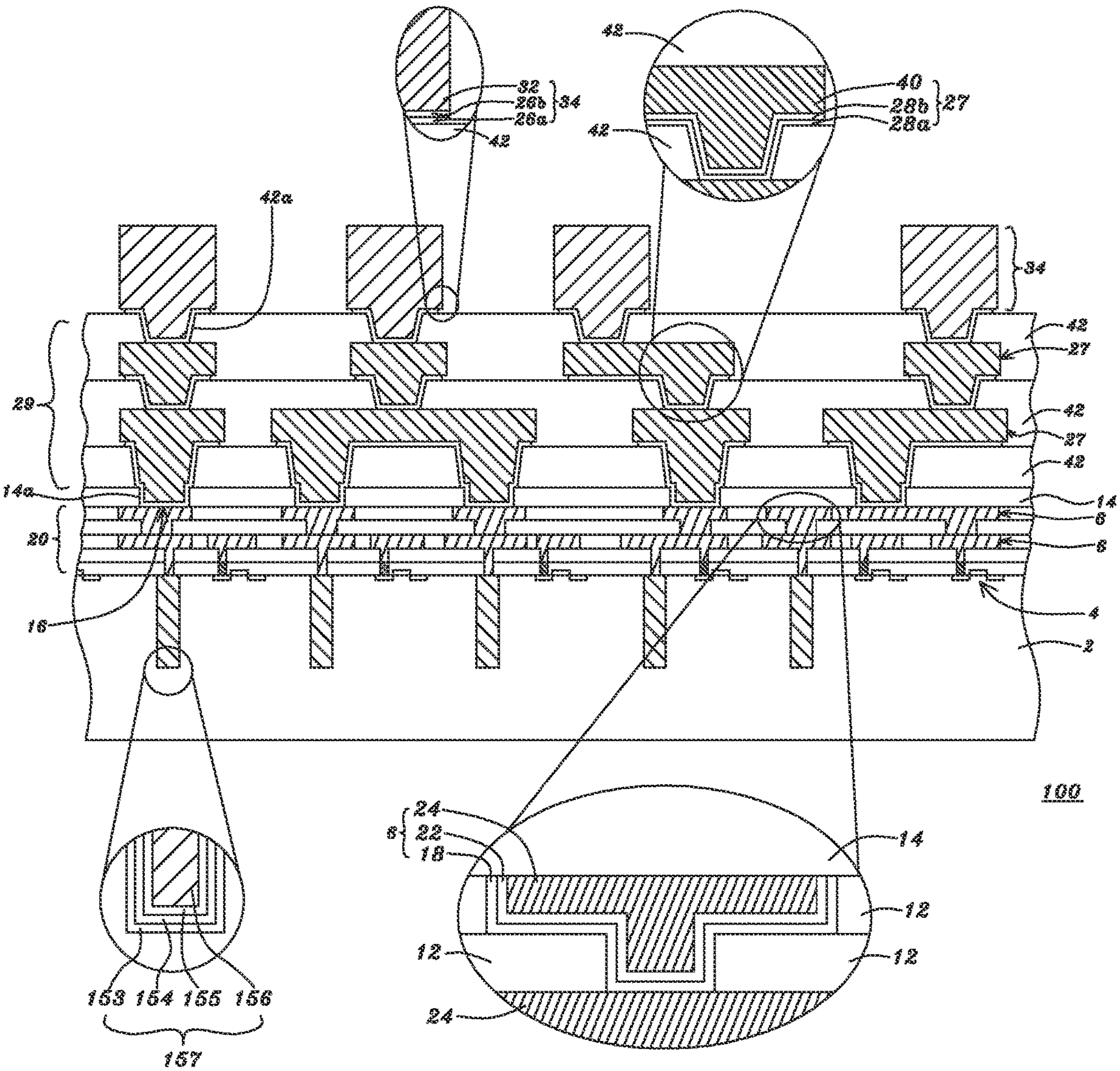

FIG. 14B is a schematically cross-sectional view showing a second type of semiconductor chip in accordance with an embodiment of the present application. Referring to FIG. 14B, a second type of semiconductor chip 100 may have a similar structure as illustrated in FIG. 14A. For an element indicated by the same reference number shown in FIGS. 14A and 14B, the specification of the element as seen in FIG. 14B may be referred to that of the element as illustrated in FIG. 14A. The difference between the first and second types of semiconductor chips 100 is that the second type of semiconductor chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20.

Referring to FIG. 14B, each of the through silicon vias (TSV) 157 of the second type of semiconductor chip 100 may include (1) an electroplated copper layer 156 having a depth, for example, between 10 nm and 3,000 nm, between 10 nm and 1,000 nm or between 10 nm and 500 nm in the semiconductor substrate 2 of the second type of semiconductor chip 100, (2) an insulating lining layer 153, such as thermally grown silicon oxide ($SiO_2$) and/or CVD silicon nitride ($Si_3N_4$) at a bottom and sidewall of its electroplated copper layer 156, (3) an adhesion layer 154, such as titanium (Ti) or titanium nitride (TiN) layer having a thickness between 1 nm to 50 nm, at the bottom and sidewall of its electroplated copper layer 156 and between its electroplated copper layer 156 and its insulating lining layer 153, and (4) an electroplating seed layer 155, such as copper seed layer 155 having a thickness between 3 nm and 200 nm, at the bottom and sidewall of its electroplated copper layer 156 and between its electroplated copper layer 156 and its adhesion layer 154.

3. Third Type of Semiconductor Chip

Figure 14C:
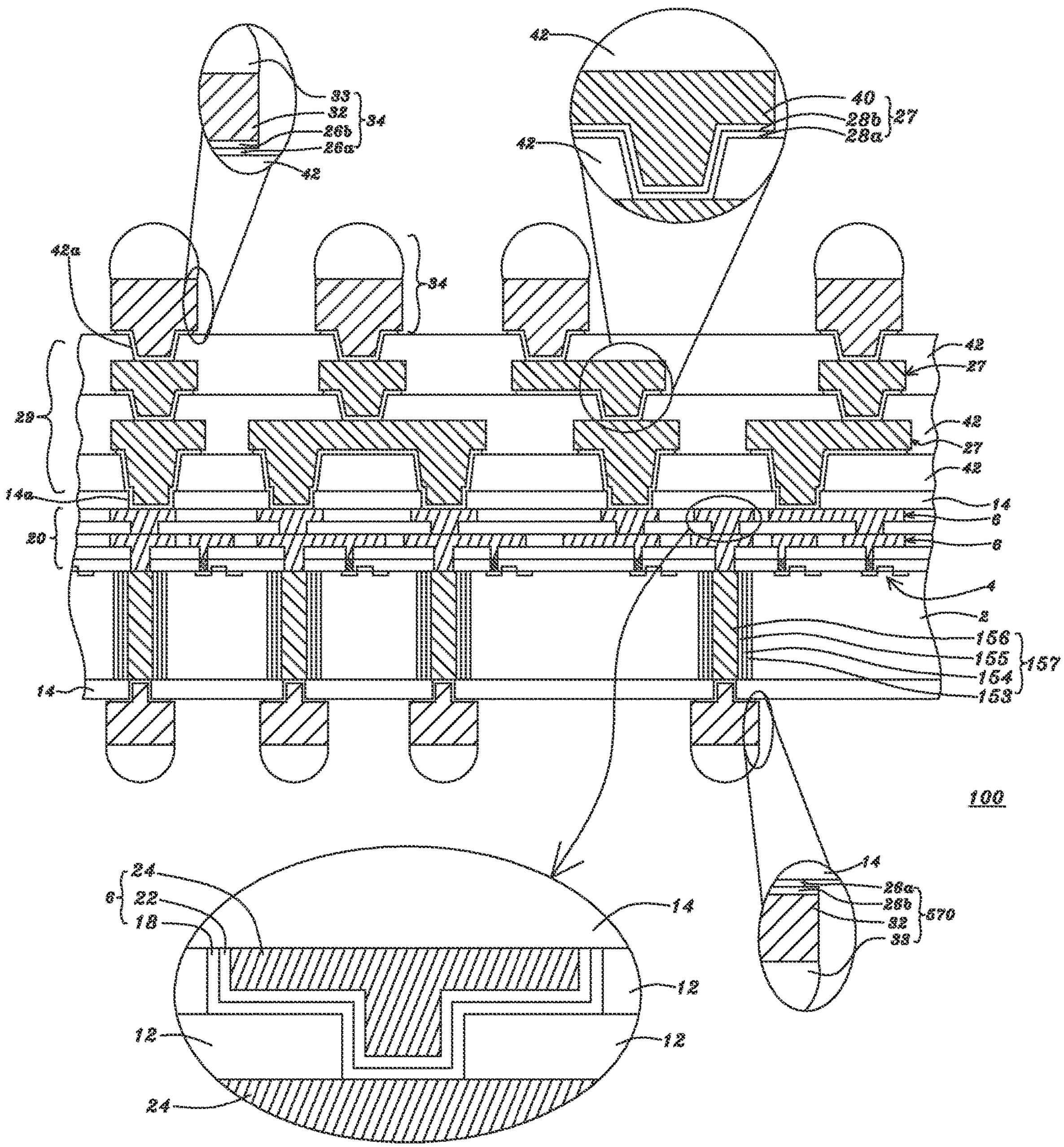

FIG. 14C is a schematically cross-sectional view showing a third type of semiconductor chip in accordance with an embodiment of the present application. Referring to FIG. 14C, a third type of semiconductor chip 100 may have a similar structure as illustrated in FIG. 14A. For an element indicated by the same reference number shown in FIGS. 14A and 14C, the specification of the element as seen in FIG. 14C may be referred to that of the element as illustrated in FIG. 14A. The difference between the first and third types of semiconductor chips 100 is that the third type of semiconductor chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20.

Referring to FIG. 14C, each of the through silicon vias (TSV) 157 of the third type of semiconductor chip 100 may include (1) an electroplated copper layer 156 having a depth, for example, between 10 nm and 3,000 nm, between 10 nm and 1,000 nm or between 10 nm and 500 nm in the semiconductor substrate 2 of the third type of semiconductor chip 100, (2) an insulating lining layer 153, such as thermally grown silicon oxide ($SiO_2$) and/or CVD silicon nitride ($Si_3N_4$) at the sidewall of its electroplated copper layer 156, (3) an adhesion layer 154, such as titanium (Ti) or titanium nitride (TiN) layer having a thickness between 1 nm to 50 nm, at the sidewall of its electroplated copper layer 156 and between its electroplated copper layer 156 and its insulating lining layer 153, and (4) an electroplating seed layer 155, such as copper seed layer 155 having a thickness between 3 nm and 200 nm, at the sidewall of its electroplated copper layer 156 and between its electroplated copper layer 156 and its adhesion layer 154. For the third type of semiconductor chip 100, the electroplated copper layer 156 of each of its through silicon vias (TSV) 157 may have a backside surface coplanar to a backside of its semiconductor substrate 2, and the insulating lining layer 153 of said each of its through silicon vias (TSV) 157 surrounds the adhesion layer 154, electroplating seed layer 155 and electroplated copper layer 156 of said each of its through silicon vias (TSV) 157. The third type of semiconductor chip 100 may further include a passivation layer 14 on the backside of its semiconductor substrate 2, wherein multiple openings 14*a* in its passivation layer 14 on the backside of its semiconductor substrate 2 may be aligned with and under the backside of the electroplated copper layer 156 of its through silicon vias (TSV) 157. For the third type of semiconductor chip 100, its passivation layer 14 on the backside of its semiconductor substrate 2 may include a silicon-nitride, SiON or SiCN layer having a thickness greater than 0.3 am for example and, alternatively, a polymer layer having a thickness between 1 and 10 am on a bottom surface of the silicon-nitride, SiON or SiCN layer. The third type of semiconductor chip 100 may further include multiple micro-bumps or micro-pillars 570 on the backside of the electroplated copper layer 156 of its through silicon vias (TSV) 157. For the third type of semiconductor chip 100, its micro-bumps or micro-pillars 570 may be of various types. A first type of micro-bumps or micro-pillars 570 may include, as seen in FIG. 14C, (1) an adhesion layer 26*a*, such as titanium (Ti) or titanium nitride (TiN) layer having a thickness of between 1 nm and 50 nm, on and under the electroplated copper layer 156 of the through silicon vias (TSV) 157 of the third type of semiconductor chip 100, (2) a seed layer 26*b*, such as copper, on and under its adhesion layer 26*a* and (3) a copper layer 32 having a thickness of between 1 μm and 60 μm on and under its seed layer 26*b*. Alternatively, a second type of micro-bumps or micro-pillars 570 may include the adhesion layer 26*a*, seed layer 26*b* and copper layer 32 as mentioned above, and may further include a tin-containing solder cap made of tin or a tin-silver alloy, which has a thickness of between 1 μm and 50 μm on and under its copper layer 32. Alternatively, a third type of micro bumps or micro-pillars 570 may be thermal compression bumps, including the adhesion layer 26*a* and seed layer 26*b* as mentioned above, and may further include, as seen in FIGS. 22C and 22D, a copper layer 37 having a thickness t3 of between 2 μm and 20 μm, such as 3 μm, and a largest transverse dimension w3, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness of between 1 μm and 15 μm, such as 2 μm, and a largest transverse dimension, such as diameter in a circular shape, between 1 μm and 15 μm, such as 3 μm, on its copper layer 37. A pitch between neighboring two of its third type of micro-bumps or micro-pillars 570 may be between 3 μm and 20 μm. Alternatively, a fourth type of micro-bumps or micro-pillars 570 may be thermal compression pads, including the adhesion layer 26*a* and seed layer 26*b* as mentioned above, and further including, as seen in FIGS. 16A and 16B, a copper layer 48 having a thickness t2 of between 1 μm and 10 μm or between 2 and 10 micrometers and a largest transverse dimension w2, such as diameter in a circular shape, between 1 μm and 15 μm, such as 5 μm, on its seed layer 26*b* and a metal cap 49 made of a tin-silver alloy, a tin-gold alloy, a tin-copper alloy, a tin-indium alloy, indium, tin or gold, which has a thickness of between 0.1 μm and 5 μm, such as 1 μm, on its copper layer 48. Neighboring two of its fourth type of micro-bumps or micro-pillars 570 may have a pitch between 3 μm and 20 μm.

4. Fourth Type of Semiconductor Chip

Figure 14D:
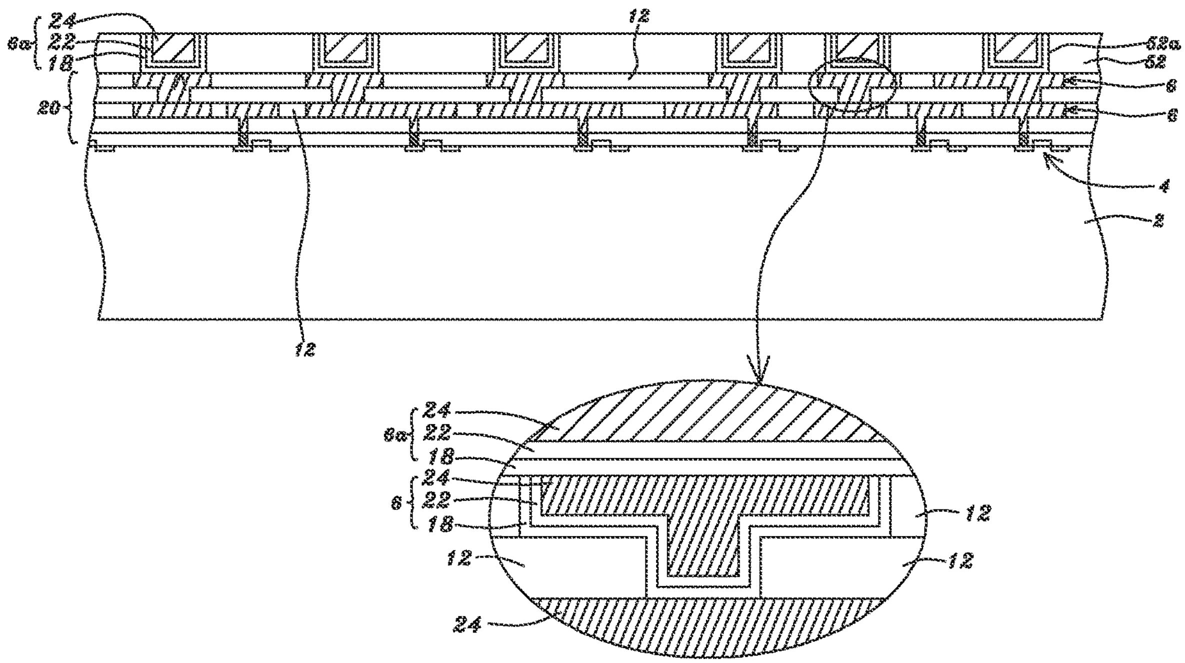

FIG. 14D is a schematically cross-sectional view showing a fourth type of semiconductor chip in accordance with an embodiment of the present application. Referring to FIG. 14D, a fourth type of semiconductor chip 100 may have a similar structure as illustrated in FIG. 14A. For an element indicated by the same reference number shown in FIGS. 14A and 14D, the specification of the element as seen in FIG. 14D may be referred to that of the element as illustrated in FIG. 14A. The difference between the first and fourth types of semiconductor chips 100 is that the fourth type of semiconductor chip 100 may be provided with (1) an insulating bonding layer 52 at its active side and on the topmost one of the insulating dielectric layers 12 of its first interconnection scheme for a chip (FISC) 20 and (2) multiple metal pads 6*a* at its active side and in multiple openings 52*a* in its insulating bonding layer 52 and on the topmost one of the interconnection metal layers 6 of its first interconnection scheme for a chip (FISC) 20, instead of the second interconnection scheme for a chip (SISC) 29, the passivation layer 14 and micro-bumps or micro-pillars 34 as seen in FIG. 14A. For the fourth type of semiconductor chip 100, its insulating bonding layer 52 may include a silicon-oxide layer having a thickness between 0.1 and 2 μm. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a* and on the topmost one of the interconnection metal layers 6 of its first interconnection scheme for a chip (FISC) 20, and (3) a seed layer 22, such as copper, between the copper layer 24 and adhesion layer 18 of said each of its metal pads 6*a*, wherein the copper layer 24 of said each of its metal pads 6a may have a top surface substantially coplanar with a top surface of the silicon-oxide layer of its insulating bonding layer 52.

5. Fifth Type of Semiconductor Chip

Figure 14E:
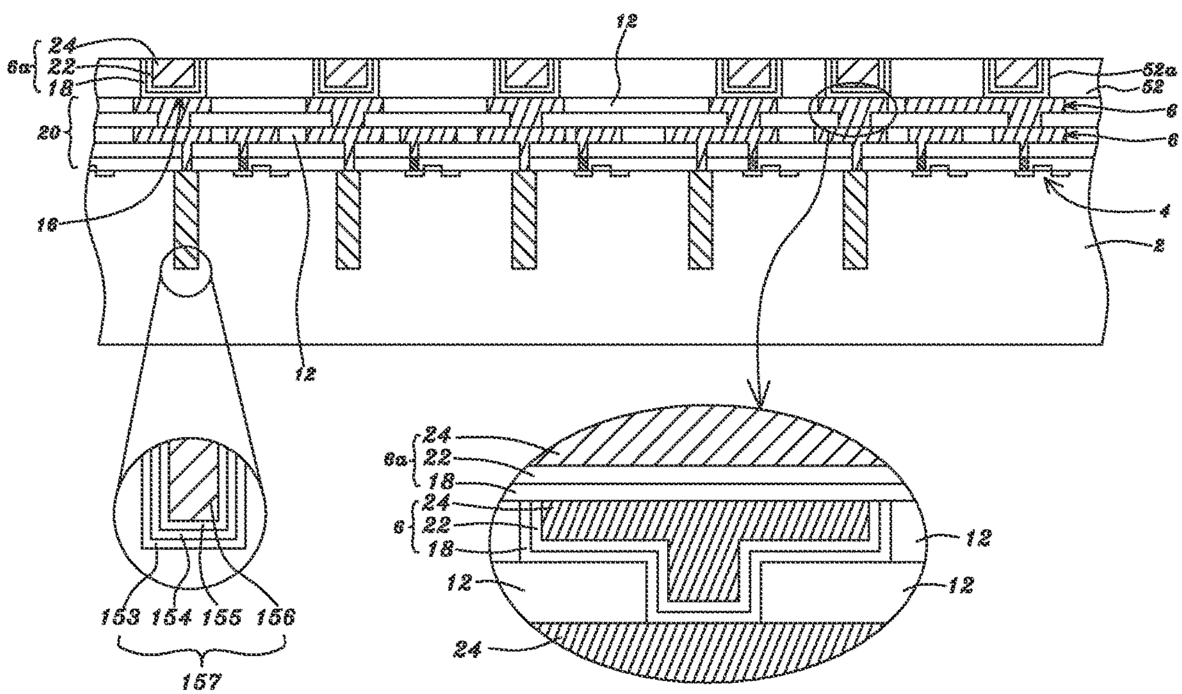

FIG. 14E is a schematically cross-sectional view showing a fifth type of semiconductor chip in accordance with an embodiment of the present application. Referring to FIG. 14E, a fifth type of semiconductor chip 100 may have a similar structure as illustrated in FIG. 14D. For an element indicated by the same reference number shown in FIGS. 14D and 14E, the specification of the element as seen in FIG. 14D may be referred to that of the element as illustrated in FIG. 14E. The difference between the fourth and fifth types of semiconductor chips 100 is that the fifth type of semiconductor chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20.

Referring to FIG. 14E, each of the through silicon vias (TSV) 157 of the fifth type of semiconductor chip 100 may include (1) an electroplated copper layer 156 having a depth, for example, between 10 nm and 3,000 nm, between 10 nm and 1,000 nm or between 10 nm and 500 nm in the semiconductor substrate 2 of the fifth type of semiconductor chip 100, (2) an insulating lining layer 153, such as thermally grown silicon oxide ($SiO_2$) and/or CVD silicon nitride ($Si_3N_4$) at a bottom and sidewall of its electroplated copper layer 156, (3) an adhesion layer 154, such as titanium (Ti) or titanium nitride (TiN) layer having a thickness between 1 nm to 50 nm, at the bottom and sidewall of its electroplated copper layer 156 and between its electroplated copper layer 156 and its insulating lining layer 153, and (4) an electroplating seed layer 155, such as copper seed layer 155 having a thickness between 3 nm and 200 nm, at the bottom and sidewall of its electroplated copper layer 156 and between its electroplated copper layer 156 and its adhesion layer 154.

6. Sixth Type of Semiconductor Chip

Figure 14F:
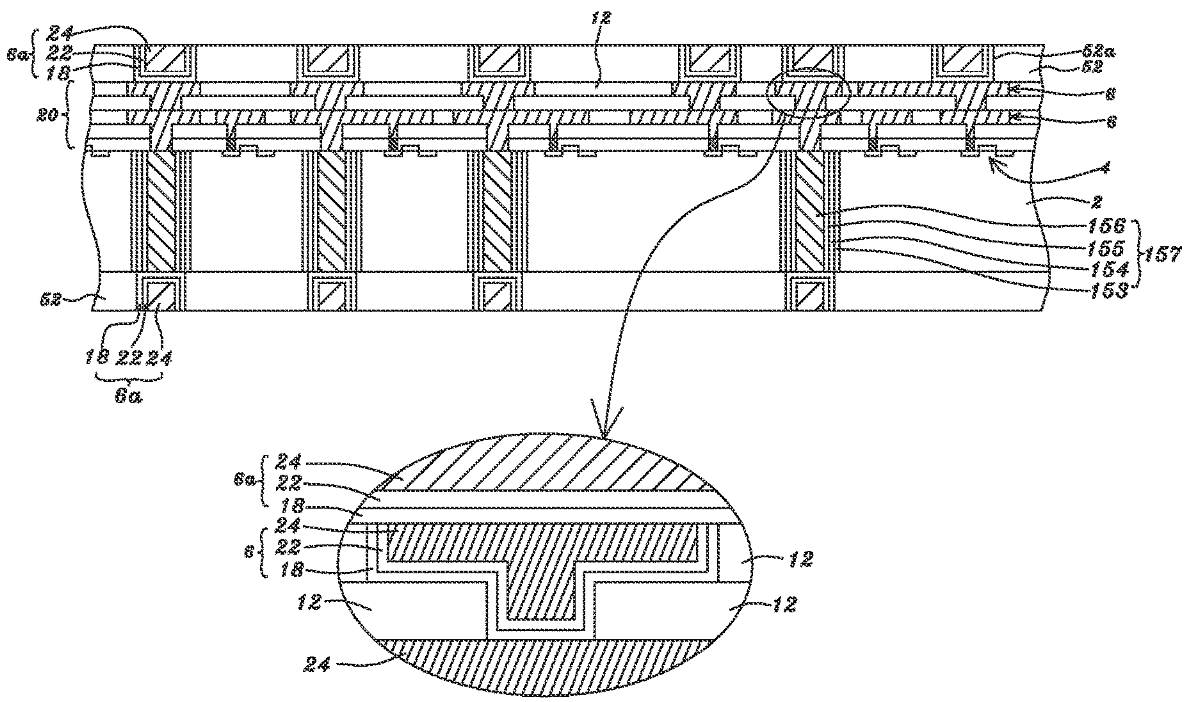

FIG. 14F is a schematically cross-sectional view showing a sixth type of semiconductor chip in accordance with an embodiment of the present application. Referring to FIG. 14F, a sixth type of semiconductor chip 100 may have a similar structure as illustrated in FIG. 14D. For an element indicated by the same reference number shown in FIGS. 14D and 14F, the specification of the element as seen in FIG. 14F may be referred to that of the element as illustrated in FIG. 14D. The difference between the fourth and sixth types of semiconductor chips 100 is that the sixth type of semiconductor chip 100 may be provided with the through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20.

Referring to FIG. 14F, each of the through silicon vias (TSV) 157 of the sixth type of semiconductor chip 100 may include (1) an electroplated copper layer 156 having a depth, for example, between 10 nm and 3,000 nm, between 10 nm and 1,000 nm or between 10 nm and 500 nm in the semiconductor substrate 2 of the sixth type of semiconductor chip 100, (2) an insulating lining layer 153, such as thermally grown silicon oxide ($SiO_2$) and/or CVD silicon nitride ($Si_3N_4$) at the sidewall of its electroplated copper layer 156, (3) an adhesion layer 154, such as titanium (Ti) or titanium nitride (TiN) layer having a thickness between 1 nm to 50 nm, at the sidewall of its electroplated copper layer 156 and between its electroplated copper layer 156 and its insulating lining layer 153, and (4) an electroplating seed layer 155, such as copper seed layer 155 having a thickness between 3 nm and 200 nm, at the sidewall of its electroplated copper layer 156 and between its electroplated copper layer 156 and its adhesion layer 154. For the sixth type of semiconductor chip 100, the electroplated copper layer 156 of each of its through silicon vias (TSV) 157 may have a backside surface coplanar to a backside of its semiconductor substrate 2, and the insulating lining layer 153 of said each of its through silicon vias (TSV) 157 surrounds the adhesion layer 154, electroplating seed layer 155 and electroplated copper layer 156 of said each of its through silicon vias (TSV) 157. The sixth type of semiconductor chip 100 may further include (1) an insulating bonding layer 52 at its backside and on the backside of its semiconductor substrate 2 and (2) multiple metal pads 6a at its backside, in multiple openings 52a in its insulating bonding layer 52 at its backside and on the backside of the electroplated copper layer 156 of its through silicon vias (TSV) 157. For the sixth type of semiconductor chip 100, its insulating bonding layer 52 at its backside may include a silicon-oxide layer having a thickness between 0.1 and 2 Each of its metal pads 6a at its backside may include (1) a copper layer 24 having a thickness of between 3 nm and 500 nm in one of the openings 52a in its insulating bonding layer 52 at its backside, (2) an adhesion layer 18, such as titanium or titanium nitride having a thickness of between 1 nm and 50 nm, at a top and sidewall of the copper layer 24 of said each of its metal pads 6a at its backside, and (3) a seed layer 22, such as copper, between the copper layer 24 and adhesion layer 18 of said each of its metal pads 6a at its backside, wherein the copper layer 24 of said each of its metal pads 6a at its backside may have a bottom surface substantially coplanar with a bottom surface of the silicon-oxide layer of its insulating bonding layer 52 at its backside.

Specification for Memory Module (HBM stacked 3D Chip-Scale-Package (CSP))

First Type of Memory Module

FIG. 15A is a schematically cross-sectional view showing a first type of memory module in accordance with an embodiment of the present application. For each of the first through third types of standard commodity logic drives 300 as illustrated in FIGS. 10A-10C, each of its first and/or second memory modules 159-1 and/or 159-2 may be a first type of memory module 159 as seen in FIG. 15A, including (1) multiple third HBM IC chips 251-3, such as volatile-memory (VM) integrated circuit (IC) chips for a VM module, dynamic-random-access-memory (DRAM) IC chips for a high-bitwidth memory (HBM) module, statistic-random-access-memory (SRAM) IC chips for a SRAM module, non-volatile memory (NVM) integrated circuit (IC) chips for a NVM module, magnetoresistive random-access-memory (MRAM) IC chips for a MRAM module, resistive random-access-memory (RRAM) IC chips for a RRAM module or phase change random access memory (PCM) chips for a PCM module, vertically stacked together, wherein the number of the third HBM IC chips 251-3 in the first type of memory module 159 may have the number equal to or greater than 2, 4, 8, 16, 32, (2) a control chip 688, i.e., ASIC or logic chip, under its stacked third HBM IC chips 251-3, (3) multiple bonded contacts 158 between neighboring two of its third HBM IC chips 251-3 and between the bottommost one of its third HBM IC chips 251-3 and its control chip 688, and (4) multiple first, second or third type of micro-bumps or micro-pillars 34 as illustrated in FIG. 14A on an active side of its control chip 688.

Referring to FIG. 15A, each of the third HBM IC chips 251-3 of the first type of memory module 159 may have the structure as illustrated in FIG. 14C, which may include the through silicon vias (TSV) 157 in its semiconductor substrate 2, each aligned with and connected to one of the bonded contacts 158 at its backside.

Figure 16B:
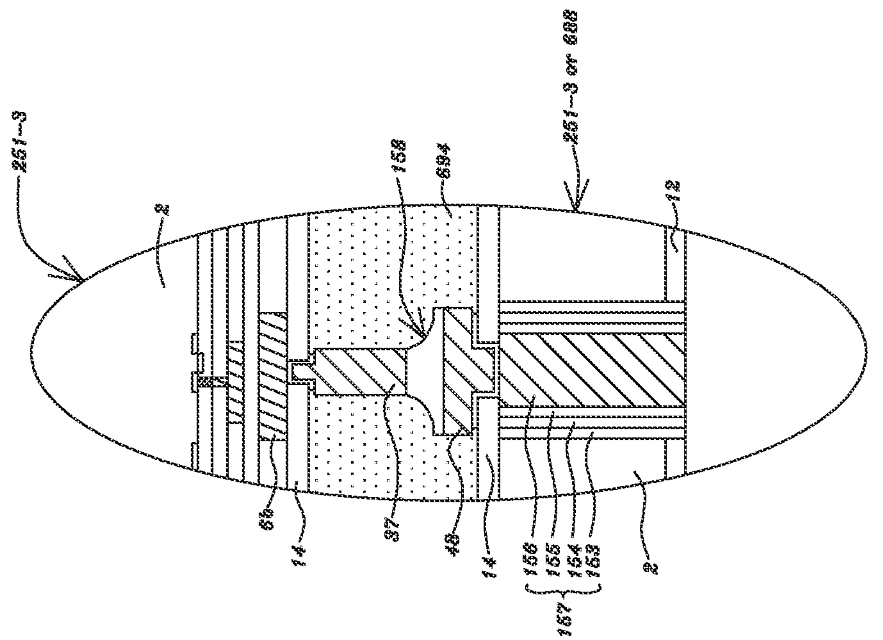
FIGS. 16A and 16B are schematically cross-sectional views showing a process of bonding a thermal compression bump to a thermal compression pad in accordance with an embodiment of the present application.
Figure 16A:
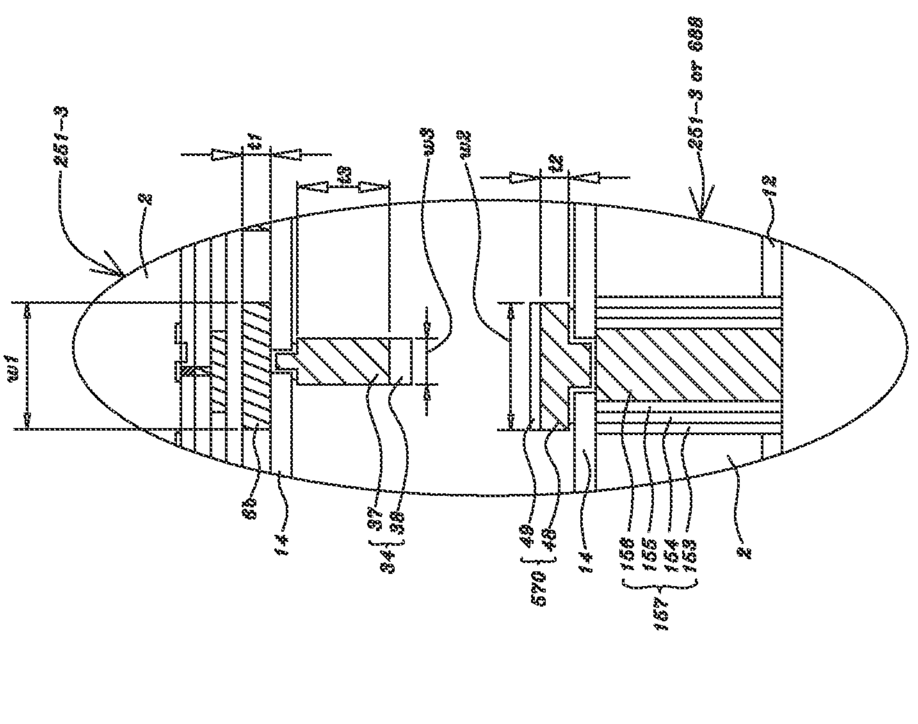

FIGS. 16A and 16B are schematically cross-sectional views showing a process of bonding a thermal compression bump to a thermal compression pad in accordance with an embodiment of the present application. For the first type of memory module 159, referring to FIGS. 15A, 16A and 16B, in a first case, an upper one of its third HBM IC chips 251-3 may have the third type of micro-bumps or micro-pillars 34 to be bonded to the fourth type of micro-bumps or micro-pillars 570 of a lower one of its third HBM IC chips 251-3. For example, the third type of micro-bumps or micro-pillars 34 of the upper one of its third HBM IC chips 251-3 may have the solder caps 38 to be thermally compressed, at a temperature between 240 and 300 degrees Celsius, at a pressure between 0.3 and 3 MPa and for a time period between 3 and 15 seconds, onto the metal caps 49 of the fourth type of micro bumps or micro-pillars 570 of the lower one of its third HBM IC chips 251-3 into multiple bonded contacts 158 between the upper and lower ones of its third HBM IC chips 251-3. Each of the third type of micro-bumps or micro-pillars 34 of the upper one of its third HBM IC chips 251-3 may have the copper layer 37 having the thickness t3 greater than the thickness t2 of the copper layer 48 of each of the fourth type of micro-bumps or micro-pillars 570 of the lower one of its third HBM IC chips 251-3 and having the largest transverse dimension w3 equal to between 0.7 and 0.1 times of the largest transverse dimension w2 of the copper layer 48 of each of the fourth type of micro-bumps or micro-pillars 570 of the lower one of its third HBM IC chips 251-3. Alternatively, each of the third type of micro-pillars or micro-bumps 34 of the upper one of its third HBM IC chips 251-3 may be provided with the copper layer 37 having a cross-sectional area equal to between 0.5 and 0.01 times of the cross-sectional area of the copper layer 48 of each of the fourth type of micro-bumps or micro-pillars 570 of the lower one of its third HBM IC chips 251-3.

For example, referring to FIGS. 15A, 16A and 16B, for the upper one of the third HBM IC chips 251-3 of the first type of memory module 159, its third type of micro-bumps or micro-pillars 34 may be formed respectively on a front surface of its metal pads 6*b* provided by the frontmost one of the interconnection metal layers 27 of its second interconnection scheme for a chip (SISC) 29 or by, if the second interconnection scheme for a chip (SISC) 29 is not provided, the frontmost one of the interconnection metal layers 6 of its first interconnection scheme for a chip (FISC) 20, wherein each of its metal pads 6*b* may have a thickness t1 between 1 and 10 micrometers or between 2 and 10 micrometers and a largest transverse dimension w1, such as diameter in a circular shape, between 1 μm and 15 μm, such as 5 μm, and each of its third type of micro-bumps or micro-pillars 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pillars 34 may be provided with the copper layer 37 having a cross-sectional area equal to between 0.5 and 0.01 times of the cross-sectional area of its metal pads 6*b*.

Referring to FIGS. 15A, 16A and 16B, for the first type of memory module 159, a bonded solder between the copper layers 37 and 48 of each of its bonded contacts 158 may be mostly kept on a top surface of the copper layer 48 of one of the fourth type of micro-bumps or micro-pillars 570 of the lower one of its third HBM IC chips 251-3 and extends out of the edge of the copper layer 48 of said one of the fourth type of micro-bumps or micro-pillars 570 of the lower one of its third HBM IC chips 251-3 less than 0.5 micrometers. Thus, a short between neighboring two of its bonded contacts 158 even in a fine-pitched fashion may be avoided.

Alternatively, for the first type of memory module 159, referring to FIG. 15A, in a second case, an upper one of its third HBM IC chips 251-3 may have the second type of micro-bumps or micro-pillars 34 to be bonded to the first type of micro-bumps or micro-pillars 570 of a lower one of its third HBM IC chips 251-3. For example, the second type of micro-bumps or micro-pillars 34 of the upper one of its third HBM IC chips 251-3 may have the solder caps 33 to be bonded onto the electroplated copper layer 32 of the first type of micro-bumps or micro-pillars 570 of the lower one of its third HBM IC chips 251-3 into multiple bonded contacts 158 between the upper and lower ones of its third HBM IC chips 251-3. Each of the second type of micro-bumps or micro-pillars 34 of the upper one of its third HBM IC chips 251-3 may have the electroplated copper layer 32 having a thickness greater than that of the electroplated copper layer 32 of each of the first type of micro-bumps or micro-pillars 570 of the lower one of its third HBM IC chips 251-3.

Alternatively, for the first type of memory module 159, referring to FIG. 15A, in a third case, an upper one of its third HBM IC chips 251-3 may have the first type of micro-bumps or micro-pillars 34 to be bonded to the second type of micro-bumps or micro-pillars 570 of a lower one of its third HBM IC chips 251-3. For example, the first type of micro-bumps or micro-pillars 34 of the upper one of its third HBM IC chips 251-3 may have the electroplated metal layer 32, e.g. copper layer, to be bonded onto the solder caps 33 of the second type of micro-bumps or micro-pillars 570 of the lower one of its third HBM IC chips 251-3 into multiple bonded contacts 158 between the upper and lower ones of its third HBM IC chips 251-3. Each of the first type of micro-bumps or micro-pillars 34 of the upper one of its third HBM IC chips 251-3 may have the electroplated copper layer 32 having a thickness greater than that of the electroplated copper layer 32 of each of the second type of micro-bumps or micro-pillars 570 of the lower one of its third HBM IC chips 251-3.

Alternatively, for the first type of memory module 159, referring to FIG. 15A, in a fourth case, an upper one of its third HBM IC chips 251-3 may have the second type of micro-bumps or micro-pillars 34 to be bonded to the second type of micro-bumps or micro-pillars 570 of a lower one of its third HBM IC chips 251-3. For example, the second type of micro-bumps or micro-pillars 34 of the upper one of its third HBM IC chips 251-3 may have the solder caps 33 to be bonded onto the solder caps 33 of the second type of micro-bumps or micro-pillars 570 of the lower one of its third HBM IC chips 251-3 into multiple bonded contacts 158 between the upper and lower ones of its third HBM IC chips 251-3. Each of the second type of micro-bumps or micro-pillars 34 of the upper one of its third HBM IC chips 251-3 may have the electroplated copper layer 32 having a thickness greater than that of the electroplated copper layer 32 of each of the second type of micro-bumps or micro-pillars 570 of the lower one of its third HBM IC chips 251-3.

Referring to FIG. 15A, for the first type of memory module 159, each of the through silicon vias (TSV) 157 of the topmost one of its third HBM IC chips 251-3 may have its sidewall and backside enclosed by the semiconductor substrate 2 of the topmost one of its third HBM IC chips 251-3, as seen in FIG. 14B. The bottommost one of its third HBM IC chips 251-3 may provide the micro-bumps or micro-pillars 34 on its bottom surface to be bonded to the micro-bumps or micro-pillars 570 on a top surface of its control chip 688 into multiple bonded contacts 158 between its control chip 688 and the bottommost one of its third HBM IC chips 251-3. The specification of its bonded contacts 158 between its control chip 688 and the bottommost one of its third HBM IC chips 251-3 and the process for forming the same may be referred to the specification of those between the upper and lower ones of its third HBM IC chips 251-3 as above illustrated in FIGS. 15A, 16A and 16B and the above-mentioned process for forming the same.

Referring to FIG. 15A, for the first type of memory module 159, the through silicon vias (TSV) 157 in its third HBM IC chips 251-3, which are aligned in a vertical direction, may couple to each other or one another through its bonded contacts 158 therebetween aligned in the vertical direction and with its through silicon vias (TSV) 157 therein in the vertical direction. Each of its third HBM IC chips 251-3 and control chip 688 may include multiple interconnects 696 each provided by the interconnection metal layers 6 and/or 27 of the first and/or second interconnection scheme for a chip (FISC) 20 and/or (SISC) 29 of said each of its third HBM IC chips 251-3 and control chip 688 to connect one or more of its through silicon vias (TSV) 157 to one or more of its bonded contacts 158 at a bottom surface of said each of its third HBM IC chips 251-3 and control chip 688. An underfill 694, e.g., a polymer, may be provided between each neighboring two of its third HBM IC chips 251-3 to enclose its bonded contacts 158 therebetween and between the bottommost one of its third HBM IC chips 251-3 and its control chip 688 to enclose its bonded contacts 158 therebetween. A molding compound 695, e.g. a polymer, may be formed around its third HBM IC chips 251-3 and over its control chip 688, wherein the topmost one of its third HBM IC chips 251-3 may have a top surface coplanar with a top surface of its molding compound 695.

Referring to FIG. 15A, for the first type of memory module 159, each of its third HBM IC chips 251-3 may have a data bit-width, equal or greater than 64, 128, 256, 512, 1024, 2048, 4096, 8K, or 16K, with external circuits of the memory module 159 via its micro-bumps or micro-pillars 34. The first type of memory module 159 may include multiple vertical interconnects 699 each composed of one of the through silicon vias (TSV) 157 in each of its third HBM IC chips 251-3.

Referring to FIG. 15A, for each of the vertical interconnects 699 of the first type of memory module 159, its through silicon vias (TSV) 157 in the third HBM IC chips 251-3 of the first type of memory module 159 are aligned with each other or one another and are connected to one or more transistors of the semiconductor devices 4 of the third HBM IC chips 251-3 of the first type of memory module 159.

Referring to FIG. 15A, for the first type of memory module 159, each of its third HBM IC chips 251-3 and control chip 688 may be provided with one or more small I/O circuits, having driving capability, loading, output capacitance or input capacitance between 0.05 pF and 2 pF, or 0.05 pF and 1 pF, or smaller than 2 pF or 1 pF, coupling to one of its vertical interconnects 699.

Referring to FIG. 15A, for the first type of memory module 159, its control chip 688 may be configured to control data access to its third HBM IC chips 251-3. Its control chip 688 may be used for buffering and controlling its third HBM IC chips 251-3. Its control chip 688 may include the through silicon vias (TSV) 157 in the semiconductor substrate 2 of its control chip 688, each aligned with and connected to one of its micro-bumps or micro-pillars 34 on the bottom surface of its control chip 688.

Second Type of Memory Module

Figure 16C:
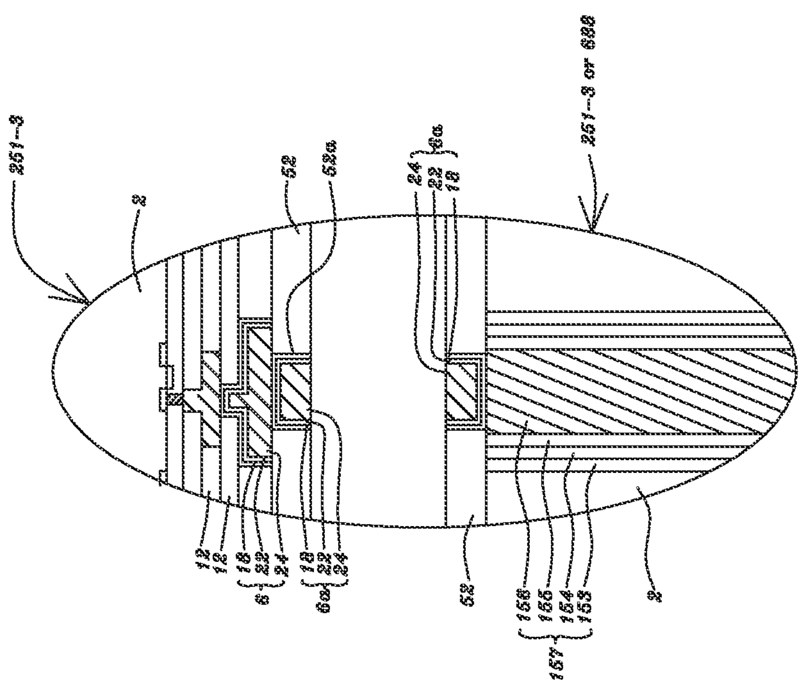
FIGS. 16C and 16D are schematically cross-sectional views showing a direct bonding process in accordance with an embodiment of the present application.
Figure 16D:
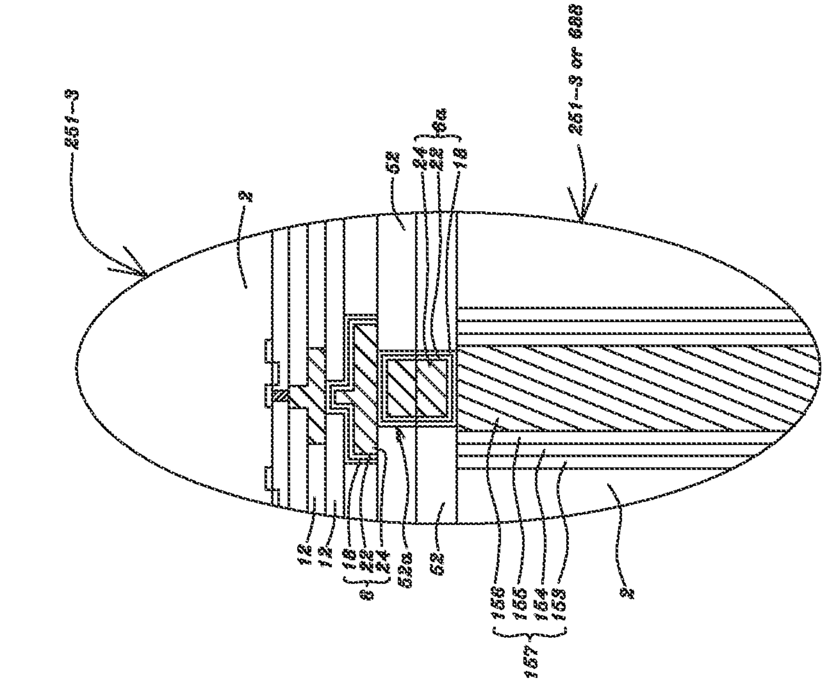

Alternatively, FIG. 15B is a schematically cross-sectional view showing a second type of memory module in accordance with another embodiment of the present application. For each of the first through third types of standard commodity logic drives 300 as illustrated in FIGS. 10A-10C, each of its first and/or second memory modules 159-1 and/or 159-2 may be a second type of memory module 159 as seen in FIG. 15B. The second type of memory module 159 may have a structure similar to the first type of memory module 159 as illustrated in FIG. 15A. For an element indicated by the same reference number shown in FIGS. 15A and 15B, the specification of the element as seen in FIG. 15B may be referred to that of the element as illustrated in FIG. 15A. The difference between the first and second types of memory modules 159 as seen in FIGS. 15A and 15B is that a direct bonding process may be performed for the second type of memory module 159 as seen in FIG. 15B. FIGS. 16C and 16D are schematically cross-sectional views showing a direct bonding process in accordance with an embodiment of the present application. Referring to FIGS. 15B, 16C and 16D, each of the third HBM IC chips 251-3 and control chip 688 of the second type of memory module 159 may have the structure as illustrated in FIG. 14F, which may include the through silicon vias (TSV) 157 in its semiconductor substrate 2, each aligned with its metal pads 6*a* at its active side and backside.

Referring to FIGS. 15B, 16C and 16D, for the second type of memory module 159, an upper one of its third HBM IC chips 251-3 may join a lower one of its third HBM IC chips 251-3 and control chip 688 by (1) activating a joining surface, i.e., silicon oxide, of the insulating bonding layer 52 at the active side of the upper one of its third HBM IC chips 251-3 and a joining surface, i.e., silicon oxide, of the insulating bonding layer 52 at the backside of the lower one of its third HBM IC chips 251-3 and control chip 688 with nitrogen plasma for increasing hydrophilic property thereof, (2) next rinsing the joining surface of the insulating bonding layer 52 at the active side of the upper one of its third HBM IC chips 251-3 and the joining surface of the insulating bonding layer 52 at the backside of the lower one of its third HBM IC chips 251-3 and control chip 688 with deionized water for water adsorption and cleaning, (3) next placing the upper one of its third HBM IC chips 251-3 onto the lower one of its third HBM IC chips 251-3 and control chip 688 with each of the metal pads 6*a* at the active side of the upper one of its third HBM IC chips 251-3 in contact with one of the metal pads 6*a* at the backside of the lower one of its third HBM IC chips 251-3 and control chip 688 and with the joining surface of the insulating bonding layer 52 at the active side of the upper one of its third HBM IC chips 251-3 in contact with the joining surface of the insulating bonding layer 52 at the backside of the lower one of its third HBM IC chips 251-3 and control chip 688, and (4) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the upper one of its third HBM IC chips 251-3 to the joining surface of the insulating bonding layer 52 at the backside of the lower one of its third HBM IC chips 251-3 and control chip 688 and (b) copper-to-copper bonding at a temperature between 300 and 350 degrees Celsius and for a time period between 10 and 60 minutes to bond the copper layer 24 of each of the metal pads 6*a* at the active side of the upper one of its third HBM IC chips 251-3 to the copper layer 24 of one of the metal pads 6*a* at the backside of the lower one of its third HBM IC chips 251-3 and control chip 688, wherein the oxide-to-oxide bonding may be caused by water desorption from reaction between the joining surface of the insulating bonding layer 52 at the active side of the upper one of its third HBM IC chips 251-3 and the joining surface of the insulating bonding layer 52 at the backside of the lower one of its third HBM IC chips 251-3, and the copper-to-copper bonding may be caused by metal inter-diffusion between the copper layer 24 of the metal pads 6*a* at the active side of the upper one of its third HBM IC chips 251-3 and the copper layer 24 of the metal pads 6*a* at the backside of the lower one of its third HBM IC chips 251-3 and control chip 688.

Embodiment for Semiconductor Wafer for Standard Commodity FPGA IC Chips

First Type of Semiconductor Wafer

Figure 17A:
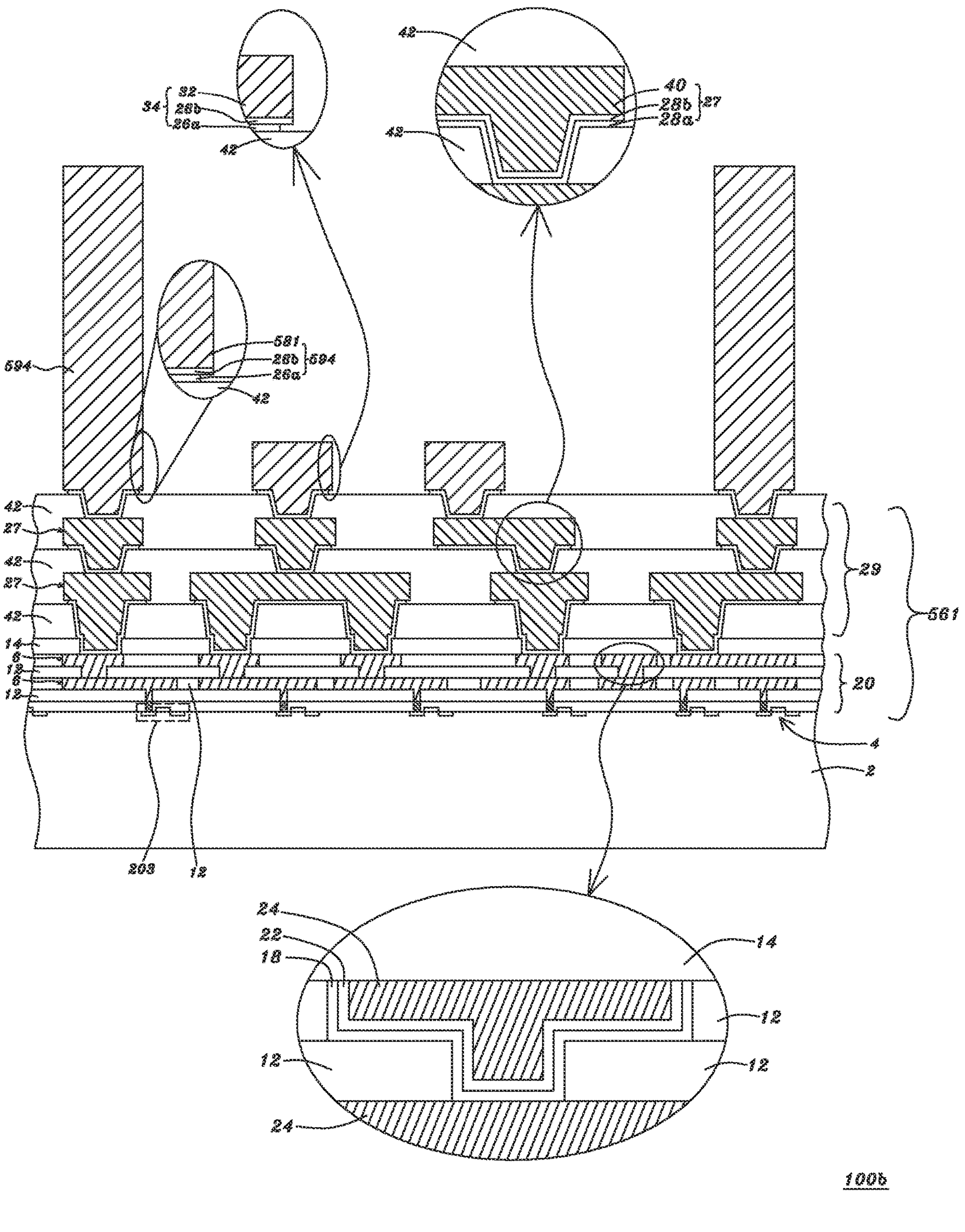
FIGS. 17A and 17B are schematically cross-sectional views showing a first type of semiconductor wafers in accordance with an embodiment of the present application.
Figure 17B:
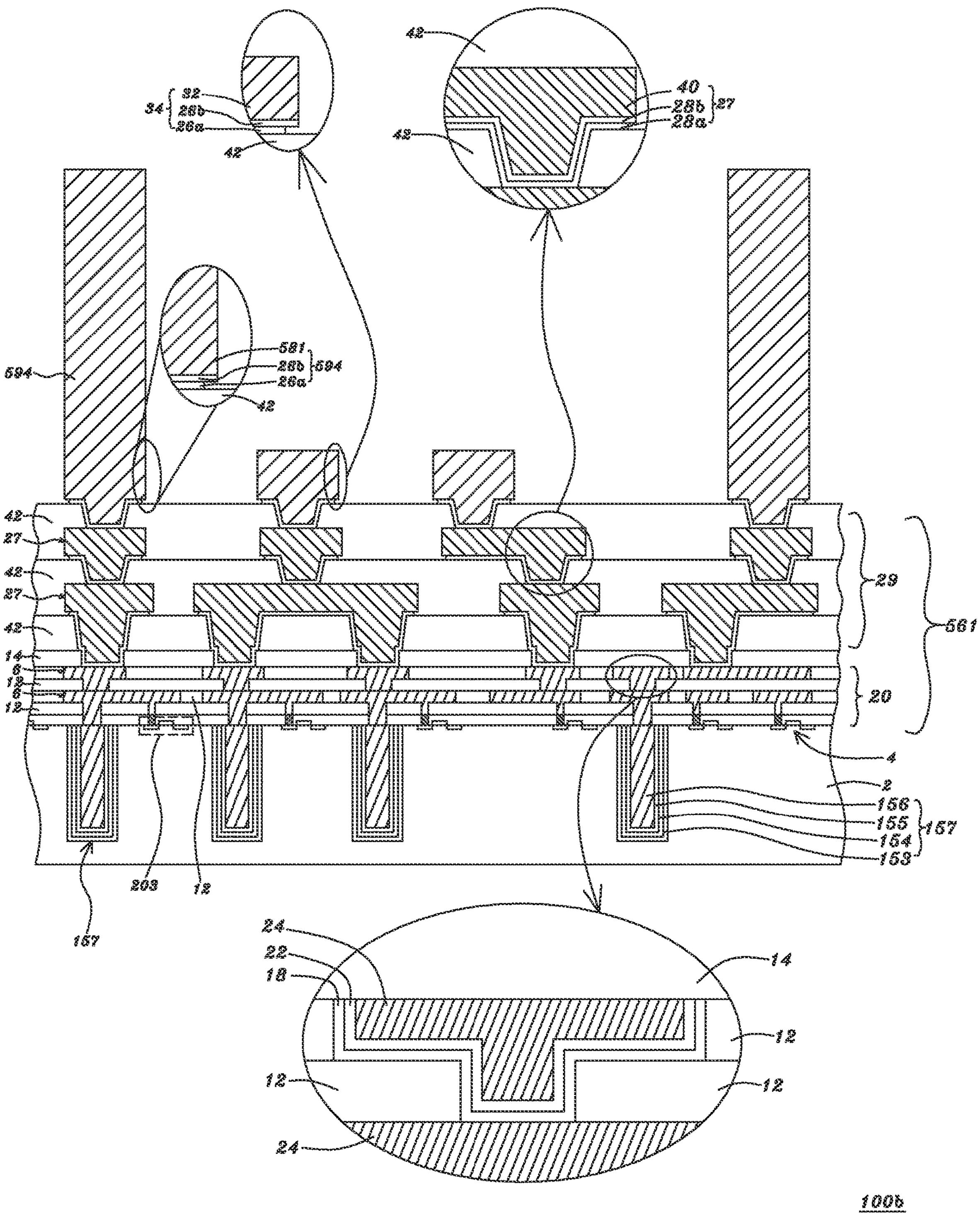

FIGS. 17A and 17B are schematically cross-sectional views showing a first type of semiconductor wafers in accordance with an embodiment of the present application. Referring to FIG. 17A, a first type of semiconductor wafer 100*b* may include (1) a semiconductor substrate 2, such as silicon wafer; (2) multiple semiconductor devices 4, such as transistors or passive devices, on its semiconductor substrate 2, which may compose the multiplexer 211 of the programmable logic cells (LC) 2014, the memory cells 490 of the programmable logic cells (LC) 2014, the memory cells 362 for the cross-point switches 379 and the small I/O circuits 203, as illustrated in FIGS. 1A-8B, for standard commodity FPGA IC chips 200, (3) a first interconnection scheme for a chip (FISIP) 20 over its semiconductor substrate 2, provided with one or more interconnection metal layers 6 coupling to its semiconductor devices 4 and one or more insulating dielectric layers 12 each between neighboring two of the interconnection metal layers 6, wherein the specification and process for the interconnection metal layers 6 and insulating dielectric layers 12 of its first interconnection scheme for a chip (FISC) 20 may be referred to those as illustrated in FIG. 14A; (4) a passivation layer 14 over its first interconnection scheme for a chip (FISC) 20, wherein multiple openings in the passivation layer 14 may be aligned with and over multiple metal pads of the topmost one of the interconnection metal layers 6 of the first interconnection scheme for a chip (FISC) 20 respectively, wherein the specification and process for its passivation layer 14 may be referred to those as illustrated in FIG. 14A; (5) a second interconnection scheme for a chip (SISC) 29 optionally provided over its passivation layer 14, provided with one or more interconnection metal layers 27 coupling to the interconnection metal layers 6 of its first interconnection scheme for a chip (FISC) 20 through the openings in its passivation layer 14 and one or more polymer layers 42 each between neighboring two of its interconnection metal layers 27, under a bottommost one of its interconnection metal layers 27 or over a topmost one of its interconnection metal layers 27, wherein multiple openings 42*a* in the topmost one of its polymer layers 42 may be aligned with and over multiple metal pads of the topmost one of the interconnection metal layers 27 of its second interconnection scheme for a chip (SISC) 29, wherein the specification and process for the interconnection metal layers 27 and polymer layers 42 of its second interconnection scheme for a chip (SISC) 29 may be referred to those as illustrated in FIG. 14A; (6) multiple first, second or fourth type of micro bumps or micro-pillars 34 as illustrated in FIG. 14A on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20; and (7) multiple through package vias on a chip (TPVCs) 594, i.e., through package metal posts or pillars, on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20, wherein each of its through package vias on a chip (TPVCs) 594 may include an adhesion layer 26*a*, such as titanium (Ti) or titanium nitride (TiN) layer having a thickness of between 1 nm and 50 nm, on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20, a seed layer 26*b*, such as copper, on its adhesion layer 26*a* and a copper layer 581 having a thickness of between 20 μm and 300 μm, 30 μm and 200 μm, 50 μm and 150 μm, 50 μm and 120 μm, 20 μm and 100 μm, 20 μm and 60 μm, 20 μm and 40 μm, or 20 μm and 30 μm, or greater than or taller than or equal to 100 μm, 50 μm, 30 μm or 20 μm on its seed layer 26*b*. For the first type of semiconductor wafer 100*b*, each of its through package vias on a chip (TPVCs) 594 may have a height taller than each of its first, second or fourth type of micro-bumps or micro-pillars 34 by greater than 20 micrometers or 50 micrometers.

Alternatively, referring to FIG. 17B, the first type of semiconductor wafer 100*b* may include the structure as mentioned in FIG. 17A and further include multiple metal vias 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. Each of the through silicon vias (TSV) 157 may include (1) an electroplated copper layer 156 having a depth, for example, between 10 nm and 3,000 nm, between 10 nm and 1,000 nm or between 10 nm and 500 nm in the semiconductor substrate 2 of the semiconductor wafer 100*b*, (2) an insulating lining layer 153, such as thermally grown silicon oxide ($SiO_2$) and/or CVD silicon nitride ($Si_3N_4$) at a bottom and sidewall of its electroplated copper layer 156, (3) an adhesion layer 154, such as titanium (Ti) or titanium nitride (TiN) layer having a thickness between 1 nm to 50 nm, at the bottom and sidewall of its electroplated copper layer 156 and between its electroplated copper layer 156 and its insulating lining layer 153, and (4) an electroplating seed layer 155, such as copper seed layer 155 having a thickness between 3 nm and 200 nm, at the bottom and sidewall of its electroplated copper layer 156 and between its electroplated copper layer 156 and its adhesion layer 154.

Second Type of Semiconductor Wafer

Figure 17C:
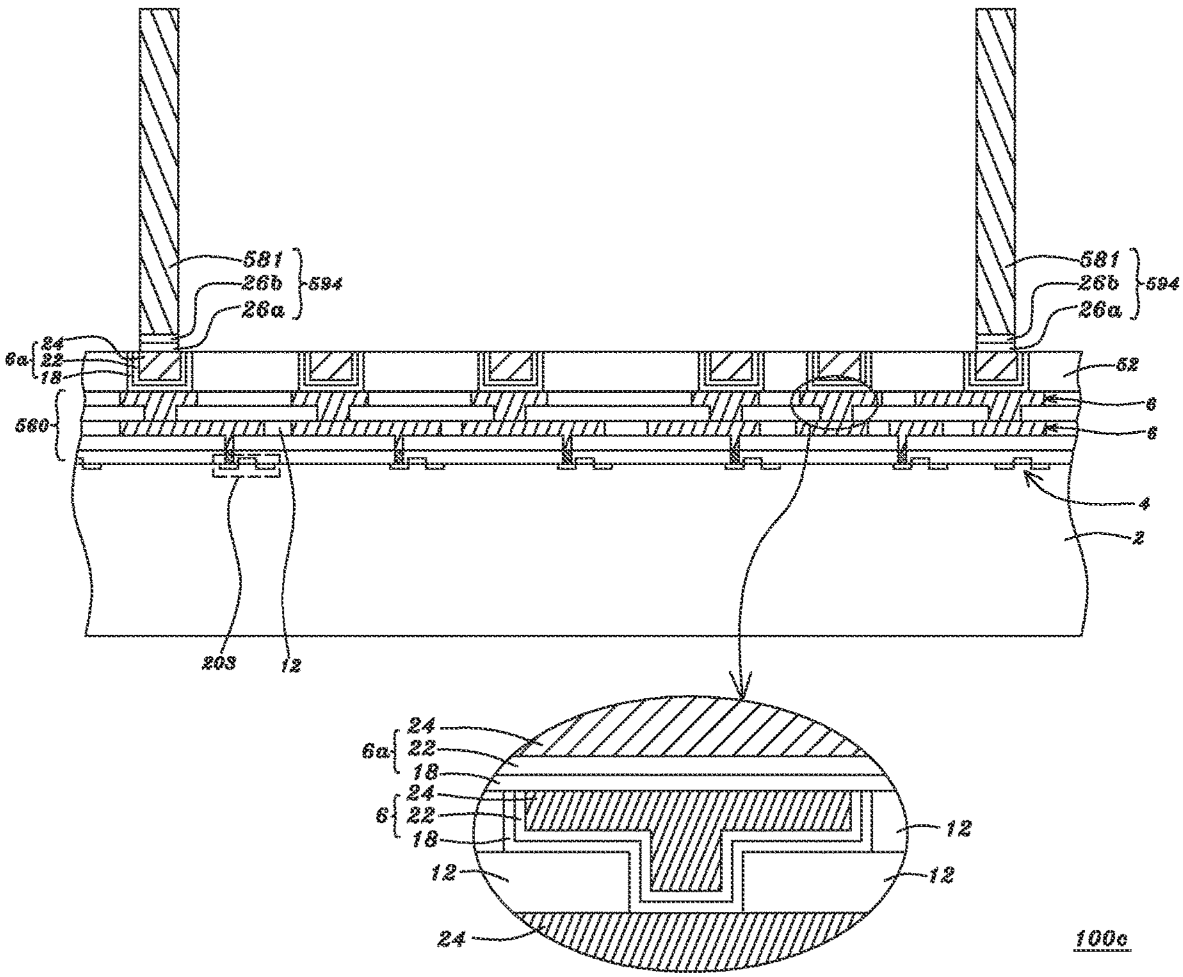
FIGS. 17C and 17D are schematically cross-sectional views showing a second type of semiconductor wafers in accordance with another embodiment of the present application.
Figure 17D:
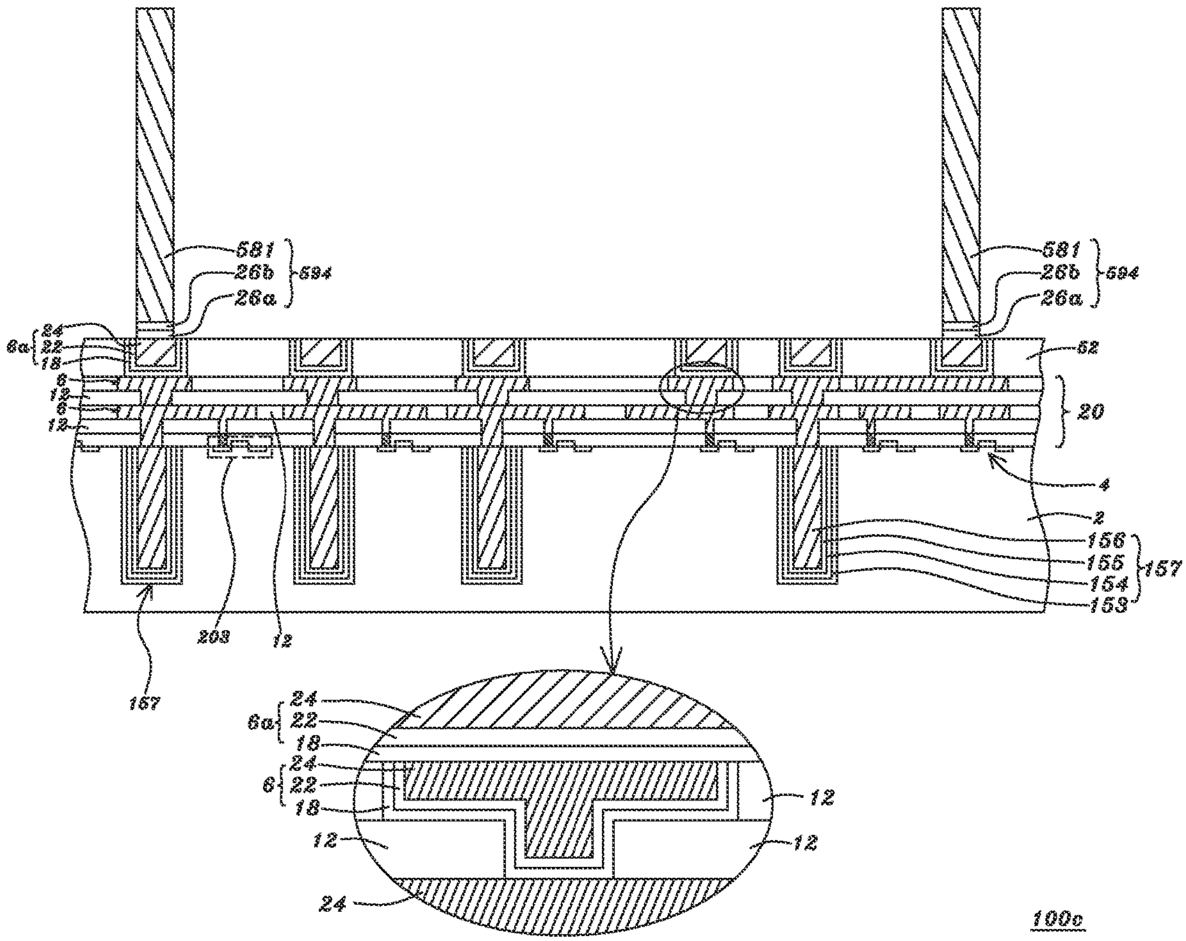

FIGS. 17C and 17D are schematically cross-sectional views showing a second type of semiconductor wafers in accordance with another embodiment of the present application. Referring to FIG. 17C, a second type of semiconductor wafer 100c may include the semiconductor substrate 2, semiconductor devices 4 and first interconnection scheme for a chip (FISC) 20 as illustrated in FIG. 17A. Further, the second type of semiconductor wafer 100c may include an insulating bonding layer 52 on the topmost one of the insulating dielectric layers 12 of its first interconnection scheme for a chip (FISC) 20 and (2) multiple metal pads 6a in multiple openings 52a in its insulating bonding layer 52 and on the topmost one of the interconnection metal layers 6 of its first interconnection scheme for a chip (FISC) 20. Its insulating bonding layer 52 may include a silicon-oxide layer having a thickness between 0.1 and 2 μm on the topmost one of the insulating dielectric layers 12 of its first interconnection scheme for a chip (FISC) 20. Each of its metal pads 6a may include (1) a copper layer 24 having a thickness of between 3 nm and 500 nm in one of the openings 52a in its insulating bonding layer 52, (2) an adhesion layer 18, such as titanium or titanium nitride having a thickness of between 1 nm and 50 nm, at a bottom and sidewall of the copper layer 24 of said each of its metal pads 6a and on the topmost one of the interconnection metal layers 6 of its first interconnection scheme for a chip (FISC) 20, and (3) a seed layer 22, such as copper, between the copper layer 24 and adhesion layer 18 of said each of its metal pads 6a, wherein the copper layer 24 of said each of its metal pads 6a may have a top surface substantially coplanar with a top surface of the silicon-oxide layer of its insulating bonding layer 52. Further, the second type of semiconductor wafer 100c may include multiple through package vias on a chip (TPVCs) 594, i.e., through package metal posts or pillars, on its metal pads 6a, wherein each of its through package vias (TPVs) 582 may include an adhesion layer 26a, such as titanium (Ti) or titanium nitride (TiN) layer having a thickness of between 1 nm and 50 nm, on the copper layer 24 of its metal pads 6a, a seed layer 26b, such as copper, on its adhesion layer 26a and a copper layer 581 having a thickness of between 20 μm and 300 μm, 30 μm and 200 μm, 50 μm and 150 μm, 50 μm and 120 μm, 20 μm and 100 μm, 20 μm and 60 μm, 20 μm and 40 μm, or 20 μm and 30 μm, or greater than or taller than or equal to 100 μm, 50 μm, 30 μm or 20 μm on its seed layer 26b.

Alternatively, referring to FIG. 17D, the second type of semiconductor wafer 100c may include the structure as mentioned in FIG. 17C and further include multiple metal vias 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. The specification and process for its through silicon vias (TSV) 157 may be referred to those as illustrated in FIG. 17B.

Process for Fabricating Operation Module (FPGA/HBM stacked 3D Chip-Scale-Package (CSP))

First Type of Operation Module

Figure 18A:
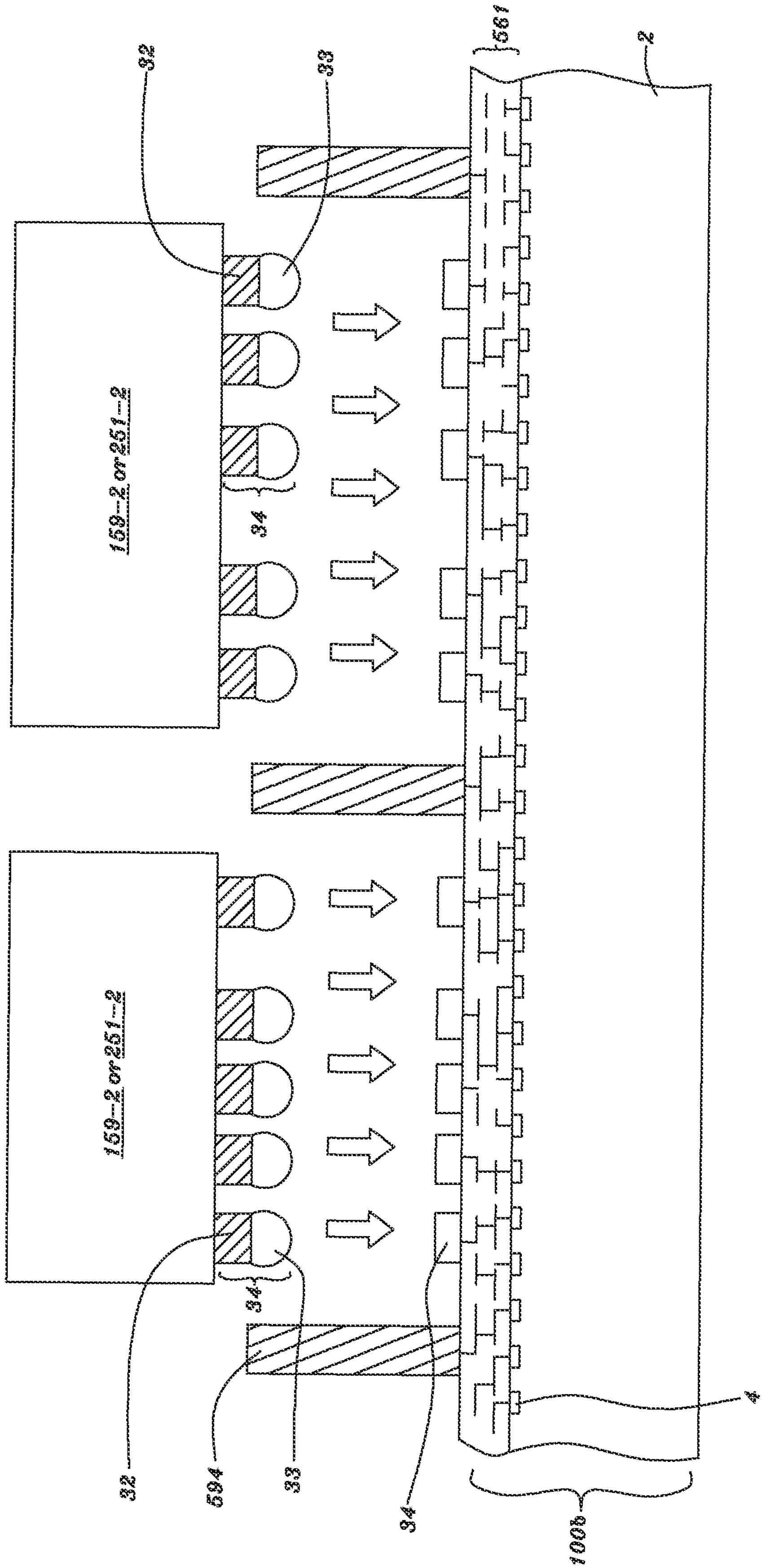
FIGS. 18A-18E are schematic views showing a process for forming a first type of operation module, i.e., FPGA/HBM stacked 3D chip scale package (CSP), in accordance with an embodiment of the present application.
Figure 18B:
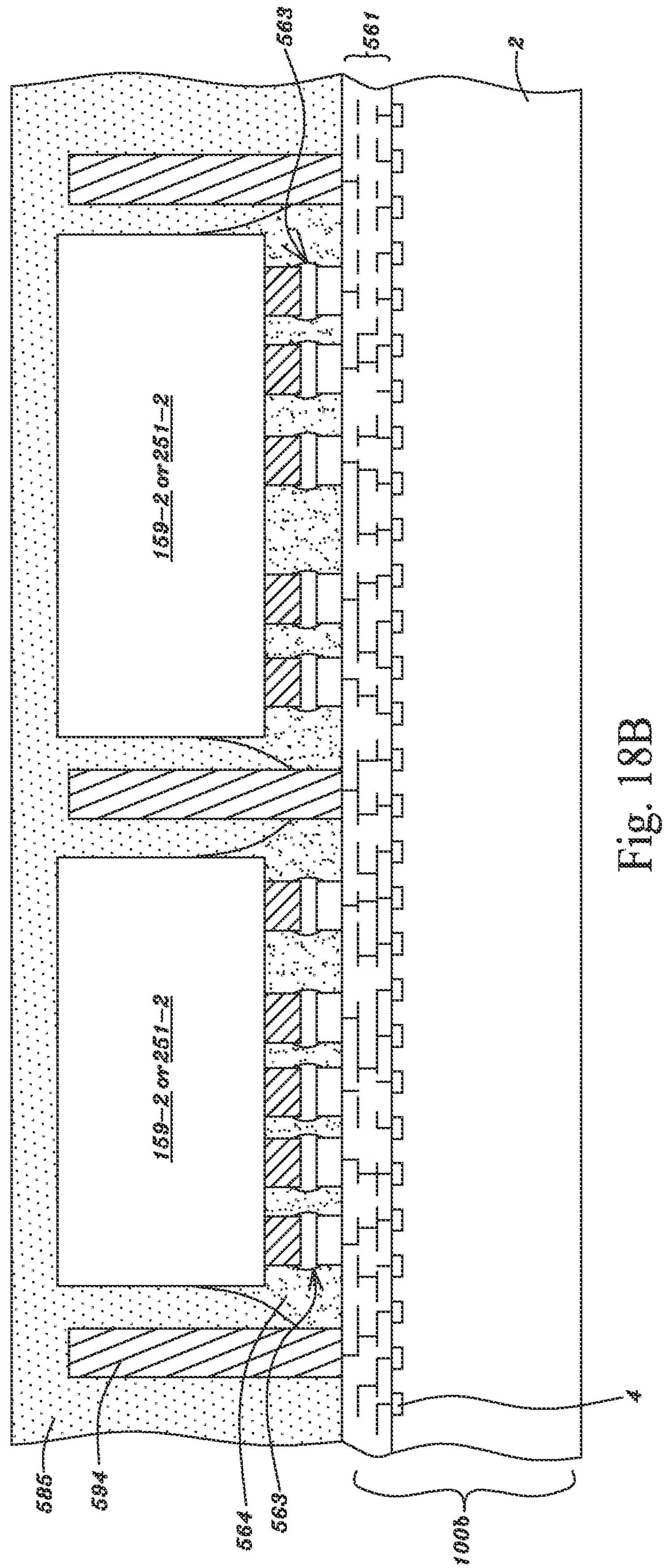

FIGS. 18A-18E are schematic views showing a process for forming a first type of operation module, i.e., FPGA/HBM stacked 3D chip scale package (CSP), in accordance with an embodiment of the present application. Referring to FIGS. 18A and 18B, multiple first type of second memory modules 159-2 (only one is shown) each having the structure as illustrated in FIG. 15A may be provided, each having the first, second or third type of micro-bumps or micro-pillars 34 to be bonded to the first, second or fourth type of micro-bumps or micro-pillars 34 preformed at an active side of the first type of semiconductor wafer 100b as illustrated in FIGS. 17A and 17B into multiple bonded contacts 563 therebetween. The first type of semiconductor wafer 100b is shown in FIG. 18A with an interconnection scheme 561, composed of the interconnection metal layers 6 and insulating dielectric layers 12 of its first interconnection scheme for a chip (FISC) 20 and/or the interconnection metal layers 27 and polymer layers 42 of its second interconnection scheme for a chip (SISC) 29 as illustrated in FIG. 17A. Alternatively, each of the first type of second memory modules 159-2 may be replaced with a known-good memory chip, such as second HBM IC chips 251-2, having the structure as illustrated in FIG. 14A or 14B. Each of the known-good second HBM IC chips 251-2 may have the first, second or third type of micro-bumps or micro-pillars 34 to be bonded to the first, second or fourth type of micro-bumps or micro-pillars 34 preformed at the active side of the first type of semiconductor wafer 100b as illustrated in FIGS. 17A and 17B into multiple bonded contacts 563 therebetween.

Figure 19B:
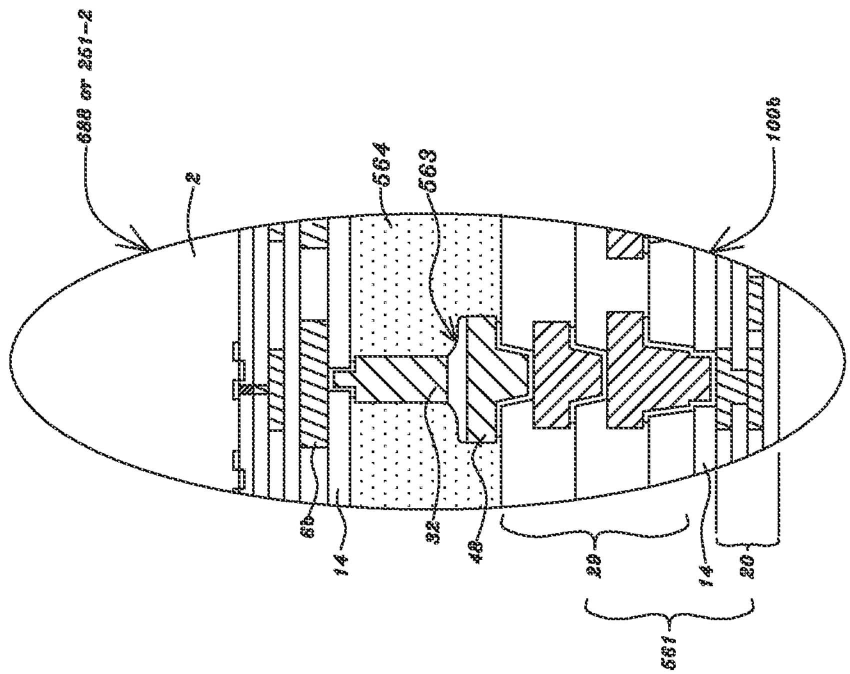
FIGS. 19A and 19B are schematically cross-sectional views showing a process of bonding a thermal compression bump to a thermal compression pad in accordance with an embodiment of the present application.
Figure 19A:
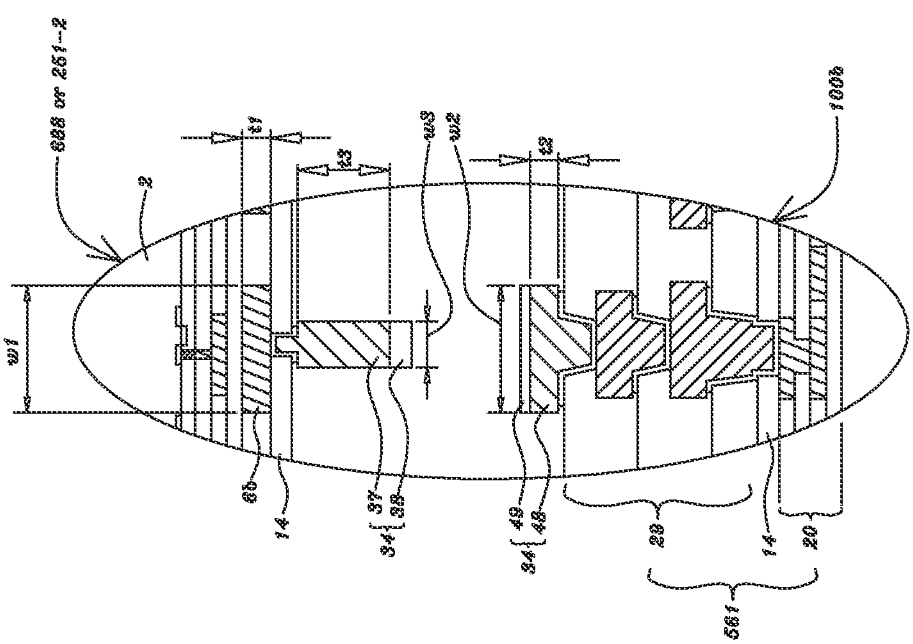

FIGS. 19A and 19B are schematically cross-sectional views showing a process of bonding a thermal compression bump to a thermal compression pad in accordance with an embodiment of the present application. For a first case, referring to FIGS. 18A, 18B, 19A and 19B, each of the first type of second memory modules 159-2, or known-good second HBM IC chips 251-2, may have the third type of micro-bumps or micro-pillars 34 to be bonded to the fourth type of micro-bumps or micro-pillars 34 of the first type of semiconductor wafer 100b as illustrated in FIGS. 17A and 17B. For example, the third type of micro-bumps or micro-pillars 34 of said each of the first type of second memory modules 159-2, or known-good second HBM IC chips 251-2, may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pillars 34 of the first type of semiconductor wafer 100b into multiple bonded contacts 563 between said each of the first type of second memory modules 159-2, or known-good second HBM IC chips 251-2, and the first type of semiconductor wafer 100b. Each of the third type of micro-bumps or micro-pillars 34 of said each of the first type of second memory modules 159-2, or known-good second HBM IC chips 251-2, may have the copper layer 37 having the thickness t3 greater than the thickness t2 of the copper layer 48 of each of the fourth type of micro-bumps or micro-pillars 34 of the first type of semiconductor wafer 100b and having the largest transverse dimension w3 equal to between 0.7 and 0.1 times of the largest transverse dimension w2 of the copper layer 48 of each of the fourth type of micro-bumps or micro-pillars 34 of the first type of semiconductor wafer 100b. Alternatively, each of the third type of micro-pillars or micro-bumps 34 of said each of the first type of second memory modules 159-2, or known-good second HBM IC chips 251-2, may be provided with the copper layer 37 having a cross-sectional area equal to between 0.5 and 0.01 times of the cross-sectional area of the copper layer 48 of each of the fourth type of micro-bumps or micro-pillars 34 of the first type of semiconductor wafer 100b.

For example, referring to FIGS. 18A, 18B, 19A and 19B, for each of the first type of second memory modules 159-2 to be bonded to the first type of semiconductor wafer 100b, its third type of micro-bumps or micro-pillars 34 may be formed respectively on a front surface of the metal pads 6b provided by the frontmost one of the interconnection metal layers 27 of the second interconnection scheme for a chip (SISC) 29 of its control chip 688 or by, if the second interconnection scheme for a chip (SISC) 29 is not provided for its control chip 688, the frontmost one of the interconnection metal layers 6 of the first interconnection scheme for a chip (FISC) 20 of its control chip 688, wherein each of its third type of micro-bumps or micro-pillars 34 may be provided with the copper layer 37 having the thickness t3 greater than the thickness t1 of each of the metal pads 6*b* of its control chip 688 and having the largest transverse dimension w3 equal to between 0.7 and 0.1 times of the largest transverse dimension w1 of each of the metal pads 6*b* of its control chip 688; alternatively, each of its third type of micro-bumps or micro-pillars 34 may be provided with the copper layer 37 having a cross-sectional area equal to between 0.5 and 0.01 times of the cross-sectional area of each of the metal pads 6*b* of its control chip 688; each of the metal pads 6*b* of its control chip 688 may have a thickness t1 between 1 and 10 micrometers or between 2 and 10 micrometers and a largest transverse dimension w1, such as diameter in a circular shape, between 1 μm and 15 μm, such as 5 μm.

Referring to FIGS. 18A, 18B, 19A and 19B, for each of the known-good second HBM IC chips 251-2 to be bonded to the first type of semiconductor wafer 100*b*, its third type of micro-bumps or micro-pillars 34 may be formed respectively on a front surface of its metal pads 6*b* provided by the frontmost one of the interconnection metal layers 27 of its second interconnection scheme for a chip (SISC) 29 or by, if the second interconnection scheme for a chip (SISC) 29 is not provided, the frontmost one of the interconnection metal layers 6 of its first interconnection scheme for a chip (FISC) 20, wherein each of its third type of micro-bumps or micro-pillars 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pillars 34 may be provided with the copper layer 37 having a cross-sectional area equal to between 0.5 and 0.01 times of the cross-sectional area of its metal pads 6*b*; each of its metal pads 6*b* may have a thickness t1 between 1 and 10 micrometers or between 2 and 10 micrometers and a largest transverse dimension w1, such as diameter in a circular shape, between 1 μm and 15 μm, such as 5 μm.

Referring to FIGS. 18A, 18B, 19A and 19B, a bonded solder between the copper layers 37 and 48 of each of the bonded contacts 563 may be mostly kept on a top surface of the copper layer 48 of one of the fourth type of micro-bumps or micro-pillars 34 of the first type of semiconductor wafer 100*b* and extends out of the edge of the copper layer 48 of said one of the fourth type of micro-bumps or micro-pillars 34 of the first type of semiconductor wafer 100*b* less than 0.5 micrometers. Thus, a short between neighboring two of the bonded contacts 563 even in a fine-pitched fashion may be avoided.

Alternatively, for a second case, referring to FIGS. 18A and 18B, each of the first type of second memory modules 159-2, or known-good second HBM IC chips 251-2, may have the second type of micro-bumps or micro-pillars 34 to be bonded to the first type of micro-bumps or micro-pillars 34 of the first type of semiconductor wafer 100*b* as illustrated in FIGS. 17A and 17B. For example, the second type of micro-bumps or micro-pillars 34 of said each of the first type of second memory modules 159-2, or known-good second HBM IC chips 251-2, may have the solder caps 33 to be bonded onto the electroplated copper layer 32 of the first type of micro-bumps or micro-pillars 34 of the first type of semiconductor wafer 100*b* into multiple bonded contacts 563 between said each of the first type of second memory modules 159-2, or known-good second HBM IC chips 251-2, and the first type of semiconductor wafer 100*b*. Each of the second type of micro-bumps or micro-pillars 34 of said each of the first type of second memory modules 159-2, or known-good second HBM IC chips 251-2, may have the electroplated copper layer 32 having a thickness greater than that of the electroplated copper layer 32 of each of the first type of micro-bumps or micro-pillars 34 of the first type of semiconductor wafer 100*b*.

Alternatively, for a third case, referring to FIGS. 18A and 18B, each of the first type of second memory modules 159-2, or known-good second HBM IC chips 251-2, may have the first type of micro-bumps or micro-pillars 34 to be bonded to the second type of metal bumps or pillars 34 of the first type of semiconductor wafer 100*b* as illustrated in FIGS. 17A and 17B. For example, the first type of micro-bumps or micro-pillars 34 of said each of the first type of second memory modules 159-2, or known-good second HBM IC chips 251-2, may have the electroplated metal layer 32, e.g. copper layer, to be bonded onto the solder caps 33 of the second type of micro-bumps or micro-pillars 34 of the first type of semiconductor wafer 100*b* into multiple bonded contacts 563 between said each of the first type of second memory modules 159-2, or known-good second HBM IC chips 251-2, and the first type of semiconductor wafer 100*b*. Each of the first type of micro-bumps or micro-pillars 34 of said each of the first type of second memory modules 159-2, or known-good second HBM IC chips 251-2, may have the electroplated copper layer 32 having a thickness greater than that of the electroplated copper layer 32 of each of the second type of micro-bumps or micro-pillars 34 of the first type of semiconductor wafer 100*b*.

Alternatively, for a fourth case, referring to FIGS. 18A and 18B, each of the first type of second memory modules 159-2, or known-good second HBM IC chips 251-2, may have the second type of micro-bumps or micro-pillars 34 to be bonded to the second type of micro-bumps or micro-pillars 34 of the first type of semiconductor wafer 100*b* as illustrated in FIGS. 17A and 17B. For example, the second type of micro-bumps or micro-pillars 34 of said each of the first type of second memory modules 159-2, or known-good second HBM IC chips 251-2, may have the solder caps 33 to be bonded onto the solder caps 33 of the second type of micro-bumps or micro-pillars 34 of the first type of semiconductor wafer 100*b* into multiple bonded contacts 563 between said each of the first type of second memory modules 159-2, or known-good second HBM IC chips 251-2, and the first type of semiconductor wafer 100*b*. Each of the second type of micro-bumps or micro-pillars 34 of said each of the first type of second memory modules 159-2, or known-good second HBM IC chips 251-2, may have the electroplated copper layer 32 having a thickness greater than that of the electroplated copper layer 32 of each of the second type of micro-bumps or micro-pillars 34 of the first type of semiconductor wafer 100*b*.

Next, referring to FIG. 18B, an underfill 564, such as epoxy resins or compounds, may be filled into a gap between each of the first type of second memory modules 159-2, or known-good second HBM IC chips 251-2, and the first type of semiconductor wafer 100*b* to enclose the bonded contacts 563 therebetween. The underfill 564 may be cured at temperature equal to or above 100, 120 or 150 degrees Celsius.

Figure 20A:
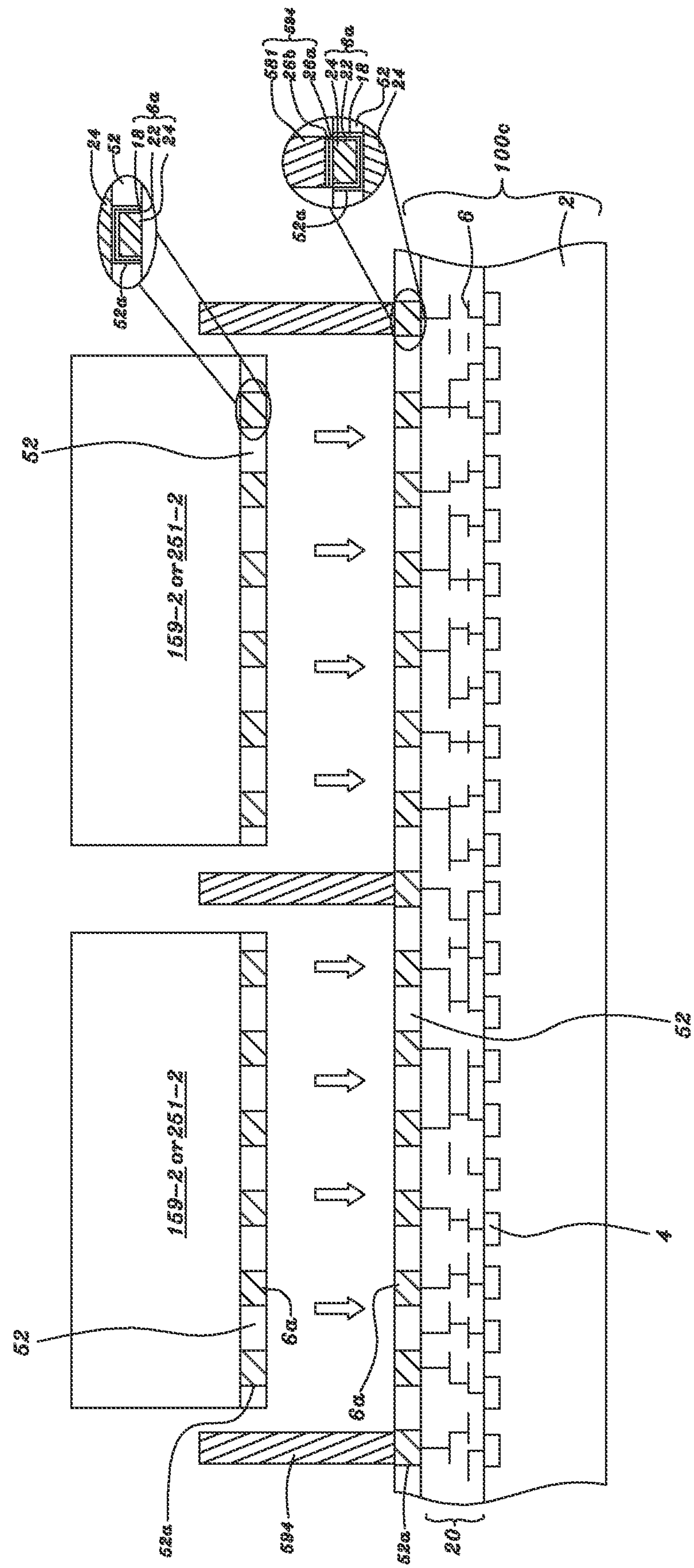
FIGS. 20A-20E are cross-sectional views showing a process for fabricating a first type of operation modules, i.e., FPGA/HBM stacked 3D chip scale packages (CSP), in accordance with another embodiment of the present application.
Figure 20B:
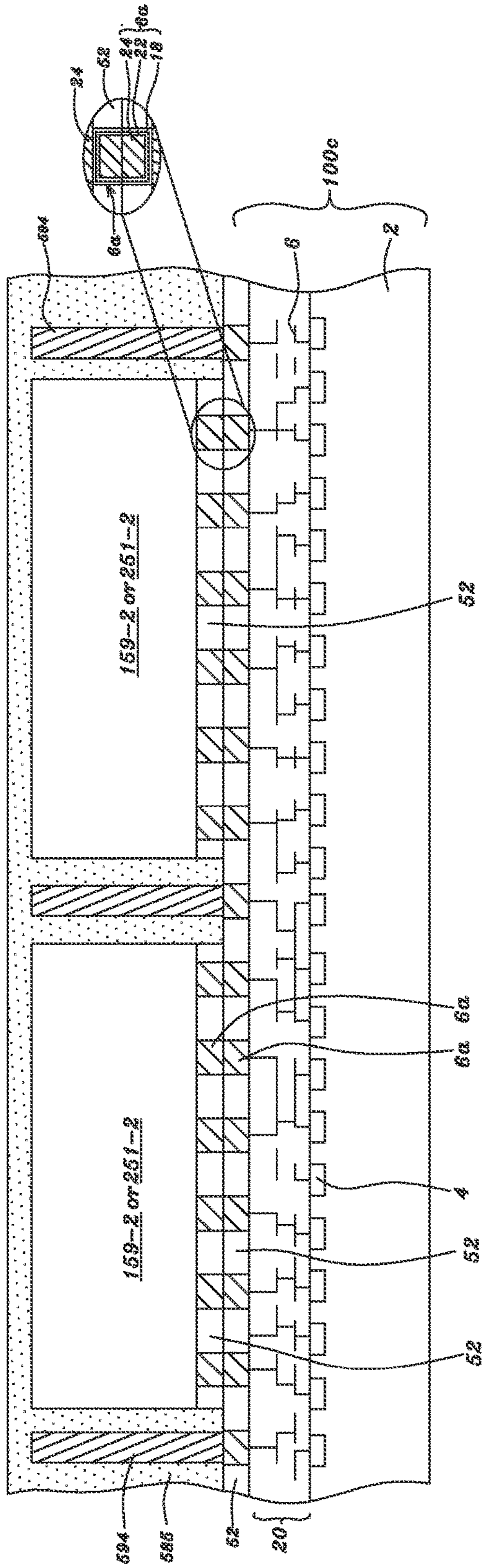

Alternatively, FIGS. 20A-20E are cross-sectional views showing a process for fabricating a first type of operation modules, i.e., FPGA/HBM stacked 3D chip scale packages (CSP), in accordance with another embodiment of the present application. Referring to FIGS. 20A and 20B, multiple second type of second memory modules 159-2 (only one is shown) each having the structure as illustrated in FIG. 15B may be provided, each having the insulating bonding layer 52 at their bottoms to be bonded to the insulating bonding layer 52 preformed at an active side of the second type of semiconductor wafer 100*c* as illustrated in FIGS. 17C and 17D and the metal pads 6*a* at their bottoms to be bonded to the metal pads 6*a* preformed at an active side of the second type of semiconductor wafer 100*c*. Alternatively, each of the second type of second memory modules 159-2 may be replaced with a known-good memory chip, such as second HBM IC chips 251-2, having the structure as illustrated in FIG. 14D or 14E. Each of the known-good second HBM IC chips 251-2 may have the insulating bonding layer 52 at their bottoms to be bonded to the insulating bonding layer 52 preformed at an active side of the second type of semiconductor wafer 100*c* and the metal pads 6*a* at their bottoms to be bonded to the metal pads 6*a* preformed at an active side of the second type of semiconductor wafer 100*c*. Before the second type of second memory modules 159-2, or known-good second HBM IC chips 251-2, join the second type of semiconductor wafer 100*c*, a joining surface, i.e., silicon oxide, of the insulating bonding layer 52 at the active side of the second type of semiconductor wafer 100*c* may be activated with nitrogen plasma for increasing a hydrophilic property thereof, and then the joining surface of the insulating bonding layer 52 at the active side of the second type of semiconductor wafer 100*c* may be rinsed with deionized water for water adsorption and cleaning. Further, a joining surface, i.e., silicon oxide, of the insulating bonding layer 52 at the active side of the control chip 688 of each of the second type of second memory modules 159-2 or at the active side of each of the known-good second HBM IC chips 251-2 may be activated with nitrogen plasma for increasing a hydrophilic property thereof, and then the joining surface of the insulating bonding layer 52 at the active side of the control chip 688 of each of the second type of second memory modules 159-2, or at the active side of each of the known-good second HBM IC chips 251-2, may be rinsed with deionized water for water adsorption and cleaning.

Next, referring to FIGS. 20A and 20B, the second type of second memory modules 159-2, or known-good second HBM IC chips 251-2, may join the second type of semiconductor wafer 100*c* by (1) picking up each of the second type of second memory modules 159-2, or known-good second HBM IC chips 251-2, to be placed on the second type of semiconductor wafer 100*c* with each of the metal pads 6*a* at the active side of the control chip 688 of each of the second type of second memory modules 159-2, or at the active side of each of the known-good second HBM IC chips 251-2, in contact with one of the metal pads 6*a* at the active side of the second type of semiconductor wafer 100*c* and with the joining surface of the insulating bonding layer 52 at the active side of the control chip 688 of each of the second type of second memory modules 159-2, or at the active side of each of the known-good second HBM IC chips 251-2, in contact with the joining surface of the insulating bonding layer 52 at the active side of the second type of semiconductor wafer 100*c*, and (2) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the control chip 688 of each of the second type of second memory modules 159-2, or at the active side of each of the known-good second HBM IC chips 251-2, to the joining surface of the insulating bonding layer 52 at the active side of the second type of semiconductor wafer 100*c* and (b) copper-to-copper bonding at a temperature between 300 and 350 degrees Celsius and for a time period between 10 and 60 minutes to bond the copper layer 24 of each of the metal pads 6*a* at the active side of the control chip 688 of each of the second type of second memory modules 159-2, or at the active side of each of the known-good second HBM IC chips 251-2, to the copper layer 24 of one of the metal pads 6*a* at the active side of the second type of semiconductor wafer 100*c*, wherein the oxide-to-oxide bonding may be caused by water desorption from reaction between the joining surface of the insulating bonding layer 52 at the active side of the control chip 688 of each of the second type of second memory modules 159-2, or at the active side of each of the known-good second HBM IC chips 251-2, and the joining surface of the insulating bonding layer 52 at the active side of the second type of semiconductor wafer 100*c*, and the copper-to-copper bonding may be caused by metal inter-diffusion between the copper layer 24 of the metal pads 6*a* at the active side of the control chip 688 of each of the second type of second memory modules 159-2, or at the active side of each of the known-good second HBM IC chips 251-2, and the copper layer 24 of the metal pads 6*a* at the active side of the second type of semiconductor wafer 100*c*.

Next, referring to FIGS. 18B and 20B, a polymer layer 585, e.g., resin or compound, may be applied to fill the gaps each between neighboring two of the first or second type of second memory modules 159-2, or known-good second HBM IC chips 251-2, and the gaps each between neighboring two of the through package vias on a chip (TPVCs) 594 and to cover the active side of the first or second type of semiconductor wafer 100*b* or 100*c* and a backside of each of the first or second type of second memory modules 159-2, or known-good second HBM IC chips 251-2, by methods, for example, spin-on coating, screen-printing, dispensing or molding. The polymer layer 585 may be, for example, polyimide, BenzoCycloButene (BCB), parylene, epoxy based material or compound, photo epoxy SU-8, elastomer, or silicone. The polymer layer 585 may be cured or cross-linked at a temperature higher than or equal to 50, 70, 90, 100, 125, 150, 175, 200, 225, 250, 275 or 300 degrees Celsius.

Figure 18C:
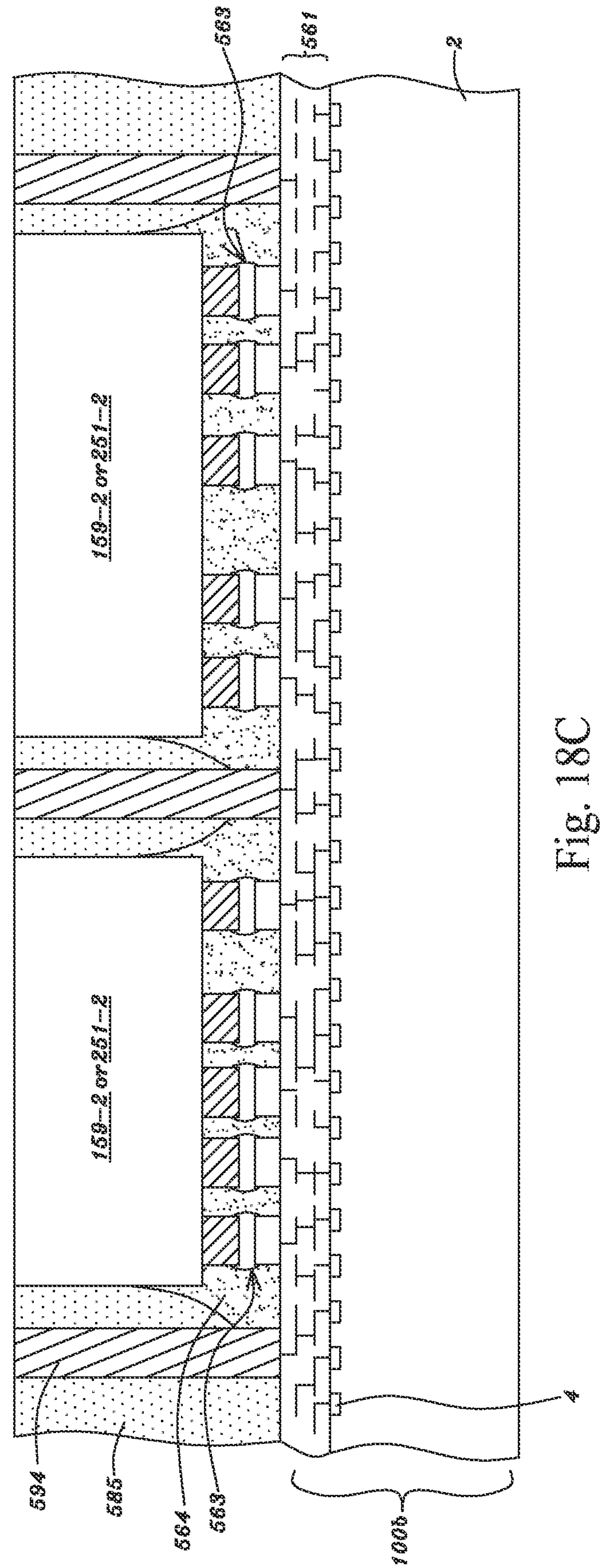
Figure 20C:
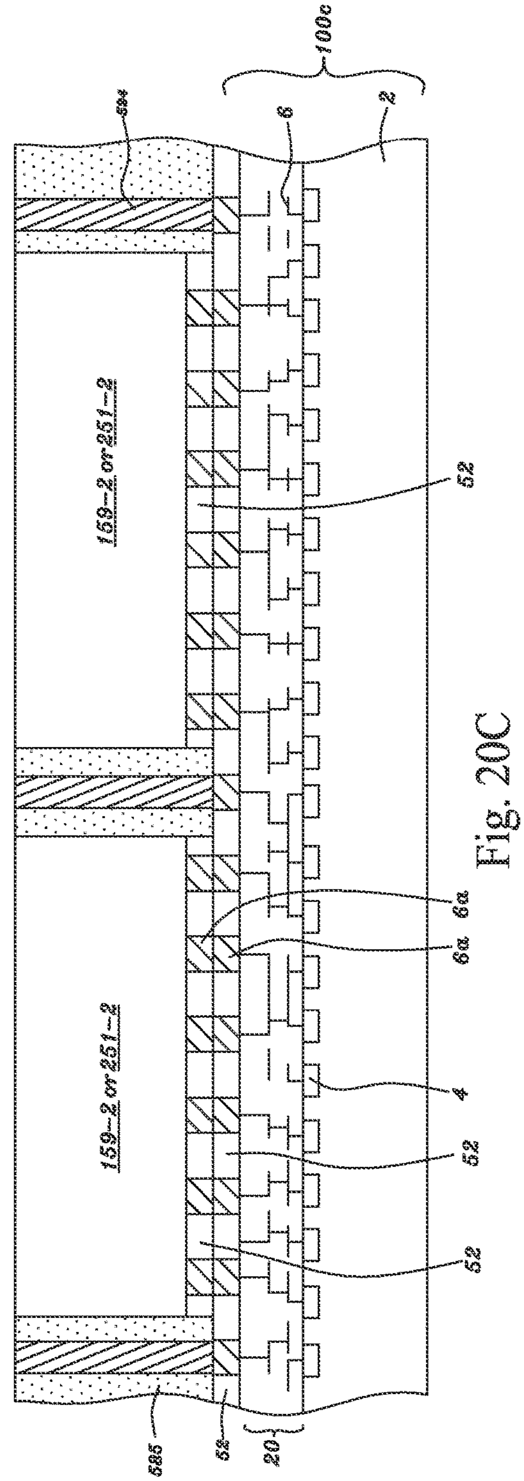

Next, referring to FIGS. 18C and 20C, a chemical mechanical polishing (CMP), polishing or grinding process may be applied to remove a top portion of the polymer layer 585 and a top portion of each of the first or second type of second memory modules 159-2, or known-good second HBM IC chips 251-2, to expose a top surface of the topmost one of the third HBM IC chips 251-3 of each of the first or second type of second memory modules 159-2, or the top surface of each of the known-good second HBM IC chips 251-2, and a top surface of the copper layer 581 of each of the through package vias on a chip (TPVCs) 594 to planarize a top surface of the polymer layer 585, the top surface of the topmost one of the third HBM IC chips 251-3 of each of the first or second type of second memory modules 159-2, or the top surface of each of the known-good second HBM IC chips 251-2, and the top surface of the copper layer 581 of each of the through package vias on a chip (TPVCs) 594.

Figure 18D:
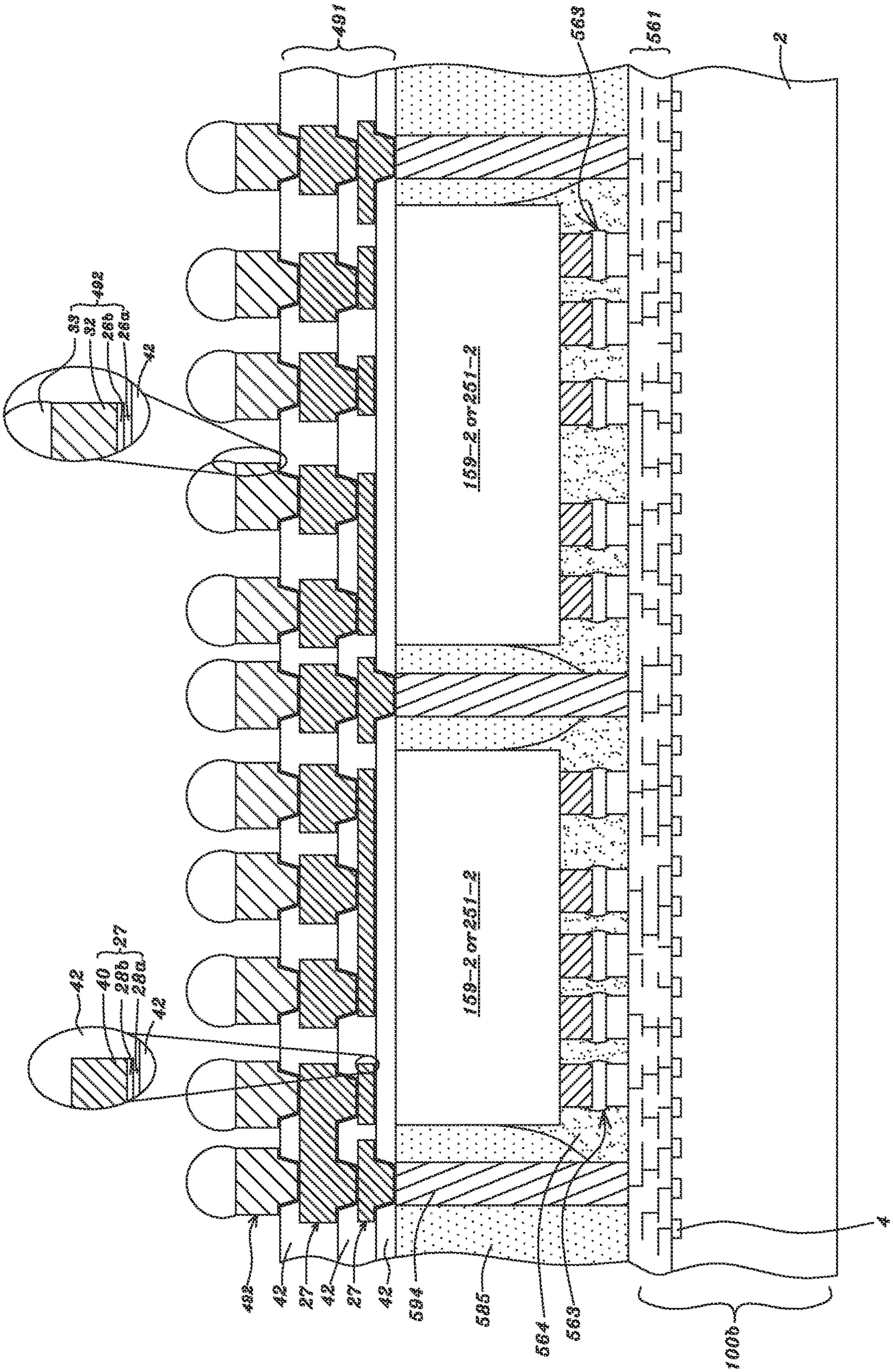
Figure 20D:
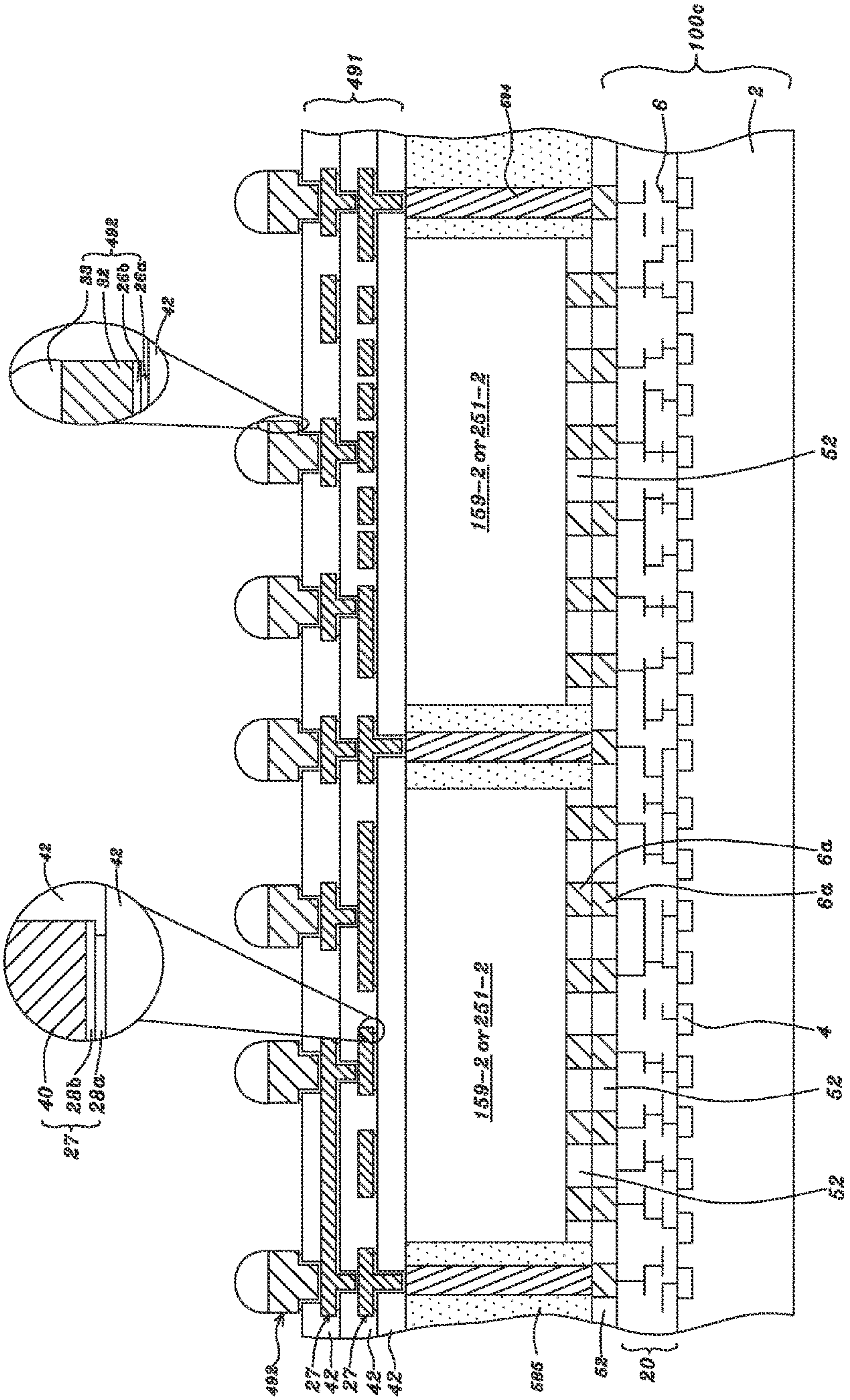

Next, referring to FIGS. 18D and 20D, a backside interconnection scheme for a chip scale package (BISCSP) 491 may be formed over the top surface of the polymer layer 585, the top surface of each of the first or second type of second memory modules 159-2, or known-good second HBM IC chips 251-2, and the top surface of each of the through package vias on a chip (TPVCs) 594. The backside interconnection scheme for a chip scale package (BISCSP) 491 may include one or more interconnection metal layers 27 coupling to each of the through package vias on a chip (TPVCs) 594 and one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the polymer layer 585 and between the bottommost one of its interconnection metal layers 27 and the top surface of each of the first or second type of second memory modules 159-2, or known-good second HBM IC chips 251-2. Each opening in the bottommost one of its polymer layers 42 may be over the top surface of the copper layer 581 of one of the through package vias on a chip (TPVCs) 594, that is, the top surface of the copper layer 581 of each of some or all of the through package vias on a chip (TPVCs) 594 may be at a bottom of one of the openings in the bottommost one of its polymer layers 42. Each of its interconnection metal layers 27 may extend horizontally across an edge of each of the first or second type of second memory modules 159-2, or known-good second HBM IC chips 251-2. The topmost one of its interconnection metal layers 27 may have multiple metal pads at bottoms of multiple respective openings in the topmost one of its polymer layers 42.

Referring to FIGS. 18D and 20D, for the backside interconnection scheme for a chip scale package (BISCSP) 491, each of its polymer layers 42 may be a layer of polyimide, BenzoCycloButene (BCB), parylene, epoxy-based material or compound, photo epoxy SU-8, elastomer or silicone, having a thickness between, for example, 0.3 μm and 30 μm, 0.5 μm and 20 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm over said one of its polymer layers 42, (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm, 0.5 μm, 0.7 μm, 1 μm, 1.5 μm, 2 μm, 3 μm or 5 μm.

Next, referring to FIGS. 18D and 20D, multiple metal bumps or pillars 492 may be formed on the metal pads of the topmost one of the interconnection metal layers 27 of the backside interconnection scheme for a chip scale package (BISCSP) 491. Each of the metal bumps or pillars 492 may be of various types A first type of metal bumps or pillars 492 may include, as seen in Fig., (1) an adhesion layer 26*a*, such as titanium (Ti) or titanium nitride (TiN) layer having a thickness of between 1 nm and 50 nm, on the metal pads of the topmost one of the interconnection metal layers 27 of the backside interconnection scheme for a chip scale package (BISCSP) 491, (2) a seed layer 26*b*, such as copper, on its adhesion layer 26*a* and (3) a copper layer 32 having a thickness of between 1 and 60 μm on its seed layer 26*b*.

Alternatively, a second type of metal bumps or pillars 492 may include the adhesion layer 26*a*, seed layer 26*b* and copper layer 32 as mentioned above, and may further include a tin-containing solder cap made of tin or a tin-silver alloy, which has a thickness of between 1 μm and 50 μm on its copper layer 32.

Alternatively, a third type of metal bumps or pillars 492 may be thermal compression bumps, including the adhesion layer 26*a* and seed layer 26*b* as mentioned above, and may further include, as seen in FIGS. 26C and 26D, a copper layer 37 having a thickness t3 of between 2 μm and 20 μm, such as 3 μm, and a largest transverse dimension w3, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness of between 1 μm and 15 μm, such as 2 μm, and a largest transverse dimension, such as diameter in a circular shape, between 1 μm and 15 μm, such as 3 μm, on its copper layer 37. The third type of micro-bumps or micro-pillars 34 are formed respectively on multiple metal pads 27*b* provided as seen in FIGS. 26C and 26D by the topmost one of the interconnection metal layers 27 of the backside interconnection scheme for a chip scale package (BISCSP) 491, wherein each of the metal pads 27*b* may have a thickness t1 between 1 and 10 micrometers or between 2 and 10 micrometers and a largest transverse dimension w1, such as diameter in a circular shape, between 1 μm and 15 μm, such as 5 μm. A pitch between neighboring two of the third type of micro-bumps or micro-pillars 34 may be between 3 μm and 20 μm.

Figure 18E:
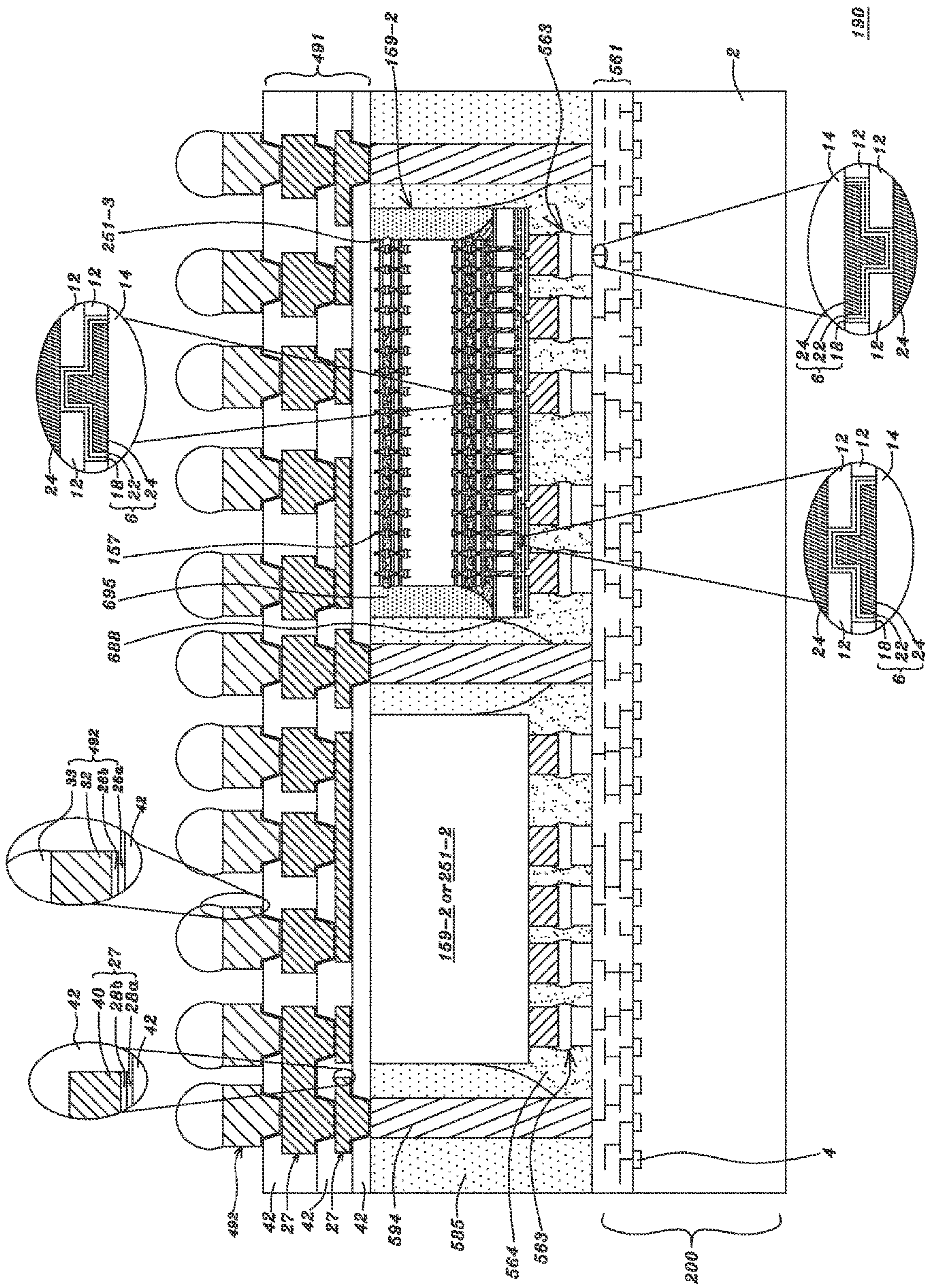
Figure 20E:
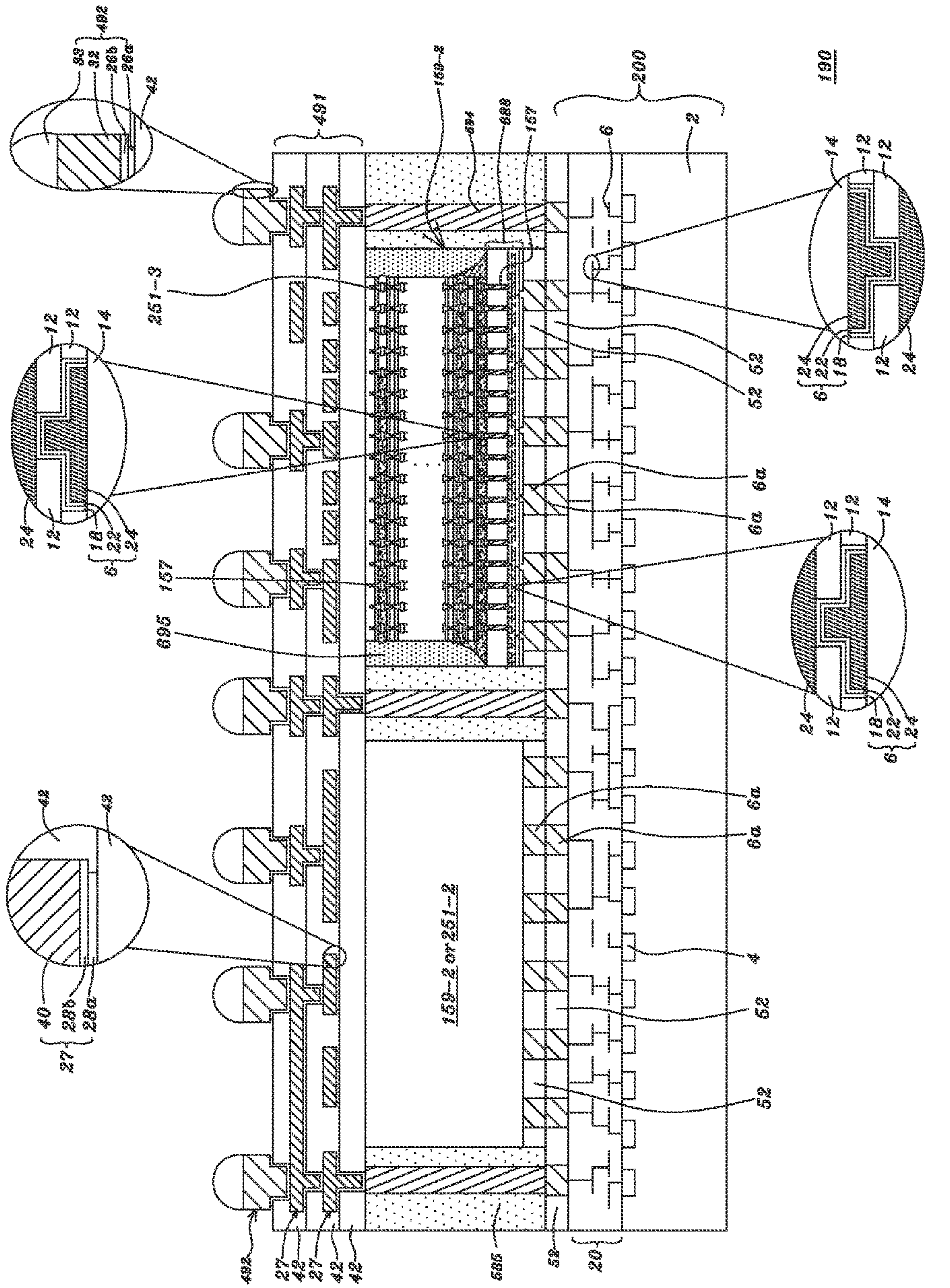

Next, the first or second type of semiconductor wafer 100*b* or 100*c*, the polymer layer 585 and the polymer layers 42 of the backside interconnection scheme for a chip scale package (BISCSP) 491 may be cut or diced to separate multiple individual first type of operation modules 190 or FPGA/HBM stacked 3D chip scale packages (CSP) as shown in FIG. 18E or 20E respectively by a laser cutting process or by a mechanical cutting process. At this time, the first or second type of semiconductor wafer 100*b* or 100*c* may be cut or diced into multiple semiconductor chips that may be standard commodity field-programmable-gate-array (FPGA) integrated-circuit (IC) chips 200, wherein on each of the standard commodity FPGA IC chips 200 may be one or more of the first or second type of second memory modules 159-2, or known-good second HBM IC chips 251-2, bonded thereto. For the first type of operation module 190 as seen in FIG. 18E, each of its through package vias on a chip (TPVCs) 594 may have a height taller than each of its bonded contact 563 between each of its first type of second memory modules 159-2, or known-good second HBM IC chips 251-2, and its standard commodity FPGA IC chip 200 by greater than 20 micrometers or 50 micrometers.

Second Type of Operation Module

Figure 18F:
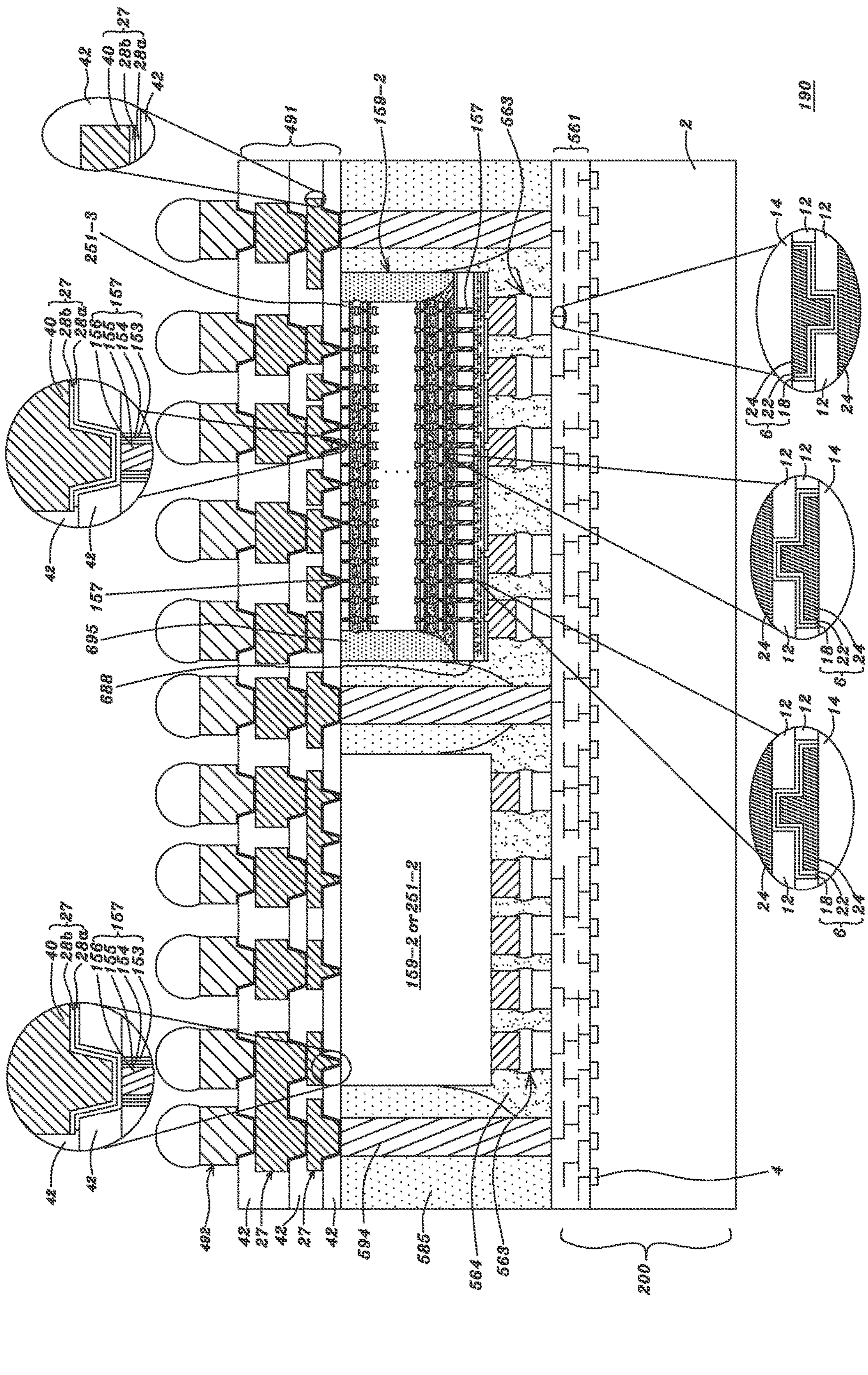
FIG. 18F is a schematically cross-sectional view showing a second type of operation module, i.e., FPGA/HBM stacked 3D chip scale package (CSP), in accordance with an embodiment of the present application.
Figure 20F:
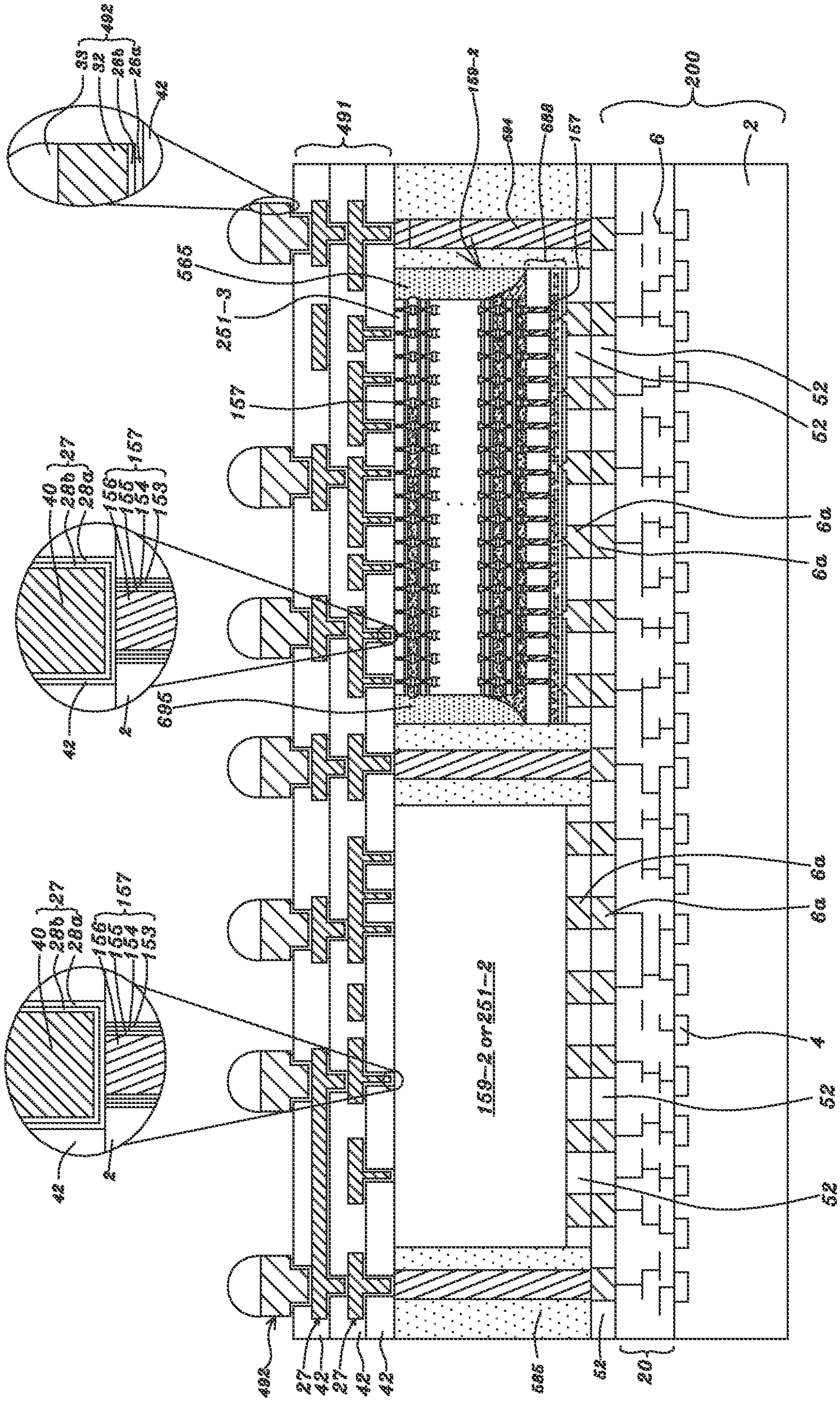
FIG. 20F is a schematically cross-sectional view showing a second type of operation module, i.e., FPGA/HBM stacked 3D chip scale package (CSP), in accordance with another embodiment of the present application.

FIG. 18F is a schematically cross-sectional view showing a second type of operation module, i.e., FPGA/HBM stacked 3D chip scale package (CSP), in accordance with an embodiment of the present application. FIG. 20F is a schematically cross-sectional view showing a second type of operation module, i.e., FPGA/HBM stacked 3D chip scale package (CSP), in accordance with another embodiment of the present application. For forming the second type of operation module 190 as seen in FIG. 18F or 20F, after the polymer layer 585 is applied as illustrated in FIG. 18C or 20C, the chemical mechanical polishing (CMP), polishing or grinding process may be applied as seen in FIG. 18D or 20D to further expose a backside of the electroplated copper layer 156 of each of the through silicon vias (TSV) 157 of the topmost one of the third HBM IC chips 251-3 of each of the first or second type of second memory modules 159-2, or each of the known-good second HBM IC chips 251-2, and to planarize the top surface of the polymer layer 585, the top surface of each of the first or second type of second memory modules 159-2, or known-good second HBM IC chips 251-2, the top surface of each of the through package vias on a chip (TPVCs) 594 and the backside of the electroplated copper layer 156 of each of the through silicon vias (TSV) 157 of the topmost one of the third HBM IC chips 251-3 of each of the first or second type of second memory modules 159-2, or each of the known-good second HBM IC chips 251-2.

Next, referring to FIG. 18F or 20F, the backside interconnection scheme for a chip scale package (BISCSP) 491 as illustrated in FIG. 18D or 20D may be formed over the top surface of the polymer layer 585, the top surface of each of the first or second type of second memory modules 159-2, or known-good second HBM IC chips 251-2, and the top surface of each of the through package vias on a chip (TPVCs) 594. Besides the specification for the backside interconnection scheme for a chip scale package (BISCSP) 491 as illustrated in FIG. 18D or 20D, each opening in the bottommost one of its polymer layers 42 may be over the backside of the electroplated copper layer 156 of one of the through silicon vias (TSV) 157 of the topmost one of the third HBM IC chips 251-3 of each of the first or second type of second memory modules 159-2, or each of the known-good second HBM IC chips 251-2, or over the top surface of one of the through package vias on a chip (TPVCs) 594; that is, the backside of the electroplated copper layer 156 of each of the through silicon vias (TSV) 157 of the topmost one of the third HBM IC chips 251-3 of each of the first or second type of second memory modules 159-2, or each of the known-good second HBM IC chips 251-2, may be at a bottom of one of the openings in the bottommost one of its polymer layers 42, and the top surface of each of the through package vias on a chip (TPVCs) 594 may be at a bottom of one of the openings in the bottommost one of its polymer layers 42. The bottommost one of its interconnection metal layers 27 may couple to the through silicon vias (TSV) 157 of the topmost one of the third HBM IC chips 251-3 of each of the first or second type of second memory modules 159-2, or each of the known-good second HBM IC chips 251-2, and the through package vias on a chip (TPVCs) 594 through the openings in the bottommost one of its polymer layers 42.

Referring to FIG. 18F or 20F, after the backside interconnection scheme for a chip scale package (BISCSP) 491 is formed, the metal bumps or pillars 492 may be formed as illustrated in FIG. 18D or 20D on the metal pads of the topmost one of the interconnection metal layers 27 of the backside interconnection scheme for a chip scale package (BISCSP) 491. Next, the first or second type of semiconductor wafer 100*b* or 100*c*, the polymer layer 585 and the polymer layers 42 of the backside interconnection scheme for a chip scale package (BISCSP) 491 may be cut or diced to separate multiple individual first type of operation modules 190 or FPGA/HBM stacked 3D chip scale packages (CSP) as shown in FIG. 18F or 20F respectively by a laser cutting process or by a mechanical cutting process. At this time, the first or second type of semiconductor wafer 100*b* or 100*c* may be cut or diced into multiple semiconductor chips that may be standard commodity field-programmable-gate-array (FPGA) integrated-circuit (IC) chips 200, wherein on each of the standard commodity FPGA IC chips 200 may be one or more of the first or second type of second memory modules 159-2, or known-good second HBM IC chips 251-2, bonded thereto. For the second type of operation module 190 as seen in FIG. 18F, each of its through package vias on a chip (TPVCs) 594 may have a height taller than each of its bonded contacts 563 between each of its first type of second memory modules 159-2, or known-good second HBM IC chips 251-2, and its standard commodity FPGA IC chip 200 by greater than 20 micrometers or 50 micrometers.

Third Type of Operation Module

Figure 18G:
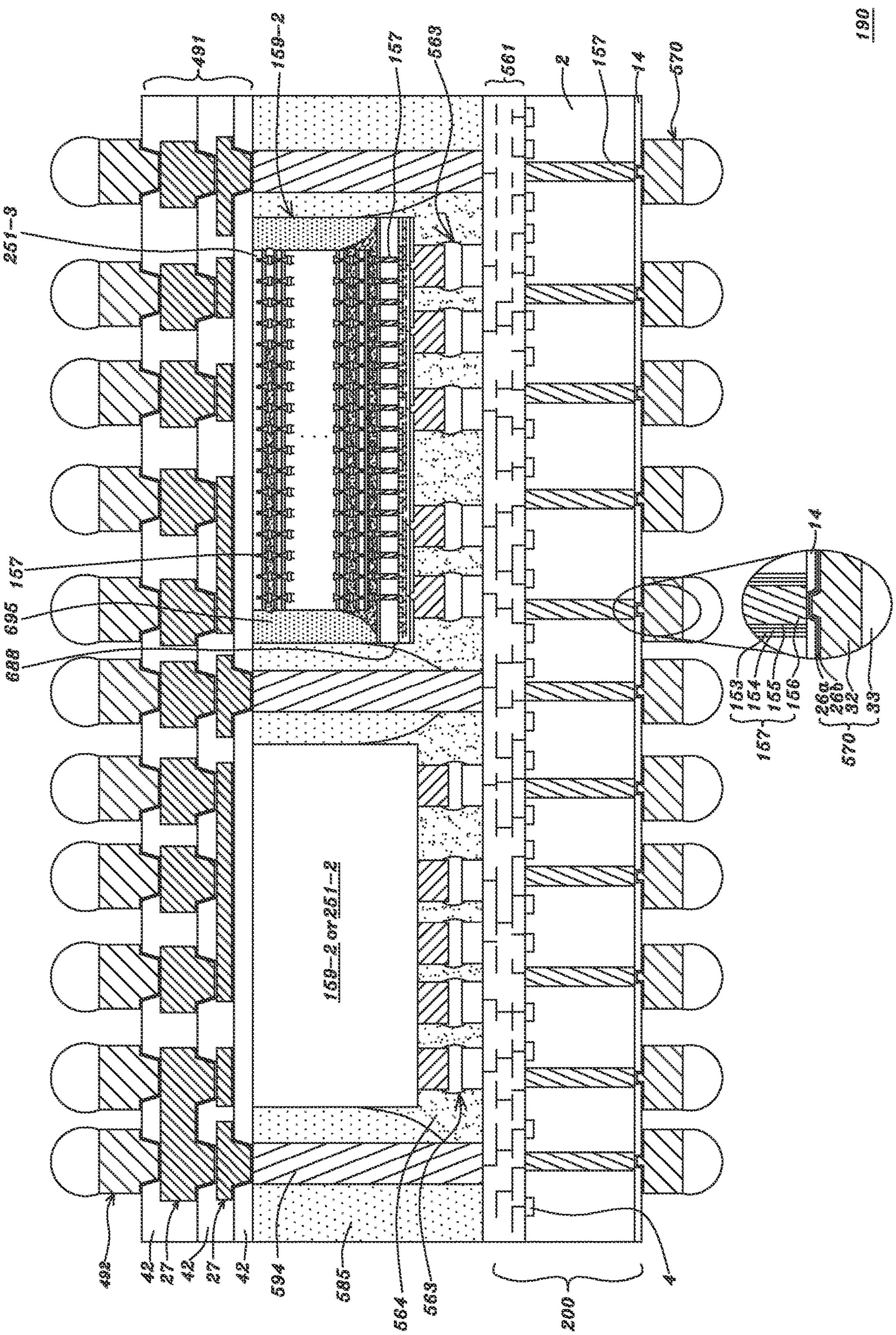
FIG. 18G is a schematically cross-sectional view showing a third type of operation module, i.e., FPGA/HBM stacked 3D chip scale package (CSP), in accordance with an embodiment of the present application.
Figure 20G:
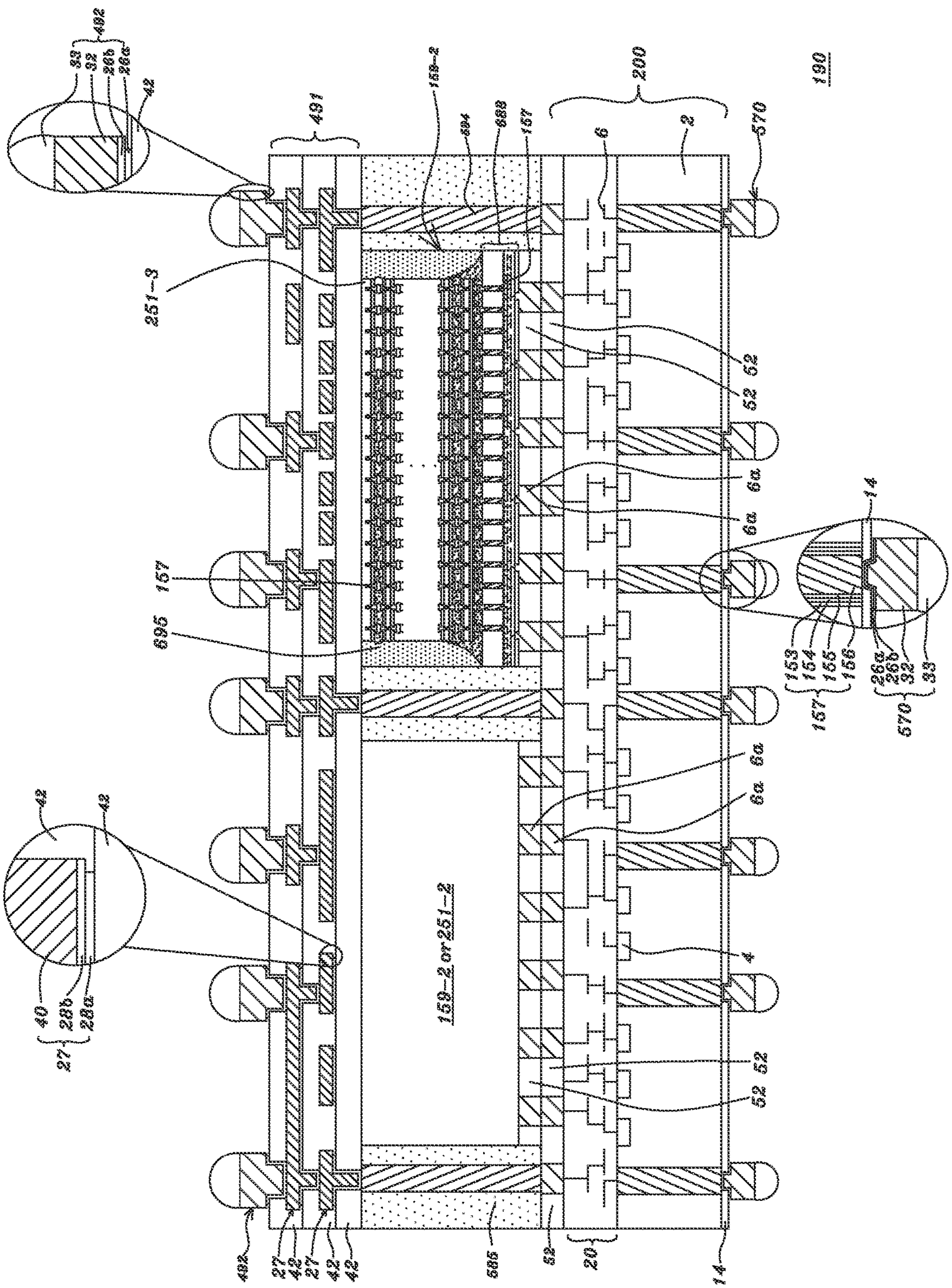
FIG. 20G is a schematically cross-sectional view showing a third type of operation module, i.e., FPGA/HBM stacked 3D chip scale package (CSP), in accordance with another embodiment of the present application.

FIG. 18G is a schematically cross-sectional view showing a third type of operation module, i.e., FPGA/HBM stacked 3D chip scale package (CSP), in accordance with an embodiment of the present application. FIG. 20G is a schematically cross-sectional view showing a third type of operation module, i.e., FPGA/HBM stacked 3D chip scale package (CSP), in accordance with another embodiment of the present application. For forming the third type of operation module 190 as seen in FIG. 18G or 20G, the first or second type of semiconductor wafer 100*b* or 100*c* as illustrated in FIGS. 18A-18D or FIGS. 20A-20D may have the structure as illustrated in FIG. 17B or 17D respectively. After the metal bumps or pillars 492 are formed on the metal pads of the topmost one of the interconnection metal layers 27 of the backside interconnection scheme for a chip scale package (BISCSP) 491, a chemical mechanical polishing (CMP), polishing or grinding process may be applied to remove a bottom portion of the semiconductor substrate 2 of the first or second type of semiconductor wafer 100*b* or 100*c* to expose a backside of the electroplated copper layer 156 of each of the through silicon vias (TSV) 157 of the first or second type of semiconductor wafer 100*b* or 100*c*. For each of the through silicon vias (TSV) 157 of the first or second type of semiconductor wafer 100*b* or 100*c*, its insulating lining layer 153, adhesion layer 154 and electroplating seed layer 155 at its bottom is removed to expose the backside of its electroplated copper layer 156.

Next, referring to FIGS. 18G and 20G, a passivation layer 14 containing a silicon-nitride, SiON or SiCN layer having a thickness greater than 0.3 μm for example and, alternatively, a polymer layer having a thickness between 1 and 10 μm may be formed on a backside of the semiconductor substrate 2 of the semiconductor wafer 100*b* or 100*c*, which is defined as a portion of the semiconductor wafer 100*b* or 100*c*. Multiple openings in the passivation layer 14 on the backside of the semiconductor substrate 2 of the semiconductor wafer 100*b* or 100*c* may be aligned with and under the backside of the electroplated copper layer 156 of the through silicon vias (TSV) 157 of the semiconductor wafer 100*b* or 100*c*. Next, multiple micro-bumps or micro-pillars 570 may be formed on the backside of the electroplated copper layer 156 of the through silicon vias (TSV) 157 of the semiconductor wafer 100*b* or 100*c* at tops of the openings in the passivation layer 14 on the backside of the semiconductor substrate 2 of the semiconductor wafer 100*b* or 100*c*. The micro-bumps or micro-pillars 570 at the backside of the semiconductor wafer 100*b* or 100*c* may be of first through third types, which may have the same specification as the first through third types of micro-bumps or micro-pillars 570 of the third type of semiconductor chip 100 as illustrated in FIG. 14C. Next, the first or second type of semiconductor wafer 100*b* or 100*c*, the polymer layer 585 and the polymer layers 42 of the backside interconnection scheme for a chip scale package (BISCSP) 491 may be cut or diced to separate multiple individual third type of operation modules 190 or FPGA/HBM stacked 3D chip scale packages (CSP) as shown in FIG. 18G or 20G respectively by a laser cutting process or by a mechanical cutting process. At this time, the first or second type of semiconductor wafer 100*b* or 100*c* may be cut or diced into multiple semiconductor chips that may be standard commodity field-programmable-gate-array (FPGA) integrated-circuit (IC) chips 200, wherein on each of the standard commodity FPGA IC chips 200 may be one or more of the first or second type of second memory modules 159-2, or known-good second HBM IC chips 251-2, bonded thereto. For the third type of operation module 190 as seen in FIG. 18G, each of its through package vias on a chip (TPVCs) 594 may have a height taller than each of its bonded contacts 563 between each of its first type of second memory modules 159-2, or known-good second HBM IC chips 251-2, and its standard commodity FPGA IC chip 200 by greater than 20 micrometers or 50 micrometers.

Fourth Type of Operation Module

Figure 18H:
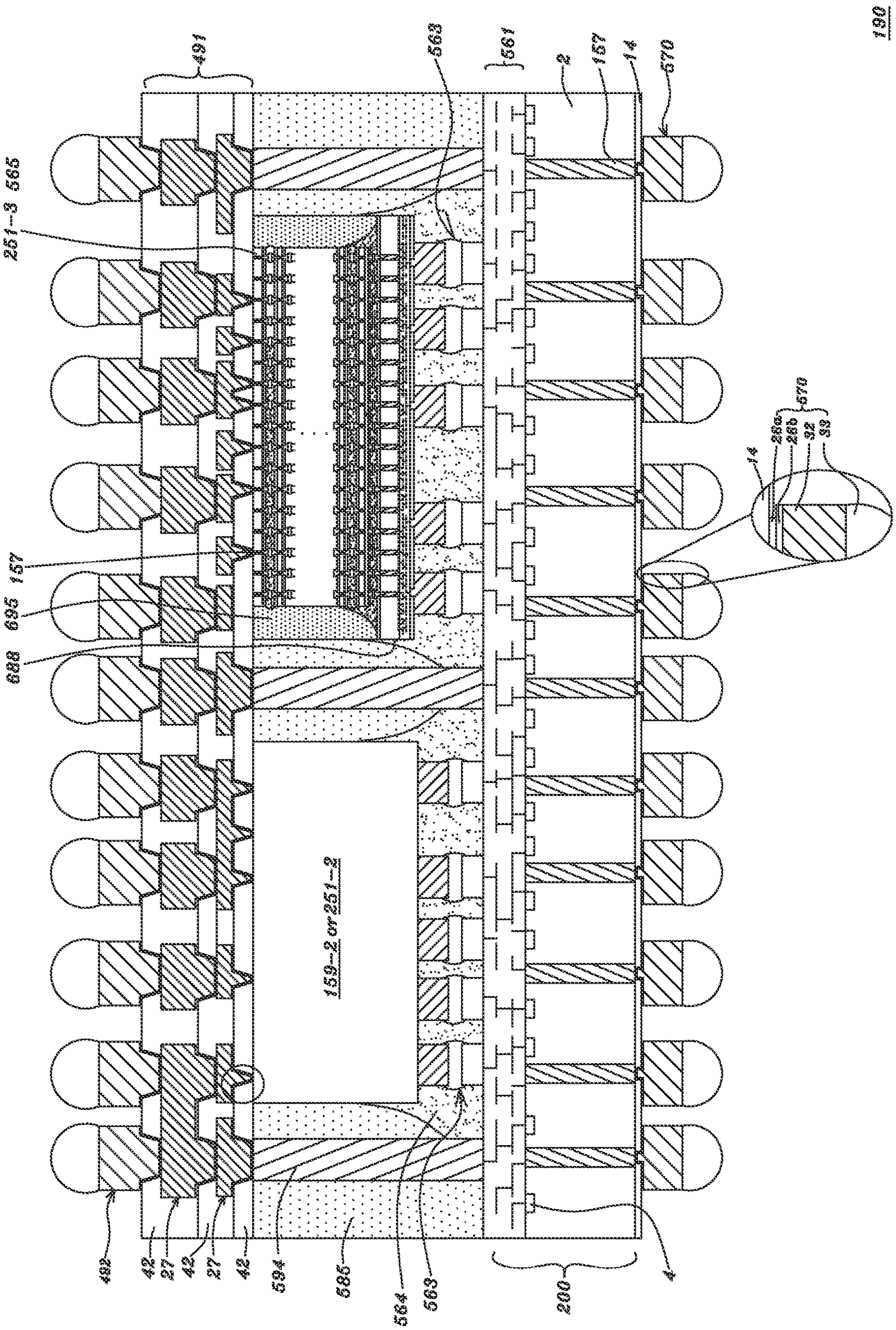
FIG. 18H is a schematically cross-sectional view showing a fourth type of operation module, i.e., FPGA/HBM stacked 3D chip scale package (CSP), in accordance with an embodiment of the present application.
Figure 20H:
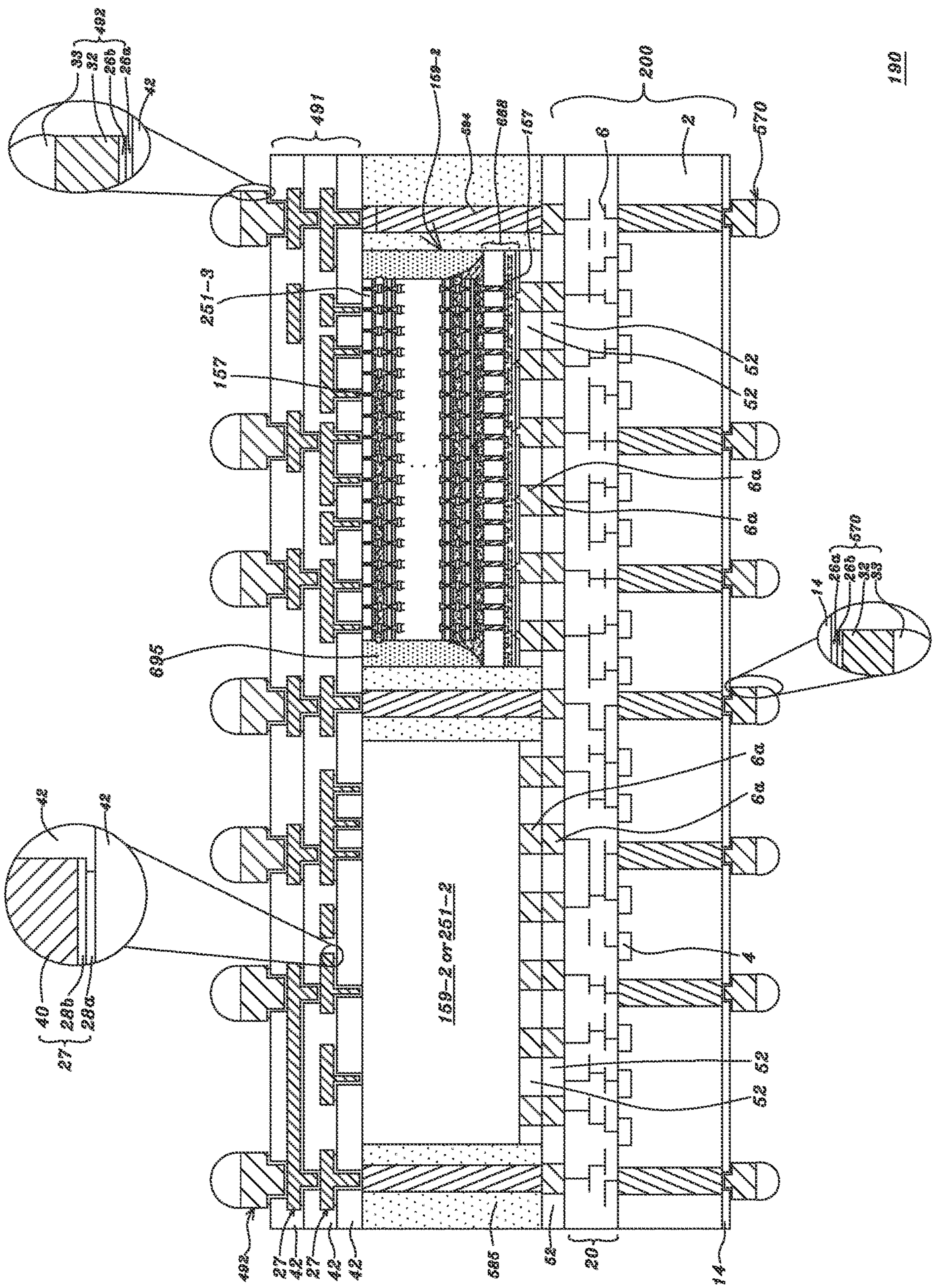
FIG. 20H is a schematically cross-sectional view showing a fourth type of operation module, i.e., FPGA/HBM stacked 3D chip scale package (CSP), in accordance with another embodiment of the present application.

FIG. 18H is a schematically cross-sectional view showing a fourth type of operation module, i.e., FPGA/HBM stacked 3D chip scale package (CSP), in accordance with an embodiment of the present application. FIG. 20H is a schematically cross-sectional view showing a fourth type of operation module, i.e., FPGA/HBM stacked 3D chip scale package (CSP), in accordance with another embodiment of the present application. A fourth type of operation module 190 may have a similar structure as illustrated in FIG. 18F or 20F. For an element indicated by the same reference number shown in FIG. 18F or 20F and FIG. 18H or 20H, the specification of the element as seen in FIG. 18H or 20H may be referred to that of the element as illustrated in FIG. 18F or 20F. The difference between the second and fourth types of semiconductor chips 100 is that for forming the fourth type of operation module 190 as seen in FIG. 18H or 20H, the first or second type of semiconductor wafer 100*b* or 100*c* may have the structure as illustrated in FIG. 17B or 17D respectively. After the metal bumps or pillars 492 are formed on the metal pads of the topmost one of the interconnection metal layers 27 of the backside interconnection scheme for a chip scale package (BISCSP) 491, the processes of applying the chemical mechanical polishing (CMP), polishing or grinding process to remove the bottom portion of the semiconductor substrate 2 of the first or second type of semiconductor wafer 100*b* or 100*c* to expose the backside of the electroplated copper layer 156 of each of the through silicon vias (TSV) 157 of the first or second type of semiconductor wafer 100*b* or 100*c*, forming the passivation layer 14 and forming the micro-bumps or micro-pillars 570 may be performed as illustrated in FIG. 18G or 20G. Next, the first or second type of semiconductor wafer 100*b* or 100*c*, the polymer layer 585 and the polymer layers 42 of the backside interconnection scheme for a chip scale package (BISCSP) 491 may be cut or diced to separate multiple individual fourth type of operation modules 190 or FPGA/HBM stacked 3D chip scale packages (CSP) as shown in FIG. 18H or 20H respectively by a laser cutting process or by a mechanical cutting process. At this time, the first or second type of semiconductor wafer 100*b* or 100*c* may be cut or diced into multiple semiconductor chips that may be standard commodity field-programmable-gate-array (FPGA) integrated-circuit (IC) chips 200, wherein on each of the standard commodity FPGA IC chips 200 may be one or more of the first or second type of second memory modules 159-2, or known-good second HBM IC chips 251-2, bonded thereto. For the fourth type of operation module 190 as seen in FIG. 18H, each of its through package vias on a chip (TPVCs) 594 may have a height taller than each of its bonded contacts 563 between each of its first type of second memory modules 159-2, or known-good second HBM IC chips 251-2, and its standard commodity FPGA IC chip 200 by greater than 20 micrometers or 50 micrometers.

Features for First Through Fourth Types of Operation Modules

For each of the first type of operation module 190 as shown in FIG. 18E or 20E, the second type of operation module 190 as shown in FIG. 18F or 20F, the third type of operation module 190 as shown in FIG. 18G or 20G and the fourth type of operation module 190 as shown in FIG. 18H or 20H, a data bus between its first or second type of second memory module 159-2, or known-good second HBM IC chip 251-2, and its FPGA IC chip 200 may have a data bit-width, equal or greater than 64, 128, 256, 512, 1024, 2048, 4096, 8K, or 16K. Each of the third HBM IC chips 251-2 of its first or second type of second memory module 159-2, or known-good second HBM IC chip 251-2, may have the small I/O circuits 203 as seen in FIGS. 5B and 12 each coupling to one of the small I/O circuits 203 of its FPGA IC chip 200 through one of the bonded contacts 563 as seen in FIG. 18E, 18F, 18G or 18H between its FPGA IC chip 200 and its first type of second memory module 159-2, or known-good second HBM IC chip 251-2, or through one of the bonded structures as seen in FIG. 20E, 20F, 20G or 20H each made from the bonding of one the metal pads 6*a* of its FPGA IC chip 200 and one of the metal pads 6*a* of its second type of second memory module 159-2, or known-good second HBM IC chip 251-2.

For each of the first type of operation module 190 as shown in FIG. 18E or 20E, the second type of operation module 190 as shown in FIG. 18F or 20F, the third type of operation module 190 as shown in FIG. 18G or 20G and the fourth type of operation module 190 as shown in FIG. 18H or 20H, its first or second type of second memory module 159-2, or known-good second HBM IC chip 251-2, may couple to one of its metal bumps or pillars 492 for signal transmission or power or ground delivery through, in sequence, one or more of the interconnection metal layers 6 and/or 27 of the first and/or second interconnection scheme for a chip (FISC) 20 and/or (SISC) 29 of its FPGA IC chip 200, one of its through package vias on a chip (TPVCs) 594 and one or more of the interconnection metal layers 27 of its backside interconnection scheme for a chip scale package (BISCSP) 491.

Fanout-Interconnection-Technology (FOIT) Chip Package

First Type of Fanout-interconnection-technology (FOIT) Chip Package

Figure 21A:
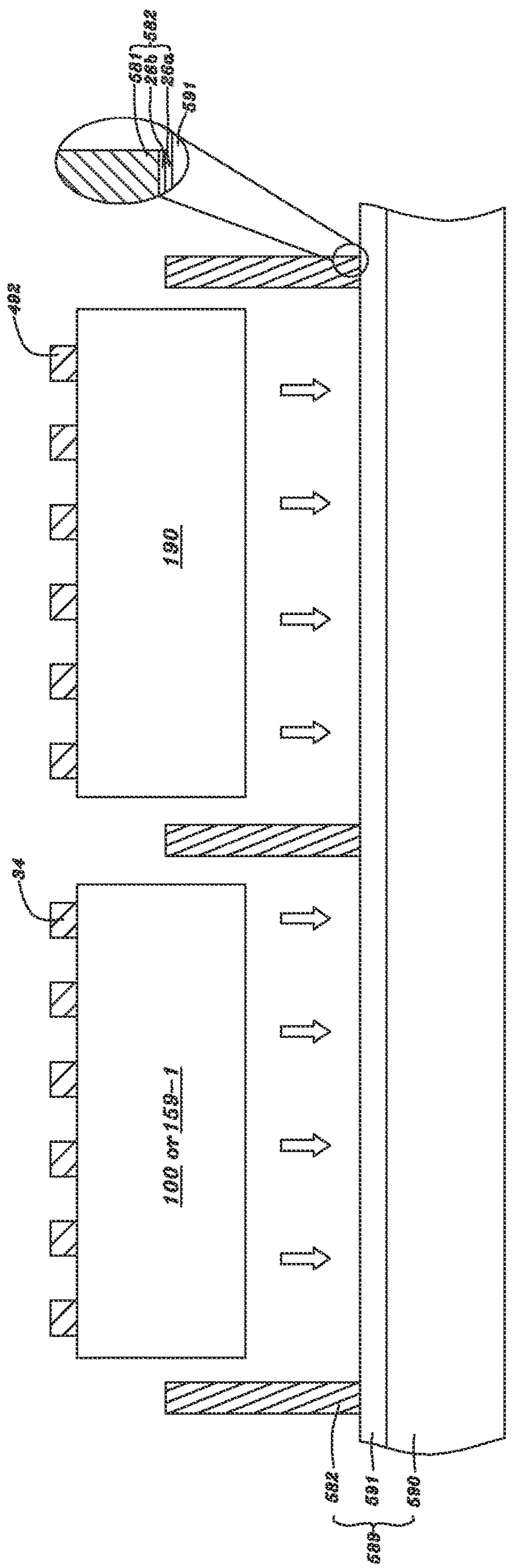
FIGS. 21A-21F are cross-sectional views showing a process for fabricating a first type of fanout-interconnection-technology (FOIT) chip package in accordance with an embodiment of the present application.

FIGS. 21A-21F are cross-sectional views showing a process for fabricating a first type of fanout-interconnection-technology (FOIT) chip package in accordance with an embodiment of the present application. A first type of fanout-interconnection-technology (FOIT) chip package may be provided to form the first, second, third or fourth type of standard commodity logic drive 300 as illustrated in FIG. 10A, 10B, 10C or 10D. Referring to FIG. 21A, a first type of interconnection carrier 589 may be provided with (1) a temporary substrate (T-Sub) 590 made of glass, silicon, metal, copper, aluminum, ceramics, steel, plastics, polymer, epoxy-based polymer or epoxy based compound, for example; (2) a sacrificial bonding layer 591, i.e., substrate-release layer, on the temporary substrate (T-sub) 590, wherein its sacrificial bonding layer 591 may have its temporary substrate (T-sub) 590 to be easily debonded or released from an element having been mounted to or formed on its sacrificial bonding layer 591 in advance, wherein its sacrificial bonding layer 591 may be a material of light-to-heat conversion (LTHC) in a liquid form that may be deposited on its temporary substrate (T-sub) 590, e.g., glass wafer or panel, by printing or spin-on coating and then cured or dried with a thickness of about 1 micrometer or between 0.5 and 2 micrometers, wherein the LTHC material may be a liquid ink containing carbon black and binder in a mixture of solvents; and (3) multiple through package vias (TPV) 582, i.e., through package metal posts or pillars, on its sacrificial bonding layer 591, wherein each of its through package vias (TPVs) 582 may include an adhesion layer 26*a*, such as titanium (Ti) or titanium nitride (TiN) layer having a thickness of between 1 nm and 50 nm, on its sacrificial bonding layer 591, a seed layer 26*b*, such as copper, on its adhesion layer 26*a* and a copper layer 581 having a thickness of between 20 μm and 300 μm, 30 μm and 200 μm, 50 μm and 150 μm, 50 μm and 120 μm, 20 μm, and 100 μm, 20 μm and 60 μm, 20 μm and 40 μm, or 20 μm and 30 μm, or greater than or taller than or equal to 100 μm, 50 μm, 30 μm or 20 μm on its seed layer 26*b*.

Figure 21B:
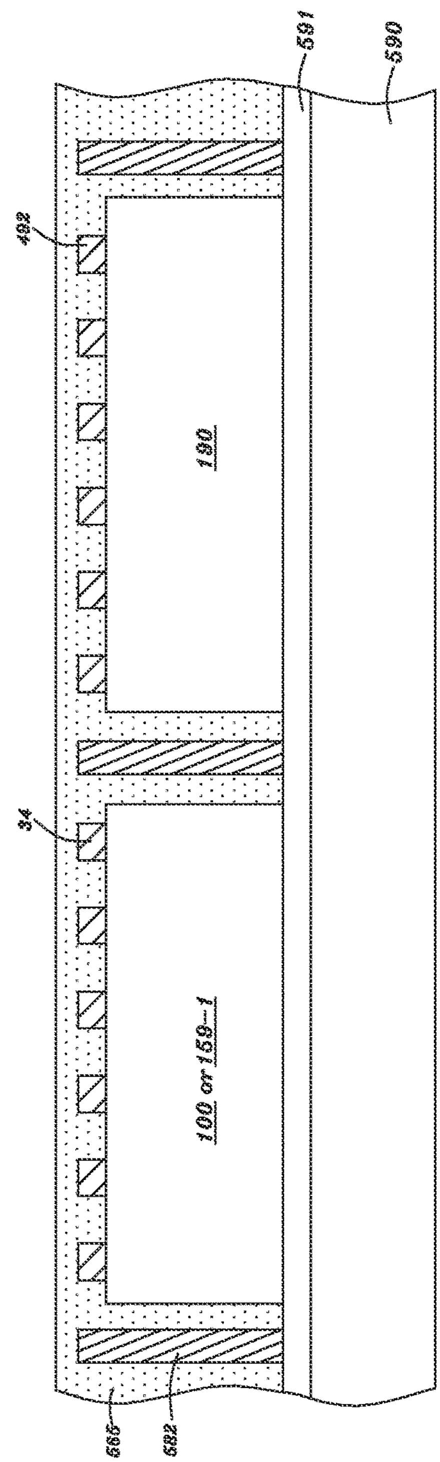

Next, referring to FIG. 21B, one or more first and/or second types of semiconductor chips 100 as illustrated in FIGS. 14A and 14B may be provided, each having a backside at a bottom thereof to be bonded to the sacrificial bonding layer 591 of the first type of interconnection carrier 589 and having the first type of micro-bumps or micro-pillars 34 facing upwards. Each of the first and/or second types of semiconductor chips 100 may be the HBM IC chip 251-1, NVM IC chip 250, PCIC chip 269, GPU chip 269*a*, CPU chip 269*b*, IAC chip 402, DPIIC chip 410, or dedicated control and I/O chip 265 for the first, second, third or fourth type of standard commodity logic drive 300 as illustrated in FIG. 10A, 10B, 10C or 10D. One or more first and/or second types of operation modules 190 as illustrated in FIG. 18E or 20E and/or FIG. 18F or 20F (only one is shown) may be provided, each having a backside at a bottom thereof to be bonded to the sacrificial bonding layer 591 of the first type of interconnection carrier 589 and having the first type of metal bumps or pillars 492 facing upwards, wherein the standard commodity FPGA IC chip 200 of each of the first and/or second types of operation modules 190 may have a backside at a bottom thereof to be bonded to the sacrificial bonding layer 591 of the first type of interconnection carrier 589. One or more first type of first memory modules 159-1 as seen in FIG. 15A (only one is shown) may be provided to be flipped to be bonded to the sacrificial bonding layer 591 of the first type of interconnection carrier 589 and having the first type of micro-bumps or micro-pillars 34 facing upwards, wherein the topmost one of the HBM IC chips 251-3 of each of the first type of first memory modules 159-1 as seen in FIG. 15A may be flipped to become the bottommost one of the HBM IC chips 251-3 of said each of the first type of first memory modules 159-1 and may have a backside to be bonded to the sacrificial bonding layer 591 of the first type of interconnection carrier 589.

Next, referring to FIG. 21B, a polymer layer 565, e.g., resin or compound, may be applied by methods, for example, spin-on coating, screen-printing, dispensing or molding to fill the gaps each between neighboring two of the first and/or second types of semiconductor chips 100, the first type of first memory module 159-1 and the first and/or second types of operation modules 190 and the gaps each between neighboring two of the through package vias (TPVs) 582 and to cover over each of the first type of micro-bumps or micro-pillars 34 of each of the first and/or second types of semiconductor chips 100, each of the first type of micro-bumps or micro-pillars 34 of each of the first type of first memory modules 159-1, each of the first type of metal bumps or pillars 492 of each of the first and/or second types of operation modules 190 and each of the through package vias (TPVs) 582.

Figure 21C:
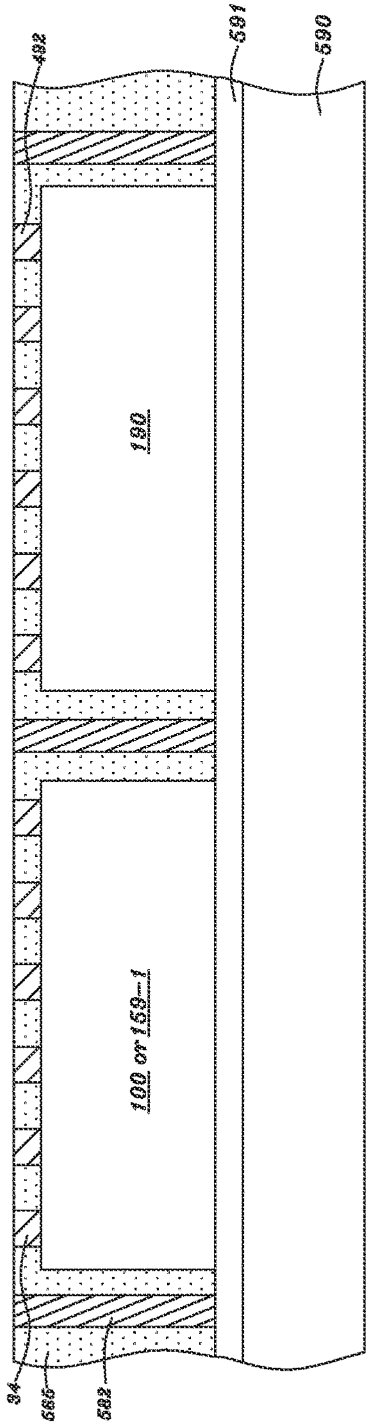

Next, referring to FIG. 21C, a chemical mechanical polishing (CMP), polishing or grinding process may be applied to remove a top portion of the polymer layer 565 to expose a top surface of the copper layer 32 of each of the first type of micro-bumps or micro-pillars 34 of each of the first and/or second types of semiconductor chips 100, a top surface of the copper layer 32 of each of the first type of micro-bumps or micro-pillars 34 of each of the first type of first memory modules 159-1, a top surface of the copper layer 32 of each of the first type of metal bumps or pillars 492 of each of the first and/or second types of operation modules 190 and a top surface of the copper layer 581 of each of the through package vias (TPVs) 582 and to planarize a top surface of the polymer layer 565, the top surface of the copper layer 32 of each of the first type of micro-bumps or micro-pillars 34 of each of the first and/or second types of semiconductor chips 100, the top surface of the copper layer 32 of each of the first type of micro-bumps or micro-pillars 34 of each of the first type of first memory modules 159-1, the top surface of the copper layer 32 of each of the first type of metal bumps or pillars 492 of each of the first and/or second types of operation modules 190 and the top surface of the copper layer 581 of each of the through package vias (TPVs) 582.

Figure 21D:
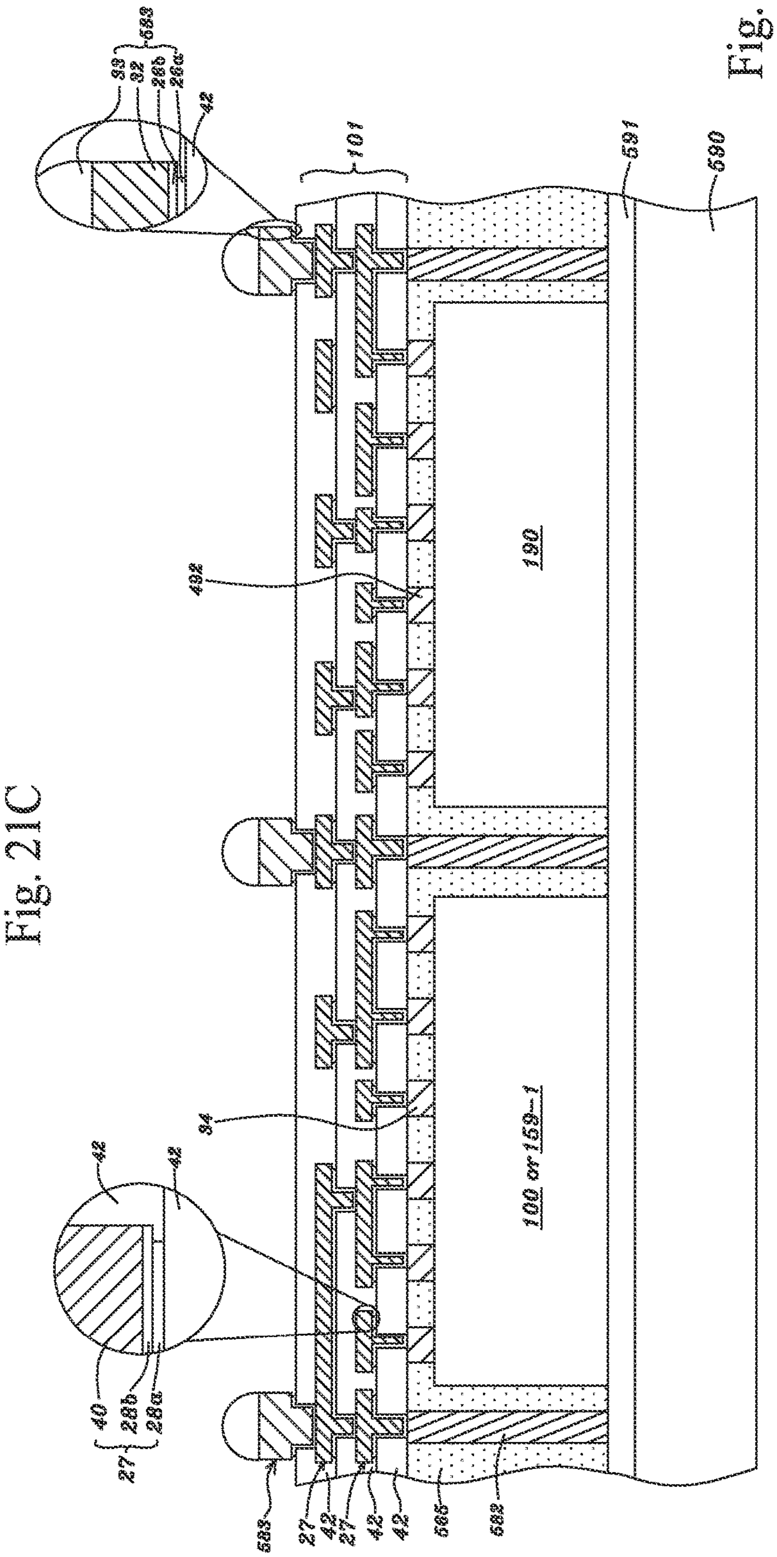

Next, referring to FIG. 21D, a frontside or topside interconnection scheme for a logic drive (FISD or TISD) 101 may be formed over the top surface of the polymer layer 565, the top surface of each of the first type of micro-bumps or micro-pillars 34 of each of the first and/or second types of semiconductor chips 100, the top surface of each of the first type of micro-bumps or micro-pillars 34 of the first type of first memory modules 159-1, the top surface of each of the first type of metal bumps or pillars 492 of each of the first and/or second types of operation modules 190 and the top surface of each of the through package vias (TPVs) 582. The frontside interconnection scheme for a logic drive (FISD) 101 may include one or more interconnection metal layers 27 each coupling to some or all of the first type of micro-bumps or micro-pillars 34 of each of the first and/or second types of semiconductor chips 100, some or all of the first type of micro-bumps or micro-pillars 34 of each of the first type of first memory modules 159-1, some or all of the first type of metal bumps or pillars 492 of each of the first and/or second types of operation modules 190 and some or all of the through package vias (TPVs) 582 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the polymer layer 565. Each opening in the bottommost one of its polymer layers 42 may be over the top surface of the copper layer 32 of one of the first type of micro-bumps or micro-pillars 34 of one of the first and/or second types of semiconductor chips 100, the top surface of the copper layer 32 of one of the first type of micro-bumps or micro-pillars 34 of one of the first type of first memory modules 159-1, the top surface of the copper layer 32 of one of the first type of metal bumps or pillars 492 of one of the first and/or second types of operation modules 190 or the top surface of the copper layer 581 of one of the through package vias (TPVs) 582; that is, the top surface of the copper layer 32 of each of some or all of the first type of micro-bumps or micro-pillars 34 of each of the first and/or second types of semiconductor chips 100 may be at a bottom of one of the openings in the bottommost one of its polymer layers 42, the top surface of the copper layer 32 of each of some or all of the first type of micro bumps or micro-pillars 34 of each of the first type of first memory modules 159-1 may be at a bottom of one of the openings in the bottommost one of its polymer layers 42, the top surface of the copper layer 32 of each of some or all of the first type of metal bumps or pillars 492 of each of the first and/or second types of operation modules 190 may be at a bottom of one of the openings in the bottommost one of its polymer layers 42, and the top surface of the copper layer 581 of each of some or all of the through package vias (TPVs) 582 may be at a bottom of one of the openings in the bottommost one of its polymer layers 42. Thus, the bottommost one of its interconnection metal layers 27 may couple to the first type of micro-bumps or micro-pillars 34 of each of the first and/or second types of semiconductor chips 100, the first type of micro-bumps or micro-pillars 34 of each of the first type of first memory modules 159-1, the first type of metal bumps or pillars 492 of each of the first and/or second types of operation modules 190 and the through package vias (TPVs) 582 through the openings in the bottommost one of its polymer layers 42. Each of its interconnection metal layers 27 may extend horizontally across an edge of each of the first and/or second types of semiconductor chips 100, the first type of first memory modules 159-1 and the first and/or second types of operation modules 190. The topmost one of its interconnection metal layers 27 may have multiple metal pads at bottoms of multiple respective openings in the topmost one of its polymer layers 42.

Referring to FIG. 21D, for the frontside interconnection scheme for a logic drive (FISD) 101, each of its polymer layers 42 may be a layer of polyimide, BenzoCycloButene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm over said one of its polymer layers 42, (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm, 0.5 μm, 0.7 μm, 1 μm, 1.5 μm, 2 μm, 3 μm or 5 μm.

Next, referring to FIG. 21D, multiple metal bumps or pillars 583 may be formed on the metal pads of the topmost one of the interconnection metal layers 27 of the frontside interconnection scheme for a logic drive (FISD) 101. Each of the metal bumps or pillars 583 may include (1) an adhesion layer 26*a*, such as titanium (Ti) or titanium nitride (TiN) layer having a thickness of between 1 nm and 50 nm, on the metal pads of the topmost one of the interconnection metal layers 27 of the frontside interconnection scheme for a logic drive (FISD) 101, (2) a seed layer 26*b*, such as copper, on and under its adhesion layer 26*a*, (3) a copper layer 32 having a thickness of between 1 μm and 60 μm on and under its seed layer 26*b*, and (4) a tin-containing solder cap 33 made of tin or a tin-silver alloy, which has a thickness of between 1 μm and 50 μm on and under its copper layer 32.

Figure 21E:
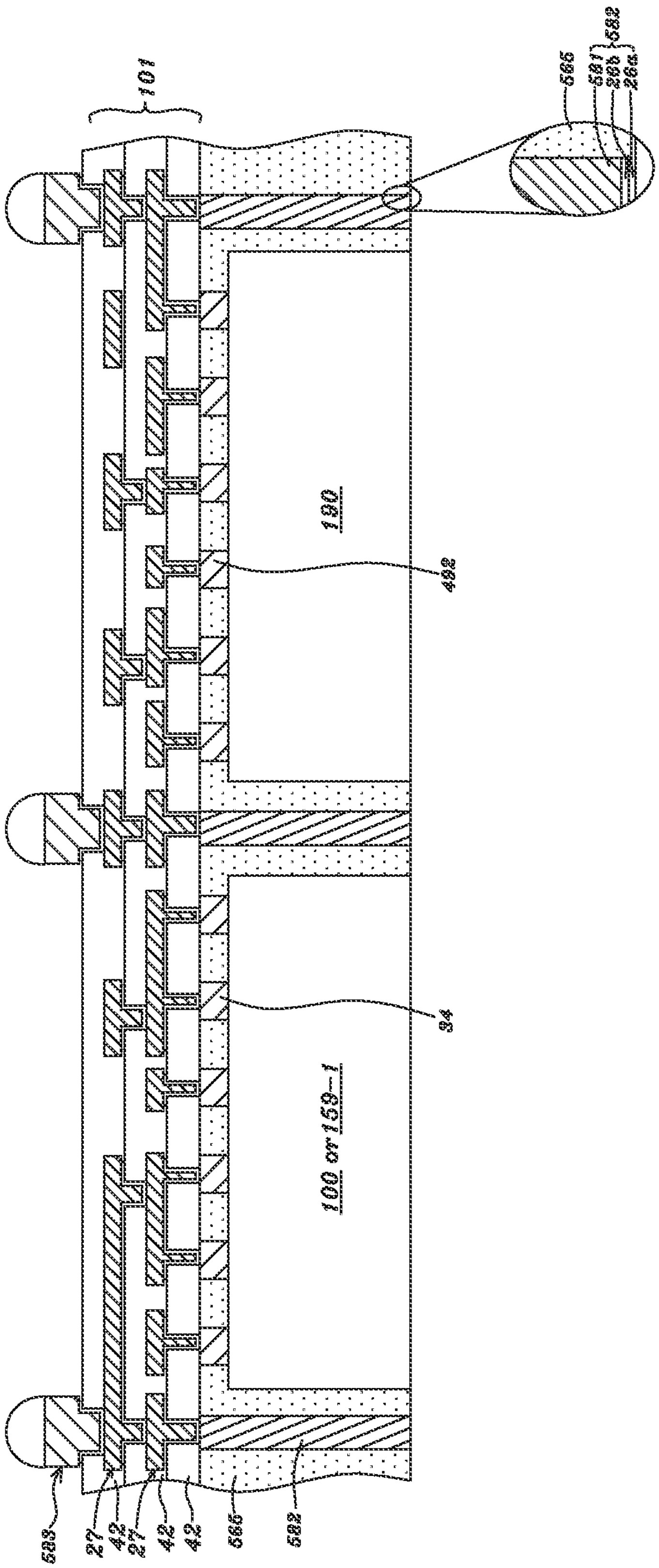

Next, referring to FIG. 21E, the temporary substrate (T-sub) 590 may be released from the sacrificial bonding layer 591. For example, in the case that the sacrificial bonding layer 591 is the material of light-to-heat conversion (LTHC) and the temporary substrate (T-sub) 590 is a glass wafer or panel, a laser light 593, such as YAG laser having a wavelength of about 1064 nm, an output power between 20 and 50 W and a spot size of 0.3 mm in diameter at a focal point, may be generated to pass from the backside of the temporary substrate (T-sub) 590 to the sacrificial bonding layer 591 through the temporary substrate (T-sub) 590 to scan the sacrificial bonding layer 591 at a speed of 8.0 m/s, for example, such that the sacrificial bonding layer 591 may be decomposed and the temporary substrate 590 may be easily released from the sacrificial bonding layer 591. Next, an adhesive peeling tape (not shown) may be attached to a bottom of the sacrificial bonding layer 591. Next, the sacrificial bonding layer 591 may be released or peeled from a bottom surface of the polymer layer 565, the backside of each of the first and/or second types of semiconductor chips 100, the backside of the bottommost one of the HBM IC chips 251-3 of each of the first type of first memory modules 159-1, the backside of the standard commodity FPGA IC chip 200 of each of the first and/or second types of operation modules 190 and the adhesion layer 26*a* of each of the through package vias (TPVs) 582 to expose the bottom surface of the polymer layer 565, the backside of each of the first and/or second types of semiconductor chips 100, the backside of the bottommost one of the HBM IC chips 251-3 of each of the first type of first memory modules 159-1, the backside of the standard commodity FPGA IC chip 200 of each of the first and/or second types of operation modules 190 and the adhesion layer 26*a* of each of the through package vias (TPVs) 582.

Figure 21F:
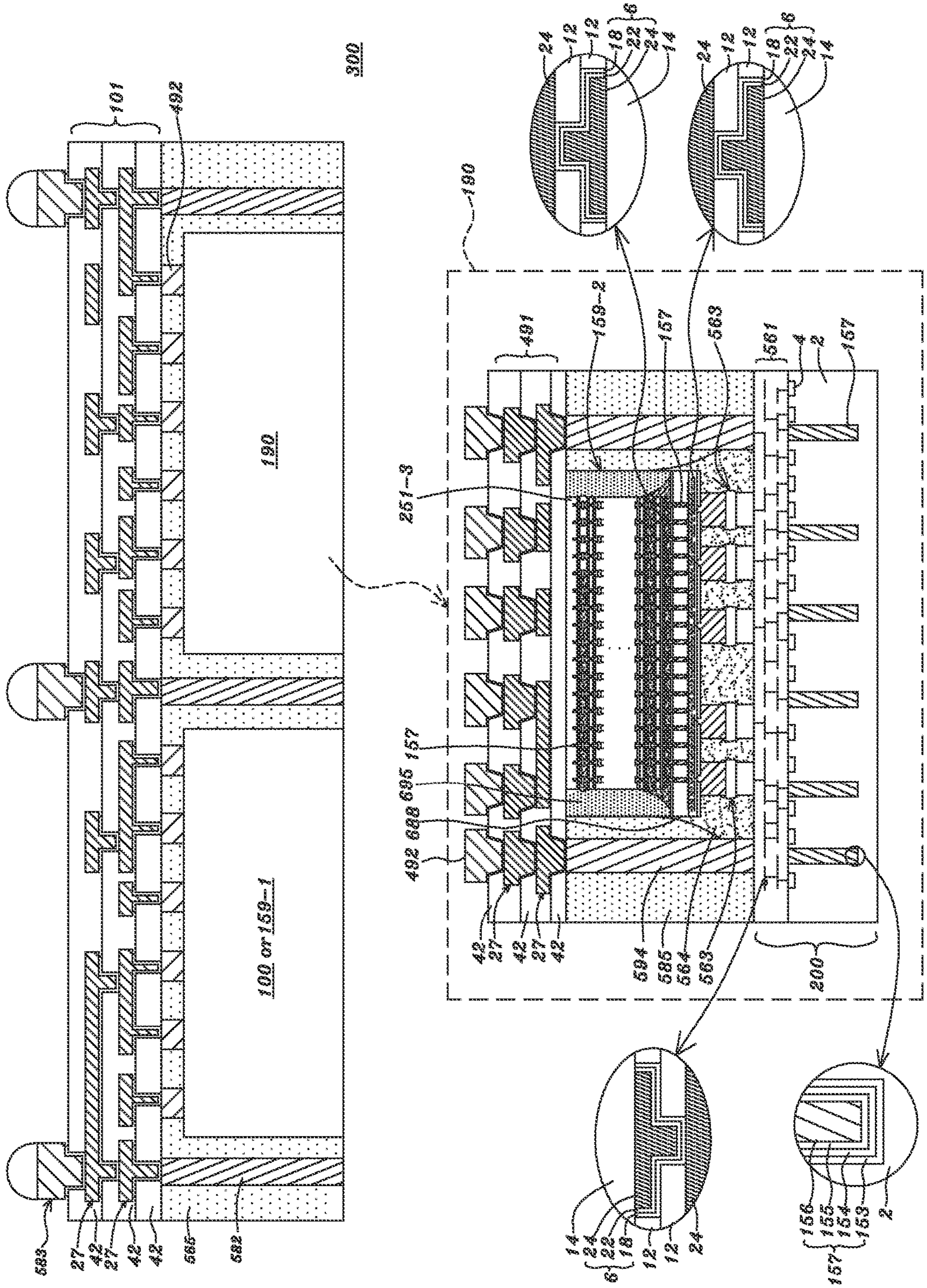

Alternatively, the temporary substrate (T-sub) 590 and sacrificial bonding layer 591 may be removed by a grinding or polishing process to expose the bottom surface of the polymer layer 565, the backside of each of the first and/or second types of semiconductor chips 100, the backside of the bottommost one of the HBM IC chips 251-3 of each of the first type of first memory modules 159-1, the backside of the standard commodity FPGA IC chip 200 of each of the first and/or second types of operation modules 190 and the adhesion layer 26*a* of each of the through package vias (TPVs) 582. Alternatively, the temporary substrate (T-sub) 590 and sacrificial bonding layer 591 may be removed after removing the top portion of the polymer layer 565 as illustrated in FIG. 21C and before forming the frontside interconnection scheme for a logic drive (FISD) 101 as illustrated in FIG. 21D. Next, the polymer layer 565 and the polymer layers 42 of the frontside interconnection scheme for a logic drive (FISD) 101 may be cut or diced to separate multiple individual first type of fanout-interconnection-technology (FOIT) chip packages 300 as seen in FIG. 21F by a laser cutting process or by a mechanical cutting process. For the first type of fanout-interconnection-technology (FOIT) chip packages 300, each of its through package vias (TPV) may couple to the voltage of power supply (Vcc) for power delivery, the voltage of ground reference (Vss) for ground delivery or a signal source for signal transmission.

Figure 21G:
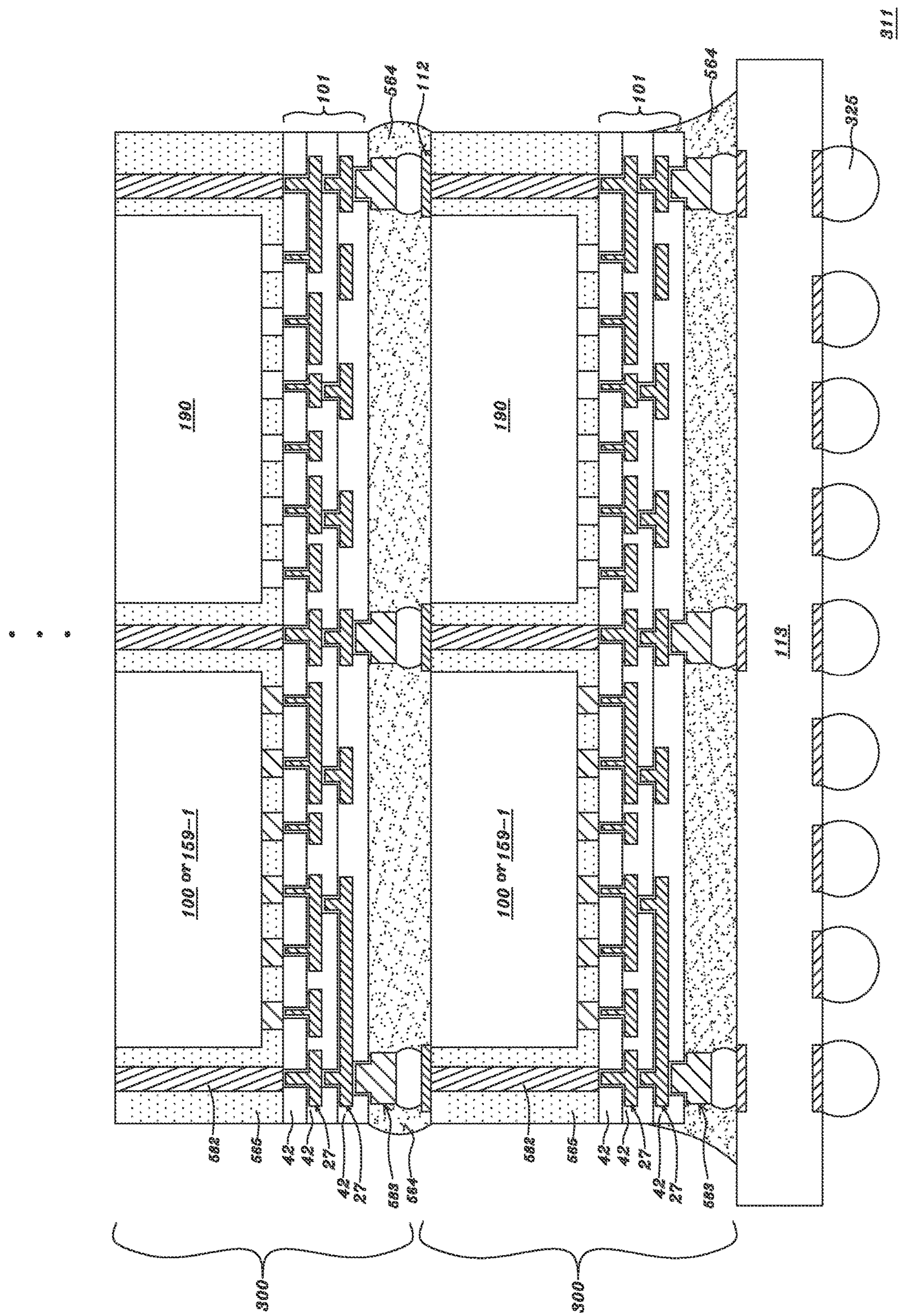
FIG. 21G is a cross-sectional view showing a first type of package-on-package (POP) assembly for a first type of fanout-interconnection-technology (FOIT) chip packages in accordance with an embodiment of the present application.

FIG. 21G is a cross-sectional view showing a first type of package-on-package (POP) assembly for a first type of fanout-interconnection-technology (FOIT) chip packages in accordance with an embodiment of the present application. Referring to FIG. 21G, multiple first type of fanout-interconnection-technology (FOIT) chip packages 300 as illustrated in FIG. 21F may be provided to be flipped and stacked together to form a first type of package-on-package (POP) assembly 311.

For forming the first type of package-on-package (POP) assembly 311 as seen in FIG. 21G, a circuit carrier substrate may be first provided. Next, the bottommost one of the first type of fanout-interconnection-technology (FOIT) chip packages 300 may have the metal bumps or pillars 583 to be bonded to the circuit carrier substrate. Next, an underfill 564 may be filled into a gap between the bottommost one of the first type of fanout-interconnection-technology (FOIT) chip packages 300 and the circuit carrier substrate to enclose the metal bumps or pillars 583 of the bottommost one of the first type of fanout-interconnection-technology (FOIT) chip packages 300.

Next, referring to FIG. 21G, in a first step, a tin-containing solder 112 may be formed on the top surface of the through package vias 582 of the lower one of the first type of fanout-interconnection-technology (FOIT) chip packages 300. Next, in a second step, an upper one of the first type of fanout-interconnection-technology (FOIT) chip packages 300 may have the metal bumps or pillars 583 to be bonded to the tin-containing solder 112. Next, in a third step, the tin-containing solder 112 may be reflowed to bond each of the metal bumps or pillars 583 of the upper one of the first type of fanout-interconnection-technology (FOIT) chip packages 300 to one of the through package vias 582 of the lower one of the first type of fanout-interconnection-technology (FOIT) chip packages 300. Next, in a fourth step, an underfill 564 may be filled into a gap between the upper and lower ones of the first type of fanout-interconnection-technology (FOIT) chip packages 300 to enclose the metal bumps or pillars 583 of the upper one of the first type of fanout-interconnection-technology (FOIT) chip packages 300.

Next, referring to FIG. 21G, the above first through fourth steps may be sequentially repeated multiple times to stack, one by one, multiple of the first type of fanout-interconnection-technology (FOIT) chip packages 300 having the number greater than or equal to two, such as four or eight. For a case, all of the first type of fanout-interconnection-technology (FOIT) chip packages stacked as seen in FIG. 21G may be the same.

Next, referring to FIG. 21G, multiple solder balls 325 may be planted on a bottom surface of the circuit carrier substrate. Next, the circuit carrier structure may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process.

Second Type of Fanout-Interconnection-Technology (FOIT) Chip Package

Figure 22A:
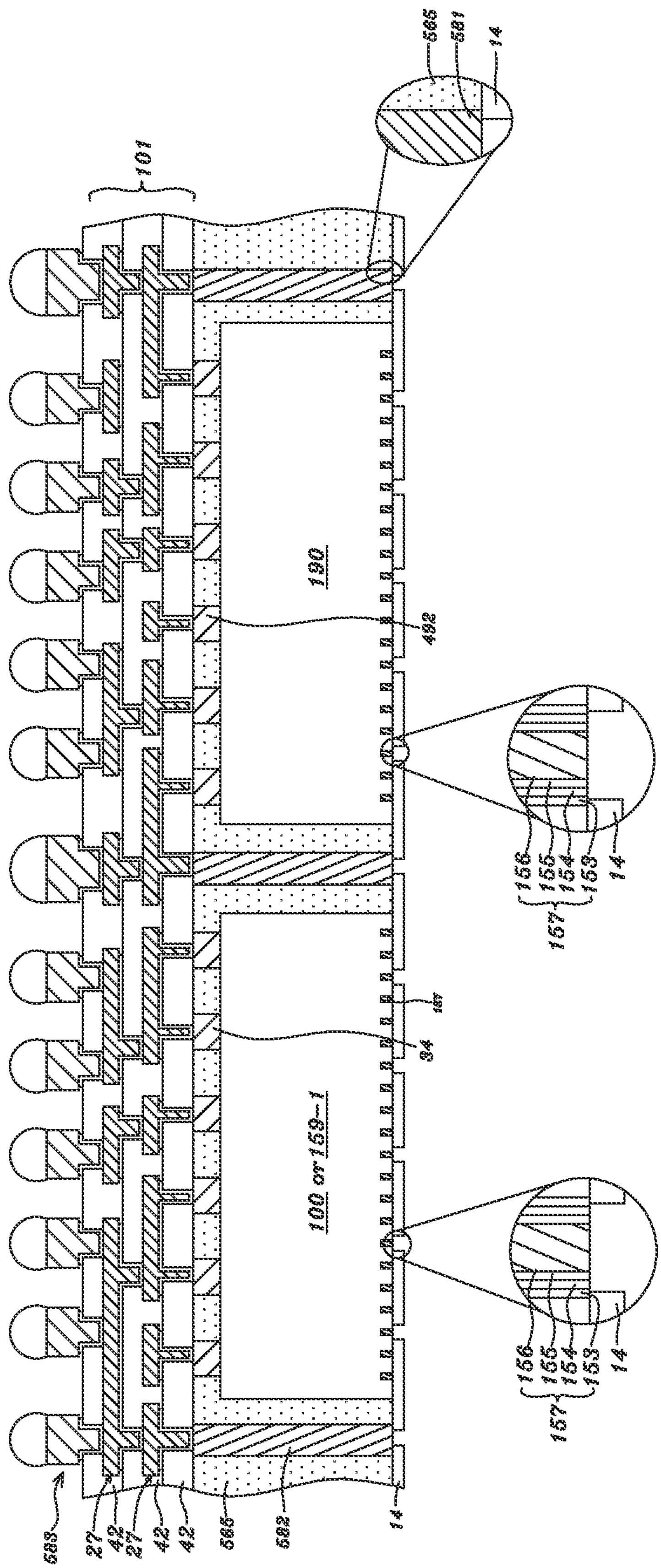
FIGS. 22A and 22B are cross-sectional views showing a process for fabricating a second type of fanout-interconnection-technology (FOIT) chip package in accordance with an embodiment of the present application.
Figure 22B:
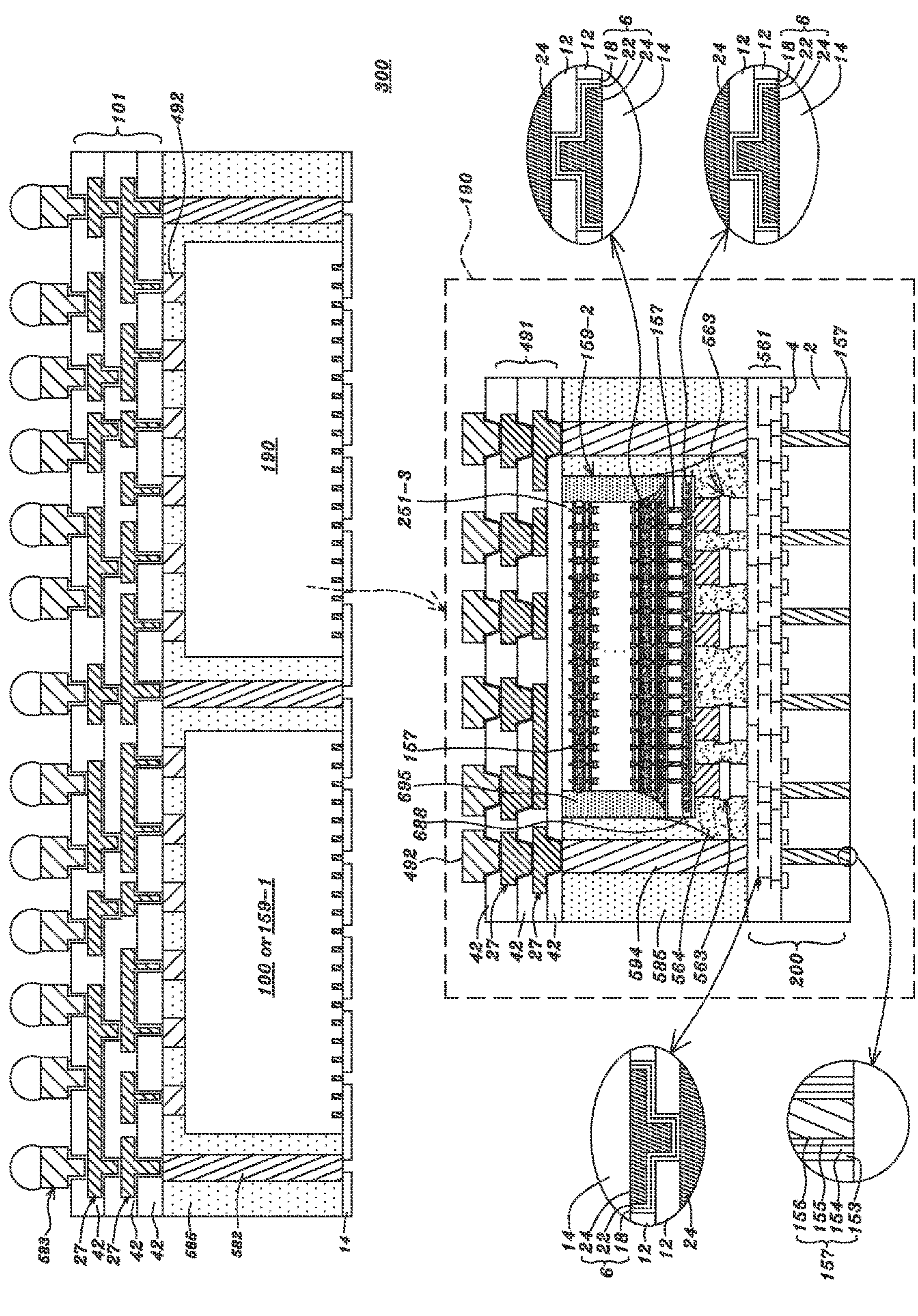

FIGS. 22A and 22B are cross-sectional views showing a process for fabricating a second type of fanout-interconnection-technology (FOIT) chip package in accordance with an embodiment of the present application. A second type of fanout-interconnection-technology (FOIT) chip package may be provided to form the first, second, third or fourth type of standard commodity logic drive 300 as illustrated in FIG. 10A, 10B, 10C or 10D. The specification and process for fabricating a second type of fanout-interconnection-technology (FOIT) chip package is similar to those for fabricating the first type of fanout-interconnection-technology (FOIT) chip package 300 as illustrated in FIGS. 21A-21E. The difference therebetween is mentioned as below: Referring to FIG. 22A, after the temporary substrate (T-sub) 590 and sacrificial bonding layer 591 are removed as illustrated in FIG. 21E, a chemical mechanical polishing (CMP), polishing or grinding process may be applied to a backside of each of the first and/or second types of semiconductor chips 100, a backside of each of the first and/or second types of operation modules 190, a backside of each of the first type of first memory modules 159-1, the bottom surface of the polymer layer 565 and the adhesion layer 26*a* of each of the through package vias (TPV) 582 to expose a backside of the electroplated copper layer 156 of each of the through silicon vias (TSV) 157 of the second type of semiconductor chips 100, a backside of the electroplated copper layer 156 of each of the through silicon vias (TSV) 157 of the standard commodity FPGA IC chip 200, which may be fabricated from the first or second type of semiconductor wafer 100*b* or 100*c* as illustrated in FIG. 17B or 17D, of each of the first and/or second types of operation modules 190, a backside of the electroplated copper layer 156 of each of the through silicon vias (TSV) 157 of the bottommost one of the HBM IC chips 251-3 of each of the first type of first memory modules 159-1 and a backside of the copper layer 581 of each of the through package vias (TPV) 582. The backside of the electroplated copper layer 156 of each of the through silicon vias (TSV) 157 of each of the second type of semiconductor chips 100 may be coplanar to the backside of the semiconductor substrate 2 of said each of the second type of semiconductor chips 100, the bottom surface of the polymer layer 565 and the backside of the copper layer 581 of each of the through package vias (TPV) 582. The backside of the electroplated copper layer 156 of each of the through silicon vias (TSV) 157 of the standard commodity FPGA IC chip 200 of each of the first and/or second types of operation modules 190 may be coplanar to the backside of the semiconductor substrate 2 of the standard commodity FPGA IC chip 200 of said each of the first and/or second types of operation modules 190, the bottom surface of the polymer layer 565 and the backside of the copper layer 581 of each of the through package vias (TPV) 582. The backside of the electroplated copper layer 156 of each of the through silicon vias (TSV) 157 of the bottommost one of the HBM IC chips 251-3 of each of the first type of first memory modules 159-1 may be coplanar to the backside of the semiconductor substrate 2 of the bottommost one of the HBM IC chips 251-3 of said each of the first type of first memory modules 159-1, the bottom surface of the polymer layer 565 and the backside of the copper layer 581 of each of the through package vias (TPV) 582.

Next, referring to FIG. 22A, a passivation layer 14 may be formed on the backside of the semiconductor substrate 2 of each of the second type of semiconductor chips 100, the backside of the semiconductor substrate 2 of the standard commodity FPGA IC chip 200 of each of the first and/or second types of operation modules 190, the backside of the semiconductor substrate 2 of the bottommost one of the HBM IC chips 251-3 of each of the first type of first memory modules 159-1 and the bottom surface of the polymer layer 565 and the backside of the copper layer 581 of each of the through package vias (TPV) 582, wherein each opening **14*a* in the passivation layer 14 may be aligned with and under the backside of the electroplated copper layer 156 of one of the through silicon vias (TSV) 157 of one of the second type of semiconductor chips 100, the backside of the electroplated copper layer 156 of one of the through silicon vias (TSV) 157 of the standard commodity FPGA IC chip 200 of one of the first and/or second types of operation modules 190, or the backside of the copper layer 581 of one of the through package vias (TPV) 582, or with and under the backside of the electroplated copper layer 156 of each of the through silicon vias (TSV) 157 of the bottommost one of the HBM IC chips 251-3 of each of the first type of first memory modules 159-1 particularly for the case for the first or second type of standard commodity logic drive 300 as illustrated in FIG. 10A or 10B and wherein the passivation layer 14 may include a silicon-nitride, SiON or SiCN layer having a thickness greater than 0.3 μm for example and, alternatively, a polymer layer having a thickness between 1 and 10 μm. Next, the polymer layer 565, the polymer layers 42 of the frontside interconnection scheme for a logic drive (FISD) 101 and the passivation layer 14 may be cut or diced to separate multiple individual second type of fanout-interconnection-technology (FOIT) chip packages 300 as seen in FIG. 22B by a laser cutting process or by a mechanical cutting process. For the second type of fanout-interconnection-technology (FOIT) chip packages 300**, each of its through package vias (TPV) may couple to the voltage of power supply (Vcc) for power delivery, the voltage of ground reference (Vss) for ground delivery or a signal source for signal transmission.

Figure 22C:
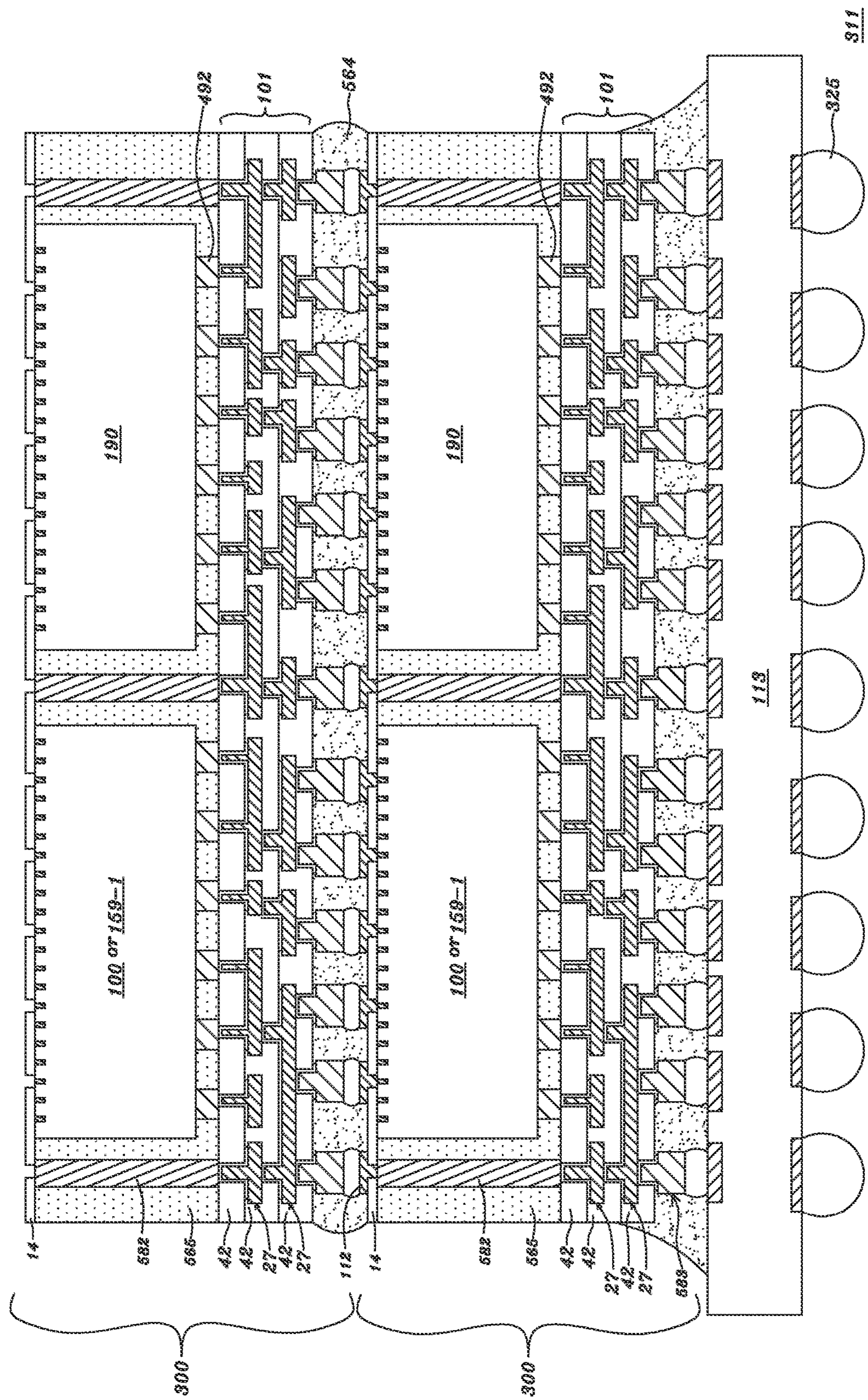
FIG. 22C is a cross-sectional view showing a second type of package-on-package (POP) assembly for a second type of fanout-interconnection-technology (FOIT) chip packages in accordance with an embodiment of the present application.

FIG. 22C is a cross-sectional view showing a second type of package-on-package (POP) assembly for a second type of fanout-interconnection-technology (FOIT) chip packages in accordance with an embodiment of the present application. Referring to FIG. 22C, multiple second type of fanout-interconnection-technology (FOIT) chip packages 300 as illustrated in FIG. 22B may be provided to be flipped and stacked together to form a second type of package-on-package (POP) assembly 311.

For forming the second type of package-on-package (POP) assembly 311 as seen in FIG. 22C, a circuit carrier substrate may be first provided. Next, the bottommost one of the first type of fanout-interconnection-technology (FOIT) chip packages 300 may have the metal bumps or pillars 583 to be bonded to the circuit carrier substrate. Next, an underfill 564 may be filled into a gap between the bottommost one of the first type of fanout-interconnection-technology (FOIT) chip packages 300 and the circuit carrier substrate to enclose the metal bumps or pillars 583 of the bottommost one of the first type of fanout-interconnection-technology (FOIT) chip packages 300.

Next, referring to FIG. 22C, in a first step, a tin-containing solder 112 may be formed on the backside of the electroplated copper layer 156 of some or all of the through silicon vias (TSV) 157 of each of the second type of semiconductor chips 100 of the lower one of the first type of fanout-interconnection-technology (FOIT) chip packages 300, the backside of the electroplated copper layer 156 of some or all of the through silicon vias (TSV) 157 of the standard commodity FPGA IC chip 200 of each of the first and/or second types of operation modules 190 of the lower one of the first type of fanout-interconnection-technology (FOIT) chip packages 300, and the backside of the copper layer 581 of some or all of the through package vias (TPV) 582 of the lower one of the first type of fanout-interconnection-technology (FOIT) chip packages 300, and/or on the backside of the electroplated copper layer 156 of each of the through silicon vias (TSV) 157 of the bottommost one of the HBM IC chips 251-3 of each of the first type of first memory modules 159-1 of the lower one of the first type of fanout-interconnection-technology (FOIT) chip packages 300 particularly for the case for the first or second type of standard commodity logic drive 300 as illustrated in FIG. 10A or 10B. Next, in a second step, an upper one of the first type of fanout-interconnection-technology (FOIT) chip packages 300 may have the metal bumps or pillars 583 to be bonded to the tin-containing solder 112. Next, in a third step, the tin-containing solder 112 may be reflowed to bond each of the metal bumps or pillars 583 of the upper one of the first type of fanout-interconnection-technology (FOIT) chip packages 300 to one of the through silicon vias (TSV) 157 of one of the second type of semiconductor chips 100 of the lower one of the first type of fanout-interconnection-technology (FOIT) chip packages 300, one of the through silicon vias (TSV) 157 of the standard commodity FPGA IC chip 200 of one of the first and/or second types of operation modules 190 of the lower one of the first type of fanout-interconnection-technology (FOIT) chip packages 300, or one of the through package vias (TPV) 582 of the lower one of the first type of fanout-interconnection-technology (FOIT) chip packages 300, or to one of the through silicon vias (TSV) 157 of the bottommost one of the HBM IC chips 251-3 of one of the first type of first memory modules 159-1 of the lower one of the first type of fanout-interconnection-technology (FOIT) chip packages 300 particularly for the case for the first or second type of standard commodity logic drive 300 as illustrated in FIG. 10A or 10B. Next, in a fourth step, an underfill 564 may be filled into a gap between the upper and lower ones of the first type of fanout-interconnection-technology (FOIT) chip packages 300 to enclose the metal bumps or pillars 583 of the upper one of the first type of fanout-interconnection-technology (FOIT) chip packages 300.

Next, referring to FIG. 22C, the above first through fourth steps may be sequentially repeated multiple times to stack, one by one, multiple of the second type of fanout-interconnection-technology (FOIT) chip packages 300 having the number greater than or equal to two, such as four or eight. For a case, all of the second type of fanout-interconnection-technology (FOIT) chip packages stacked as seen in FIG. 22C may be the same.

Next, referring to FIG. 22C, multiple solder balls 325 may be planted on a bottom surface of the circuit carrier substrate. Next, the circuit carrier structure may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process.

Third Type of Fanout-Interconnection-Technology (FOIT) Chip Package

Figure 23A:
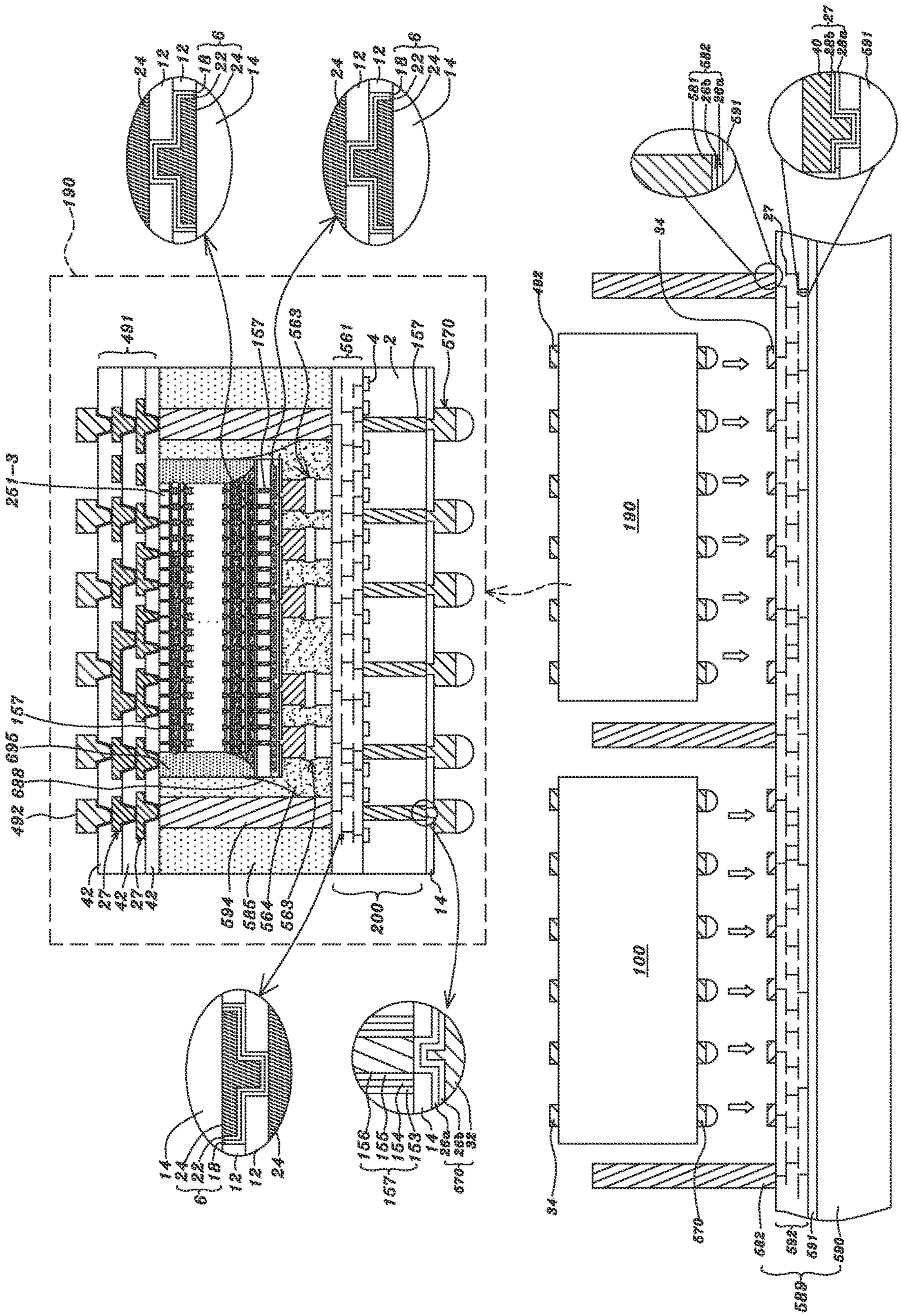
FIGS. 23A-23G are cross-sectional views showing a process for fabricating a third type of fanout-interconnection-technology (FOIT) chip package in accordance with an embodiment of the present application.

FIGS. 23A-23G are cross-sectional views showing a process for fabricating a third type of fanout-interconnection-technology (FOIT) chip package in accordance with an embodiment of the present application. A third type of fanout-interconnection-technology (FOIT) chip package may be provided to form the first, second, third or fourth type of standard commodity logic drive 300 as illustrated in FIG. 10A, 10B, 10C or 10D. Referring to FIG. 23A, a second type of interconnection carrier 589 may be provided with (1) a temporary substrate (T-Sub) 590 having the same specification as that illustrated in FIG. 21A for the first type of interconnection carrier 589; (2) a sacrificial bonding layer 591, i.e., substrate-release layer, on the temporary substrate (T-sub) 590, having the same specification as that illustrated in FIG. 21A for the first type of interconnection carrier 589; and (3) a fan-out interconnection scheme for a logic drive (FOISD) 592 on the sacrificial bonding layer 591, wherein the fan-out interconnection scheme for a logic drive (FOISD) 592 may include one or more interconnection metal layers 27 and one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the sacrificial bonding layer 591 of the second type of interconnection carrier 589. The bottommost one of its interconnection metal layers 27 may have multiple metal vias, each of which is in one of openings in the bottommost one of its polymer layers 42 and has a bottom surface substantially coplanar with a bottom surface of the bottommost one of its polymer layers 42, wherein the bottom surface of each of the metal vias of the bottommost one of its interconnection metal layers 27 and the bottom surface of the bottommost one of its polymer layers 42 may join the sacrificial bonding layer 591 of the second type of interconnection carrier 589. The topmost one of its interconnection metal layers 27 may have multiple metal pads at bottoms of multiple respective openings in the topmost one of its polymer layers 42.

Referring to FIG. 23A, for the fan-out interconnection scheme for a logic drive (FOISD) 592, each of its polymer layers 42 may be a layer of polyimide, BenzoCycloButene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm over said one of its polymer layers 42, (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm, 0.5 μm, 0.7 μm, 1 μm, 1.5 μm, 2 μm, 3 μm or 5 μm.

Referring to FIG. 23A, the second type of interconnection carrier 589 may further include multiple first, second or fourth type of micro-bumps or micro-pillars 34 as illustrated in FIG. 14A on a first group of metal pads of the topmost one of the interconnection metal layers 27 of its fan-out interconnection scheme for a logic drive (FOISD) 592, and multiple through package vias (TPVs) 582 as illustrated in FIG. 21A on a second group of metal pads of the topmost one of the interconnection metal layers 27 of its fan-out interconnection scheme for a logic drive (FOISD) 592, wherein each of its through package vias (TPVs) 582 may include an adhesion layer 26*a*, such as titanium (Ti) or titanium nitride (TiN) layer having a thickness of between 1 nm and 50 nm, on one of the second group of metal pads of the topmost one of the interconnection metal layers 27 of its fan-out interconnection scheme for a logic drive (FOISD) 592, a seed layer 26*b*, such as copper, on its adhesion layer 26*a* and a copper layer 581 having a thickness of between 20 μm and 300 μm, 30 μm and 200 μm, 50 μm and 150 μm, 50 μm and 120 μm, 20 μm and 100 μm, 20 μm and 60 μm, 20 μm and 40 μm, or 20 μm and 30 μm, or greater than or taller than or equal to 100 μm, 50 μm, 30 μm or 20 μm on its seed layer 26*b*.

Figure 23B:
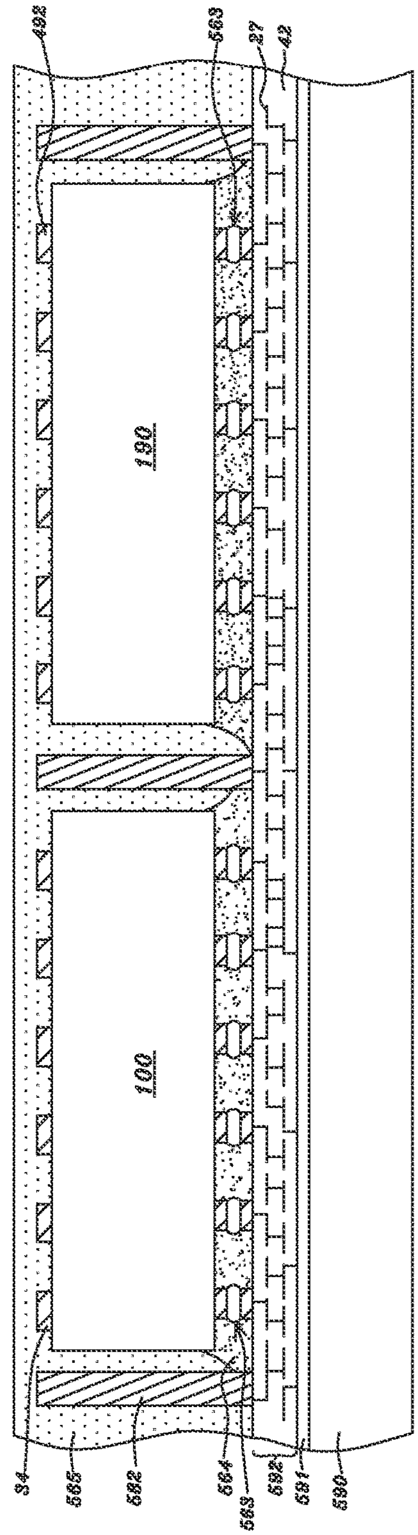

Referring to FIGS. 23A and 23B, one or more first and/or second types of semiconductor chips 100 as illustrated in FIGS. 14A and 14B may be provided, each having a backside at a bottom thereof to be bonded to the topmost one of the polymer layers 42 of the fan-out interconnection scheme for a logic drive (FOISD) 592 of the second type of interconnection carrier 589 and having the first type of micro-bumps or micro-pillars 34 facing upwards. Each of the first and/or second types of semiconductor chips 100 may be the DPIIC chip 410, IAC chip 402, dedicated control and input/output (I/O) chip 265, NVM IC chip 250, first HBM IC chip 251-1, PCIC chip 269, GPU chip 269*a* or CPU chip 269*b* for the first, second, third or fourth type of standard commodity logic drive 300 as illustrated in FIG. 10A-10D. One or more first type of first memory modules 159-1 as seen in FIG. 15A but not shown in FIGS. 23A and 23B may be provided to be flipped to be bonded to the topmost one of the polymer layers 42 of the fan-out interconnection scheme for a logic drive (FOISD) 592 of the second type of interconnection carrier 589 and having the first type of micro-bumps or micro-pillars 34 facing upwards, wherein the topmost one of the HBM IC chips 251-3 of each of the first type of first memory modules 159-1 as seen in FIG. 15A may be flipped to become the bottom-most one of the HBM IC chips 251-3 of said each of the first type of first memory modules 159-1 and may have a backside to be bonded to the topmost one of the polymer layers 42 of the fan-out interconnection scheme for a logic drive (FOISD) 592 of the second type of interconnection carrier 589. One or more first and/or second types of operation modules 190 as illustrated in FIG. 18E or 20E and/or FIG. 18F or 20F may be provided, each having a backside at a bottom thereof to be bonded to the topmost one of the polymer layers 42 of the fan-out interconnection scheme for a logic drive (FOISD) 592 of the second type of interconnection carrier 589 and having the first type of metal bumps or pillars 492 facing upwards, wherein the standard commodity FPGA IC chip 200 of each of the first and/or second types of operation modules 190 may have a backside at a bottom thereof to be bonded to the topmost one of the polymer layers 42 of the fan-out interconnection scheme for a logic drive (FOISD) 592 of the second type of interconnection carrier 589.

Referring to FIGS. 23A and 23B, one or more third type of semiconductor chips 100 as illustrated in FIG. 14C may be provided, each having the micro-bumps or micro-pillars 570 to be bonded to the micro-bumps or micro-pillars 34 of the second type of interconnection carrier 589 and having the first type of micro-bumps or micro-pillars 34 facing upwards. Each of the third type of semiconductor chips 100 may be the DPIIC chip 410, IAC chip 402, dedicated control and input/output (I/O) chip 265, NVM IC chip 250, first HBM IC chip 251-1, PCIC chip 269, GPU chip 269*a* or CPU chip 269*b* for the first, second, third or fourth type of standard commodity logic drive 300 as illustrated in FIGS. 10A-10D. Further, one or more third and/or fourth types of operation modules 190 as illustrated in FIG. 18G or 20G and/or FIG. 18H or 20H may be provided, each having the micro-bumps or micro-pillars 570 to be bonded to the micro-bumps or micro-pillars 34 of the second type of interconnection carrier 589 and having the first type of micro-bumps or micro-pillars 34 facing upwards.

Figure 24B:
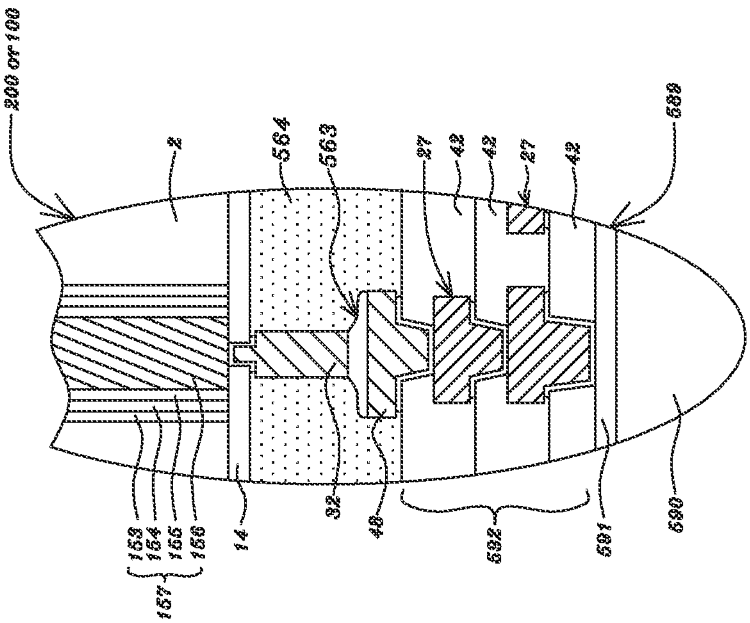
FIGS. 24A and 24B are schematically cross-sectional views showing a process of bonding a thermal compression bump to a thermal compression pad in accordance with an embodiment of the present application.
Figure 24A:
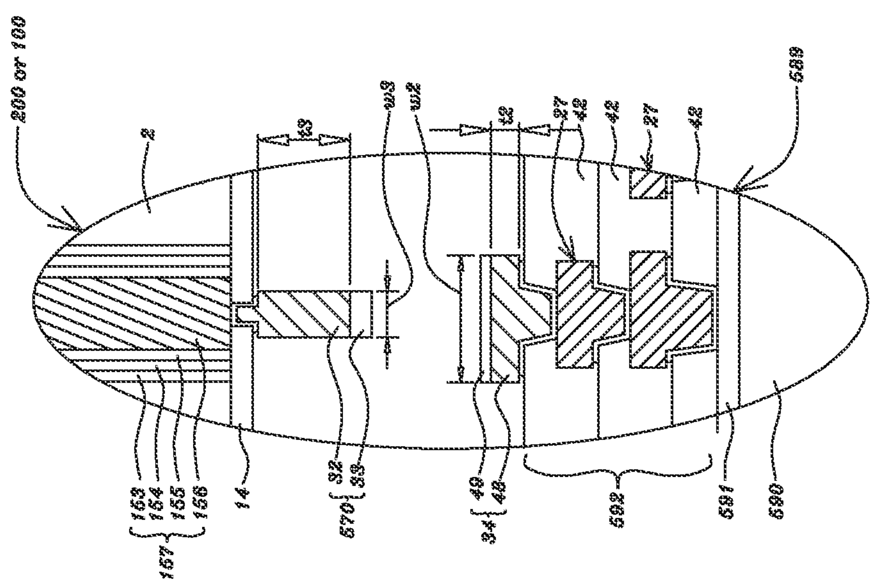

FIGS. 24A and 24B are schematically cross-sectional views showing a process of bonding a thermal compression bump to a thermal compression pad in accordance with an embodiment of the present application. For a first case, referring to FIGS. 23A, 23B, 24A and 24B, each of the third type of semiconductor chips 100 and the third and/or fourth types of operation modules 190 may have the third type of micro-bumps or micro-pillars 570 to be bonded to the fourth type of micro-bumps or micro-pillars 34 of the second type of interconnection carrier 589. For example, the third type of micro-bumps or micro-pillars 570 of each of the third type of semiconductor chips 100 and the third and/or fourth types of operation modules 190 may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pillars 34 of the second type of interconnection carrier 589 into multiple bonded contacts 563 between said each of the third type of semiconductor chips 100 and the third and/or fourth types of operation modules 190 and the fan-out interconnection scheme for a logic drive (FOISD) 592 of the second type of interconnection carrier 589. Each of the third type of micro-bumps or micro-pillars 570 of said each of the third type of semiconductor chips 100 and the third and/or fourth types of operation modules 190 may have the copper layer 37 having the thickness t3 greater than the thickness t2 of the copper layer 48 of each of the fourth type of micro-bumps or micro-pillars 34 of the second type of interconnection carrier 589 and having the largest transverse dimension w3 equal to between 0.7 and 0.1 times of the largest transverse dimension w2 of the copper layer 48 of each of the fourth type of micro-bumps or micro-pillars 34 of the second type of interconnection carrier 589. Alternatively, each of the third type of micro-pillars or micro-bumps 570 of said each of the third type of semiconductor chips 100 and the third and/or fourth types of operation modules 190 may be provided with the copper layer 37 having a cross-sectional area equal to between 0.5 and 0.01 times of the cross-sectional area of the copper layer 48 of each of the fourth type of micro-bumps or micro-pillars 34 of the second type of interconnection carrier 589. A bonded solder between the copper layers 37 and 48 of each of the bonded contacts 563 may be mostly kept on a top surface of the copper layer 48 of one of the fourth type of micro-bumps or micro-pillars 34 of the second type of interconnection carrier 589 and extends out of the edge of the copper layer 48 of said one of the fourth type of micro-bumps or micro-pillars 34 of the second type of interconnection carrier 589 less than 0.5 micrometers. Thus, a short between neighboring two of the bonded contacts 563 even in a fine-pitched fashion may be avoided.

Alternatively, for a second case, referring to FIGS. 23A and 23B, each of the third type of semiconductor chips 100 and the third and/or fourth types of operation modules 190 may have the second type of micro-bumps or micro-pillars 570 to be bonded to the first type of micro-bumps or micro-pillars 34 of the second type of interconnection carrier 589. For example, the second type of micro-bumps or micro-pillars 570 of said each of the third type of semiconductor chips 100 and the third and/or fourth types of operation modules 190 may have the solder caps 33 to be bonded onto the electroplated copper layer 32 of the first type of micro-bumps or micro-pillars 34 of the second type of interconnection carrier 589 into multiple bonded contacts 563 between said each of the third type of semiconductor chips 100 and the third and/or fourth types of operation modules 190 and the fan-out interconnection scheme for a logic drive (FOISD) 592 of the second type of interconnection carrier 589. Each of the second type of micro-bumps or micro-pillars 570 of said each of the third type of semiconductor chips 100 and the third and/or fourth types of operation modules 190 may have the electroplated copper layer 32 having a thickness greater than that of the electroplated copper layer 32 of each of the first type of micro-bumps or micro-pillars 34 of the second type of interconnection carrier 589.

Alternatively, for a third case, referring to FIGS. 23A and 23B, each of the third type of semiconductor chips 100 and the third and/or fourth types of operation modules 190 may have the first type of micro-bumps or micro-pillars 570 to be bonded to the second type of metal bumps or pillars 34 of the second type of interconnection carrier 589. For example, the first type of micro-bumps or micro-pillars 570 of said each of the third type of semiconductor chips 100 and the third and/or fourth types of operation modules 190 may have the electroplated metal layer 32, e.g. copper layer, to be bonded onto the solder caps 33 of the second type of micro-bumps or micro-pillars 34 of the second type of interconnection carrier 589 into multiple bonded contacts 563 between said each of the third type of semiconductor chips 100 and the third and/or fourth types of operation modules 190 and the fan-out interconnection scheme for a logic drive (FOISD) 592 of the second type of interconnection carrier 589. Each of the first type of micro-bumps or micro-pillars 570 of said each of the third type of semiconductor chips 100 and the third and/or fourth types of operation modules 190 may have the electroplated copper layer 32 having a thickness greater than that of the electroplated copper layer 32 of each of the second type of micro-bumps or micro-pillars 34 of the second type of interconnection carrier 589.

Alternatively, for a fourth case, referring to FIGS. 23A and 23B, each of the third type of semiconductor chips 100 and the third and/or fourth types of operation modules 190 may have the second type of micro-bumps or micro-pillars 570 to be bonded to the second type of micro-bumps or micro-pillars 34 of the second type of interconnection carrier 589. For example, the second type of micro-bumps or micro-pillars 570 of said each of the third type of semiconductor chips 100 and the third and/or fourth types of operation modules 190 may have the solder caps 33 to be bonded onto the solder caps 33 of the second type of micro bumps or micro-pillars 34 of the second type of interconnection carrier 589 into multiple bonded contacts 563 between said each of the third type of semiconductor chips 100 and the third and/or fourth types of operation modules 190 and the fan-out interconnection scheme for a logic drive (FOISD) 592 of the second type of interconnection carrier 589. Each of the second type of micro-bumps or micro-pillars 34 of said each of the third type of semiconductor chips 100 and the third and/or fourth types of operation modules 190 may have the electroplated copper layer 32 having a thickness greater than that of the electroplated copper layer 32 of each of the second type of micro-bumps or micro-pillars 34 of the second type of interconnection carrier 589.

Next, referring to FIG. 23B, an underfill 564, such as epoxy resins or compounds, may be filled into a gap between each of the third type of semiconductor chips 100 and the third and/or fourth types of operation modules 190 and the fan-out interconnection scheme for a logic drive (FOISD) 592 of the second type of interconnection carrier 589 to enclose the bonded contacts 563 therebetween. The underfill 564 may be cured at temperature equal to or above 100, 120 or 150 degrees Celsius.

Next, referring to FIG. 22B, a polymer layer 565, e.g., resin or compound, may be applied by methods, for example, spin-on coating, screen-printing, dispensing or molding to fill the gaps each between neighboring two of the first, second and/or third types of semiconductor chips 100, the first type of first memory module 159-1 (not shown) and the first, second, third and/or fourth types of operation modules 190 and the gaps each between neighboring two of the through package vias (TPVs) 582 and to cover over each of the first type of micro bumps or micro-pillars 34 of each of the first, second and/or third types of semiconductor chips 100, each of the first type of micro-bumps or micro-pillars 34 of each of the first type of first memory modules 159-1, each of the first type of metal bumps or pillars 492 of each of the first, second, third and/or fourth types of operation modules 190 and each of the through package vias (TPVs) 582.

Figure 23C:
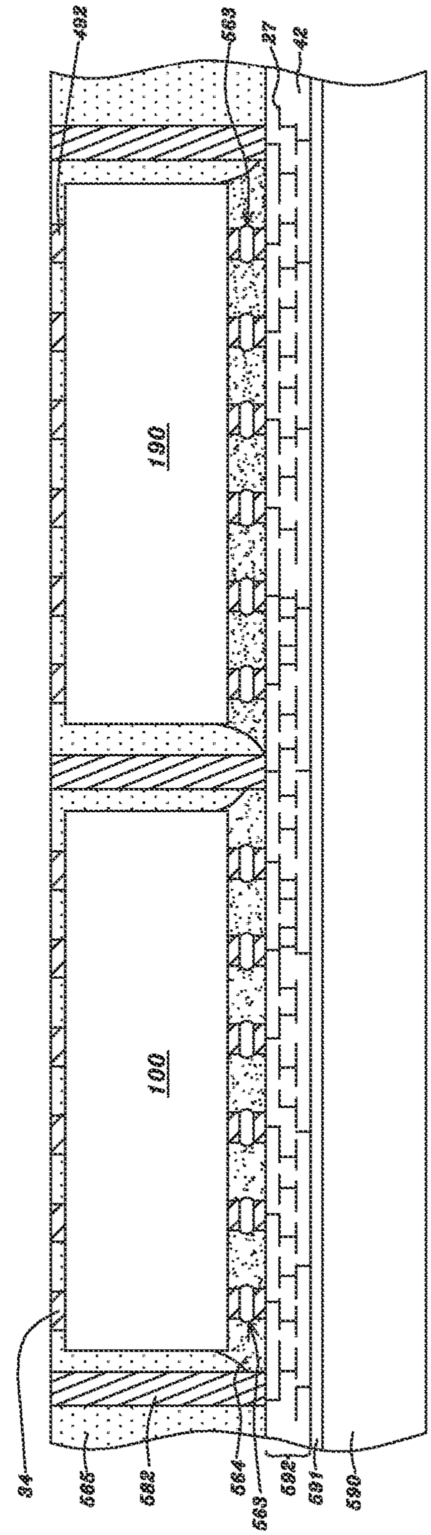

Next, referring to FIG. 23C, a chemical mechanical polishing (CMP), polishing or grinding process may be applied to remove a top portion of the polymer layer 565 to expose a top surface of the copper layer 32 of each of the first type of micro-bumps or micro-pillars 34 of each of the first, second and/or third types of semiconductor chips 100, a top surface of the copper layer 32 of each of the first type of micro bumps or micro-pillars 34 of each of the first type of first memory modules 159-1 (not shown), a top surface of the copper layer 32 of each of the first type of metal bumps or pillars 492 of each of the first, second, third and/or fourth types of operation modules 190 and a top surface of the copper layer 581 of each of the through package vias (TPVs) 582 and to planarize a top surface of the polymer layer 565, the top surface of the copper layer 32 of each of the first type of micro bumps or micro-pillars 34 of each of the first, second and/or third types of semiconductor chips 100, the top surface of the copper layer 32 of each of the first type of micro-bumps or micro-pillars 34 of each of the first type of first memory modules 159-1, the top surface of the copper layer 32 of each of the first type of metal bumps or pillars 492 of each of the first, second, third and/or fourth types of operation modules 190 and the top surface of the copper layer 581 of each of the through package vias (TPVs) 582.

Figure 23D:
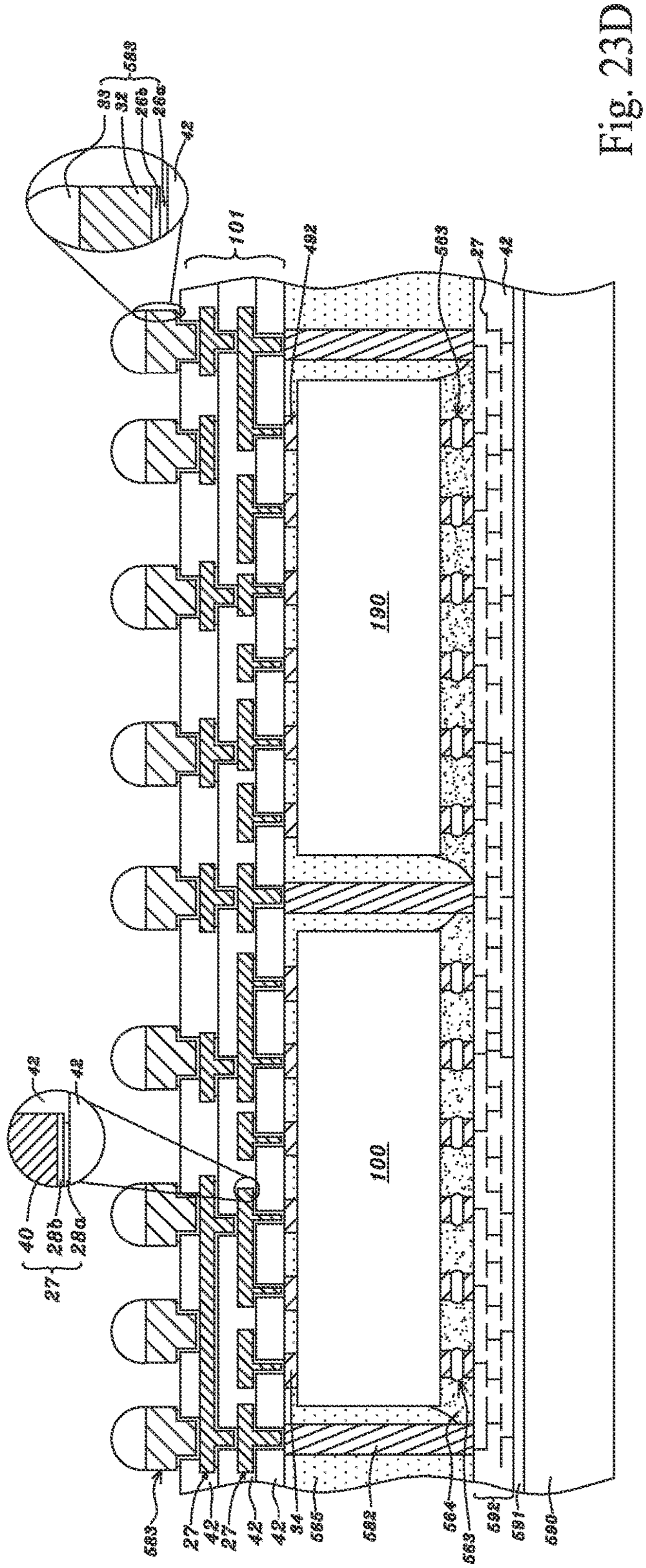

Next, referring to FIG. 23D, the frontside interconnection scheme for a logic drive (FISD) 101 as illustrated in FIG. 21D may be formed over the top surface of the polymer layer 565, the top surface of each of the first type of micro-bumps or micro-pillars 34 of each of the first, second and/or third types of semiconductor chips 100, the top surface of each of the first type of micro-bumps or micro-pillars 34 of the first type of first memory modules 159-1, the top surface of each of the first type of metal bumps or pillars 492 of each of the first, second, third and/or fourth types of operation modules 190 and the top surface of each of the through package vias (TPVs) 582. The specification and process for the frontside interconnection scheme for a logic drive (FISD) 101 herein may be referred to those as illustrated in FIG. 21D. For the frontside interconnection scheme for a logic drive (FISD) 101, each of its interconnection metal layers 27 may couple to some or all of the first type of micro-bumps or micro-pillars 34 of each of the first, second and/or third types of semiconductor chips 100, some or all of the first type of micro-bumps or micro-pillars 34 of each of the first type of first memory modules 159-1, some or all of the first type of metal bumps or pillars 492 of each of the first, second, third and/or fourth types of operation modules 190 and some or all of the through package vias (TPVs) 582. Each opening in the bottommost one of its polymer layers 42 may be over the top surface of the copper layer 32 of one of the first type of micro-bumps or micro-pillars 34 of one of the first, second and/or third types of semiconductor chips 100, the top surface of the copper layer 32 of one of the first type of micro-bumps or micro-pillars 34 of one of the first type of first memory modules 159-1, the top surface of the copper layer 32 of one of the first type of metal bumps or pillars 492 of one of the first, second, third and/or fourth types of operation modules 190 or the top surface of the copper layer 581 of one of the through package vias (TPVs) 582; that is, the top surface of the copper layer 32 of each of some or all of the first type of micro-bumps or micro-pillars 34 of each of the first, second and/or third types of semiconductor chips 100 may be at a bottom of one of the openings in the bottommost one of its polymer layers 42, the top surface of the copper layer 32 of each of some or all of the first type of micro-bumps or micro-pillars 34 of each of the first type of first memory modules 159-1 may be at a bottom of one of the openings in the bottommost one of its polymer layers 42, the top surface of the copper layer 32 of each of some or all of the first type of metal bumps or pillars 492 of each of the first, second, third and/or fourth types of operation modules 190 may be at a bottom of one of the openings in the bottommost one of its polymer layers 42, and the top surface of the copper layer 581 of each of some or all of the through package vias (TPVs) 582 may be at a bottom of one of the openings in the bottommost one of its polymer layers 42. Each of its interconnection metal layers 27 may extend horizontally across an edge of each of the first, second and/or third types of semiconductor chips 100, the first type of first memory modules 159-1 and the first, second, third and/or fourth types of operation modules 190.

Next, referring to FIG. 23D, the metal bumps or pillars 583 as illustrated in FIG. 21D may be formed on the metal pads of the topmost one of the interconnection metal layers 27 of the frontside interconnection scheme for a logic drive (FISD) 101. The specification and process for the metal bumps or pillars 583 herein may be referred to those as illustrated in FIG. 21D.

Figure 23E:
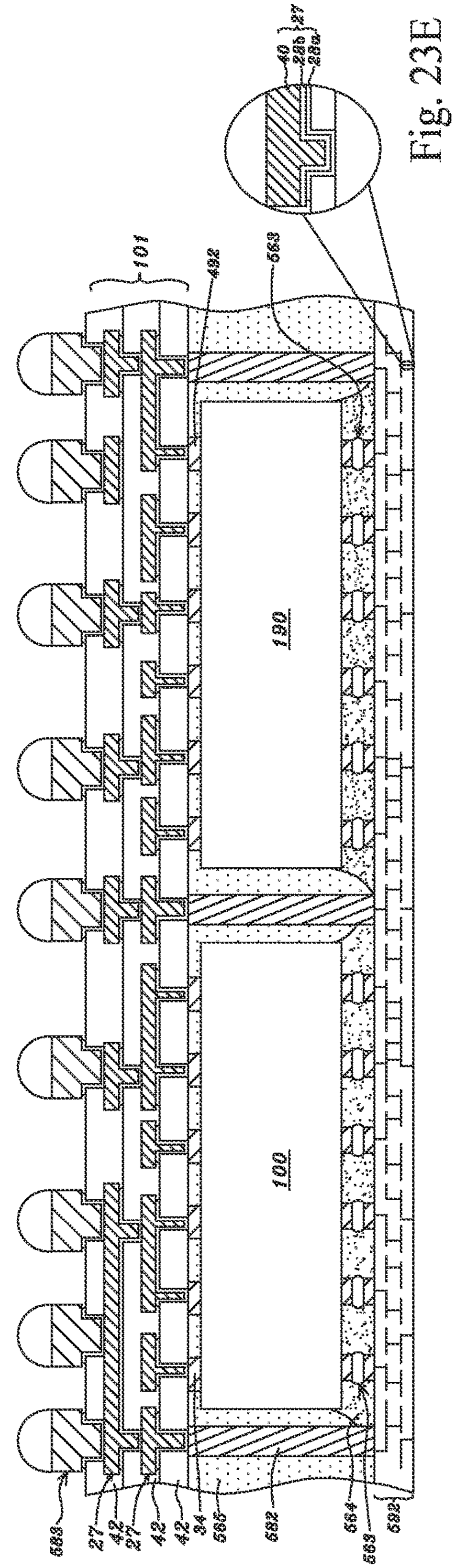

Next, referring to FIG. 23E, the temporary substrate (T-sub) 590 may be released from the sacrificial bonding layer 591, as illustrated in FIG. 21E. Next, an adhesive peeling tape (not shown) may be attached to a bottom of the sacrificial bonding layer 591. Next, the sacrificial bonding layer 591 may be released or peeled from the bottom surface of the bottommost one of the polymer layers 42 of the fan-out interconnection scheme for a logic drive (FOISD) 592 and the bottom surface of each of the metal vias of the bottommost one of the interconnection metal layers 27 of the fan-out interconnection scheme for a logic drive (FOISD) 592 to expose the bottom surface of the bottommost one of the polymer layers 42 of the fan-out interconnection scheme for a logic drive (FOISD) 592 and the bottom surface of each of the metal vias of the bottommost one of the interconnection metal layers 27 of the fan-out interconnection scheme for a logic drive (FOISD) 592. Alternatively, the temporary substrate (T-sub) 590 and sacrificial bonding layer 591 may be removed by a grinding or polishing process to expose the bottom surface of the bottommost one of the polymer layers 42 of the fan-out interconnection scheme for a logic drive (FOISD) 592 and the bottom surface of each of the metal vias of the bottommost one of the interconnection metal layers 27 of the fan-out interconnection scheme for a logic drive (FOISD) 592. Alternatively, the temporary substrate (T-sub) 590 and sacrificial bonding layer 591 may be removed after removing the top portion of the polymer layer 565 as illustrated in FIG. 22C and before forming the frontside interconnection scheme for a logic drive (FISD) 101 as illustrated in FIG. 22D.

Figure 23F:
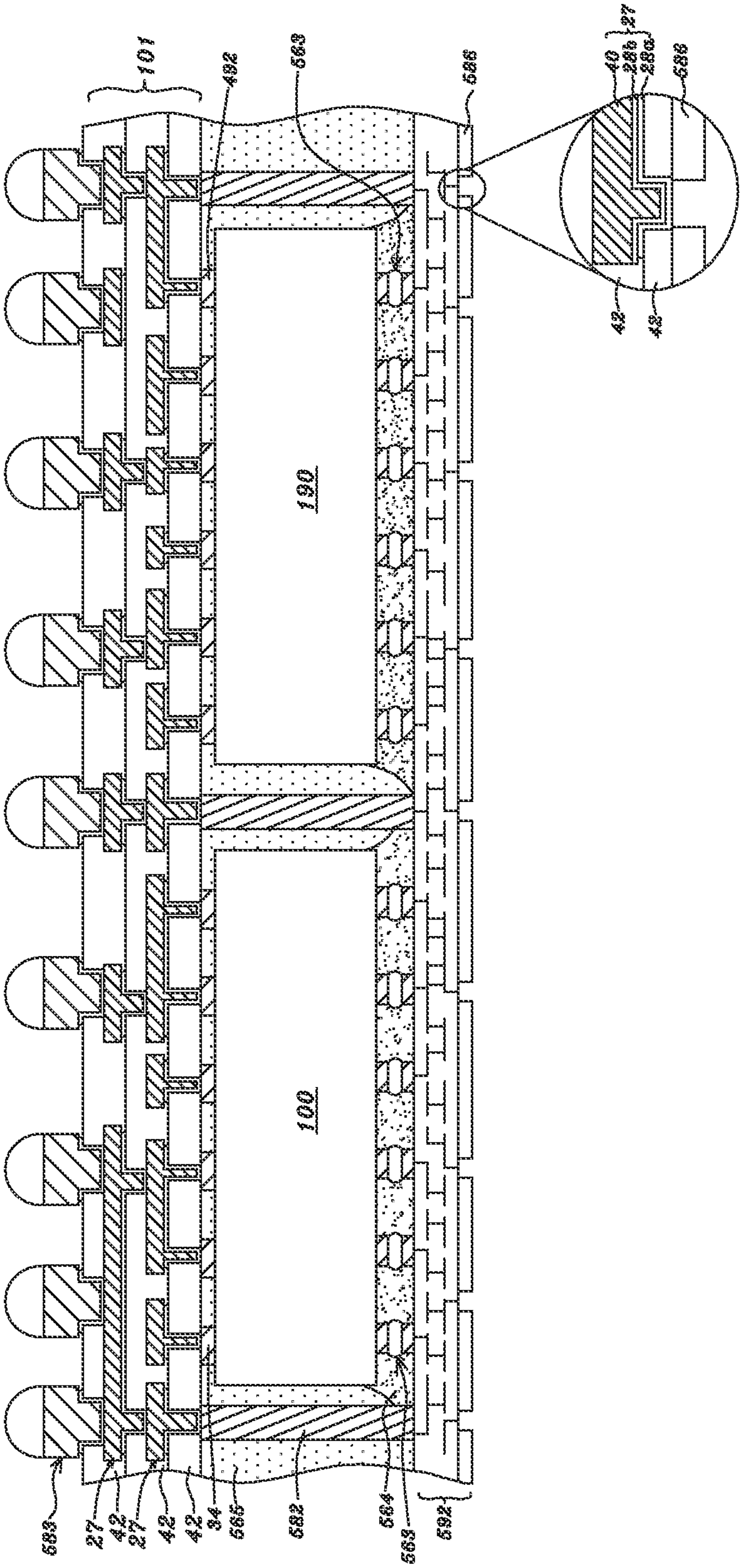

Next, referring to FIG. 23F, a polymer layer 586 may be formed on the bottom surface of the bottommost one of the polymer layers 42 of the fan-out interconnection scheme for a logic drive (FOISD) 592 and each opening in the polymer layer 586 may be aligned with and under the bottom surface of one of the metal vias of the bottommost one of the interconnection metal layers 27 of the fan-out interconnection scheme for a logic drive (FOISD) 592; that is, the bottom surface of each of the metal vias of the bottommost one of the interconnection metal layers 27 of the fan-out interconnection scheme for a logic drive (FOISD) 592 may be at a top of one of the openings in the polymer layer 586. The polymer layer 586 may be a layer of polyimide, BenzoCycloButene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, which is defined as a portion of the fan-out interconnection scheme for a logic drive (FOISD) 592.

Figure 23G:
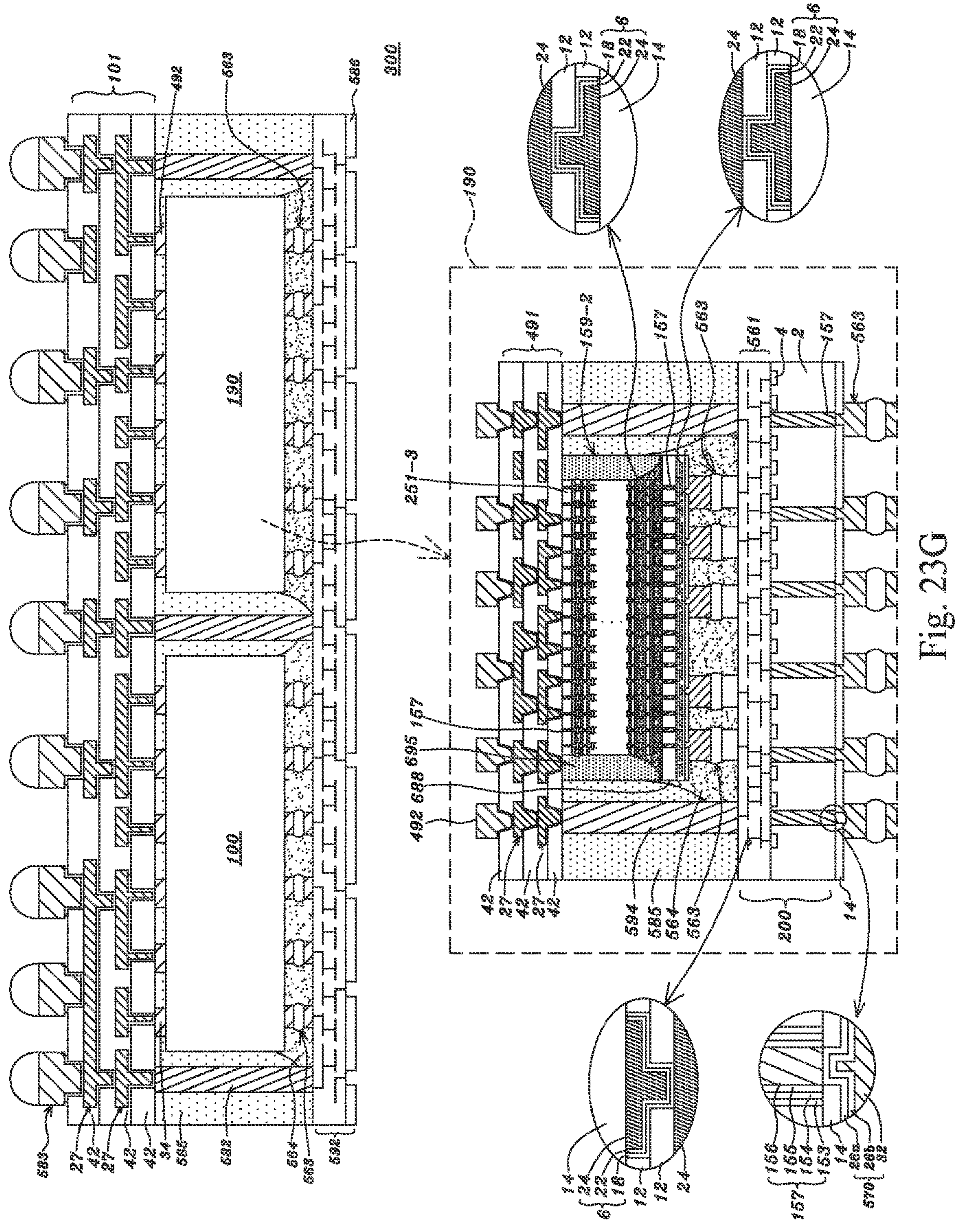

Next, the polymer layer 565, the polymer layers 42 of the frontside interconnection scheme for a logic drive (FISD) 101 and the polymer layers 42 and 586 of the fan-out interconnection scheme for a logic drive (FOISD) 592 may be cut or diced to separate multiple individual third type of fanout-interconnection-technology (FOIT) chip packages 300 as seen in FIG. 23G by a laser cutting process or by a mechanical cutting process. For the third type of fanout-interconnection-technology (FOIT) chip packages 300, each of its through package vias (TPV) may couple to the voltage of power supply (Vcc) for power delivery, the voltage of ground reference (Vss) for ground delivery or a signal source for signal transmission. For the third type of fanout-interconnection-technology (FOIT) chip package 300, each of its through package vias (TPVs) 582 may have a height taller than each of its bonded contacts 563 between each of its third type of semiconductor chips 100 and its third and/or fourth types of operation modules 190 and its fan-out interconnection scheme for a logic drive (FOISD) 592 by greater than 20 micrometers or 50 micrometers.

Figure 23H:
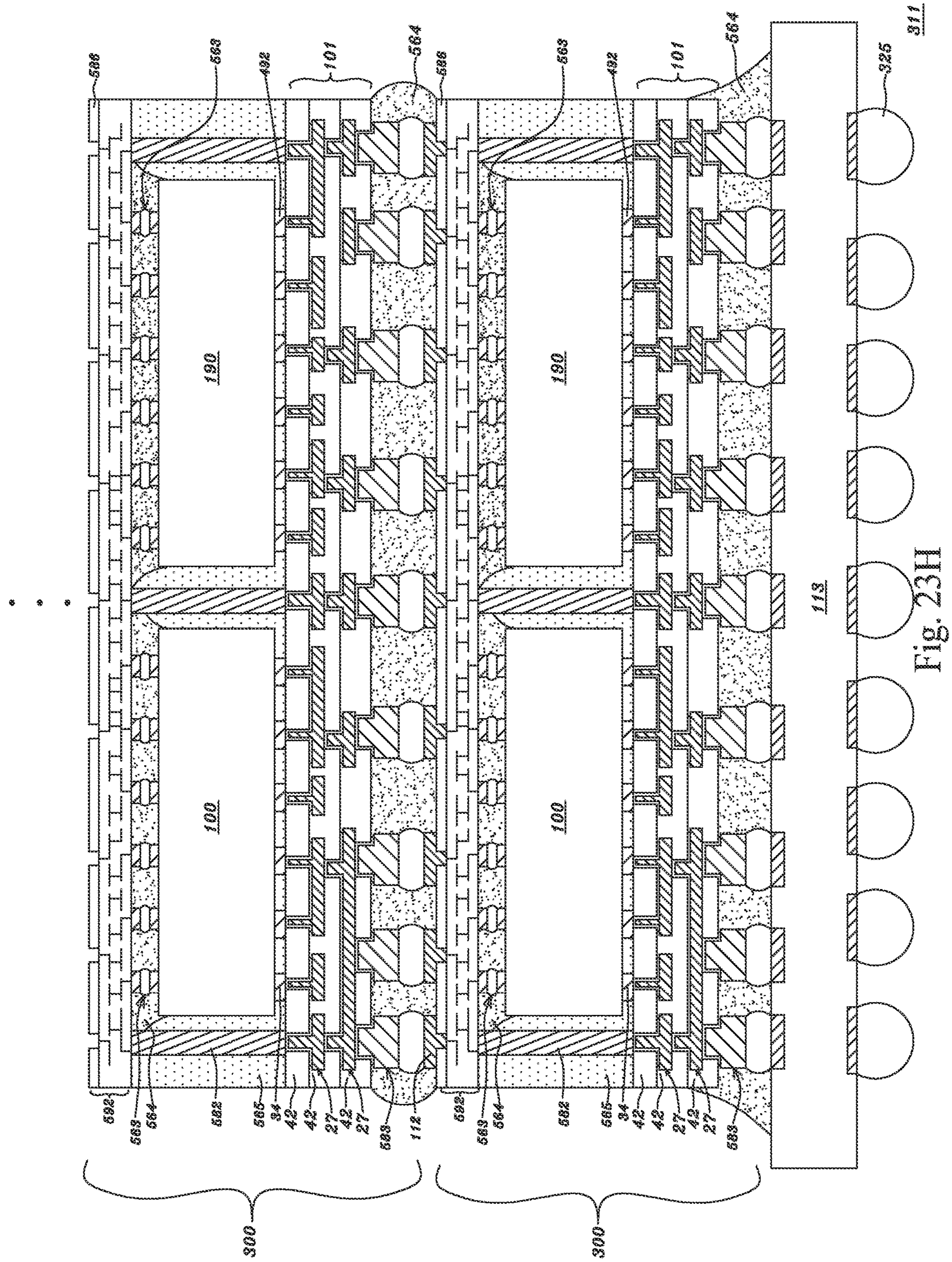
FIG. 23H is a cross-sectional view showing a third type of package-on-package (POP) assembly for a third type of fanout-interconnection-technology (FOIT) chip packages in accordance with an embodiment of the present application.

FIG. 23H is a cross-sectional view showing a third type of package-on-package (POP) assembly for a third type of fanout-interconnection-technology (FOIT) chip packages in accordance with an embodiment of the present application. Referring to FIG. 23H, multiple third type of fanout-interconnection-technology (FOIT) chip packages 300 as illustrated in FIG. 23G may be provided to be flipped and stacked together to form a third type of package-on-package (POP) assembly 311.

For forming the third type of package-on-package (POP) assembly 311 as seen in FIG. 23H, a circuit carrier substrate may be first provided. Next, the bottommost one of the third type of fanout-interconnection-technology (FOIT) chip packages 300 may have the metal bumps or pillars 583 to be bonded to the circuit carrier substrate. Next, an underfill 564 may be filled into a gap between the bottommost one of the third type of fanout-interconnection-technology (FOIT) chip packages 300 and the circuit carrier substrate to enclose the metal bumps or pillars 583 of the bottommost one of the third type of fanout-interconnection-technology (FOIT) chip packages 300.

Next, referring to FIG. 23H, in a first step, a tin-containing solder 112 may be formed on the top surface of each of some or all of the metal vias of the topmost one of the interconnection metal layers 27 of the fan-out interconnection scheme for a logic drive (FOISD) 592 of the lower one of the third type of fanout-interconnection-technology (FOIT) chip packages 300. Next, in a second step, an upper one of the third type of fanout-interconnection-technology (FOIT) chip packages 300 may have the metal bumps or pillars 583 to be bonded to the tin-containing solder 112. Next, in a third step, the tin-containing solder 112 may be reflowed to bond each of the metal bumps or pillars 583 of the upper one of the third type of fanout-interconnection-technology (FOIT) chip packages 300 to one of the metal vias of the topmost one of the interconnection metal layers 27 of the fan-out interconnection scheme for a logic drive (FOISD) 592 of the lower one of the third type of fanout-interconnection-technology (FOIT) chip packages 300. Next, in a fourth step, an underfill 564 may be filled into a gap between the upper and lower ones of the third type of fanout-interconnection-technology (FOIT) chip packages 300 to enclose the metal bumps or pillars 583 of the upper one of the third type of fanout-interconnection-technology (FOIT) chip packages 300.

Next, referring to FIG. 23H, the above first through fourth steps may be sequentially repeated multiple times to stack, one by one, multiple of the third type of fanout-interconnection-technology (FOIT) chip packages 300 having the number greater than or equal to two, such as four or eight.

For a case, all of the third type of fanout-interconnection-technology (FOIT) chip packages stacked as seen in FIG. 23H may be the same.

Next, referring to FIG. 23H, multiple solder balls 325 may be planted on a bottom surface of the circuit carrier substrate. Next, the circuit carrier structure may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process.

Fourth Type of Fanout-Interconnection-Technology (FOIT) Chip Package

Figure 25A:
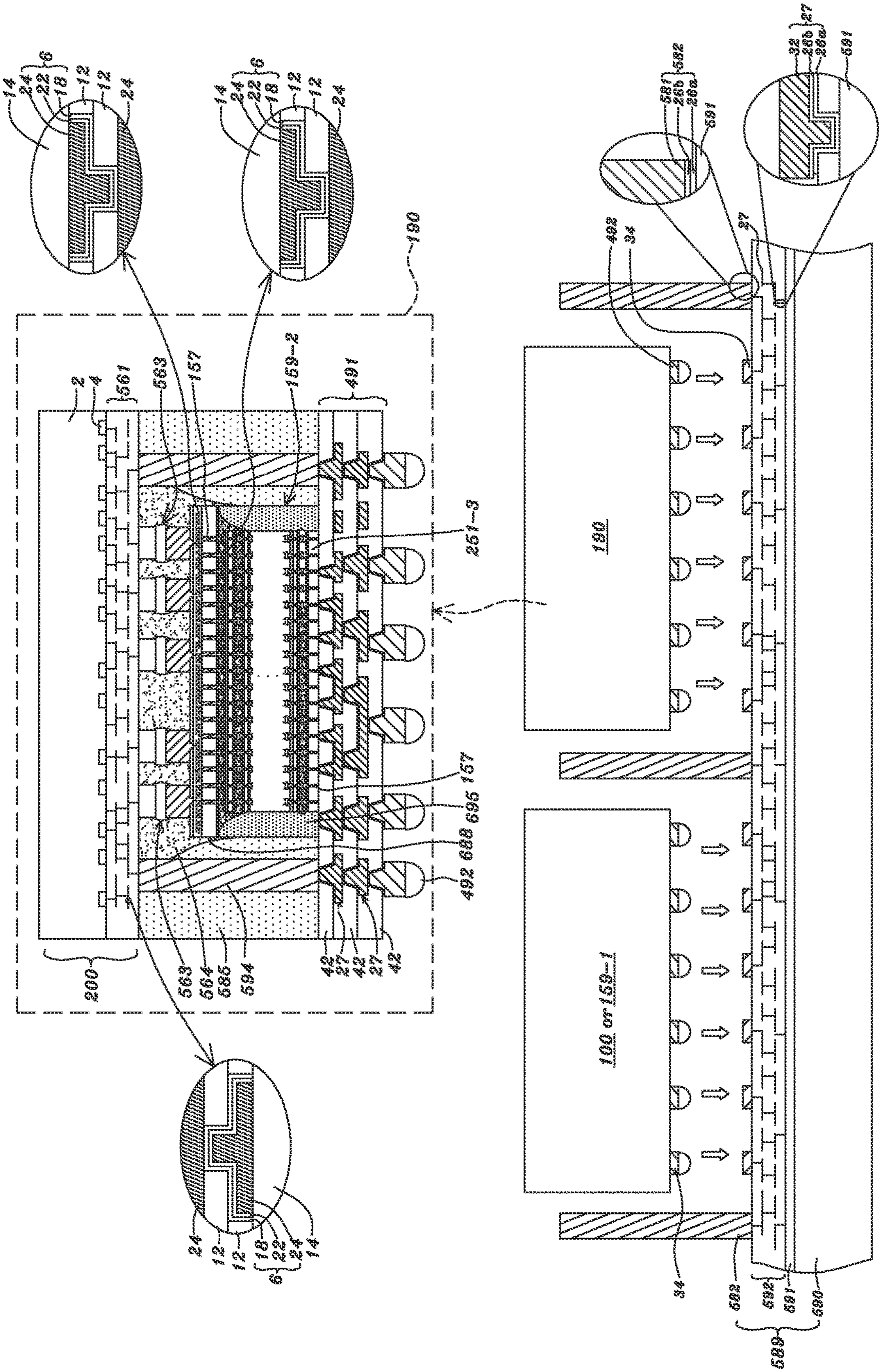
FIGS. 25A-25F are cross-sectional views showing a process for fabricating a fourth type of fanout-interconnection-technology (FOIT) chip package in accordance with an embodiment of the present application.
Figure 25B:
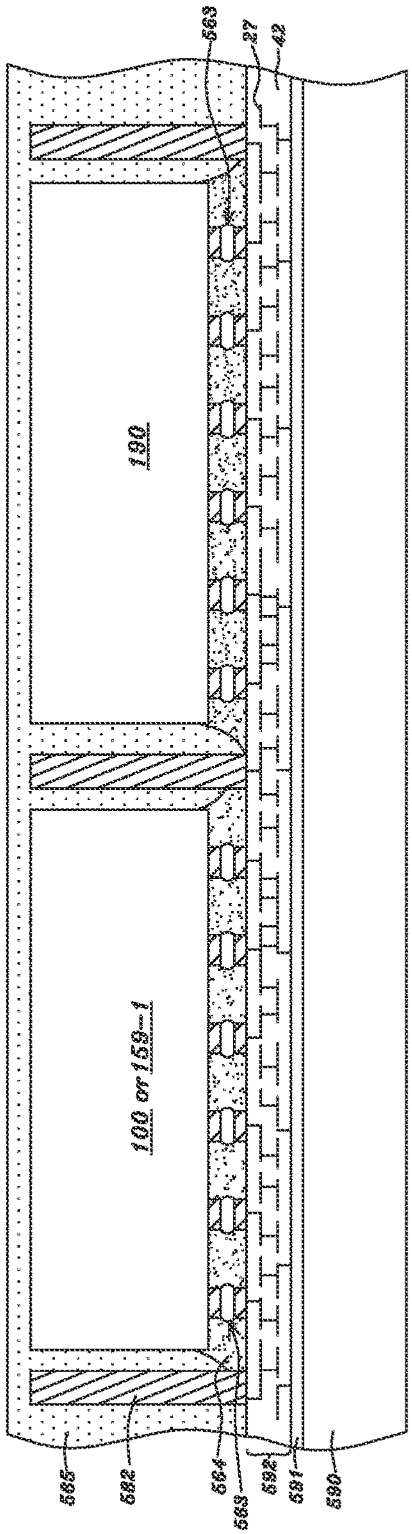

FIGS. 25A-25F are cross-sectional views showing a process for fabricating a fourth type of fanout-interconnection-technology (FOIT) chip package in accordance with an embodiment of the present application. A fourth type of fanout-interconnection-technology (FOIT) chip package may be provided to form the first, second, third or fourth type of standard commodity logic drive 300 as illustrated in FIG. 10A, 10B, 10C or 10D. Referring to FIGS. 25A and 25B, the second type of interconnection carrier 589 as illustrated in FIG. 23A may be first provided. Next, one or more first and/or second types of semiconductor chips 100 as illustrated in FIGS. 14A and 14B may be provided to be flipped, each having the micro-bumps or micro-pillars 34 to be bonded to the micro-bumps or micro-pillars 34 of the second type of interconnection carrier 589 and having the backside at a top thereof facing upwards. Each of the first and/or second types of semiconductor chips 100 may be the DPIIC chip 410, IAC chip 402, dedicated control and input/output (I/O) chip 265, NVM IC chip 250, first HBM IC chip 251-1, PCIC chip 269, GPU chip 269*a* or CPU chip 269*b* for the first, second, third or fourth type of standard commodity logic drive 300 as illustrated in FIG. 10A-10D. One or more first type of first memory modules 159-1 as seen in FIG. 15A (only one is shown) may be provided, each having the micro-bumps or micro-pillars 34 to be bonded to the micro-bumps or micro-pillars 34 of the second type of interconnection carrier 589, wherein the topmost one of the HBM IC chips 251-3 of said each of the first type of first memory modules 159-1 may have the backside at a top thereof facing upwards. One or more first and/or second types of operation modules 190 as illustrated in FIG. 18E or 20E and/or FIG. 18F or 20F (only one is shown) may be provided to be flipped, each having the metal bumps or pillars 492 to be bonded to the micro-bumps or micro-pillars 34 of the second type of interconnection carrier 589, wherein the standard commodity FPGA IC chip 200 of said each of the first and/or second types of operation modules 190 may be flipped to become to have the backside at a top thereof facing upwards.

Figure 26B:
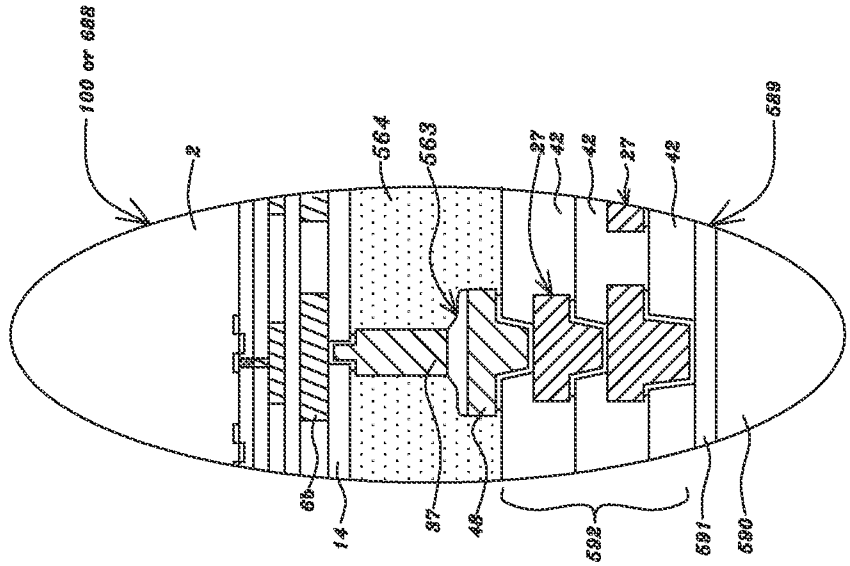
FIGS. 26A and 26B are schematically cross-sectional views showing a process of bonding a thermal compression bump to a thermal compression pad in accordance with an embodiment of the present application.
Figure 26A:
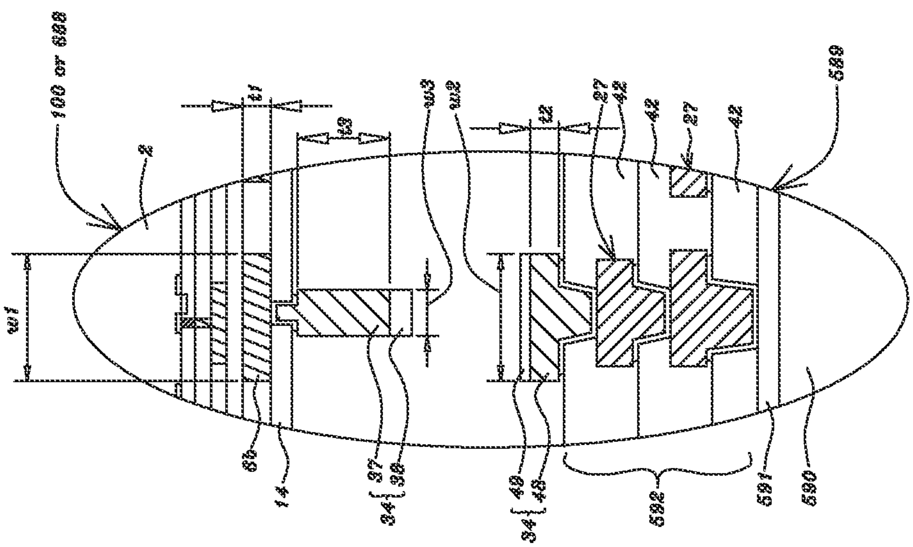
Figure 26D:
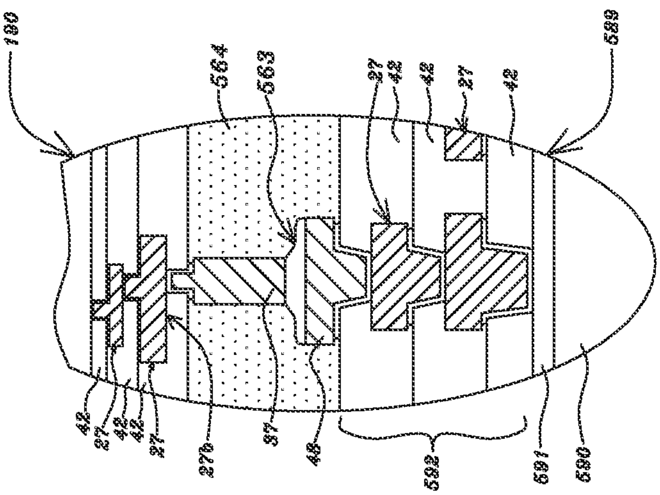
FIGS. 26C and 26D are schematically cross-sectional views showing a process of bonding a thermal compression bump to a thermal compression pad in accordance with an embodiment of the present application.
Figure 26C:
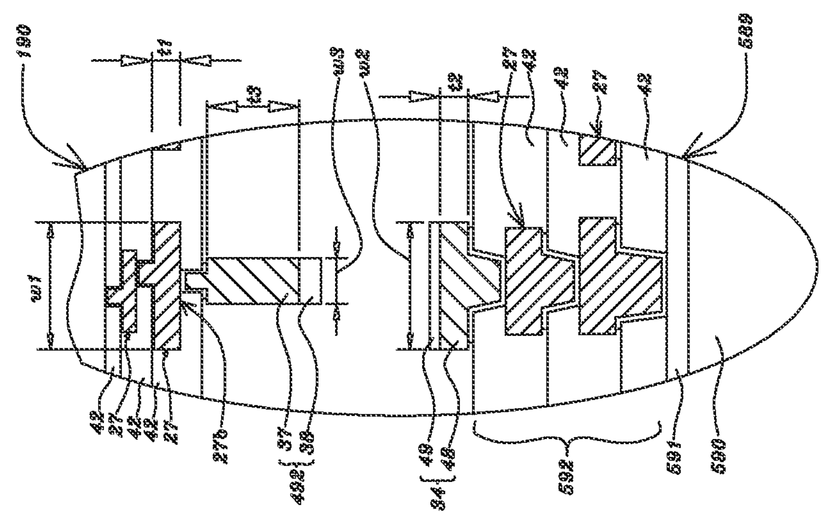

FIGS. 26A and 26B are schematically cross-sectional views showing a process of bonding a thermal compression bump to a thermal compression pad in accordance with an embodiment of the present application. For a first case, referring to FIGS. 25A, 25B, 26A and 26B, each of the first and/or second types of semiconductor chips 100 and the first type of first memory modules 159-1 may have the third type of micro-bumps or micro-pillars 34 to be bonded to the fourth type of micro-bumps or micro-pillars 34 of the second type of interconnection carrier 589. For example, the third type of micro-bumps or micro-pillars 34 of said each of the first and/or second types of semiconductor chips 100 and the first type of first memory modules 159-1 may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pillars 34 of the second type of interconnection carrier 589 into multiple bonded contacts 563 between said each of the first and/or second types of semiconductor chips 100 and the first type of first memory modules 159-1 and the second type of interconnection carrier 589. Each of the third type of micro-bumps or micro-pillars 34 of said each of the first and/or second types of semiconductor chips 100 and the first type of first memory modules 159-1 may have the copper layer 37 having the thickness t3 greater than the thickness t2 of the copper layer 48 of each of the fourth type of micro-bumps or micro-pillars 34 of the second type of interconnection carrier 589 and having the largest transverse dimension w3 equal to between 0.7 and 0.1 times of the largest transverse dimension w2 of the copper layer 48 of each of the fourth type of micro-bumps or micro-pillars 34 of the second type of interconnection carrier 589. Alternatively, each of the third type of micro-pillars or micro-bumps 34 of said each of the first and/or second types of semiconductor chips 100 and the first type of first memory modules 159-1 may be provided with the copper layer 37 having a cross-sectional area equal to between 0.5 and 0.01 times of the cross-sectional area of the copper layer 48 of each of the fourth type of micro-bumps or micro-pillars 34 of the second type of interconnection carrier 589.

For example, referring to FIGS. 25A, 25B, 26A and 26B, for each of the first and/or second types of semiconductor chips 100 to be bonded to the second type of interconnection carrier 589, its third type of micro-bumps or micro-pillars 34 may be formed respectively on a front surface of its metal pads 6*b* provided by the frontmost one of the interconnection metal layers 27 of its second interconnection scheme for a chip (SISC) 29 or by, if the second interconnection scheme for a chip (SISC) 29 is not provided, the frontmost one of the interconnection metal layers 6 of its first interconnection scheme for a chip (FISC) 20, wherein each of its third type of micro-bumps or micro-pillars 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pillars 34 may be provided with the copper layer 37 having a cross-sectional area equal to between 0.5 and 0.01 times of the cross-sectional area of its metal pads 6*b*; each of its metal pads 6*b* may have a thickness t1 between 1 and 10 micrometers or between 2 and 10 micrometers and a largest transverse dimension w1, such as diameter in a circular shape, between 1 μm and 15 μm, such as 5 μm.

Referring to FIGS. 25A, 25B, 26A and 26B, for the first type of first memory modules 159-1 to be bonded to the second type of interconnection carrier 589, its third type of micro-bumps or micro-pillars 34 may be formed respectively on a front surface of the metal pads 6*b* provided by the frontmost one of the interconnection metal layers 27 of the second interconnection scheme for a chip (SISC) 29 of its control chip 688 or by, if the second interconnection scheme for a chip (SISC) 29 is not provided for its control chip 688, the frontmost one of the interconnection metal layers 6 of the first interconnection scheme for a chip (FISC) 20 of its control chip 688, wherein each of its third type of micro-bumps or micro-pillars 34 may be provided with the copper layer 37 having the thickness t3 greater than the thickness t1 of each of the metal pads 6*b* of its control chip 688 and having the largest transverse dimension w3 equal to between 0.7 and 0.1 times of the largest transverse dimension w1 of each of the metal pads 6*b* of its control chip 688; alternatively, each of its third type of micro-bumps or micro-pillars 34 may be provided with the copper layer 37 having a cross-sectional area equal to between 0.5 and 0.01 times of the cross-sectional area of each of the metal pads 6*b* of its control chip 688; each of the metal pads 6*b* of its control chip 688 may have a thickness t1 between 1 and 10 micrometers or between 2 and 10 micrometers and a largest transverse dimension w1, such as diameter in a circular shape, between 1 μm and 15 μm, such as 5 μm.

Referring to 25A, 25B, 26A and 26B, a bonded solder between the copper layers 37 and 48 of each of the bonded contacts 563 may be mostly kept on a top surface of the copper layer 48 of one of the fourth type of micro-bumps or micro-pillars 34 of the second type of interconnection carrier 589 and extends out of the edge of the copper layer 48 of said one of the fourth type of micro-bumps or micro-pillars 34 of the second type of interconnection carrier 589 less than 0.5 micrometers. Thus, a short between neighboring two of the bonded contacts 563 even in a fine-pitched fashion may be avoided.

Alternatively, for a second case, referring to FIGS. 25A, 25B, 26A and 26B, each of the first and/or second types of semiconductor chips 100 and the first type of first memory modules 159-1 may have the second type of micro-bumps or micro-pillars 34 to be bonded to the first type of micro-bumps or micro-pillars 34 of the second type of interconnection carrier 589. For example, the second type of micro-bumps or micro-pillars 34 of said each of the first and/or second types of semiconductor chips 100 and the first type of first memory modules 159-1 may have the solder caps 33 to be bonded onto the electroplated copper layer 32 of the first type of micro-bumps or micro-pillars 34 of the second type of interconnection carrier 589 into multiple bonded contacts 563 between said each of the first and/or second types of semiconductor chips 100 and the first type of first memory modules 159-1 and the second type of interconnection carrier 589. Each of the second type of micro-bumps or micro-pillars 34 of said each of the first and/or second types of semiconductor chips 100 and the first type of first memory modules 159-1 may have the electroplated copper layer 32 having a thickness greater than that of the electroplated copper layer 32 of each of the first type of micro-bumps or micro-pillars 34 of the second type of interconnection carrier 589.

Alternatively, for a third case, referring to FIGS. 25A, 25B, 26A and 26B, each of the first and/or second types of semiconductor chips 100 and the first type of first memory modules 159-1 may have the first type of micro-bumps or micro-pillars 34 to be bonded to the second type of metal bumps or pillars 34 of the second type of interconnection carrier 589. For example, the first type of micro-bumps or micro-pillars 34 of said each of the first and/or second types of semiconductor chips 100 and the first type of first memory modules 159-1 may have the electroplated metal layer 32, e.g. copper layer, to be bonded onto the solder caps 33 of the second type of micro-bumps or micro-pillars 34 of the second type of interconnection carrier 589 into multiple bonded contacts 563 between said each of the first and/or second types of semiconductor chips 100 and the first type of first memory modules 159-1 and the second type of interconnection carrier 589. Each of the first type of micro-bumps or micro-pillars 34 of said each of the first and/or second types of semiconductor chips 100 and the first type of first memory modules 159-1 may have the electroplated copper layer 32 having a thickness greater than that of the electroplated copper layer 32 of each of the second type of micro-bumps or micro-pillars 34 of the second type of interconnection carrier 589.

Alternatively, for a fourth case, referring to FIGS. 25A, 25B, 26A and 26B, each of the first and/or second types of semiconductor chips 100 and the first type of first memory modules 159-1 may have the second type of micro-bumps or micro-pillars 34 to be bonded to the second type of micro-bumps or micro-pillars 34 of the second type of interconnection carrier 589. For example, the second type of micro-bumps or micro-pillars 34 of said each of the first and/or second types of semiconductor chips 100 and the first type of first memory modules 159-1 may have the solder caps 33 to be bonded onto the solder caps 33 of the second type of micro bumps or micro-pillars 34 of the second type of interconnection carrier 589 into multiple bonded contacts 563 between said each of the first and/or second types of semiconductor chips 100 and the first type of first memory modules 159-1 and the second type of interconnection carrier 589. Each of the second type of micro-bumps or micro-pillars 34 of said each of the first and/or second types of semiconductor chips 100 and the first type of first memory modules 159-1 may have the electroplated copper layer 32 having a thickness greater than that of the electroplated copper layer 32 of each of the second type of micro-bumps or micro-pillars 34 of the second type of interconnection carrier 589.

FIGS. 26C and 26D are schematically cross-sectional views showing a process of bonding a thermal compression bump to a thermal compression pad in accordance with an embodiment of the present application. For a first case, referring to FIGS. 25A, 25B, 26C and 26D, each of the first and/or second types of operation modules 190 may have the third type of metal bumps or pillars 492 to be bonded to the fourth type of micro-bumps or micro-pillars 34 of the second type of interconnection carrier 589. For example, the third type of metal bumps or pillars 492 of said each of the first and/or second types of operation modules 190 may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pillars 34 of the second type of interconnection carrier 589 into multiple bonded contacts 563 between said each of the first and/or second types of operation modules 190 and the second type of interconnection carrier 589. Each of the third type of metal bumps or pillars 492 of said each of the first and/or second types of operation modules 190 may have the copper layer 37 having the thickness t3 greater than the thickness t2 of the copper layer 48 of each of the fourth type of micro-bumps or micro-pillars 34 of the second type of interconnection carrier 589 and having the largest transverse dimension w3 equal to between 0.7 and 0.1 times of the largest transverse dimension w2 of the copper layer 48 of each of the fourth type of micro-bumps or micro-pillars 34 of the second type of interconnection carrier 589. Alternatively, each of the third type of metal bumps or pillars 492 of said each of the first and/or second types of operation modules 190 may be provided with the copper layer 37 having a cross-sectional area equal to between 0.5 and 0.01 times of the cross-sectional area of the copper layer 48 of each of the fourth type of micro-bumps or micro-pillars 34 of the second type of interconnection carrier 589.

Referring to 25A, 25B, 26C and 26D, a bonded solder between the copper layers 37 and 48 of each of the bonded contacts 563 may be mostly kept on a top surface of the copper layer 48 of one of the fourth type of micro-bumps or micro-pillars 34 of the second type of interconnection carrier 589 and extends out of the edge of the copper layer 48 of said one of the fourth type of micro-bumps or micro-pillars 34 of the second type of interconnection carrier 589 less than 0.5 micrometers. Thus, a short between neighboring two of the bonded contacts 563 even in a fine-pitched fashion may be avoided.

Alternatively, for a second case, referring to FIGS. 25A, 25B, 26C and 26D, each of the first and/or second types of operation modules 190 may have the second type of metal bumps or pillars 492 to be bonded to the first type of micro-bumps or micro-pillars 34 of the second type of interconnection carrier 589. For example, the second type of metal bumps or pillars 492 of said each of the first and/or second types of operation modules 190 may have the solder caps 33 to be bonded onto the electroplated copper layer 32 of the first type of micro-bumps or micro-pillars 34 of the second type of interconnection carrier 589 into multiple bonded contacts 563 between said each of the first and/or second types of operation modules 190 and the second type of interconnection carrier 589. Each of the second type of metal bumps or pillars 492 of said each of the first and/or second types of operation modules 190 may have the electroplated copper layer 32 having a thickness greater than that of the electroplated copper layer 32 of each of the first type of micro-bumps or micro-pillars 34 of the second type of interconnection carrier 589.

Alternatively, for a third case, referring to FIGS. 25A, 25B, 26C and 26D, each of the first and/or second types of operation modules 190 may have the first type of metal bumps or pillars 492 to be bonded to the second type of metal bumps or pillars 34 of the second type of interconnection carrier 589. For example, the first type of metal bumps or pillars 492 of said each of the first and/or second types of operation modules 190 may have the electroplated metal layer 32, e.g. copper layer, to be bonded onto the solder caps 33 of the second type of micro-bumps or micro-pillars 34 of the second type of interconnection carrier 589 into multiple bonded contacts 563 between said each of the first and/or second types of operation modules 190 and the second type of interconnection carrier 589. Each of the first type of metal bumps or pillars 492 of said each of the first and/or second types of operation modules 190 may have the electroplated copper layer 32 having a thickness greater than that of the electroplated copper layer 32 of each of the second type of micro-bumps or micro-pillars 34 of the second type of interconnection carrier 589.

Alternatively, for a fourth case, referring to FIGS. 25A, 25B, 26C and 26D, each of the first and/or second types of operation modules 190 may have the second type of metal bumps or pillars 492 to be bonded to the second type of micro-bumps or micro-pillars 34 of the second type of interconnection carrier 589. For example, the second type of metal bumps or pillars 492 of said each of the first and/or second types of operation modules 190 may have the solder caps 33 to be bonded onto the solder caps 33 of the second type of micro-bumps or micro-pillars 34 of the second type of interconnection carrier 589 into multiple bonded contacts 563 between said each of the first and/or second types of operation modules 190 and the second type of interconnection carrier 589. Each of the second type of metal bumps or pillars 492 of said each of the first and/or second types of operation modules 190 may have the electroplated copper layer 32 having a thickness greater than that of the electroplated copper layer 32 of each of the second type of micro-bumps or micro-pillars 34 of the second type of interconnection carrier 589.

Next, referring to FIG. 25B, an underfill 564, such as epoxy resins or compounds, may be filled into a gap between each of the first and/or second types of semiconductor chips 100, the first type of first memory modules 159-1 and the first and/or second types of operation modules 190 and the fan-out interconnection scheme for a logic drive (FOISD) 592 of the second type of interconnection carrier 589 to enclose the bonded contacts 563 therebetween. The underfill 564 may be cured at temperature equal to or above 100, 120 or 150 degrees Celsius.

Next, referring to FIG. 25B, a polymer layer 565, e.g., resin or compound, may be applied by methods, for example, spin-on coating, screen-printing, dispensing or molding to fill the gaps each between neighboring two of the first and/or second types of semiconductor chips 100, the first type of first memory module 159-1 and the first and/or second types of operation modules 190 and the gaps each between neighboring two of the through package vias (TPVs) 582 and to cover over each of the first and/or second types of semiconductor chips 100, the first type of first memory module 159-1 and the first and/or second types of operation modules 190 and each of the through package vias (TPVs) 582.

Figure 25C:
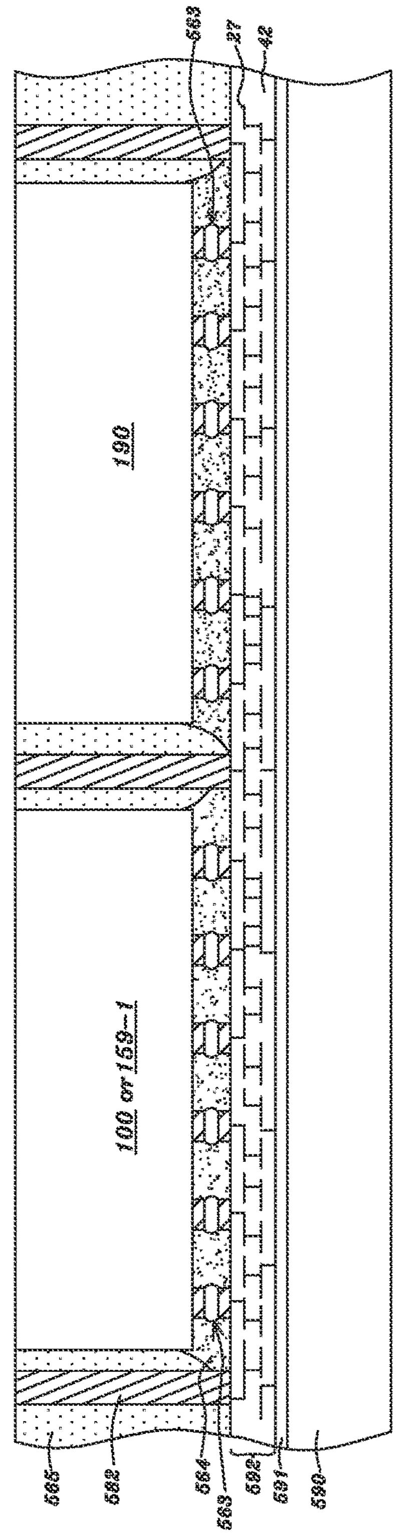

Next, referring to FIG. 25C, a chemical mechanical polishing (CMP), polishing or grinding process may be applied to remove a top portion of the polymer layer 565 to expose the backside of each of the first and/or second types of semiconductor chips 100, the backside of the topmost one of the HBM IC chips 251-3 of each of the first type of first memory modules 159-1, the backside of the standard commodity FPGA IC chip 200 of each of the first and/or second types of operation modules 190 and a top surface of the copper layer 581 of each of the through package vias (TPVs) 582 and to planarize a top surface of the polymer layer 565, the backside of each of the first and/or second types of semiconductor chips 100, the backside of the topmost one of the HBM IC chips 251-3 of each of the first type of first memory modules 159-1, the backside of the standard commodity FPGA IC chip 200 of each of the first and/or second types of operation modules 190 and the top surface of the copper layer 581 of each of the through package vias (TPVs) 582.

Figure 25D:
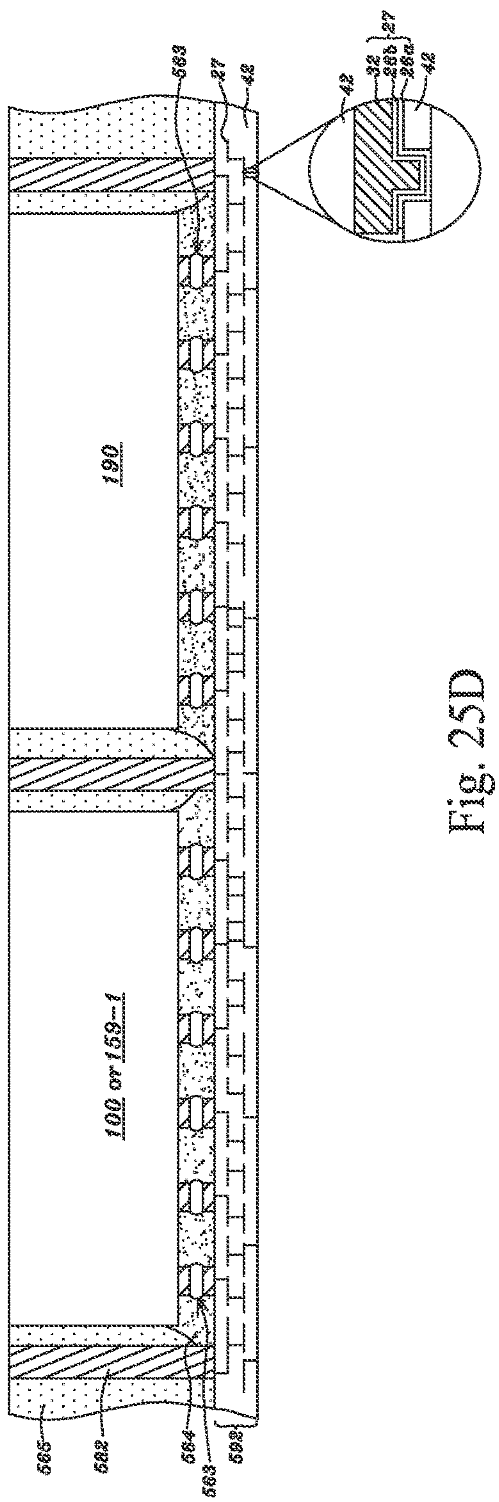

Next, referring to FIG. 25D, the temporary substrate (T-sub) 590 may be released from the sacrificial bonding layer 591, which may be referred to FIG. 21E. Next, an adhesive peeling tape (not shown) may be attached to a bottom of the sacrificial bonding layer 591. Next, the sacrificial bonding layer 591 may be released or peeled from the bottom surface of the bottommost one of the polymer layers 42 of the fan-out interconnection scheme for a logic drive (FOISD) 592 and the bottom surface of each of the metal vias of the bottommost one of the interconnection metal layers 27 of the fan-out interconnection scheme for a logic drive (FOISD) 592 to expose the bottom surface of the bottommost one of the polymer layers 42 of the fan-out interconnection scheme for a logic drive (FOISD) 592 and the bottom surface of each of the metal vias of the bottommost one of the interconnection metal layers 27 of the fan-out interconnection scheme for a logic drive (FOISD) 592. Alternatively, the temporary substrate (T-sub) 590 and sacrificial bonding layer 591 may be removed by a grinding or polishing process to expose the bottom surface of the bottommost one of the polymer layers 42 of the fan-out interconnection scheme for a logic drive (FOISD) 592 and the bottom surface of each of the metal vias of the bottommost one of the interconnection metal layers 27 of the fan-out interconnection scheme for a logic drive (FOISD) 592.

Figure 25E:
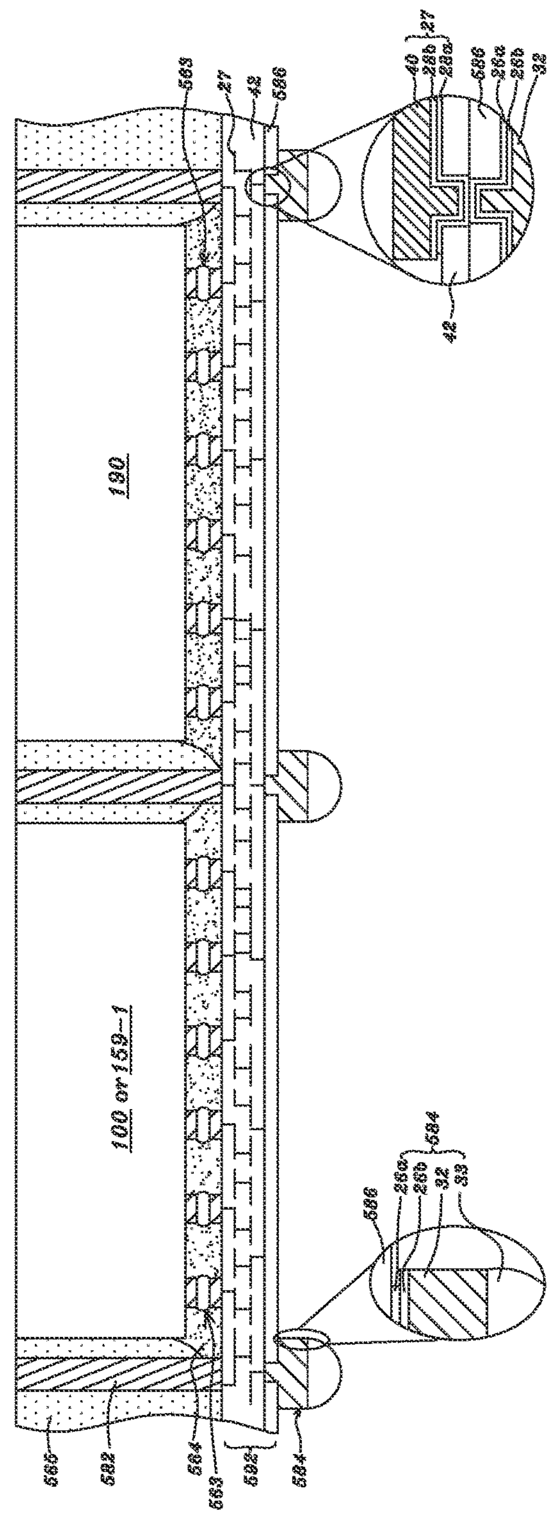

Next, referring to FIG. 25E, the polymer layer 586 may be formed on the bottom surface of the bottommost one of the polymer layers 42 of the fan-out interconnection scheme for a logic drive (FOISD) 592 and may be defined as a portion of the fan-out interconnection scheme for a logic drive (FOISD) 592. The specification and process for the polymer layer 586 herein may be referred to those as illustrated in FIG. 23F. Next, multiple metal bumps or pillars 584 may be formed on the bottom surface of each of the metal vias of the bottommost one of the interconnection metal layers 27 of the fan-out interconnection scheme for a logic drive (FOISD) 592. Each of the metal bumps or pillars 584 may include (1) an adhesion layer 26*a*, such as titanium (Ti) or titanium nitride (TiN) layer having a thickness of between 1 nm and 50 nm, on and under the bottom surface of one of the metal vias of the bottommost one of the interconnection metal layers 27 of the fan-out interconnection scheme for a logic drive (FOISD) 592, (2) a seed layer 26*b*, such as copper, on and under its adhesion layer 26*a*, (3) a copper layer 32 having a thickness of between 1 μm and 60 μm on and under its seed layer 26*b*, and (4) a tin-containing solder cap 33 made of tin or a tin-silver alloy, which has a thickness of between 1 μm and 50 μm on and under its copper layer 32.

Figure 25F:
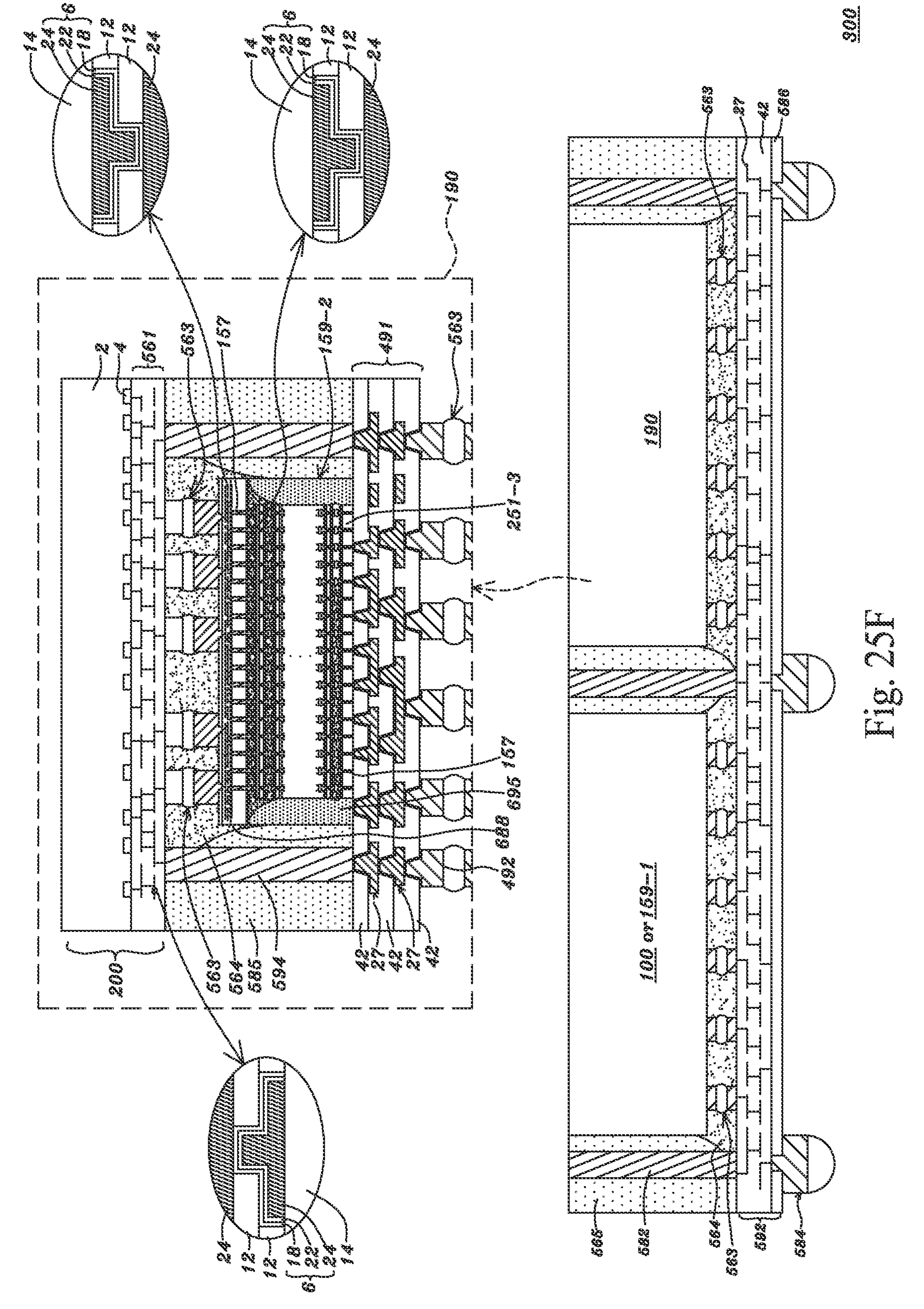

Next, the polymer layer 565 and the polymer layers 42 and 586 of the fan-out interconnection scheme for a logic drive (FOISD) 592 may be cut or diced to separate multiple individual fourth type of fanout-interconnection-technology (FOIT) chip packages 300 as seen in FIG. 25F by a laser cutting process or by a mechanical cutting process. For the fourth type of fanout-interconnection-technology (FOIT) chip packages 300, each of its through package vias (TPV) may couple to the voltage of power supply (Vcc) for power delivery, the voltage of ground reference (Vss) for ground delivery or a signal source for signal transmission. For the fourth type of fanout-interconnection-technology (FOIT) chip package 300, each of its through package vias (TPVs) 582 may have a height taller than each of its bonded contacts 563 between each of its first and/or second types of semiconductor chips 100, its first type of first memory modules 159-1 and its first and/or second types of operation modules 190 and its fan-out interconnection scheme for a logic drive (FOISD) 592 by greater than 20 micrometers or 50 micrometers.

Figure 25G:
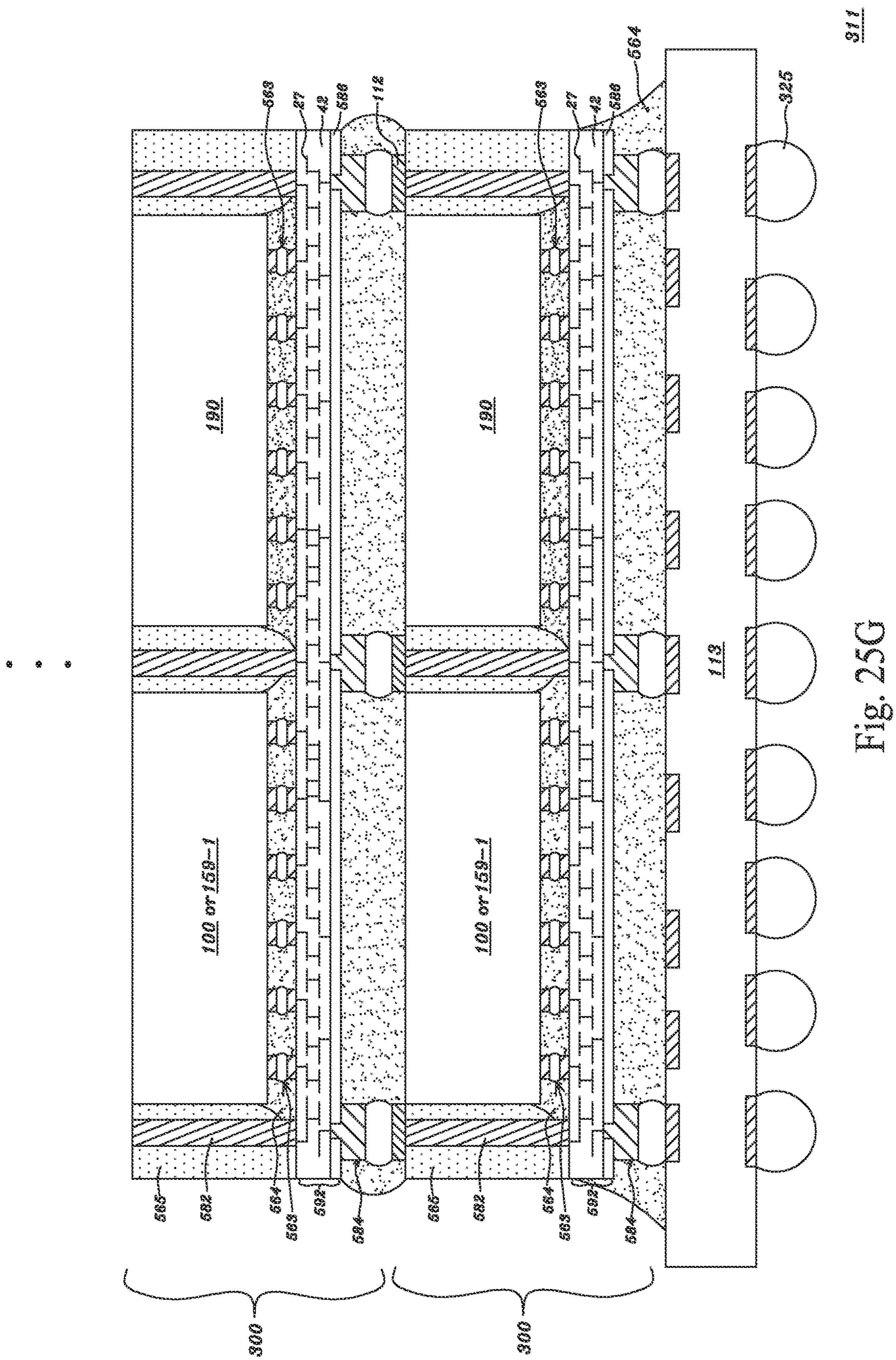
FIG. 25G is a cross-sectional view showing a fourth type of package-on-package (POP) assembly for a fourth type of fanout-interconnection-technology (FOIT) chip packages in accordance with an embodiment of the present application.

FIG. 25G is a cross-sectional view showing a fourth type of package-on-package (POP) assembly for a fourth type of fanout-interconnection-technology (FOIT) chip packages in accordance with an embodiment of the present application. Referring to FIG. 25F, multiple fourth type of fanout-interconnection-technology (FOIT) chip packages 300 as illustrated in FIG. 25E may be provided to be stacked together to form a fourth type of package-on-package (POP) assembly 311.

For forming the fourth type of package-on-package (POP) assembly 311 as seen in FIG. 25F, a circuit carrier substrate may be first provided. Next, the bottommost one of the fourth type of fanout-interconnection-technology (FOIT) chip packages 300 may have the metal bumps or pillars 584 to be bonded to the circuit carrier substrate. Next, an underfill 564 may be filled into a gap between the bottommost one of the fourth type of fanout-interconnection-technology (FOIT) chip packages 300 and the circuit carrier substrate to enclose the metal bumps or pillars 584 of the bottommost one of the fourth type of fanout-interconnection-technology (FOIT) chip packages 300.

Next, referring to FIG. 25G, in a first step, a tin-containing solder 112 may be formed on the top surface of the copper layer 581 of each of some or all of the through package vias (TPVs) 582 of the lower one of the fourth type of fanout-interconnection-technology (FOIT) chip packages 300. Next, in a second step, an upper one of the fourth type of fanout-interconnection-technology (FOIT) chip packages 300 may have the metal bumps or pillars 584 to be bonded to the tin-containing solder 112. Next, in a third step, the tin-containing solder 112 may be reflowed to bond each of the metal bumps or pillars 584 of the upper one of the fourth type of fanout-interconnection-technology (FOIT) chip packages 300 to one of the copper layer 581 of one of the through package vias (TPVs) 582 of the lower one of the fourth type of fanout-interconnection-technology (FOIT) chip packages 300. Next, in a fourth step, an underfill 564 may be filled into a gap between the upper and lower ones of the fourth type of fanout-interconnection-technology (FOIT) chip packages 300 to enclose the metal bumps or pillars 583 of the upper one of the fourth type of fanout-interconnection-technology (FOIT) chip packages 300.

Next, referring to FIG. 25G, the above first through fourth steps may be sequentially repeated multiple times to stack, one by one, multiple of the fourth type of fanout-interconnection-technology (FOIT) chip packages 300 having the number greater than or equal to two, such as four or eight. For a case, all of the fourth type of fanout-interconnection-technology (FOIT) chip packages stacked as seen in FIG. 25G may be the same.

Next, referring to FIG. 25G, multiple solder balls 325 may be planted on a bottom surface of the circuit carrier substrate. Next, the circuit carrier structure may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process.

Fifth Type of Fanout-Interconnection-Technology (FOIT) Chip Package

Figure 27A:
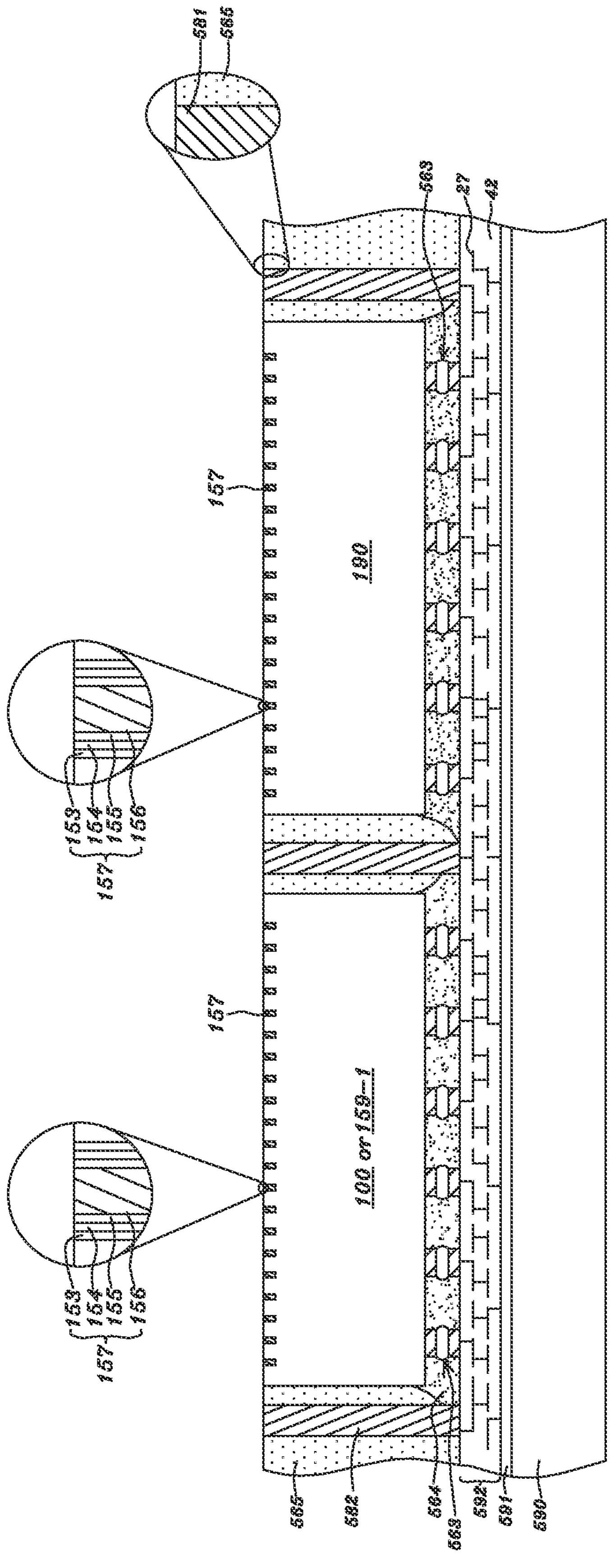
FIGS. 27A and 27B are cross-sectional views showing a process for fabricating a fifth type of fanout-interconnection-technology (FOIT) chip package in accordance with an embodiment of the present application.
Figure 27B:
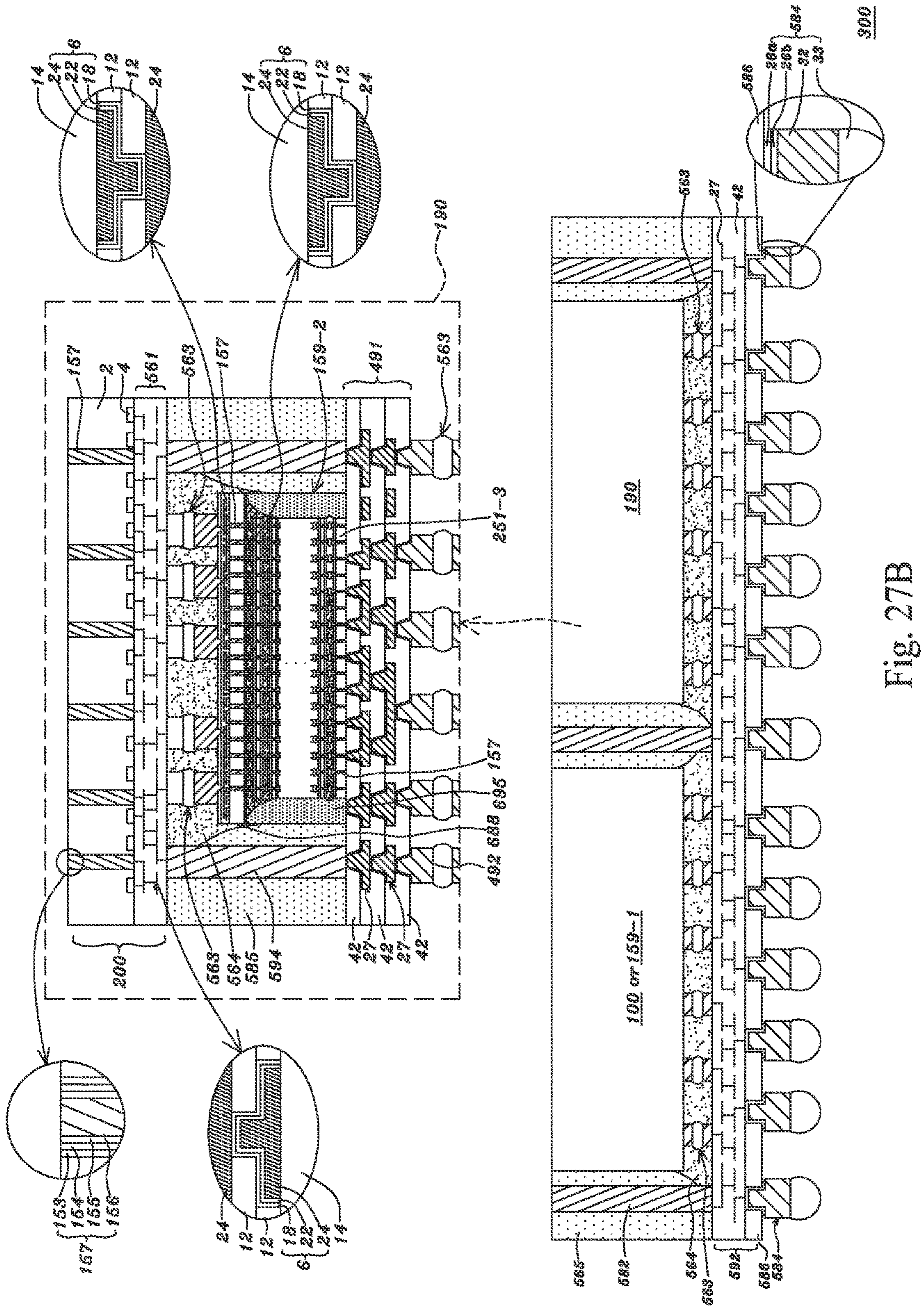

FIGS. 27A and 27B are cross-sectional views showing a process for fabricating a fifth type of fanout-interconnection-technology (FOIT) chip package in accordance with an embodiment of the present application. A fifth type of fanout-interconnection-technology (FOIT) chip package may be provided to form the first, second, third or fourth type of standard commodity logic drive 300 as illustrated in FIG. 10A, 10B, 10C or 10D. The specification and process for fabricating the fifth type of fanout-interconnection-technology (FOIT) chip package is similar to those for fabricating the fourth type of fanout-interconnection-technology (FOIT) chip package 300 as illustrated in FIGS. 25A-25F. The difference therebetween is mentioned as below: Referring to FIG. 27A, the chemical mechanical polishing (CMP), polishing or grinding process as illustrated in FIG. 25C may be performed further to expose a backside of the electroplated copper layer 156 of each of the through silicon vias (TSV) 157 of each of the second type of semiconductor chips 100, a backside of the electroplated copper layer 156 of each of the through silicon vias (TSV) 157 of the standard commodity FPGA IC chip 200, which may be fabricated from the first or second type of semiconductor wafer 100*b* or 100*c* as illustrated in FIG. 17B or 17D, of each of the first and/or second types of operation modules 190, and a backside of the electroplated copper layer 156 of each of the through silicon vias (TSV) 157 of the topmost one of the HBM IC chips 251-3 of each of the first type of first memory modules 159-1. The backside of the electroplated copper layer 156 of each of the through silicon vias (TSV) 157 of each of the second type of semiconductor chips 100 may be coplanar to the backside of the semiconductor substrate 2 of said each of the second type of semiconductor chips 100, the top surface of the polymer layer 565 and the top surface of the copper layer 581 of each of the through package vias (TPV) 582. The backside of the electroplated copper layer 156 of each of the through silicon vias (TSV) 157 of the standard commodity FPGA IC chip 200 of each of the first and/or second types of operation modules 190 may be coplanar to the backside of the semiconductor substrate 2 of the standard commodity FPGA IC chip 200 of said each of the first and/or second types of operation modules 190, the top surface of the polymer layer 565 and the top surface of the copper layer 581 of each of the through package vias (TPV) 582. The backside of the electroplated copper layer 156 of each of the through silicon vias (TSV) 157 of the topmost one of the HBM IC chips 251-3 of each of the first type of first memory modules 159-1 may be coplanar to the backside of the semiconductor substrate 2 of the topmost one of the HBM IC chips 251-3 of said each of the first type of first memory modules 159-1, the top surface of the polymer layer 565 and the top surface of the copper layer 581 of each of the through package vias (TPV) 582.

Next, the following processes may be performed as illustrated in FIGS. 25D-25F to form multiple individual fifth type of fanout-interconnection-technology (FOIT) chip packages 300 as seen in FIG. 27B. For the fifth type of fanout-interconnection-technology (FOIT) chip packages 300, each of its through package vias (TPV) may couple to the voltage of power supply (Vcc) for power delivery, the voltage of ground reference (Vss) for ground delivery or a signal source for signal transmission. For the fifth type of fanout-interconnection-technology (FOIT) chip package 300, each of its through package vias (TPVs) 582 may have a height taller than each of its bonded contacts 563 between each of its first and/or second types of semiconductor chips 100, its first type of first memory modules 159-1 and its first and/or second types of operation modules 190 and its fan-out interconnection scheme for a logic drive (FOISD) 592 by greater than 20 micrometers or 50 micrometers.

Figure 27C:
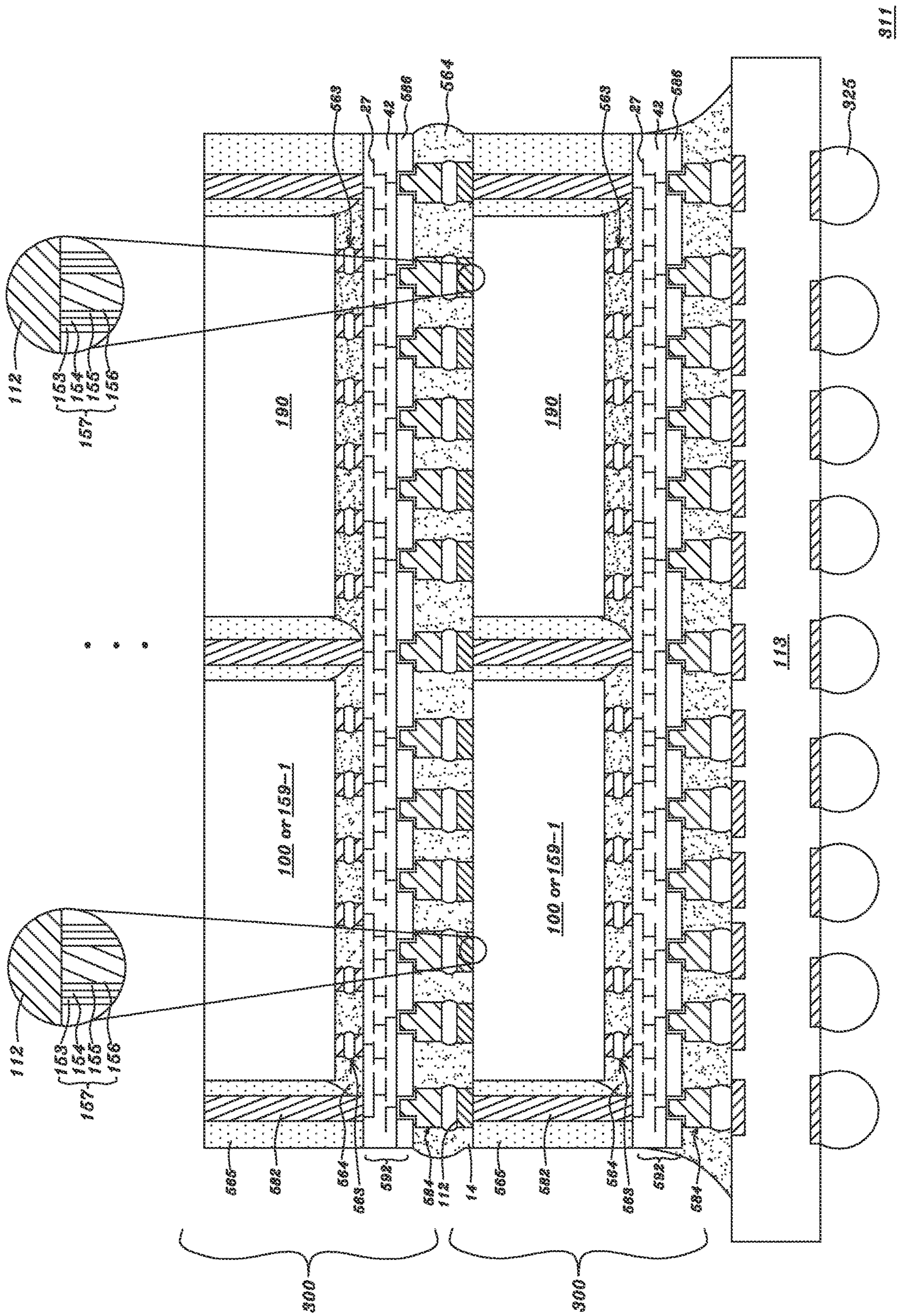
FIG. 27C is a cross-sectional view showing a fifth type of package-on-package (POP) assembly for a fifth type of fanout-interconnection-technology (FOIT) chip packages in accordance with an embodiment of the present application.

FIG. 27C is a cross-sectional view showing a fifth type of package-on-package (POP) assembly for a fifth type of fanout-interconnection-technology (FOIT) chip packages in accordance with an embodiment of the present application. Referring to FIG. 27C, multiple fifth type of fanout-interconnection-technology (FOIT) chip packages 300 as illustrated in FIG. 27B may be provided to be stacked together to form a fifth type of package-on-package (POP) assembly 311.

For forming the fifth type of package-on-package (POP) assembly 311 as seen in FIG. 27C, a circuit carrier substrate may be first provided. Next, the bottommost one of the fifth type of fanout-interconnection-technology (FOIT) chip packages 300 may have the metal bumps or pillars 584 to be bonded to the circuit carrier substrate. Next, an underfill 564 may be filled into a gap between the bottommost one of the fifth type of fanout-interconnection-technology (FOIT) chip packages 300 and the circuit carrier substrate to enclose the metal bumps or pillars 584 of the bottommost one of the fifth type of fanout-interconnection-technology (FOIT) chip packages 300.

Next, referring to FIG. 27C, in a first step, a tin-containing solder 112 may be formed on the backside of the electroplated copper layer 156 of each of the through silicon vias (TSV) 157 of each of the second type of semiconductor chips 100 of the lower one of the fifth type of fanout-interconnection-technology (FOIT) chip packages 300, the backside of the electroplated copper layer 156 of each of the through silicon vias (TSV) 157 of the standard commodity FPGA IC chip 200, which may be fabricated from the first or second type of semiconductor wafer 100*b* or 100*c* as illustrated in FIG. 17B or 17D, of each of the first and/or second types of operation modules 190 of the lower one of the fifth type of fanout-interconnection-technology (FOIT) chip packages 300, the backside of the electroplated copper layer 156 of each of the through silicon vias (TSV) 157 of the topmost one of the HBM IC chips 251-3 of each of the first type of first memory modules 159-1 of the lower one of the fifth type of fanout-interconnection-technology (FOIT) chip packages 300 and the top surface of the copper layer 581 of each of some or all of the through package vias (TPVs) 582 of the lower one of the fifth type of fanout-interconnection-technology (FOIT) chip packages 300. Next, in a second step, an upper one of the fifth type of fanout-interconnection-technology (FOIT) chip packages 300 may have the metal bumps or pillars 584 to be bonded to the tin-containing solder 112. Next, in a third step, the tin-containing solder 112 may be reflowed to bond each of the metal bumps or pillars 584 of the upper one of the fifth type of fanout-interconnection-technology (FOIT) chip packages 300 to the electroplated copper layer 156 of one of the through silicon vias (TSV) 157 of one of the second type of semiconductor chips 100 of the lower one of the fifth type of fanout-interconnection-technology (FOIT) chip packages 300, the electroplated copper layer 156 of one of the through silicon vias (TSV) 157 of the standard commodity FPGA IC chip 200, which may be fabricated from the first or second type of semiconductor wafer 100*b* or 100*c* as illustrated in FIG. 17B or 17D, of one of the first and/or second types of operation modules 190 of the lower one of the fifth type of fanout-interconnection-technology (FOIT) chip packages 300, the electroplated copper layer 156 of one of the through silicon vias (TSV) 157 of the topmost one of the HBM IC chips 251-3 of one of the first type of first memory modules 159-1 of the lower one of the fifth type of fanout-interconnection-technology (FOIT) chip packages 300, or the copper layer 581 of one of the through package vias (TPVs) 582 of the lower one of the fifth type of fanout-interconnection-technology (FOIT) chip packages 300. Next, in a fourth step, an underfill 564 may be filled into a gap between the upper and lower ones of the fifth type of fanout-interconnection-technology (FOIT) chip packages 300 to enclose the metal bumps or pillars 583 of the upper one of the fifth type of fanout-interconnection-technology (FOIT) chip packages 300.

Next, referring to FIG. 27C, the above first through fourth steps may be sequentially repeated multiple times to stack, one by one, multiple of the fifth type of fanout-interconnection-technology (FOIT) chip packages 300 having the number greater than or equal to two, such as four or eight. For a case, all of the fifth type of fanout-interconnection-technology (FOIT) chip packages stacked as seen in FIG. 27C may be the same.

Next, referring to FIG. 27C, multiple solder balls 325 may be planted on a bottom surface of the circuit carrier substrate. Next, the circuit carrier structure may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process.

Sixth Type of Fanout-Interconnection-Technology (FOIT) Chip Package

Figure 28A:
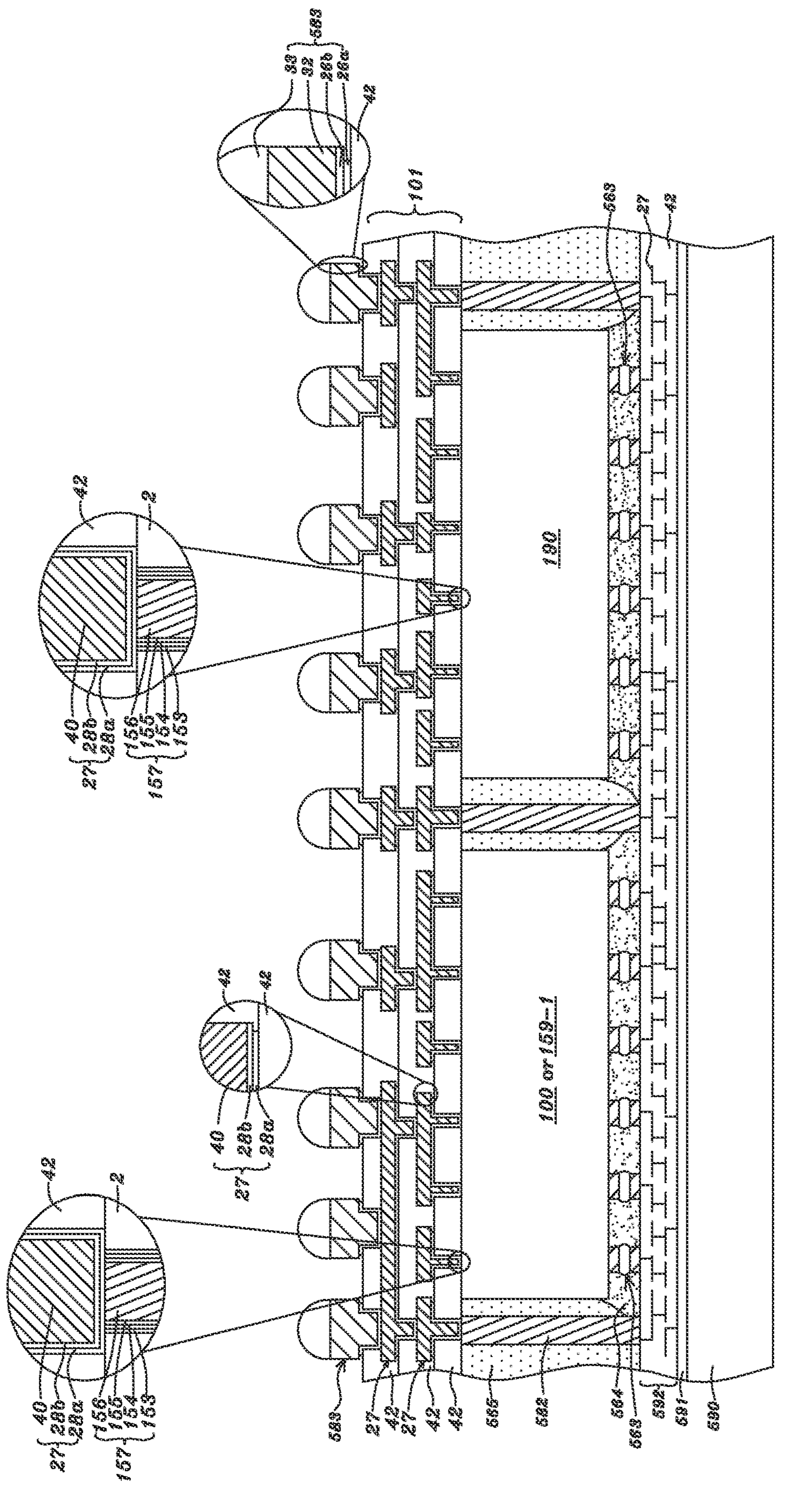
FIGS. 28A-28B are cross-sectional views showing a process for fabricating a sixth type of fanout-interconnection-technology (FOIT) chip package in accordance with an embodiment of the present application.
Figure 28B:
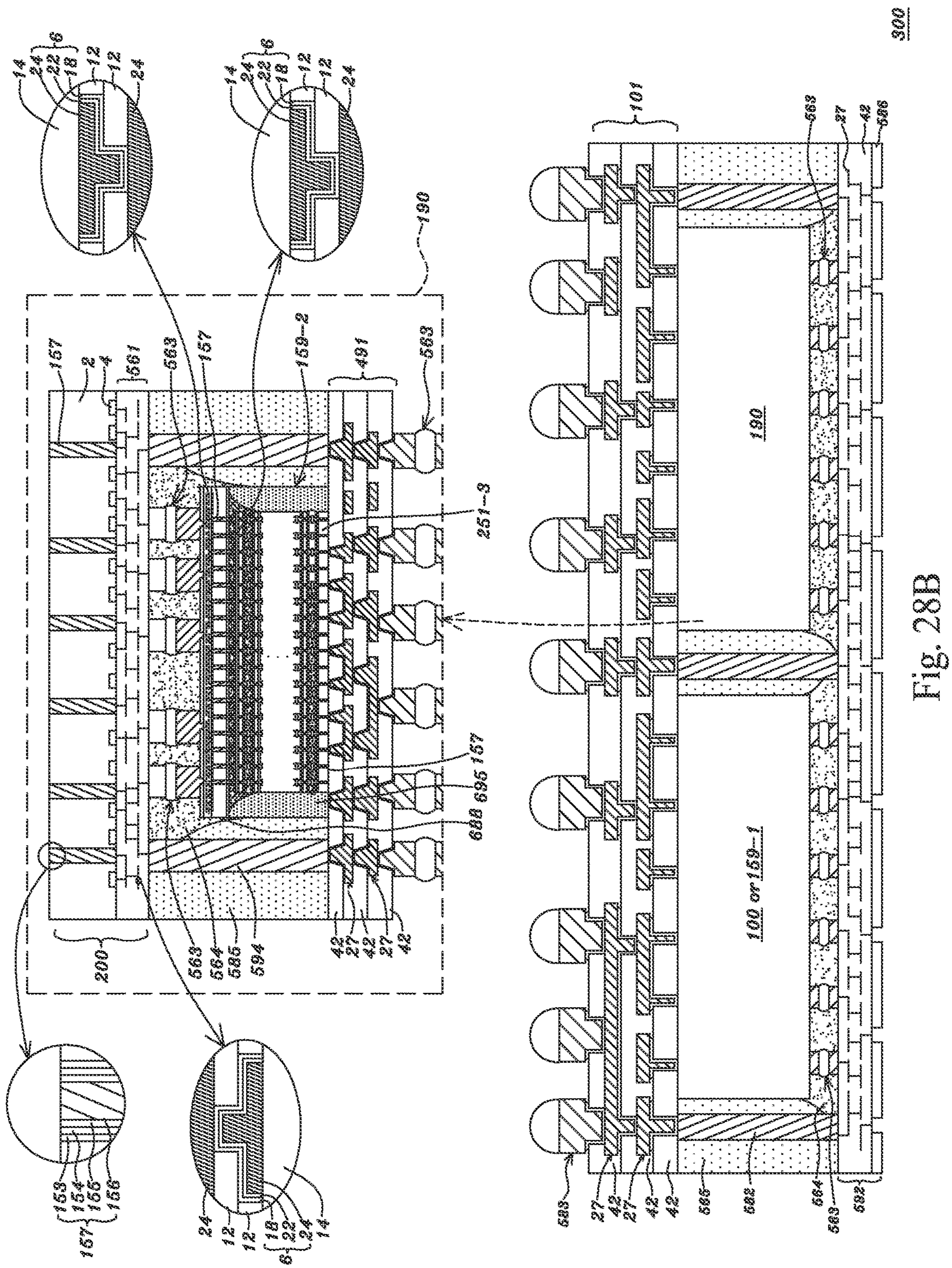

FIGS. 28A-28B are cross-sectional views showing a process for fabricating a sixth type of fanout-interconnection-technology (FOIT) chip package in accordance with an embodiment of the present application. A sixth type of fanout-interconnection-technology (FOIT) chip package may be provided to form the first, second, third or fourth type of standard commodity logic drive 300 as illustrated in FIG. 10A, 10B, 10C or 10D. The specification and process for fabricating the sixth type of fanout-interconnection-technology (FOIT) chip package is similar to those for fabricating the fifth type of fanout-interconnection-technology (FOIT) chip package 300 as illustrated in FIGS. 27A and 27B. The difference therebetween is mentioned as below: Referring to FIG. 28A, after the chemical mechanical polishing (CMP), polishing or grinding process as illustrated in FIG. 27A is performed, the topside interconnection scheme for a logic drive (TISD) 101 as illustrated in FIG. 21D may be formed over the top surface of the polymer layer 565, the backside of each of the first and/or second types of semiconductor chips 100, the backside of the topmost one of the HBM IC chips 251-3 of each of the first type of first memory modules 159-1, the backside of the standard commodity FPGA IC chip 200 of each of the first and/or second types of operation modules 190 and the top surface of the copper layer 581 of each of the through package vias (TPVs) 582. The specification and process for the topside interconnection scheme for a logic drive (TISD) 101 herein may be referred to those for the frontside interconnection scheme for a logic drive (FISD) 101 as illustrated in FIG. 21D. For the topside interconnection scheme for a logic drive (TISD) 101, the bottommost one of its polymer layers 42 may be between the bottommost one of its interconnection metal layers 27 and the polished or ground plane defined by the top surface of the polymer layer 565, the backside of each of the first and/or second types of semiconductor chips 100, the backside of the topmost one of the HBM IC chips 251-3 of each of the first type of first memory modules 159-1, the backside of the standard commodity FPGA IC chip 200 of each of the first and/or second types of operation modules 190 and the top surface of the copper layer 581 of each of the through package vias (TPVs) 582. Each opening in the bottommost one of its polymer layers 42 may be over the backside of the electroplated copper layer 156 of one of the through silicon vias (TSV) 157 of one of the second type of semiconductor chips 100, the backside of the electroplated copper layer 156 of one of the through silicon vias (TSV) 157 of the standard commodity FPGA IC chip 200, which may be fabricated from the first or second type of semiconductor wafer 100*b* or 100*c* as illustrated in FIG. 17B or 17D, of one of the first and/or second types of operation modules 190, the backside of the electroplated copper layer 156 of one of the through silicon vias (TSV) 157 of the topmost one of the HBM IC chips 251-3 of one of the first type of first memory modules 159-1 or the top surface of the copper layer 581 of one of the through package vias (TPV) 582; that is, the backside of the electroplated copper layer 156 of each of some or all of the through silicon vias (TSV) 157 of each of the second type of semiconductor chips 100 may be at a bottom of one of the openings in the bottommost one of its polymer layers 42, the backside of the electroplated copper layer 156 of each of some or all of the through silicon vias (TSV) 157 of the standard commodity FPGA IC chip 200, which may be fabricated from the first or second type of semiconductor wafer 100*b* or 100*c* as illustrated in FIG. 17B or 17D, of each of the first and/or second types of operation modules 190 may be at a bottom of one of the openings in the bottommost one of its polymer layers 42, the backside of the electroplated copper layer 156 of each of some or all of the through silicon vias (TSV) 157 of the topmost one of the HBM IC chips 251-3 of each of the first type of first memory modules 159-1 may be at a bottom of one of the openings in the bottommost one of its polymer layers 42, and the top surface of the copper layer 581 of each of some or all of the through package vias (TPVs) 582 may be at a bottom of one of the openings in the bottommost one of its polymer layers 42. Thus, the bottommost one of its interconnection metal layers 27 may couple to the through silicon vias (TSV) 157 of each of the second type of semiconductor chips 100, the through silicon vias (TSV) 157 of the standard commodity FPGA IC chip 200, which may be fabricated from the first or second type of semiconductor wafer 100*b* or 100*c* as illustrated in FIG. 17B or 17D, of each of the first and/or second types of operation modules 190, the through silicon vias (TSV) 157 of the topmost one of the HBM IC chips 251-3 of each of the first type of first memory modules 159-1 and the through package vias (TPVs) 582 through the openings in the bottommost one of its polymer layers 42.

Next, the following processes may be performed as illustrated in FIGS. 25D-25F to form multiple individual sixth type of fanout-interconnection-technology (FOIT) chip packages 300 as seen in FIG. 28B. For the sixth type of fanout-interconnection-technology (FOIT) chip packages 300, each of its through package vias (TPV) may couple to the voltage of power supply (Vcc) for power delivery, the voltage of ground reference (Vss) for ground delivery or a signal source for signal transmission. For the fourth type of fanout-interconnection-technology (FOIT) chip package 300, each of its through package vias (TPVs) 582 may have a height taller than each of its bonded contacts 563 between each of its first and/or second types of semiconductor chips 100, its first type of first memory modules 159-1 and its first and/or second types of operation modules 190 and its fan-out interconnection scheme for a logic drive (FOISD) 592 by greater than 20 micrometers or 50 micrometers.

Figure 28C:
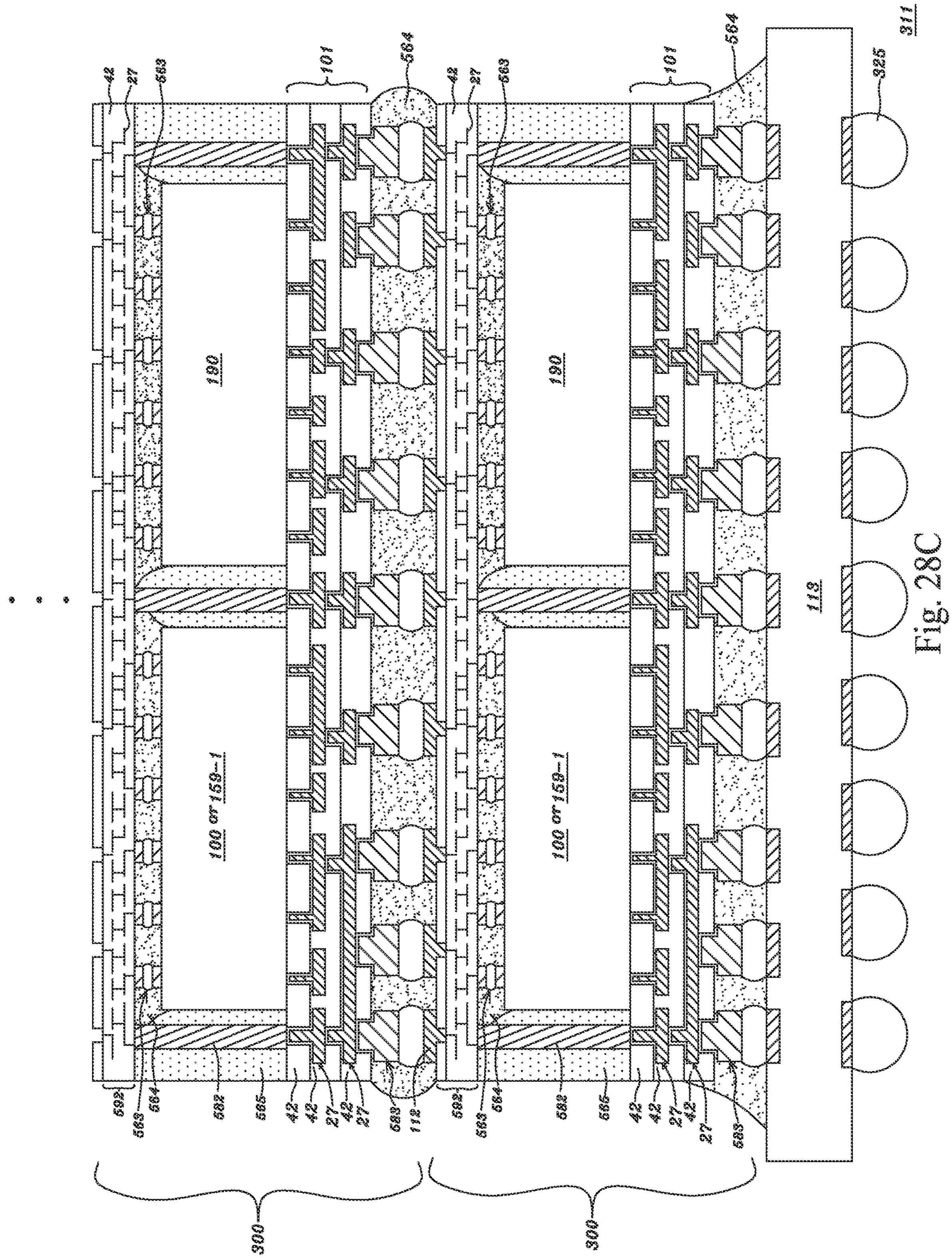
FIG. 28C is a cross-sectional view showing a fifth type of package-on-package (POP) assembly for a sixth type of fanout-interconnection-technology (FOIT) chip packages in accordance with an embodiment of the present application.

FIG. 28C is a cross-sectional view showing a fifth type of package-on-package (POP) assembly for a sixth type of fanout-interconnection-technology (FOIT) chip packages in accordance with an embodiment of the present application. Referring to FIG. 28C, multiple sixth type of fanout-interconnection-technology (FOIT) chip packages 300 as illustrated in FIG. 28B may be provided to be stacked together to form a sixth type of package-on-package (POP) assembly 311.

For forming the sixth type of package-on-package (POP) assembly 311 as seen in FIG. 28C, a circuit carrier substrate may be first provided. Next, the bottommost one of the sixth type of fanout-interconnection-technology (FOIT) chip packages 300 may have the metal bumps or pillars 584 to be bonded to the circuit carrier substrate. Next, an underfill 564 may be filled into a gap between the bottommost one of the sixth type of fanout-interconnection-technology (FOIT) chip packages 300 and the circuit carrier substrate to enclose the metal bumps or pillars 584 of the bottommost one of the sixth type of fanout-interconnection-technology (FOIT) chip packages 300.

Next, referring to FIG. 28C, in a first step, a tin-containing solder 112 may be formed on the metal pads of the topmost one of the interconnection metal layers 27 of the topside interconnection scheme for a logic drive (TISD) 101 of the lower one of the sixth type of fanout-interconnection-technology (FOIT) chip packages 300. Next, in a second step, an upper one of the sixth type of fanout-interconnection-technology (FOIT) chip packages 300 may have the metal bumps or pillars 584 to be bonded to the tin-containing solder 112. Next, in a third step, the tin-containing solder 112 may be reflowed to bond each of the metal bumps or pillars 584 of the upper one of the sixth type of fanout-interconnection-technology (FOIT) chip packages 300 to the metal pads of the topmost one of the interconnection metal layers 27 of the topside interconnection scheme for a logic drive (TISD) 101 of the lower one of the sixth type of fanout-interconnection-technology (FOIT) chip packages 300. Next, in a fourth step, an underfill 564 may be filled into a gap between the upper and lower ones of the sixth type of fanout-interconnection-technology (FOIT) chip packages 300 to enclose the metal bumps or pillars 583 of the upper one of the sixth type of fanout-interconnection-technology (FOIT) chip packages 300.

Next, referring to FIG. 28C, the above first through fourth steps may be sequentially repeated multiple times to stack, one by one, multiple of the sixth type of fanout-interconnection-technology (FOIT) chip packages 300 having the number greater than or equal to two, such as four or eight. For a case, all of the sixth type of fanout-interconnection-technology (FOIT) chip packages stacked as seen in FIG. 28C may be the same.

Next, referring to FIG. 28C, multiple solder balls 325 may be planted on a bottom surface of the circuit carrier substrate. Next, the circuit carrier structure may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process.

Seventh Type of Fanout-Interconnection-Technology (FOIT) Chip Package

Figure 29A:
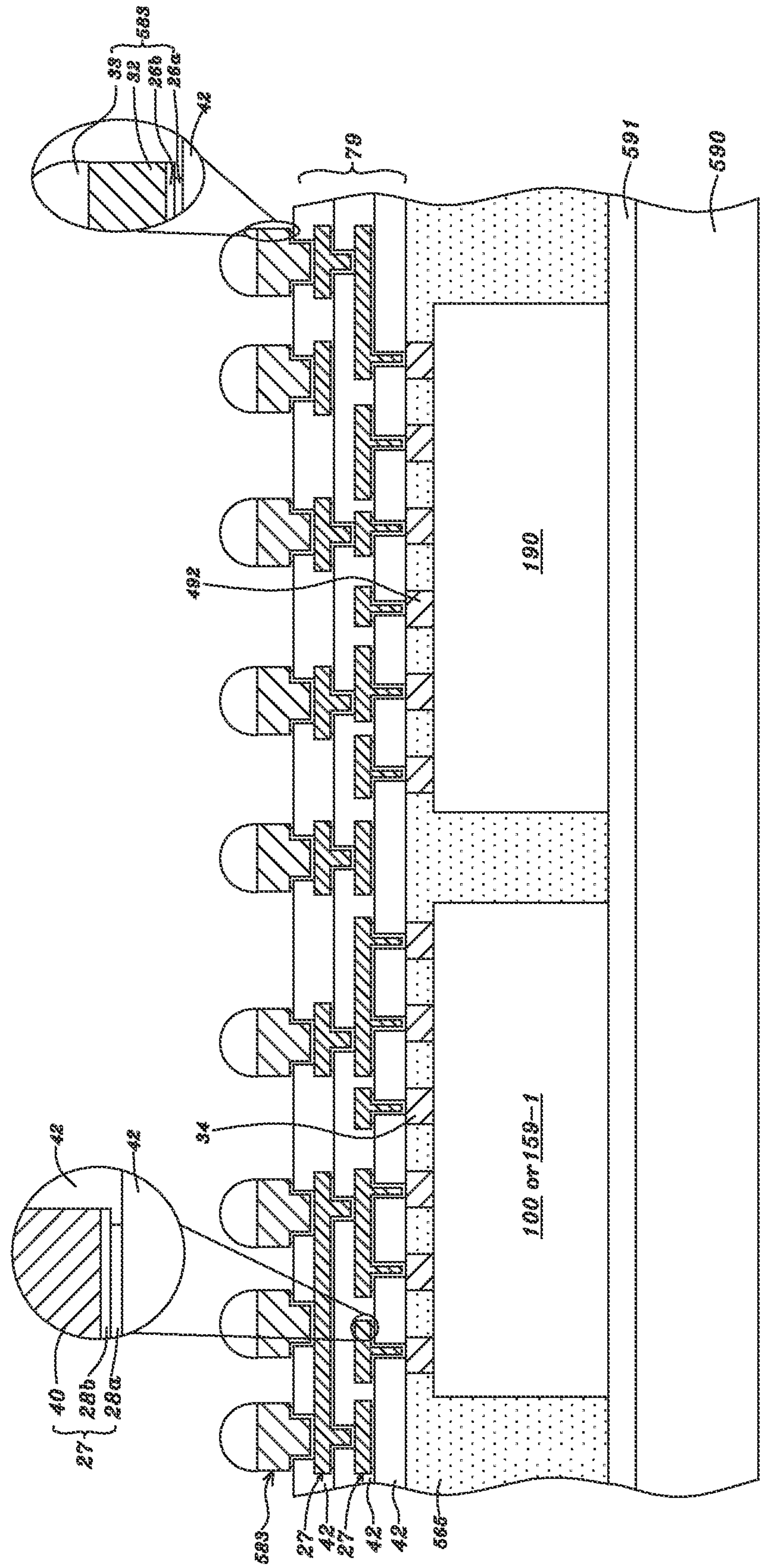
FIGS. 29A and 29B are cross-sectional views showing a process for fabricating a seventh type of fanout-interconnection-technology (FOIT) chip package in accordance with another embodiment of the present application.
Figure 29B:
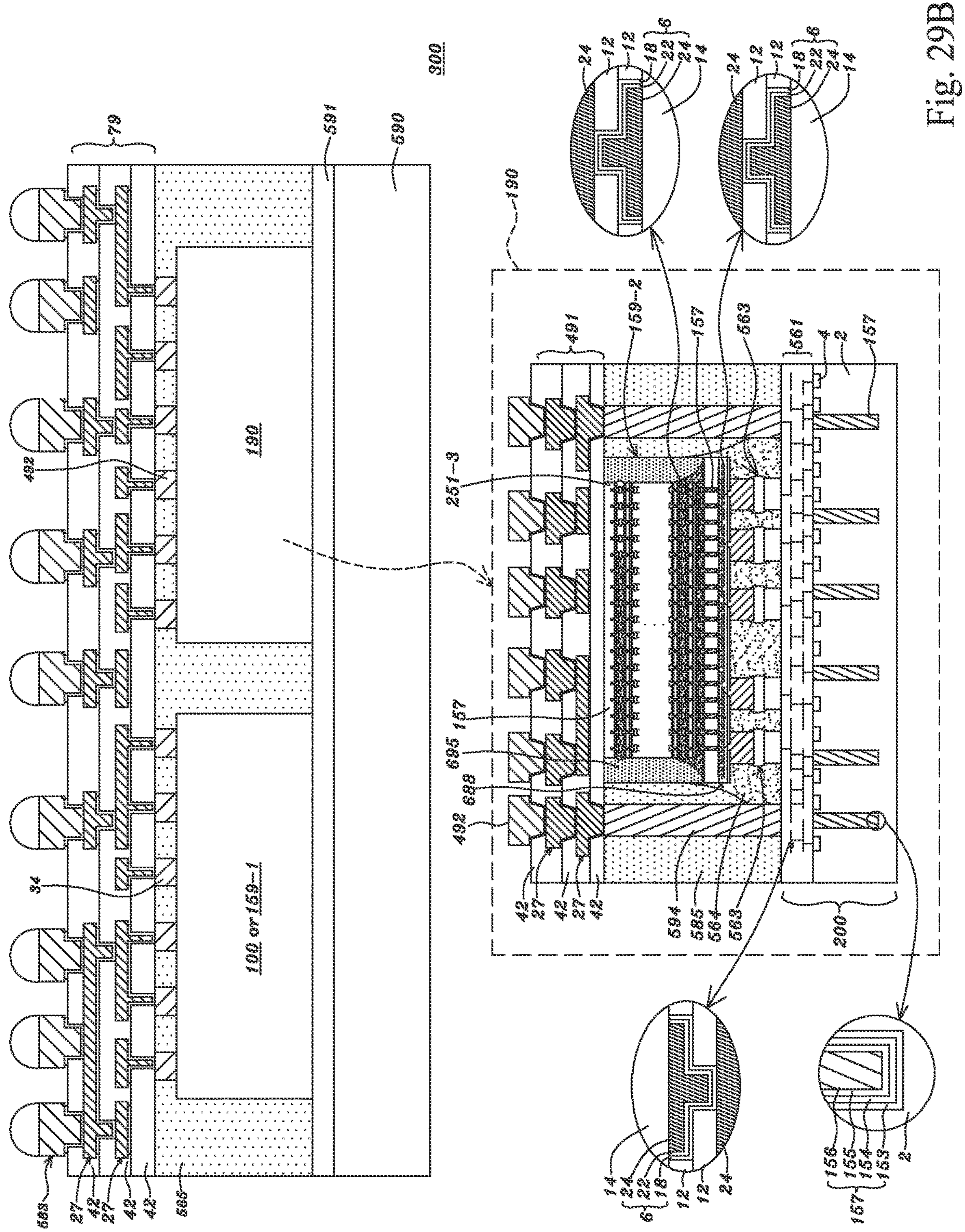

Alternatively, FIGS. 29A and 29B are cross-sectional views showing a process for fabricating a seventh type of fanout-interconnection-technology (FOIT) chip package in accordance with another embodiment of the present application. A seventh type of fanout-interconnection-technology (FOIT) chip package may be provided to form the first, second, third or fourth type of standard commodity logic drive 300 as illustrated in FIG. 10A, 10B, 10C or 10D. The specification and process for fabricating the seventh type of fanout-interconnection-technology (FOIT) chip package is similar to those for fabricating the first type of fanout-interconnection-technology (FOIT) chip package 300 as illustrated in FIGS. 21A-21F. The difference therebetween is mentioned as below: Referring to FIG. 29A, the through package vias (TPV) 582 of the first type of interconnection carrier 589 as seen in FIG. 21A is not provided for the seventh type of fanout-interconnection-technology (FOIT) chip package. After the metal bumps or pillars 583 are formed as illustrated in FIG. 21D on the metal pads of the topmost one of the interconnection metal layers 27 of the frontside interconnection scheme for a logic drive (FISD) 101, the temporary substrate (T-sub) 590 and the sacrificial bonding layer 591 are not removed from the bottom surface of the polymer layer 565, the backside of each of the first and/or second types of semiconductor chips 100, the backside of the bottommost one of the HBM IC chips 251-3 of each of the first type of first memory modules 159-1 and the backside of the standard commodity FPGA IC chip 200 of each of the first and/or second types of operation modules 190 but left on the bottom surface of the polymer layer 565, the backside of each of the first and/or second types of semiconductor chips 100, the backside of the bottommost one of the HBM IC chips 251-3 of each of the first type of first memory modules 159-1 and the backside of the standard commodity FPGA IC chip 200 of each of the first and/or second types of operation modules 190 as illustrated in FIGS. 18E and/or 18F respectively. Next, the temporary substrate (T-sub) 590, the sacrificial bonding layer 591, the polymer layer 565 and the polymer layers 42 of the frontside interconnection scheme for a logic drive (FISD) 101 may be cut or diced to separate multiple individual seventh type of fanout-interconnection-technology (FOIT) chip packages 300 as seen in FIG. 29B by a laser cutting process or by a mechanical cutting process. In this case, for the seventh type of fanout-interconnection-technology (FOIT) chip package 300, its temporary substrate (T-sub) 590 may be used as a heat sink to dissipate heat generated from its first and/or second types of semiconductor chips 100, its first type of first memory modules 159-1 and its first and/or second types of operation modules 190, and its sacrificial bonding layer 591 may be a thermally conductive adhesive to bond its temporary substrate (T-sub) 590 to its first and/or second types of semiconductor chips 100, its first type of first memory modules 159-1 and its first and/or second types of operation modules 190.

Alternative Embodiment for Operation Module

For each of the operation modules 190 as seen in FIGS. 18E-18H and 20E-20H to be packaged in one of the first through seventh types of fanout-interconnection-technology (FOIT) chip packages as seen in FIGS. 21F, 22B, 23G, 25F, 27B, 28B and 29B respectively for one of the first through fourth types of standard commodity logic drives as seen in FIGS. 10A-10D respectively, its FPGA IC chip 200 may be replaced with a central-processing-unit (CPU) chip, graphic-processing-unit (GPU) chip, digital-signal-processing (DSP) chip, tensor-processing-unit (TPU) chip, application-processing-unit (APU) chip, application-specific integrated-circuit (ASIC) chip or artificial-intelligence (AI) chip to be bonded to its second memory module 159-2 or second HBM IC chip 251-2 by a process as illustrated in FIG. 18A-18H or 20A-20H. Further, its second memory module 159-2 or second HBM IC chip 251-2 may be replaced with a standard commodity FPGA IC chip 200 as illustrated in FIGS. 8A and 8B, central-processing-unit (CPU) chip, graphic-processing-unit (GPU) chip, digital-signal-processing (DSP) chip, tensor-processing-unit (TPU) chip, application-processing-unit (APU) chip, application-specific integrated-circuit (ASIC) chip, artificial-intelligence (AI) chip, dedicated control and I/O chip, IAC chip or DPIIC chip 410 as illustrated in FIG. 9, to be bonded to its standard commodity FPGA IC chip 200, central-processing-unit (CPU) chip, graphic-processing-unit (GPU) chip, digital-signal-processing (DSP) chip, tensor-processing-unit (TPU) chip, application-processing-unit (APU) chip, application-specific integrated-circuit (ASIC) chip or artificial-intelligence (AI) chip by a process as illustrated in FIG. 18A-18H or 20A-20H, wherein the IAC chip may include intellectual property (IP) circuits, application specific (AS) circuits, analog circuits, mixed-mode signal circuits, radio-frequency (RF) circuits and/or transmitter, receiver, transceiver circuits.

Alternative Embodiment for Standard Commodity Logic Drive

Figure 30:
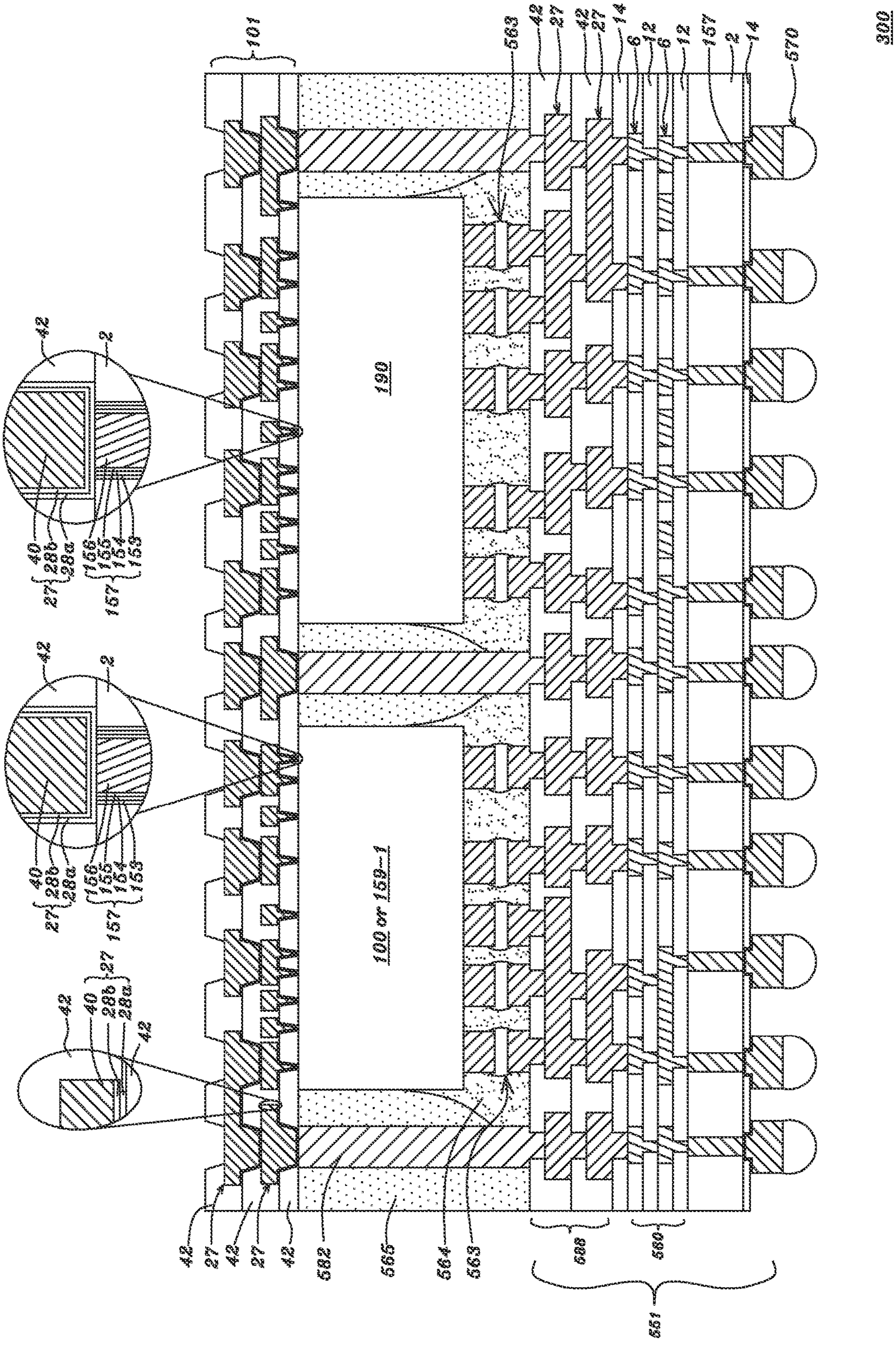
FIGS. 30 and 31 are schematically cross-sectional views showing various multi-chip packages for a standard commodity logic drive in accordance with another embodiment of the present application.

FIG. 30 is a schematically cross-sectional view showing a standard commodity logic drive in accordance with another embodiment of the present application. Referring to FIG. 30, for the first, second, third or fourth type of standard commodity logic drive 300 as illustrated in FIG. 10A, 10B, 10C or 10D, an interposer 551 may be provided to carry the first and/or second type of semiconductor chips 100 as illustrated in FIGS. 14A and 14B, the first type of first memory module 159-1 as illustrated in FIG. 15A and/or the first and/or second types of operation modules 190 as seen in FIG. 18E or 20E and/or FIG. 18F or 20F. The interposer 551 may be formed with the first, second or fourth type of micro-bumps or micro-pillars 34, as illustrated in FIG. 14A, to be bonded with (1) the first, second or third type of micro-bumps or micro-pillars 34 of each of the first and/or second type of semiconductor chips 100 into the bonded contacts 563 therebetween, (2) the first, second or third type of micro-bumps or micro-pillars 34 on the active side of the control chip 688 of the first type of first memory module 159-1 into the bonded contacts 563 therebetween, and/or (3) the first, second or third type of metal bumps or pillars 492 of each of the first and/or second types of operation module 190 into the bonded contacts 563 therebetween, which may be referred to the description as illustrated in FIGS. 25A, 25B and 26A-26D.

Referring to FIG. 30, each of the first and/or second types of semiconductor chips 100 may be the DPIIC chip 410, dedicated control and input/output (I/O) chip 265, NVM IC chip 250, first HBM IC chip 251-1, PCIC chip 269, GPU chip 269*a* or CPU chip 269*b* for the first, second, third or fourth type of standard commodity logic drive 300. The interposer 551 may include (1) a semiconductor substrate 2, such as silicon wafer; (2) multiple metal vias 157 in its semiconductor substrate 2, wherein the specification and process for its through silicon vias (TSV) 157 may be referred to those for the through silicon vias (TSV) 157 as illustrated in FIG. 14B; (3) a first interconnection scheme for an interposer (FISIP) 560 over its semiconductor substrate 2, provided with one or more interconnection metal layers 6 coupling to its metal vias 157 and one or more insulating dielectric layers 12 each between neighboring two of the interconnection metal layers 6, wherein the specification and process for the interconnection metal layers 6 and insulating dielectric layers 12 for its first interconnection scheme for an interposer (FISIP) 560 herein may be referred to those for the first interconnection scheme for a chip (FISC) 20 as illustrated in FIG. 14A; (4) a passivation layer 14 over its first interconnection scheme for an interposer (FISIP) 560, wherein multiple openings in the passivation layer 14 may be aligned with and over multiple metal pads of the topmost one of the interconnection metal layers 6 of the first interconnection scheme for an interposer (FISIP) 560 respectively, wherein the specification and process for its passivation layer 14 herein may be referred to those for the passivation layer 14 as illustrated in FIG. 14A; (5) a second interconnection scheme for an interposer (SISIP) 588 optionally provided over its passivation layer 14, provided with one or more interconnection metal layers 27 coupling to the interconnection metal layers 6 of its first interconnection scheme for an interposer (FISIP) 560 through the openings in its passivation layer 14 and one or more polymer layers 42 each between neighboring two of its interconnection metal layers 27, under a bottommost one of its interconnection metal layers 27 or over a topmost one of its interconnection metal layers 27, wherein multiple openings 42*a* in the topmost one of its polymer layers 42 may be aligned with and over multiple metal pads of the topmost one of the interconnection metal layers 27 of its second interconnection scheme for an interposer (SISIP) 588, wherein the specification and process for the interconnection metal layers 27 and polymer layers 42 for its second interconnection scheme for an interposer (SISIP) 588 herein may be referred to those for the second interconnection scheme for a chip (SISC) 29 as illustrated in FIG. 14A; and (6) a passivation layer 14 on the backside of its semiconductor substrate 2, including a silicon-nitride, SiON or SiCN layer having a thickness greater than 0.3 μm for example and, alternatively, a polymer layer having a thickness between 1 and 10 μm on a bottom surface of the silicon-nitride, SiON or SiCN layer, wherein multiple openings 14*a* in its passivation layer 14 on the backside of its semiconductor substrate 2 may be aligned with and under the backside of the electroplated copper layer 156 of its through silicon vias (TSV) 157. Each micro-bump or micro-pillar 570 may be formed on the backside of the electroplated copper layer 156 of one of the through silicon vias (TSV) 157 of the interposer 551 at a top of one of the openings 14*a* in the passivation layer 14 on the backside of the semiconductor substrate 2 of the interposer 551. The specification and process for the micro-bump or micro-pillars 570 herein may be referred to those for the micro-bump or micro-pillars 570 as illustrated in FIG. 14C.

Referring to FIG. 30, the standard commodity logic drive 300 may further include multiple through package vias (TPVs) 582 on the interposer 551, extending from the interconnection substrate 551 in a vertical direction, wherein each of the through package vias (TPVs) 582 may have a top surface coplanar to the top surface of the polymer layer 565, the backside of each of the first and/or second type of semiconductor chips 100, the backside of the topmost one of the HBM IC chips 159 of each of the first type of first memory modules 159-1 and/or the backside of the FPGA IC chip 200 of each of the first and/or second types of operation modules 190. Each of its through package vias (TPVs) 582 may have a height taller than each of its bonded contacts 563 between each of its first and/or second types of semiconductor chips 100, its first type of first memory modules 159-1 and its first and/or second types of operation modules 190 and its interposer 551 by greater than 20 micrometers or 50 micrometers. For an element indicated by the same reference number shown in FIGS. 25A-25C, 27A, 28A, 28B and 29, the specification of the element as seen in FIG. 29 may be referred to that of the element as illustrated in FIGS. 25A-25C, 27A, 28A and 28B.

Figure 31:
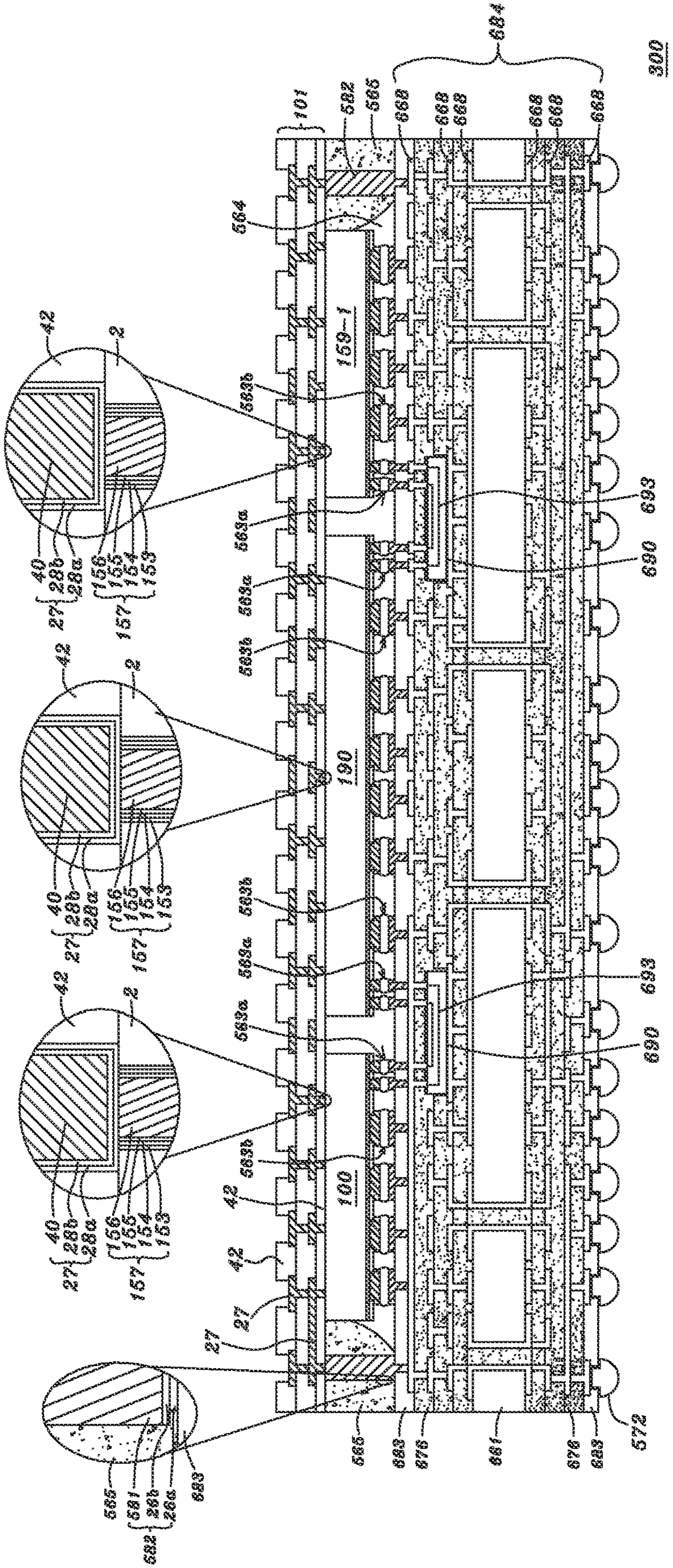

Alternatively, FIG. 31 is a schematically cross-sectional view showing a standard commodity logic drive in accordance with another embodiment of the present application. Referring to FIG. 31, for the first, second, third or fourth type of standard commodity logic drive 300 as illustrated in FIG. 10A, 10B, 10C or 10D, an interconnection substrate 684 may be provided to carry the first and/or second type of semiconductor chips 100 as illustrated in FIGS. 14A and 14B, the first type of first memory module 159-1 as illustrated in FIG. 15A and/or the first and/or second types of operation modules 190 as seen in FIG. 18E or 20E and/or FIG. 18F or 20F. The interconnection substrate 684 may be formed with the first, second or fourth type of micro-bumps or micro-pillars 34, as illustrated in FIG. 14A, in two groups, i.e., high-density, small-size copper pads (HDP) and low-density, large-size copper pads (LDP), to be bonded respectively with (1) the first, second or third type of micro-bumps or micro-pillars 34 in two groups, i.e., high-density, small-size micro-bumps (HDB) and low-density, large-size micro-bumps (LDB), of each of the first and/or second type of semiconductor chips 100 into the bonded contacts 563*a* and 563*b* in two groups, i.e., high-density, small-size bonded contacts 563*a* and low-density, large-size bonded contacts

563*b*, therebetween, (2) the first, second or third type of micro-bumps or micro-pillars 34 in two groups, i.e., high-density, small-size micro-bumps (HDB) and low-density, large-size micro-bumps (LDB), on the active side of the control chip 688 of the first type of first memory module 159-1 into the bonded contacts 563*a* and 563*b* in two groups, i.e., high-density, small-size bonded contacts 563*a* and low-density, large-size bonded contacts 563*b*, therebetween, and/or (3) the first, second or third type of metal bumps or pillars 492 in two groups, i.e., high-density, small-size micro-bumps (HDB) and low-density, large-size micro-bumps (LDB), of each of the first and/or second types of operation module 190 into the bonded contacts 563*a* and 563*b* in two groups, i.e., high-density, small-size bonded contacts 563*a* and low-density, large-size bonded contacts 563*b*, therebetween, which may be referred to the description as illustrated in FIGS. 25A, 25B and 26A-26D.

Referring to FIG. 31, each of the bonded contacts 563*a* may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of the bonded contacts 563*a* may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. Each of the bonded contacts 563*b* may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The smallest space between neighboring two of the bonded contacts 563*b* may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm.

Referring to FIG. 31, each of the first and/or second types of semiconductor chips 100 may be the DPIIC chip 410, dedicated control and input/output (I/O) chip 265, NVM IC chip 250, first HBM IC chip 251-1, PCIC chip 269, GPU chip 269*a* or CPU chip 269*b* for the first, second, third or fourth type of standard commodity logic drive 300. The interconnection substrate 684 may include (1) a core layer 661, such as FR4, containing epoxy or bismaleimide-triazine (BT) resin, wherein FR4 may be a composite material composed of woven fiberglass cloth and an epoxy resin binder, (2) multiple interconnection metal layers 668, made of copper, over and under the core layer 661, (3) multiple polymer layers 676 over and under the core layer 661, wherein each of the polymer layers 676 is between neighboring two of the interconnection metal layers 668, and (4) two solder masks 683 at the top and bottom of the interconnection substrate 684 to cover the topmost and bottommost ones of the interconnection metal layers 668 respectively, wherein the topmost and bottommost ones of the interconnection metal layers 668 may include multiple metal pads at bottoms and tops of multiple openings in the topmost and bottommost ones of solder masks 683 respectively. The bonded contacts 563*a* and 563*b* may be formed on metal pads of the topmost one of the interconnection metal layers 668. Multiple metal bumps 572, such as solder bumps, may be formed on the metal pads of the bottommost one of the interconnection metal layers 668 by a screen printing method or a solder-ball mounting method, and then by a solder reflow process. The metal bumps 572 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. The interconnection bridge 684 may further include multiple fine-line interconnection bridges (FIB) 690 embedded in the interconnection bridge 684. Each of the fine-line interconnection bridges (FIB) 690 may have multiple interconnection metal layers, each have the same specification as the interconnection metal layer 6 of the first interconnection scheme for a chip (FISC) 20 as illustrated in FIG. 14A, and multiple insulating dielectric layers, each have the same specification as the insulating dielectric layer 12 of the first interconnection scheme for a chip (FISC) 20 as illustrated in FIG. 14A, each between neighboring two of its interconnection metal layers. The interconnection metal layers of one of the fine-line interconnection bridges (FIB) 690 may be connected to one of the first and/or second types of semiconductor chips 100 and/or the first type of first memory module 159-1 through the bonded contacts 563*a* for signal transmission; the interconnection metal layers of one of the fine-line interconnection bridges (FIB) 690 may be connected to one of the first and/or second types of operation modules 190 through the bonded contacts 563*a* for signal transmission. The interconnection metal layers of each of the fine-line interconnection bridges (FIB) 690 may include multiple metal lines 693 connecting neighboring two of the first and/or second types of semiconductor chips 100, the first type of first memory module 159-1 and/or the first and/or second types of operation modules 190, said each of the fine-line interconnection bridges (FIB) 690 may extend across under edges of said neighboring two of the first and/or second types of semiconductor chips 100, the first type of first memory module 159-1 and/or the first and/or second types of operation modules 190.

Referring to FIG. 31, the standard commodity logic drive 300 may further include multiple through package vias (TPVs) 582 on the interconnection substrate 684, extending from the interconnection substrate 684 in a vertical direction, wherein each of the through package vias (TPVs) 582 may have a top surface coplanar to the top surface of the polymer layer 565, the backside of each of the first and/or second type of semiconductor chips 100, the backside of the topmost one of the HBM IC chips 159 of each of the first type of first memory modules 159-1 and/or the backside of the FPGA IC chip 200 of each of the first and/or second types of operation modules 190. Each of its through package vias (TPVs) 582 may have a height taller than each of its bonded contacts 563*a* and 563*b* between each of its first and/or second types of semiconductor chips 100, its first type of first memory modules 159-1 and its first and/or second types of operation modules 190 and its interconnection substrate 684 by greater than 20 micrometers or 50 micrometers. For an element indicated by the same reference number shown in FIGS. 25A-25C, 27A, 28A, 28B and 31, the specification of the element as seen in FIG. 31 may be referred to that of the element as illustrated in FIGS. 25A-25C, 27A, 28A and 28B.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A multi-chip package comprising:

a first semiconductor integrated-circuit (IC) chip comprising a first silicon substrate, a plurality of first transistors at a top surface of the first silicon substrate and a first interconnection scheme over the first silicon substrate and coupling to the plurality of first transistors;

a second semiconductor integrated-circuit (IC) chip over and coupling to the first semiconductor integrated-circuit (IC) chip, wherein the second semiconductor integrated-circuit (IC) chip comprises a second silicon substrate, a plurality of second transistors at a bottom surface of the second silicon substrate and a second interconnection scheme under the second silicon substrate and coupling to the plurality of second transistors, wherein the second interconnection scheme comprises a first silicon-oxide-containing layer and a first bonding pad each at a bottom of the second semiconductor integrated-circuit (IC) chip, wherein the first bonding pad is in an opening in the first silicon-oxide-containing layer and couples to the first semiconductor integrated-circuit (IC) chip, wherein the first bonding pad comprises a first copper layer in the opening in the first silicon-oxide-containing layer and a first adhesion metal layer having a first portion at a sidewall of the first copper layer and a second portion at a top of the first copper layer, wherein the first copper layer has a bottom surface coplanar with a bottom surface of the first silicon-oxide-containing layer, wherein the second semiconductor integrated-circuit (IC) chip has a first edge over the first semiconductor integrated-circuit (IC) chip and a second edge opposite to the first edge and over the first semiconductor integrated-circuit (IC) chip;

a sealing layer over the first semiconductor integrated-circuit (IC) chip and at a same horizontal level as the second semiconductor integrated-circuit (IC) chip;

a first metal via over the first semiconductor integrated-circuit (IC) chip and vertically in the sealing layer;

a second metal via over the first semiconductor integrated-circuit (IC) chip, vertically in the sealing layer and coupling to the first bonding pad of the second semiconductor integrated-circuit (IC) chip;

a first metal pad vertically over and coupling to the first metal via;

a polymer layer over the second semiconductor integrated-circuit (IC) chip and sealing layer, wherein an opening in the polymer layer is vertically over the first metal pad and first metal via; and a first metal bump on the first metal pad, vertically over the first metal via and at a top of the multi-chip package, wherein the first metal bump couples to the first metal via through the first metal pad.

2. The multi-chip package of claim 1 further comprising a second metal pad coupling to the second metal via and a second metal bump at the top of the multi-chip package, on the second metal pad and coupling to the second metal via through the second metal pad.

3. The multi-chip package of claim 1 further comprising a second metal pad vertically over the second semiconductor integrated-circuit (IC) chip and a second metal bump at the top of the multi-chip package, on the second metal pad and vertically over the second semiconductor integrated-circuit (IC) chip.

4. The multi-chip package of claim 3, wherein the second semiconductor integrated-circuit (IC) chip comprises a through silicon via vertically in the second silicon substrate, wherein the second metal pad couples to the through silicon via.

5. The multi-chip package of claim 1, wherein the second interconnection scheme further comprises an interconnection metal layer under the second silicon substrate, wherein the interconnection metal layer comprises a second copper layer and a second adhesion metal layer having a first portion at a sidewall of the second copper layer and a second portion at a top of the second copper layer, wherein the first bonding pad is under and on the interconnection metal layer and the second portion of the first adhesion metal layer is between the first and second copper layers and in contact with the second copper layer.

6. The multi-chip package of claim 1, wherein the first interconnection scheme comprises a second silicon-oxide-containing layer having a top surface bonded to and in contact with the bottom surface of the first silicon-oxide-containing layer and a second bonding pad in an opening in the second silicon-oxide-containing layer, wherein the second bonding pad comprises a second copper layer in the opening in the second silicon-oxide-containing layer and a second adhesion metal layer having a first portion at a sidewall of the second copper layer and a second portion at a bottom of the second copper layer, wherein the second copper layer has a top surface bonded to and in contact with the bottom surface of the first copper layer.

7. The multi-chip package of claim 1, wherein the first metal bump comprises tin.

8. The multi-chip package of claim 1, wherein the second metal via is configured to couple to a power supply voltage.

9. The multi-chip package of claim 1, wherein the second metal via is configured to couple to a ground voltage.

10. The multi-chip package of claim 1, wherein the second metal via couples to the first bonding pad of the second semiconductor integrated-circuit (IC) chip through the first interconnection scheme.

11. The multi-chip package of claim 1, wherein the first metal via comprises a second copper layer having a thickness between 20 and 100 micrometers.

12. The multi-chip package of claim 1, wherein a sidewall of the sealing layer is substantially coplanar with a sidewall of the first semiconductor integrated-circuit (IC) chip in a vertical direction and the polymer layer is not extending beyond the sidewall of the first semiconductor integrated-circuit (IC) chip in a horizontal direction.

13. The multi-chip package of claim 1, wherein the second silicon substrate has a top surface not above a top surface of the sealing layer.

14. The multi-chip package of claim 1, wherein the second semiconductor integrated-circuit (IC) chip is a memory chip.

15. The multi-chip package of claim 1, wherein the first semiconductor integrated-circuit (IC) chip is a logic chip.

16. A multi-chip package comprising:

a first semiconductor integrated-circuit (IC) chip comprising a first silicon substrate, a plurality of first transistors at a top surface of the first silicon substrate and a first interconnection scheme over the first silicon substrate and coupling to the plurality of first transistors;

a second semiconductor integrated-circuit (IC) chip over and coupling to the first semiconductor integrated-circuit (IC) chip, wherein the second semiconductor integrated-circuit (IC) chip comprises a second silicon substrate, a plurality of second transistors at a bottom surface of the second silicon substrate and a second interconnection scheme under the second silicon substrate and coupling to the plurality of second transistors, wherein the second interconnection scheme comprises a first silicon-oxide-containing layer and a first bonding pad each at a bottom of the second semiconductor integrated-circuit (IC) chip, wherein the first bonding pad is in an opening in the first silicon-oxide-containing layer and couples to the first semiconductor integrated-circuit (IC) chip, wherein the first bonding pad comprises a first copper layer in the opening in the first silicon-oxide-containing layer and a first adhesion metal layer having a first portion at a sidewall of the first copper layer and a second portion at a top of the first copper layer, wherein the first copper layer has a bottom surface coplanar with a bottom surface of the first silicon-oxide-containing layer, wherein the second semiconductor integrated-circuit (IC) chip has a first edge over the first semiconductor integrated-circuit (IC) chip and a second edge opposite to the first edge and over the first semiconductor integrated-circuit (IC) chip;

a sealing layer over the first semiconductor integrated-circuit (IC) chip and at a same horizontal level as the second semiconductor integrated-circuit (IC) chip;

a first metal via over and coupling to the first semiconductor integrated-circuit (IC) chip and vertically in the sealing layer;

a third interconnection scheme over the second semiconductor integrated-circuit (IC) chip, sealing layer and first metal via and coupling to the first metal via; and a first metal bump on the third interconnection scheme, at a top of the multi-chip package and protruding from a top surface of the third interconnection scheme, wherein the first metal bump couples to the first bonding pad of the second semiconductor integrated-circuit (IC) chip through, in sequence, the third interconnection scheme and first metal via.

17. The multi-chip package of claim 16 further comprising a second metal bump on the third interconnection scheme, at the top of the multi-chip package, vertically over the second semiconductor integrated-circuit (IC) chip and protruding from the top surface of the third interconnection scheme.

18. The multi-chip package of claim 17, wherein the second semiconductor integrated-circuit (IC) chip comprises a through silicon via vertically in the second silicon substrate, wherein the second metal bump couples to the through silicon via through the third interconnection scheme.

19. The multi-chip package of claim 17 further comprising a second metal via over and coupling to the first semiconductor integrated-circuit (IC) chip and vertically in the sealing layer, wherein the second metal bump couples to the second metal via through the third interconnection scheme.

20. The multi-chip package of claim 16, wherein the second interconnection scheme further comprises an interconnection metal layer under the second silicon substrate, wherein the interconnection metal layer comprises a second copper layer and a second adhesion metal layer having a first portion at a sidewall of the second copper layer and a second portion at a top of the second copper layer, wherein the first bonding pad is under and on the interconnection metal layer and the second portion of the first adhesion metal layer is between the first and second copper layers and in contact with the second copper layer.

21. The multi-chip package of claim 16, wherein the first interconnection scheme comprises a second silicon-oxide-containing layer having a top surface bonded to and in contact with the bottom surface of the first silicon-oxide-containing layer and a second bonding pad in an opening in the second silicon-oxide-containing layer, wherein the second bonding pad comprises a second copper layer in the opening in the second silicon-oxide-containing layer and a second adhesion metal layer having a first portion at a sidewall of the second copper layer and a second portion at a bottom of the second copper layer, wherein the second copper layer has a top surface bonded to and in contact with the bottom surface of the first copper layer.

22. The multi-chip package of claim 16 further comprising a third semiconductor integrated-circuit (IC) chip over and coupling to the first semiconductor integrated-circuit (IC) chip and at the same horizontal level as the second semiconductor integrated-circuit (IC) chip and sealing layer, wherein the third interconnection scheme is further over the third semiconductor integrated-circuit (IC) chip.

23. The multi-chip package of claim 16, wherein the first metal bump comprises tin.

24. The multi-chip package of claim 16, wherein the first metal via is configured to couple to a power supply voltage.

25. The multi-chip package of claim 16, wherein the first metal via is configured to couple to a ground voltage.

26. The multi-chip package of claim 16, wherein the first metal via couples to the first bonding pad of the second semiconductor integrated-circuit (IC) chip through the first interconnection scheme.

27. The multi-chip package of claim 16, wherein the first metal via comprises a second copper layer having a thickness between 20 and 100 micrometers.

28. The multi-chip package of claim 16, wherein the second semiconductor integrated-circuit (IC) chip is a memory chip.

29. The multi-chip package of claim 16, wherein the first semiconductor integrated-circuit (IC) chip is a logic chip.

* * * * *